US012552821B2

(12) United States Patent
Wang et al.

(10) Patent No.: US 12,552,821 B2
(45) Date of Patent: Feb. 17, 2026

(54) ORGANIC ELECTROLUMINESCENT MATERIAL AND DEVICE THEREOF

(71) Applicant: BEIJING SUMMER SPROUT TECHNOLOGY CO., LTD., Beijing (CN)

(72) Inventors: Zhen Wang, Beijing (CN); Hongbo Li, Beijing (CN); Ming Sang, Beijing (CN); Wei Cai, Beijing (CN); Chi Yuen Raymond Kwong, Beijing (CN); Chuanjun Xia, Beijing (CN)

(73) Assignee: BEIJING SUMMER SPROUT TECHNOLOGY CO., LTD., Beijing (CN)

(*) Notice: Subject to any disclaimer, the term of this patent is extended or adjusted under 35 U.S.C. 154(b) by 911 days.

(21) Appl. No.: 17/718,430

(22) Filed: Apr. 12, 2022

(65) Prior Publication Data

US 2022/0372055 A1 Nov. 24, 2022

(30) Foreign Application Priority Data

Apr. 14, 2021 (CN) ........................ 202110389568.7

(51) Int. Cl.

*C09K 11/06* (2006.01)
*C07F 15/00* (2006.01)
*H10K 85/30* (2023.01)
*H10K 85/60* (2023.01)

(52) U.S. Cl.

CPC ....... *C07F 15/0033* (2013.01); *H10K 85/342* (2023.02); *H10K 85/622* (2023.02); *H10K 85/626* (2023.02); *H10K 85/654* (2023.02); *H10K 85/6572* (2023.02); *H10K 85/6574* (2023.02); *H10K 85/6576* (2023.02)

(58) Field of Classification Search

None

See application file for complete search history.

(56) References Cited

U.S. PATENT DOCUMENTS

| | | | |
|---|---|---|---|
| 5,703,436 A | 12/1997 | Forrest et al. | |
| 5,707,745 A | 1/1998 | Forrest et al. | |
| 5,844,363 A | 12/1998 | Gu et al. | |
| 6,097,147 A | 8/2000 | Baldo et al. | |
| 6,303,238 B1 | 10/2001 | Thompson et al. | |
| 7,279,704 B2 | 10/2007 | Walters et al. | |
| 7,968,146 B2 | 6/2011 | Wagner et al. | |
| 8,692,241 B1 * | 4/2014 | Zeng | H05B 33/14 257/E51.027 |
| 9,685,617 B2 * | 6/2017 | Beers | H10K 85/342 |
| 10,355,227 B2 * | 7/2019 | Ma | C07F 15/0033 |
| 10,411,201 B2 * | 9/2019 | Boudreault | C09K 11/025 |
| 10,608,186 B2 * | 3/2020 | Zeng | H10K 50/11 |
| 2003/0230980 A1 | 12/2003 | Forrest et al. | |
| 2004/0174116 A1 | 9/2004 | Lu et al. | |
| 2012/0292601 A1 * | 11/2012 | Kottas | H05B 33/14 546/4 |
| 2013/0119354 A1 | 5/2013 | Ma et al. | |
| 2015/0069334 A1 | 3/2015 | Xia et al. | |
| 2015/0171349 A1 * | 6/2015 | Ma | C07F 15/0033 546/4 |
| 2015/0349273 A1 | 12/2015 | Hung et al. | |
| 2016/0359122 A1 | 12/2016 | Boudreault et al. | |
| 2018/0076393 A1 * | 3/2018 | Zeng | H10K 85/342 |
| 2018/0254417 A1 | 9/2018 | Ma et al. | |
| 2018/0273563 A1 * | 9/2018 | Choi | H10K 85/342 |
| 2019/0296251 A1 * | 9/2019 | Yen | H10K 85/654 |
| 2020/0091442 A1 | 3/2020 | Cai et al. | |
| 2020/0106028 A1 * | 4/2020 | Yen | H10K 85/342 |
| 2020/0157129 A1 * | 5/2020 | Yen | H10K 50/171 |
| 2020/0212318 A1 * | 7/2020 | Kim | C07F 15/0033 |
| 2020/0251666 A1 | 8/2020 | Cai et al. | |
| 2021/0054010 A1 | 2/2021 | Tsai et al. | |
| 2021/0403496 A1 | 12/2021 | Cai et al. | |
| 2022/0002329 A1 | 1/2022 | Cai et al. | |
| 2022/0162244 A1 | 5/2022 | Sang et al. | |

(Continued)

FOREIGN PATENT DOCUMENTS

| | | |
|---|---|---|
| CN | 110903321 A | 3/2020 |
| CN | 111518139 A | 8/2020 |
| CN | 112079875 A | 12/2020 |

(Continued)

OTHER PUBLICATIONS

Chinese Search Report issued in CN Application No. 202110389568.7 on Apr. 14, 2021.

First Office Action issued in CN Application No. 202110389568.7 on Feb. 20, 2024.

First Office Action issued in KR Application No. 10-2022-0046427 on Apr. 18, 2024.

Second Office Action issued in CN Application No. 202110389568.7 on Sep. 25, 2024.

(Continued)

*Primary Examiner* — Robert S Loewe

(74) *Attorney, Agent, or Firm* — ArentFox Schiff LLP; Joseph M. Maraia

(57) ABSTRACT

Provided are an organic electroluminescent material and a device thereof. The organic electroluminescent material is a metal complex including a ligand $L_a$ having a structure of Formula 1, and the metal complex can be used as luminescent materials in electroluminescent devices. These new compounds, when used in electroluminescent devices, can show better performance, provide lower device voltage and higher device efficiency, and significantly improve the comprehensive performance of devices. Further provided are an electroluminescent device including the metal complex and a compound composition including the metal complex.

37 Claims, 1 Drawing Sheet

(56) References Cited

U.S. PATENT DOCUMENTS

| | | | |
|---|---|---|---|
| 2022/0165968 | A1 | 5/2022 | Sang et al. |

FOREIGN PATENT DOCUMENTS

| | | | |
|---|---|---|---|
| CN | 113816996 | A | 12/2021 |
| CN | 114907412 | A | 8/2022 |
| CN | 114907413 | A | 8/2022 |
| KR | 20200096423 | A | 8/2020 |

OTHER PUBLICATIONS

Tang et al., "Organic electroluminescent diodes," Appl. Phys. Lett. vol. 51, No. 12, pp. 913-915, 1987.

Uoyama et al., "Highly efficient organic light-emitting diodes from delayed fluorescence," Nature, vol. 492, pp. 234-240, 2012.

* cited by examiner

ORGANIC ELECTROLUMINESCENT MATERIAL AND DEVICE THEREOF

CROSS-REFERENCE TO RELATED APPLICATION(S)

This application claims priority to Chinese Patent Application No. CN 202110389568.7 filed on Apr. 14, 2021, the disclosure of which is incorporated herein by reference in its entirety.

TECHNICAL FIELD

The present disclosure relates to compounds for organic electronic devices, for example, an organic light-emitting device. More particularly, the present disclosure relates to a metal complex comprising a ligand $L_a$ having a structure represented by Formula 1, an electroluminescent device comprising the metal complex, and a compound composition.

BACKGROUND

Organic electronic devices include, but are not limited to, the following types: organic light-emitting diodes (OLEDs), organic field-effect transistors (O-FETs), organic light-emitting transistors (OLETs), organic photovoltaic devices (OPVs), dye-sensitized solar cells (DSSCs), organic optical detectors, organic photoreceptors, organic field-quench devices (OFQDs), light-emitting electrochemical cells (LECs), organic laser diodes and organic plasmon emitting devices.

In 1987, Tang and Van Slyke of Eastman Kodak reported a bilayer organic electroluminescent device, which includes an arylamine hole transporting layer and a tris-8-hydroxyquinolato-aluminum layer as the electron and emitting layer (Applied Physics Letters, 1987, 51 (12): 913-915). Once a bias is applied to the device, green light was emitted from the device. This device laid the foundation for the development of modern organic light-emitting diodes (OLEDs). State-of-the-art OLEDs may include multiple layers such as charge injection and transporting layers, charge and exciton blocking layers, and one or multiple emissive layers between the cathode and anode. Since the OLED is a self-emitting solid state device, it offers tremendous potential for display and lighting applications. In addition, the inherent properties of organic materials, such as their flexibility, may make them well suited for particular applications such as fabrication on flexible substrates.

The OLED can be categorized as three different types according to its emitting mechanism. The OLED invented by Tang and van Slyke is a fluorescent OLED. It only utilizes singlet emission. The triplets generated in the device are wasted through nonradiative decay channels. Therefore, the internal quantum efficiency (IQE) of the fluorescent OLED is only 25%. This limitation hindered the commercialization of OLED. In 1997, Forrest and Thompson reported phosphorescent OLED, which uses triplet emission from heavy metal containing complexes as the emitter. As a result, both singlet and triplets can be harvested, achieving 100% IQE. The discovery and development of phosphorescent OLED contributed directly to the commercialization of active-matrix OLED (AMOLED) due to its high efficiency. Recently, Adachi achieved high efficiency through thermally activated delayed fluorescence (TADF) of organic compounds. These emitters have small singlet-triplet gap that makes the transition from triplet back to singlet possible. In the TADF device, the triplet excitons can go through reverse intersystem crossing to generate singlet excitons, resulting in high IQE.

OLEDs can also be classified as small molecule and polymer OLEDs according to the forms of the materials used. A small molecule refers to any organic or organometallic material that is not a polymer. The molecular weight of the small molecule can be large as long as it has well defined structure. Dendrimers with well-defined structures are considered as small molecules. Polymer OLEDs include conjugated polymers and non-conjugated polymers with pendant emitting groups. Small molecule OLED can become the polymer OLED if post polymerization occurred during the fabrication process.

There are various methods for OLED fabrication. Small molecule OLEDs are generally fabricated by vacuum thermal evaporation. Polymer OLEDs are fabricated by solution process such as spin-coating, inkjet printing, and slit printing. If the material can be dissolved or dispersed in a solvent, the small molecule OLED can also be produced by solution process.

The emitting color of the OLED can be achieved by emitter structural design. An OLED may include one emitting layer or a plurality of emitting layers to achieve desired spectrum. In the case of green, yellow, and red OLEDs, phosphorescent emitters have successfully reached commercialization. Blue phosphorescent device still suffers from non-saturated blue color, short device lifetime, and high operating voltage. Commercial full-color OLED displays normally adopt a hybrid strategy, using fluorescent blue and phosphorescent yellow, or red and green. At present, efficiency roll-off of phosphorescent OLEDs at high brightness remains a problem. In addition, it is desirable to have more saturated emitting color, higher efficiency, and longer device lifetime.

US2021054010 A1 discloses a ligand having a structure represented by

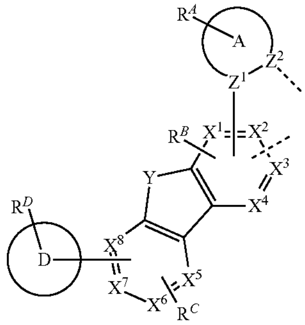
, wherein the ring D is a five- or six-membered carbocyclic ring or heterocyclic ring, and at least one $R^D$ is a carbocyclic ring or a heterocyclic ring, and further discloses the structure of iridium complexes, e.g.

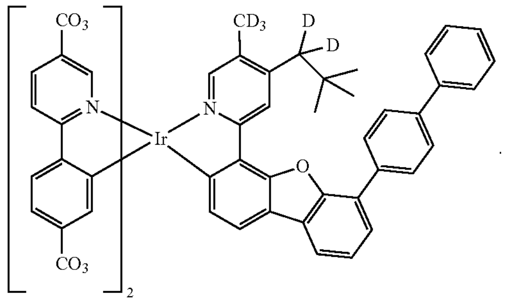

However, this application has neither disclosed nor taught the effects of the specific positions and lengths of the ring D and substituent $R^D$ and the introduction of the specific substituent $R_e$ on the device performance.

In the previous patent US20200251666A1, the applicant discloses a ligand having a structure represented by

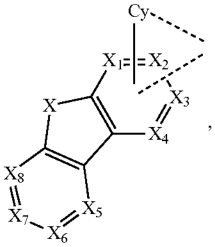

, wherein at least one of $X_1$ to $X_8$ is selected from C—CN, and further discloses an iridium complex having a structure represented by

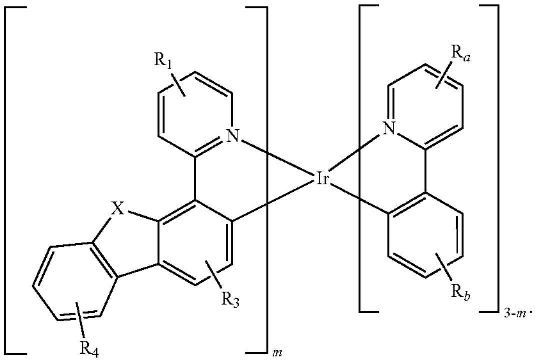

.

The complex, when used in organic electroluminescent devices, can improve device performance and color saturation and has reached a high level in the industry, but there is still room for improvement. However, this application has neither disclosed nor taught the effect of the specific position and length of substituent $R_4$ on the device performance.

In the previous patent US20200091442A1, the applicant discloses a ligand having a structure represented by

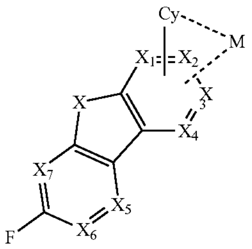

and further discloses an iridium complex having a structure represented by

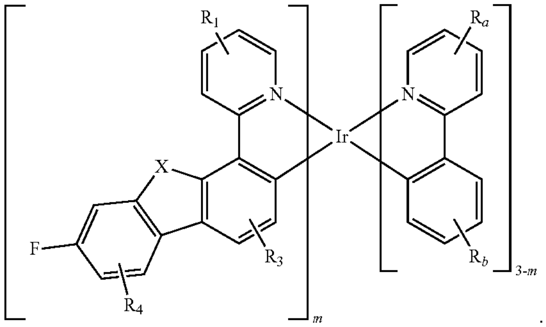

.

In this application, fluorine at a particular position of the ligand can improve material performance, device lifetime, and thermal stability. However, this application has neither disclosed nor taught the effect of the specific position and length of substituent $R_4$ on the device performance.

SUMMARY

The present disclosure aims to provide a series of metal complexes comprising a ligand $L_a$ having a structure represented by Formula 1 to solve at least part of the above-mentioned problems.

According to an embodiment of the present disclosure, a metal complex is disclosed. The metal complex comprises a metal M and a ligand $L_a$ coordinated to the metal M, wherein the metal M is selected from metals having a relative atomic mass greater than 40, and $L_a$ has a structure represented by Formula 1:

Formula 1

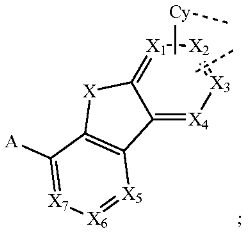

;

wherein in Formula 1,

Cy is, at each occurrence identically or differently, selected from a substituted or unsubstituted aromatic ring having 6 to 24 ring atoms, a substituted or unsubstituted heteroaromatic ring having 5 to 24 ring atoms or combinations thereof;

X is selected from the group consisting of O, S, Se, NR', CR'R', SiR'R', and GeR'R'; when two R' are present, the two R' are identical or different;

$X_1$ to $X_7$ are, at each occurrence identically or differently, selected from C, $CR_x$ or N; at least one of $X_1$ to $X_4$ is C and is attached to Cy;

$X_1$, $X_2$, $X_3$ or $X_4$ is attached to the metal M through a metal-carbon bond or a metal-nitrogen bond;

at least one of $X_1$ to $X_7$ is $CR_x$, wherein the $R_x$ is cyano or fluorine;

A has a structure represented by Formula 2:

Formula 2

$$*—A_1—(A_2)_a—R_{a3};$$

wherein a is selected from 1, 2, 3, 4 or 5;

$A_1$ is, at each occurrence identically or differently, selected from the group consisting of: O, S, Se, NR", SiR"R", GeR"R", BR", PR", P(O)R", following groups unsubstituted or substituted by one or at least two $R_{a2}$: alkylene having 1 to 20 carbon atoms, heteroalkylene having 1 to 20 carbon atoms, cycloalkylene having 3 to 20 carbon atoms, heterocyclene having 3 to 20 ring atoms, phenylene and heteroarylene having 5 to 6 ring atoms, and combinations thereof;

$A_2$ is, at each occurrence identically or differently, selected from the group consisting of: O, S, Se, NR", SiR"R", GeR"R", BR", PR", P(O)R", following groups unsubstituted or substituted by one or at least two $R_{a2}$: alkylene having 1 to 20 carbon atoms, heteroalkylene having 1 to 20 carbon atoms, cycloalkylene having 3 to 20 carbon atoms, heterocyclene having 3 to 20 ring atoms, arylene having 6 to 30 carbon atoms and heteroarylene having 3 to 30 carbon atoms, and combinations thereof;

R', R", $R_x$, $R_{a1}$, $R_{a2}$, and $R_{a3}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof;

adjacent substituents R', R", $R_x$, $R_{a2}$, $R_{a3}$ can be optionally joined to form a ring;

the length of A is at least 6.7 Å;

"*" represents a position where A is attached;

when $A_1$ is selected from phenylene unsubstituted or substituted by one or at least two $R_{a1}$ or heteroarylene having 5 to 6 ring atoms unsubstituted or substituted by one or at least two $R_{a1}$, $A_2$ and $R_{a1}$ need to satisfy the following conditions:

1) $A_2$ that is directly attached to $A_1$ is, at each occurrence identically or differently, selected from the group consisting of: O, S, Se, NR", SiR"R", GeR"R", BR", PR", P(O)R", following groups unsubstituted or substituted by one or at least two $R_{a2}$: alkylene having 1 to 20 carbon atoms, heteroalkylene having 1 to 20 carbon atoms, cycloalkylene having 3 to 20 carbon atoms and heterocyclene having 3 to 20 ring atoms, and combinations thereof; and 2) $R_{a1}$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof.

According to another embodiment of the present disclosure, an electroluminescent device is further disclosed. The electroluminescent device comprises:

an anode, a cathode, and an organic layer disposed between the anode and the cathode, wherein the organic layer comprises the metal complex described in the above-mentioned embodiment.

According to another embodiment of the present disclosure, a compound composition is further disclosed. The compound composition comprises the metal complex described in the above-mentioned embodiment.

The present disclosure discloses a series of metal complexes comprising a ligand $L_a$ having a structure of Formula 1, and the metal complexes can be used as luminescent materials in electroluminescent devices. These novel metal complexes, when used in electroluminescent devices, can reduce the device voltage, improve the device efficiency, and ultimately achieve the beneficial effect of significantly improving the comprehensive performance of devices.

DETAILED DESCRIPTION

Figure 1:
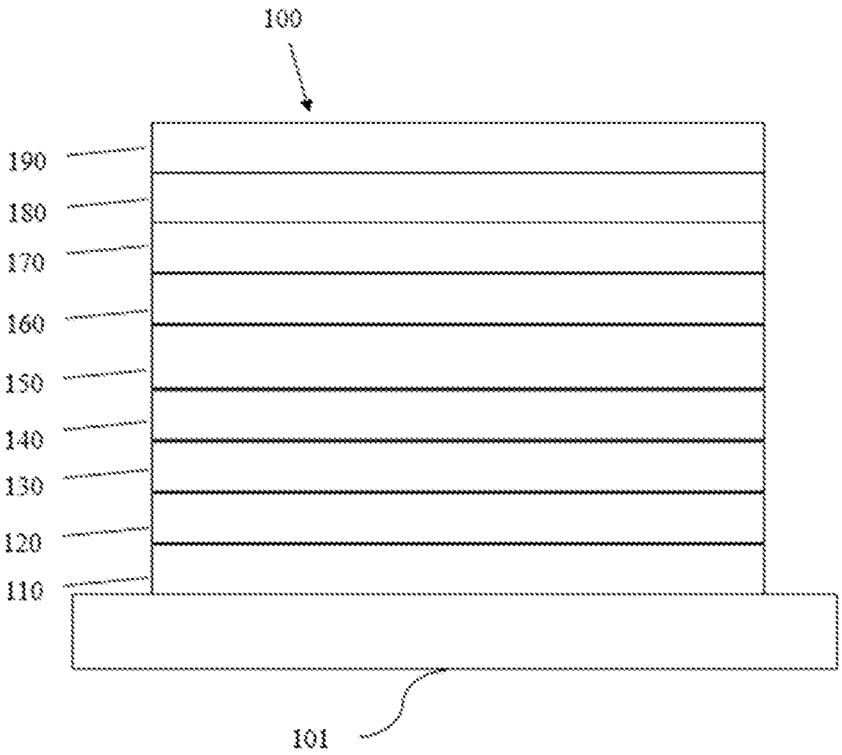
FIG. 1 is a schematic diagram of an electroluminescent device comprising a metal complex and a compound composition disclosed in the present disclosure.

OLEDs can be fabricated on various types of substrates such as glass, plastic, and metal foil. FIG. 1 schematically shows an organic light-emitting device 100 without limitation. The figures are not necessarily drawn to scale. Some of the layers in the figures can also be omitted as needed. Device 100 may include a substrate 101, an anode 110, a hole injection layer 120, a hole transport layer 130, an electron blocking layer 140, an emissive layer 150, a hole blocking layer 160, an electron transport layer 170, an electron injection layer 180 and a cathode 190. Device 100 may be fabricated by depositing the layers described in order. The properties and functions of these various layers, as well as example materials, are described in more detail in U.S. Pat. No. 7,279,704 at cols. 6-10, the contents of which are incorporated by reference herein in its entirety.

More examples for each of these layers are available. For example, a flexible and transparent substrate-anode combination is disclosed in U.S. Pat. No. 5,844,363, which is incorporated by reference herein in its entirety. An example of a p-doped hole transport layer is m-MTDATA doped with F4-TCNQ at a molar ratio of 50:1, as disclosed in U.S. Patent Application Publication No. 2003/0230980, which is incorporated by reference herein in its entirety. Examples of host materials are disclosed in U.S. Pat. No. 6,303,238 to Thompson et al., which is incorporated by reference herein in its entirety. An example of an n-doped electron transport layer is BPhen doped with Li at a molar ratio of 1:1, as disclosed in U.S. Patent Application Publication No. 2003/0230980, which is incorporated by reference herein in its entirety. U.S. Pat. Nos. 5,703,436 and 5,707,745, which are incorporated by reference herein in their entireties, disclose examples of cathodes including composite cathodes having a thin layer of metal such as Mg:Ag with an overlying transparent, electrically-conductive, sputter-deposited ITO layer. The theory and use of blocking layers are described in more detail in U.S. Pat. No. 6,097,147 and U.S. Patent Application Publication No. 2003/0230980, which are incorporated by reference herein in their entireties. Examples of injection layers are provided in U.S. Patent Application Publication No. 2004/0174116, which is incorporated by reference herein in its entirety. A description of protective layers may be found in U.S. Patent Application Publication No. 2004/0174116, which is incorporated by reference herein in its entirety.

The layered structure described above is provided by way of non-limiting examples. Functional OLEDs may be achieved by combining the various layers described in different ways, or layers may be omitted entirely. It may also include other layers not specifically described. Within each layer, a single material or a mixture of multiple materials can be used to achieve optimum performance. Any functional layer may include several sublayers. For example, the emissive layer may have two layers of different emitting materials to achieve desired emission spectrum.

In one embodiment, an OLED may be described as having an "organic layer" disposed between a cathode and an anode. This organic layer may include a single layer or multiple layers.

Figure 2:
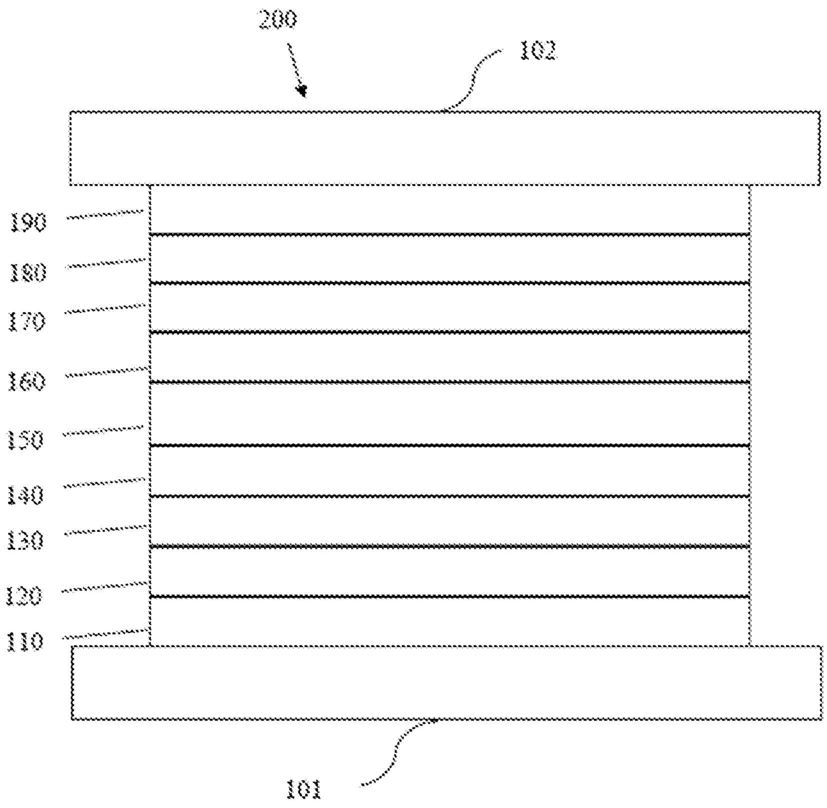
FIG. 2 is a schematic diagram of another electroluminescent device comprising a metal complex and a compound composition disclosed in the present disclosure.

An OLED can be encapsulated by a barrier layer. FIG. 2 schematically shows an organic light emitting device 200 without limitation. FIG. 2 differs from FIG. 1 in that the organic light emitting device include a barrier layer 102, which is above the cathode 190, to protect it from harmful species from the environment such as moisture and oxygen. Any material that can provide the barrier function can be used as the barrier layer such as glass or organic-inorganic hybrid layers. The barrier layer should be placed directly or indirectly outside of the OLED device. Multilayer thin film encapsulation was described in U.S. Pat. No. 7,968,146, which is incorporated by reference herein in its entirety.

Devices fabricated in accordance with embodiments of the present disclosure can be incorporated into a wide variety of consumer products that have one or more of the electronic component modules (or units) incorporated therein. Some examples of such consumer products include flat panel displays, monitors, medical monitors, televisions, billboards, lights for interior or exterior illumination and/or signaling, heads-up displays, fully or partially transparent displays, flexible displays, smart phones, tablets, phablets, wearable devices, smart watches, laptop computers, digital cameras, camcorders, viewfinders, micro-displays, 3-D displays, vehicles displays, and vehicle tail lights.

The materials and structures described herein may be used in other organic electronic devices listed above.

As used herein, "top" means furthest away from the substrate, while "bottom" means closest to the substrate. Where a first layer is described as "disposed over" a second layer, the first layer is disposed further away from the substrate. There may be other layers between the first and second layers, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

It is believed that the internal quantum efficiency (IQE) of fluorescent OLEDs can exceed the 25% spin statistics limit through delayed fluorescence. As used herein, there are two types of delayed fluorescence, i.e. P-type delayed fluorescence and E-type delayed fluorescence. P-type delayed fluorescence is generated from triplet-triplet annihilation (TTA).

On the other hand, E-type delayed fluorescence does not rely on the collision of two triplets, but rather on the transition between the triplet states and the singlet excited states. Compounds that are capable of generating E-type delayed fluorescence are required to have very small singlet-triplet gaps to convert between energy states. Thermal energy can activate the transition from the triplet state back to the singlet state. This type of delayed fluorescence is also known as thermally activated delayed fluorescence (TADF). A distinctive feature of TADF is that the delayed component increases as temperature rises. If the reverse intersystem crossing (RISC) rate is fast enough to minimize the non-radiative decay from the triplet state, the fraction of back populated singlet excited states can potentially reach 75%. The total singlet fraction can be 100%, far exceeding 25% of the spin statistics limit for electrically generated excitons.

E-type delayed fluorescence characteristics can be found in an exciplex system or in a single compound. Without being bound by theory, it is believed that E-type delayed fluorescence requires the luminescent material to have a small singlet-triplet energy gap ($\Delta_{ES-T}$). Organic, non-metal containing, donor-acceptor luminescent materials may be able to achieve this. The emission in these materials is generally characterized as a donor-acceptor charge-transfer (CT) type emission. The spatial separation of the HOMO and LUMO in these donor-acceptor type compounds generally results in small $\Delta_{ES-T}$. These states may involve CT states. Generally, donor-acceptor luminescent materials are constructed by connecting an electron donor moiety such as amino- or carbazole-derivatives and an electron acceptor moiety such as N-containing six-membered aromatic rings.

Definition of Terms of Substituents

Halogen or halide—as used herein includes fluorine, chlorine, bromine, and iodine.

Alkyl—as used herein includes both straight and branched chain alkyl groups. Alkyl may be alkyl having 1 to 20 carbon atoms, preferably alkyl having 1 to 12 carbon atoms, and more preferably alkyl having 1 to 6 carbon atoms. Examples of alkyl groups include a methyl group, an ethyl group, a propyl group, an isopropyl group, a n-butyl group, an s-butyl group, an isobutyl group, a t-butyl group, an n-pentyl group, an n-hexyl group, an n-heptyl group, an n-octyl group, an n-nonyl group, an n-decyl group, an n-undecyl group, an n-dodecyl group, an n-tridecyl group, an n-tetradecyl group, an n-pentadecyl group, an n-hexadecyl group, an n-heptadecyl group, an n-octadecyl group, a neopentyl group, a 1-methylpentyl group, a 2-methylpentyl group, a 1-pentylhexyl group, a 1-butylpentyl group, a 1-heptyloctyl group, and a 3-methylpentyl group. Of the above, preferred are a methyl group, an ethyl group, a propyl group, an isopropyl group, a n-butyl group, an s-butyl group, an isobutyl group, a t-butyl group, an n-pentyl group, a neopentyl group, and an n-hexyl group. Additionally, the alkyl group may be optionally substituted.

Cycloalkyl—as used herein includes cyclic alkyl groups. The cycloalkyl groups may be those having 3 to 20 ring carbon atoms, preferably those having 4 to 10 carbon atoms. Examples of cycloalkyl include cyclobutyl, cyclopentyl, cyclohexyl, 4-methylcyclohexyl, 4,4-dimethylcylcohexyl, 1-adamantyl, 2-adamantyl, 1-norbornyl, 2-norbornyl, and the like. Of the above, preferred are cyclopentyl, cyclohexyl, 4-methylcyclohexyl, and 4,4-dimethylcylcohexyl. Additionally, the cycloalkyl group may be optionally substituted.

Heteroalkyl—as used herein, includes a group formed by replacing one or more carbons in an alkyl chain with a hetero-atom(s) selected from the group consisting of a nitrogen atom, an oxygen atom, a sulfur atom, a selenium atom, a phosphorus atom, a silicon atom, a germanium atom, and a boron atom. Heteroalkyl may be those having 1 to 20 carbon atoms, preferably those having 1 to 10 carbon atoms, and more preferably those having 1 to 6 carbon atoms. Examples of heteroalkyl include methoxymethyl, ethoxymethyl, ethoxyethyl, methylthiomethyl, ethylthiomethyl, ethylthioethyl, methoxymethoxymethyl, ethoxymethoxymethyl, ethoxyethoxyethyl, hydroxymethyl, hydroxyethyl, hydroxypropyl, mercaptomethyl, mercaptoethyl, mercaptopropyl, aminomethyl, aminoethyl, aminopropyl, dimethylaminomethyl, trimethylgermanylmethyl, trimethylgermanylethyl, trimethylgermanylisopropyl, dimethylethylgermanylmethyl, dimethylisopropylgermanylmethyl, tert-butylmethylgermanylmethyl, triethylgermanylmethyl, triethylgermanylethyl, triisopropylgermanylmethyl, triisopropylgermanylethyl, trimethylsilylmethyl, trimethylsilylethyl, and trimethylsilylisopropyl, triisopropylsilylmethyl, triisopropylsilylethyl. Additionally, the heteroalkyl group may be optionally substituted.

Alkenyl—as used herein includes straight chain, branched chain, and cyclic alkene groups. Alkenyl may be those having 2 to 20 carbon atoms, preferably those having 2 to 10 carbon atoms. Examples of alkenyl include vinyl, 1-propenyl group, 1-butenyl, 2-butenyl, 3-butenyl, 1,3-butandienyl, 1-methylvinyl, styryl, 2,2-diphenylvinyl, 1,2-diphenylvinyl, 1-methylallyl, 1,1-dimethylallyl, 2-methylallyl, 1-phenylallyl, 2-phenylallyl, 3-phenylallyl, 3,3-diphenylallyl, 1,2-dimethylallyl, 1-phenyl-1-butenyl, 3-phenyl-1-butenyl, cyclopentenyl, cyclopentadienyl, cyclohexenyl, cycloheptenyl, cycloheptatrienyl, cyclooctenyl, cyclooctatetraenyl, and norbornenyl. Additionally, the alkenyl group may be optionally substituted.

Alkynyl—as used herein includes straight chain alkynyl groups. Alkynyl may be those having 2 to 20 carbon atoms, preferably those having 2 to 10 carbon atoms. Examples of alkynyl groups include ethynyl, propynyl, propargyl, 1-butynyl, 2-butynyl, 3-butynyl, 1-pentynyl, 2-pentynyl, 3,3-dimethyl-1-butynyl, 3-ethyl-3-methyl-1-pentynyl, 3,3-diisopropyl-1-pentynyl, phenylethynyl, phenylpropynyl, etc. Of the above, preferred are ethynyl, propynyl, propargyl, 1-butynyl, 2-butynyl, 3-butynyl, 1-pentynyl, and phenylethynyl. Additionally, the alkynyl group may be optionally substituted.

Aryl or an aromatic group—as used herein includes non-condensed and condensed systems. Aryl may be those having 6 to 30 carbon atoms, preferably those having 6 to 20 carbon atoms, and more preferably those having 6 to 12 carbon atoms. Examples of aryl groups include phenyl, biphenyl, terphenyl, triphenylene, tetraphenylene, naphthalene, anthracene, phenalene, phenanthrene, fluorene, pyrene, chrysene, perylene, and azulene, preferably phenyl, biphenyl, terphenyl, triphenylene, fluorene, and naphthalene. Examples of non-condensed aryl groups include phenyl, biphenyl-2-yl, biphenyl-3-yl, biphenyl-4-yl, p-terphenyl-4-yl, p-terphenyl-3-yl, p-terphenyl-2-yl, m-terphenyl-4-yl, m-terphenyl-3-yl, m-terphenyl-2-yl, o-tolyl, m-tolyl, p-tolyl, p-(2-phenylpropyl)phenyl, 4'-methylbiphenylyl, 4"-t-butyl-p-terphenyl-4-yl, o-cumenyl, m-cumenyl, p-cumenyl, 2,3-xylyl, 3,4-xylyl, 2,5-xylyl, mesityl, and m-quarterphenyl. Additionally, the aryl group may be optionally substituted.

Heterocyclic groups or heterocycle—as used herein include non-aromatic cyclic groups. Non-aromatic heterocyclic groups includes saturated heterocyclic groups having 3 to 20 ring atoms and unsaturated non-aromatic heterocyclic groups having 3 to 20 ring atoms, where at least one ring atom is selected from the group consisting of a nitrogen atom, an oxygen atom, a sulfur atom, a selenium atom, a silicon atom, a phosphorus atom, a germanium atom, and a boron atom. Preferred non-aromatic heterocyclic groups are those having 3 to 7 ring atoms, each of which includes at least one hetero-atom such as nitrogen, oxygen, silicon, or sulfur. Examples of non-aromatic heterocyclic groups include oxiranyl, oxetanyl, tetrahydrofuranyl, tetrahydropyranyl, dioxolanyl, dioxanyl, aziridinyl, dihydropyrrolyl, tetrahydropyrrolyl, piperidinyl, oxazolidinyl, morpholinyl, piperazinyl, oxepinyl, thiepinyl, azepinyl, and tetrahydrosilolyl. Additionally, the heterocyclic group may be optionally substituted.

Heteroaryl—as used herein, includes non-condensed and condensed hetero-aromatic groups having 1 to 5 hetero-atoms, where at least one hetero-atom is selected from the group consisting of a nitrogen atom, an oxygen atom, a sulfur atom, a selenium atom, a silicon atom, a phosphorus atom, a germanium atom, and a boron atom. A heteroaromatic group is also referred to as heteroaryl. Heteroaryl may be those having 3 to 30 carbon atoms, preferably those having 3 to 20 carbon atoms, and more preferably those having 3 to 12 carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridoindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group may be optionally substituted.

Alkoxy—as used herein, is represented by —O-alkyl, —O-cycloalkyl, —O-heteroalkyl, or —O-heterocyclic group. Examples and preferred examples of alkyl, cycloalkyl, heteroalkyl, and heterocyclic groups are the same as those described above. Alkoxy groups may be those having 1 to 20 carbon atoms, preferably those having 1 to 6 carbon atoms. Examples of alkoxy groups include methoxy, ethoxy, propoxy, butoxy, pentyloxy, hexyloxy, cyclopropyloxy, cyclobutyloxy, cyclopentyloxy, cyclohexyloxy, tetrahydrofuranyloxy, tetrahydropyranyloxy, methoxypropyloxy, ethoxyethyloxy, methoxymethyloxy, and ethoxymethyloxy. Additionally, the alkoxy group may be optionally substituted.

Aryloxy—as used herein, is represented by —O-aryl or —O-heteroaryl. Examples and preferred examples of aryl and heteroaryl are the same as those described above. Aryloxy groups may be those having 6 to 30 carbon atoms, preferably those having 6 to 20 carbon atoms. Examples of aryloxy groups include phenoxy and biphenyloxy. Additionally, the aryloxy group may be optionally substituted.

Arylalkyl—as used herein, contemplates alkyl substituted with an aryl group. Arylalkyl may be those having 7 to 30 carbon atoms, preferably those having 7 to 20 carbon atoms, and more preferably those having 7 to 13 carbon atoms. Examples of arylalkyl groups include benzyl, 1-phenylethyl, 2-phenylethyl, 1-phenylisopropyl, 2-phenylisopropyl, phenyl-t-butyl, alpha-naphthylmethyl, 1-alpha-naphthylethyl, 2-alpha-naphthylethyl, 1-alpha-naphthylisopropyl, 2-alpha-naphthylisopropyl, beta-naphthylmethyl, 1-beta-naphthylethyl, 2-beta-naphthylethyl, 1-beta-naphthylisopropyl, 2-beta-naphthylisopropyl, p-methylbenzyl, m-methylbenzyl, o-methylbenzyl, p-chlorobenzyl, m-chlorobenzyl, o-chlorobenzyl, p-bromobenzyl, m-bromobenzyl, o-bromobenzyl, p-iodobenzyl, m-iodobenzyl, o-iodobenzyl, p-hydroxybenzyl, m-hydroxybenzyl, o-hydroxybenzyl, p-aminobenzyl, m-aminobenzyl, o-aminobenzyl, p-nitrobenzyl, m-nitrobenzyl, o-nitrobenzyl, p-cyanobenzyl, m-cyanobenzyl, o-cyanobenzyl, 1-hydroxy-2-phenylisopropyl, and 1-chloro-2-phenylisopropyl. Of the above, preferred are benzyl, p-cyanobenzyl, m-cyanobenzyl, o-cyanobenzyl, 1-phenylethyl, 2-phenylethyl, 1-phenylisopropyl, and 2-phenylisopropyl. Additionally, the arylalkyl group may be optionally substituted.

Alkylsilyl—as used herein, contemplates a silyl group substituted with an alkyl group. Alkylsilyl groups may be those having 3 to 20 carbon atoms, preferably those having 3 to 10 carbon atoms. Examples of alkylsilyl groups include trimethylsilyl, triethylsilyl, methyldiethylsilyl, ethyldimethylsilyl, tripropylsilyl, tributylsilyl, triisopropylsilyl, methyldiisopropylsilyl, dimethylisopropylsilyl, tri-t-butylsilyl, triisobutylsilyl, dimethyl t-butylsilyl, and methyldi-t-butylsilyl. Additionally, the alkylsilyl group may be optionally substituted.

Arylsilyl—as used herein, contemplates a silyl group substituted with an aryl group. Arylsilyl groups may be those having 6 to 30 carbon atoms, preferably those having 8 to 20 carbon atoms. Examples of arylsilyl groups include triphenylsilyl, phenyldibiphenylylsilyl, diphenylbiphenylsilyl, phenyldiethylsilyl, diphenylethylsilyl, phenyldimethylsilyl, diphenylmethylsilyl, phenyldiisopropylsilyl, diphenylisopropylsilyl, diphenylbutylsilyl, diphenylisobutylsilyl, diphenyl t-butylsilyl. Additionally, the arylsilyl group may be optionally substituted.

Alkylgermanyl—as used herein contemplates a germanyl substituted with an alkyl group. The alkylgermanyl may be those having 3 to 20 carbon atoms, preferably those having 3 to 10 carbon atoms. Examples of alkylgermanyl include trimethylgermanyl, triethylgermanyl, methyldiethylgermanyl, ethyldimethylgermanyl, tripropylgermanyl, tributylgermanyl, triisopropylgermanyl, methyldiisopropylgermanyl, dimethylisopropylgermanyl, tri-t-butylgermanyl, triisobutylgermanyl, dimethyl-t-butylgermanyl, and methyldi-t-butylgermanyl. Additionally, the alkylgermanyl may be optionally substituted.

Arylgermanyl—as used herein contemplates a germanyl substituted with at least one aryl group or heteroaryl group. Arylgermanyl may be those having 6 to 30 carbon atoms, preferably those having 8 to 20 carbon atoms. Examples of arylgermanyl include triphenylgermanyl, phenyldibiphenylylgermanyl, diphenylbiphenylgermanyl, phenyldiethylgermanyl, diphenylethylgermanyl, phenyldimethylgermanyl, diphenylmethylgermanyl, phenyldiisopropylgermanyl, diphenylisopropylgermanyl, diphenylbutylgermanyl, diphenylisobutylgermanyl, and diphenyl-t-butylgermanyl. Additionally, the arylgermanyl may be optionally substituted.

The term "aza" in azadibenzofuran, azadibenzothiophene, etc. means that one or more of C—H groups in the respective aromatic fragment are replaced by a nitrogen atom. For example, azatriphenylene encompasses dibenzo[f,h]quinoxaline, dibenzo[f,h]quinoline and other analogs with two or more nitrogens in the ring system. One of ordinary skill in the art can readily envision other nitrogen analogs of the aza-derivatives described above, and all such analogs are intended to be encompassed by the terms as set forth herein.

In the present disclosure, unless otherwise defined, when any term of the group consisting of substituted alkyl, substituted cycloalkyl, substituted heteroalkyl, substituted heterocyclic group, substituted arylalkyl, substituted alkoxy, substituted aryloxy, substituted alkenyl, substituted alkynyl, substituted aryl, substituted heteroaryl, substituted alkylsilyl, substituted arylsilyl, substituted alkylgermanyl, substituted arylgermanyl, substituted amino, substituted acyl, substituted carbonyl, a substituted carboxylic acid group, a substituted ester group, substituted sulfinyl, substituted sulfonyl, and substituted phosphino is used, it means that any group of alkyl, cycloalkyl, heteroalkyl, heterocyclic group, arylalkyl, alkoxy, aryloxy, alkenyl, alkynyl, aryl, heteroaryl, alkylsilyl, arylsilyl, amino, acyl, carbonyl, a carboxylic acid group, an ester group, sulfinyl, sulfonyl, and phosphino may be substituted with one or more moieties selected from the group consisting of deuterium, halogen, unsubstituted alkyl having 1 to 20 carbon atoms, unsubstituted cycloalkyl having 3 to 20 ring carbon atoms, unsubstituted heteroalkyl having 1 to 20 carbon atoms, an unsubstituted heterocyclic group having 3 to 20 ring atoms, unsubstituted arylalkyl having 7 to 30 carbon atoms, unsubstituted alkoxy having 1 to 20 carbon atoms, unsubstituted aryloxy having 6 to 30 carbon atoms, unsubstituted alkenyl having 2 to 20 carbon atoms, unsubstituted alkynyl having 2 to 20 carbon atoms, unsubstituted aryl having 6 to 30 carbon atoms, unsubstituted heteroaryl having 3 to 30 carbon atoms, unsubstituted alkylsilyl having 3 to 20 carbon atoms, unsubstituted arylsilyl group having 6 to 20 carbon atoms, unsubstituted alkylgermanyl having 3 to 20 carbon atoms, unsubstituted arylgermanyl having 6 to 20 carbon atoms, unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or an attached fragment are considered to be equivalent.

In the compounds mentioned in the present disclosure, hydrogen atoms may be partially or fully replaced by deuterium. Other atoms such as carbon and nitrogen may also be replaced by their other stable isotopes. The replacement by other stable isotopes in the compounds may be preferred due to its enhancements of device efficiency and stability.

In the compounds mentioned in the present disclosure, multiple substitution refers to a range that includes a di-substitution, up to the maximum available substitution. When substitution in the compounds mentioned in the present disclosure represents multiple substitution (including di-, tri-, and tetra-substitutions etc.), that means the substituent may exist at a plurality of available substitution positions on its linking structure, the substituents present at a plurality of available substitution positions may have the same structure or different structures.

In the compounds mentioned in the present disclosure, adjacent substituents in the compounds cannot be joined to form a ring unless otherwise explicitly defined, for example, adjacent substituents can be optionally joined to form a ring. In the compounds mentioned in the present disclosure, the expression that adjacent substituents can be optionally joined to form a ring includes a case where adjacent substituents may be joined to form a ring and a case where adjacent substituents are not joined to form a ring. When adjacent substituents can be optionally joined to form a ring, the ring formed may be monocyclic or polycyclic (including spirocyclic, endocyclic, fused cyclic, and etc.), as well as alicyclic, heteroalicyclic, aromatic, or heteroaromatic. In such expression, adjacent substituents may refer to substituents bonded to the same atom, substituents bonded to carbon atoms which are directly bonded to each other, or substituents bonded to carbon atoms which are more distant from each other. Preferably, adjacent substituents refer to substituents bonded to the same carbon atom and substituents bonded to carbon atoms which are directly bonded to each other.

The expression that adjacent substituents can be optionally joined to form a ring is also intended to mean that two substituents bonded to the same carbon atom are joined to each other via a chemical bond to form a ring, which can be exemplified by the following formula:

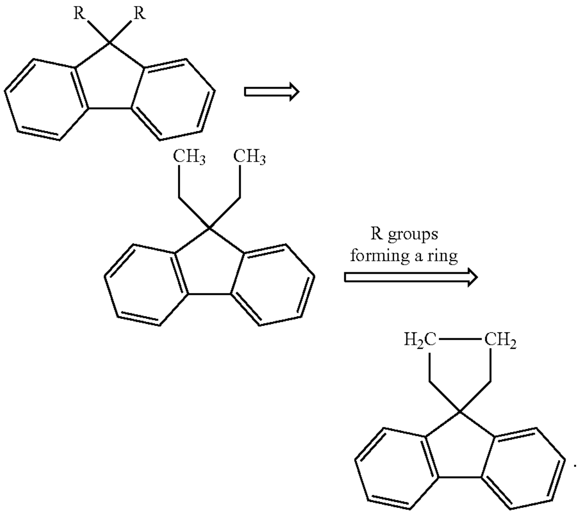

The expression that adjacent substituents can be optionally joined to form a ring is also intended to mean that two substituents bonded to carbon atoms which are directly bonded to each other are joined to each other via a chemical bond to form a ring, which can be exemplified by the following formula:

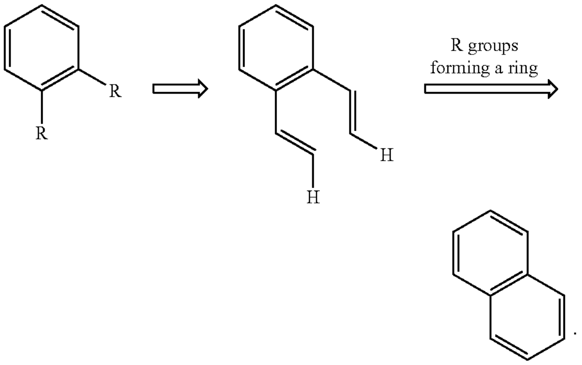

The expression that adjacent substituents can be optionally joined to form a ring is also intended to mean that two substituents bonded to a further distant carbon atom are joined to each other via a chemical bond to form a ring, which can be exemplified by the following formula:

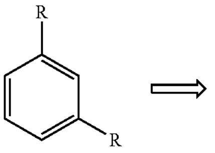

-continued

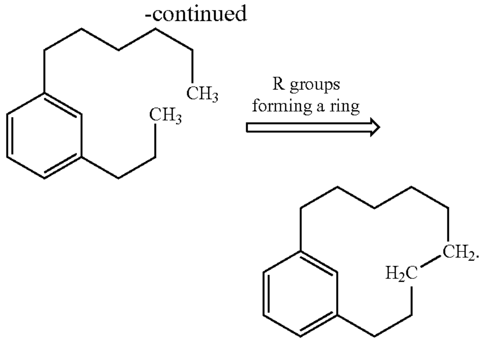

Furthermore, the expression that adjacent substituents can be optionally joined to form a ring is also intended to mean that, in the case where one of the two substituents bonded to carbon atoms which are directly bonded to each other represents hydrogen, the second substituent is bonded at a position at which the hydrogen atom is bonded, thereby forming a ring. This is exemplified by the following formula:

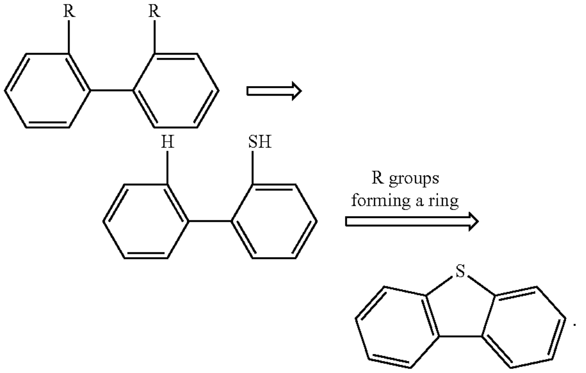

According to an embodiment of the present disclosure, a metal complex is disclosed. The metal complex comprises a metal M and a ligand $L_a$ coordinated to the metal M, wherein the metal M is selected from metals having a relative atomic mass greater than 40, and $L_a$ has a structure represented by Formula 1:

Formula 1

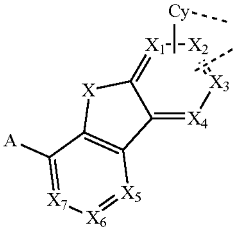

wherein in Formula 1,

Cy is, at each occurrence identically or differently, selected from a substituted or unsubstituted aromatic ring having 6 to 24 ring atoms, a substituted or unsubstituted heteroaromatic ring having 5 to 24 ring atoms or combinations thereof;

X is selected from the group consisting of O, S, Se, NR', CR'R', SiR'R', and GeR'R'; when two R' are present, the two R' are identical or different;

$X_1$ to $X_7$ are, at each occurrence identically or differently, selected from C, $CR_x$ or N; at least one of $X_1$ to $X_4$ is C and is attached to Cy;

$X_1$, $X_2$, $X_3$ or $X_4$ is attached to the metal M through a metal-carbon bond or a metal-nitrogen bond;

at least one of $X_1$ to $X_7$ is $CR_x$, wherein the $R_x$ is cyano or fluorine;

A has a structure represented by Formula 2:

Formula 2

$$*-A_1-(A_2)_a-R_{a3};$$

wherein a is selected from 1, 2, 3, 4 or 5;

$A_1$ is, at each occurrence identically or differently, selected from the group consisting of: O, S, Se, NR", SiR"R", GeR"R", BR", PR", P(O)R", following groups unsubstituted or substituted by one or at least two $R_{a1}$: alkylene having 1 to 20 carbon atoms, heteroalkylene having 1 to 20 carbon atoms, cycloalkylene having 3 to 20 carbon atoms, heterocyclene having 3 to 20 ring atoms, arylene having 6 to 30 carbon atoms and heteroarylene having 3 to 30 carbon atoms, and combinations thereof;

$A_2$ is, at each occurrence identically or differently, selected from the group consisting of: O, S, Se, NR", SiR"R", GeR"R", BR", PR", P(O)R", following groups unsubstituted or substituted by one or at least two $R_{a2}$: alkylene having 1 to 20 carbon atoms, heteroalkylene having 1 to 20 carbon atoms, cycloalkylene having 3 to 20 carbon atoms, heterocyclene having 3 to 20 ring atoms, arylene having 6 to 30 carbon atoms and heteroarylene having 3 to 30 carbon atoms, and combinations thereof;

R', R", $R_x$, $R_{a1}$, $R_{a2}$, and $R_{a3}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof;

adjacent substituents R', R", $R_x$, $R_{a1}$, $R_{a2}$, $R_{a3}$ can be optionally joined to form a ring;

the length of A is at least 6.7 Å;

"*" represents a position where A is attached.

According to an embodiment of the present disclosure, a metal complex is disclosed. The metal complex comprises a metal M and a ligand $L_a$ coordinated to the metal M, wherein the metal M is selected from metals having a relative atomic mass greater than 40, and $L_a$ has a structure represented by Formula 1:

Formula 1

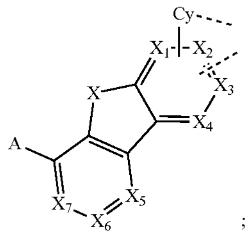

;

wherein in Formula 1,

Cy is, at each occurrence identically or differently, selected from a substituted or unsubstituted aromatic ring having 6 to 24 ring atoms, a substituted or unsubstituted heteroaromatic ring having 5 to 24 ring atoms or combinations thereof;

X is selected from the group consisting of O, S, Se, NR', CR'R', SiR'R', and GeR'R'; when two R' are present, the two R' are identical or different;

$X_1$ to $X_7$ are, at each occurrence identically or differently, selected from C, $CR_x$ or N; at least one of $X_1$ to $X_4$ is C and is attached to Cy;

$X_1$, $X_2$, $X_3$ or $X_4$ is attached to the metal M through a metal-carbon bond or a metal-nitrogen bond;

at least one of $X_1$ to $X_7$ is $CR_x$, wherein the $R_x$, is a cyano group or fluorine;

A has a structure represented by Formula 2:

Formula 2

$$*-A_1-(A_2)_a-R_{a3};$$

wherein a is selected from 1, 2, 3, 4 or 5;

$A_1$ is, at each occurrence identically or differently, selected from the group consisting of: O, S, Se, NR", SiR"R", GeR"R", BR", PR", P(O)R", following groups unsubstituted or substituted by one or at least two $R_{a1}$: alkylene having 1 to 20 carbon atoms, heteroalkylene having 1 to 20 carbon atoms, cycloalkylene having 3 to 20 carbon atoms, heterocyclene having 3 to 20 ring atoms, phenylene and heteroarylene having 5 to 6 ring atoms, and combinations thereof;

$A_2$ is, at each occurrence identically or differently, selected from the group consisting of: O, S, Se, NR", SiR"R", GeR"R", BR", PR", P(O)R", following groups unsubstituted or substituted by one or at least two $R_{a2}$: alkylene having 1 to 20 carbon atoms, heteroalkylene having 1 to 20 carbon atoms, cycloalkylene having 3 to 20 carbon atoms, heterocyclene having 3 to 20 ring atoms, arylene having 6 to 30 carbon atoms and heteroarylene having 3 to 30 carbon atoms, and combinations thereof;

R', R", $R_x$, $R_{a1}$, $R_{a2}$, and $R_{a3}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof;

adjacent substituents R', R", $R_x$, $R_{a2}$, $R_{a3}$ can be optionally joined to form a ring;

the length of A is at least 6.7 Å;

"*" represents a position where A is attached;

when $A_1$ is selected from phenylene unsubstituted or substituted by one or at least two $R_{a1}$ or heteroarylene having 5 to 6 ring atoms unsubstituted or substituted by one or at least two $R_{a1}$, $A_2$ and $R_{a1}$ need to satisfy the following conditions:

1) $A_2$ that is directly attached to $A_1$ is, at each occurrence identically or differently, selected from the group consisting of: O, S, Se, NR", SiR"R", GeR"R", BR", PR", P(O)R", following groups unsubstituted or substituted by one or at least two $R_{a2}$: alkylene having 1 to 20 carbon atoms, heteroalkylene having 1 to 20 carbon atoms, cycloalkylene having 3 to 20 carbon atoms and heterocyclene having 3 to 20 ring atoms, and combinations thereof; and 2) $R_{a1}$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof.

Herein, the expression that "adjacent substituents R', R", $R_x$, $R_{a2}$, $R_{a3}$ can be optionally joined to form a ring" is intended to mean that any one or more of groups of adjacent substituents, such as two substituents R', two substituents R'', two substituents $R_x$, two substituents $R_{a2}$, substituents $R_{a2}$ and $R_{a3}$, and substituents R' and $R_x$, can be joined to form a ring. Obviously, it is possible that none of these substituents are joined to form a ring.

Herein, the "ring atoms" in the "heteroarylene having 5 to 6 ring atoms" refer to those atoms that are bonded to form a heterocyclic structure having aromaticity. The carbon atoms and heteroatoms (comprising, but not limited to, O, S, N, Se, Si, Ge, etc.) in the ring are all counted in the number of ring atoms. When the ring is substituted by a substituent, the atoms comprised in the substituent are excluded from the number of ring atoms. For example, the number of ring atoms of pyridyl, pyrimidine and triazine is 6; the number of ring atoms of pyrrolidine, thienyl, furyl, imidazolyl and triazolyl is 5. The various examples described herein are examples only, and so on in other cases.

Herein, the expression that "the length of A is at least 6.7 Å" is intended to mean that the distance between the atom in Formula 2 that is directly attached to Formula 1 and the atom in Formula 2 that is furthest from the atom in Formula 2 that is directly attached to Formula 1 is the length of A, and the length is at least 6.7 Å. In the present application, the length of A is calculated by ChemBio3D Ultra 14.0.0.117, optimized by MM2. For example, when A is 4-trimethylsilylphenyl, that is, Formula 2 is

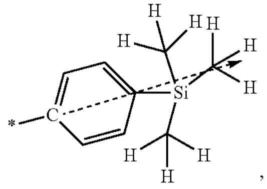 [SMILES: *c1ccc([Si](C)(C)C)cc1]

, the longest distance is the distance between the "C" that is directly attached to Formula 1 and the farthest hydrogen atom (as indicated by the dashed arrow), and the length of the substituent obtained by the calculation method of the present application is 6.6 Å, that is, the group A mentioned in the present application does not contain this structure. In another example, when A is 4-propylphenyl, that is, Formula 2 is

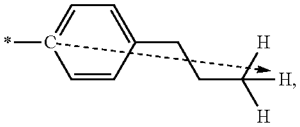

the longest distance is the distance between the "C" that is directly attached to Formula 1 and the farthest hydrogen atom (as indicated by the dashed arrow), and the length of the substituent obtained by the calculation method of the present application is 7.3 Å, that is, the group A mentioned in the present application contains this structure, to which the other cases are similar.

Herein, "$A_2$ that is directly attached to $A_1$" refers to the $A_2$ that is directly bonded to $A_1$ through a chemical bond. For example, when a is 1, that is, Formula 2 has the following structure: *-$A_1$-$A_2$-$R_{a3}$, at this point, there is only one $A_2$, and this $A_2$ is directly bonded to $A_1$; in another example, when a is 2, that is, Formula 2 has the following structure: *-$A_1$-$A_2$-$A_2$-$R_{a3}$, at this point, there are two $A_2$ in Formula 2, and the first $A_2$ from the left is the $A_2$ directly attached to $A_1$; and so on when a is 3, 4 or 5.

According to an embodiment of the present disclosure, a metal complex is disclosed. The metal complex comprises a metal M and a ligand $L_a$ coordinated to the metal M, wherein the metal M is selected from metals having a relative atomic mass greater than 40, and $L_a$ has a structure represented by Formula 1:

Formula 1

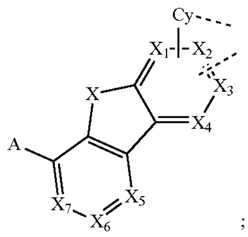

;

wherein in Formula 1,

Cy is, at each occurrence identically or differently, selected from a substituted or unsubstituted aromatic ring having 6 to 24 ring atoms, a substituted or unsubstituted heteroaromatic ring having 5 to 24 ring atoms or combinations thereof;

X is selected from the group consisting of O, S, Se, NR', CR'R', SiR'R', and GeR'R'; when two R' are present, the two R' are identical or different;

$X_1$ to $X_7$ are, at each occurrence identically or differently, selected from C, $CR_x$ or N; at least one of $X_1$ to $X_4$ is C and is attached to Cy;

$X_1$, $X_2$, $X_3$ or $X_4$ is attached to the metal M through a metal-carbon bond or a metal-nitrogen bond;

at least one of $X_1$ to $X_7$ is $CR_x$, wherein the $R_x$ is cyano or fluorine;

R' and $R_x$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof;

A has a structure represented by Formula 2:

Formula 2

$$*—A_1—(A_2)_a—R_{a3};$$

wherein a is selected from 1, 2, 3, 4 or 5;

the length of A is at least 6.7 Å;

"*" represents a position where A is attached;

$A_1$, $A_2$, and $R_{a3}$ need to satisfy at least one of the following two cases:

the first case is as follows: $A_1$ is, at each occurrence identically or differently, selected from the group consisting of: O, S, Se, NR", SiR"R", GeR"R", BR", PR", P(O)R", following groups unsubstituted or substituted by one or at least two $R_{a1}$: alkylene having 1 to 20 carbon atoms, heteroalkylene having 1 to 20 carbon atoms, cycloalkylene having 3 to 20 carbon atoms and heterocyclene having 3 to 20 ring atoms, and combinations thereof;

$A_2$ is, at each occurrence identically or differently, selected from the group consisting of: O, S, Se, NR", SiR"R", GeR"R", BR", PR", P(O)R", alkylene having 1 to 20 carbon atoms unsubstituted or substituted by one or at least two $R_{a2}$, heteroalkylene having 1 to 20 carbon atoms unsubstituted or substituted by one or at least two $R_{a2}$, cycloalkylene having 3 to 20 carbon atoms unsubstituted or substituted by one or at least two $R_{a2}$, heterocyclene having 3 to 20 ring atoms unsubstituted or substituted by one or at least two $R_{a2}$, arylene having 6 to 30 carbon atoms unsubstituted or substituted by one or at least two $R_{a2}$, heteroarylene having 3 to 30 carbon atoms unsubstituted or substituted by one or at least two $R_{a2}$, and combinations thereof;

R", $R_{a1}$, $R_{a2}$, and $R_{a3}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof; and adjacent substituents R', R", $R_x$, $R_{a2}$, $R_{a3}$ can be optionally joined to form a ring;

the second case is as follows: $A_1$ is, at each occurrence identically or differently, selected from phenylene unsubstituted or substituted by one or at least two $R_{a1}$, heteroarylene having 5 to 6 ring atoms unsubstituted or substituted by one or at least two $R_{a1}$ or combinations thereof;

$A_2$ is, at each occurrence identically or differently, selected from the group consisting of: O, S, Se, NR", SiR"R", GeR"R", BR", PR", P(O)R", following groups unsubstituted or substituted by one or at least two $R_{a2}$: alkylene having 1 to 20 carbon atoms, heteroalkylene having 1 to 20 carbon atoms, cycloalkylene having 3 to 20 carbon atoms and heterocyclene having 3 to 20 ring atoms, and combinations thereof;

R", $R_{a2}$, and $R_{a3}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof; and $R_{a1}$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof;

adjacent substituents R', R", $R_x$, $R_{a2}$, $R_{a1}$ can be optionally joined to form a ring.

According to an embodiment of the present disclosure, the length of A is greater than or equal to 6.7 Å and less than or equal to 22 Å.

According to an embodiment of the present disclosure, the length of A is greater than or equal to 6.7 Å and less than 13.3 Å.

According to an embodiment of the present disclosure, the length of A is greater than or equal to 7.0 Å and less than 13.3 Å.

According to an embodiment of the present disclosure, the length of A is greater than or equal to 7.0 Å and less than or equal to 10.5 Å.

According to an embodiment of the present disclosure, $A_1$ is, at each occurrence identically or differently, selected from phenylene unsubstituted or substituted by one or at least two $R_{a1}$ or heteroarylene having 5 to 6 ring atoms unsubstituted or substituted by one or at least two $R_{a1}$; $A_2$ is, at each occurrence identically or differently, selected from the group consisting of: O, S, NR", SiR"R", GeR"R", following groups unsubstituted or substituted by one or at least two $R_{a2}$: alkylene having 1 to 6 carbon atoms, cycloalkylene having 3 to 20 ring carbon atoms and heterocyclene having 3 to 20 ring atoms, and combinations thereof.

According to an embodiment of the present disclosure, $A_1$ is, at each occurrence identically or differently, selected from phenylene unsubstituted or substituted by one or at least two $R_{a1}$ or heteroarylene having 6 ring atoms unsubstituted or substituted by one or at least two $R_{a1}$; $A_2$ is, at each occurrence identically or differently, selected from cycloalkylene having 3 to 20 ring carbon atoms unsubstituted or substituted by one or at least two $R_{a2}$, heterocyclene having 3 to 20 ring atoms unsubstituted or substituted by one or at least two $R_{a2}$ or combinations thereof.

According to an embodiment of the present disclosure, $A_1$ is, at each occurrence identically or differently, selected from phenylene unsubstituted or substituted by one or at least two $R_{a1}$; $A_2$ is, at each occurrence identically or differently, selected from cycloalkylene having 5 to 12 ring carbon atoms unsubstituted or substituted by one or at least two $R_{a2}$, heterocyclene unsubstituted or substituted by one or at least two $R_{a2}$ and having 5 to 12 ring atoms or combinations thereof.

According to an embodiment of the present disclosure, $A_1$ is, at each occurrence identically or differently, selected from the group consisting of: O, S, NR", SiR"R", GeR"R", following groups unsubstituted or substituted by one or at least two $R_{a1}$: alkylene having 1 to 20 carbon atoms, heteroalkylene having 1 to 20 carbon atoms, cycloalkylene having 3 to 20 carbon atoms and heterocyclene having 3 to 20 ring atoms, and combinations thereof; $A_2$ is, at each occurrence identically or differently, selected from following groups unsubstituted or substituted by one or at least two $R_{a2}$: alkylene having 1 to 20 carbon atoms, heteroalkylene having 1 to 20 carbon atoms, cycloalkylene having 3 to 20 carbon atoms, heterocyclene having 3 to 20 ring atoms, arylene having 6 to 30 carbon atoms, heteroarylene having 3 to 30 carbon atoms, and combinations thereof.

According to an embodiment of the present disclosure, $A_1$ is, at each occurrence identically or differently, selected from the group consisting of: O, S, NR", SiR"R", GeR"R", following groups unsubstituted or substituted by one or at least two $R_{a1}$: cycloalkylene having 3 to 10 carbon atoms and heterocyclene having 3 to 10 ring atoms, and combinations thereof; $A_2$ is, at each occurrence identically or differently, selected from following groups unsubstituted or substituted by one or at least two $R_{a2}$: cycloalkylene having 3 to 10 carbon atoms, heterocyclene having 3 to 10 ring atoms, arylene having 6 to 18 carbon atoms and heteroarylene having 3 to 18 ring atoms, and combinations thereof.

According to an embodiment of the present disclosure, Cy is selected from the group consisting of the following structures:

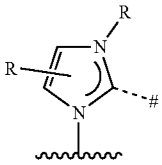 , 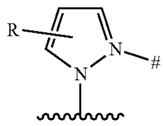 , 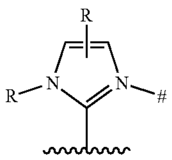 ,

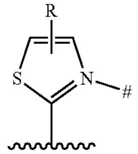 , 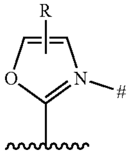 , 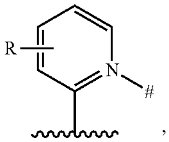 ,

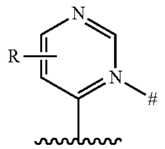 , 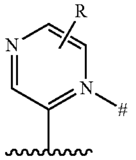 , 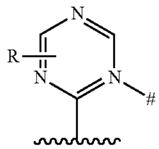 ,

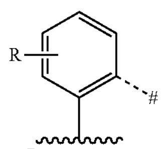 , 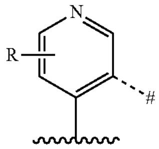 , 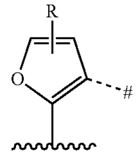 ,

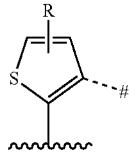 , 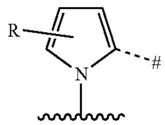 , 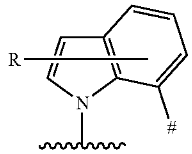 ,

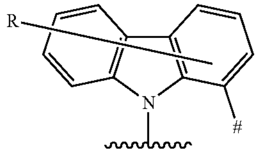 , and

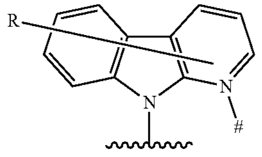 ;

wherein,

R represents, at each occurrence identically or differently, mono-substitution, multiple substitutions or no substitution; when a plurality of R are present, the plurality of R are identical or different;

R is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof;

two adjacent substituents R can be optionally joined to form a ring;

"#" represents a position where the metal M is attached, and

""

represents a position where $X_1$, $X_2$, $X_3$ or $X_4$ is attached.

Herein, the expression that "two adjacent substituents R can be optionally joined to form a ring" is intended to mean that any one or more of substituent groups consisting of any two adjacent substituents R can be joined to form a ring. Obviously, it is possible that none of these substituents are joined to form a ring.

According to an embodiment of the present disclosure, $L_a$ is, at each occurrence identically or differently, selected from the group consisting of:

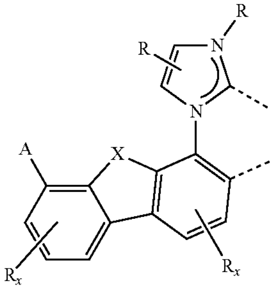
,
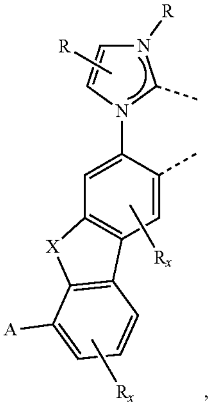
,
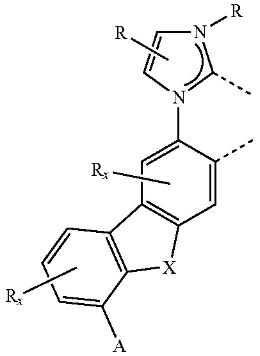
,
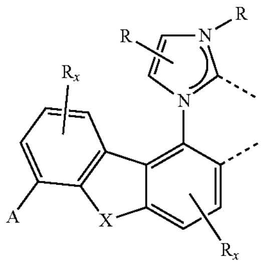
,

-continued

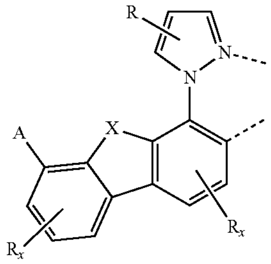
,
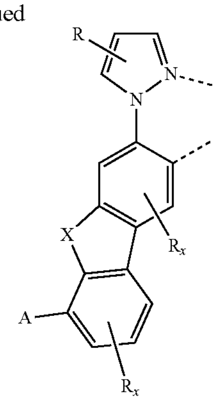
,
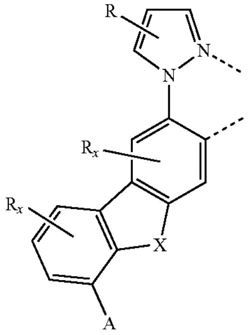
,
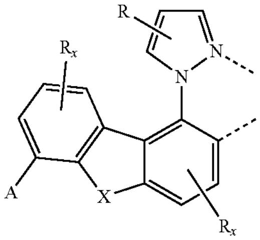
,
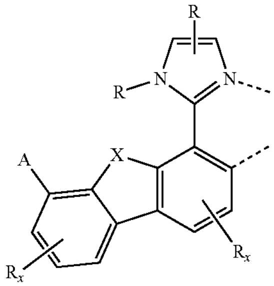
,
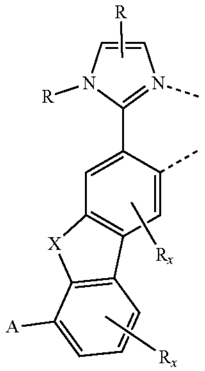
,
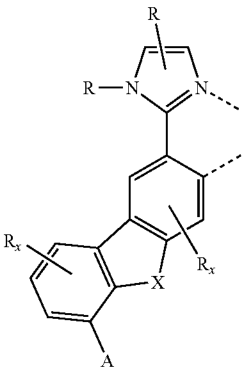
,
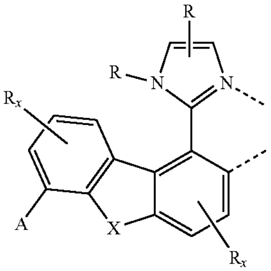
, -continued
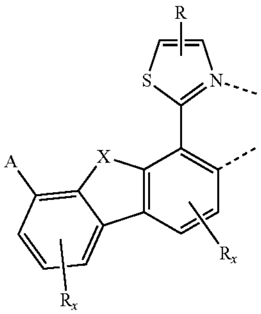
,
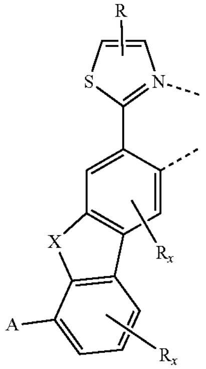
,
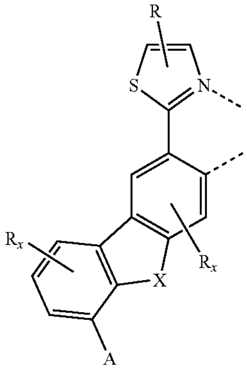
,
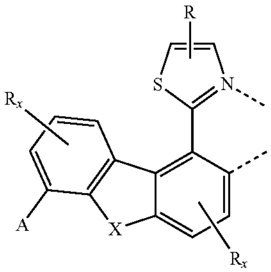
,
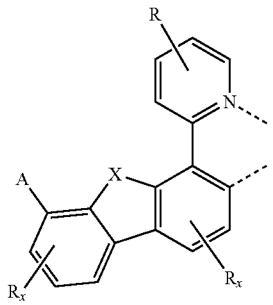
,
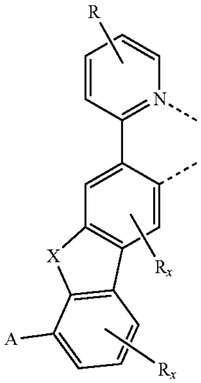
,
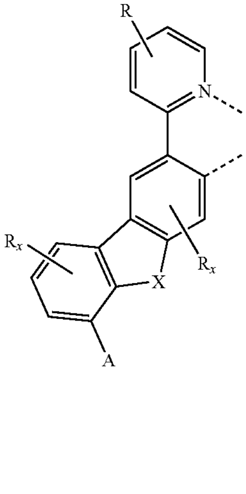
,
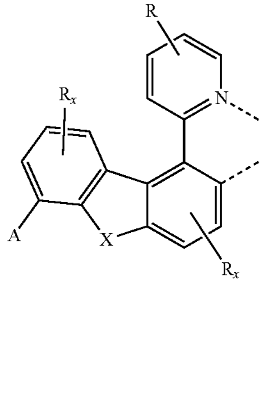
,
-continued
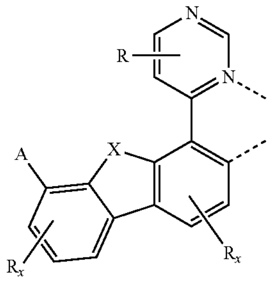
,
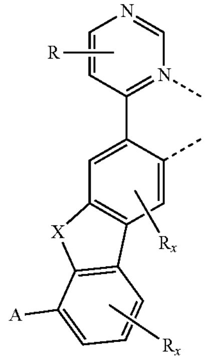
,
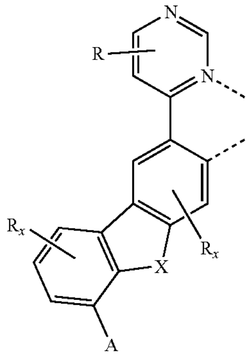
,
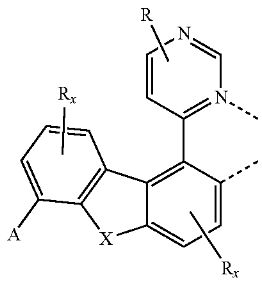
,
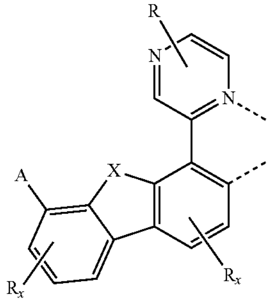
,
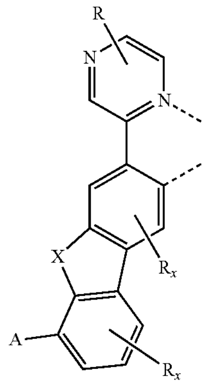
,
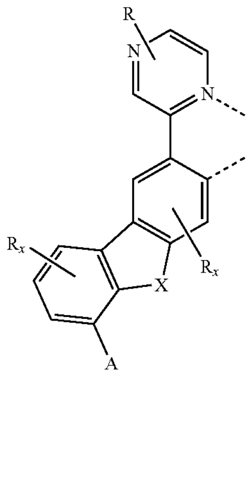
,
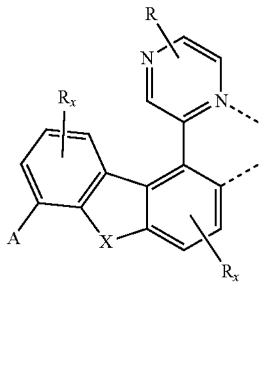
, -continued
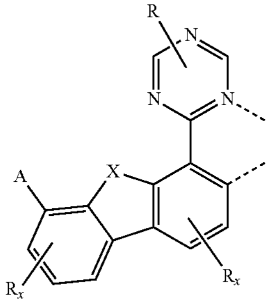
,
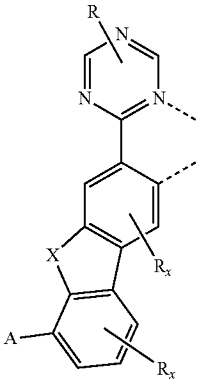
,
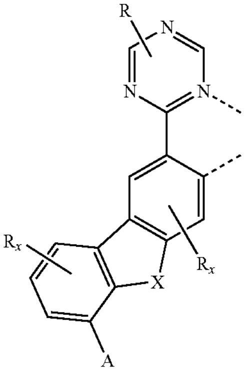
,
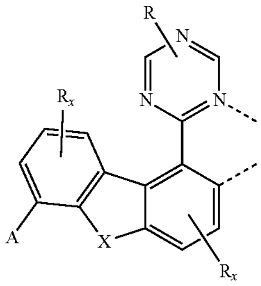
,
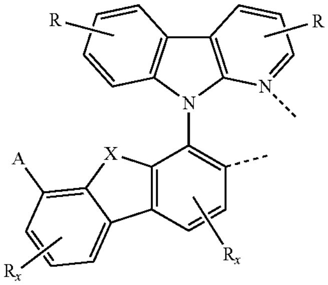
,
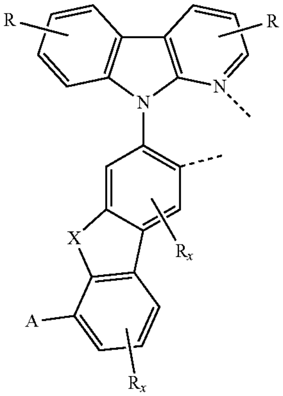
,
-continued
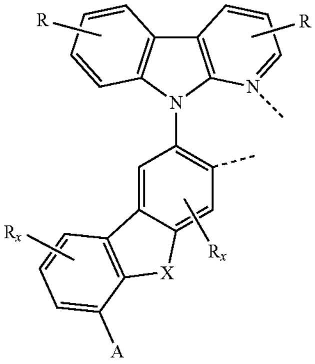
,
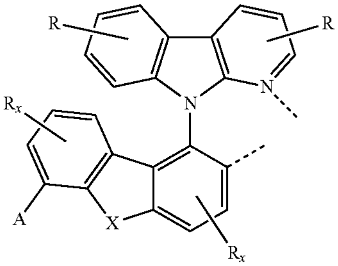
,
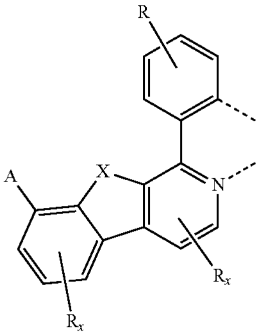
,
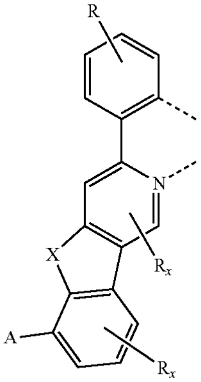
,
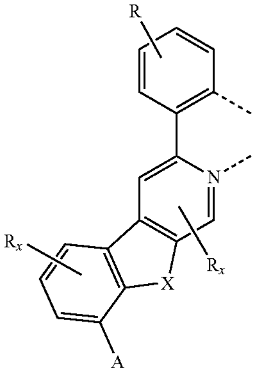
,
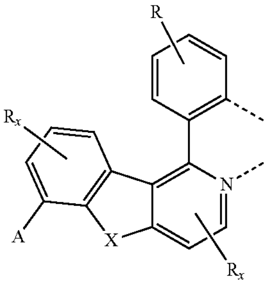
, -continued

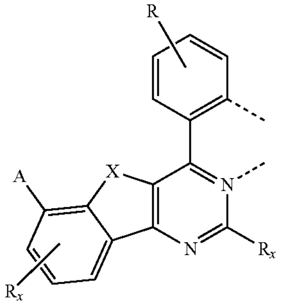

,

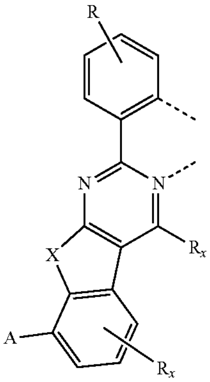

,

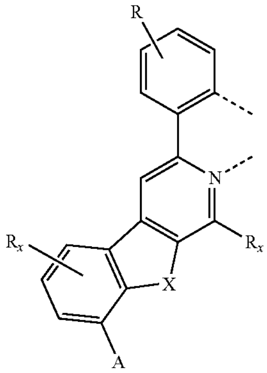

,

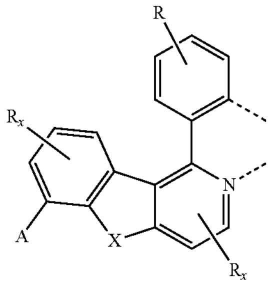

,

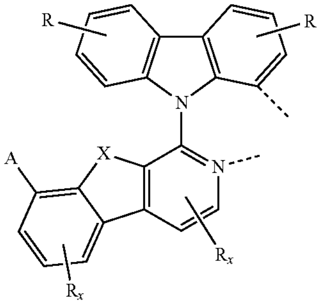

,

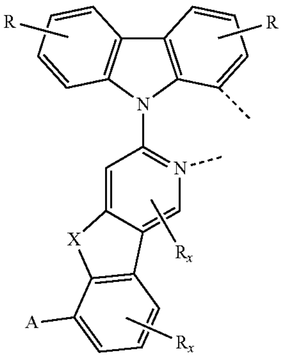

,

-continued

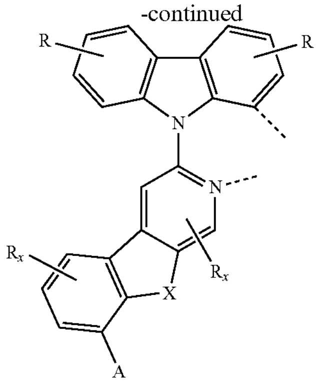

, and

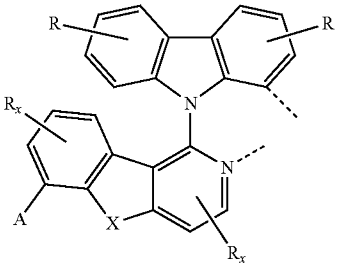

;

wherein,

X is selected from the group consisting of O, S, Se, NR', CR'R', SiR'R', and GeR'R'; when two R' are present, the two R' are identical or different;

R and $R_x$ represent, at each occurrence identically or differently, mono-substitution, multiple substitutions or no substitution;

at least one of $R_x$ is fluorine or cyano;

A has a structure represented by Formula 2:

Formula 2

$$*—A_1—(A_2)_a—R_{a3};$$

wherein a is selected from 1, 2, 3, 4 or 5;

$A_1$ is, at each occurrence identically or differently, selected from the group consisting of: O, S, Se, NR", SiR"R", GeR"R", BR", PR", P(O)R", following groups unsubstituted or substituted by one or at least two $R_{a1}$: alkylene having 1 to 20 carbon atoms, heteroalkylene having 1 to 20 carbon atoms, cycloalkylene having 3 to 20 carbon atoms, heterocyclene having 3 to 20 ring atoms, phenylene and heteroarylene having 5 to 6 ring atoms, and combinations thereof;

$A_2$ is, at each occurrence identically or differently, selected from the group consisting of: O, S, Se, NR", SiR"R", GeR"R", BR", PR", P(O)R", following groups unsubstituted or substituted by one or at least two $R_{a2}$: alkylene having 1 to 20 carbon atoms, heteroalkylene having 1 to 20 carbon atoms, cycloalkylene having 3 to 20 carbon atoms, heterocyclene having 3 to 20 ring atoms, arylene having 6 to 30 carbon atoms and heteroarylene having 3 to 30 carbon atoms, and combinations thereof;

R, R', R", $R_x$, $R_{a1}$, $R_{a2}$, and $R_{a3}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof;

adjacent substituents R, R", $R_x$, $R_{a2}$, $R_{a3}$ can be optionally joined to form a ring;

"*" represents a position where A is attached;

when $A_1$ is selected from phenylene unsubstituted or substituted by one or at least two $R_{a1}$ or heteroarylene having 5 to 6 ring atoms unsubstituted or substituted by one or at least two $R_{a1}$, $A_2$ and $R_{a1}$ need to satisfy the following conditions:

1) $A_2$ that is directly attached to $A_1$ is, at each occurrence identically or differently, selected from the group consisting of: O, S, Se, NR", SiR"R", GeR"R", BR", PR", P(O)R", alkylene having 1 to 20 carbon atoms unsubstituted or substituted by one or at least two $R_{a2}$, heteroalkylene having 1 to 20 carbon atoms unsubstituted or substituted by one or at least two $R_{a2}$, cycloalkylene having 3 to 20 carbon atoms unsubstituted or substituted by one or at least two $R_{a2}$, heterocyclene having 3 to 20 ring atoms unsubstituted or substituted by one or at least two $R_{a2}$, and combinations thereof; and 2) $R_{a1}$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof.

Herein, the expression that "adjacent substituents R, R', R", $R_x$, $R_{a2}$, $R_{a3}$ can be optionally joined to form a ring" is intended to mean that any one or more of groups of adjacent substituents, such as two substituents R, two substituents two substituents R", two substituents $R_x$, two substituents $R_{a2}$, substituents $R_{a2}$ and $R_{a3}$, and substituents R' and $R_x$, can be joined to form a ring. Obviously, it is possible that none of these substituents are joined to form a ring.

According to an embodiment of the present disclosure, the metal complex has a general formula of $M(L_a)_m(L_b)_n(L_c)_q$;

wherein,

M is, at each occurrence identically or differently, selected from the group consisting of Cu, Ag, Au, Ru, Rh, Pd, Os, Ir, and Pt;

$L_a$, $L_b$, and $L_c$ are a first ligand, a second ligand and a third ligand coordinated to the metal M, respectively, and $L_c$ is identical to or different from $L_a$ or $L_b$; wherein $L_a$, $L_b$, and $L_c$ can be optionally joined to form a multidentate ligand; for example, any two of $L_a$, $L_b$, and $L_c$ can be joined to form a tetradentate ligand; in another example, $L_a$, $L_b$, and $L_c$ can be joined to each other to form a hexadentate ligand; in another example, none of $L_a$, $L_b$, and $L_c$ are joined so that no multidentate ligand is formed;

m is selected from 1, 2 or 3, n is selected from 0, 1 or 2, q is selected from 0, 1 or 2, and m+n+q equals an oxidation state of the metal M; when m is greater than or equal to 2, a plurality of $L_a$ are identical or different; when n is equal to 2, two $L_b$ are identical or different; when q is equal to 2, two $L_c$ are identical or different;

$L_b$ and $L_c$ are, at each occurrence identically or differently, selected from the group consisting of the following structures:

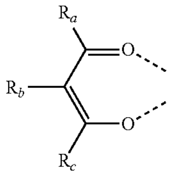
,
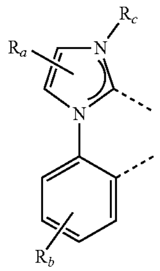
,
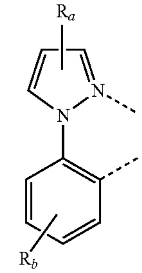
,
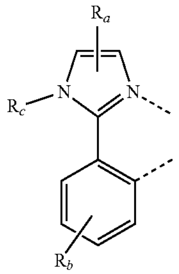
,
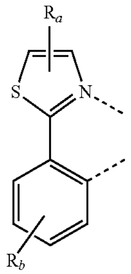
,
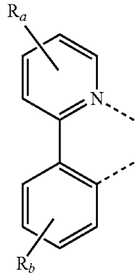
,
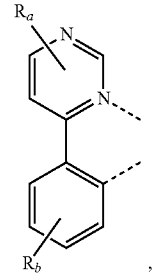
,
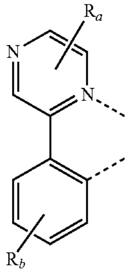
,
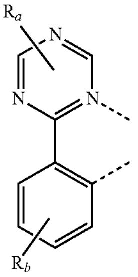
, -continued

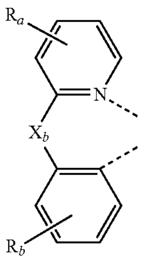
, 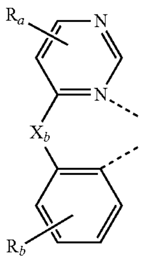
, and 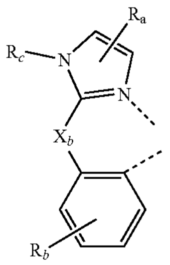
;

wherein, $R_a$ and $R_b$ represent, at each occurrence identically or differently, mono-substitution, multiple substitutions or no substitution;

$X_b$ is, at each occurrence identically or differently, selected from the group consisting of: O, S, Se, $NR_{N1}$, and $CR_{C1}R_{C2}$;

$R_a$, $R_b$, $R_c$, $R_{N1}$, $R_{C1}$, and $R_{C2}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof;

adjacent substituents $R_a$, $R_b$, $R_c$, $R_{N1}$, $R_{C1}$, and $R_{C2}$ can be optionally joined to form a ring.

Herein, the expression that "adjacent substituents $R_a$, $R_b$, $R_c$, $R_{N1}$, $R_{C1}$, and $R_{C2}$ can be optionally joined to form a ring" is intended to mean that any one or more of groups of adjacent substituents, such as two substituents $R_a$, two substituents $R_b$, substituents $R_a$ and $R_b$, substituents $R_a$ and $R_c$, substituents $R_b$ and $R_c$, substituents $R_a$ and $R_{N1}$, substituents $R_b$ and $R_{N1}$, substituents $R_a$ and $R_{C1}$, substituents $R_a$ and $R_{C2}$, substituents $R_b$ and $R_{C1}$, substituents $R_b$ and $R_{C2}$, and substituents $R_{C1}$ and $R_{C2}$, can be joined to form a ring. Obviously, it is possible that none of these substituents are joined to form a ring.

According to an embodiment of the present disclosure, the metal M is, at each occurrence identically or differently, selected from the group consisting of Cu, Ag, Au, Ru, Rh, Pd, Os, Ir, and Pt.

According to an embodiment of the present disclosure, the metal M is, at each occurrence identically or differently, selected from Pt or Ir.

According to an embodiment of the present disclosure, the metal complex $Ir(L_a)_m(L_b)_{3-m}$ has a structure represented by Formula 3:

Formula 3

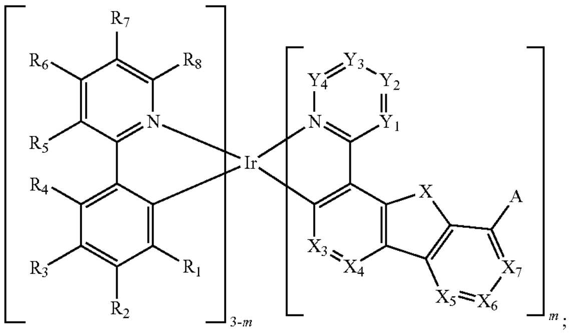

wherein, m is selected from 1, 2 or 3; when m is selected from 1, two $L_b$ are identical or different;

when m is selected from 2 or 3, a plurality of $L_a$ are identical or different;

$Y_1$ to $Y_4$ are, at each occurrence identically or differently, selected from $CR_y$ or N;

X is selected from the group consisting of O, S, Se, NR', CR'R', SiR'R', and GeR'R'; when two R' are present, the two R' are identical or different;

$X_3$ to $X_7$ are, at each occurrence identically or differently, selected from $CR_x$ or N;

at least one of $X_3$ to $X_7$ is $CR_x$, wherein the $R_x$ is cyano or fluorine;

A has a structure represented by Formula 2:

Formula 2

$$*-A_1-(A_2)_a-R_{a3};$$

wherein a is selected from 1, 2, 3, 4 or 5;

$A_1$ is, at each occurrence identically or differently, selected from the group consisting of: O, S, Se, NR", SiR"R", GeR"R", BR", PR", P(O)R", following groups unsubstituted or substituted by one or at least two $R_{a1}$: alkylene having 1 to 20 carbon atoms, heteroalkylene having 1 to 20 carbon atoms, cycloalkylene having 3 to 20 carbon atoms, heterocyclene having 3 to 20 ring atoms, phenylene and heteroarylene having 5 to 6 ring atoms, and combinations thereof;

$A_2$ is, at each occurrence identically or differently, selected from the group consisting of: O, S, Se, NR", SiR"R", GeR"R", BR", PR", P(O)R", following groups unsubstituted or substituted by one or at least two $R_{a2}$: alkylene having 1 to 20 carbon atoms, heteroalkylene having 1 to 20 carbon atoms, cycloalkylene having 3 to 20 carbon atoms, heterocyclene having 3 to 20 ring atoms, arylene having 6 to 30 carbon atoms and heteroarylene having 3 to 30 carbon atoms, and combinations thereof;

R', R", $R_x$, $R_y$, $R_{a1}$, $R_{a2}$, $R_{a3}$, and $R_1$ to $R_8$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof;

adjacent substituents $R_1$ to $R_8$ can be optionally joined to form a ring;

adjacent substituents R', R", $R_x$, $R_y$, $R_{a2}$, $R_{a31}$ can be optionally joined to form a ring;

the length of A is at least 6.7 Å;

"*" represents a position where A is attached;

when $A_1$ is, at each occurrence identically or differently, selected from phenylene unsubstituted or substituted by one or at least two $R_{a1}$ or heteroarylene having 5 to 6 ring atoms unsubstituted or substituted by one or at least two $R_{a1}$, $A_2$ and $R_{a1}$ need to satisfy the following conditions:

1) $A_2$ that is directly attached to $A_1$ is, at each occurrence identically or differently, selected from the group consisting of: O, S, Se, NR", SiR"R", GeR"R", BR", PR", P(O)R", alkylene having 1 to 20 carbon atoms unsubstituted or substituted by one or at least two $R_{a2}$, heteroalkylene having 1 to 20 carbon atoms unsubstituted or substituted by one or at least two $R_{a2}$, cycloalkylene having 3 to 20 carbon atoms unsubstituted or substituted by one or at least two $R_{a2}$, heterocyclene having 3 to 20 ring atoms unsubstituted or substituted by one or at least two $R_{a2}$, and combinations thereof; and 2) $R_{a1}$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof.

Herein, the expression that "adjacent substituents R', R", $R_x$, $R_y$, $R_{a2}$, $R_{a3}$ can be optionally joined to form a ring" is intended to mean that any one or at least two of groups of adjacent substituents, such as two substituents R', two substituents R", two substituents $R_x$, two substituents $R_y$, two substituents $R_{a2}$, two substituents $R_{a3}$, substituents R' and $R_x$, and substituents $R_{a2}$ and $R_{a3}$, can be joined to form a ring. Obviously, it is possible that none of these substituents are joined to form a ring.

The expression that "adjacent substituents $R_1$ to $R_8$ can be optionally joined to form a ring" is intended to mean that any one or at least two of groups of adjacent substituents, such as adjacent substituents $R_1$ and $R_2$, adjacent substituents $R_2$ and $R_3$, adjacent substituents $R_3$ and $R_4$, adjacent substituents $R_5$ and $R_4$, adjacent substituents $R_5$ and $R_6$, adjacent substituents $R_7$ and $R_6$, and adjacent substituents $R_7$ and $R_8$, can be joined to form a ring. Obviously, it is possible that none of these substituents are joined to form a ring.

According to an embodiment of the present disclosure, the metal complex $Ir(L_a)_m(L_b)_{3-m}$ has a structure represented by Formula 3A:

Formula 3A

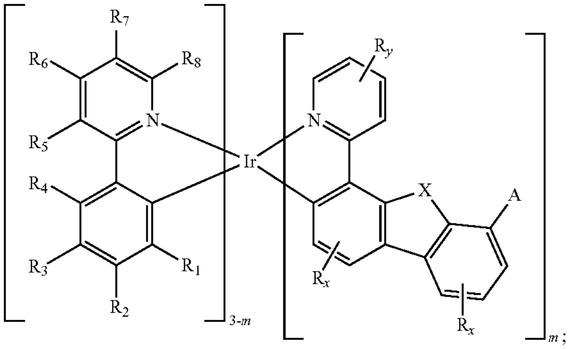

wherein, m is selected from 1, 2 or 3; when m is selected from 1, two $L_b$ are identical or different; when m is selected from 2 or 3, a plurality of $L_a$ are identical or different;

X is selected from the group consisting of O, S, Se, NR', CR'R', SiR'R', and GeR'R'; when two R' are present, the two R' are identical or different;

$R_x$ and $R_y$ represent, at each occurrence identically or differently, mono-substitution, multiple substitutions or no substitution;

at least one $R_x$ is cyano or fluorine; and

A has a structure represented by Formula 2:

Formula 2

$$*-A_1-(A_2)_a-R_{a3};$$

wherein a is selected from 1, 2, 3, 4 or 5;

$A_1$ is, at each occurrence identically or differently, selected from the group consisting of: O, S, Se, NR", SiR"R", GeR"R", BR", PR", P(O)R", following groups unsubstituted or substituted by one or at least two $R_{a1}$: alkylene having 1 to 20 carbon atoms, heteroalkylene having 1 to 20 carbon atoms, cycloalkylene having 3 to 20 carbon atoms, heterocyclene having 3 to 20 ring atoms, phenylene and heteroarylene having 5 to 6 ring atoms, and combinations thereof;

$A_2$ is, at each occurrence identically or differently, selected from the group consisting of: O, S, Se, NR", SiR"R", GeR"R", BR", PR", P(O)R", following groups unsubstituted or substituted by one or at least two $R_{a2}$: alkylene having 1 to 20 carbon atoms, heteroalkylene having 1 to 20 carbon atoms, cycloalkylene having 3 to 20 carbon atoms, heterocyclene having 3 to 20 ring atoms, arylene having 6 to 30 carbon atoms and heteroarylene having 3 to 30 carbon atoms, and combinations thereof;

R', R", $R_x$, $R_y$, $R_{a1}$, $R_{a2}$, $R_{a3}$, and $R_1$ to $R_8$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof;

adjacent substituents $R_1$ to $R_8$ can be optionally joined to form a ring;

adjacent substituents R', R", $R_x$, $R_y$, $R_{a2}$, $R_{a31}$ can be optionally joined to form a ring;

the length of A is at least 6.7 Å;

"*" represents a position where A is attached;

when $A_1$ is, at each occurrence identically or differently, selected from phenylene unsubstituted or substituted by one or at least two $R_{a1}$ or heteroarylene having 5 to 6 ring atoms unsubstituted or substituted by one or at least two $R_{a1}$, $A_2$ and $R_{a1}$ need to satisfy the following conditions:

1) $A_2$ that is directly attached to $A_1$ is, at each occurrence identically or differently, selected from the group consisting of: O, S, Se, NR", SiR"R", GeR"R", BR", PR", P(O)R", alkylene having 1 to 20 carbon atoms unsubstituted or substituted by one or at least two $R_{a2}$, heteroalkylene having 1 to 20 carbon atoms unsubstituted or substituted by one or at least two $R_{a2}$, cycloalkylene having 3 to 20 carbon atoms unsubstituted or substituted by one or at least two $R_{a2}$, heterocyclene having 3 to 20 ring atoms unsubstituted or substituted by one or at least two $R_{a2}$, and combinations thereof; and 2) $R_{a1}$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof.

According to an embodiment of the present disclosure, X is selected from O or S.

According to an embodiment of the present disclosure, X is O.

According to an embodiment of the present disclosure, $X_1$ to $X_7$ are, at each occurrence identically or differently, selected from C or $CR_x$.

According to an embodiment of the present disclosure, at least one of $X_1$ to $X_7$ is N, for example, one of $X_1$ to $X_7$ is N or two of $X_1$ to $X_7$ are N.

According to an embodiment of the present disclosure, in Formula 3, $X_3$ to $X_7$ are, at each occurrence identically or differently, selected from $CR_x$.

According to an embodiment of the present disclosure, in Formula 3, at least one of $X_3$ to $X_7$ is N, for example, one of $X_3$ to $X_7$ is N or two of $X_3$ to $X_7$ are N.

According to an embodiment of the present disclosure, $Y_1$ to $Y_4$ are, at each occurrence identically or differently, selected from $CR_Y$.

According to an embodiment of the present disclosure, at least one of $Y_1$ to $Y_4$ is N, for example, one of $Y_1$ to $Y_4$ is N or two of $Y_1$ to $Y_4$ are N.

According to an embodiment of the present disclosure, a is selected from 1, 2 or 3.

According to an embodiment of the present disclosure, a is selected from 1.

According to an embodiment of the present disclosure, at least one of $X_3$ to $X_7$ is selected from $CR_x$, wherein the $R_x$ is a cyano group or fluorine.

According to an embodiment of the present disclosure, at least one of $X_5$ to $X_7$ is selected from $CR_x$, wherein the $R_x$ is cyano or fluorine.

According to an embodiment of the present disclosure, $X_7$ is $CR_x$, wherein the $R_x$ is cyano or fluorine.

According to an embodiment of the present disclosure, $X_7$ is $CR_x$ wherein the $R_x$ is cyano.

According to an embodiment of the present disclosure, at least one of $X_3$ to $X_7$ is $CR_x$, wherein the $R_x$ is cyano or fluorine; remaining $R_x$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, a cyano group, and combinations thereof.

According to an embodiment of the present disclosure, at least one of $X_5$ to $X_7$ is $CR_x$, wherein the $R_x$ is cyano or fluorine; remaining $R_x$ are, at each occurrence identically or differently, selected from the group consisting of: hydrogen, deuterium, fluorine, substituted or unsubstituted alkyl having 1 to 6 carbon atoms, substituted or unsubstituted cycloalkyl having 3 to 6 ring carbon atoms, substituted or unsubstituted aryl having 6 to 12 carbon atoms, substituted or unsubstituted heteroaryl having 3 to 12 carbon atoms, substituted or unsubstituted alkylsilyl having 3 to 6 carbon atoms, a cyano group, and combinations thereof.

According to an embodiment of the present disclosure, $X_7$ is $CR_x$, wherein the $R_x$ is cyano or fluorine; remaining $R_x$ are, at each occurrence identically or differently, selected from the group consisting of: hydrogen, deuterium, substituted or unsubstituted alkyl having 1 to 6 carbon atoms, substituted or unsubstituted cycloalkyl having 3 to 6 ring carbon atoms, and combinations thereof.

According to an embodiment of the present disclosure, $R_{a1}$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted arylalkyl having 7 to 30 carbon atoms, substituted or unsubstituted alkylsilyl having 4 to 20 carbon atoms, substituted or unsubstituted arylsilyl having 6 to 20 carbon atoms, a hydroxyl group, a sulfanyl group, and combinations thereof.

According to an embodiment of the present disclosure, $R_{a1}$ is, at each occurrence identically or differently, selected from the group consisting of: hydrogen, deuterium, fluorine, substituted or unsubstituted alkyl having 1 to 6 carbon atoms, substituted or unsubstituted cycloalkyl having 3 to 6 ring carbon atoms, substituted or unsubstituted alkylsilyl having 4 to 15 carbon atoms, and combinations thereof.

According to an embodiment of the present disclosure, $R_{a1}$ is, at each occurrence identically or differently, selected from the group consisting of: hydrogen, deuterium, fluorine, methyl, ethyl, propyl, isopropyl, n-butyl, isobutyl, t-butyl, cyclopentyl, cyclohexyl, deuterated methyl, deuterated ethyl, deuterated propyl, deuterated isopropyl, deuterated n-butyl, deuterated isobutyl, deuterated t-butyl, deuterated cyclopentyl, deuterated cyclohexyl, trimethylsilyl, and combinations thereof.

According to an embodiment of the present disclosure, $R_{a2}$ and $R_{a3}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted arylalkyl having 7 to 30 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, a hydroxyl group, a sulfanyl group, and combinations thereof.

According to an embodiment of the present disclosure, $R_{a2}$ and $R_{a3}$ are, at each occurrence identically or differently, selected from the group consisting of: hydrogen, deuterium, fluorine, substituted or unsubstituted alkyl having 1 to 6 carbon atoms, substituted or unsubstituted cycloalkyl having 3 to 6 ring carbon atoms, substituted or unsubstituted aryl having 6 to 18 carbon atoms, substituted or unsubstituted heteroaryl having 3 to 18 carbon atoms, substituted or unsubstituted alkylsilyl having 3 to 15 carbon atoms, and combinations thereof.

According to an embodiment of the present disclosure, $R_{a2}$ and $R_{a3}$ are, at each occurrence identically or differently, selected from the group consisting of: hydrogen, deuterium, fluorine, methyl, ethyl, propyl, isopropyl, n-butyl, isobutyl, t-butyl, cyclopentyl, cyclohexyl, deuterated methyl, deuterated ethyl, deuterated propyl, deuterated isopropyl, deuterated n-butyl, deuterated isobutyl, deuterated t-butyl, deuterated cyclopentyl, deuterated cyclohexyl, phenyl, pyridyl, trimethylsilyl, and combinations thereof.

According to an embodiment of the present disclosure, A is, at each occurrence identically or differently, selected from the group consisting of A-1 to A-179, wherein for the specific structures of A-1 to A-179, reference is made to claim 13; optionally, hydrogen in A-1 to A-179 can be partially or fully substituted with deuterium, wherein "*" represents a position where A is attached.

Herein, the length of A is calculated by ChemBio3D Ultra 14.0.0.117, optimized by MM2. Structures and lengths of some substituents are illustrated in the following table.

| Structure | Length L (Å) |
| --- | --- |
| 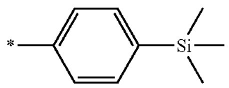 [SMILES: *c1ccc([Si](C)(C)C)cc1] | 6.6 |
| 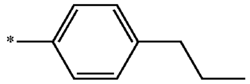 [SMILES: *c1ccc(CCC)cc1] | 7.3 |
| 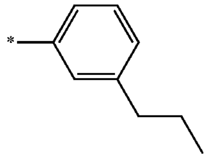 [SMILES: *c1cccc(CCC)c1] | 7.1 |
| 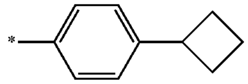 [SMILES: *c1ccc(C2CCC2)cc1] | 6.9 |
| 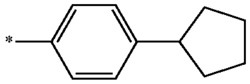 [SMILES: *c1ccc(C2CCCC2)cc1] | 7.3 |
| 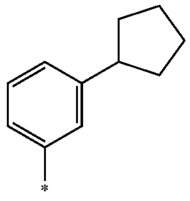 [SMILES: *c1cccc(C2CCCC2)c1] | 7.0 |
| 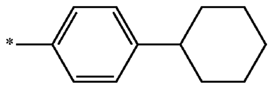 [SMILES: *c1ccc(C2CCCCC2)cc1] | 8.1 |

-continued
| Structure | Length L (Å) |
|---|---|
| 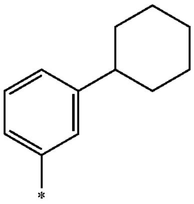 [SMILES: *c1cccc(C2CCCCC2)c1] | 7.7 |
| 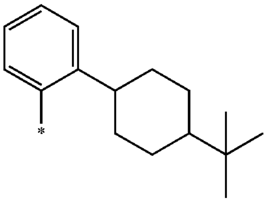 [SMILES: *c1ccccc1C1CCC(C(C)(C)C)CC1] | 8.9 |
| 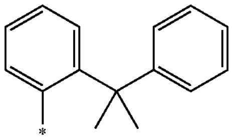 [SMILES: *c1ccccc1C(C)(C)c1ccccc1] | 7.0 |
| 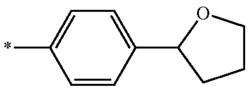 [SMILES: *c1ccc(C2CCCO2)cc1] | 7.1 |
| 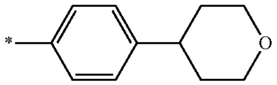 | 7.2 |
| 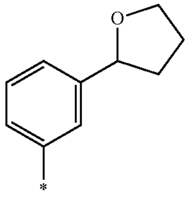 [SMILES: *c1cccc(C2CCCO2)c1] | 6.9 |
| 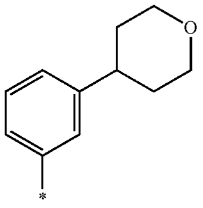 [SMILES: *c1cccc(C2CCOCC2)c1] | 6.9 |
| 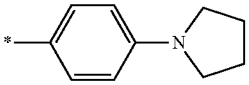 [SMILES: *c1ccc(N2CCCC2)cc1] | 7.2 |
| 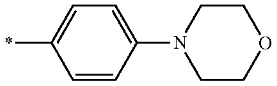 [SMILES: *c1ccc(N2CCOCC2)cc1] | 7.1 |
-continued
| Structure | Length L (Å) |
|---|---|
| 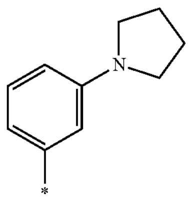 | 6.8 |
| 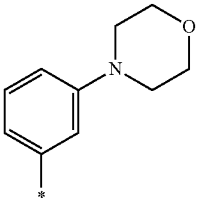 [SMILES: *c1cccc(N2CCOCC2)c1] | 6.9 |
| 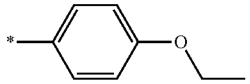 | 7.2 |
| 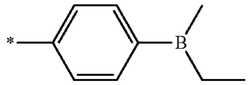 [SMILES: *c1ccc(B(C)CC)cc1] | 7.4 |
| 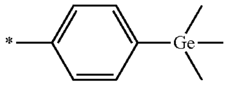 | 6.7 |
| 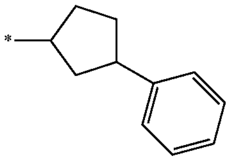 [SMILES: *C1CCC(c2ccccc2)C1] | 7.5 |
| 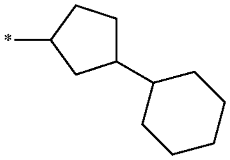 [SMILES: *C1CCC(C2CCCCC2)C1] | 7.8 |
| 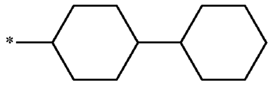 [SMILES: *C1CCC(C2CCCCC2)CC1] | 8.5 |
| 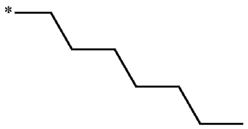 [SMILES: *CCCCCCC] | 7.3 |
| 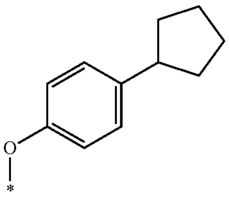 [SMILES: *Oc1ccc(C2CCCC2)cc1] | 8.6 |

-continued

| Structure | Length L (Å) |
| --- | --- |
| 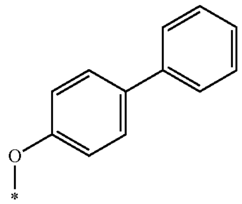 [SMILES: *Oc1ccc(-c2ccccc2)cc1] | 9.4 |

According to an embodiment of the present disclosure, in Formula 3, $R_y$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted arylalkyl having 7 to 30 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, and combinations thereof.

According to an embodiment of the present disclosure, in Formula 3, $R_y$ is, at each occurrence identically or differently, selected from the group consisting of: hydrogen, deuterium, halogen, substituted or unsubstituted alkyl having 1 to 6 carbon atoms, substituted or unsubstituted cycloalkyl having 3 to 6 ring carbon atoms, substituted or unsubstituted aryl having 6 to 12 carbon atoms, substituted or unsubstituted heteroaryl having 3 to 11 carbon atoms, substituted or unsubstituted alkylsilyl having 3 to 6 carbon atoms, a cyano group, and combinations thereof.

According to an embodiment of the present disclosure, in Formula 3, $R_y$ is, at each occurrence identically or differently, selected from the group consisting of: hydrogen, deuterium, methyl, ethyl, propyl, isopropyl, n-butyl, isobutyl, t-butyl, cyclopentyl, cyclohexyl, deuterated methyl, deuterated ethyl, deuterated propyl, deuterated isopropyl, deuterated n-butyl, deuterated isobutyl, deuterated t-butyl, deuterated cyclopentyl, deuterated cyclohexyl, phenyl, pyridyl, trimethylsilyl, and combinations thereof.

According to an embodiment of the present disclosure, in Formula 3, at least one $R_y$ is selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, and combinations thereof.

According to an embodiment of the present disclosure, in Formula 3, at least one or at least two of $R_5$ to $R_8$ is(are), at each occurrence identically or differently, selected from substituted or unsubstituted alkyl having 1 to 20 carbon atoms, substituted or unsubstituted cycloalkyl having 3 to 20 ring carbon atoms or combinations thereof, and the total number of carbon atoms in $R_5$ to $R_8$ is at least 4.

According to an embodiment of the present disclosure, in Formula 3, at least one or at least two of $R_6$ and $R_7$ is(are) selected from substituted or unsubstituted alkyl having 1 to 20 carbon atoms, substituted or unsubstituted cycloalkyl having 3 to 20 ring carbon atoms or combinations thereof, and the total number of carbon atoms in $R_6$ and $R_7$ is at least 4.

According to an embodiment of the present disclosure, in Formula 3, $R_7$ is selected from substituted or unsubstituted alkyl having 4 to 20 carbon atoms, substituted or unsubstituted cycloalkyl having 4 to 20 ring carbon atoms or combinations thereof.

According to an embodiment of the present disclosure, in Formula 3, at least one or at least two or at least three or all of $R_2$, $R_3$, $R_6$, and $R_7$ is(are) selected from the group consisting of: deuterium, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, and combinations thereof.

According to an embodiment of the present disclosure, in Formula 3, at least one or at least two or at least three or all of $R_2$, $R_3$, $R_6$, and $R_7$ is (are) selected from the group consisting of: deuterium, substituted or unsubstituted alkyl having 1 to 20 carbon atoms, substituted or unsubstituted cycloalkyl having 3 to 20 ring carbon atoms, and combinations thereof.

According to an embodiment of the present disclosure, in Formula 3, at least one or at least two or at least three or all of $R_2$, $R_3$, $R_6$, and $R_7$ is (are) selected from the group consisting of: deuterium, methyl, ethyl, propyl, isopropyl, n-butyl, isobutyl, t-butyl, cyclopentyl, cyclohexyl, and combinations thereof; optionally, hydrogen in the above groups can be partially or fully substituted with deuterium.

According to an embodiment of the present disclosure, R" is, at each occurrence identically or differently, selected from substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms or combinations thereof.

According to an embodiment of the present disclosure, R" is, at each occurrence identically or differently, selected from hydrogen, deuterium, methyl, ethyl, propyl, isopropyl, n-butyl, isobutyl, t-butyl, cyclopentyl, cyclohexyl, deuterated methyl, deuterated ethyl, deuterated propyl, deuterated isopropyl, deuterated n-butyl, deuterated isobutyl, deuterated t-butyl, deuterated cyclopentyl, deuterated cyclohexyl, phenyl, pyridyl or combinations thereof.

According to an embodiment of the present disclosure, R' is selected from substituted or unsubstituted alkyl having 1 to 20 carbon atoms or substituted or unsubstituted cycloalkyl having 3 to 20 ring carbon atoms.

According to an embodiment of the present disclosure, R' is selected from methyl or deuterated methyl.

According to an embodiment of the present disclosure, $L_a$ is, at each occurrence identically or differently, selected from the group consisting of $L_{a1}$ to $L_{a938}$, wherein for the specific structures of $L_{a1}$ to $L_{a938}$, reference is made to claim 17.

According to an embodiment of the present disclosure, $L_b$ is, at each occurrence identically or differently, selected from the group consisting of $L_{b1}$ to $L_{b328}$, and for the specific structures of $L_{b1}$ to $L_{b328}$, reference is made to claim 18.

According to an embodiment of the present disclosure, $L_c$ is, at each occurrence identically or differently, selected from the group consisting of $L_{c1}$ to $L_{c360}$, and for the specific structures of $L_{c1}$ to $L_{c360}$, reference is made to claim 19.

According to an embodiment of the present disclosure, the metal complex has a structure of $Ir(L_a)_2(L_b)$, wherein $L_a$ is, at each occurrence identically or differently, selected from any one or any two of the group consisting of $L_{a1}$ to $L_{a938}$, and $L_b$ is selected from any one of the group consisting of $L_{b1}$ to $L_{b328}$, wherein for the specific structures of $L_{a1}$ to $L_{a938}$, reference is made to claim 17, and for the specific structures of $L_{b1}$ to $L_{b328}$, reference is made to claim 18.

According to an embodiment of the present disclosure, the metal complex has a structure of $Ir(L_a)(L_b)_2$, wherein $L_a$ is, at each occurrence identically or differently, selected from any one of the group consisting of $L_{a1}$ to $L_{a938}$, and $L_b$ is selected from any one or any two of the group consisting of $L_{b1}$ to $L_{b328}$, wherein for the specific structures of $L_{a1}$ to $L_{a938}$, reference is made to claim 17, and for the specific structures of $L_{b1}$ to $L_{b328}$, reference is made to claim 18.

According to one embodiment of the present disclosure, the metal complex has a structure of $Ir(L_a)_3$, wherein $L_a$ is, at each occurrence identically or differently, selected from any one or any two or any three of the group consisting of $L_{a1}$ to $L_{a938}$, wherein for the specific structures of $L_{a1}$ to $L_{a938}$, reference is made to claim 17.

According to an embodiment of the present disclosure, the metal complex has a structure of $Ir(L_a)_2(L_c)$, wherein $L_a$ is, at each occurrence identically or differently, selected from any one or any two of the group consisting of $L_{a1}$ to $L_{a938}$, and $L_c$ is selected from any one of the group consisting of $L_{c1}$ to $L_{c360}$, wherein for the specific structures of $L_{a1}$ to $L_{a938}$, reference is made to claim 17, and for the specific structures of $L_{c1}$ to $L_{c360}$, reference is made to claim 19.

According to an embodiment of the present disclosure, the metal complex has a structure of $Ir(L_a)(L_c)_2$, wherein $L_a$ is, at each occurrence identically or differently, selected from any one of the group consisting of $L_{a1}$ to $L_{a938}$, and $L_c$ is selected from any one or any two of the group consisting of $L_{c1}$ to $L_{c360}$, wherein for the specific structures of $L_{a1}$ to $L_{a938}$, reference is made to claim 17, and for the specific structures of $L_{c1}$ to $L_{c360}$, reference is made to claim 19.

According to an embodiment of the present disclosure, the metal complex has a structure of $Ir(L_a)(L_b)(L_c)$, wherein $L_a$ is, at each occurrence identically or differently, selected from any one of the group consisting of $L_{a1}$ to $L_{a938}$, $L_b$ is selected from any one of the group consisting of $L_{b1}$ to $L_{b328}$, and $L_c$ is selected from any one of the group consisting of $L_{c1}$ to $L_{c360}$, wherein for the specific structures of $L_{a1}$ to $L_{a938}$, reference is made to claim 17, for the specific structures of $L_{b1}$ to $L_{b328}$, reference is made to claim 18, and for the specific structures of $L_{c1}$ to $L_{c360}$, reference is made to claim 19.

According to an embodiment of the present disclosure, the metal complex is selected from the group consisting of metal complex 1 to metal complex 1900, wherein for the specific structures of metal complex 1 to metal complex 1900, reference is made to claim 20.

According to an embodiment of the present disclosure, the metal complex is selected from the group consisting of metal complex 1 to metal complex 1902, wherein for the specific structures of metal complex 1 to metal complex 1902, reference is made to claim 20.

According to an embodiment of the present disclosure, an electroluminescent device is disclosed. The electroluminescent device includes:

an anode, a cathode, and an organic layer disposed between the anode and the cathode, wherein the organic layer comprises the metal complex described in any one of the above-mentioned embodiments.

According to an embodiment of the present disclosure, the organic layer comprising the metal complex in the electroluminescent device is an emissive layer.

According to an embodiment of the present disclosure, the electroluminescent device emits green light.

According to an embodiment of the present disclosure, the electroluminescent device emits white light.

According to an embodiment of the present disclosure, the emissive layer of the electroluminescent device comprises a first host compound.

According to an embodiment of the present disclosure, the emissive layer of the electroluminescent device comprises a first host compound and a second host compound.

According to an embodiment of the present disclosure, the first host compound and/or the second host compound in the electroluminescent device comprise at least one chemical group selected from the group consisting of: benzene, pyridine, pyrimidine, triazine, carbazole, azacarbazole, indolocarbazole, dibenzothiophene, azadibenzothiophene, dibenzofuran, azadibenzofuran, dibenzoselenophene, triphenylene, azatriphenylene, fluorene, silafluorene, naphthalene, quinoline, isoquinoline, quinazoline, quinoxaline, phenanthrene, azaphenanthrene, and combinations thereof.

According to an embodiment of the present disclosure, the first host compound has a structure represented by Formula 4:

Formula 4

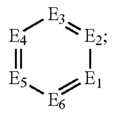

wherein, $E_1$ to $E_6$ are, at each occurrence identically or differently, selected from C, $CR_c$ or N, at least two of $E_1$ to $E_6$ are N, and at least one of $E_1$ to $E_6$ is C and is attached to Formula A:

Formula A

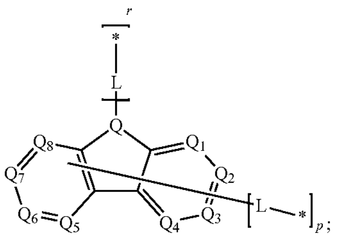

wherein,

Q is, at each occurrence identically or differently, selected from the group consisting of O, S, Se, N, NR''', CR'''R''', SiR'''R''', GeR'''R''', and R'''C═CR'''; when two R''' are present, the two R''' can be identical or different;

p is 0 or 1; r is 0 or 1;

when Q is selected from N, p is 0, and r is 1;

when Q is selected from the group consisting of O, S, Se, NR''', CR'''R''', SiR'''R''', GeR'''R''', and R'''C═CR''', p is 1, and r is 0;

L is, at each occurrence identically or differently, selected from a single bond, substituted or unsubstituted alkylene having 1 to 20 carbon atoms, substituted or unsubstituted cycloalkylene having 3 to 20 carbon atoms, substituted or unsubstituted arylene having 6 to 20 carbon atoms, substituted or unsubstituted heteroarylene having 3 to 20 carbon atoms or combinations thereof;

$Q_1$ to $Q_8$ are, at each occurrence identically or differently, selected from C, $CR_q$ or N;

$R_c$, R''', and $R_q$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof;

"*" represents a position where Formula A is attached to Formula 4;

adjacent substituents $R_e$, R''', $R_q$ can be optionally joined to form a ring.

Herein, the expression that "adjacent substituents $R_e$, R''', $R_q$ can be optionally joined to form a ring" is intended to mean that any one or at least two of groups of adjacent substituents, such as two substituents $R_e$, two substituents R''', two substituents $R_q$, and substituents R''' and $R_q$, can be joined to form a ring. Obviously, it is possible that none of these substituents are joined to form a ring.

According to an embodiment of the present disclosure, Q is, at each occurrence identically or differently, selected from O, S, N or NR''.

According to an embodiment of the present disclosure, $E_1$ to $E_6$ are, at each occurrence identically or differently, selected from C, $CR_e$ or N; wherein three of $E_1$ to $E_6$ are N, and at least one of $E_1$ to $E_6$ is $CR_e$ where in $R_e$ is, at each occurrence identically or differently, selected from the group consisting of: substituted or unsubstituted aryl having 6 to 30 carbon atoms, substituted or unsubstituted heteroaryl having 3 to 30 carbon atoms, and combinations thereof.

According to an embodiment of the present disclosure, $E_1$ to $E_6$ are, at each occurrence identically or differently, selected from C, $CR_e$ or N, three of $E_1$ to $E_6$ are N, at least one of $E_1$ to $E_6$ are is $CR_e$, and $R_e$ is, at each occurrence identically or differently, selected from the group consisting of: substituted or unsubstituted phenyl, substituted or unsubstituted biphenyl, substituted or unsubstituted terphenyl, substituted or unsubstituted naphthyl, substituted or unsubstituted phenanthryl, substituted or unsubstituted triphenylenyl, substituted or unsubstituted fluorenyl, substituted or unsubstituted dibenzofuryl, substituted or unsubstituted dibenzothiophenyl, substituted or unsubstituted carbazolyl, and combinations thereof.

According to an embodiment of the present disclosure, $R_e$ is, at each occurrence identically or differently, selected from the group consisting of: substituted or unsubstituted aryl having 6 to 30 carbon atoms, substituted or unsubstituted heteroaryl having 3 to 30 carbon atoms, and combinations thereof.

According to an embodiment of the present disclosure, $R_e$ is, at each occurrence identically or differently, selected from substituted or unsubstituted phenyl, substituted or unsubstituted biphenyl, substituted or unsubstituted terphenyl, substituted or unsubstituted naphthyl, substituted or unsubstituted phenanthryl, substituted or unsubstituted triphenylenyl, substituted or unsubstituted fluorenyl, substituted or unsubstituted dibenzofuryl, substituted or unsubstituted dibenzothiophenyl, substituted or unsubstituted carbazolyl, or combinations thereof.

According to an embodiment of the present disclosure, at least one or at least two of $Q_1$ to $Q_8$ is(are) selected from $CR_q$, wherein the $R_q$ is selected from substituted or unsubstituted aryl having 6 to 30 carbon atoms, substituted or unsubstituted heteroaryl having 5 to 30 carbon atoms or combinations thereof.

According to an embodiment of the present disclosure, at least one or at least two of $Q_1$ to $Q_8$ is(are) selected from $CR_q$, wherein the $R_q$ is selected from substituted or unsubstituted phenyl, substituted or unsubstituted naphthyl, substituted or unsubstituted biphenyl, substituted or unsubstituted terphenyl, substituted or unsubstituted pyridyl or combinations thereof.

According to an embodiment of the present disclosure, R''' is, at each occurrence identically or differently, selected from substituted or unsubstituted aryl having 6 to 30 carbon atoms, substituted or unsubstituted heteroaryl having 3 to 30 carbon atoms or combinations thereof.

According to an embodiment of the present disclosure, R''' is, at each occurrence identically or differently, selected from substituted or unsubstituted phenyl, substituted or unsubstituted biphenyl, substituted or unsubstituted terphenyl, substituted or unsubstituted naphthyl, substituted or unsubstituted phenanthryl, substituted or unsubstituted triphenylenyl, substituted or unsubstituted fluorenyl, substituted or unsubstituted dibenzofuryl, substituted or unsubstituted dibenzothiophenyl, substituted or unsubstituted carbazolyl or combinations thereof.

According to an embodiment of the present disclosure, L is, at each occurrence identically or differently, selected from a single bond, substituted or unsubstituted arylene having 6 to 20 carbon atoms, substituted or unsubstituted heteroarylene having 3 to 20 carbon atoms or combinations thereof.

According to an embodiment of the present disclosure, L is, at each occurrence identically or differently, selected from a single bond, substituted or unsubstituted phenylene, substituted or unsubstituted biphenylene, substituted or unsubstituted carbazolylene, substituted or unsubstituted dibenzofuranylene, substituted or unsubstituted dibenzothiophenylene or substituted or unsubstituted fluorenylene.

According to an embodiment of the present disclosure, L is, at each occurrence identically or differently, selected from a single bond, substituted or unsubstituted phenylene or substituted or unsubstituted biphenylene.

According to an embodiment of the present disclosure, the first host compound is selected from the group consisting of H-1 to H-243, wherein for the specific structures of H-1 to H-243, reference is made to claim 27.

According to an embodiment of the present disclosure, the second host compound in the electroluminescent device has a structure represented by Formula 5:

Formula 5

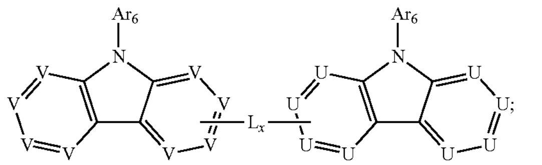

wherein, $L_x$ is, at each occurrence identically or differently, selected from a single bond, substituted or unsubstituted alkylene having 1 to 20 carbon atoms, substituted or unsubstituted cycloalkylene having 3 to 20 carbon atoms, substituted or unsubstituted arylene having 6 to 20 carbon atoms, substituted or unsubstituted heteroarylene having 3 to 20 carbon atoms or combinations thereof;

V is, at each occurrence identically or differently, selected from C, $CR_v$ or N, and at least one of V is C and is attached to $L_x$;

U is, at each occurrence identically or differently, selected from C, $CR_u$ or N, and at least one of U is C and is attached to $L_x$;

$R_v$ and $R_u$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof;

$Ar_6$ is, at each occurrence identically or differently, selected from substituted or unsubstituted aryl having 6 to 30 carbon atoms, substituted or unsubstituted heteroaryl having 3 to 30 carbon atoms or combinations thereof;

adjacent substituents $R_v$ and $R_u$ can be optionally joined to form a ring.

Herein, the expression that "adjacent substituents $R_v$ and $R_u$ can be optionally joined to form a ring" is intended to mean that any one or more of groups of adjacent substituents, such as two substituents $R_v$, two substituents $R_u$, and substituents $R_v$ and $R_u$, can be joined to form a ring. Obviously, it is possible that none of these substituents are joined to form a ring.

According to an embodiment of the present disclosure, the second host compound in the electroluminescent device has a structure represented by one of Formula 5-a to Formula 5-j:

5-a

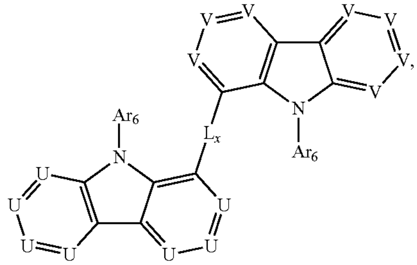

5-b

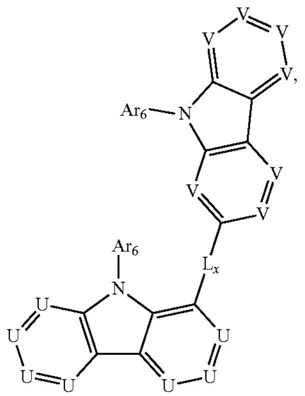

5-c

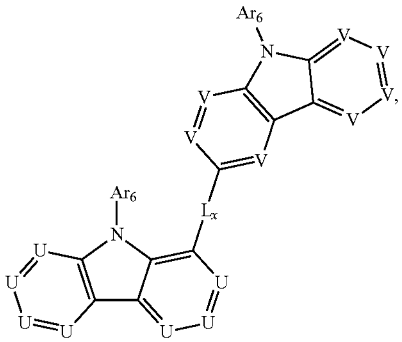

5-d

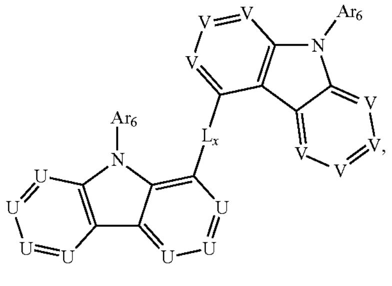

-continued 5-e

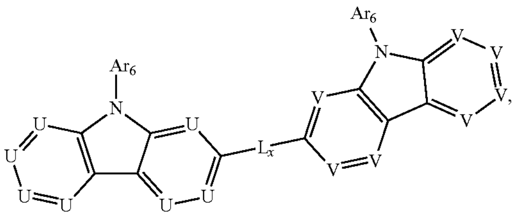

5-f

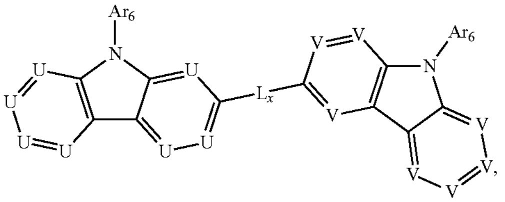

5-g

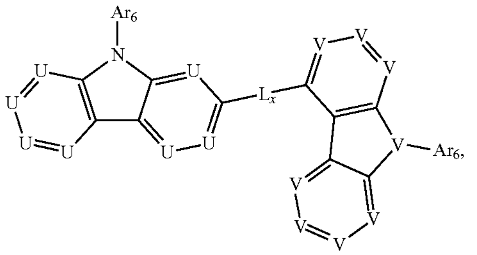

5-h

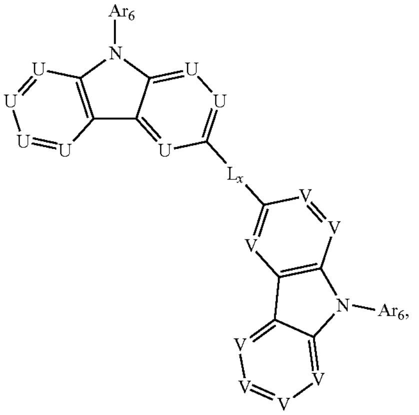

5-i

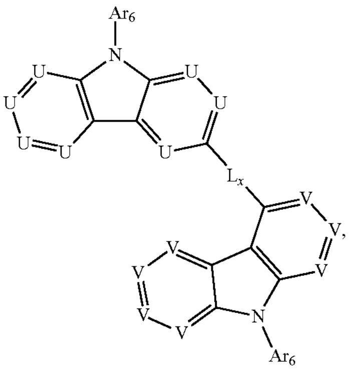

and

-continued 5-j

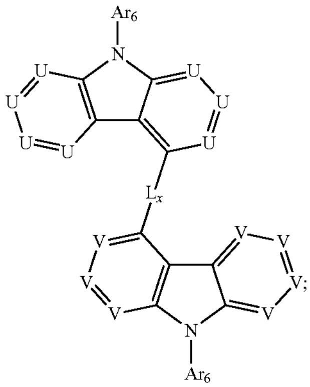

wherein, $L_x$ is, at each occurrence identically or differently, selected from a single bond, substituted or unsubstituted alkylene having 1 to 20 carbon atoms, substituted or unsubstituted cycloalkylene having 3 to 20 carbon atoms, substituted or unsubstituted arylene having 6 to 20 carbon atoms, substituted or unsubstituted heteroarylene having 3 to 20 carbon atoms or combinations thereof;

V is, at each occurrence identically or differently, selected from $CR_v$ or N;

U is, at each occurrence identically or differently, selected from $CR_u$ or N;

$R_v$ and $R_u$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof;

$Ar_6$ is, at each occurrence identically or differently, selected from substituted or unsubstituted aryl having 6 to 30 carbon atoms, substituted or unsubstituted heteroaryl having 3 to 30 carbon atoms or combinations thereof;

adjacent substituents $R_v$ and $R_u$ can be optionally joined to form a ring.

According to an embodiment of the present disclosure, the second host compound is selected from the group consisting of X-1 to X-150, wherein for the specific structures of X-1 to X-150, reference is made to claim 29.

According to an embodiment of the present disclosure, in the electroluminescent device, the metal complex is doped in the first host compound and the second host compound, and the weight of the metal complex accounts for 1% to 30% of the total weight of the emissive layer.

According to an embodiment of the present disclosure, in the electroluminescent device, the metal complex is doped in the first host compound and the second host compound, and the weight of the metal complex accounts for 3% to 13% of the total weight of the emissive layer.

According to another embodiment of the present disclosure, a compound composition is further disclosed. The compound composition comprises the metal complex described in any one of the above-mentioned embodiments.

Combination with Other Materials

The materials described in the present disclosure for a particular layer in an organic light-emitting device can be used in combination with various other materials present in the device. The combinations of these materials are described in more detail in U.S. Pat. App. No. 20160359122 at paragraphs 0132-0161, which is incorporated by reference herein in its entirety. The materials described or referred to the disclosure are non-limiting examples of materials that may be useful in combination with the compounds disclosed herein, and one of skill in the art can readily consult the literature to identify other materials that may be useful in combination.

The materials described herein as useful for a particular layer in an organic light-emitting device may be used in combination with a variety of other materials present in the device. For example, dopants disclosed herein may be used in combination with a wide variety of hosts, transport layers, blocking layers, injection layers, electrodes and other layers that may be present. The combination of these materials is described in detail in paragraphs 0080-0101 of U.S. Pat. App. No. 20150349273, which is incorporated by reference herein in its entirety. The materials described or referred to the disclosure are non-limiting examples of materials that may be useful in combination with the compounds disclosed herein, and one of skill in the art can readily consult the literature to identify other materials that may be useful in combination.

In the embodiments of material synthesis, all reactions were performed under nitrogen protection unless otherwise stated. All reaction solvents were anhydrous and used as received from commercial sources. Synthetic products were structurally confirmed and tested for properties using one or more conventional equipment in the art (including, but not limited to, nuclear magnetic resonance instrument produced by BRUKER, liquid chromatograph produced by SHIMADZU, liquid chromatograph-mass spectrometry produced by SHIMADZU, gas chromatograph-mass spectrometry produced by SHIMADZU, differential Scanning calorimeters produced by SHIMADZU, fluorescence spectrophotometer produced by SHANGHAI LENGGUANG TECH., electrochemical workstation produced by WUHAN CORRTEST, and sublimation apparatus produced by ANHUI BEQ, etc.) by methods well known to the persons skilled in the art. In the embodiments of the device, the characteristics of the device were also tested using conventional equipment in the art (including, but not limited to, evaporator produced by ANGSTROM ENGINEERING, optical testing system produced by SUZHOU FATAR, life testing system produced by SUZHOU FATAR, and ellipsometer produced by BEIJING ELLITOP, etc.) by methods well known to the persons skilled in the art. As the persons skilled in the art are aware of the above-mentioned equipment use, test methods and other related contents, the inherent data of the sample can be obtained with certainty and without influence, so the above related contents are not further described in this patent.

MATERIAL SYNTHESIS EXAMPLE

The method for preparing a compound of the present disclosure is not limited herein. Typically, the following compounds are taken as examples without limitations, and synthesis routes and preparation methods thereof are described below.

Synthesis Example 1: Synthesis of Metal Complex 1701

Step 1:

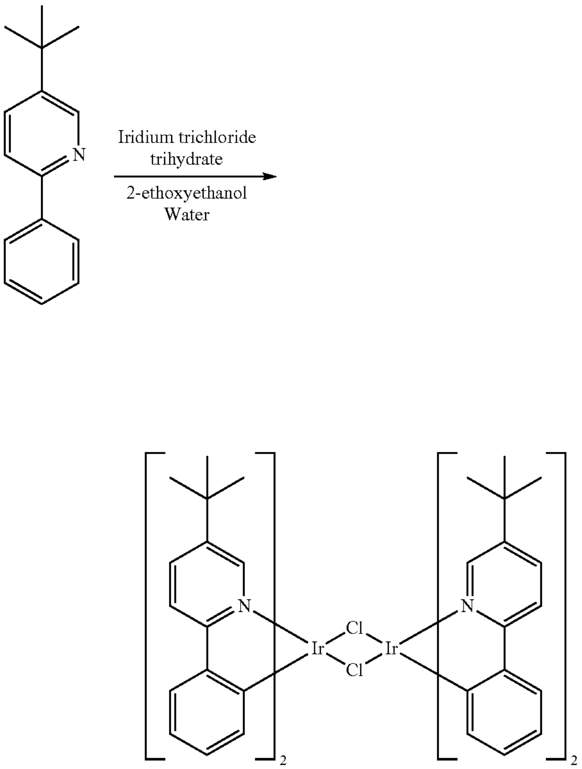

Intermediate 1

5-t-butyl-2-phenylpyridine (13.2 g, 62.9 mmol), iridium trichloride trihydrate (5.5 g, 15.7 mmol), 300 mL of 2-ethoxyethanol and 100 mL of water were sequentially added into a dry 500 mL round-bottom flask, purged with nitrogen three times, and heated and stirred at 130° C. for 24 hours under nitrogen protection. The reaction product was cooled, filtered, washed three times with methanol and n-hexane separately, and suction-dried to give 9.7 g of intermediate 1 (with a yield of 97%).

Step 2:

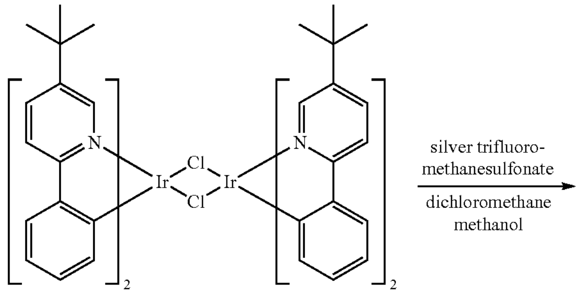

Intermediate 1

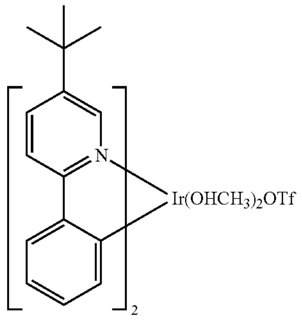

Intermediate 2

Intermediate 1 (9.7 g, 7.7 mmol), 250 mL of anhydrous dichloromethane, 10 mL of methanol and silver trifluoromethanesulfonate (4.3 g, 16.7 mmol) were sequentially added into a dry 500 mL round-bottom flask, purged with nitrogen three times, and stirred overnight at room temperature under nitrogen protection. The reaction product was filtered with Celite and washed twice with dichloromethane. The organic phases were collected and concentrated under reduced pressure to give 13.2 g of intermediate 2 as a yellow solid (with a yield of 93%).

Step 3:

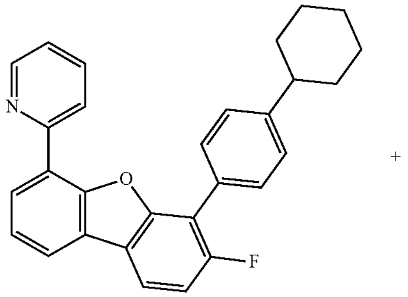

Intermediate 3

-continued

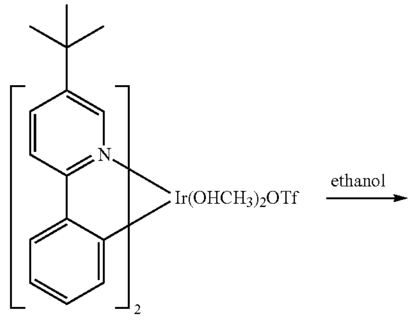

Intermediate 2

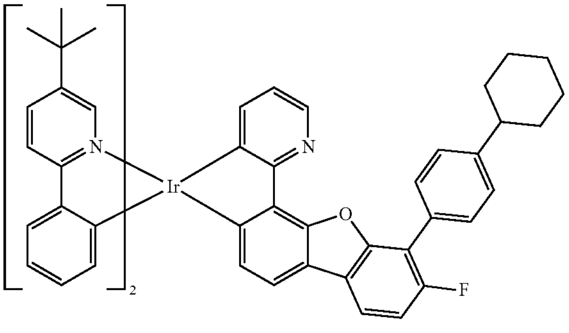

Metal complex 1701

Intermediate 2 (3.5 g, 4.3 mmol), intermediate 3 (3.3 g, 7.8 mmol) and 125 mL of ethanol were sequentially added into a dry 500 mL round-bottom flask, purged with nitrogen three times, heated at 100° C. and reacted for 24 hours under nitrogen protection. After the reaction was cooled, the reaction product was filtered with Celite, washed twice with methanol and n-hexane separately. Yellow solids above the Celite were dissolved with dichloromethane. The organic phases were collected, concentrated under reduced pressure, and purified by column chromatography to give metal complex 1701 as a yellow solid (2.3 g with a yield of 52%). The product was confirmed as the target product with a molecular weight of 1033.4.

Synthesis Example 2: Synthesis of Metal Complex 105

Step 1:

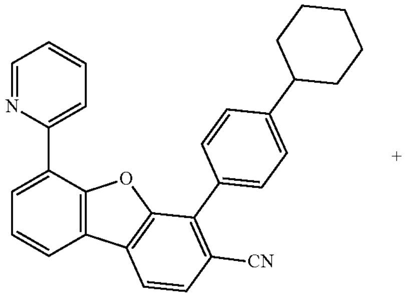

Intermediate 4

-continued

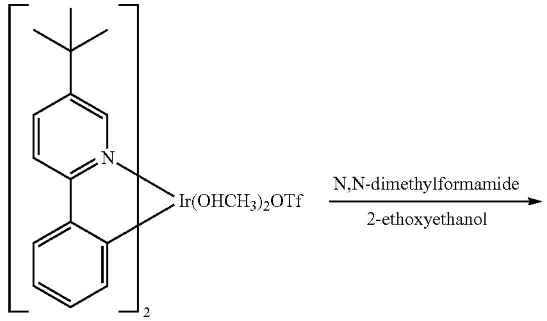

Intermediate 2

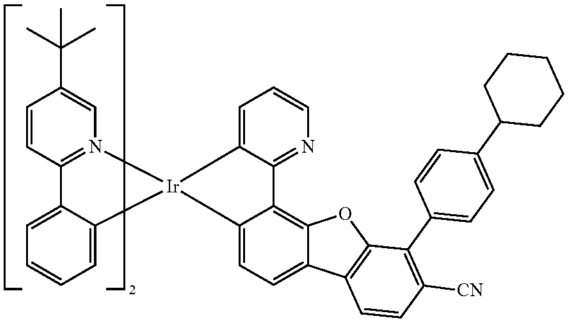

Metal complex 105

Intermediate 4 (1.0 mmol, 2.3 mmol), intermediate 2 (1.8 g, 2.3 mmol), 30 mL of 2-ethoxyethanol and 30 mL of N,N-dimethylformamide were sequentially added into a dry 250 mL round-bottom flask, purged with nitrogen three times, heated at 100° C. and reacted for 72 hours under nitrogen protection. After the reaction was cooled, the reaction product was filtered with Celite, washed twice with methanol and n-hexane separately. Yellow solids above the Celite were dissolved with dichloromethane. The organic phases were collected, concentrated under reduced pressure, and purified by column chromatography to give metal complex 105 as a yellow solid (0.6 g with a yield of 25%). The product was confirmed as the target product with a molecular weight of 1040.4.

Synthesis Example 3: Synthesis of Metal Complex 67

Step 1:

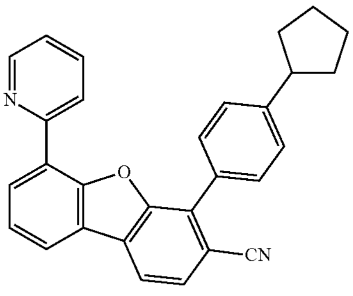

+

Intermediate 5

-continued

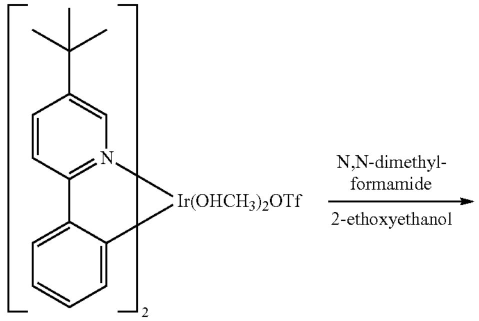

Intermediate 2

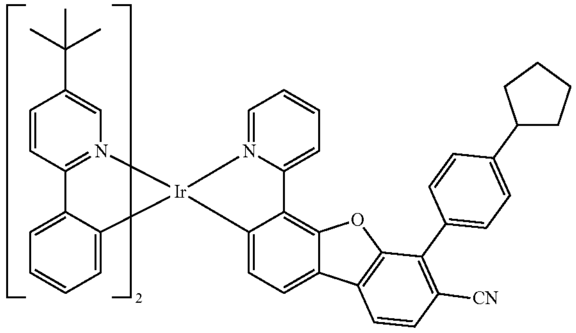

Metal complex 67

Intermediate 5 (1.8 g, 4.3 mmol), intermediate 2 (2.7 g, 3.2 mmol), 50 mL of 2-ethoxyethanol and 50 mL of N,N-dimethylformamide were sequentially added into a dry 250 mL round-bottom flask, purged with nitrogen three times, heated at 100° C. and reacted for 96 hours under nitrogen protection. After the reaction was cooled, the reaction product was filtered with Celite, washed twice with methanol and n-hexane separately. Yellow solids above the Celite were dissolved with dichloromethane. The organic phases were collected, concentrated under reduced pressure, and purified by column chromatography to give metal complex 67 as a yellow solid (0.4 g with a yield of 12%). The product was confirmed as the target product with a molecular weight of 1026.4.

Synthesis Example 4: Synthesis of Metal Complex 257

Step 1:

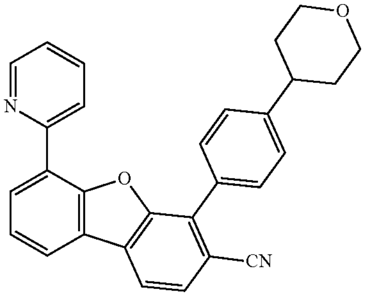

+

Intermediate 6

-continued

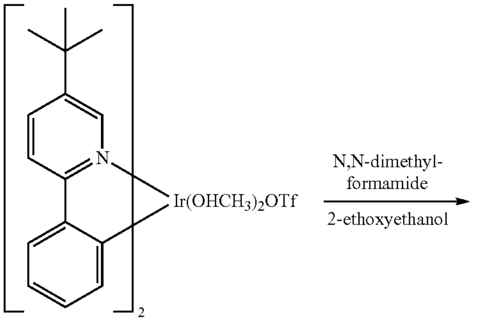

Intermediate 2

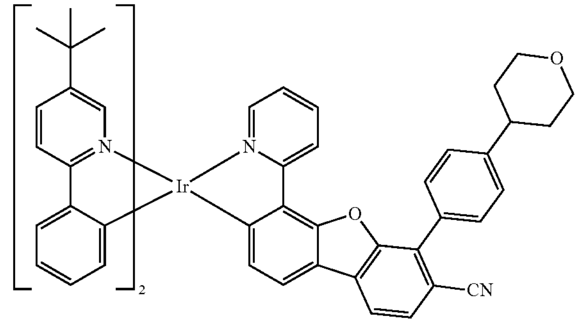

Metal complex 257

Intermediate 6 (1.3 g, 3.0 mmol), intermediate 2 (2.1 g, 2.5 mmol), 30 mL of 2-ethoxyethanol and 30 mL of N,N-dimethylformamide were sequentially added into a dry 250 mL round-bottom flask, purged with nitrogen three times, heated at 100° C. and reacted for 3 days under nitrogen protection. After the reaction was cooled, the reaction product was filtered with Celite, washed twice with methanol and n-hexane separately. Yellow solids above the Celite were dissolved with dichloromethane. The organic phases were collected, concentrated under reduced pressure, and purified by column chromatography to give metal complex 257 as a yellow solid (0.3 g with a yield of 11%). The product was confirmed as the target product with a molecular weight of 1042.4.

Synthesis Example 5: Synthesis of Metal Complex 1901

Step 1:

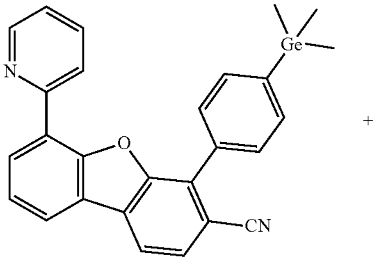

Intermediate 7

-continued

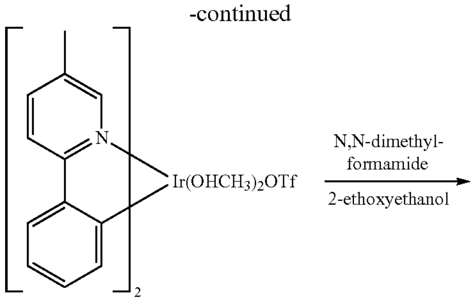

Intermediate 8

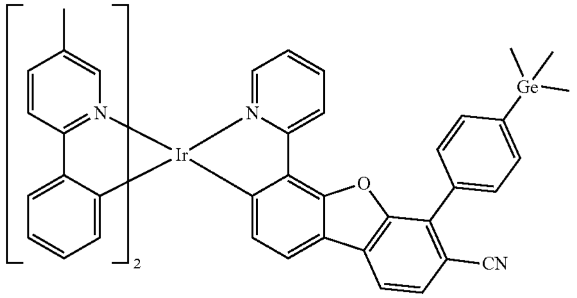

Metal complex 1901

Intermediate 7 (0.6 g, 1.2 mmol), intermediate 8 (0.9 g, 1.2 mmol), 15 mL of 2-ethoxyethanol and 15 mL of N,N-dimethylformamide were sequentially added into a dry 250 mL round-bottom flask, purged with nitrogen three times, heated at 100° C. and reacted for 5 days under nitrogen protection. After the reaction was cooled, the reaction product was filtered with Celite, washed twice with methanol and n-hexane separately. Yellow solids above the Celite were dissolved with dichloromethane. The organic phases were collected, concentrated under reduced pressure, and purified by column chromatography to give metal complex 1901 as a yellow solid (0.2 g with a yield of 17%). The product was confirmed as the target product with a molecular weight of 992.2.

The persons skilled in the art will appreciate that the above preparation methods are merely examples. The persons skilled in the art can obtain other compound structures of the present disclosure through the modifications of the preparation methods.

Device Example 1

First, a glass substrate having an indium tin oxide (ITO) anode with a thickness of 80 nm was cleaned and then treated with oxygen plasma and UV ozone. After the treatment, the substrate was dried in a glovebox to remove moisture. Next, the substrate was mounted on a substrate holder and placed in a vacuum chamber. Organic layers specified below were sequentially deposited through vacuum thermal evaporation on the ITO anode at a rate of 0.2 to 2 Angstroms per second at a vacuum degree of about $10^{-8}$ torr. Compound HI was used as a hole injection layer (HIL). Compound HT was deposited as a hole transport layer (HTL). Compound H1 was used as an electron blocking layer (EBL). The metal complex 1701 of the present disclosure, as a dopant, Compound H1 and Compound H2 were co-deposited as an emissive layer (EML). On the EML, Compound HB was used as a hole blocking layer (HBL). On the HBL, Compound ET and 8-hydroxyquinolinolato-lithium (Liq) were co-deposited as an electron transport layer (ETL). Finally, 8-hydroxyquinolinolato-lithium (Liq) with a thickness of 1 nm was deposited as an electron injection layer, and A1 with a thickness of 120 nm was deposited as a cathode. The device was then transferred back to the glovebox and encapsulated with a glass lid to complete the device.

Device Example 2

The implementation mode in Device Example 2 was the same as that in Device Example 1, except that the metal complex 1701 of the present disclosure in the EML was replaced with the metal complex 105 of the present disclosure.

Device Comparative Example 1

The implementation mode in Device Comparative Example 1 was the same as that in Device Example 1, except that the metal complex 1701 of the present disclosure in the emissive layer (EML) was replaced with a compound GD1.

Device Comparative Example 2

The implementation mode in Device Comparative Example 2 was the same as that in Device Example 1, except that the metal complex 1701 of the present disclosure in the emissive layer (EML) was replaced with a compound GD2.

Detailed structures and thicknesses of layers of the devices are shown in the following table. The layers using more than one material are obtained by doping different compounds at a weight ratio as recorded in the following stable.

The structures of the materials used in the devices are shown as follows:

Compound HI

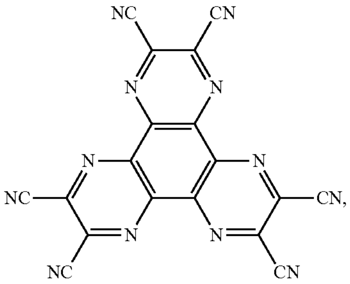

,

Compound HT

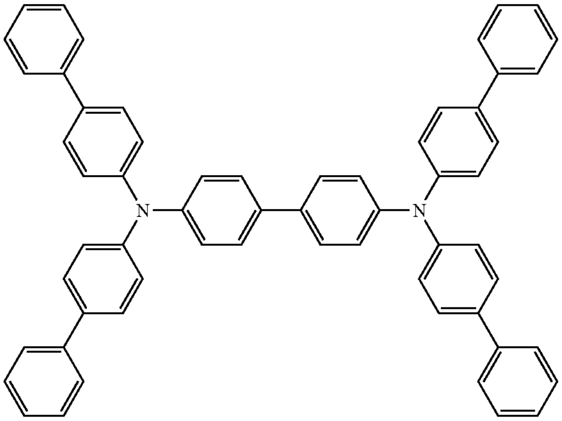

,

TABLE 1

Structures of devices of Examples 1 to 2 and Comparative Examples 1 to 2

| Device ID | HIL | HTL | EBL | EML | HBL | ETL |
|---|---|---|---|---|---|---|
| Example 1 | Compound HI (100 Å) | Compound HT (350 Å) | Compound H1 (50 Å) | Compound H1:Compound H2:Metal complex 1701(63:31:6) (400 Å) | Compound HB (50 Å) | Compound ET:Liq (40:60) (350 Å) |
| Example 2 | Compound HI (100 Å) | Compound HT (350 Å) | Compound H1 (50 Å) | Compound H1:Compound H2:Metal complex 105 (63:31:6) (400 Å) | Compound HB (50 Å) | Compound ET:Liq (40:60) (350 Å) |
| Comparative Example 1 | Compound HI (100 Å) | Compound HT (350 Å) | Compound H1 (50 Å) | Compound H1:Compound H2:Compound GD1 (63:31:6) (400 Å) | Compound HB (50 Å) | Compound ET:Liq (40:60) (350 Å) |
| Comparative Example 2 | Compound HI (100 Å) | Compound HT (350 Å) | Compound H1 (50 Å) | Compound H1:Compound H2:CompoundGD2 (63:31:6) (400 Å) | Compound HB (50 Å) | Compound ET:Liq (40:60) (350 Å) |

-continued
Compound H1
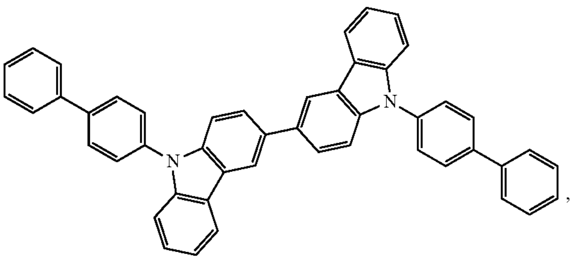
Compound H2
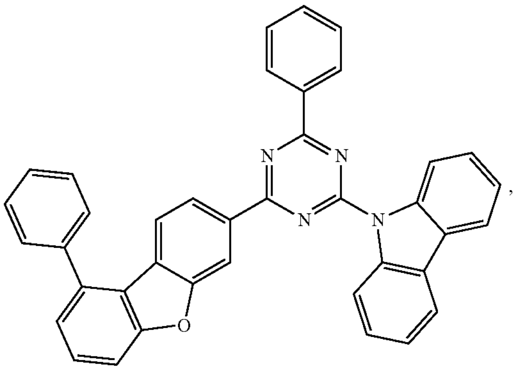
Compound HB
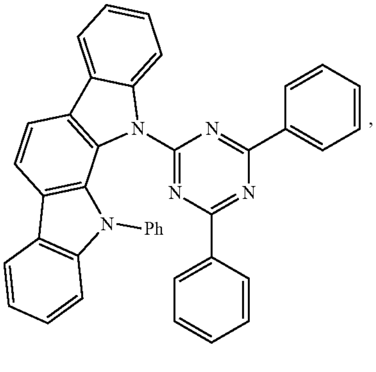
Metal complex 1701
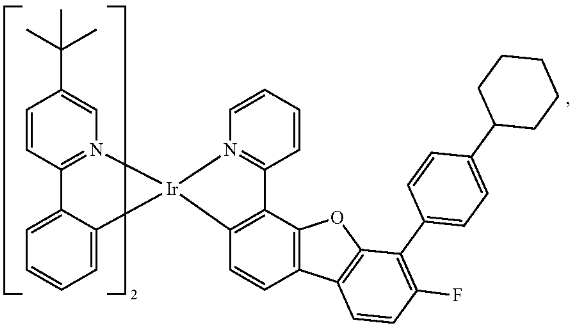
-continued
Metal complex 105
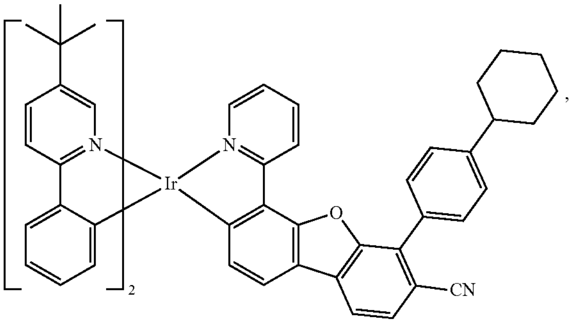
GD1
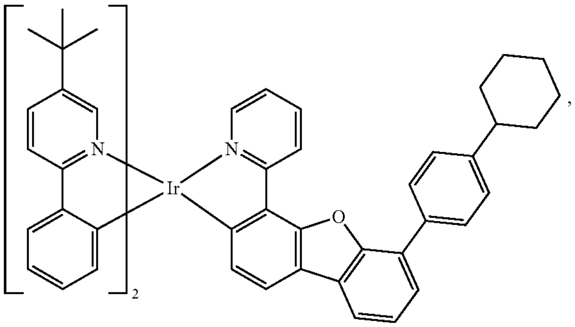
GD2
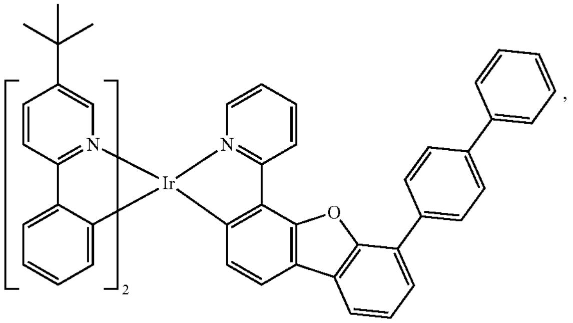
Compound ET
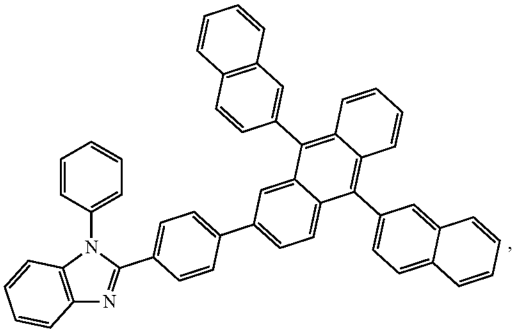
and -continued

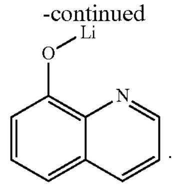

Liq

The IVL characteristics of the devices were measured. The CIE data, maximum emission wavelength ($\lambda_{max}$), full width at half maximum (FWHM), voltage (V), current efficiency (CE), power efficiency (PE), and external quantum efficiency (EQE) of the devices were measured at 1000 cd/m$^2$. The data was recorded and shown in Table 2.

TABLE 2

Device data of Examples 1 to 2 and Comparative Examples 1 to 2

| Device ID | CIE (x, y) | $\lambda_{max}$ (nm) | FWHM (nm) | Voltage (V) | CE (cd/A) | PE (lm/W) | EQE (%) |
|---|---|---|---|---|---|---|---|
| Example 1 | (0.358, 0.619) | 531 | 60.4 | 2.83 | 105 | 117 | 27.45 |
| Example 2 | (0.344, 0.633) | 531 | 37.9 | 2.66 | 114 | 135 | 29.04 |
| Comparative Example 1 | (0.355, 0.622) | 531 | 59.4 | 3.00 | 105 | 110 | 27.15 |
| Comparative Example 2 | (0.351, 0.625) | 529 | 58.3 | 2.98 | 103 | 109 | 26.64 |

Discussion:

Table 2 shows the performance of the devices using the compounds of the present disclosure and comparative compounds. Compared with Comparative Example 1, in Example 1, the ligand $L_a$ of the metal complex contained both fluorine substitution and substitution A at a specific position, the CE of the device was comparable, the EQE was slightly improved, the PE was increased by 6.4%, and the voltage was reduced by 0.17 V. It shows that both fluorine substitution and substitution A at a specific position contained in the ligand $L_a$ can reduce the drive voltage, improve the device efficiency and improve the comprehensive performance of the device.

Compared with Comparative Example 1, in Example 2, the ligand $L_a$ of the metal complex contained both cyano substitution and substitution A at a specific position, the CE, PE and EQE of the device were increased by 8.5%, 22.7% and 7%, respectively. In addition, the full width at half maximum of Example 2 was narrowed by 21 nm and the voltage was reduced by 0.34 V, compared with Comparative Example 1. It shows that both cyano substitution and substitution A at a specific position contained the ligand $L_a$ can reduce the drive voltage and full width at half maximum, significantly improve the device efficiency and significantly improve the comprehensive performance of the device.

Compared with Comparative Example 2, in Example 1, the voltage of the device was reduced by 0.15 V, and the CE, PE, and EQE were improved by 1.9%, 7.3% and 3.0%, respectively. Similarly, compared with Comparative Example 2, in Example 2, the voltage of the device was reduced by 0.32 V, the full width at half maximum was narrowed by 20 nm, and the CE, PE, and EQE were improved by 10.7%, 23.9% and 9.0%, respectively.

The above data show that, in the case that the performances of Comparative Examples have been at a very excellent level, the metal complexes of the present disclosure comprising the ligand $L_a$ having both fluorine or cyano substitution and a specific substituent A at a specific position can obviously surpass the metal complexes of the Comparative Examples in the comprehensive performance of the device and significantly improve the comprehensive performance of the device, which is very rare in the industry.

Device Example 3

The implementation mode in Device Example 3 was the same as that in Device Example 1, except that the metal complex 1701 of the present disclosure in the emissive layer was replaced with the metal complex 67 of the present disclosure.

Device Example 4

The implementation mode in Device Example 4 was the same as that in Device Example 1, except that the metal complex 1701 of the present disclosure in the emissive layer was replaced with the metal complex 257 of the present disclosure.

Device Comparative Example 3

The implementation mode in Device Comparative Example 3 was the same as that in Device Example 1, except that the metal complex 1701 of the present disclosure in the emissive layer (EML) was replaced with a compound GD3.

Device Comparative Example 4

The implementation mode in Device Comparative Example 4 was the same as that in Device Example 1, except that the metal complex 1701 of the present disclosure in the emissive layer (EML) was replaced with a compound GD4.

Device Comparative Example 5

The implementation mode in Device Comparative Example 5 was the same as that in Device Example 1, except that the metal complex 1701 of the present disclosure in the emissive layer (EML) was replaced with a compound GD5.

Detailed structures and thicknesses of layers of the devices are shown in the following table. The layers using more than one material are obtained by doping different compounds at a weight ratio as recorded in the following stable.

TABLE 3

| Structures of devices of Examples 3 to 4 and Comparative Examples 3 to 5 | | | | | | |
|---|---|---|---|---|---|---|
| Device ID | HIL | HTL | EBL | EML | HBL | ETL |
| Example 3 | Compound HI (100 Å) | Compound HT (350 Å) | Compound H1 (50 Å) | Compound H1:Compound H2:Metal complex 67(63:31:6) (400 Å) | Compound HB (50 Å) | Compound ET:Liq (40:60) (350 Å) |
| Example 4 | Compound HI (100 Å) | Compound HT (350 Å) | Compound H1 (50 Å) | Compound H1:Compound H2:Metal complex 257(63:31:6) (400 Å) | Compound HB (50 Å) | Compound ET:Liq (40:60) (350 Å) |
| Comparative Example 3 | Compound HI (100 Å) | Compound HT (350 Å) | Compound H1 (50 Å) | Compound H1:Compound H2:Compound GD3 (63:31:6) (400 Å) | Compound HB (50 Å) | Compound ET:Liq (40:60) (350 Å) |
| Comparative Example 4 | Compound HI (100 Å) | Compound HT (350 Å) | Compound H1 (50 Å) | Compound H1:Compound H2:CompoundGD4 (63:31:6) (400 Å) | Compound HB (50 Å) | Compound ET:Liq (40:60) (350 Å) |
| Comparative Example 5 | Compound HI (100 Å) | Compound HT (350 Å) | Compound H1 (50 Å) | Compound H1:Compound H2:Compound GD5 (63:31:6) (400 Å) | Compound HB (50 Å) | Compound ET:Liq (40:60) (350 Å) |

Structures of the new materials used in the device are as follows:

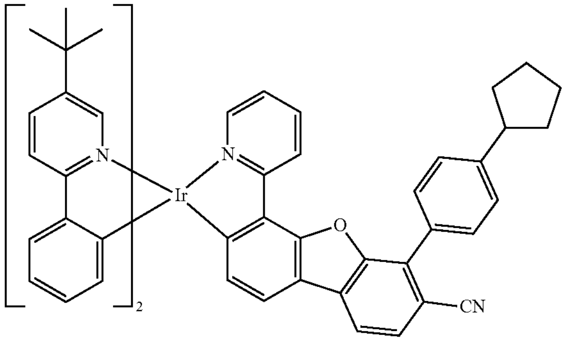

Metal complex 67 ,

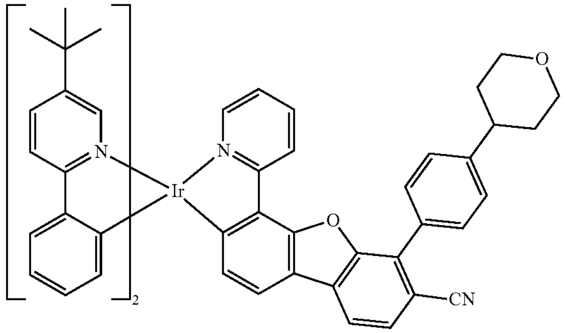

Metal complex 257 ,

-continued

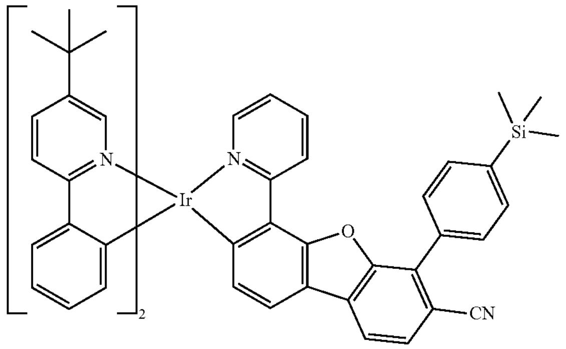

GD3 ,

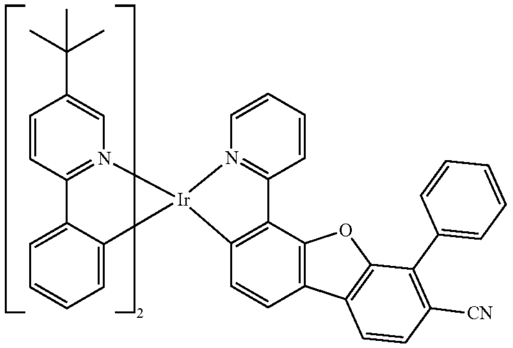

GD4 , and

-continued

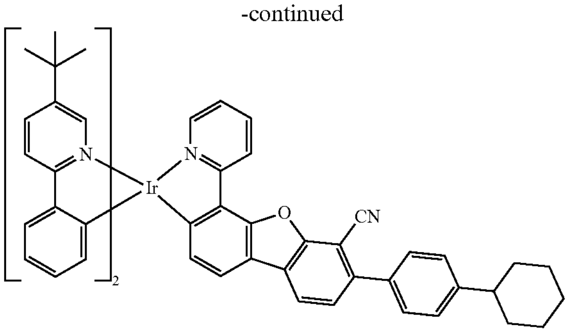

GD5

The IVL characteristics of the devices were measured. The CIE data, maximum emission wavelength ($\lambda_{max}$), full width at half maximum (FWHM), voltage (V), current efficiency (CE), power efficiency (PE), and external quantum efficiency (EQE) of the devices were measured at 1000 cd/m$^2$. The data was recorded and shown in Table 4.

TABLE 4

Device data of Examples 2 to 4 and Comparative Examples 3 to 5

| Device ID | CIE (x, y) | $\lambda_{max}$ (nm) | FWHM (nm) | Voltage (V) | CE (cd/A) | PE (lm/W) | EQE (%) |
|---|---|---|---|---|---|---|---|
| Example 2 | (0.344, 0.633) | 531 | 37.9 | 2.66 | 114 | 135 | 29.04 |
| Example 3 | (0.346, 0.631) | 531 | 39.3 | 2.68 | 111 | 131 | 28.27 |
| Example 4 | (0.347, 0.631) | 532 | 38.2 | 2.64 | 113 | 135 | 28.94 |
| Comparative Example 3 | (0.346, 0.631) | 532 | 37.4 | 2.79 | 106 | 120 | 26.90 |
| Comparative Example 4 | (0.342, 0.635) | 531 | 35.9 | 2.70 | 104 | 121 | 26.21 |
| Comparative Example 5 | (0.352, 0.627) | 534 | 45.1 | 2.74 | 104 | 119 | 26.47 |

Discussion:

Table 4 shows the performance of the devices using the compounds of the present disclosure and comparative compounds. Compared with Comparative Example 3, in Examples 2 to 4, the ligand $L_a$ of the metal complexes contained both cyano substitution and substituents of different lengths at specific positions, the voltages of the devices were reduced by 0.13 V, 0.11 V and 0.15 V, respectively, the CE of the devices was all improved by around 5%, the PE was increased by 12.5%, 9.2% and 12.5%, respectively, the EQE was improved by around 8.0%, 5.1% and 7.6%, respectively.

Similarly, compared with Comparative Example 4, in Examples 2 to 4, the ligand $L_a$ of the metal complexes contained both cyano substitution and substituents of different lengths at specific positions, the voltages of the devices were slightly reduced, the CE of the devices was all improved by around 8%, the PE was increased by 11.5%, 8.2% and 11.5%, respectively, and the EQE was improved by around 10.8%, 7.8% and 10.4%, respectively.

Compared with Comparative Example 5, in Example 2, the ligand $L_a$ of the metal complex contained both a cyano substituent and a substituent A at different substitution positions, the voltage of the device was slightly reduced, the CE, PE and EQE of the device were improved by 9.6%, 13.4% and 9.7%, respectively. Meanwhile, the half peak width was narrowed by 7.2 nm, and the spectrum shows blue shift by 3 nm.

The above data show that, in the case that the performances of Comparative Examples have been at a very excellent level, the metal complexes of the present disclosure comprising the ligand $L_a$ having both cyano substitution and a specific substituent A at a specific position can significantly improve the comprehensive performance of the device and obviously surpass the metal complexes of the Comparative Examples in the comprehensive performance of the device, which is very rare in the industry.

Device Comparative Example 6

The implementation mode in Device Comparative Example 6 was the same as that in Device Example 1, except that the metal complex 1701 of the present disclosure in the emissive layer (EML) was replaced with a Compound GD6.

Device Comparative Example 7

The implementation mode in Device Comparative Example 7 was the same as that in Device Example 1, except that the metal complex 1701 of the present disclosure in the emissive layer (EML) was replaced with a compound GD7.

Detailed structures and thicknesses of layers of the devices are shown in the following table. The layers using more than one material are obtained by doping different compounds at a weight ratio as recorded in the following stable.

TABLE 5

Structures of devices of Comparative Examples 6 and 7

| Device ID | HIL | HTL | EBL | EML | HBL | ETL |
|---|---|---|---|---|---|---|
| Comparative Example 6 | Compound HI (100 Å) | Compound HT (350 Å) | Compound H1 (50 Å) | Compound H1:Compound H2:Compound GD6 (63:31:6) (400 Å) | Compound HB (50 Å) | Compound ET:Liq (40:60) (350 Å) |

TABLE 5-continued

| Structures of devices of Comparative Examples 6 and 7 | | | | | | |
|---|---|---|---|---|---|---|
| Device ID | HIL | HTL | EBL | EML | HBL | ETL |
| Comparative Example 7 | Compound HI (100 Å) | Compound HT (350 Å) | Compound H1 (50 Å) | Compound H1:Compound H2:Compound GD7 (63:31:6) (400 Å) | Compound HB (50 Å) | Compound ET:Liq (40:60) (350 Å) |

Structures of the new materials used in the device are as follows:

GD6

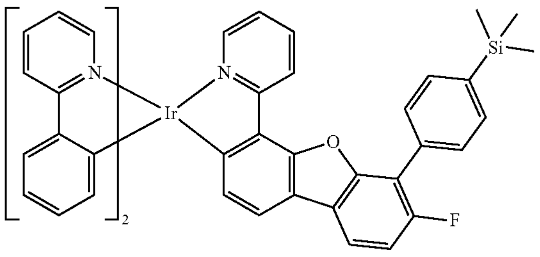

and

GD7

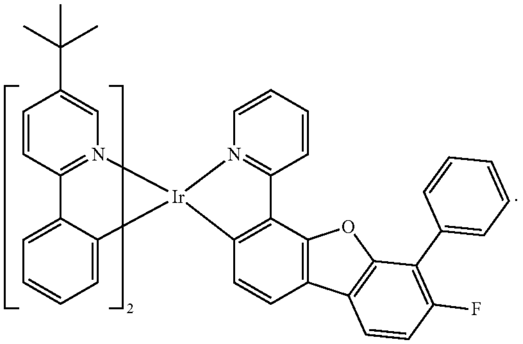

.

The IVL characteristics of the devices were measured. The CIE data, maximum emission wavelength ($\lambda_{max}$), full width at half maximum (FWHM), voltage (V), current efficiency (CE), power efficiency (PE), and external quantum efficiency (EQE) of the devices were measured at 1000 cd/$m^2$. The data was recorded and shown in Table 6.

TABLE 6

| Device data of Example 1 and Comparative Examples 6 and 7 | | | | | | | |
|---|---|---|---|---|---|---|---|
| Device ID | CIE (x, y) | $\lambda_{max}$ (nm) | FWHM (nm) | Voltage (V) | CE (cd/A) | PE (lm/W) | EQE (%) |
| Example 1 | (0.358, 0.619) | 531 | 60.4 | 2.83 | 105 | 117 | 27.45 |
| Comparative Example 6 | (0.340, 0.629) | 527 | 60.3 | 2.84 | 92 | 102 | 24.21 |
| Comparative Example 7 | (0.352, 0.624) | 530 | 58.4 | 3.06 | 96 | 98 | 24.75 |

Discussion:

Table 6 shows the performance of the devices using the compounds of the present disclosure and comparative compounds. Compared with Comparative Examples 6 and 7, in Example 1, the ligand $L_a$ of the metal complex contained both fluorine substitution and substituents of different lengths at specific positions. Compared with Comparative Example 6, in Example 1, the voltage of the device was equivalent, and the CE, PE, and EQE were improved by 14.1%, 14.7% and 13.4%, respectively. Similarly, compared with Comparative Example 7, in Example 1, the voltage of the device was reduced by 0.23 V, and the CE, PE, and EQE were improved by 9.4%, 19.4% and 10.9%, respectively.

In sum, in the case that the performances of Comparative Examples have been at a very excellent level, the metal complexes of the present disclosure comprising the ligand $L_a$ having both fluorine substitution and a specific substituent A at a specific position can obviously surpass the metal complexes of the Comparative Examples in the comprehensive performance of the device and significantly improve the comprehensive performance of the device, which is very rare in the industry.

As can be seen from Examples and Comparative Examples in the above discussion, compared with metal complexes of Comparative Examples, the metal complex of the present disclosure comprising the ligand $L_a$ having both cyano or fluorine substitution and substitution A at a specific position can significantly improve the device performance. The observed advantages of the compounds of the present disclosure are completely unexpected. Even for the persons skilled in the art, it is impossible to predict this situation.

It should be understood that various embodiments described herein are merely examples and not intended to limit the scope of the present disclosure. Therefore, it is apparent to the persons skilled in the art that the present disclosure as claimed may include variations from specific embodiments and preferred embodiments described herein. Many of materials and structures described herein may be substituted with other materials and structures without departing from the spirit of the present disclosure. It should be understood that various theories as to why the present disclosure works are not intended to be limitative.

What is claimed is:

1. A metal complex, comprising a metal M and a ligand $L_a$ coordinated with the metal M, wherein the metal M is selected from metals having a relative atomic mass greater than 40, and $L_a$ has a structure represented by Formula 1:

Formula 1

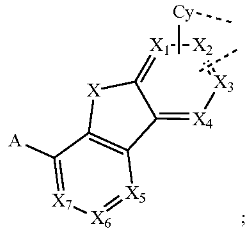

;

wherein in Formula 1,

Cy is, at each occurrence identically or differently, selected from a substituted or unsubstituted aromatic ring having 6 to 24 ring atoms, a substituted or unsubstituted heteroaromatic ring having 5 to 24 ring atoms or combinations thereof;

X is selected from the group consisting of O, S, Se, NR', CR'R', SiR'R', and GeR'R'; when two R' are present, the two R' are identical or different;

$X_1$ to $X_7$ are, at each occurrence identically or differently, selected from C, $CR_x$ or N; at least one of $X_1$ to $X_4$ is C and is attached to Cy;

$X_1$, $X_2$, $X_3$ or $X_4$ is attached to the metal M through a metal-carbon bond or a metal-nitrogen bond;

at least one of $X_1$ to $X_7$ is $CR_x$, wherein the $R_x$ is cyano or fluorine;

A has a structure represented by Formula 2:

Formula 2

$$*-A_1-(A_2)_a-R_{a3};$$

wherein a is selected from 1;

$A_1$ is, at each occurrence identically or differently, selected from the group consisting of the following groups unsubstituted or substituted by one or at least two $R_{a1}$: alkylene having 1 to 20 carbon atoms, heteroalkylene having 1 to 20 carbon atoms, cycloalkylene having 3 to 20 carbon atoms, heterocyclene having 3 to 20 ring atoms, phenylene, and heteroarylene having 5 to 6 ring atoms, and combinations thereof;

$A_2$ is, at each occurrence identically or differently, selected from the group consisting of the following groups unsubstituted or substituted by one or at least two $R_{a2}$: cycloalkylene having 3 to 20 carbon atoms, heterocyclene having 3 to 20 ring atoms, and combinations thereof;

R', $R_x$, $R_{a1}$, $R_{a2}$, and $R_{a3}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof;

adjacent substituents R', $R_x$, $R_{a2}$, $R_{a3}$ can be optionally joined to form a ring;

the length of A is at least 6.7 Å;

"*" represents a position where A is attached;

when $A_1$ is selected from phenylene unsubstituted or substituted by one or at least two $R_{a1}$ or heteroarylene having 5 to 6 ring atoms unsubstituted or substituted by one or at least two $R_{a1}$, $A_2$ and $R_{a1}$ need to satisfy the following conditions:

1) $A_2$ that is directly attached to $A_1$ is, at each occurrence identically or differently, selected from the group consisting of: following groups unsubstituted or substituted by one or at least two $R_{a2}$: cycloalkylene having 3 to 20 carbon atoms and heterocyclene having 3 to 20 ring atoms, and combinations thereof; and 2) $R_{a1}$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof.

2. The metal complex of claim 1, wherein $A_1$ is, at each occurrence identically or differently, selected from phenylene unsubstituted or substituted by one or at least two $R_{a1}$ or heteroarylene having 5 to 6 ring atoms unsubstituted or substituted by one or at least two $R_{a1}$; $A_2$ is, at each occurrence identically or differently, selected from the group consisting of the following groups following groups unsubstituted or substituted by one or at least two $R_{a2}$: cycloalkylene having 3 to 20 ring carbon atoms and heterocyclene having 3 to 20 ring atoms, and combinations thereof.

3. The metal complex of claim 1, wherein $A_1$ is, at each occurrence identically or differently, selected from the group consisting of the following groups unsubstituted or substituted by one or at least two $R_{a1}$: alkylene having 1 to 20 carbon atoms, heteroalkylene having 1 to 20 carbon atoms, cycloalkylene having 3 to 20 carbon atoms and heterocyclene having 3 to 20 ring atoms, and combinations thereof; $A_2$ is, at each occurrence identically or differently, selected from following groups unsubstituted or substituted by one or at least two $R_{a2}$: cycloalkylene having 3 to 20 carbon atoms, heterocyclene having 3 to 20 ring atoms, and combinations thereof.

4. The metal complex of claim 1, wherein Cy is selected from any one of the group consisting of the following structures:

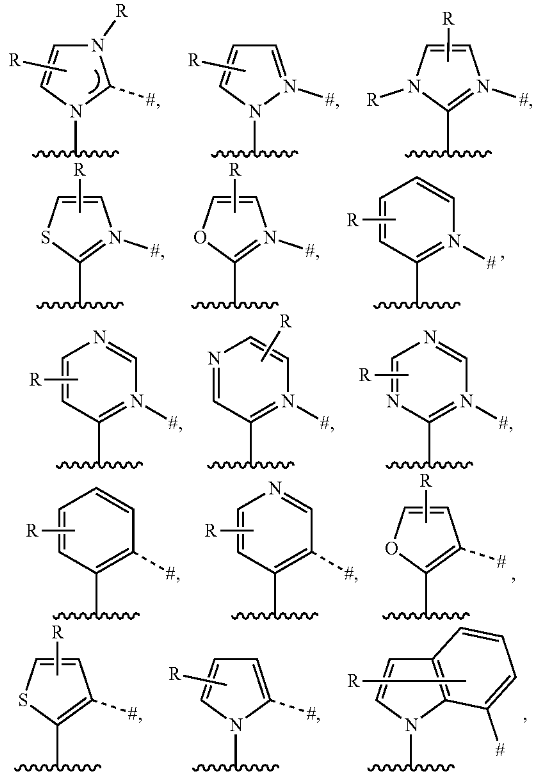

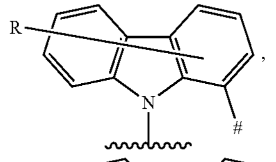

and

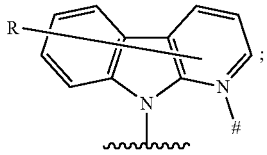

;

wherein,

R represents, at each occurrence identically or differently, mono-substitution, multiple substitutions or no substitution; when a plurality of R are present in any one of those structures, the plurality of R are identical or different;

R is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, a cyano group, an isocyano group, and combinations thereof;

two adjacent substituents R can be optionally joined to form a ring;

"#" represents a position where the metal M is attached, and

represents a position where $X_1$, $X_2$, $X_3$ or $X_4$ is attached.

5. The metal complex of claim 1, wherein the metal complex has a general formula of $M(L_a)_m(L_b)_n(L_c)_q$;

wherein,

M is, at each occurrence identically or differently, selected from the group consisting of Cu, Ag, Au, Ru, Rh, Pd, Os, Ir, and Pt;

$L_a$, $L_b$, and $L_c$ are a first ligand, a second ligand and a third ligand coordinated to the metal M, respectively, and $L_c$ is identical to or different from $L_a$ or $L_b$; wherein $L_a$, $L_b$, and $L_c$ can be optionally joined to form a multidentate ligand;

m is selected from 1, 2 or 3, n is selected from 0, 1 or 2, q is selected from 0, 1 or 2, and m+n+q equals an oxidation state of the metal M; when m is greater than or equal to 2, a plurality of $L_a$ are identical or different; when n is equal to 2, two $L_b$ are identical or different; when q is equal to 2, two $L_c$ are identical or different;

$L_a$ is, at each occurrence identically or differently, selected from the group consisting of:

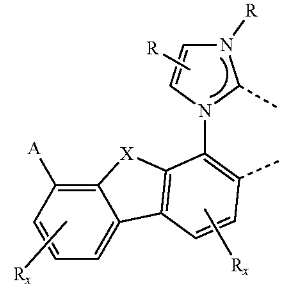

,

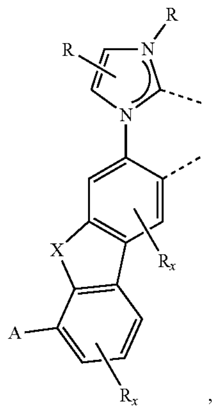

,

-continued
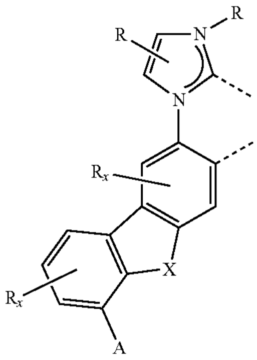
,
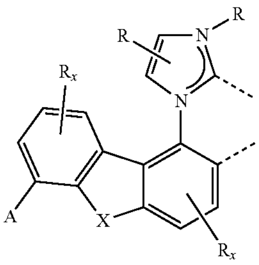
,
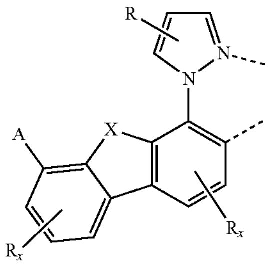
,
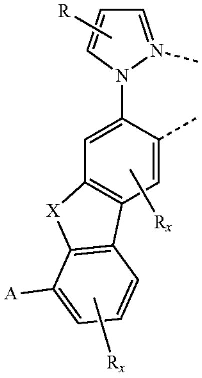
,
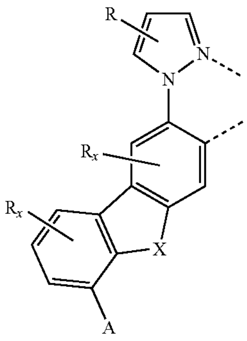
,
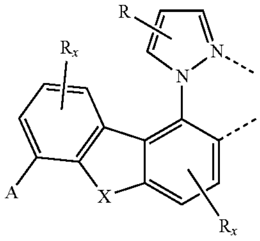
,
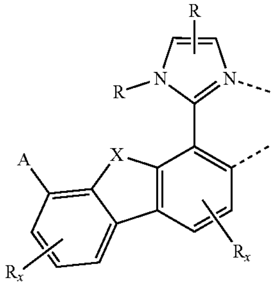
,
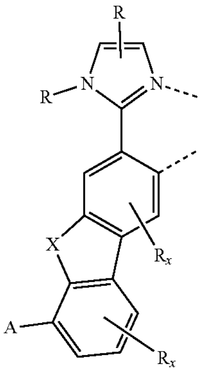
,
-continued
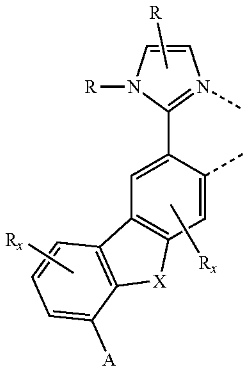
,
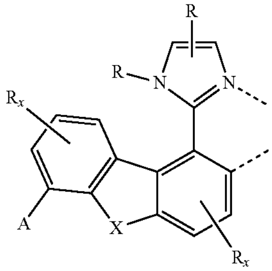
,
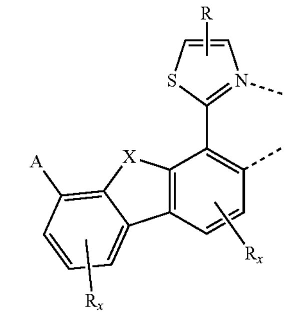
,
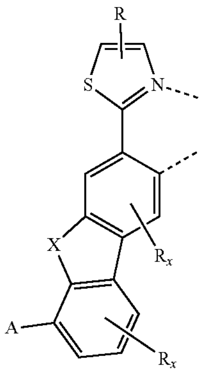
,
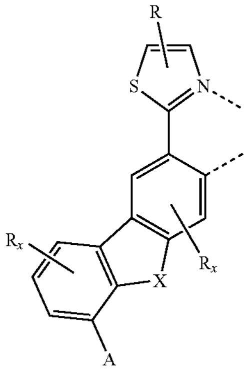
,
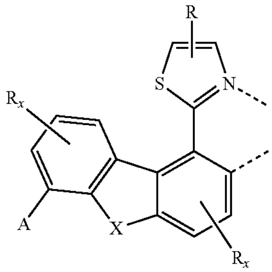
,
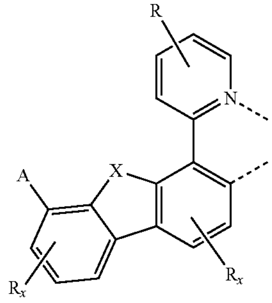
,
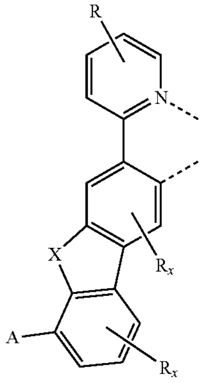
, -continued
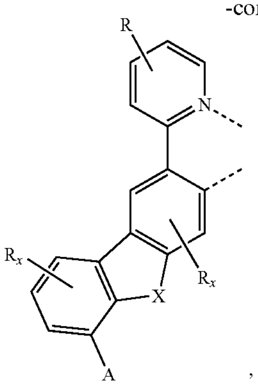
,
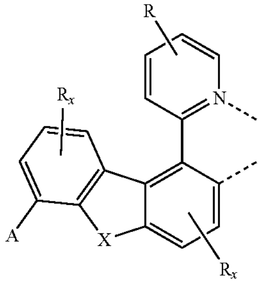
,
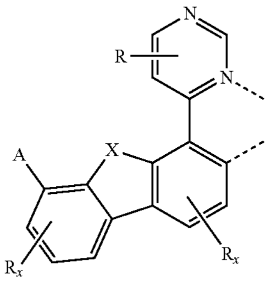
,
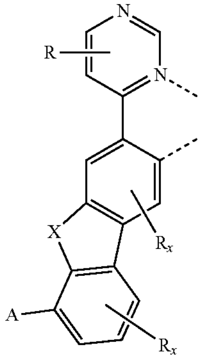
,
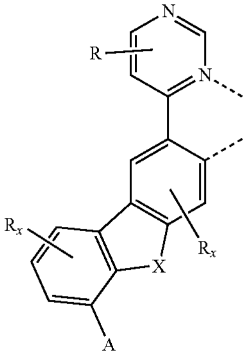
,
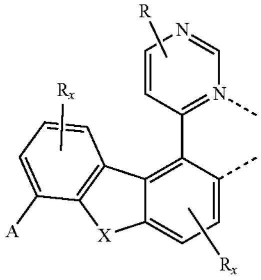
,
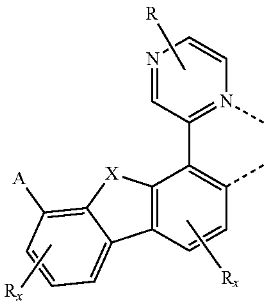
,
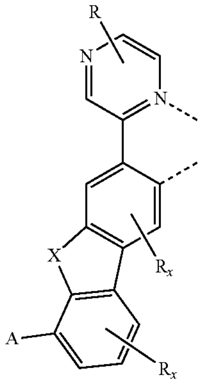
,
-continued
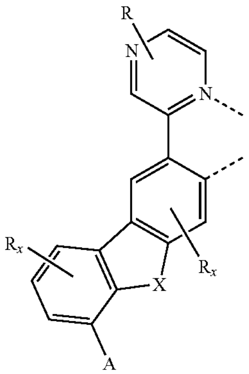
,
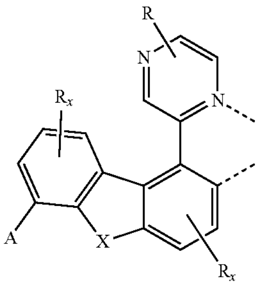
,
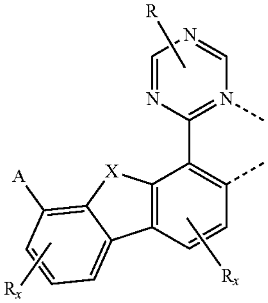
,
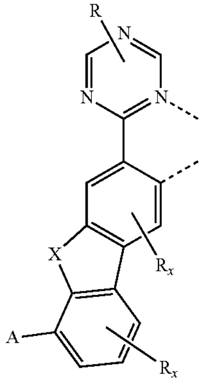
,
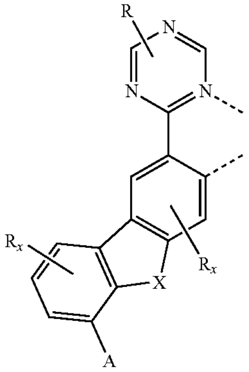
,
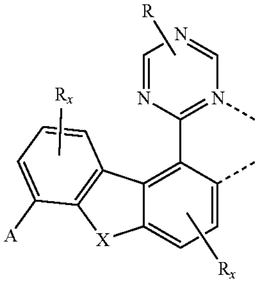
,
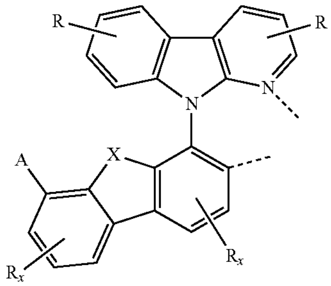
, -continued
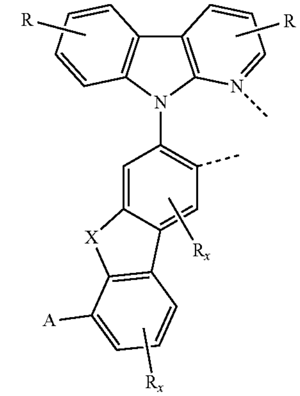
,
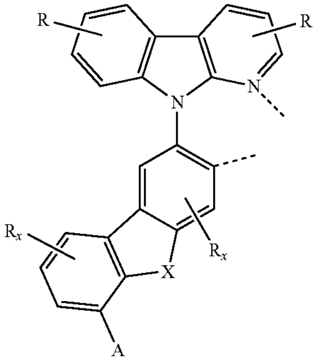
,
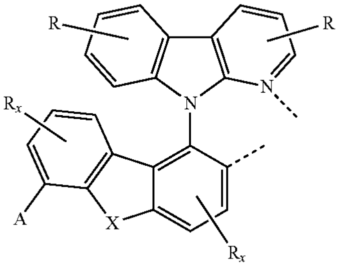
,
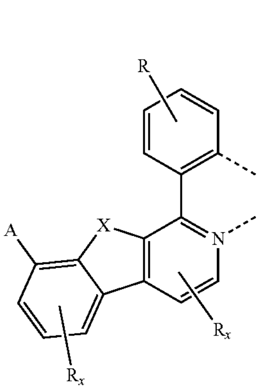
,
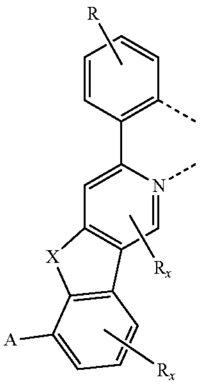
,
-continued
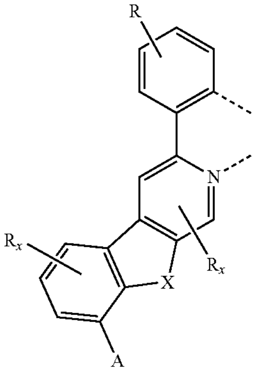
,
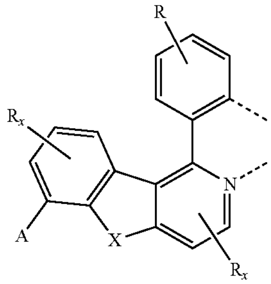
,
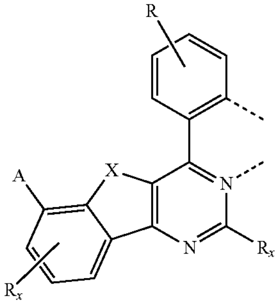
,
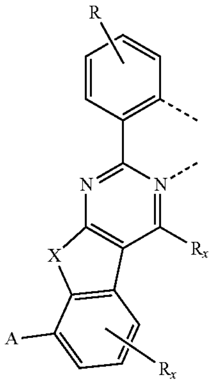
,
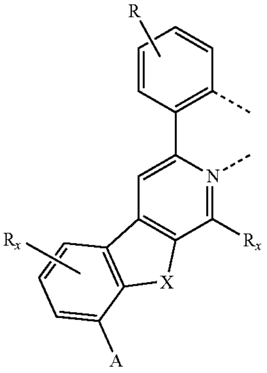
,
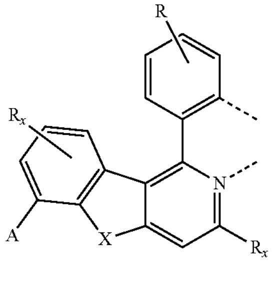
,
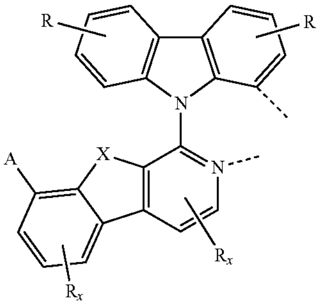
, -continued

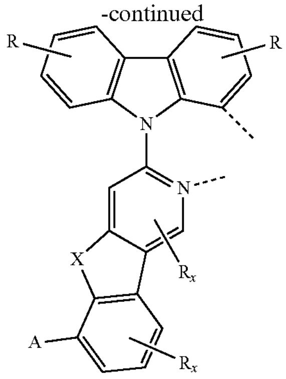

,

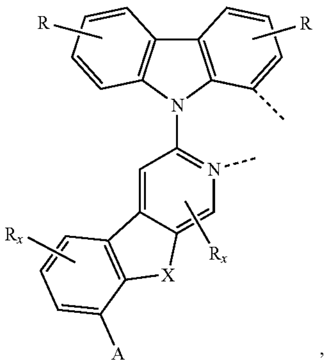

, and

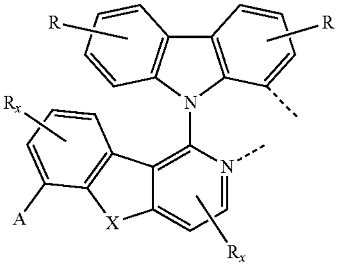

;

X is selected from the group consisting of O, S, Se, NR', CR'R', SiR'R', and GeR'R'; when two R' are present, the two R' are identical or different;

R and $R_x$ represent, at each occurrence identically or differently, mono-substitution, multiple substitutions or no substitution;

at least one of $R_x$ is fluorine or cyano;

A has a structure represented by Formula 2:

Formula 2

$$*—A_1—(A_2)_a—R_{a3};$$

wherein a is selected from 1, 2, 3, 4 or 5;

$A_1$ is, at each occurrence identically or differently, selected from the group consisting of the following groups unsubstituted or substituted by one or at least two $R_{a1}$: alkylene having 1 to 20 carbon atoms, heteroalkylene having 1 to 20 carbon atoms, cycloalkylene having 3 to 20 carbon atoms, heterocyclene having 3 to 20 ring atoms, phenylene and heteroarylene having 5 to 6 ring atoms, and combinations thereof;

$A_2$ is, at each occurrence identically or differently, selected from the group consisting of the following groups unsubstituted or substituted by one or at least two $R_{a2}$: cycloalkylene having 3 to 20 carbon atoms, heterocyclene having 3 to 20 ring atoms, and combinations thereof;

R, R', R", $R_x$, $R_{a1}$, $R_{a2}$, and $R_{a3}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof;

adjacent substituents R, R', R", $R_x$, $R_{a2}$, $R_{a3}$ can be optionally joined to form a ring;

the length of A is at least 6.7 Å;

"*" represents a position where A is attached;

when $A_1$ is selected from phenylene unsubstituted or substituted by one or at least two Ral or heteroarylene having 5 to 6 ring atoms unsubstituted or substituted by one or at least two $R_{a1}$, $A_2$ and $R_{a1}$ need to satisfy the following conditions:

1) $A_2$ that is directly attached to $A_1$ is, at each occurrence identically or differently, selected from the group consisting of: cycloalkylene having 3 to 20 carbon atoms unsubstituted or substituted by one or at least two $R_{a2}$, heterocyclene having 3 to 20 ring atoms unsubstituted or substituted by one or at least two $R_{a2}$, and combinations thereof; and 2) $R_{a1}$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof;

$L_b$ and $L_c$ are, at each occurrence identically or differently, selected from the group consisting of the following structures:

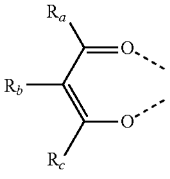
,
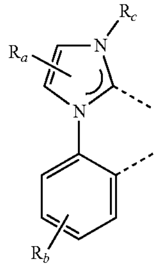
,
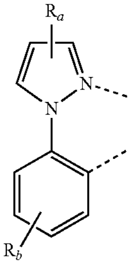
,
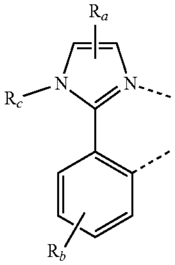
,
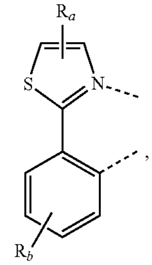
,
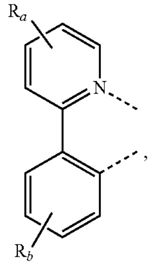
,
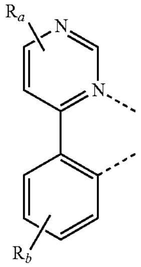
,
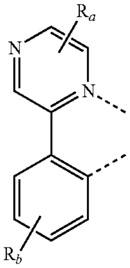
,
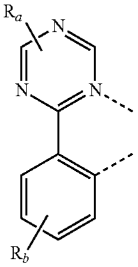
,
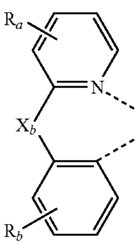
,
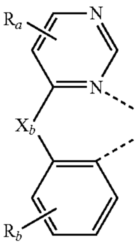
, and
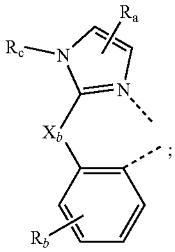
;

wherein, $R_a$ and $R_b$ represent, at each occurrence identically or differently, mono-substitution, multiple substitutions or no substitution;

$X_b$ is, at each occurrence identically or differently, selected from the group consisting of: O, S, Se, $NR_{N1}$, and $CR_{C1}R_{C2}$;

$R_a$, $R_b$, $R_c$, $R_{N1}$, $R_{C1}$, and $R_{C2}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof;

adjacent substituents $R_a$, $R_b$, $R_c$, $R_{N1}$, $R_{C1}$, and $R_{C2}$ can be optionally joined to form a ring.

6. The metal complex of claim 5, wherein $L_a$ is, at each occurrence identically or differently, selected from the group consisting of:

$L_{a12}$

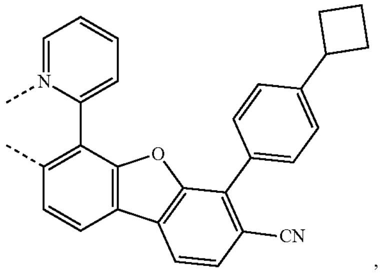
, $L_{a13}$

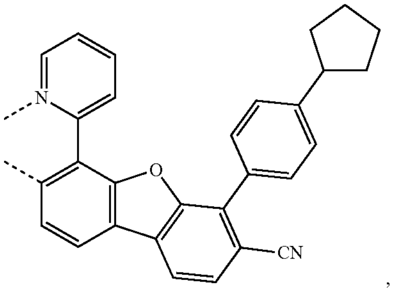
, $L_{a14}$

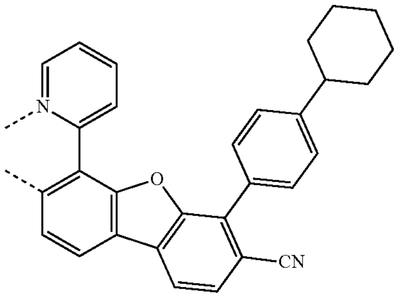
,

-continued
$L_{a15}$
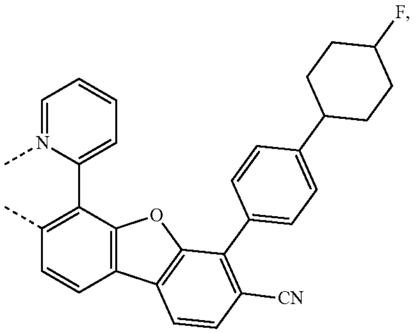
$L_{a16}$
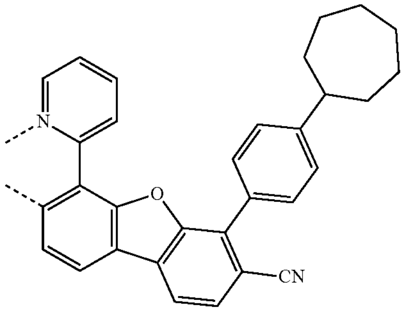
,
$L_{a17}$
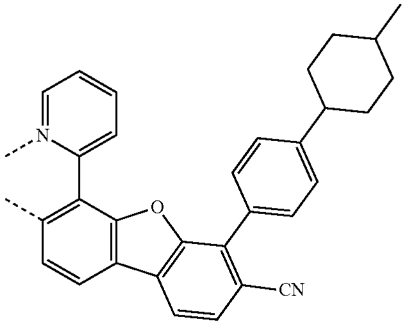
,
$L_{a18}$
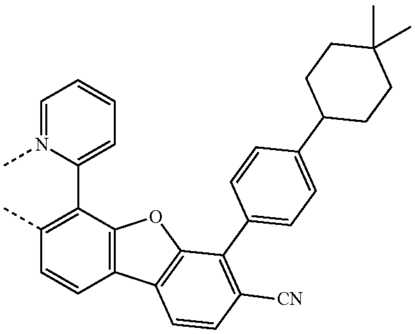
,
-continued
$L_{a19}$
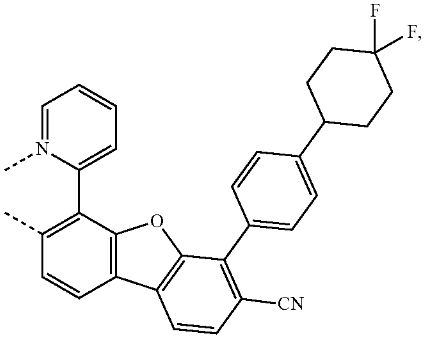
$L_{a20}$
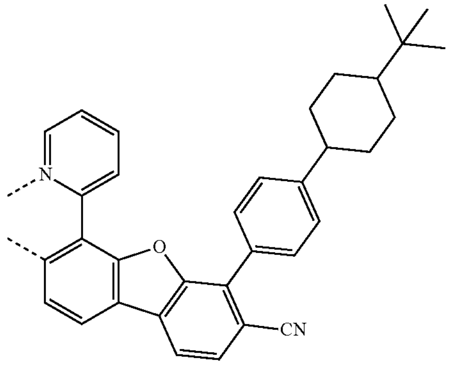
,
$L_{a21}$
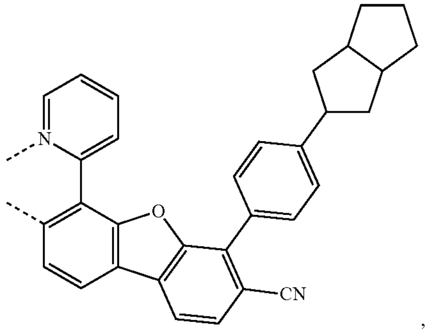
,
$L_{a22}$
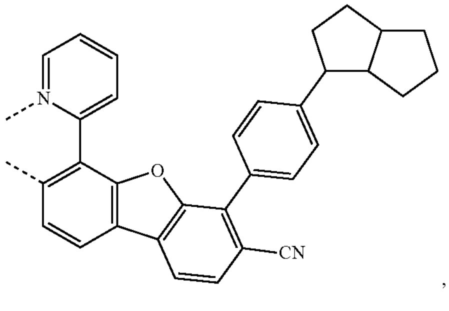
, -continued
$L_{a23}$
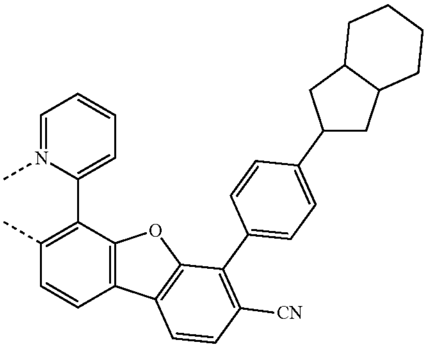
,
$L_{a24}$
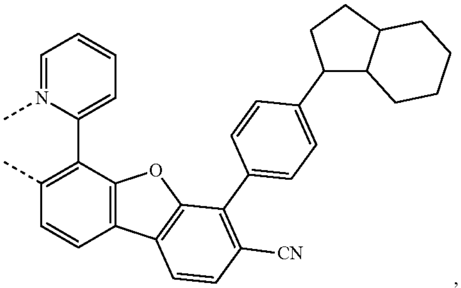
,
$L_{a25}$
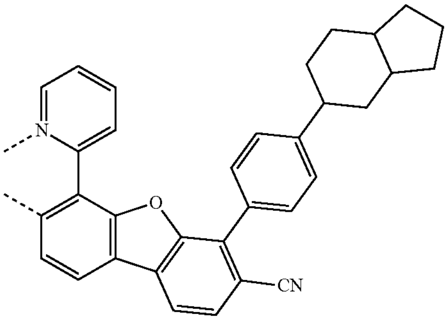
,
$L_{a26}$
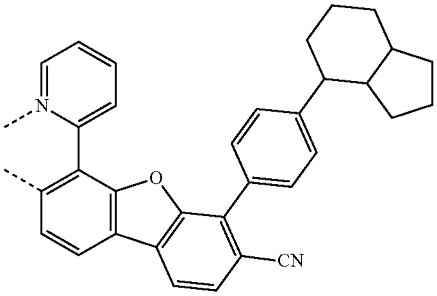
,
$L_{a27}$
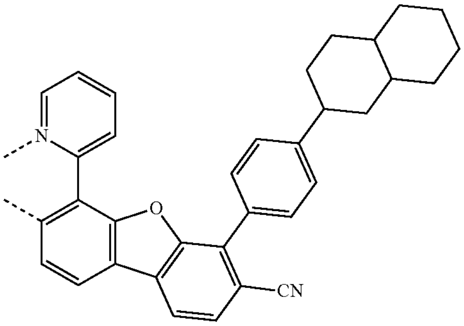
,
-continued
$L_{a28}$
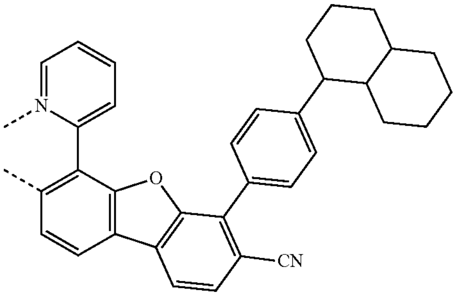
,
$L_{a29}$
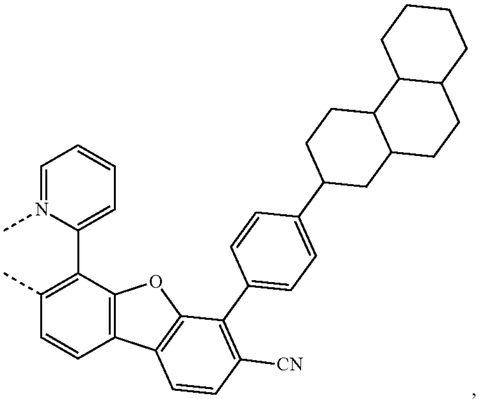
,
$L_{a30}$
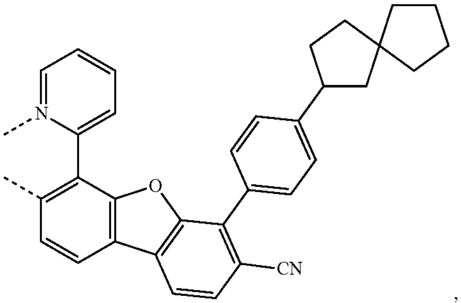
,
$L_{a31}$
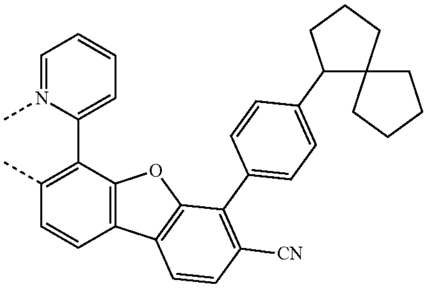
, -continued
$L_{a32}$
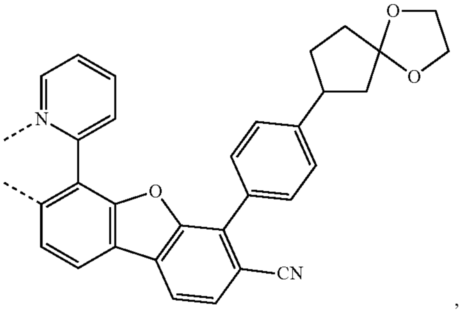
,
$L_{a33}$
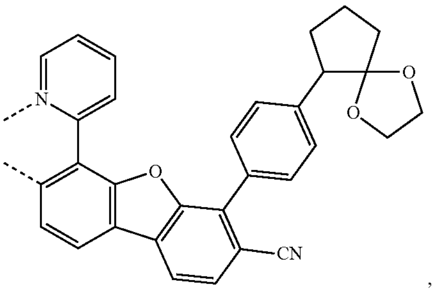
,
$L_{a34}$
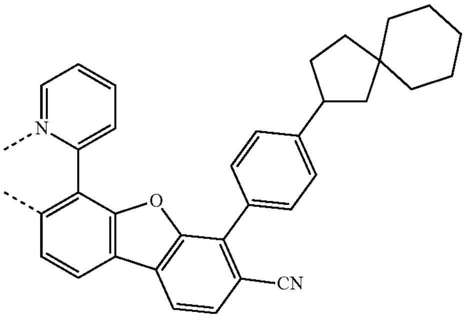
,
$L_{a35}$
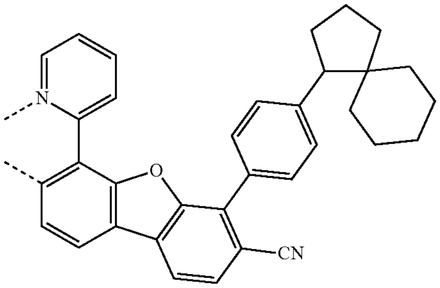
,
$L_{a36}$
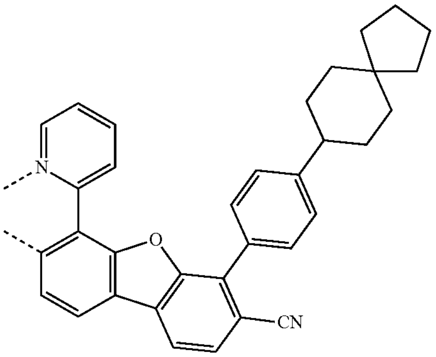
,
-continued
$L_{a37}$
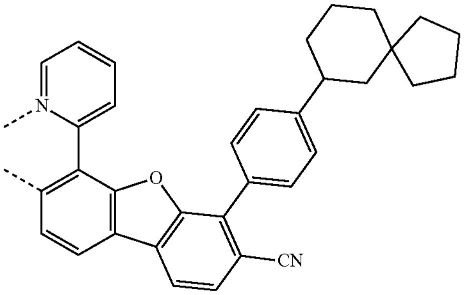
,
$L_{a38}$
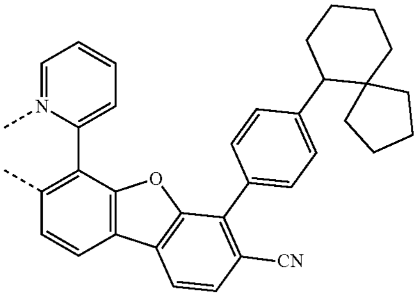
,
$L_{a39}$
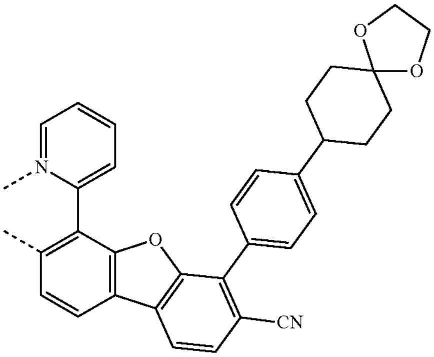
,
$L_{a40}$
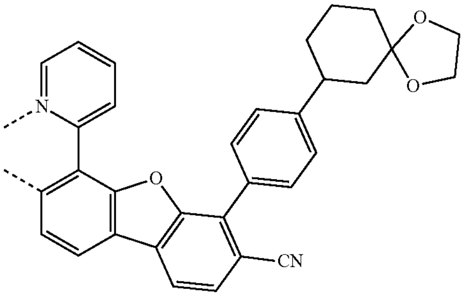
,
$L_{a41}$
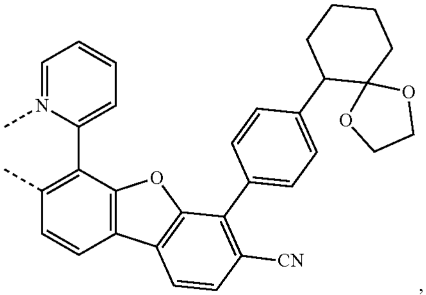
, -continued
La42
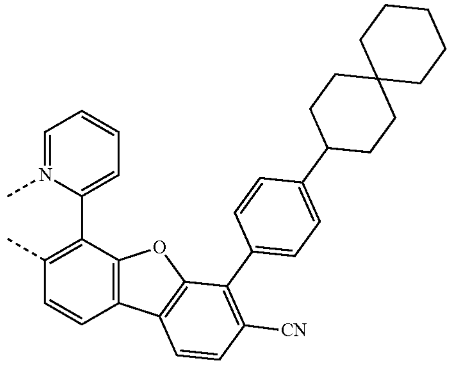
,
La43
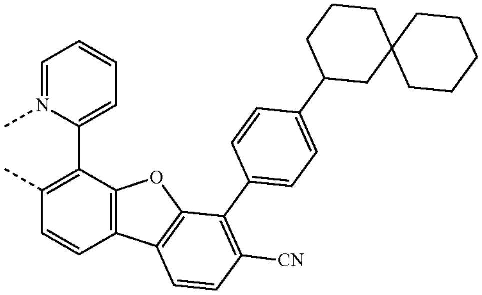
,
La44
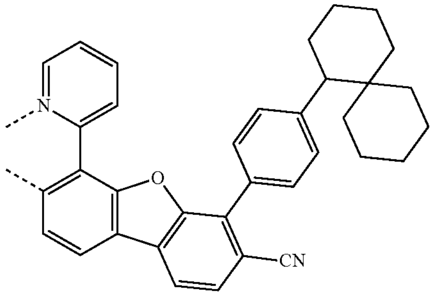
,
La45
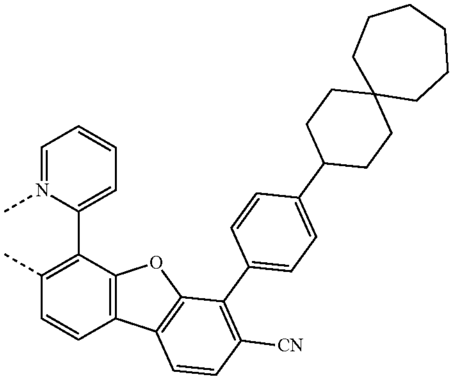
,
-continued
La46
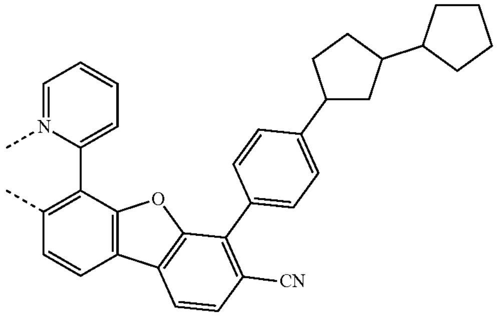
,
La47
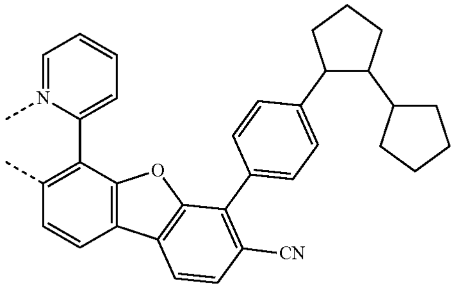
,
La48
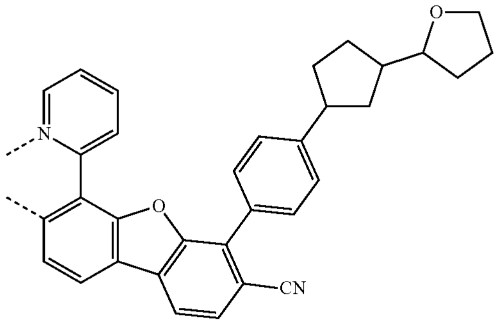
,
La49
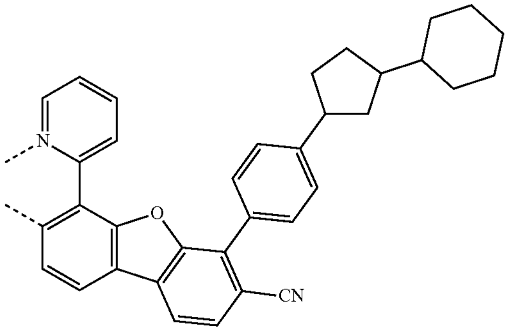
,
La50
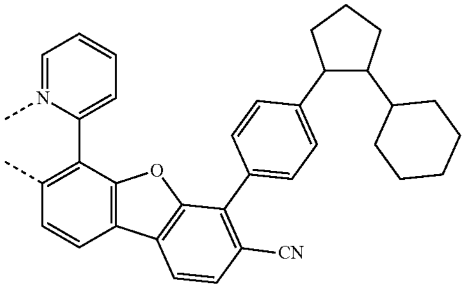
, -continued
$L_{a51}$
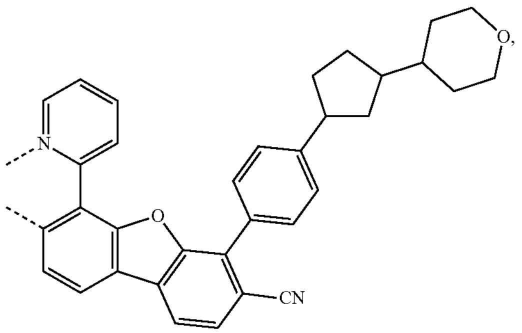
$L_{a52}$
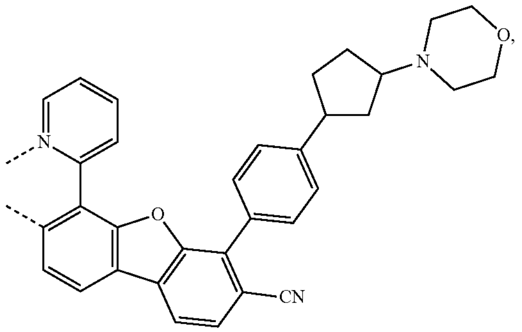
$L_{a53}$
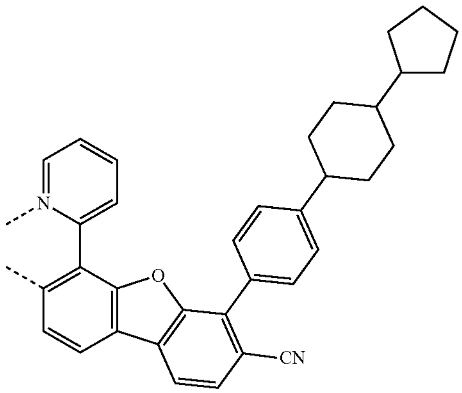
,
$L_{a54}$
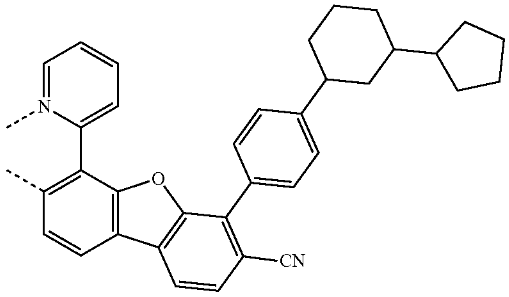
,
-continued
$L_{a55}$
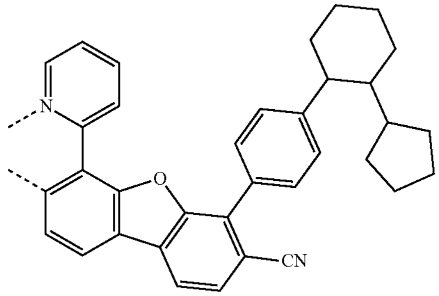
,
$L_{a56}$
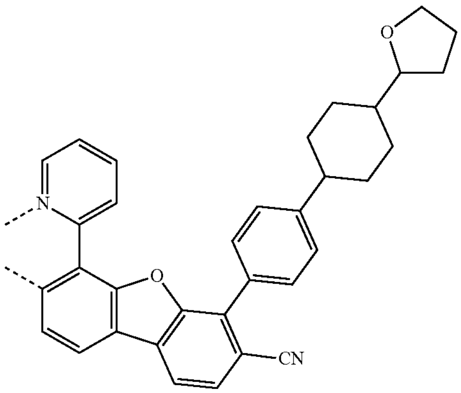
,
$L_{a57}$
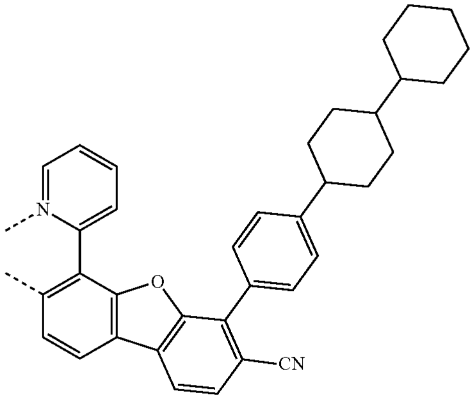
,
$L_{a58}$
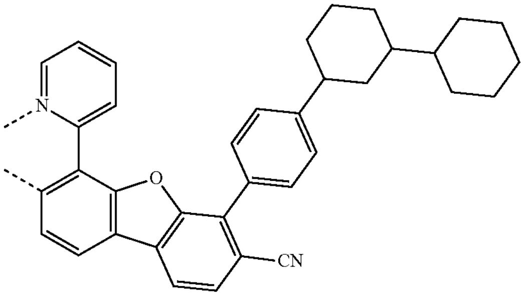
, -continued
L$_{a59}$
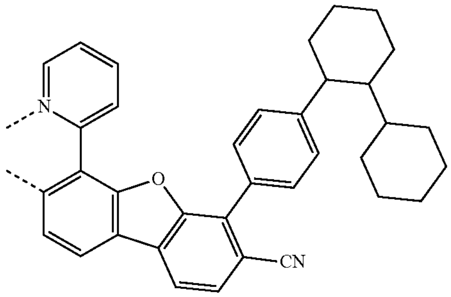
,
L$_{a60}$
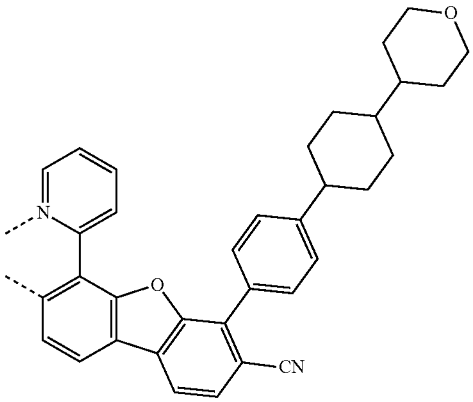
,
L$_{a61}$
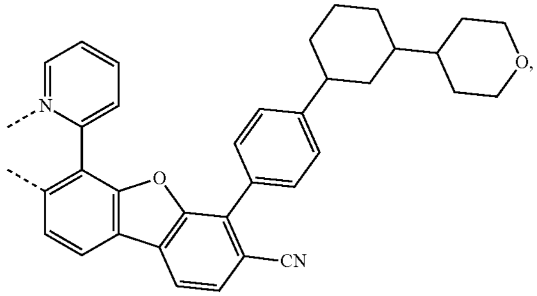
L$_{a62}$
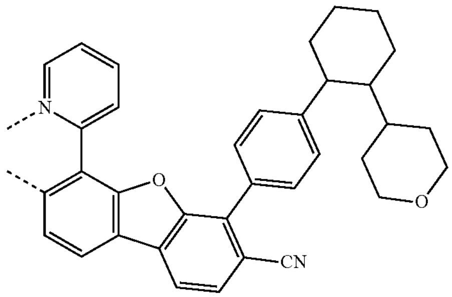
,
-continued
L$_{a63}$
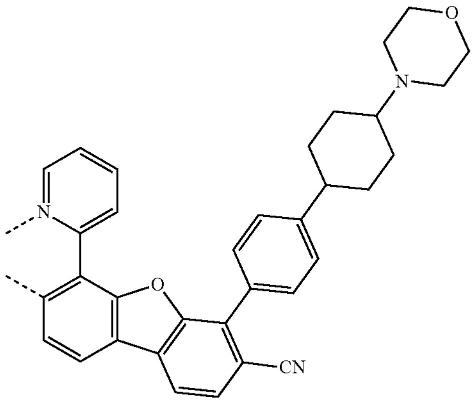
,
L$_{a64}$
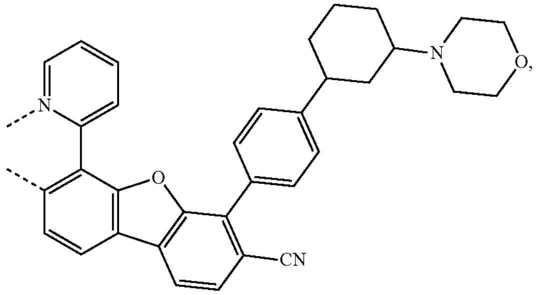
L$_{a65}$
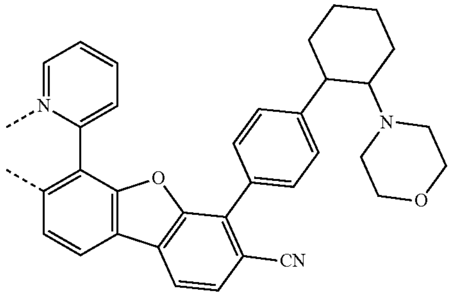
,
L$_{a66}$
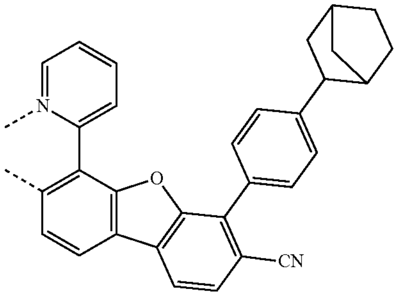
, $L_{a67}$
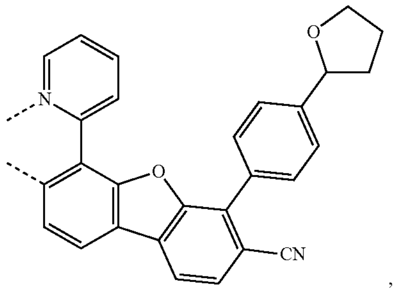
,
$L_{a68}$
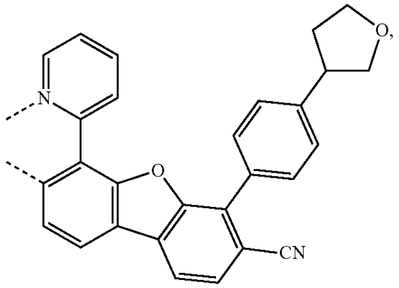
$L_{a69}$
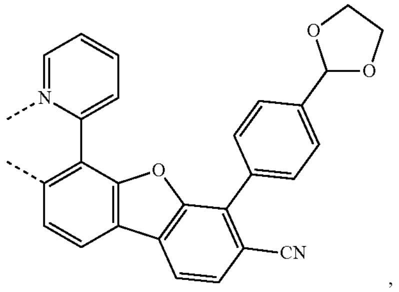
,
$L_{a70}$
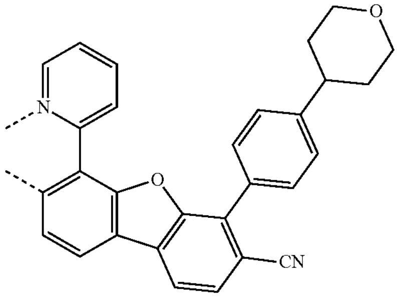
,
$L_{a71}$
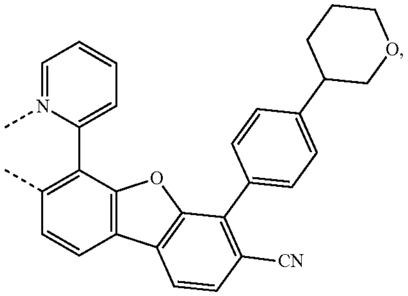
$L_{a72}$
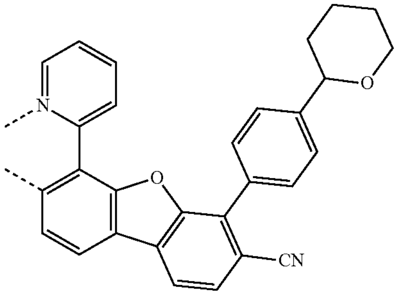
,
$L_{a73}$
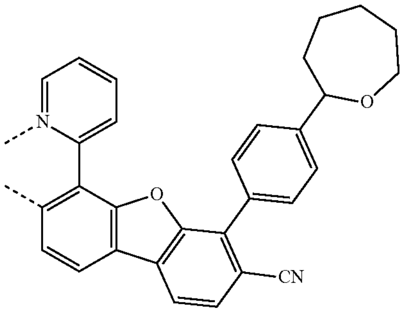
,
$L_{a74}$
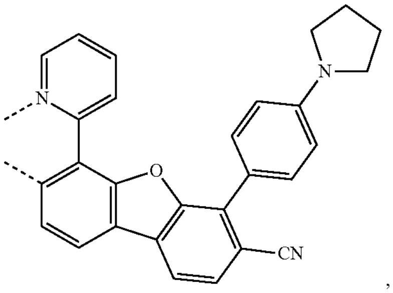
,
$L_{a75}$
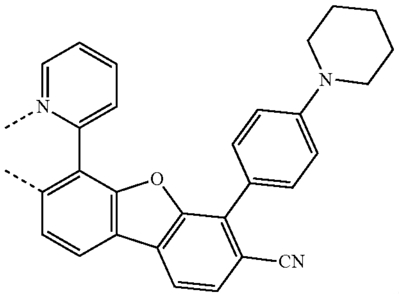
,
$L_{a76}$
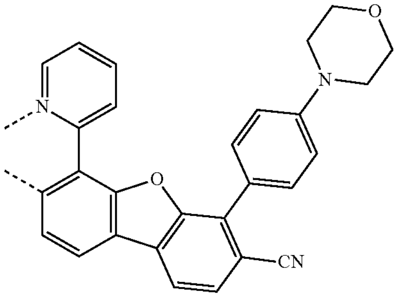
, $L_{a77}$
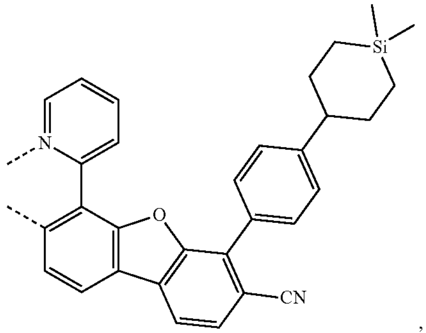
,
$L_{a91}$
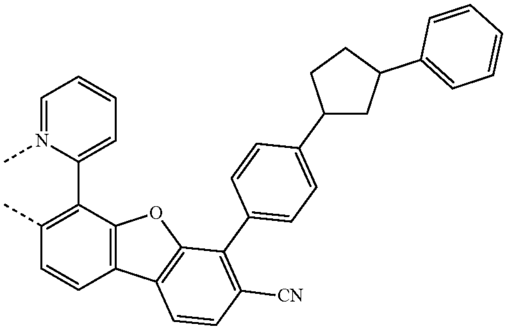
,
$L_{a92}$
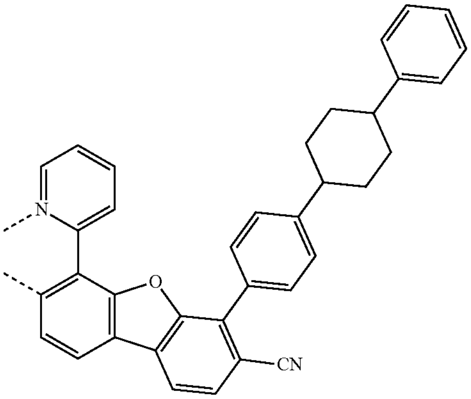
,
$L_{a93}$
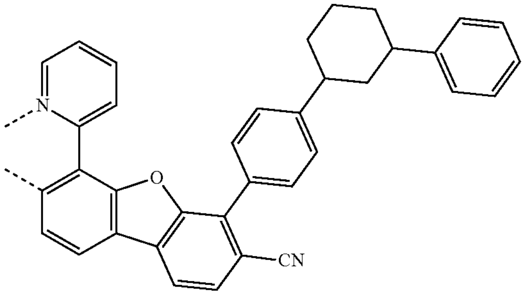
,
$L_{a94}$
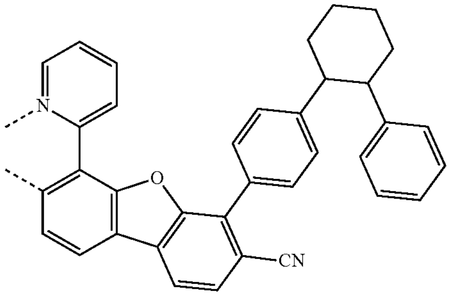
,
$L_{a98}$
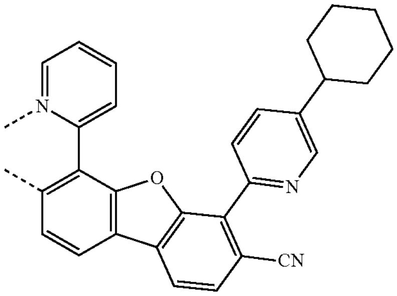
,
$L_{a99}$
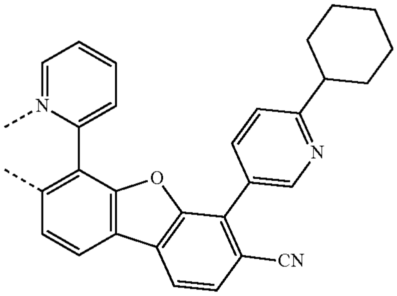
,
$L_{a100}$
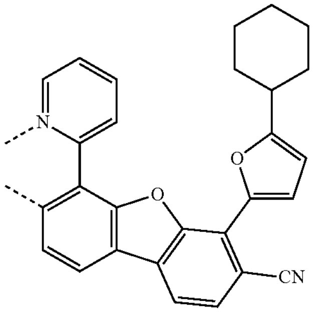
,
$L_{a101}$
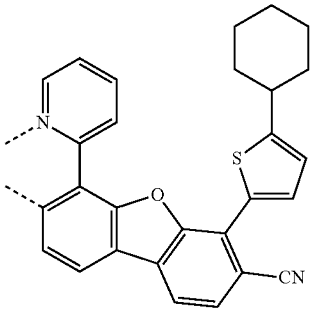
, -continued
$L_{a102}$
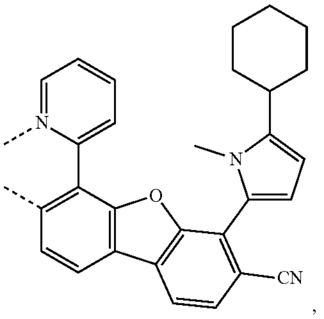
,
$L_{a103}$
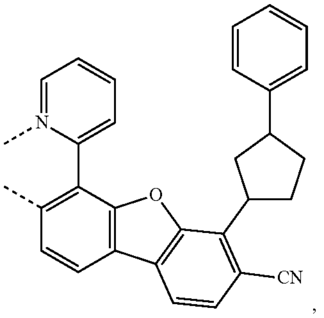
,
$L_{a104}$
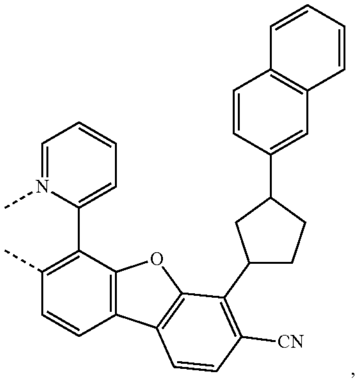
,
$L_{a111}$
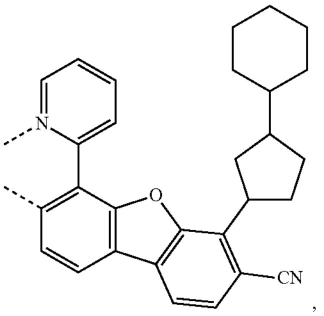
,
-continued
$L_{a112}$
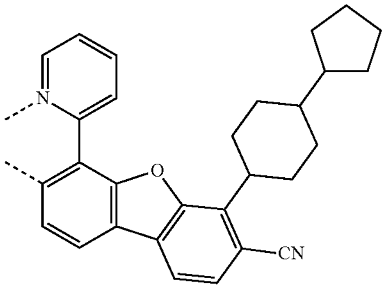
,
$L_{a113}$
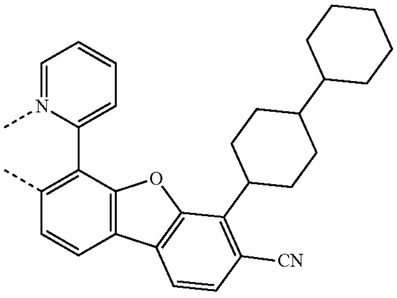
,
$L_{a114}$
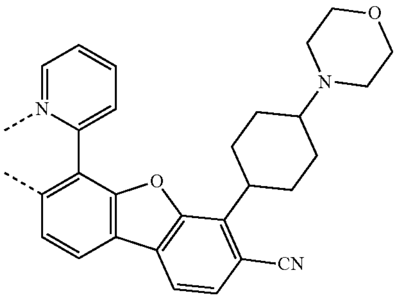
,
$L_{a142}$
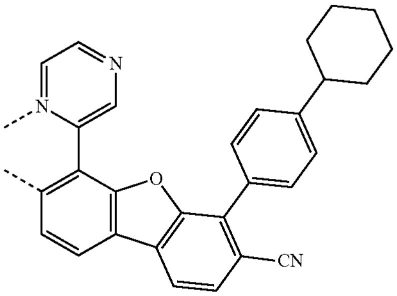
,
$L_{a143}$
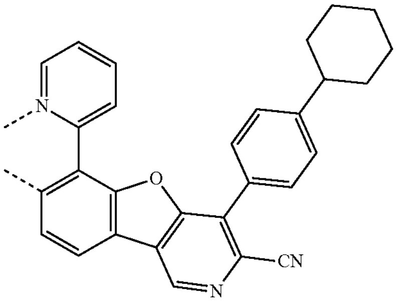
, -continued
$L_{a144}$
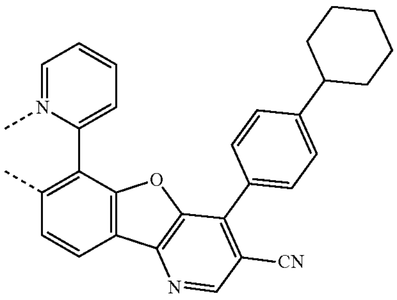
,
$L_{a145}$
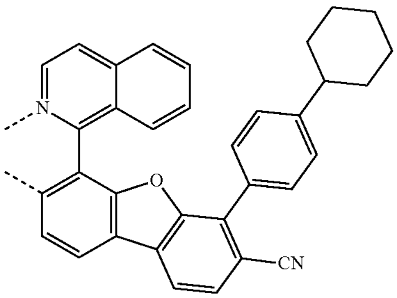
,
$L_{a146}$
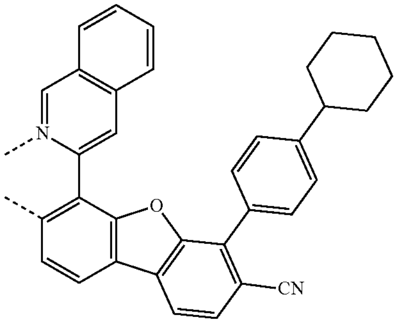
,
$L_{a147}$
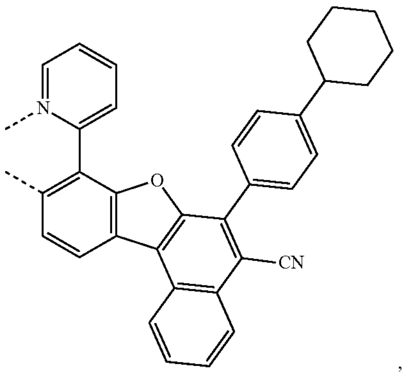
,
-continued
$L_{a148}$
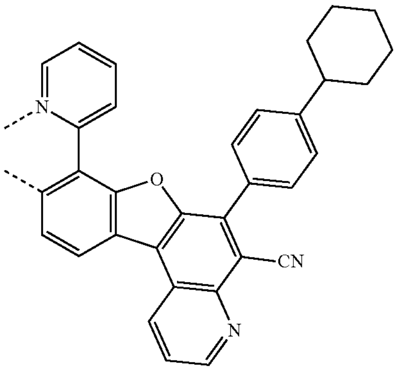
,
$L_{a149}$
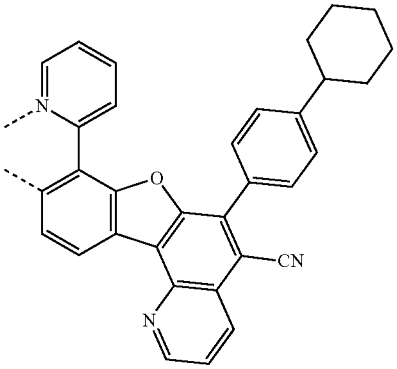
,
$L_{a150}$
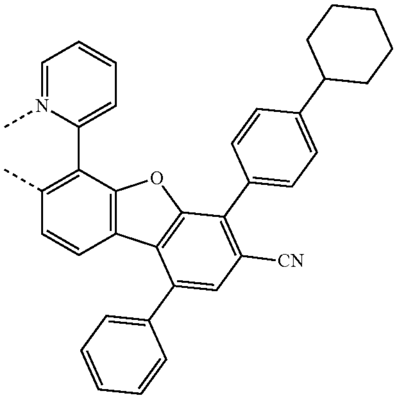
,
$L_{a153}$
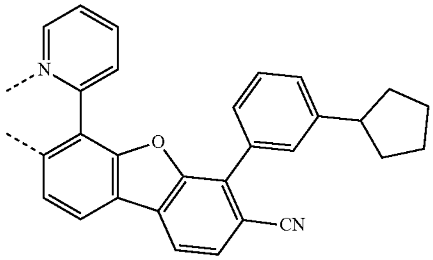
, -continued
$L_{a154}$
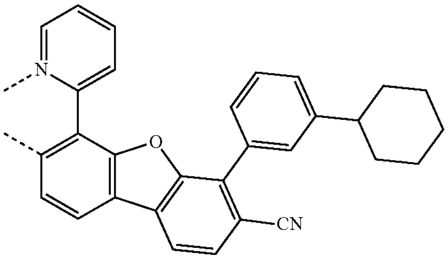
,
$L_{a155}$
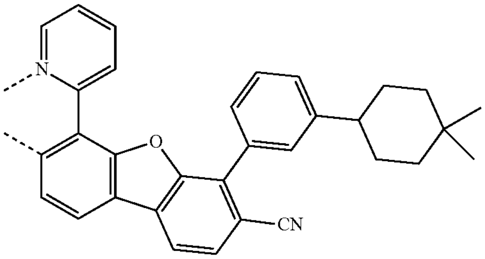
,
$L_{a156}$
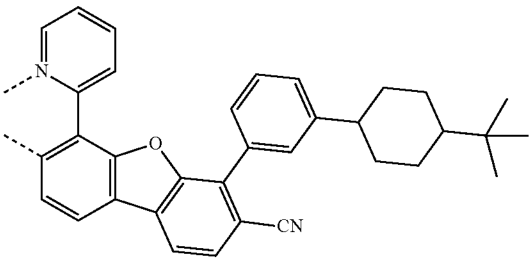
,
$L_{a157}$
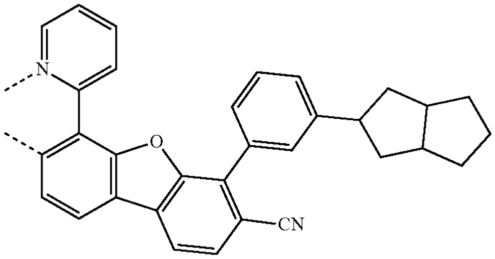
,
$L_{a158}$
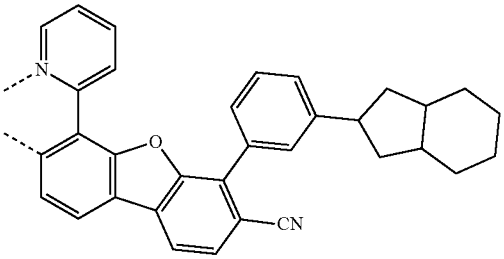
,
-continued
$L_{a159}$
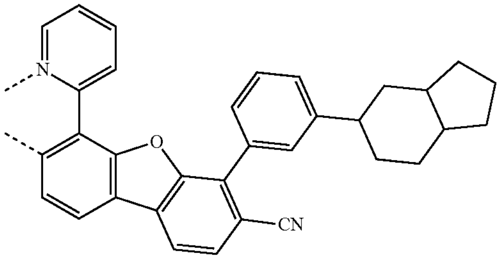
,
$L_{a160}$
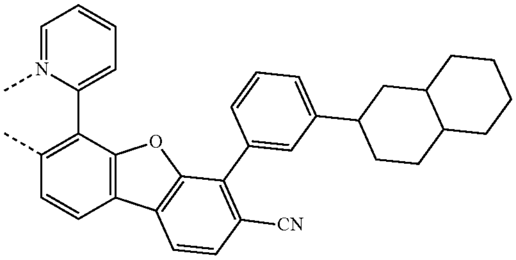
,
$L_{a161}$
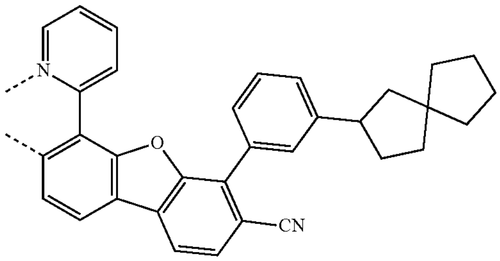
,
$L_{a162}$
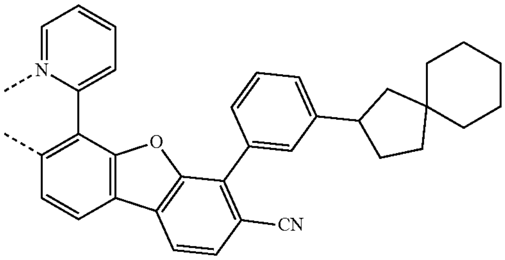
,
$L_{a163}$
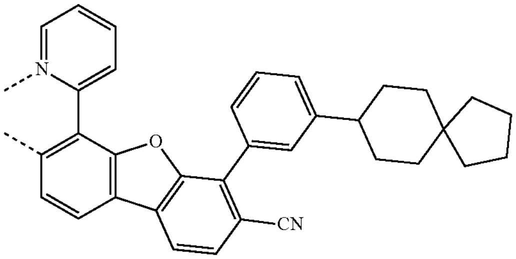
, -continued
$L_{a164}$
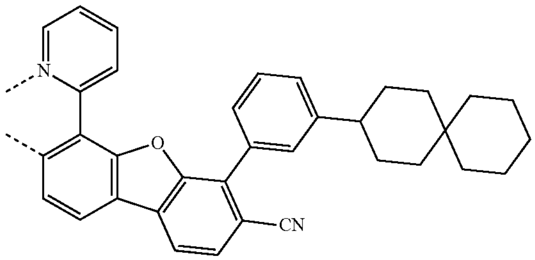
,
$L_{a165}$
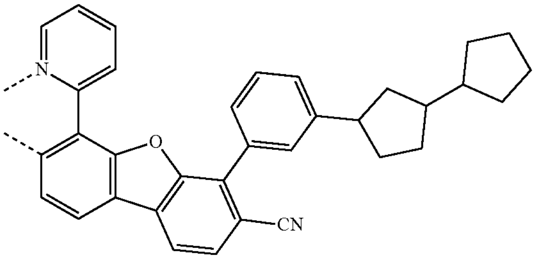
,
$L_{a166}$
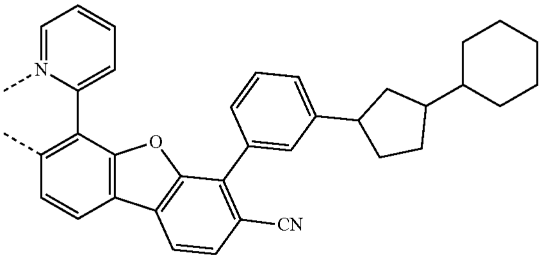
,
$L_{a167}$
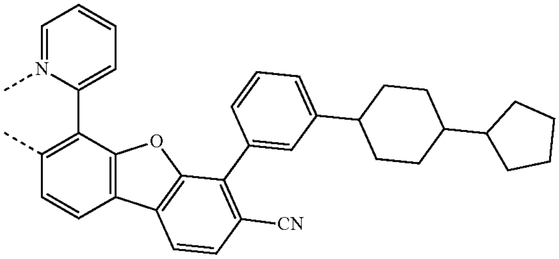
,
$L_{a168}$
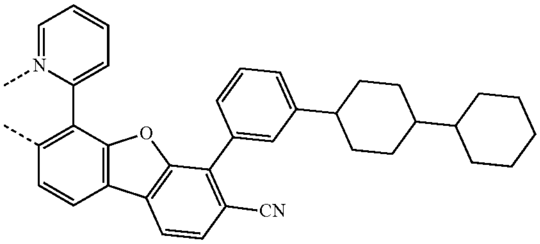
,
-continued
$L_{a169}$
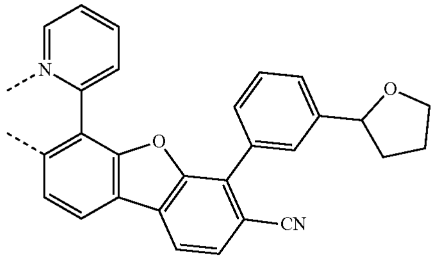
,
$L_{a170}$
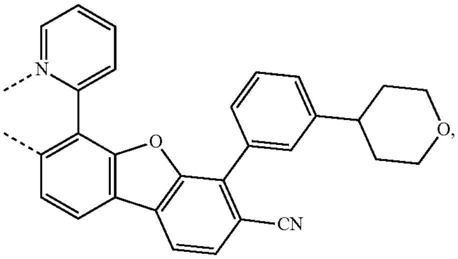
,
$L_{a171}$
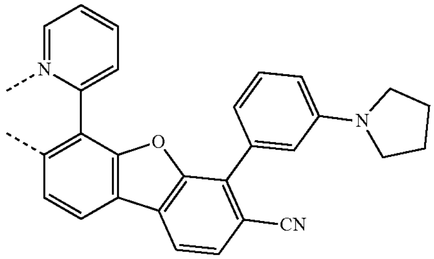
,
$L_{a172}$
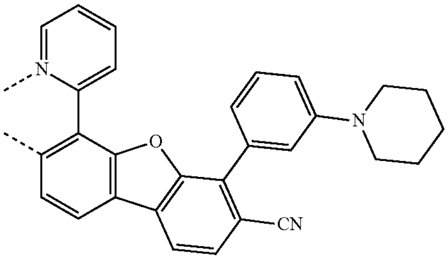
,
$L_{a173}$
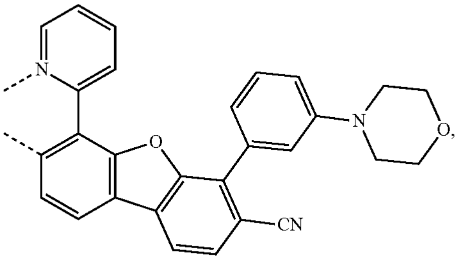
, -continued
$L_{a177}$
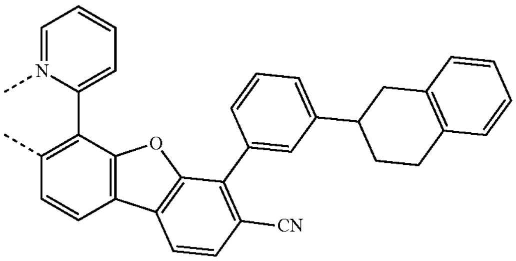
,
$L_{a178}$
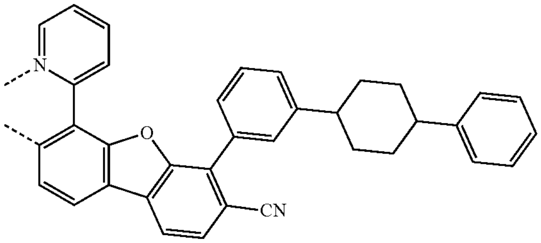
,
$L_{a179}$
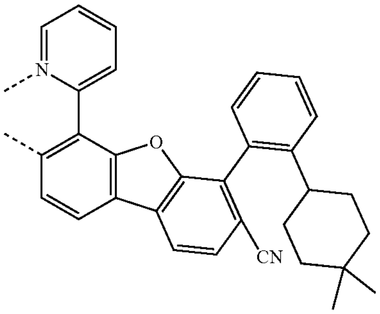
,
$L_{a180}$
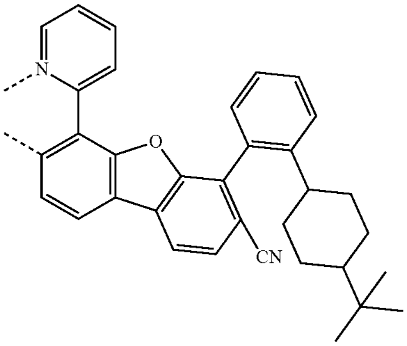
,
$L_{a181}$
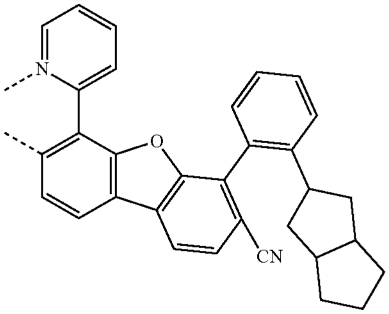
,
-continued
$L_{a182}$
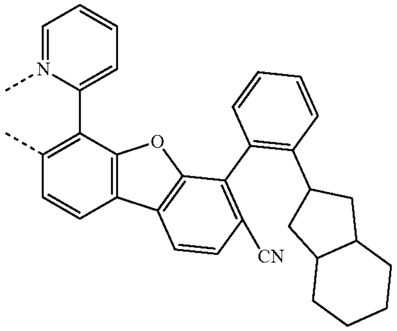
,
$L_{a183}$
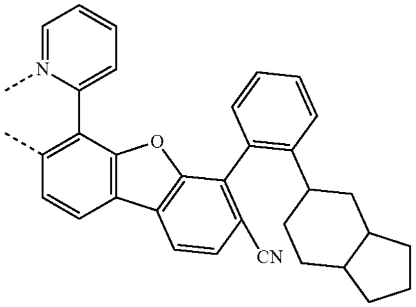
,
$L_{a184}$
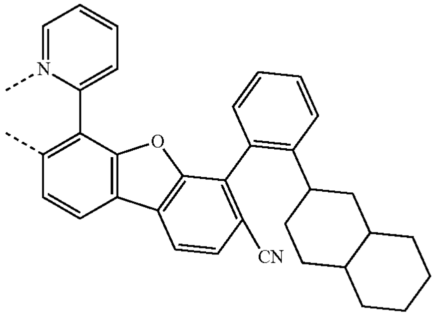
,
$L_{a185}$
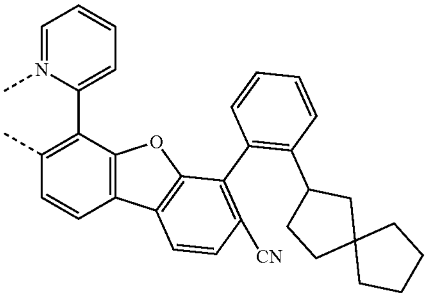
,
$L_{a186}$
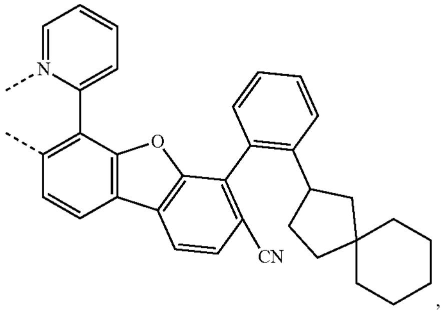
, -continued
$L_{a187}$
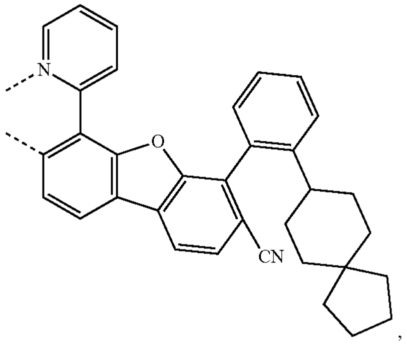
$L_{a188}$
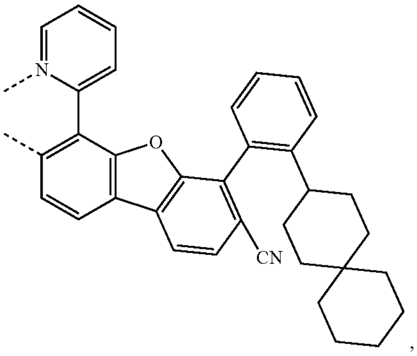
$L_{a189}$
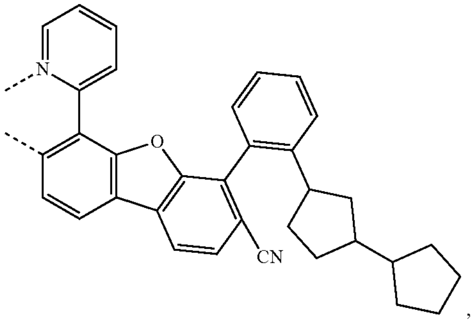
$L_{a190}$
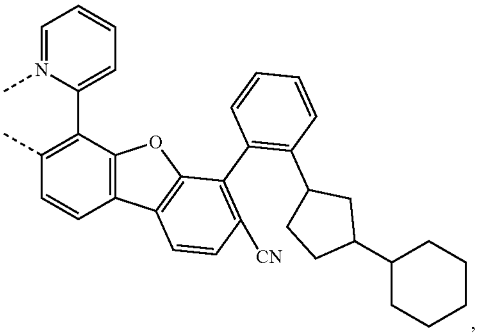
-continued
$L_{a191}$
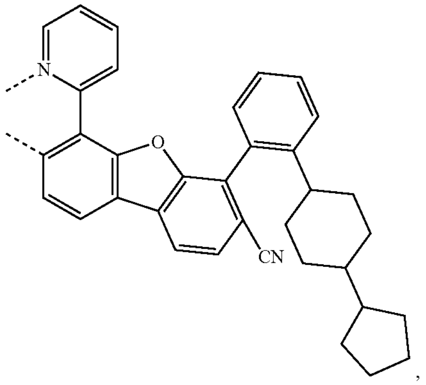
$L_{a192}$
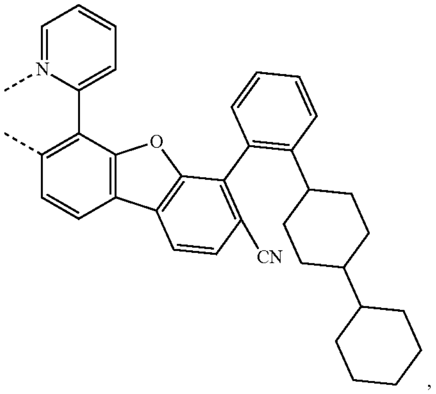
$L_{a195}$
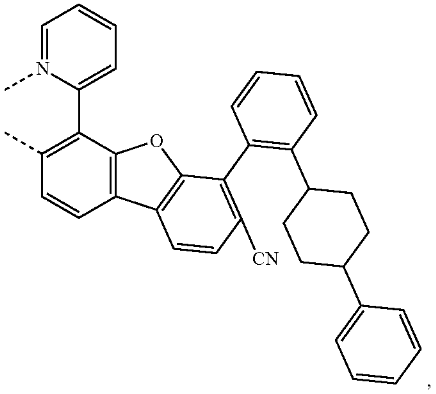
$L_{a196}$
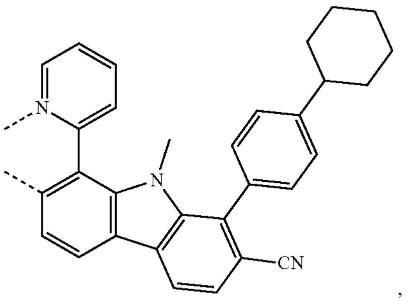

-continued
$L_{a197}$
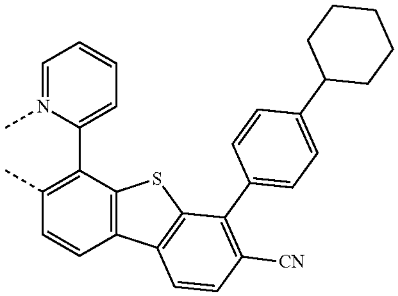
,
$L_{a198}$
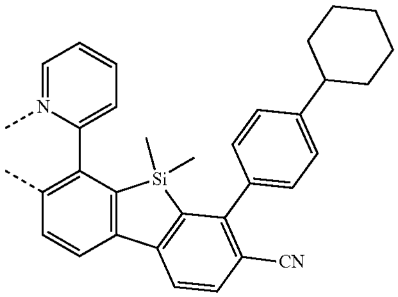
,
$L_{a199}$
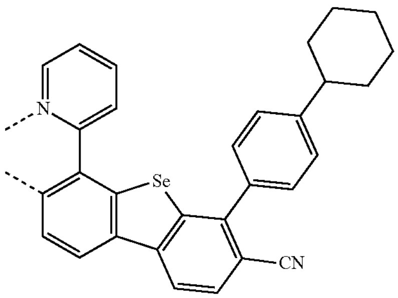
,
$L_{a200}$
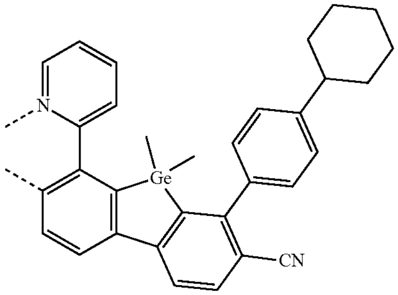
,
$L_{a229}$
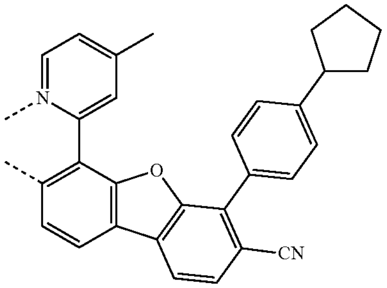
,
-continued
$L_{a230}$
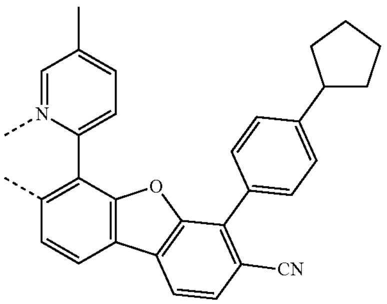
,
$L_{a231}$
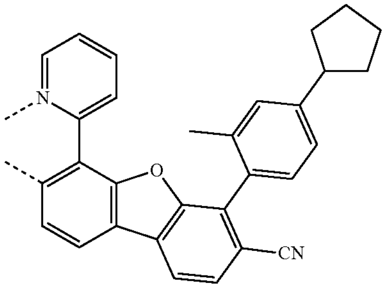
,
$L_{a232}$
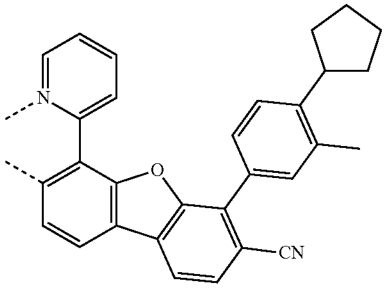
,
$L_{a233}$
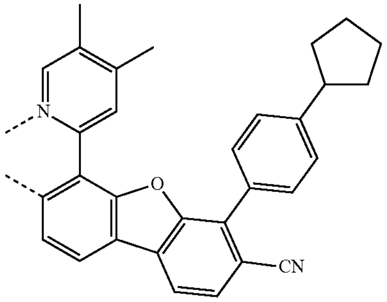
,
$L_{a234}$
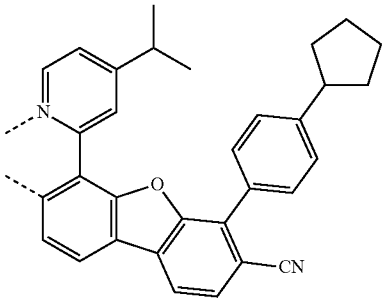
, -continued
$L_{a235}$
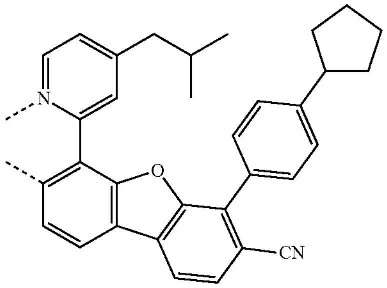
,
$L_{a236}$
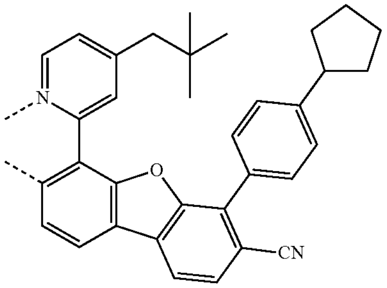
,
$L_{a237}$
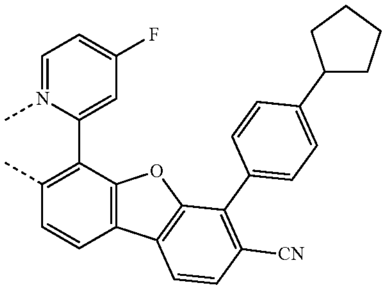
,
$L_{a238}$
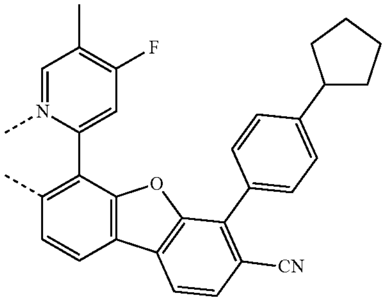
,
$L_{a239}$
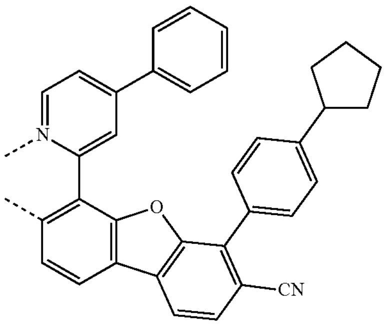
,
-continued
$L_{a240}$
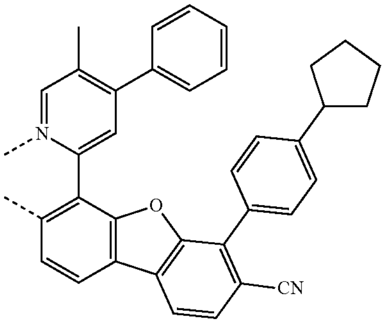
,
$L_{a241}$
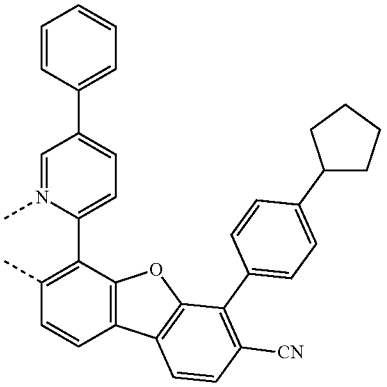
,
$L_{a242}$
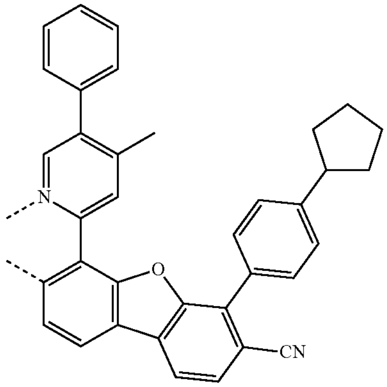
,
$L_{a243}$
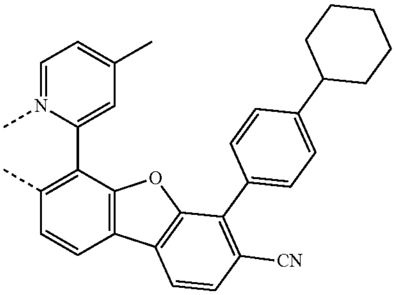
, -continued
L$_{a244}$
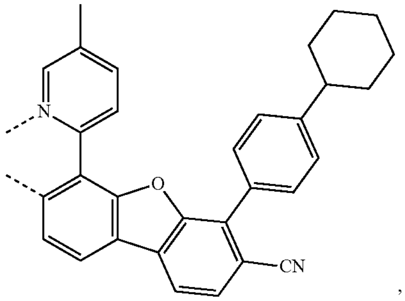
,
L$_{a245}$
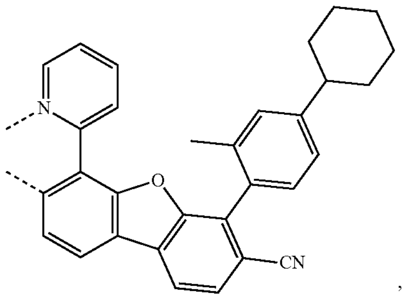
,
L$_{a246}$
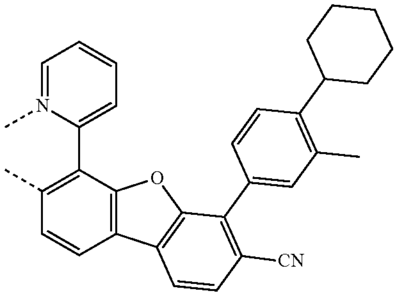
,
L$_{a247}$
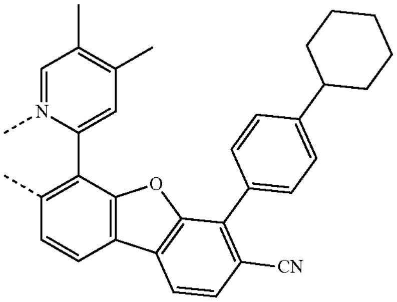
,
L$_{a248}$
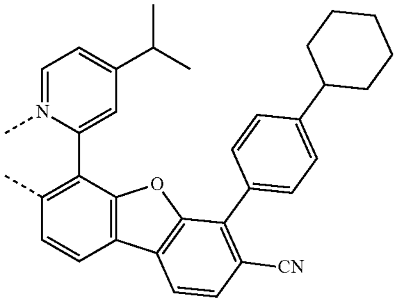
,
-continued
L$_{a249}$
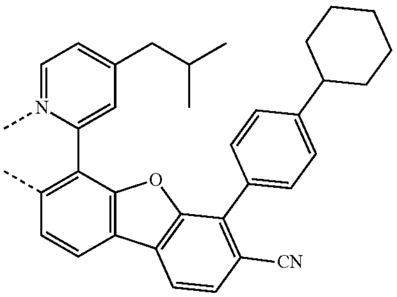
,
L$_{a250}$
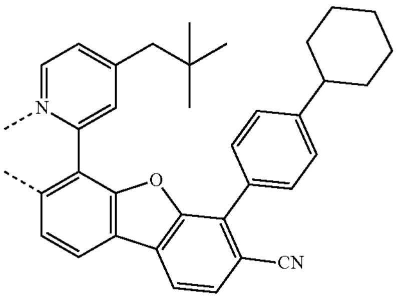
,
L$_{a251}$
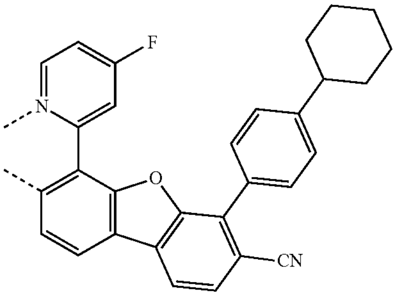
,
L$_{a252}$
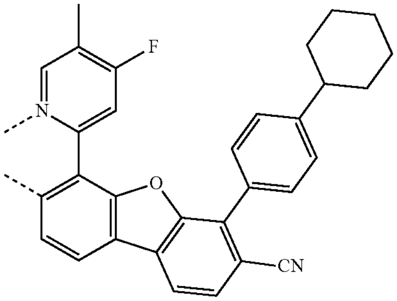
,
L$_{a253}$
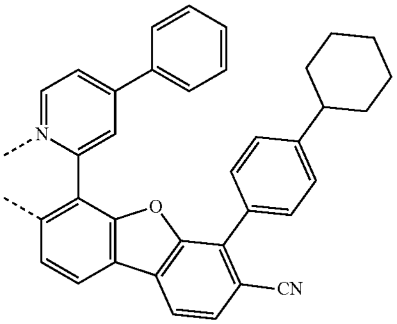
, -continued
$L_{a254}$
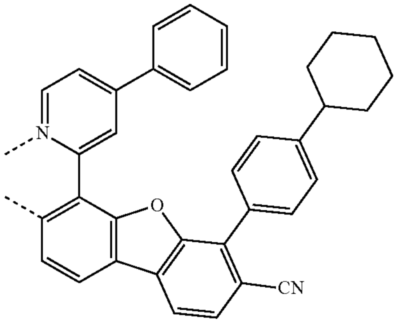
,
$L_{a255}$
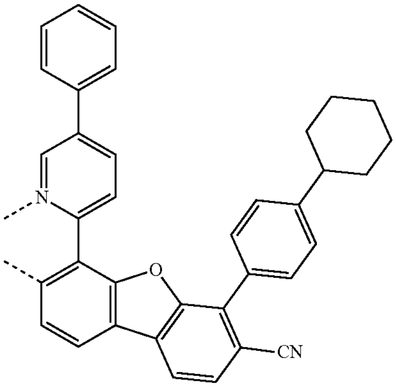
,
$L_{a256}$
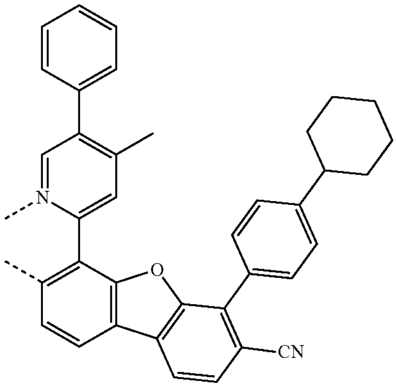
,
$L_{a257}$
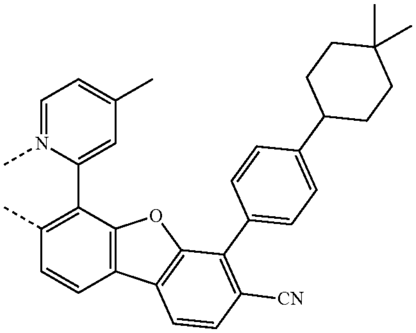
,
-continued
$L_{a258}$
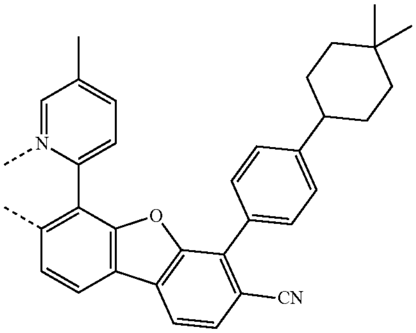
,
$L_{a259}$
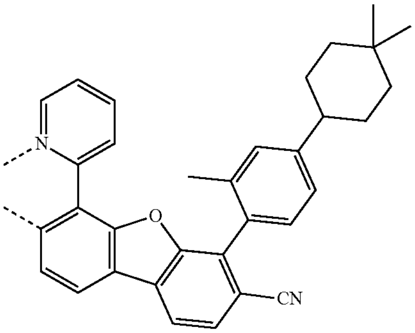
,
$L_{a260}$
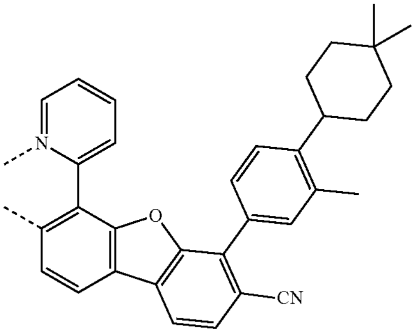
,
$L_{a261}$
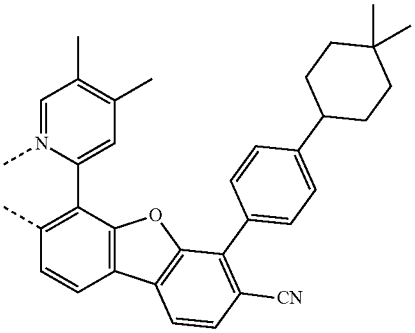
, -continued
$L_{a262}$
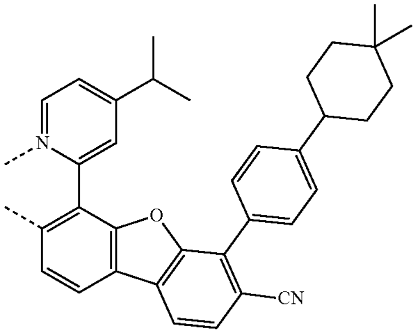
,
$L_{a263}$
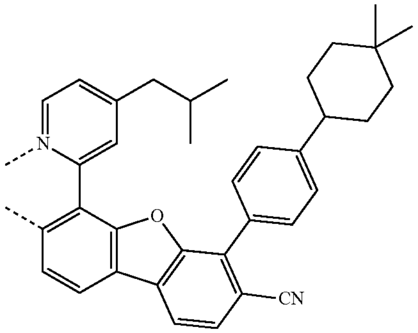
,
$L_{a264}$
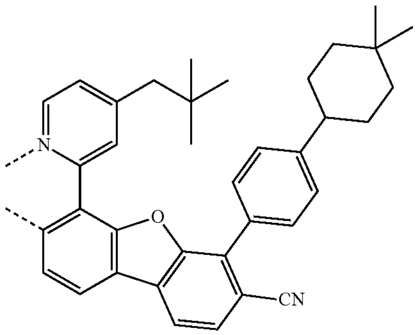
,
$L_{a265}$
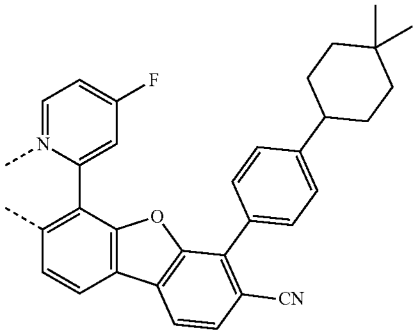
,
-continued
$L_{a266}$
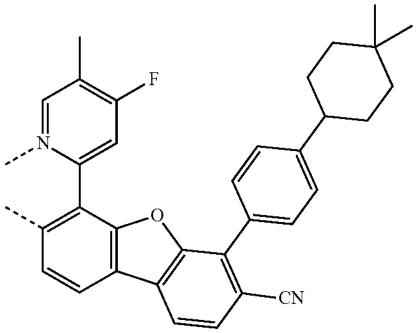
,
$L_{a267}$
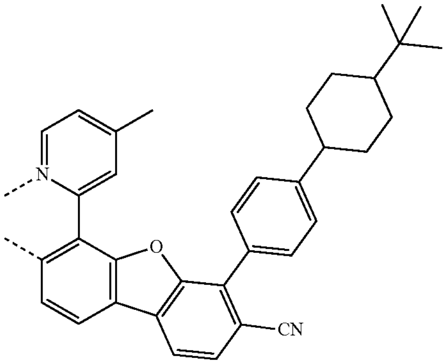
,
$L_{a268}$
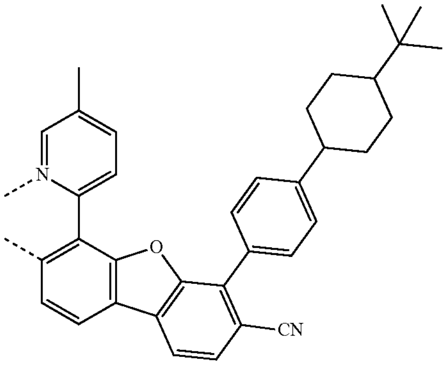
,
$L_{a269}$
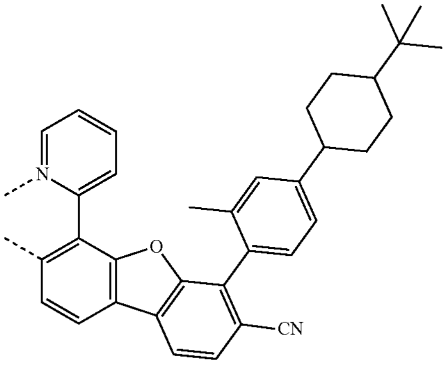
, -continued
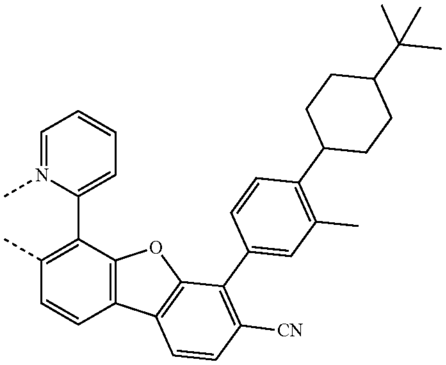
$L_{a270}$
,
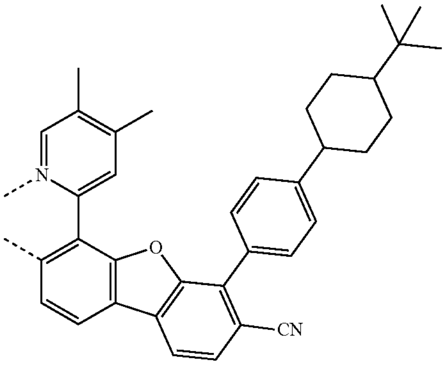
$L_{a271}$
,
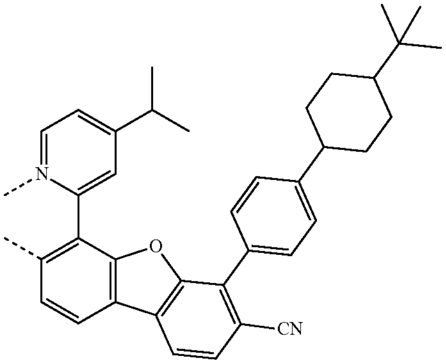
$L_{a272}$
,
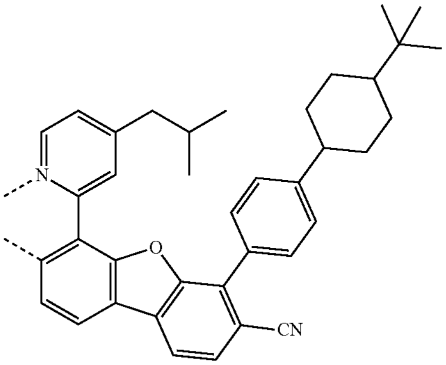
$L_{a273}$
,
-continued
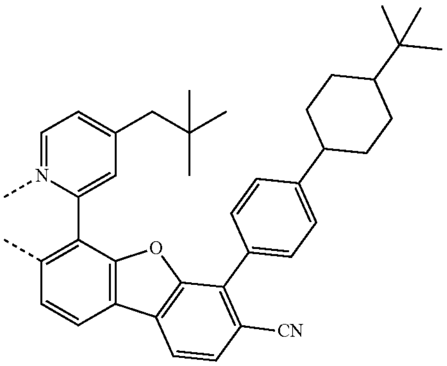
$L_{a274}$
,
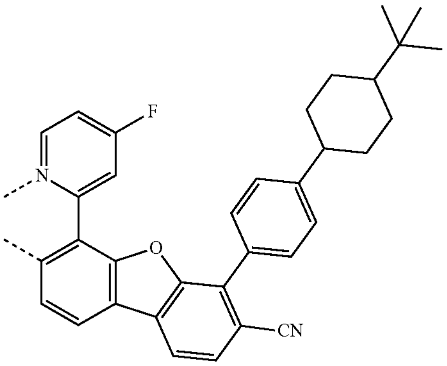
$L_{a275}$
,
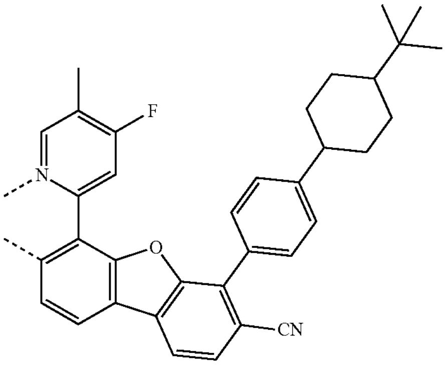
$L_{a276}$
,
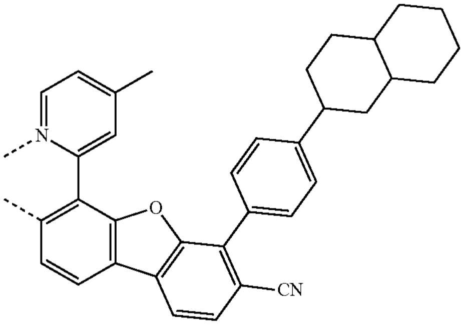
$L_{a277}$
, $L_{a278}$
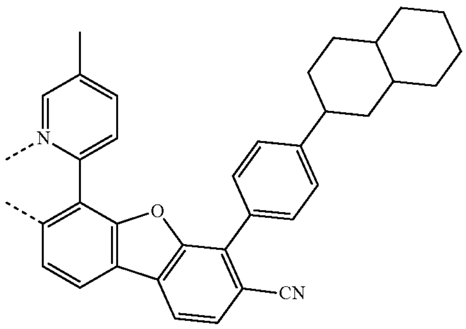
,
$L_{a279}$
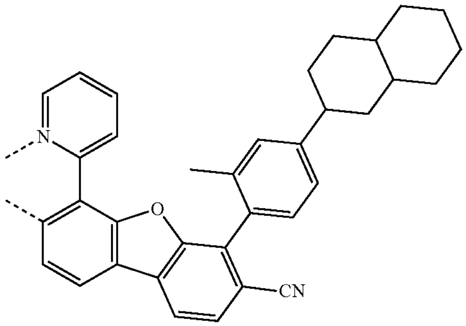
,
$L_{a280}$
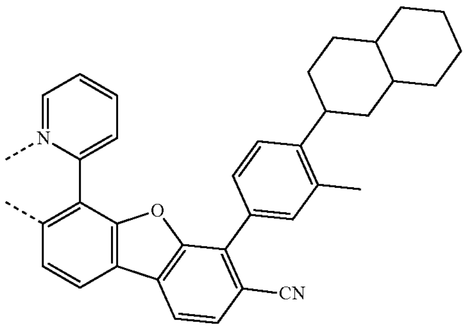
,
$L_{a281}$
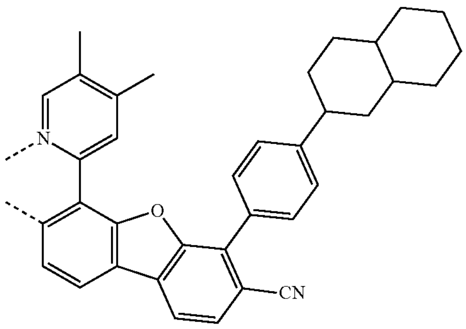
,
$L_{a282}$
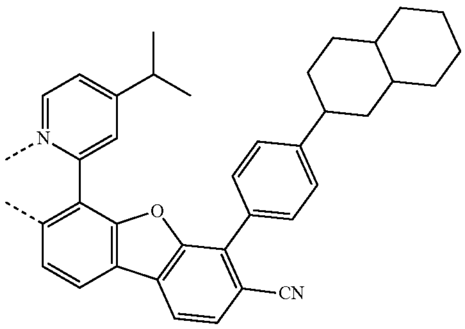
,
$L_{a283}$
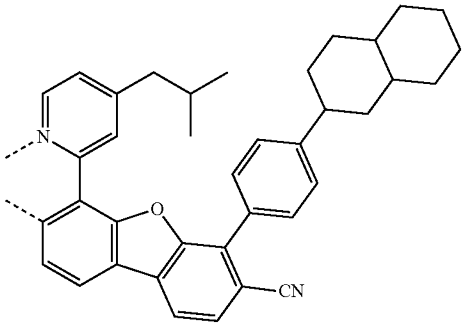
,
$L_{a284}$
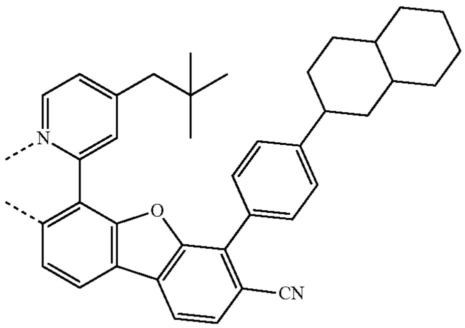
,
$L_{a285}$
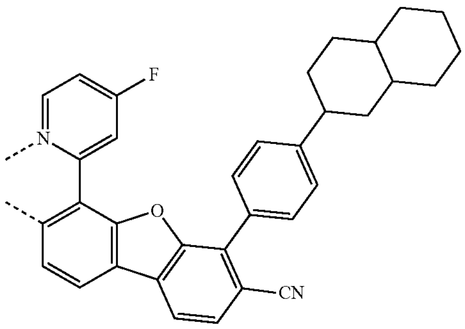
, -continued
$L_{a286}$
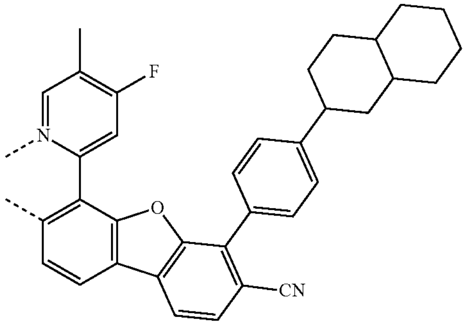
,
$L_{a287}$
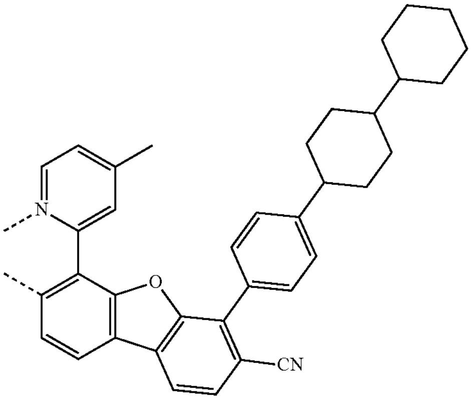
,
$L_{a288}$
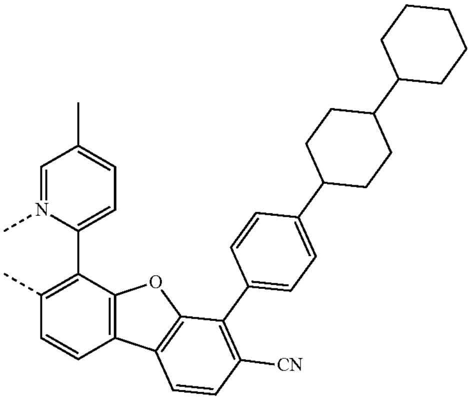
,
$L_{a289}$
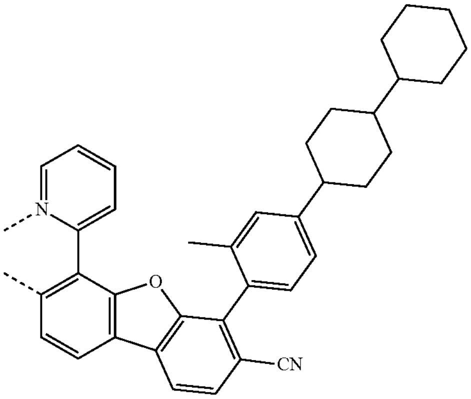
,
-continued
$L_{a290}$
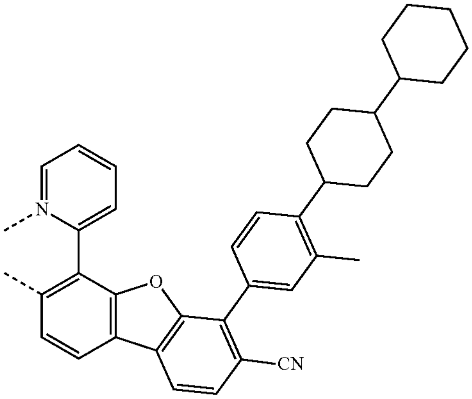
,
$L_{a291}$
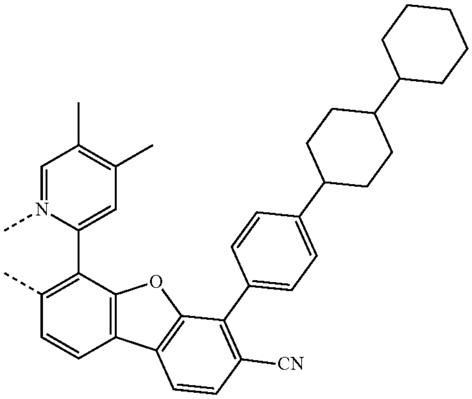
,
$L_{a292}$
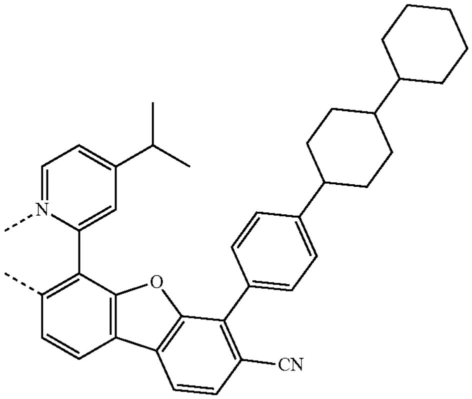
,
$L_{a293}$
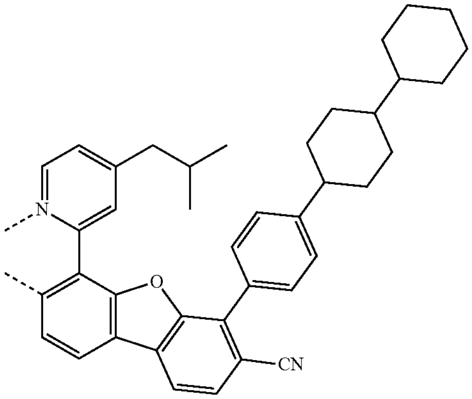
, -continued
L$_{a294}$
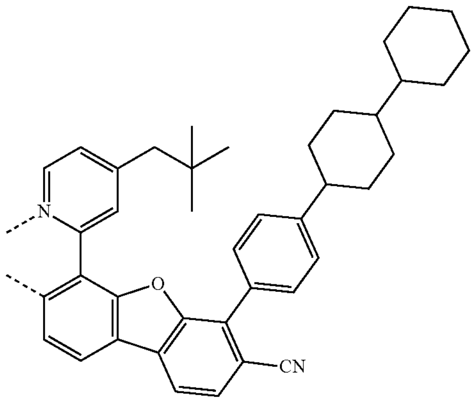
,
L$_{a295}$
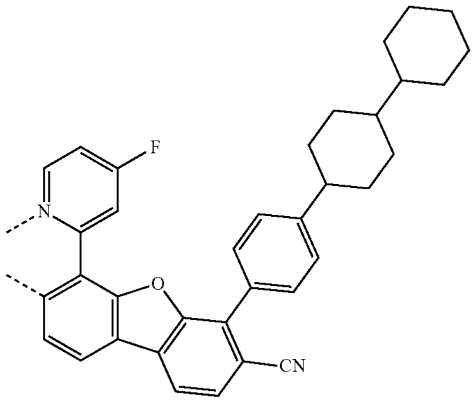
,
L$_{a296}$
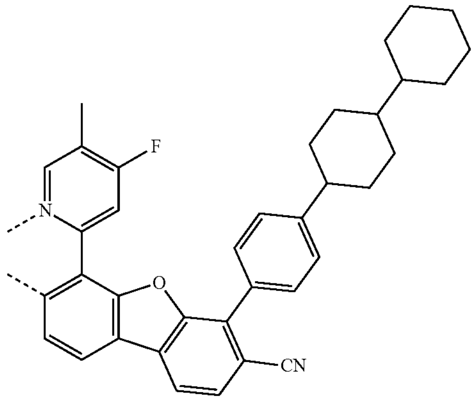
,
L$_{a297}$
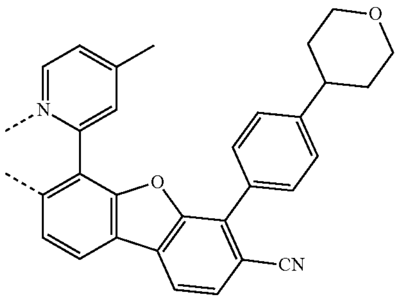
,
-continued
L$_{a298}$
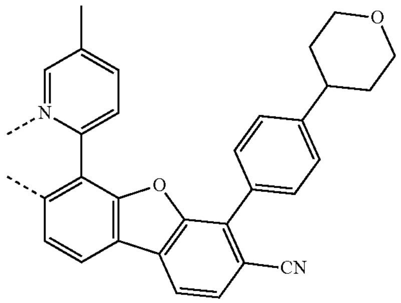
,
L$_{a299}$
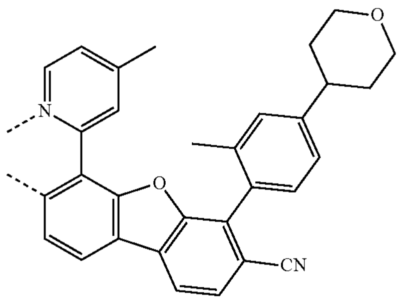
,
L$_{a300}$
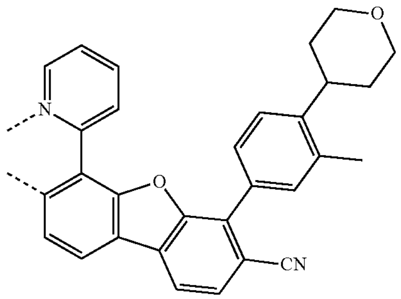
,
L$_{a301}$
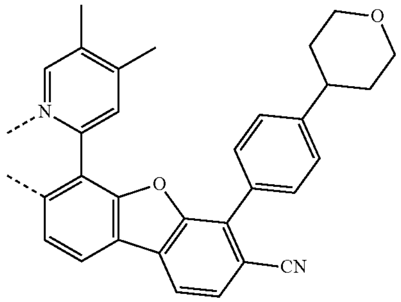
,
L$_{a302}$
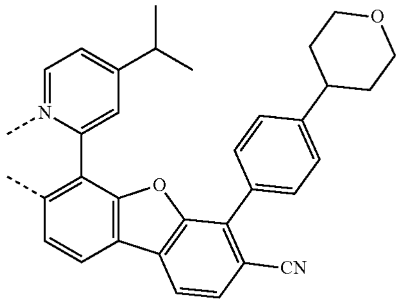
, $L_{a303}$
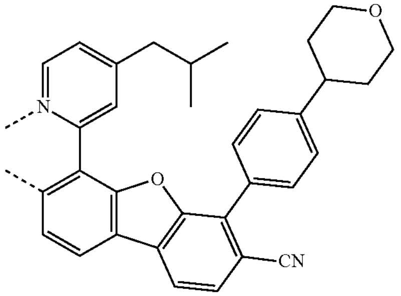
,
$L_{a304}$
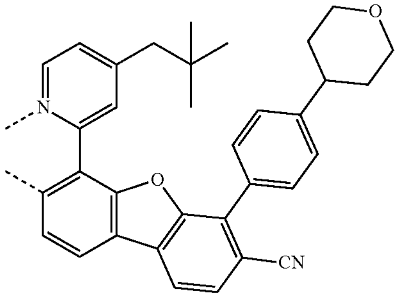
,
$L_{a305}$
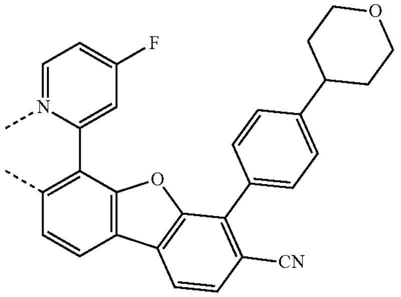
,
$L_{a306}$
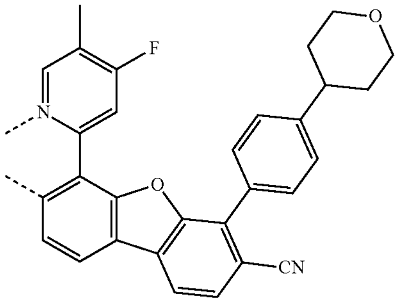
,
$L_{a327}$
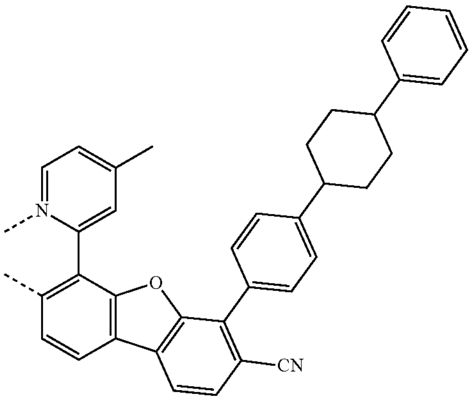
,
$L_{a328}$
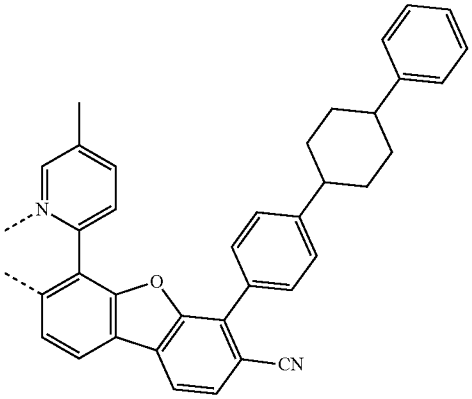
,
$L_{a329}$
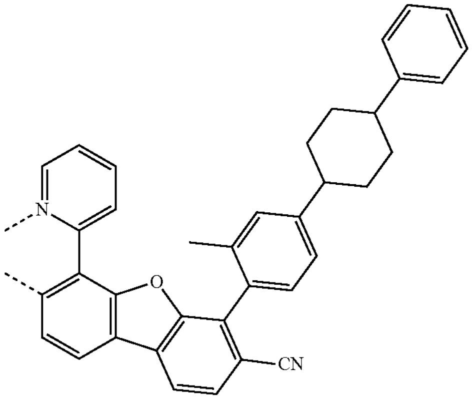
,
$L_{a330}$
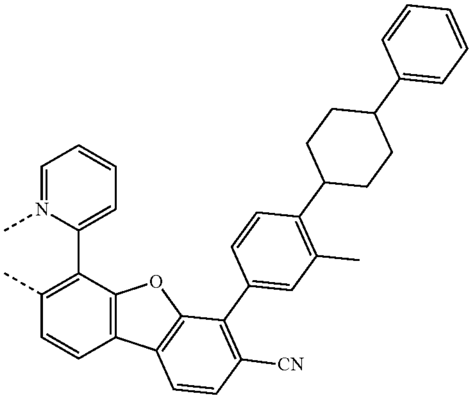
,
$L_{a331}$
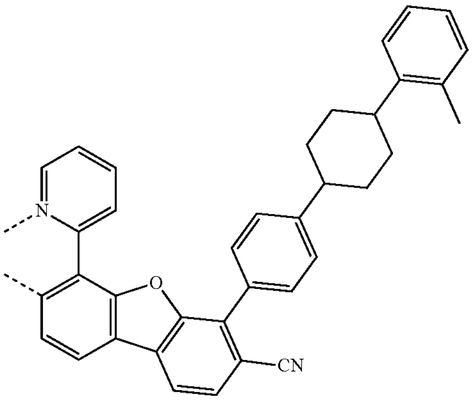
, -continued
$L_{a332}$
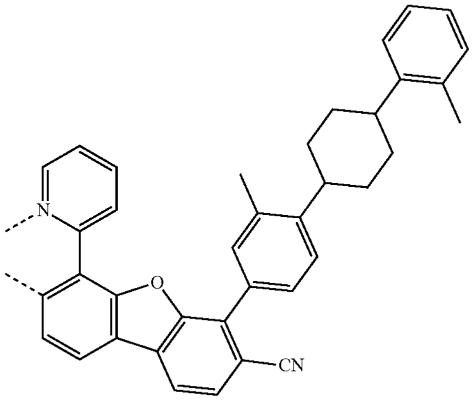
,
$L_{a333}$
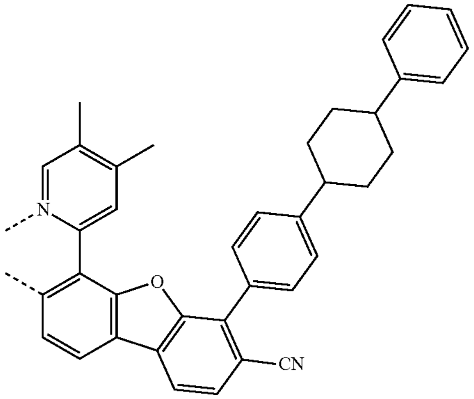
,
$L_{a334}$
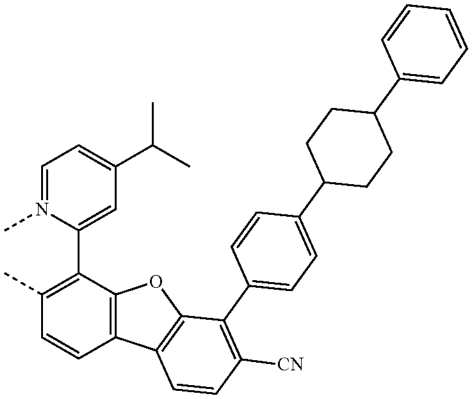
,
$L_{a335}$
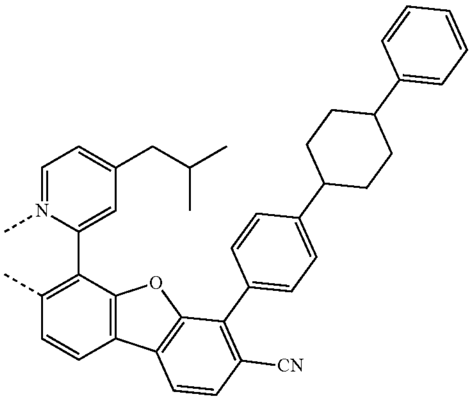
,
-continued
$L_{a336}$
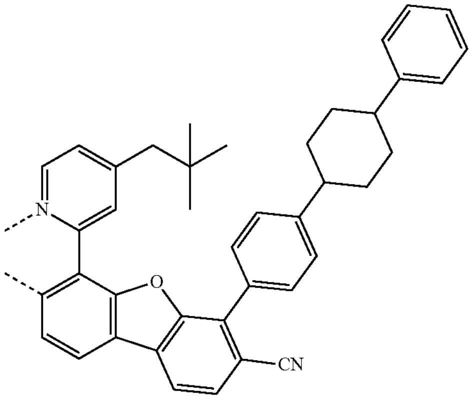
,
$L_{a337}$
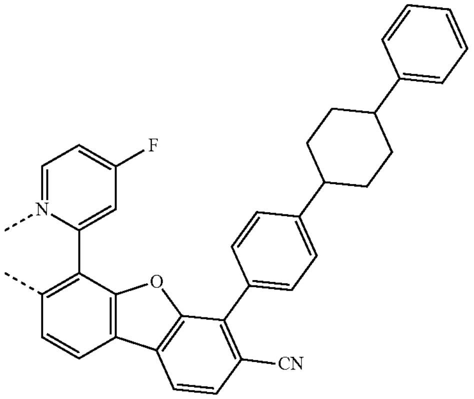
,
$L_{a338}$
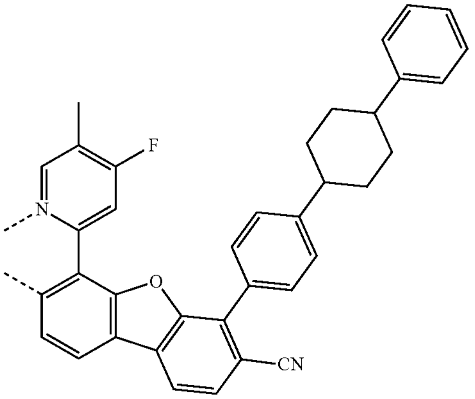
,
$L_{a339}$
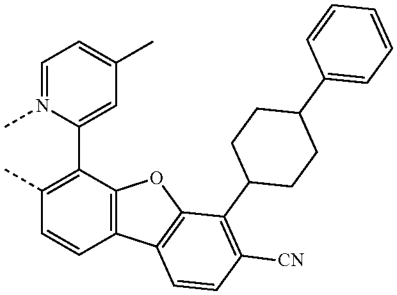
, -continued
$L_{a340}$
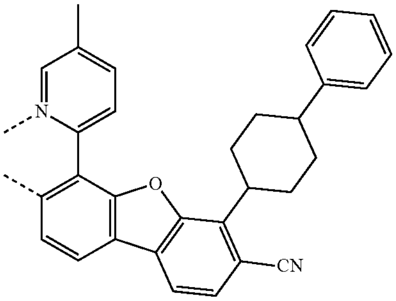
,
$L_{a341}$
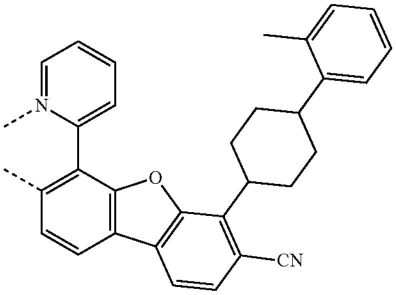
,
$L_{a342}$
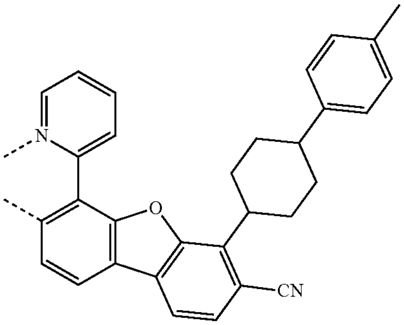
,
$L_{a343}$
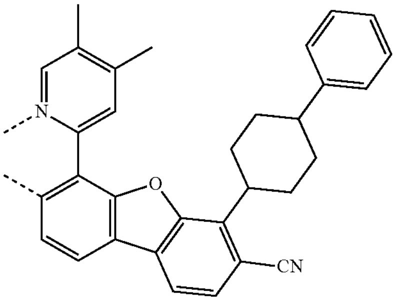
,
$L_{a344}$
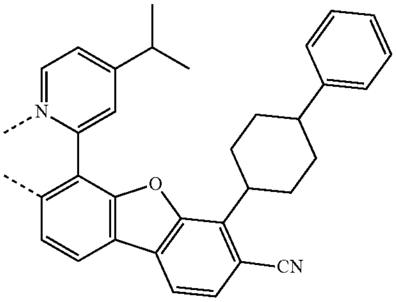
,
-continued
$L_{a345}$
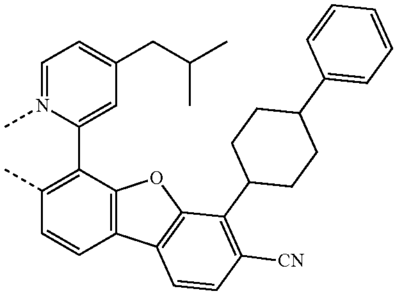
,
$L_{a346}$
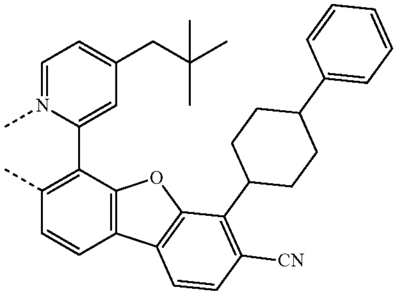
,
$L_{a347}$
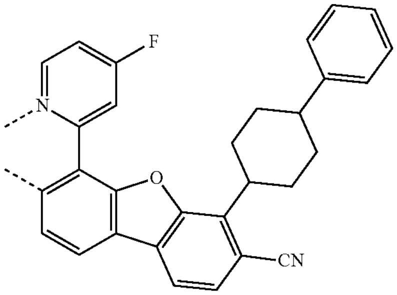
,
$L_{a348}$
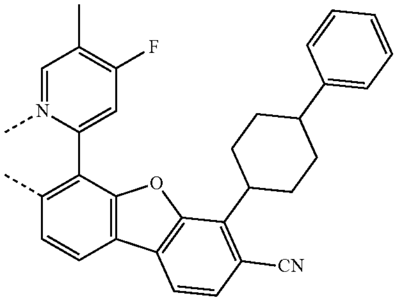
,
$L_{a349}$
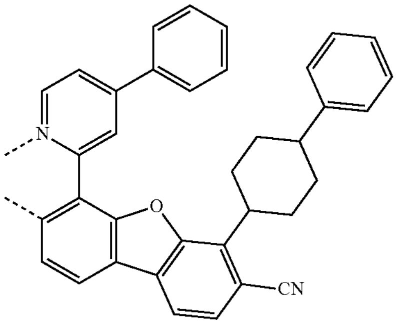
, -continued
$L_{a350}$
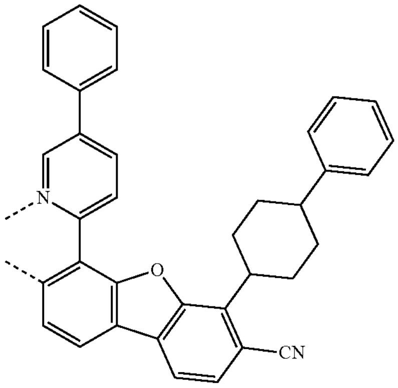
,
$L_{a351}$
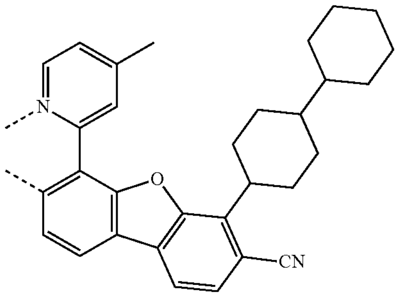
,
$L_{a352}$
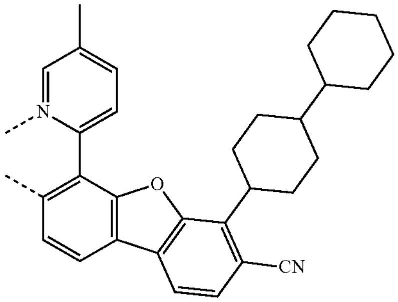
,
$L_{a353}$
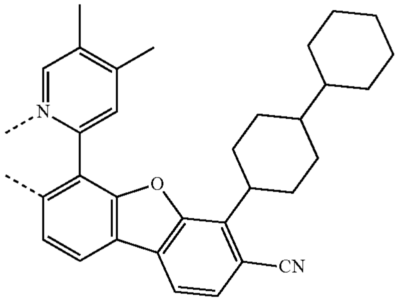
,
$L_{a354}$
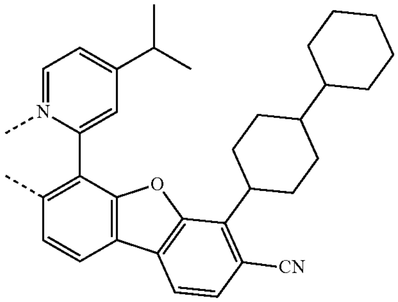
,
-continued
$L_{a355}$
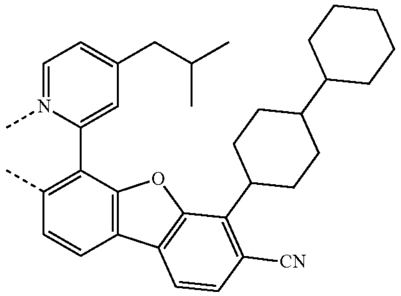
,
$L_{a356}$
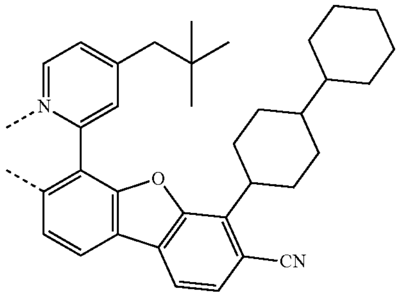
,
$L_{a357}$
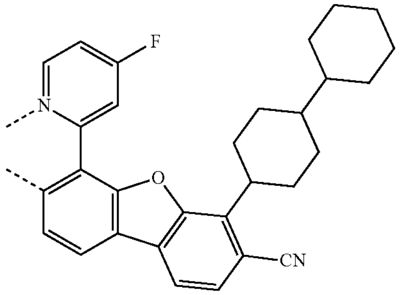
,
$L_{a358}$
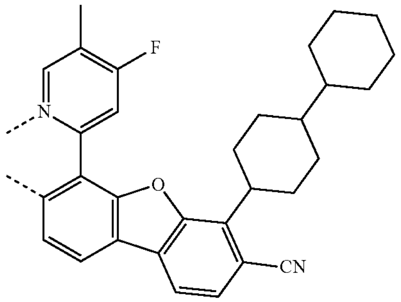
,
$L_{a359}$
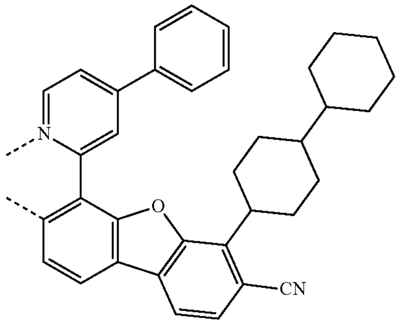
, $L_{a360}$
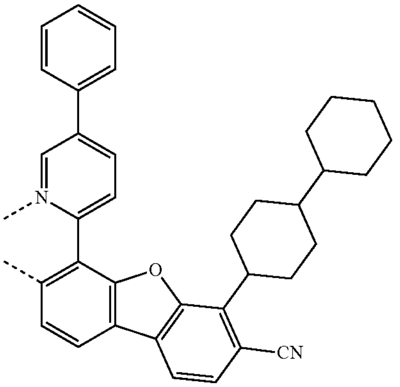
,
$L_{a381}$
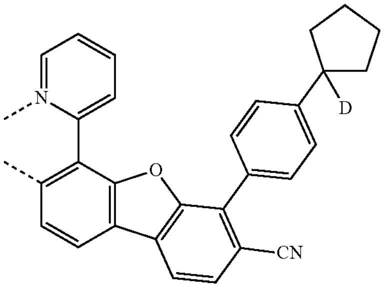
,
$L_{a382}$
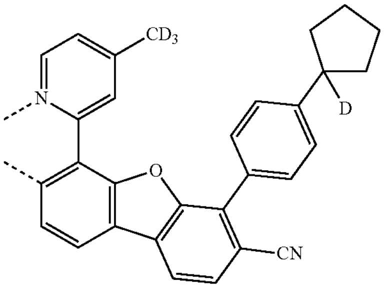
,
$L_{a383}$
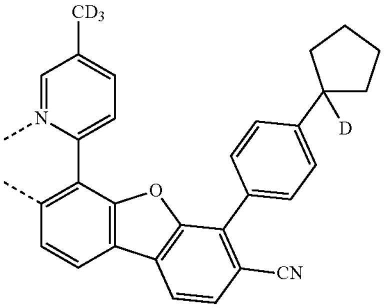
,
$L_{a384}$
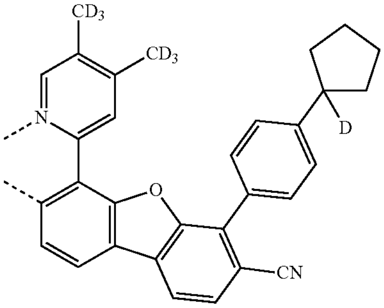
,
$L_{a385}$
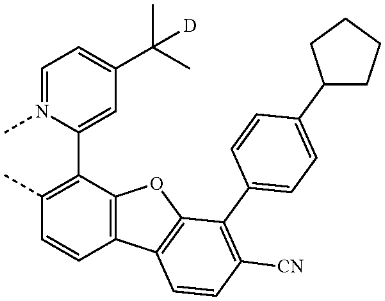
,
$L_{a386}$
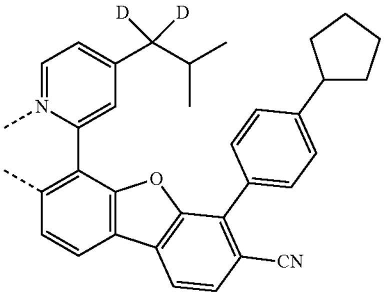
,
$L_{a387}$
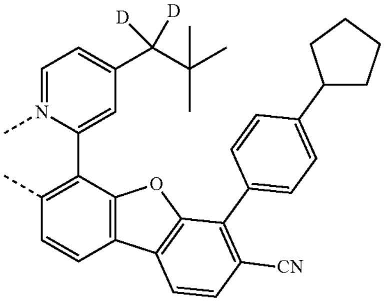
,
$L_{a388}$
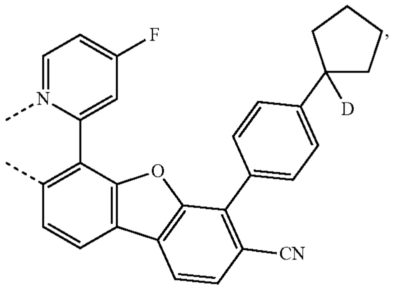
,
$L_{a389}$
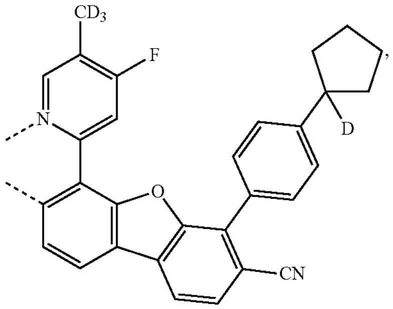

-continued
$L_{a390}$
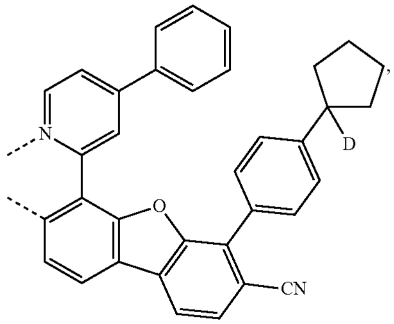
$L_{a391}$
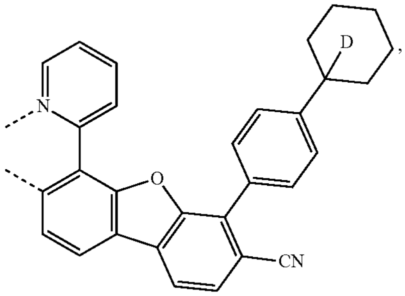
$L_{a392}$
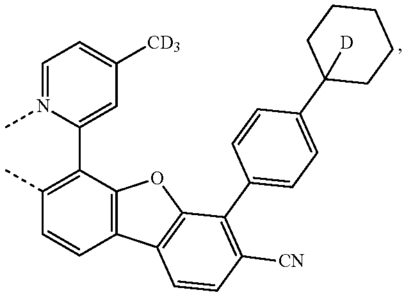
$L_{a393}$
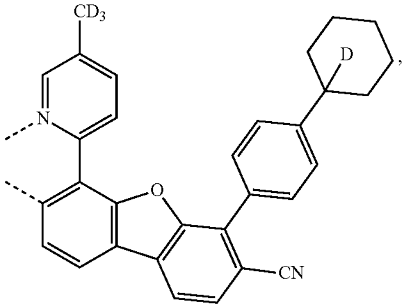
$L_{a394}$
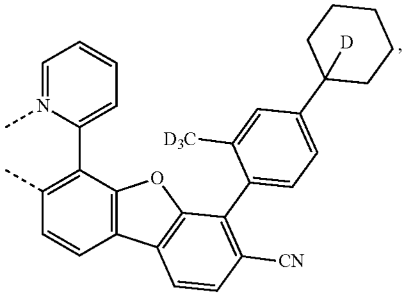
-continued
$L_{a395}$
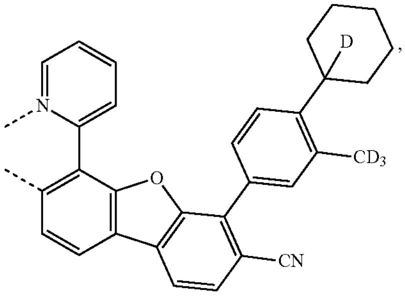
$L_{a396}$
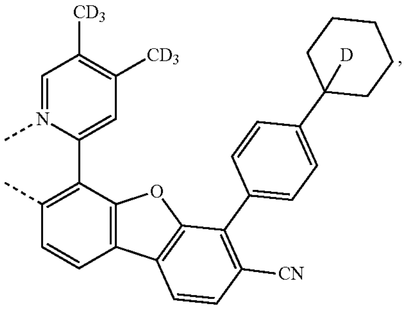
$L_{a397}$
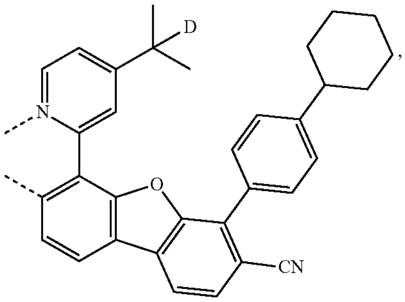
$L_{a398}$
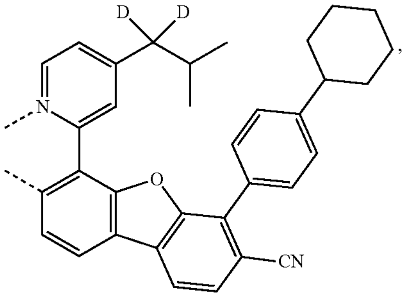
$L_{a399}$
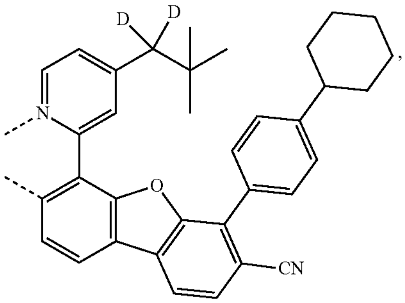

-continued
$L_{a400}$
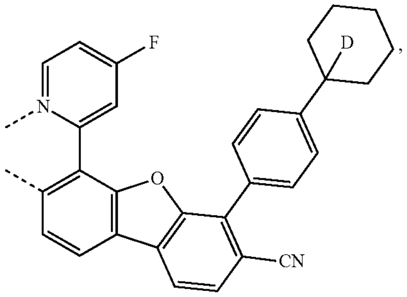
$L_{a401}$
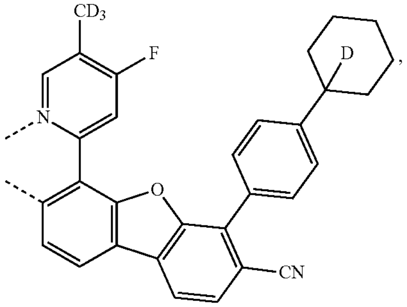
$L_{a402}$
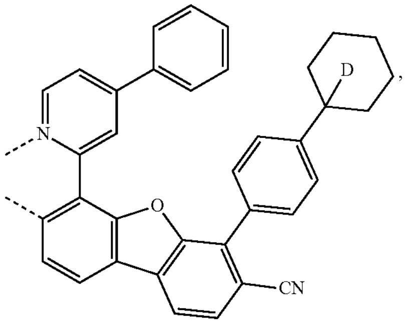
$L_{a403}$
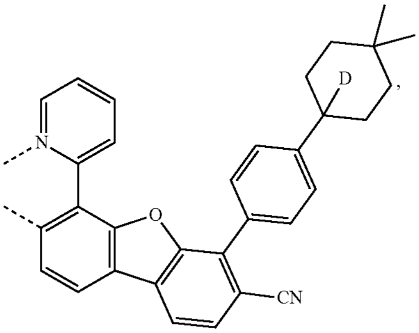
$L_{a404}$
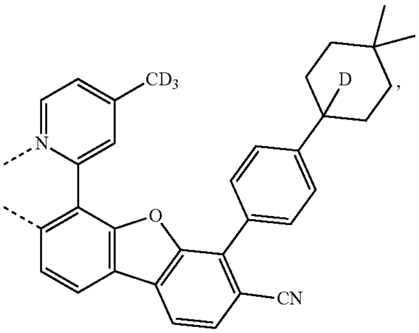
-continued
$L_{a405}$
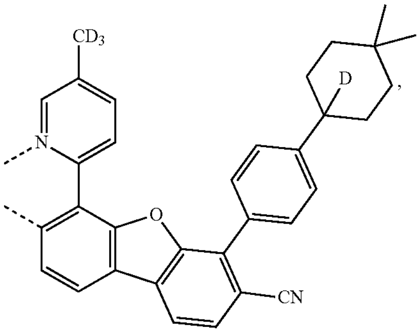
$L_{a406}$
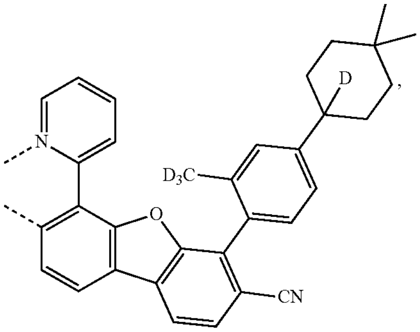
$L_{a407}$
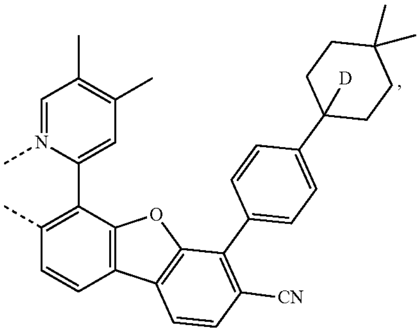
$L_{a408}$
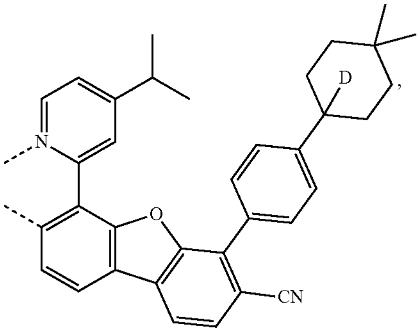

-continued
$L_{a409}$
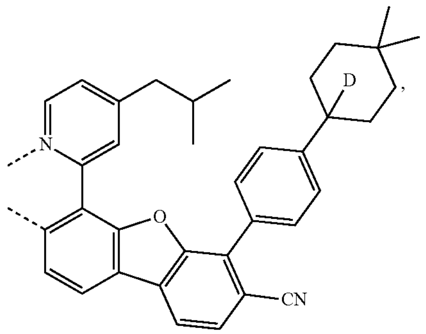
$L_{a410}$
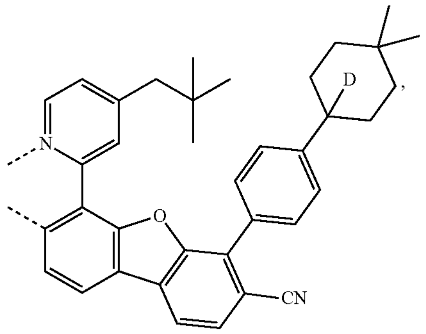
$L_{a411}$
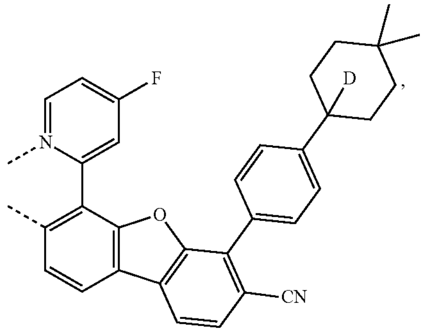
$L_{a412}$
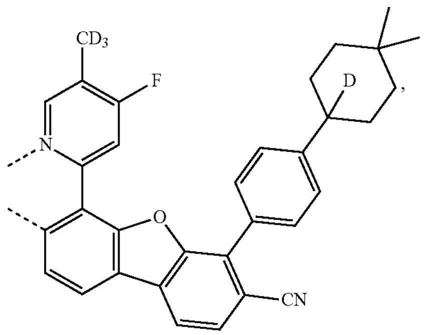
-continued
$L_{a413}$
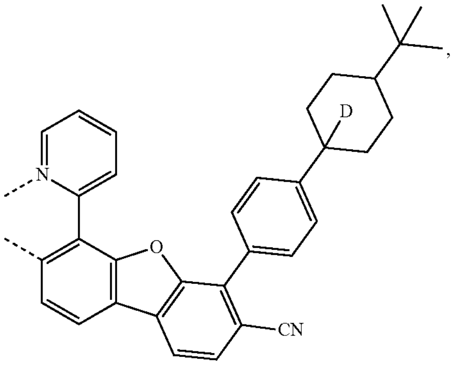
$L_{a414}$
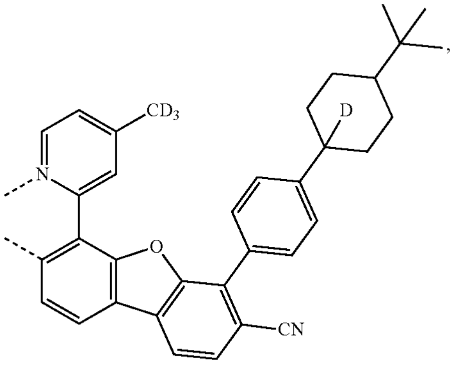
$L_{a415}$
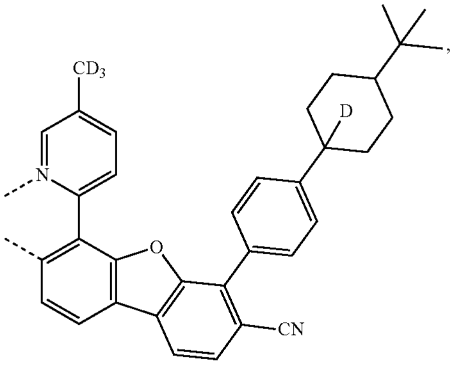
$L_{a416}$
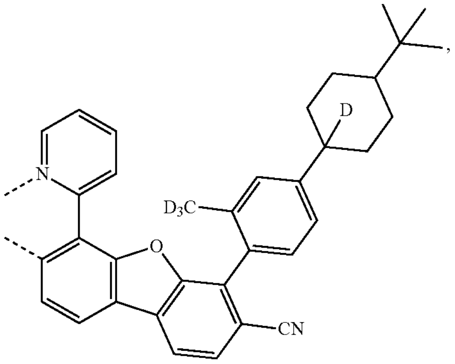

-continued
$L_{a417}$
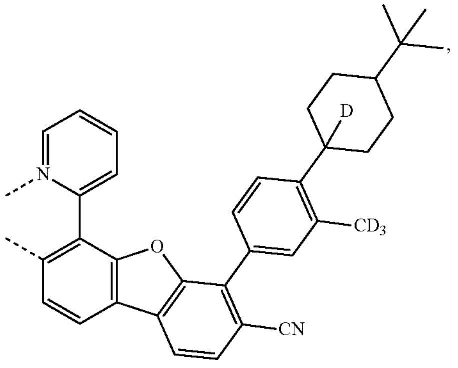
$L_{a418}$
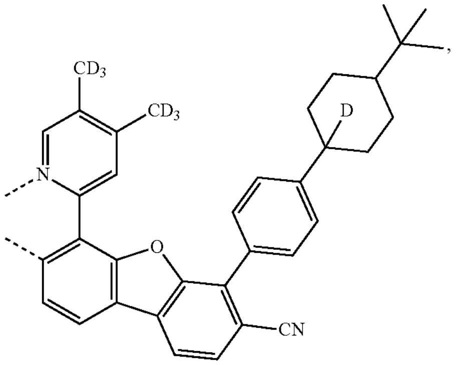
$L_{a419}$
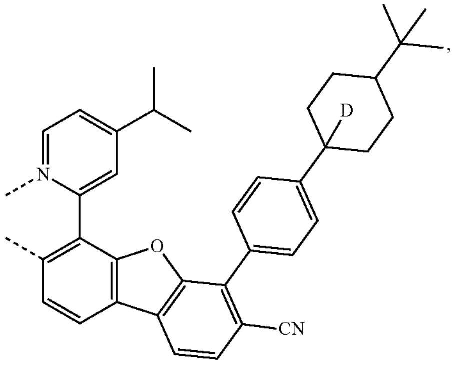
$L_{a420}$
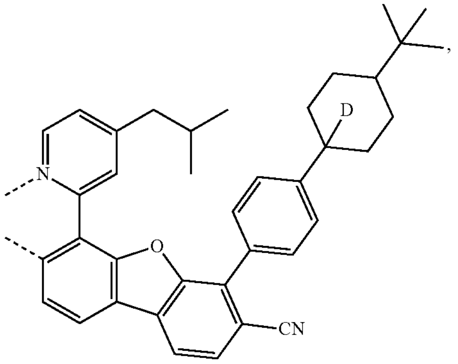
-continued
$L_{a421}$
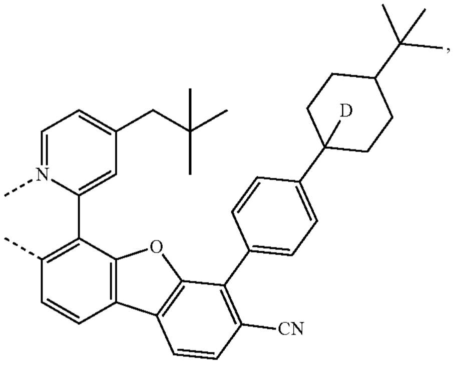
$L_{a422}$
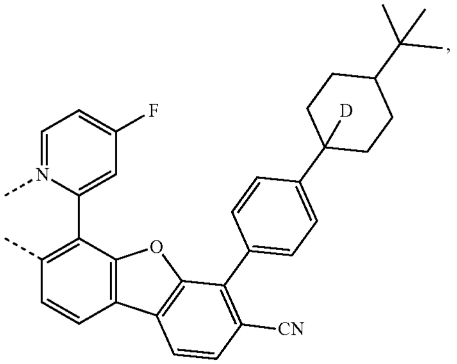
$L_{a423}$
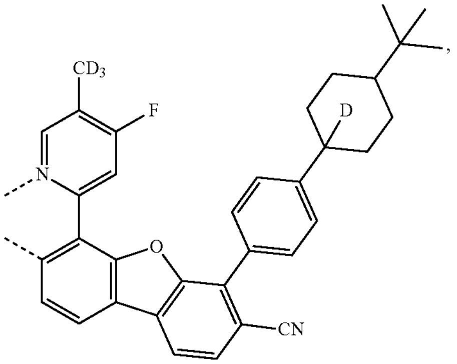
$L_{a424}$
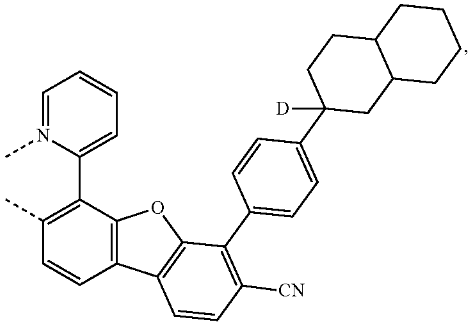

-continued
$L_{a425}$
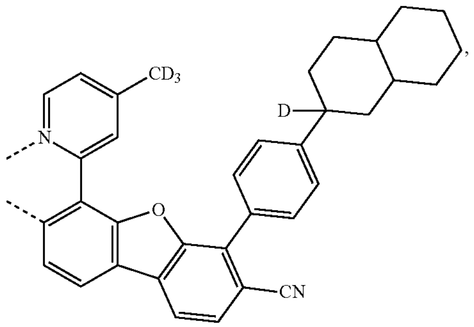
$L_{a426}$
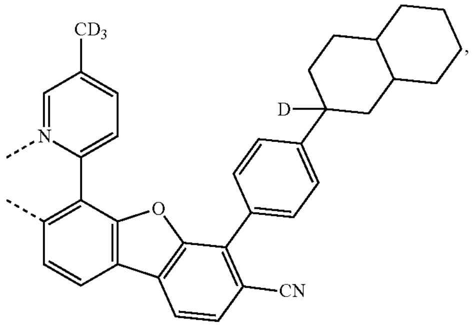
$L_{a427}$
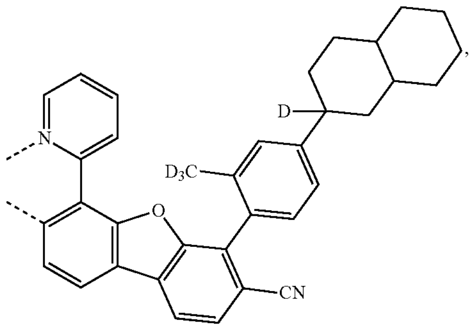
$L_{a428}$
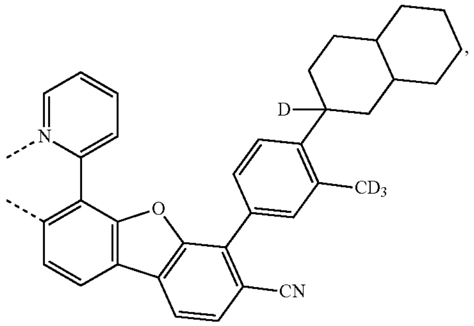
-continued
$L_{a429}$
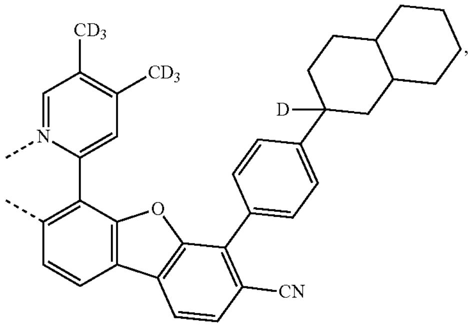
$L_{a430}$
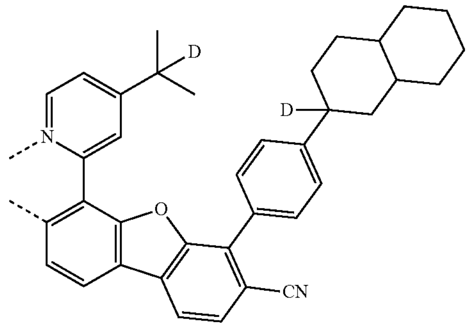
$L_{a431}$
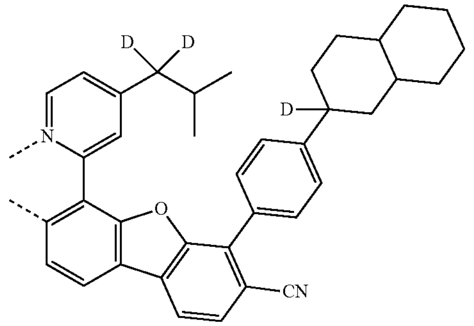
$L_{a432}$
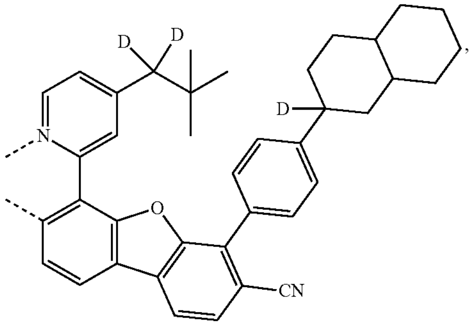

-continued
L$_{a433}$
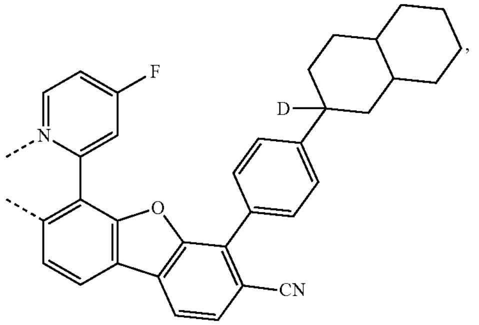
L$_{a434}$
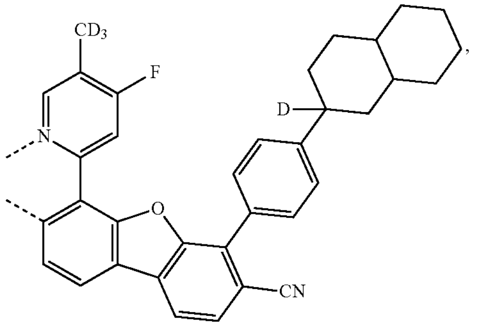
L$_{a435}$
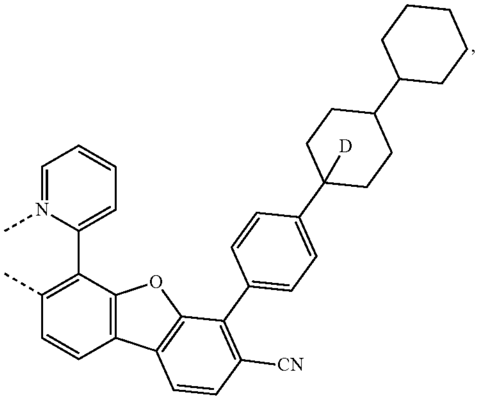
L$_{a436}$
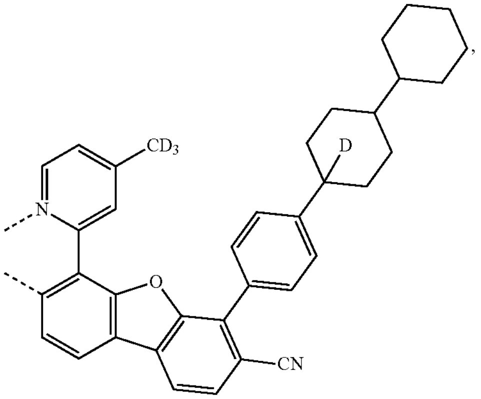
-continued
L$_{a437}$
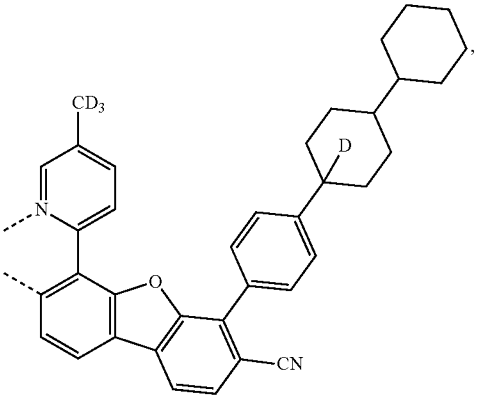
L$_{a438}$
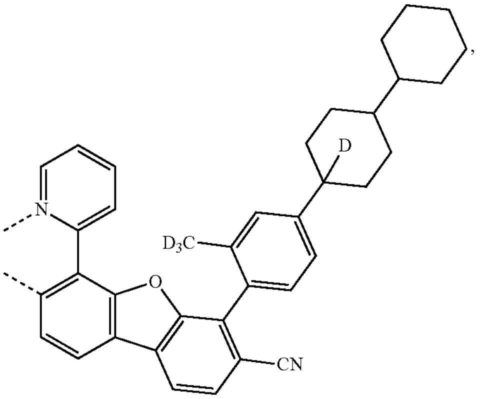
L$_{a439}$
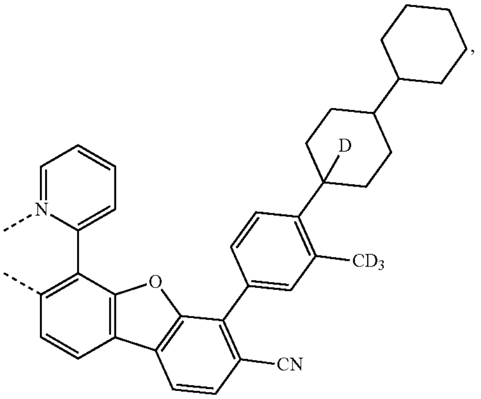
L$_{a440}$
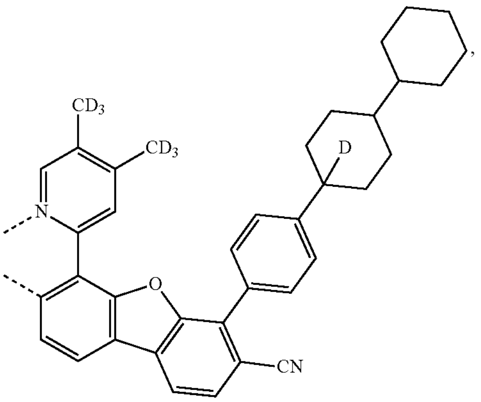

-continued
$L_{a441}$
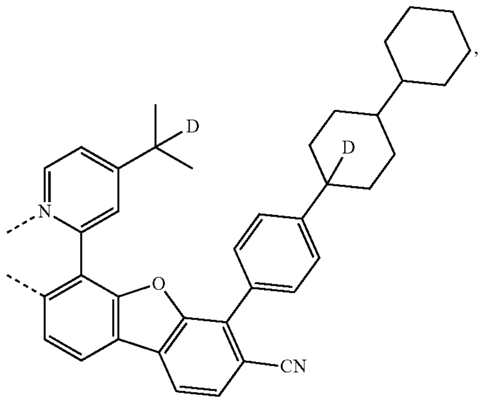
$L_{a442}$
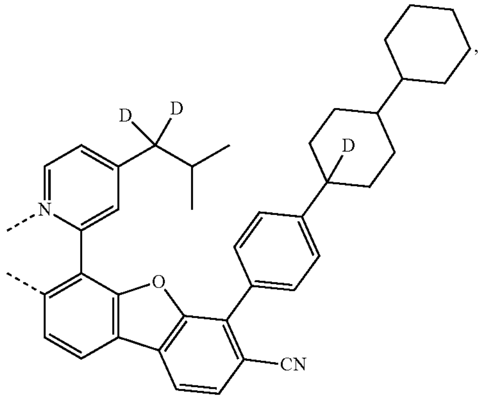
$L_{a443}$
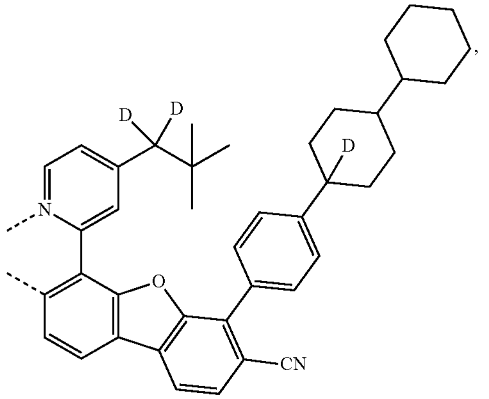
$L_{a444}$
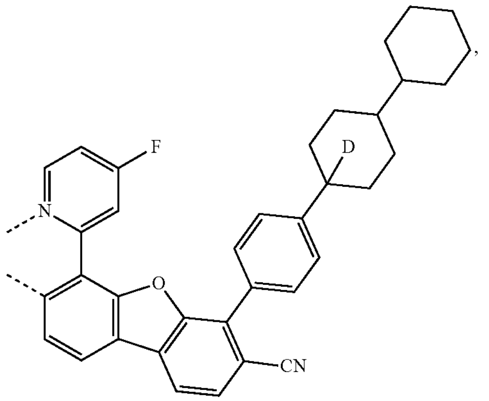
-continued
$L_{a445}$
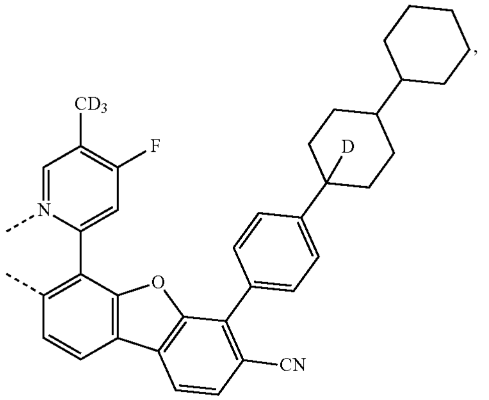
$L_{a446}$
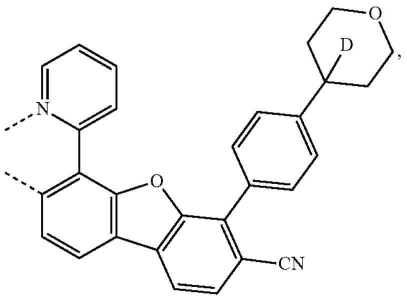
$L_{a447}$
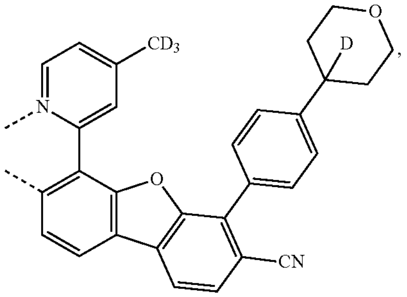
$L_{a448}$
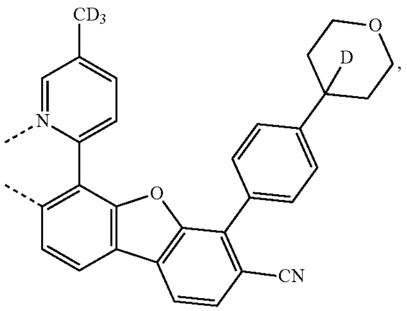
$L_{a449}$
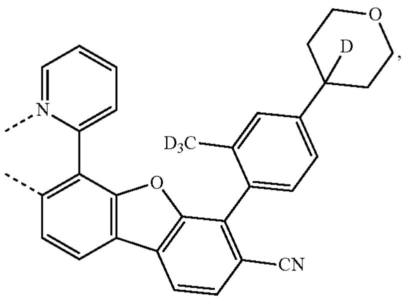

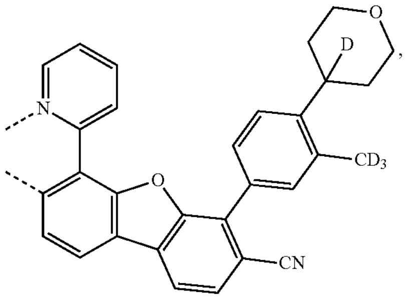
$L_{a450}$
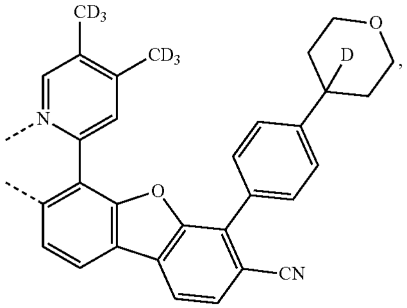
$L_{a451}$
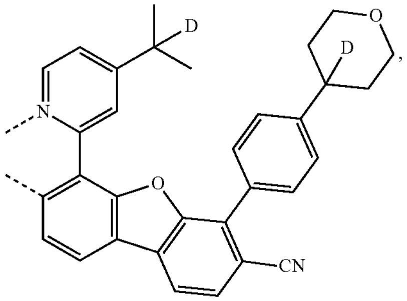
$L_{a452}$
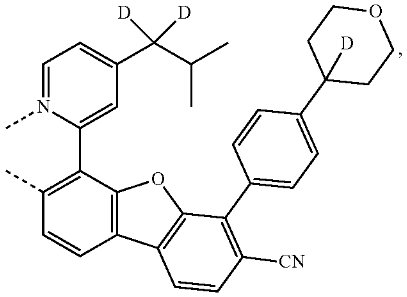
$L_{a453}$
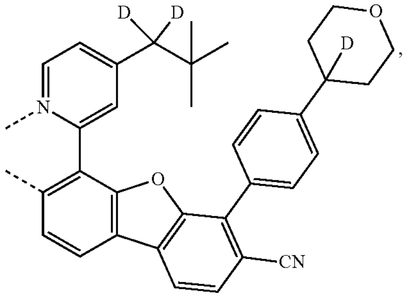
$L_{a454}$
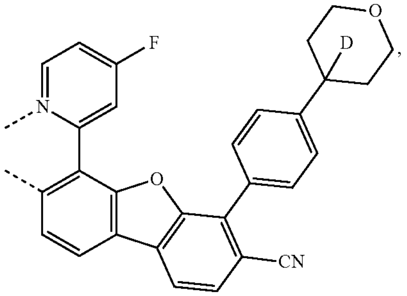
$L_{a455}$
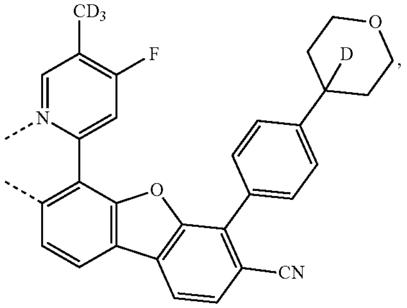
$L_{a456}$
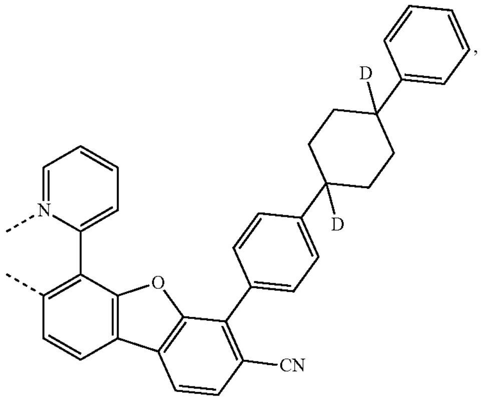
$L_{a466}$
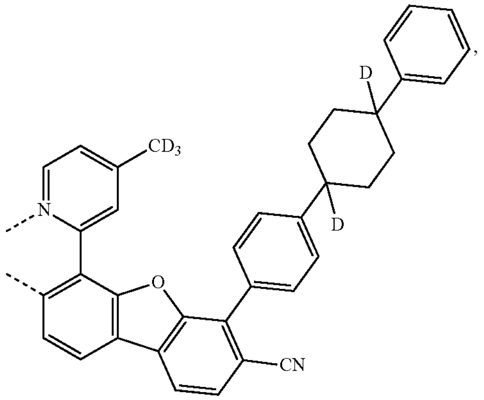
$L_{a467}$ -continued
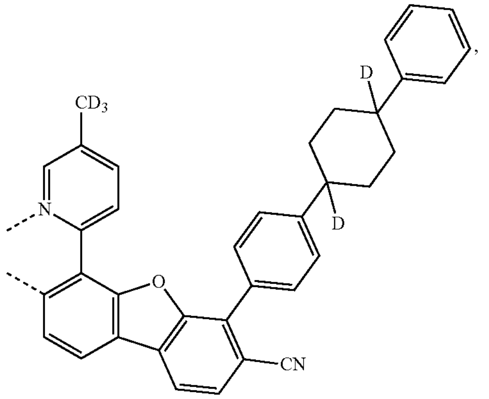
$L_{a468}$
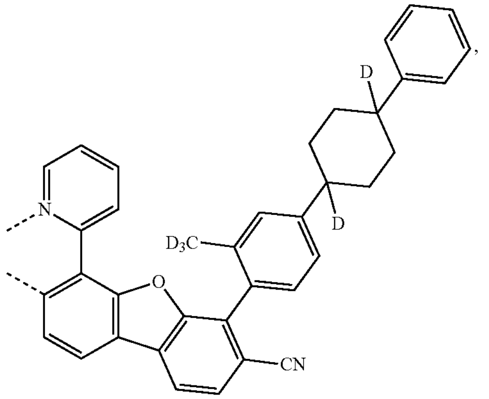
$L_{a469}$
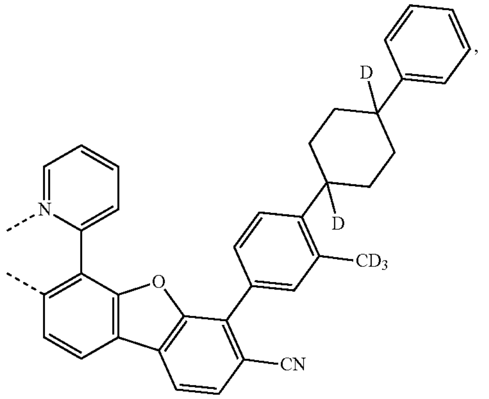
$L_{a470}$
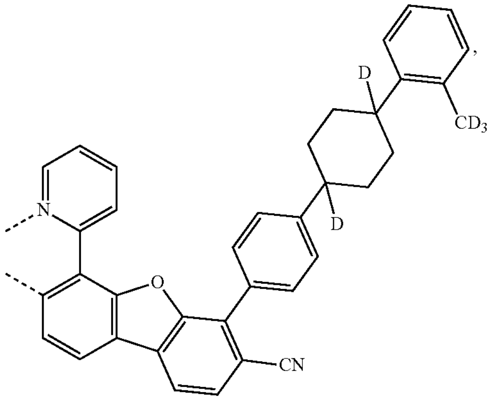
$L_{a471}$
-continued
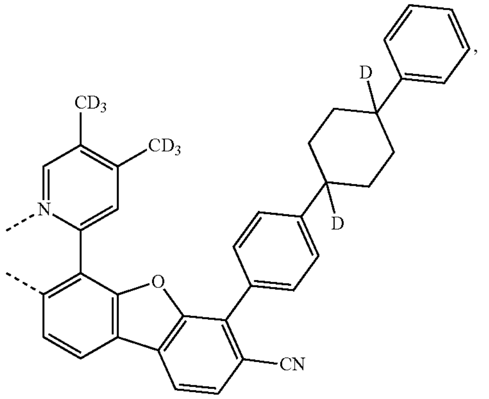
$L_{a472}$
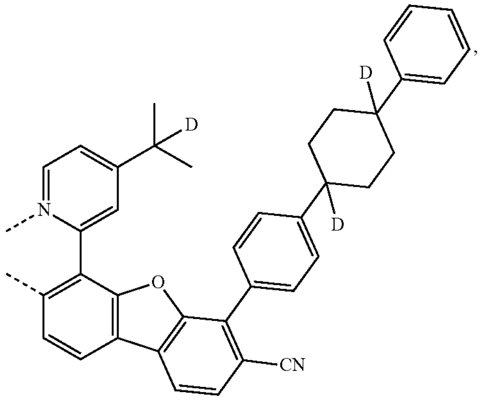
$L_{a473}$
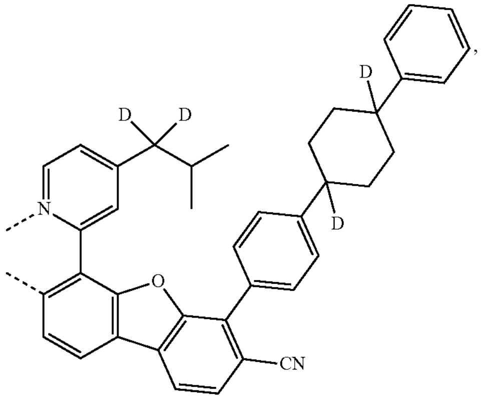
$L_{a474}$
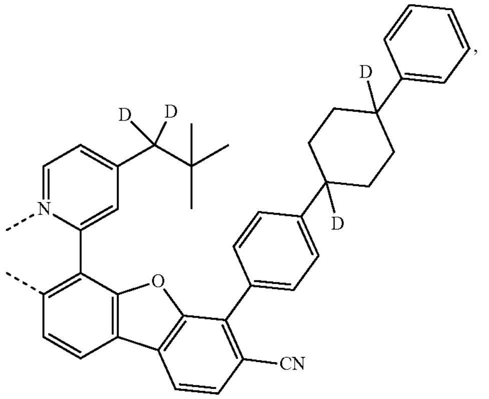
$L_{a475}$ -continued
$L_{a476}$
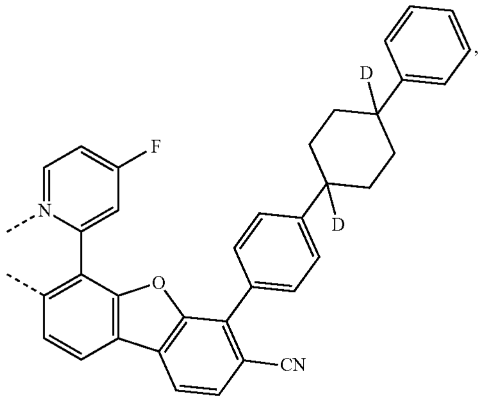
$L_{a477}$
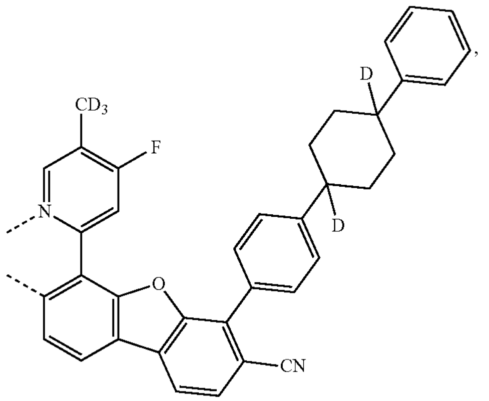
$L_{a482}$
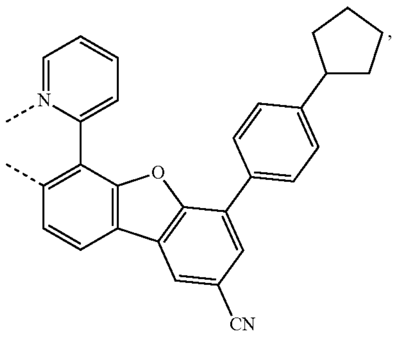
$L_{a483}$
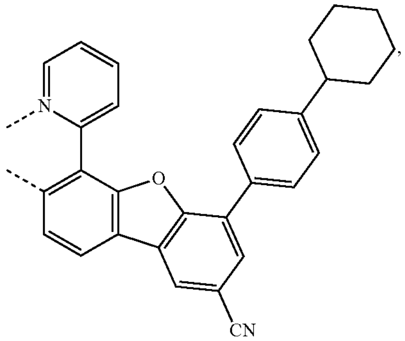
-continued
$L_{a484}$
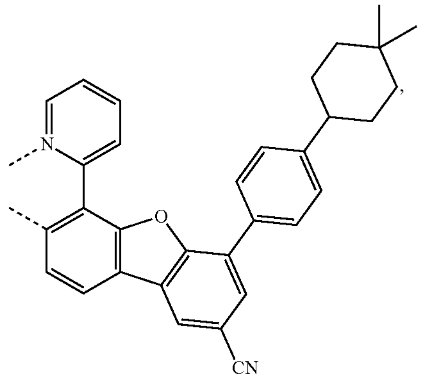
$L_{a485}$
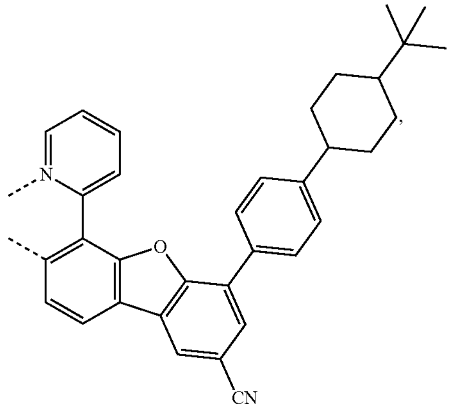
$L_{a486}$
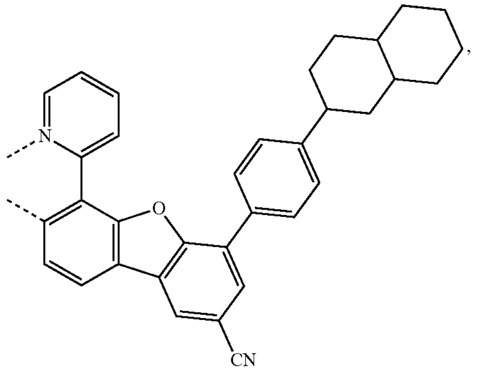
$L_{a487}$
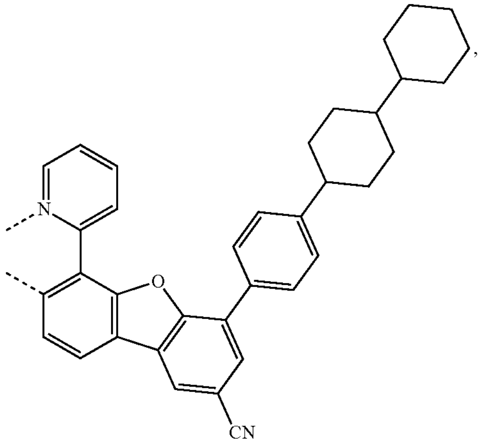

-continued
$L_{a488}$
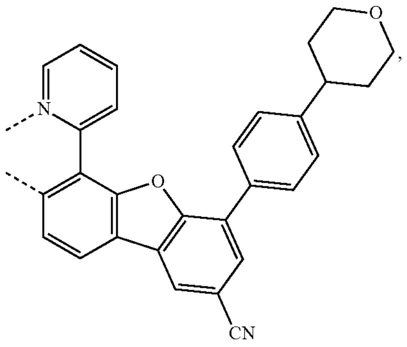
,
$L_{a490}$
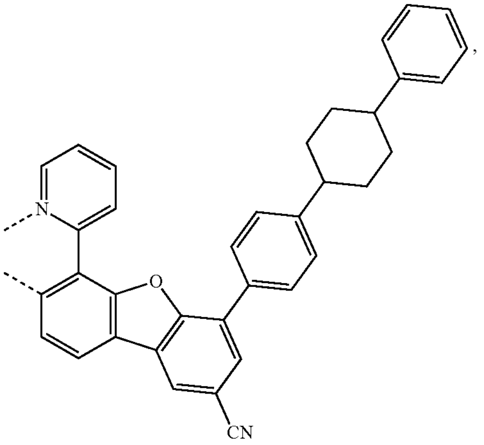
,
$L_{a495}$
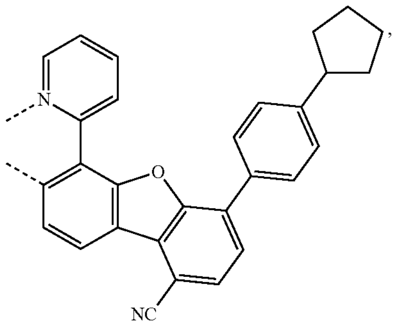
,
$L_{a496}$
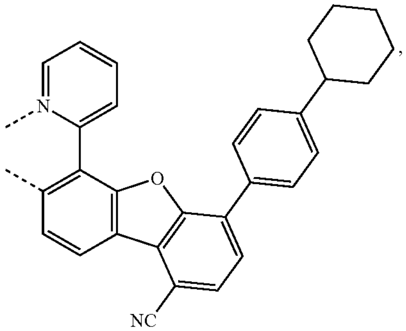
,
-continued
$L_{a497}$
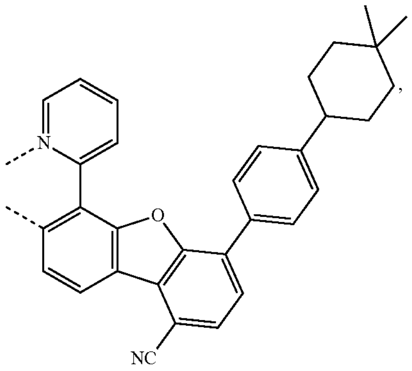
,
$L_{a498}$
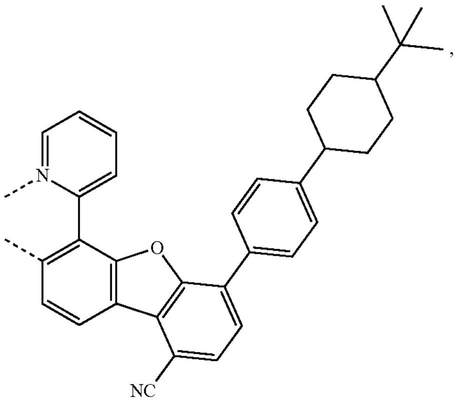
,
$L_{a499}$
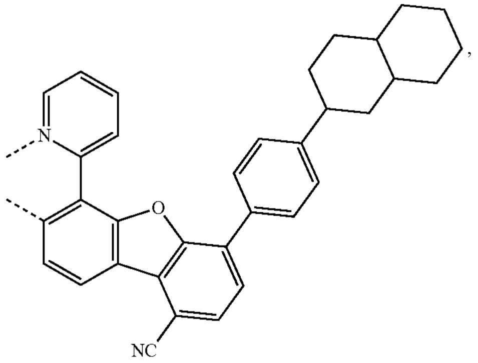
,
$L_{a500}$
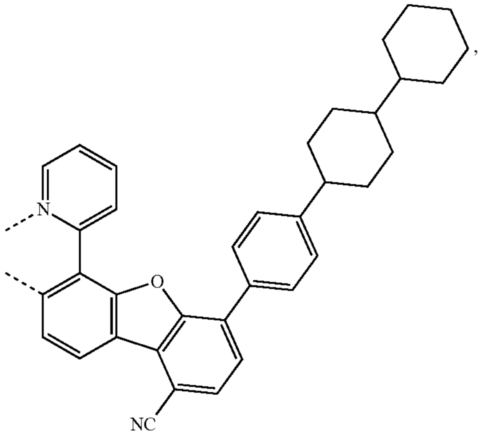
, -continued
$L_{a501}$
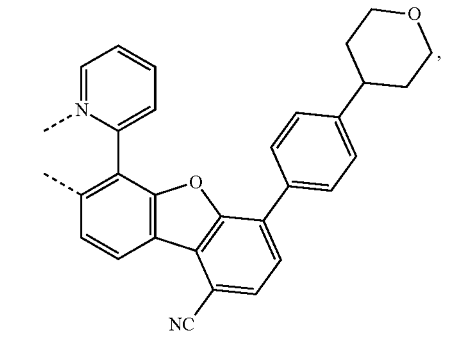
$L_{a503}$
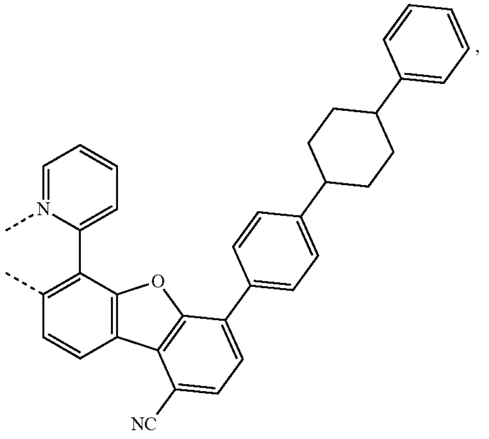
$L_{a517}$
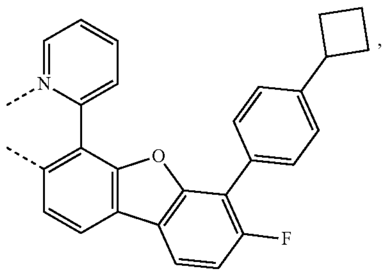
$L_{a518}$
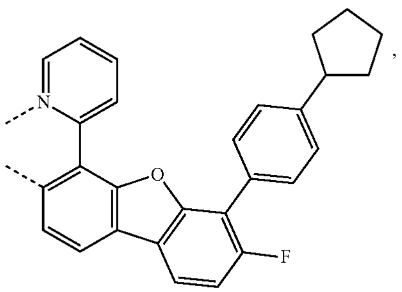
-continued
$L_{a519}$
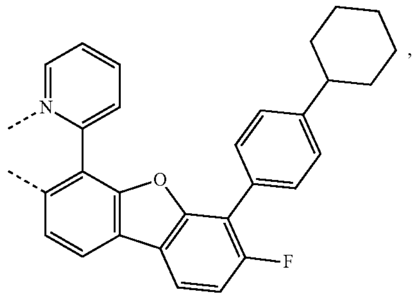
$L_{a520}$
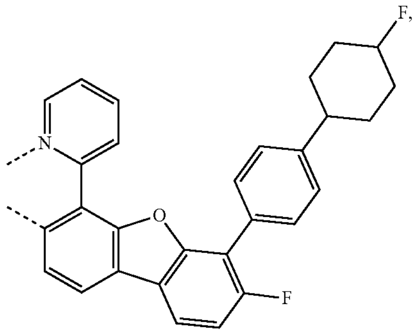
$L_{a521}$
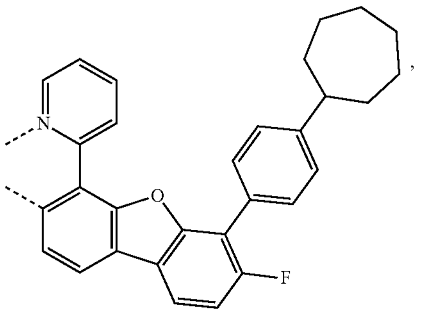
$L_{a522}$
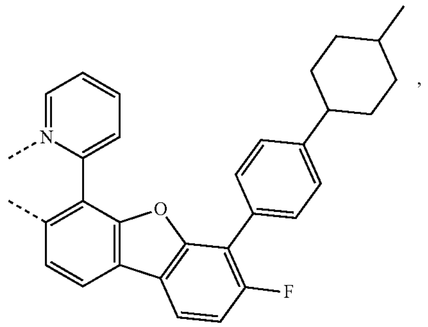
$L_{a523}$
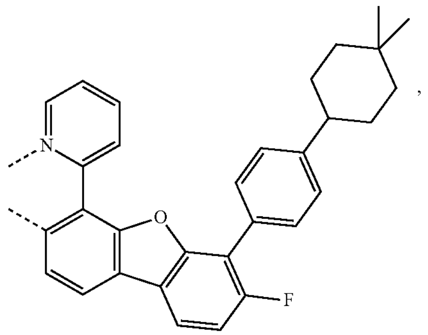

-continued
$L_{a524}$
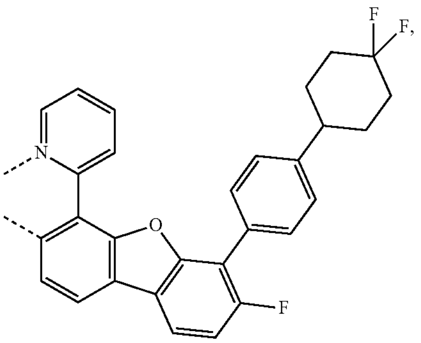
$L_{a525}$
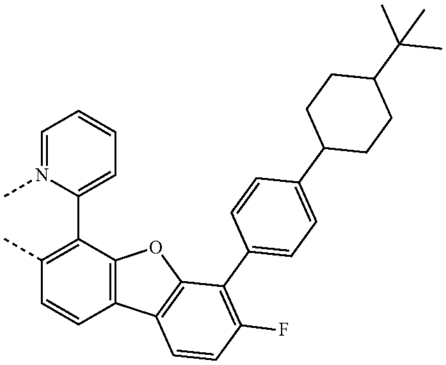
,
$L_{a526}$
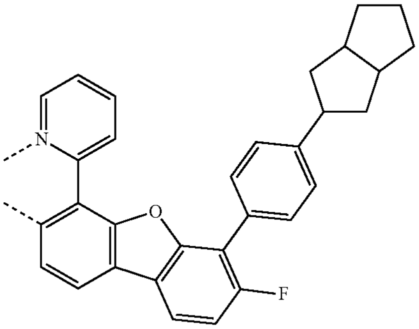
,
$L_{a527}$
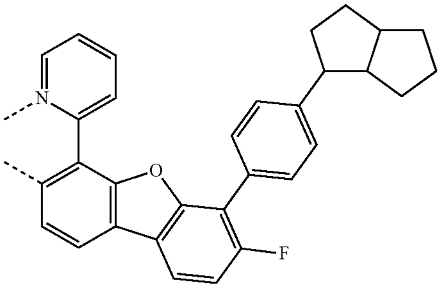
,
-continued
$L_{a528}$
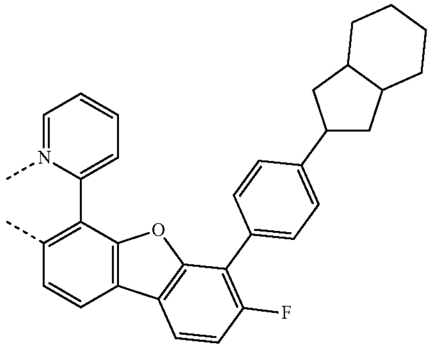
,
$L_{a529}$
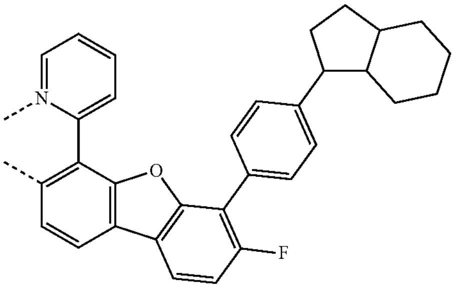
,
$L_{a530}$
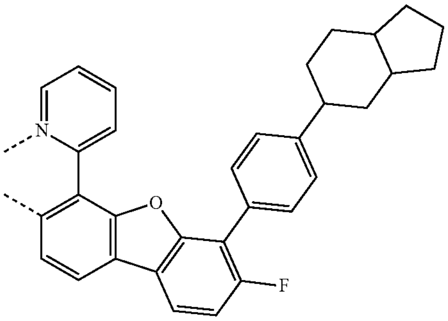
,
$L_{a531}$
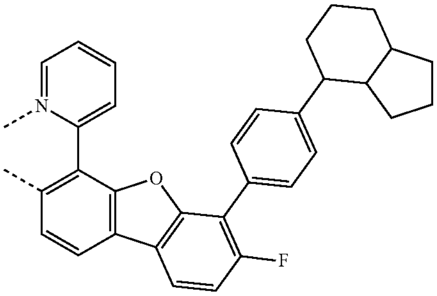
,
$L_{a532}$
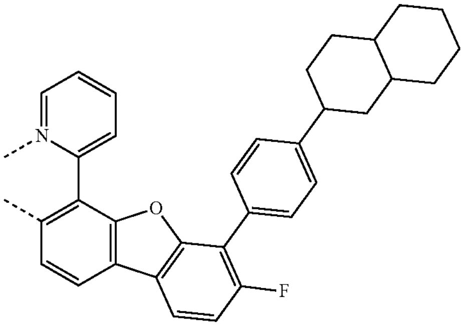
, -continued
$L_{a533}$
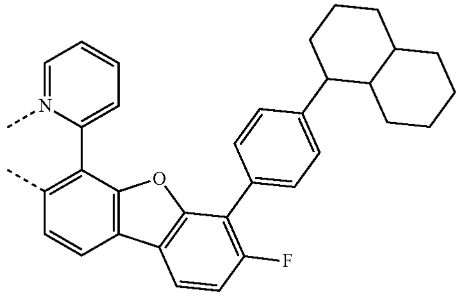,
$L_{a534}$
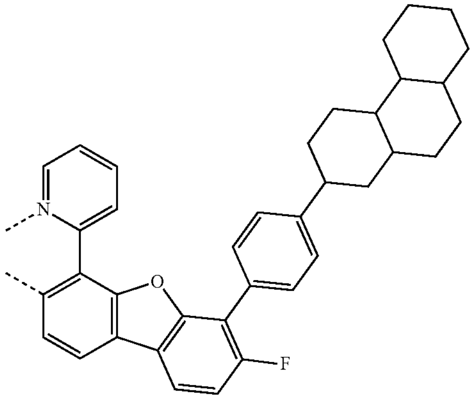,
$L_{a535}$
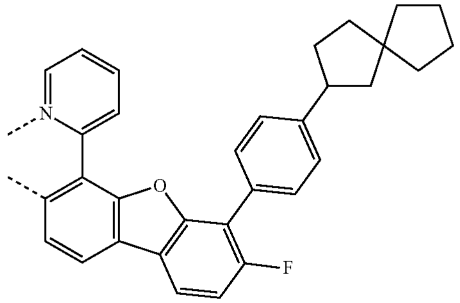,
$L_{a536}$
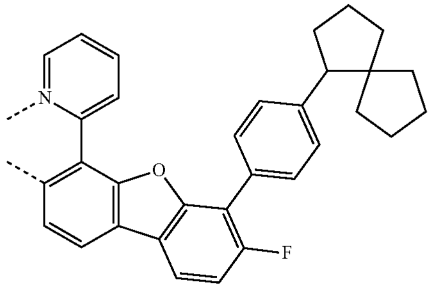,
$L_{a537}$
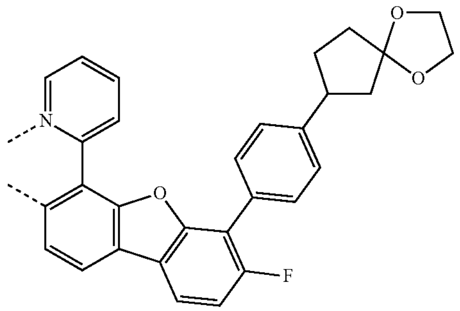,
-continued
$L_{a538}$
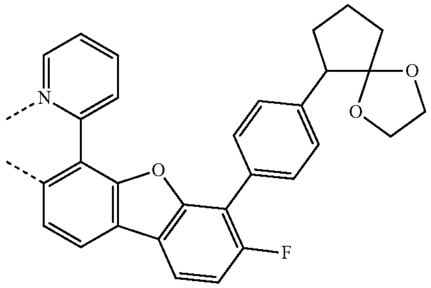,
$L_{a539}$
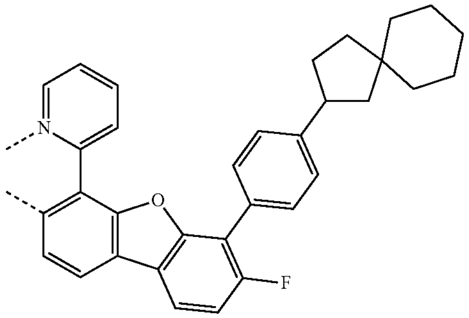,
$L_{a540}$
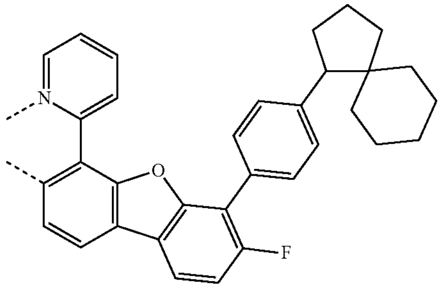,
$L_{a541}$
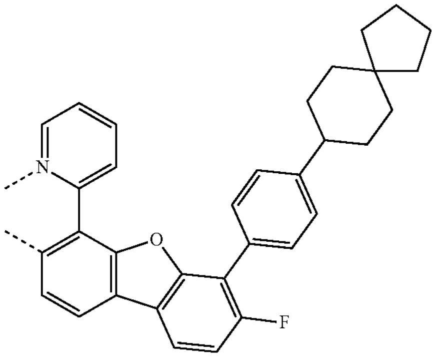,
$L_{a542}$
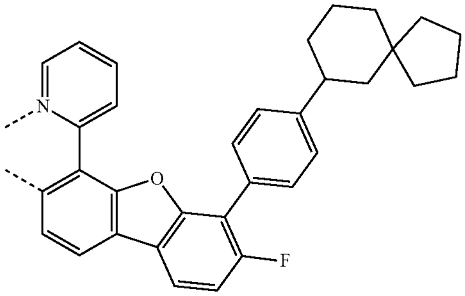, $L_{a543}$
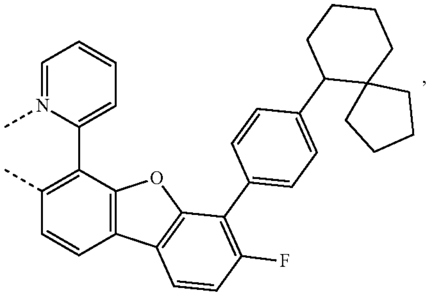
$L_{a544}$
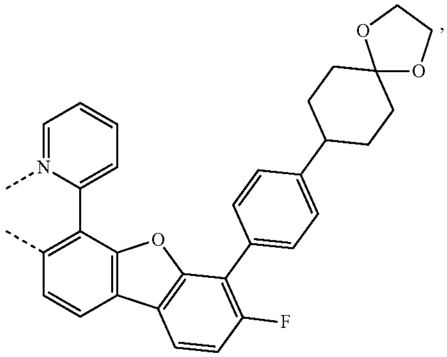
$L_{a545}$
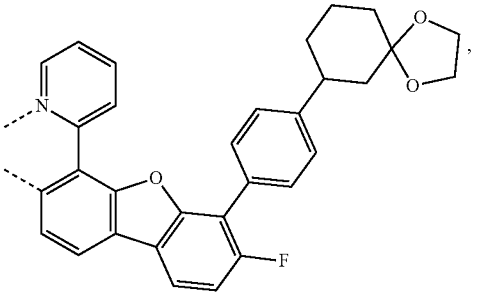
$L_{a546}$
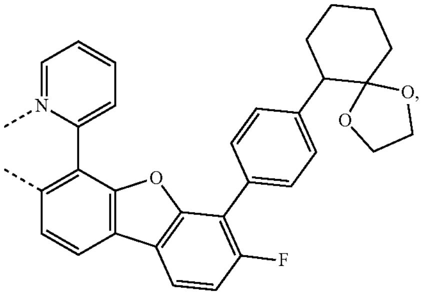
$L_{a547}$
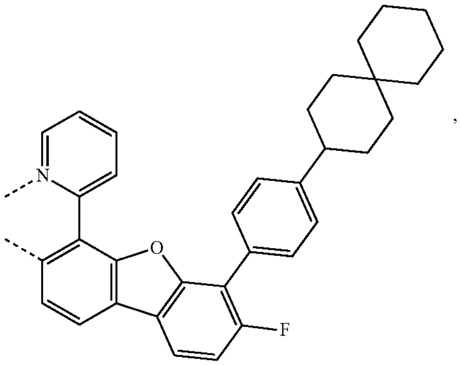
$L_{a548}$
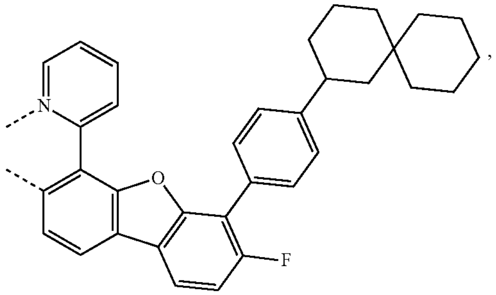
$L_{a549}$
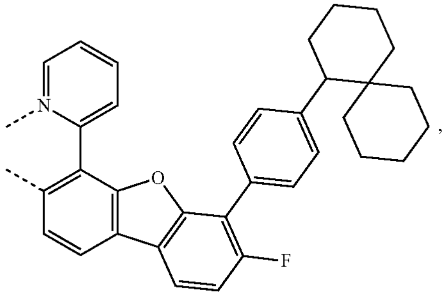
$L_{a550}$
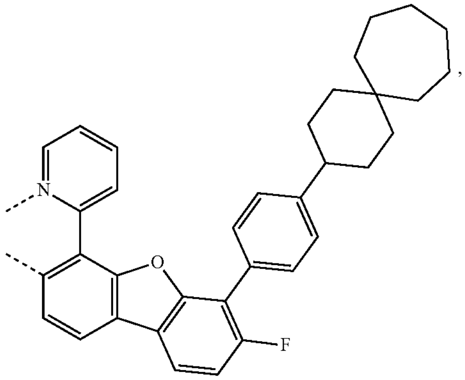
$L_{a551}$
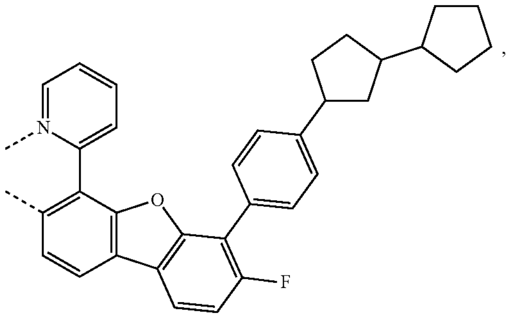
$L_{a552}$
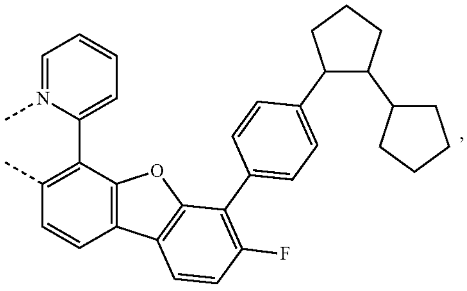

$L_{a553}$
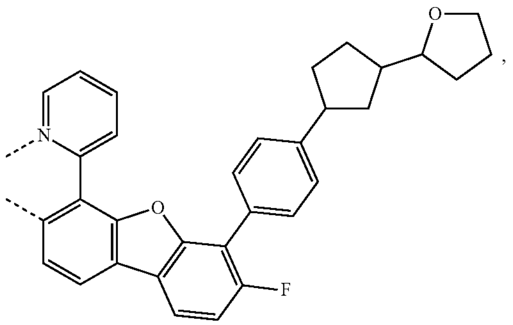
$L_{a554}$
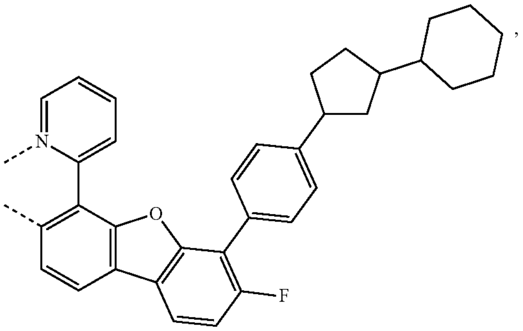
$L_{a555}$
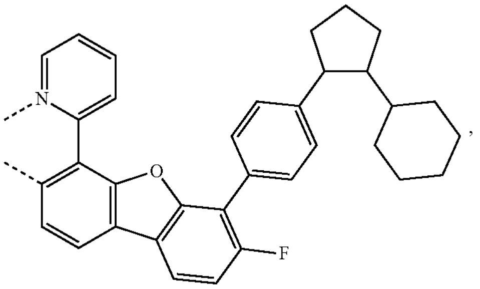
$L_{a556}$
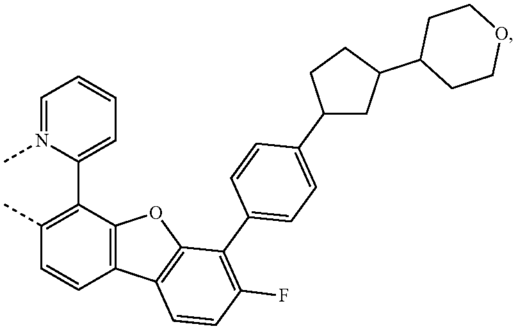
$L_{a557}$
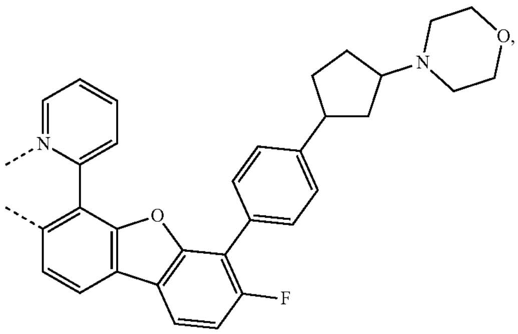
$L_{a558}$
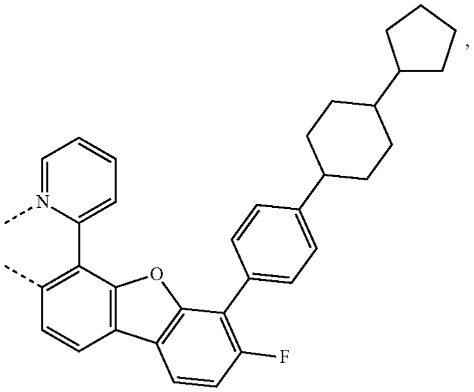
$L_{a559}$
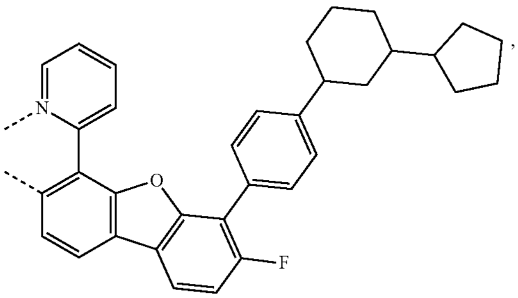
$L_{a560}$
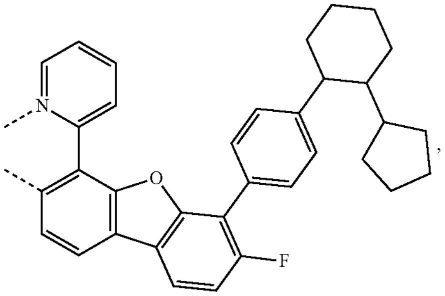

-continued
L$_{a561}$
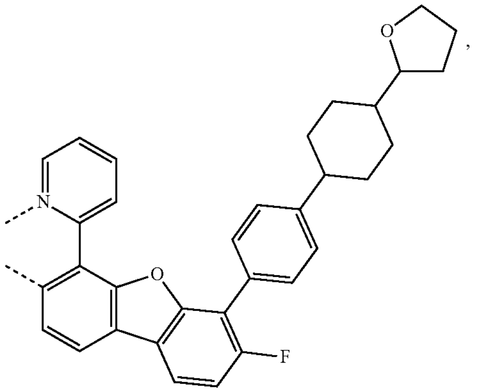
L$_{a562}$
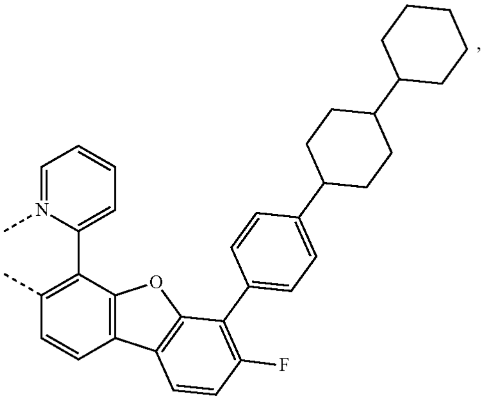
L$_{a563}$
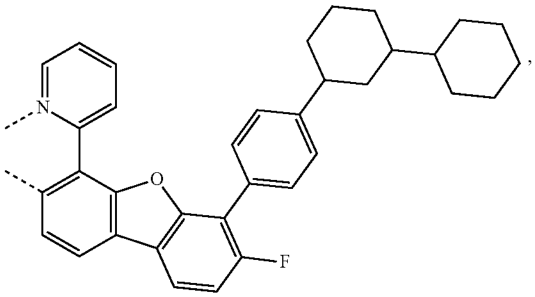
L$_{a564}$
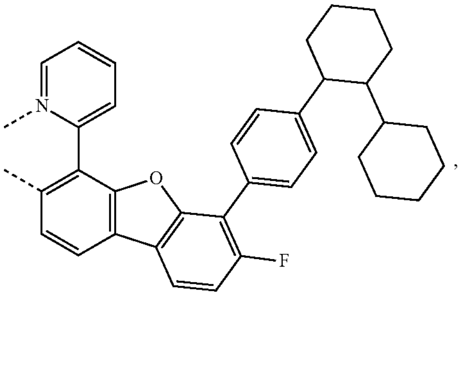
-continued
L$_{a565}$
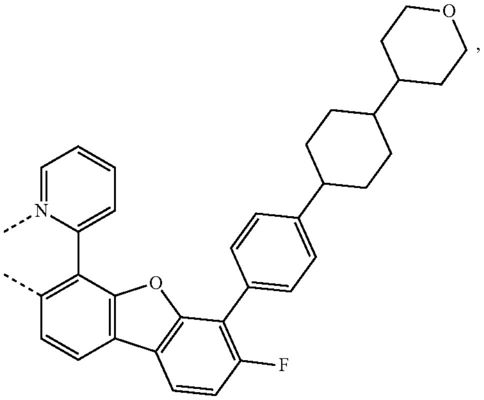
L$_{a566}$
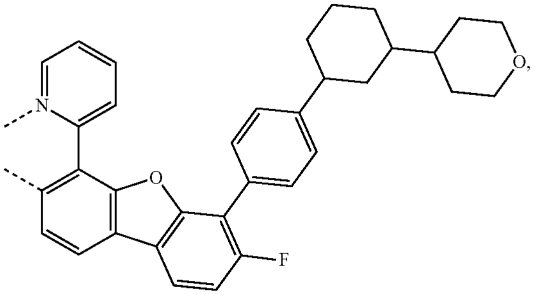
L$_{a567}$
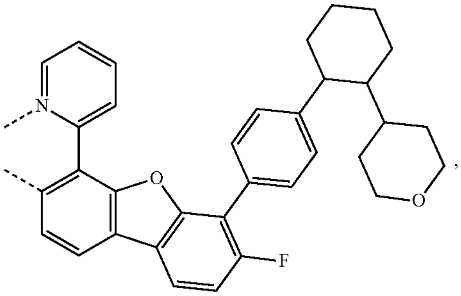
L$_{a568}$
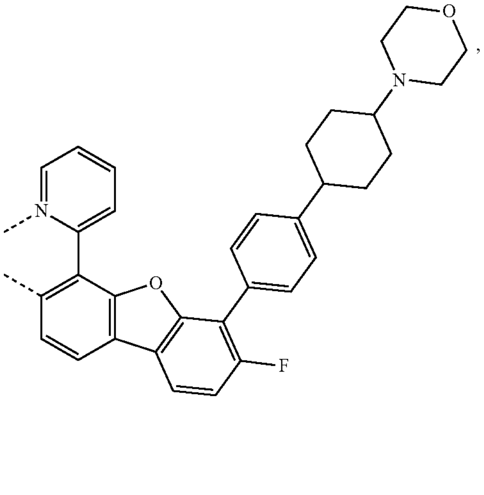

-continued
$L_{a569}$
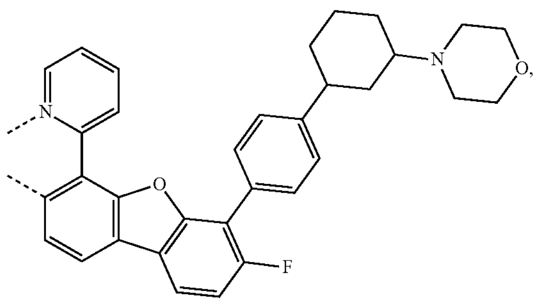
$L_{a570}$
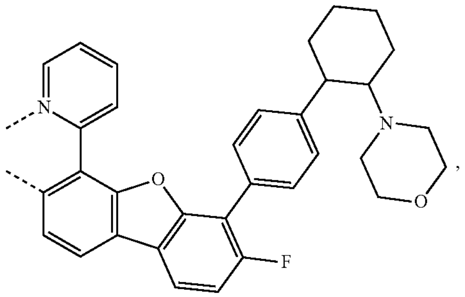
$L_{a571}$
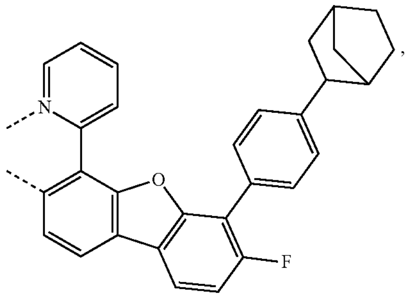
$L_{a572}$
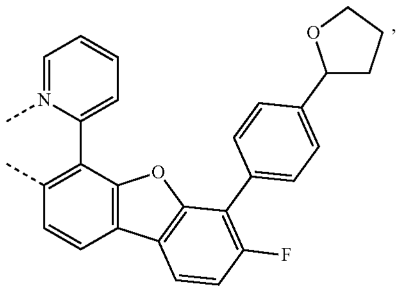
$L_{a573}$
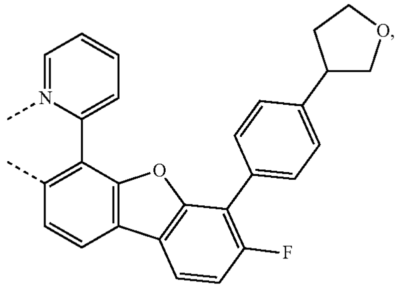
-continued
$L_{a574}$
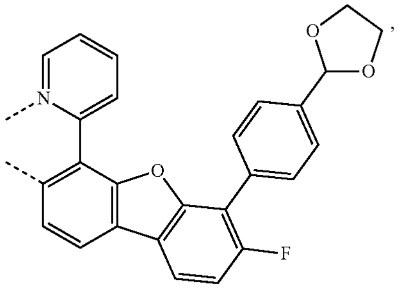
$L_{a575}$
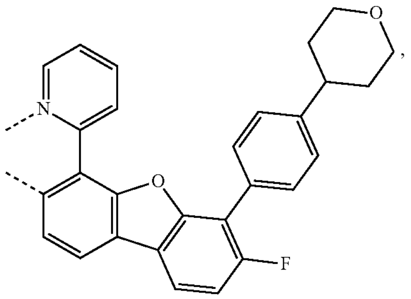
$L_{a576}$
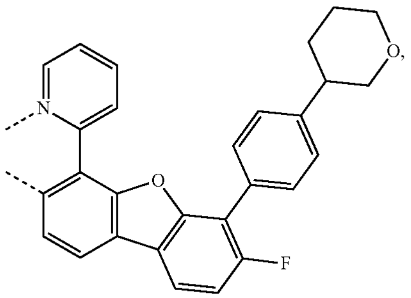
$L_{a577}$
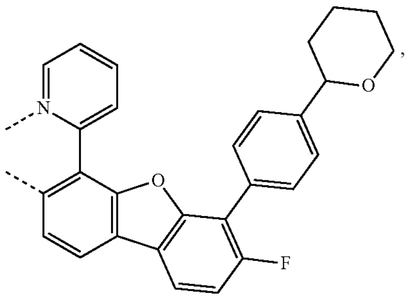
$L_{a578}$
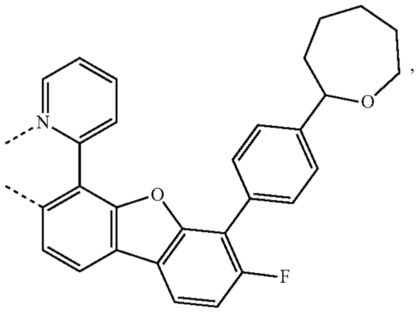

-continued
$L_{a579}$
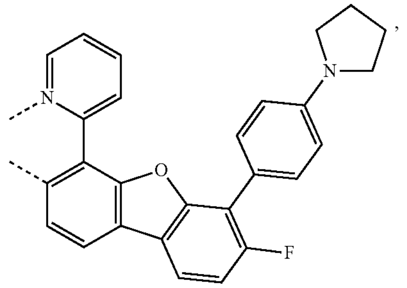
$L_{a580}$
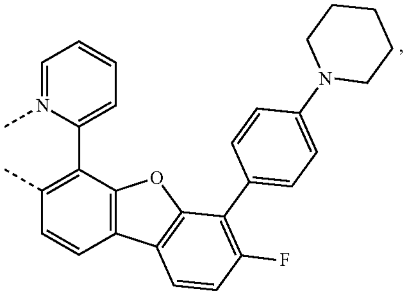
$L_{a581}$
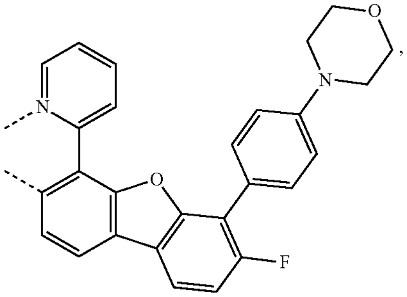
$L_{a582}$
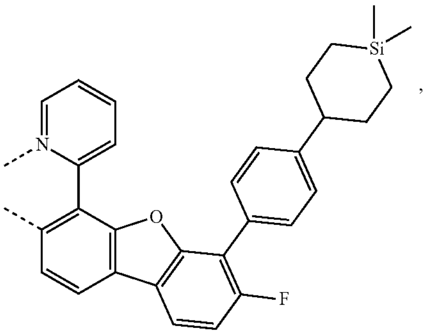
$L_{a596}$
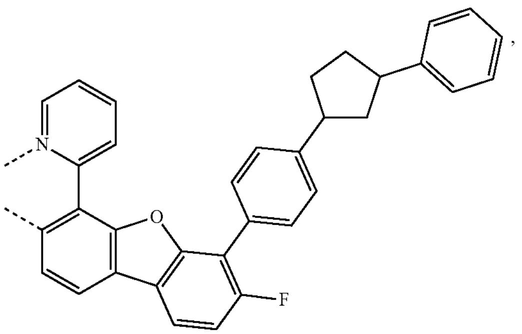
$L_{a597}$
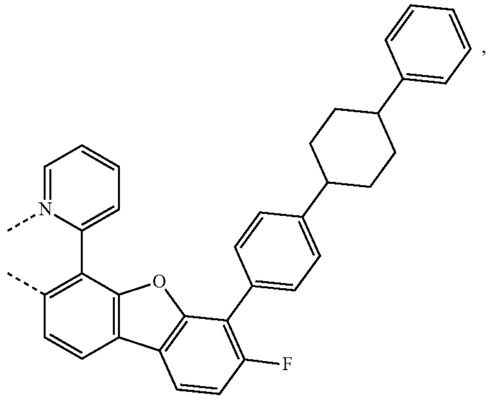
$L_{a598}$
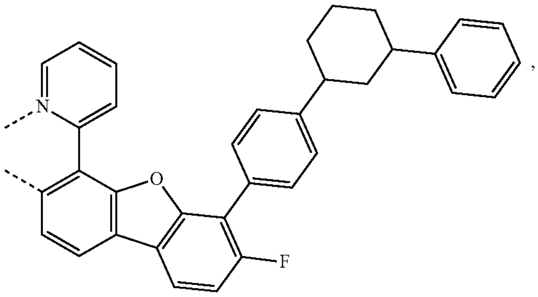
$L_{a599}$
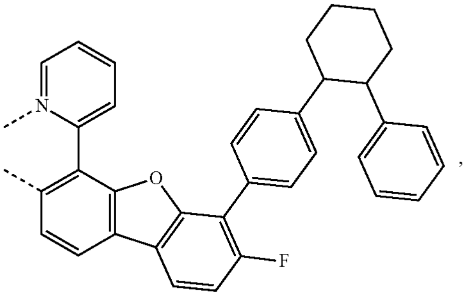

-continued
$L_{a603}$
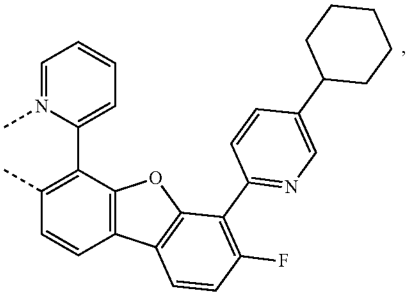
$L_{a604}$
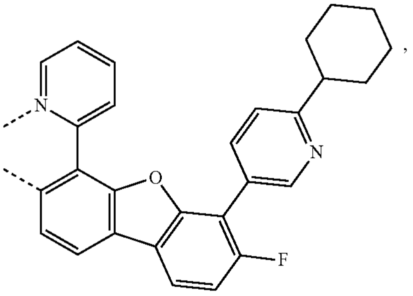
$L_{a605}$
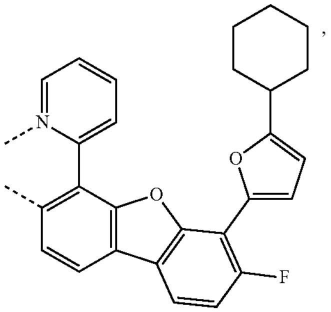
$L_{a606}$
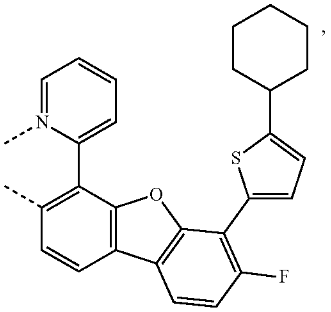
$L_{a607}$
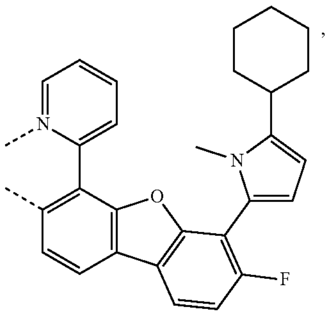
-continued
$L_{a616}$
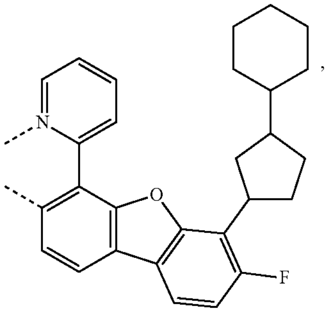
$L_{a617}$
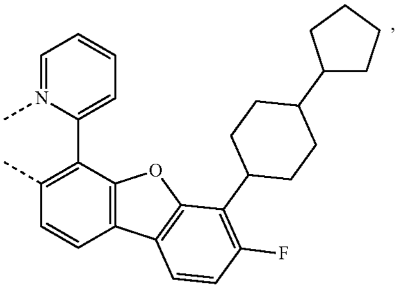
$L_{a618}$
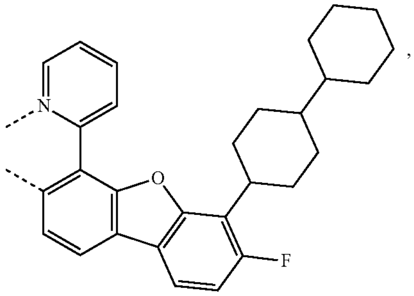
$L_{a619}$
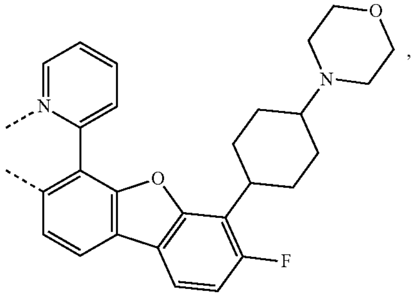
$L_{a647}$
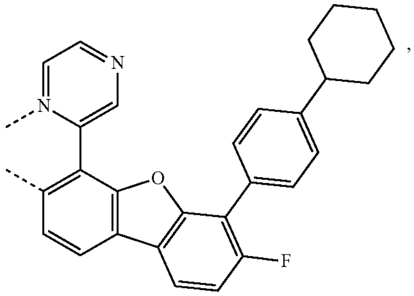

-continued
$L_{a648}$
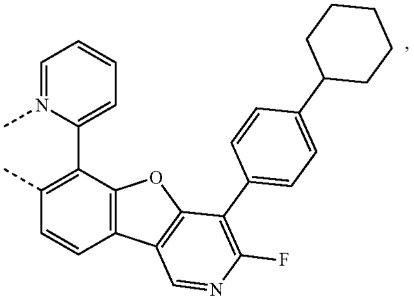
$L_{a649}$
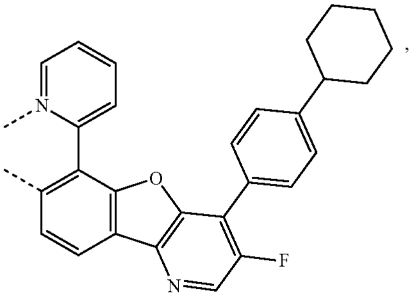
$L_{a650}$
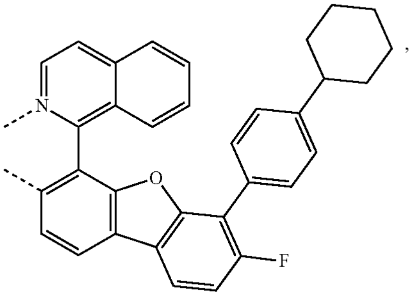
$L_{a651}$
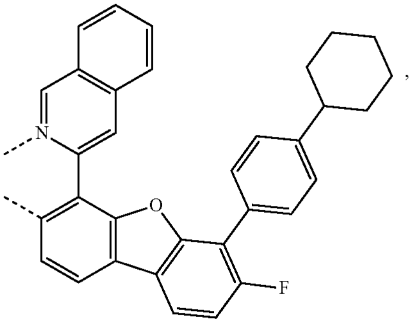
$L_{a652}$
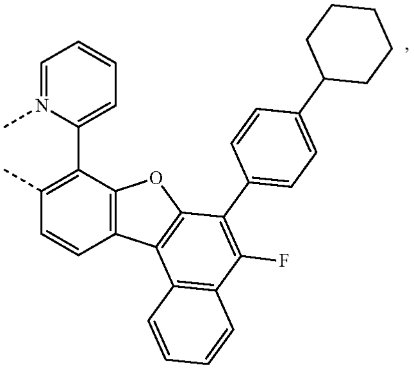
-continued
$L_{a653}$
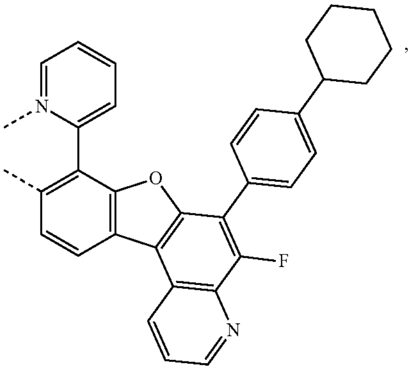
$L_{a654}$
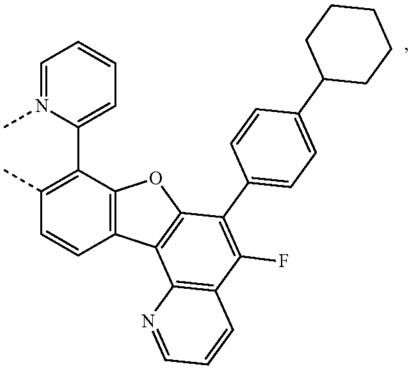
$L_{a655}$
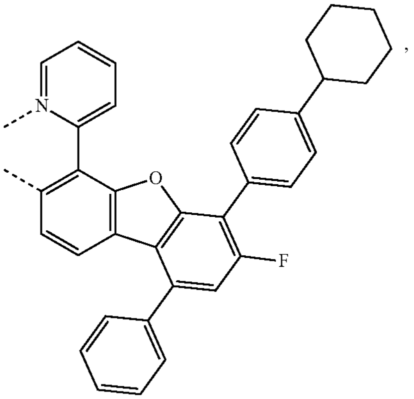
$L_{a658}$
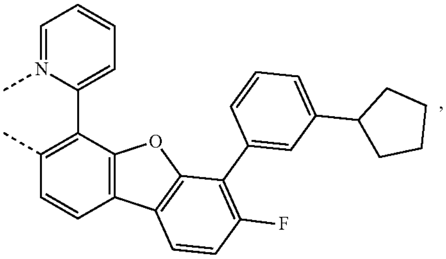

-continued
$L_{a659}$
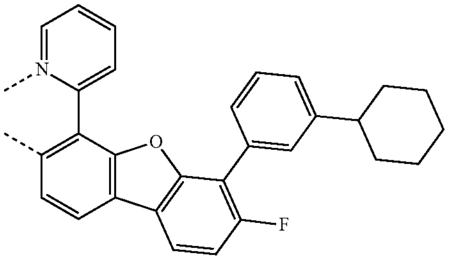
,
$L_{a660}$
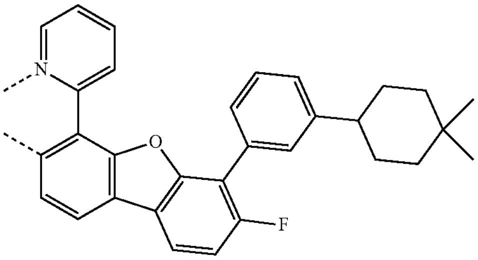
,
$L_{a661}$
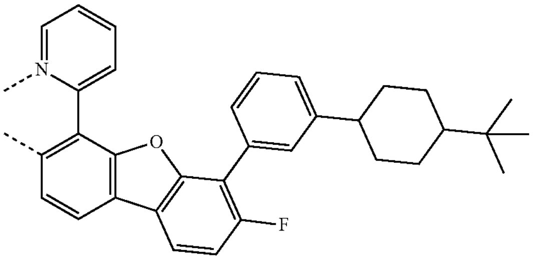
,
$L_{a662}$
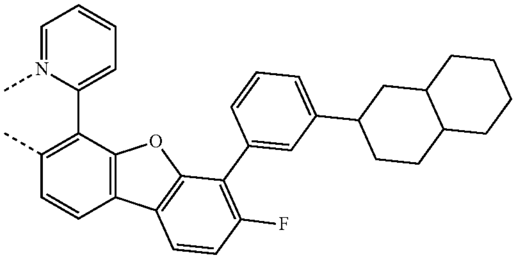
,
$L_{a663}$
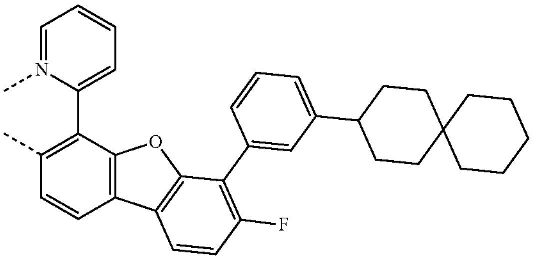
,
-continued
$L_{a664}$
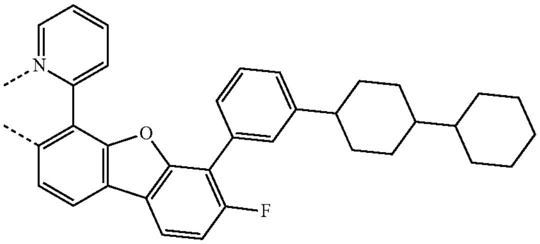
,
$L_{a665}$
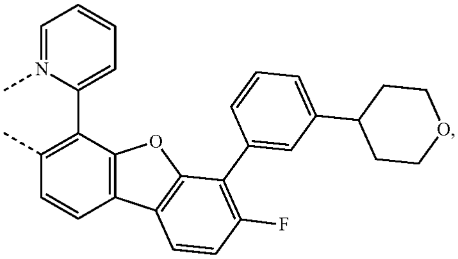
$L_{a670}$
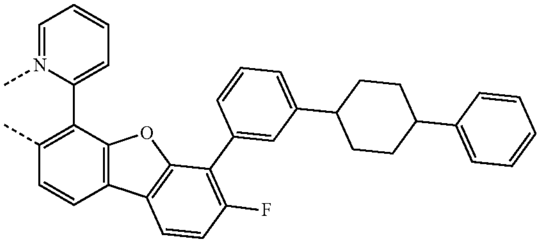
,
$L_{a671}$
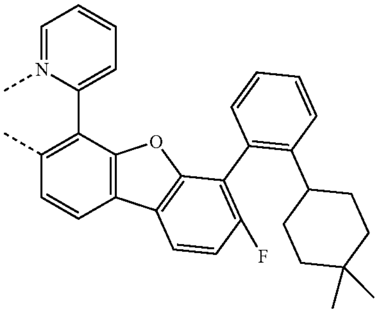
,
$L_{a672}$
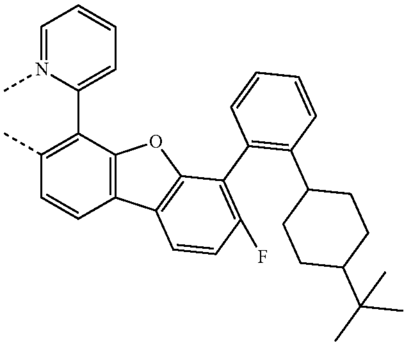
, -continued
L$_{a673}$
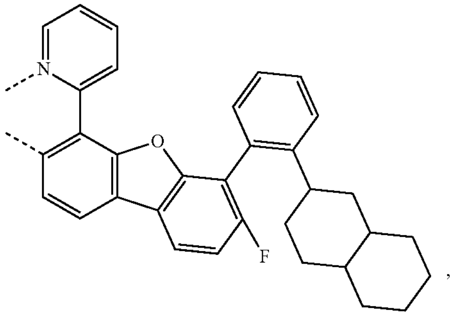
L$_{a674}$
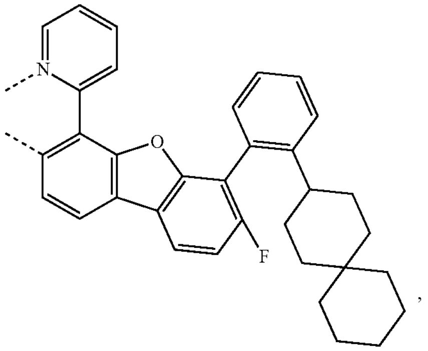
L$_{a675}$
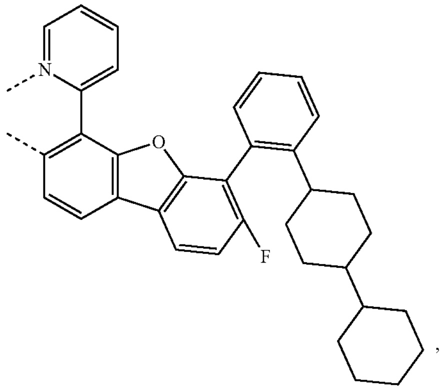
L$_{a676}$
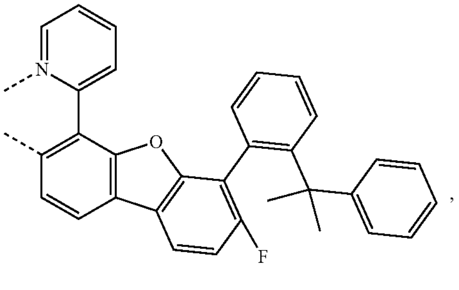
-continued
L$_{a678}$
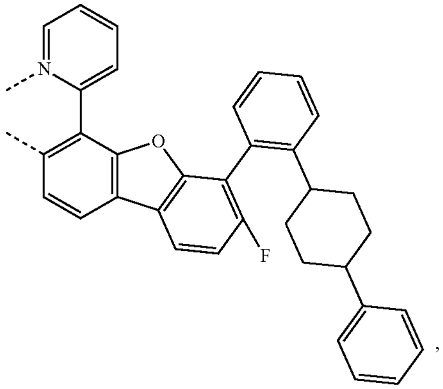
L$_{a679}$
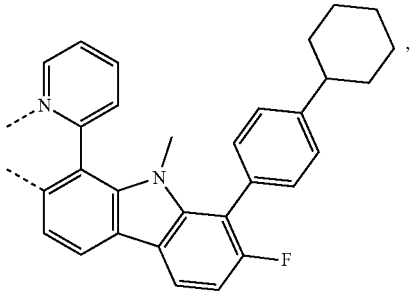
L$_{a680}$
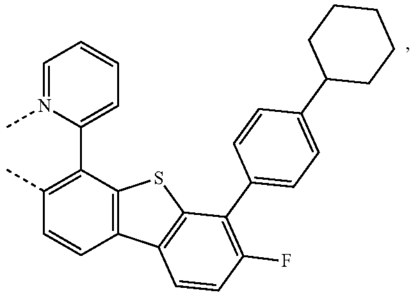
L$_{a681}$
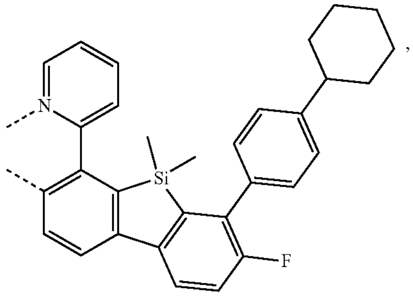
L$_{a682}$
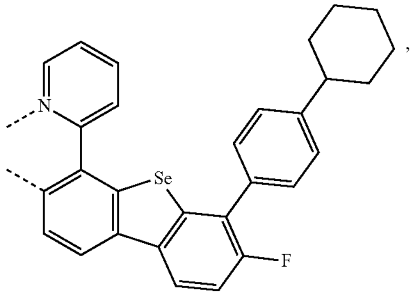

-continued
$L_{a683}$
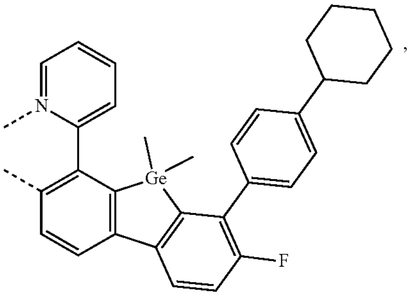
$L_{a684}$
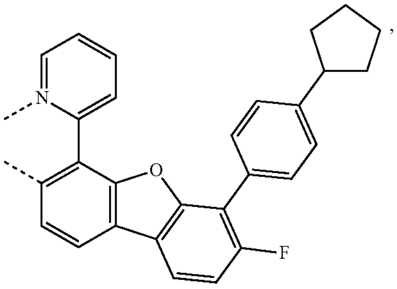
$L_{a685}$
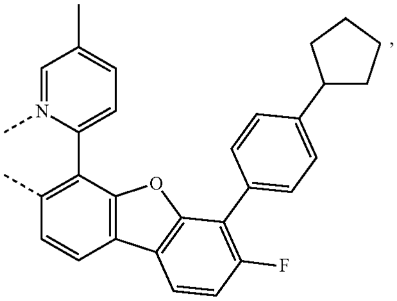
$L_{a686}$
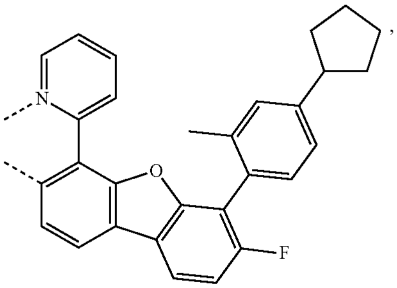
$L_{a687}$
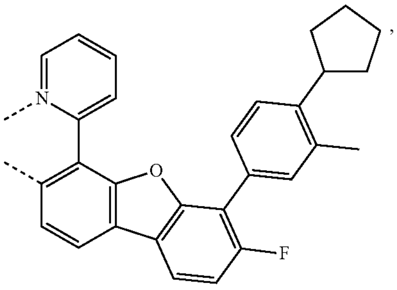
-continued
$L_{a688}$
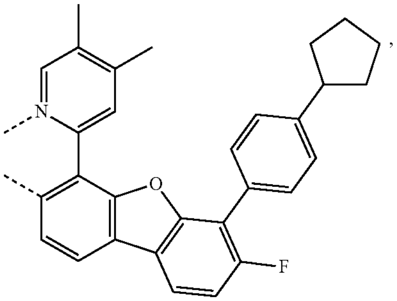
$L_{a689}$
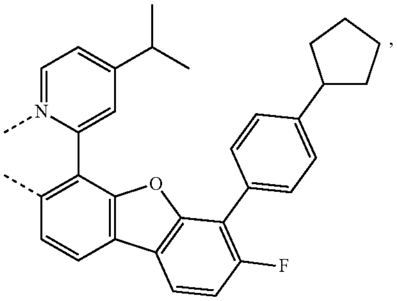
$L_{a690}$
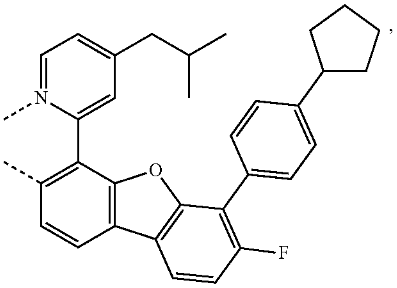
$L_{a691}$
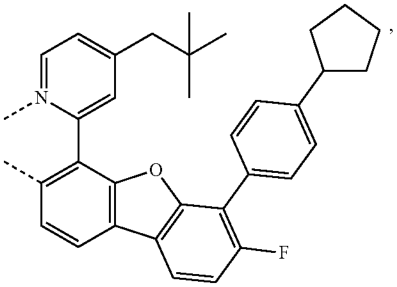
$L_{a692}$
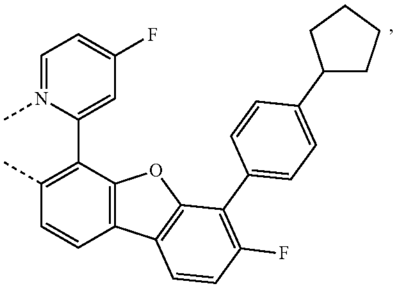

-continued
$L_{a693}$
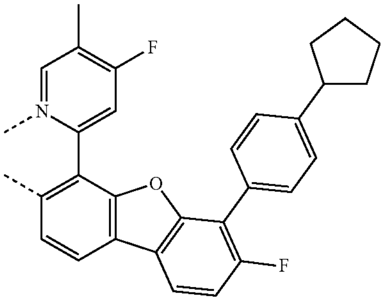
,
$L_{a694}$
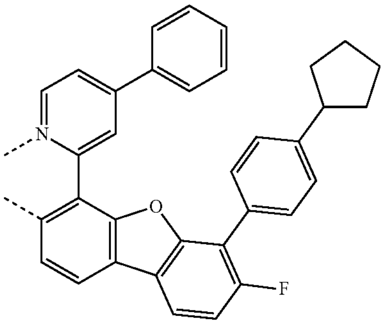
,
$L_{a695}$
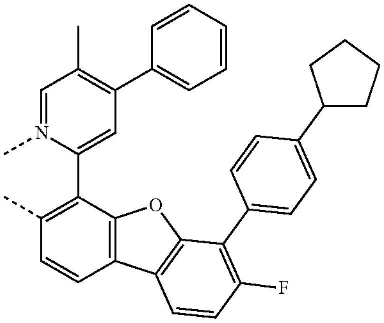
,
$L_{a696}$
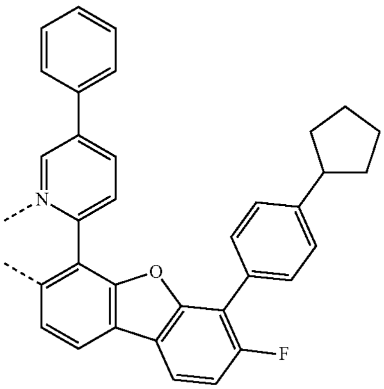
,
-continued
$L_{a697}$
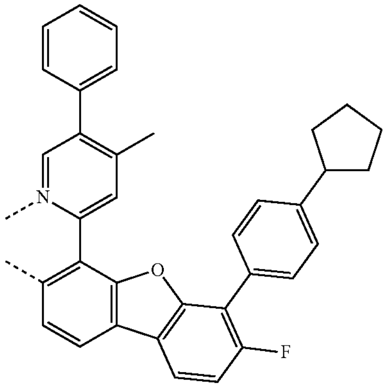
,
$L_{a698}$
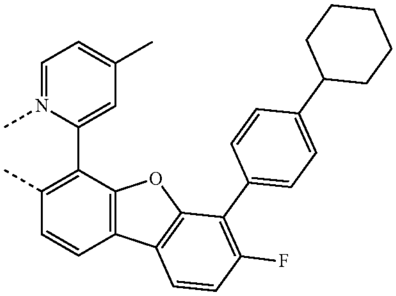
,
$L_{a699}$
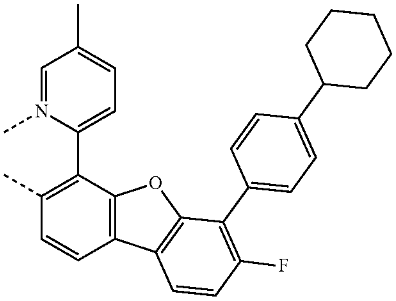
,
$L_{a700}$
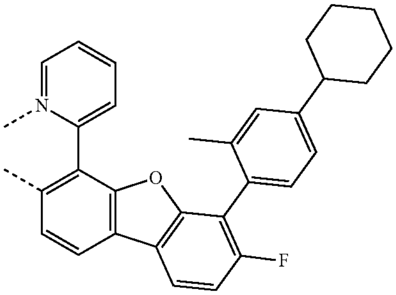
,
$L_{a701}$
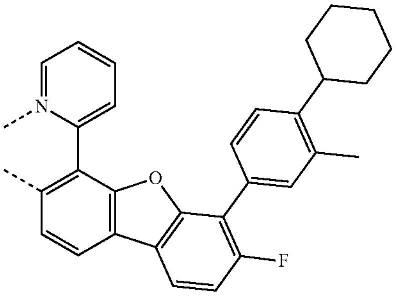
, -continued
$L_{a702}$
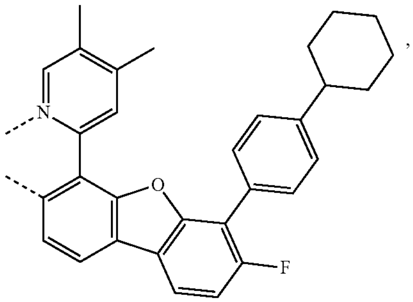
$L_{a703}$
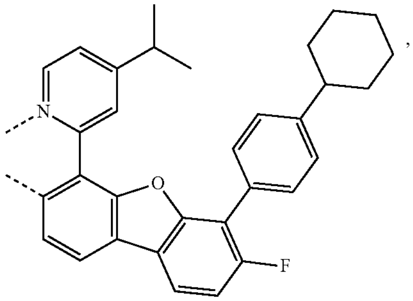
$L_{a704}$
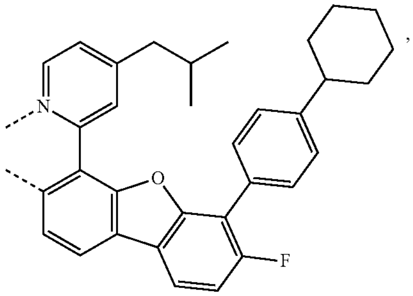
$L_{a705}$
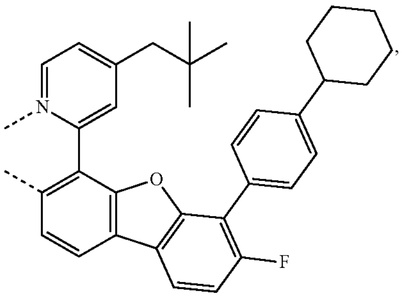
$L_{a706}$
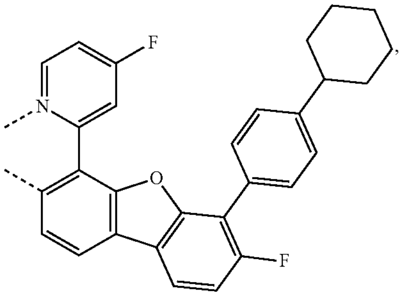
-continued
$L_{a707}$
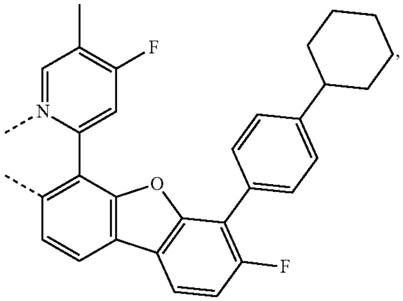
$L_{a708}$
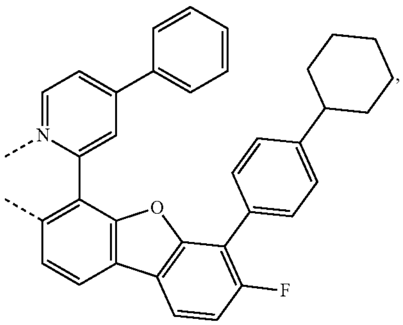
$L_{a709}$
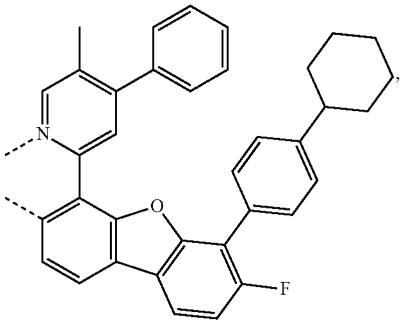
$L_{a710}$
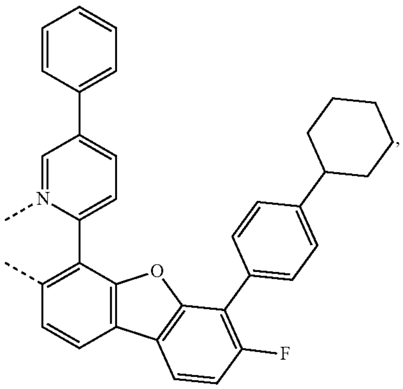

-continued
L$_{a711}$
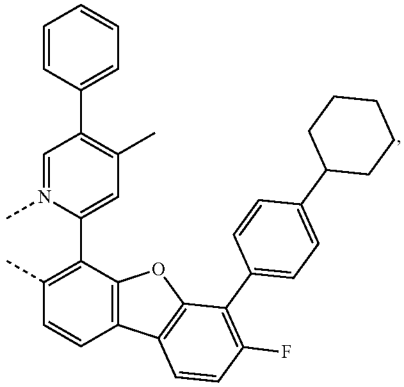
,
L$_{a712}$
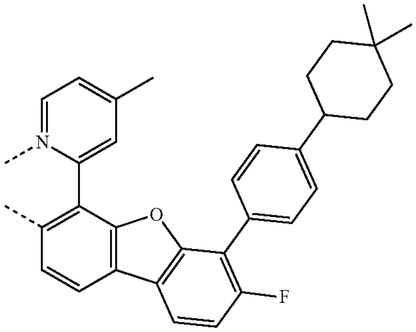
,
L$_{a713}$
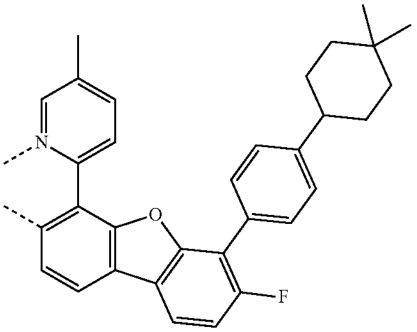
,
L$_{a714}$
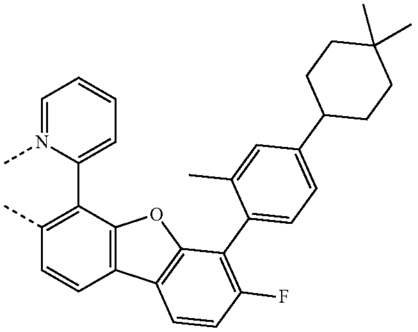
,
-continued
L$_{a715}$
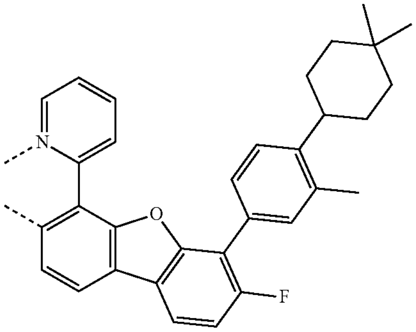
,
L$_{a716}$
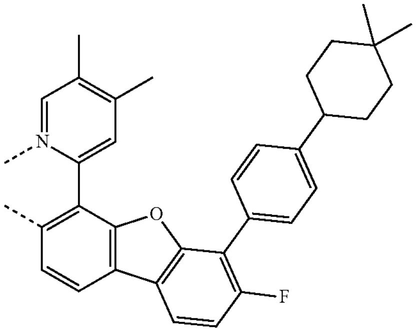
,
L$_{a717}$
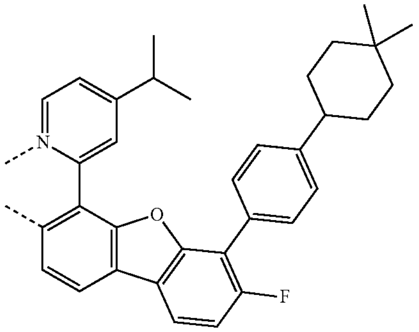
,
L$_{a718}$
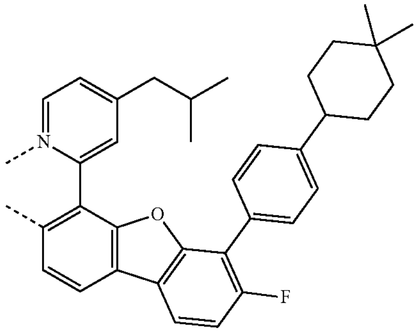
, -continued
$L_{a719}$
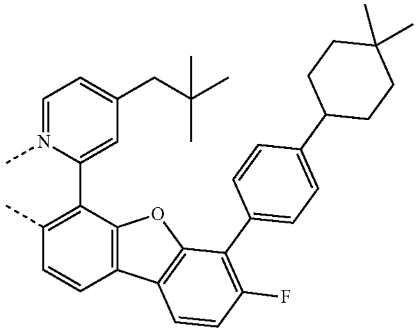
,
$L_{a720}$
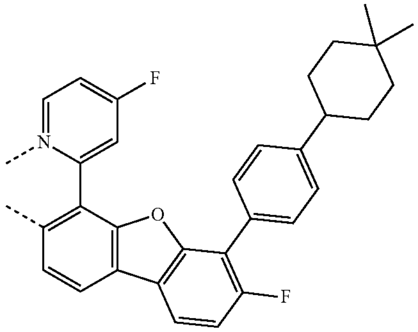
,
$L_{a721}$
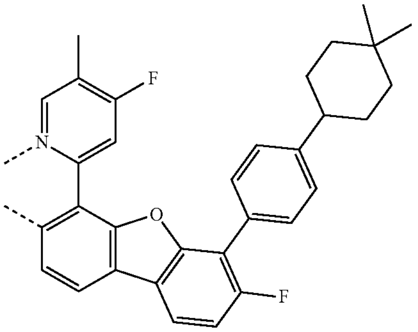
,
$L_{a722}$
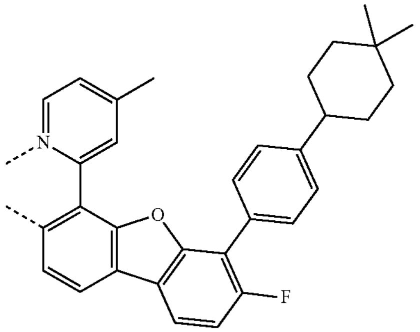
,
-continued
$L_{a723}$
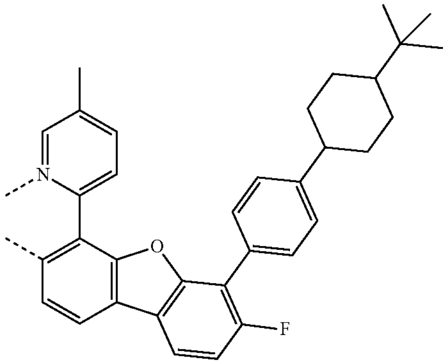
,
$L_{a724}$
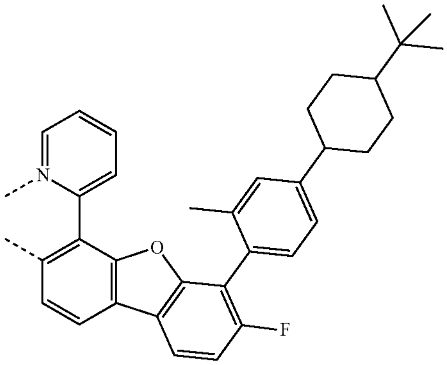
,
$L_{a725}$
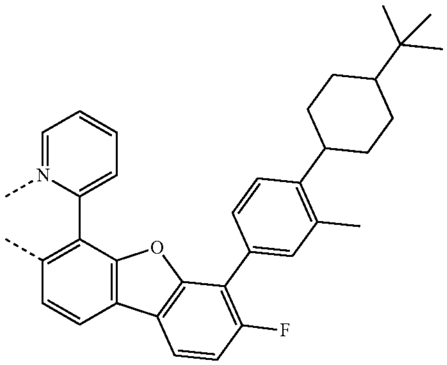
,
$L_{a726}$
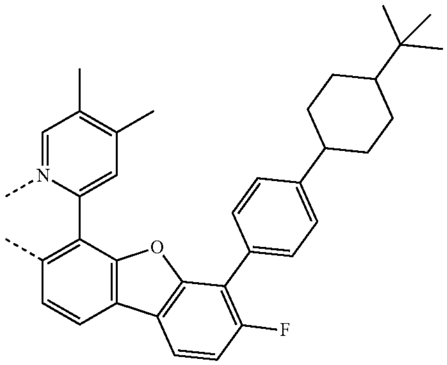
, L$_{a727}$
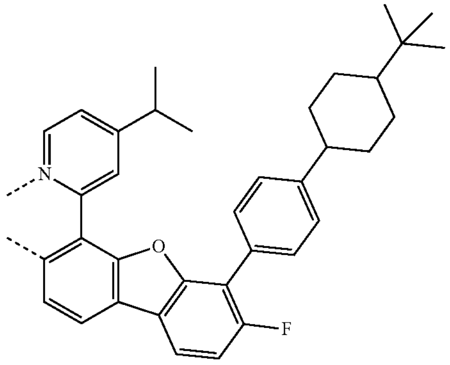
,
L$_{a728}$
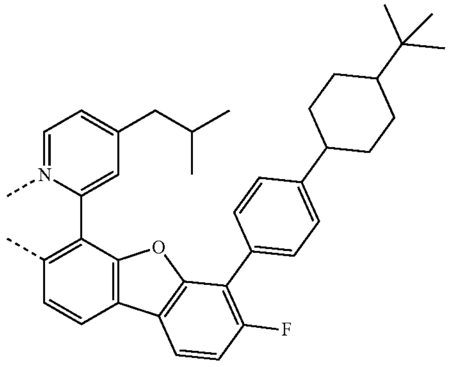
,
L$_{a729}$
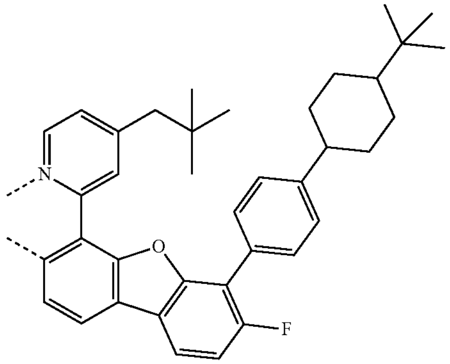
,
L$_{a730}$
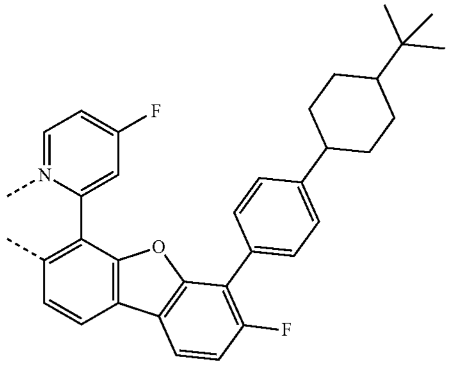
,
L$_{a731}$
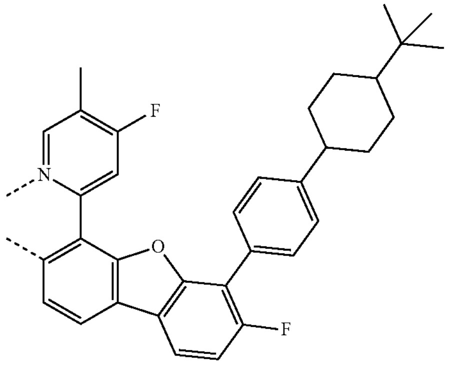
,
L$_{a732}$
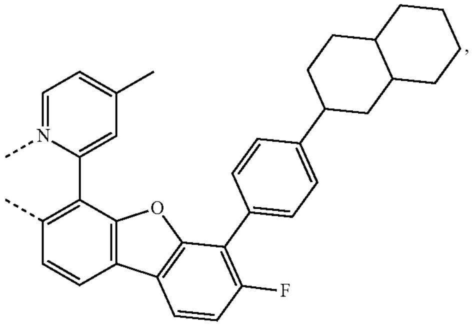
,
L$_{a733}$
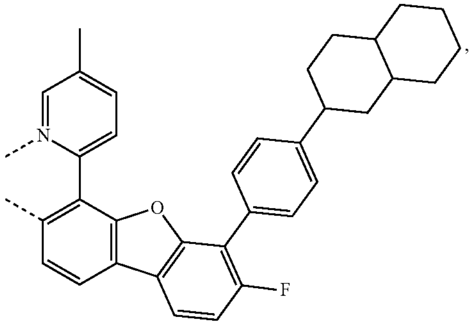
,
L$_{a734}$
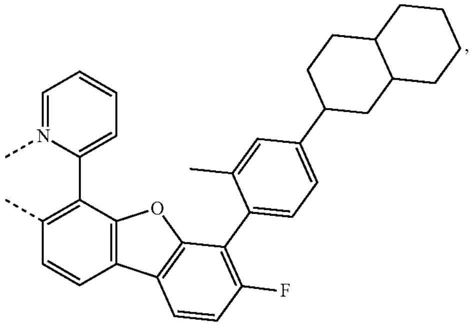
, -continued
L$_{a735}$
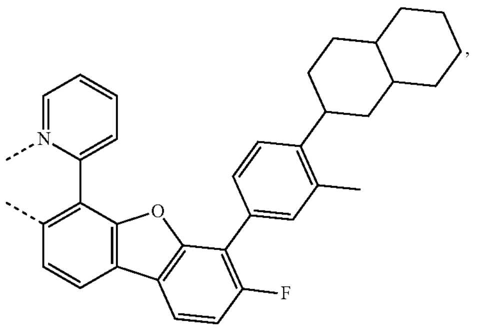
L$_{a736}$
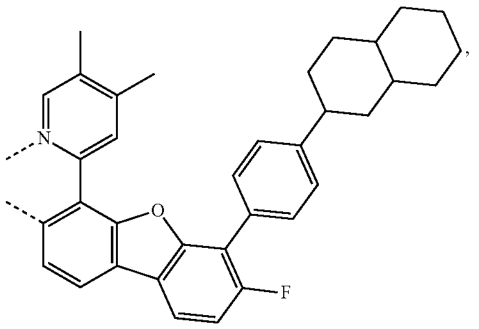
L$_{a737}$
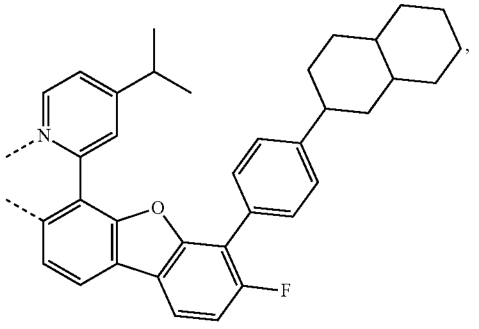
L$_{a738}$
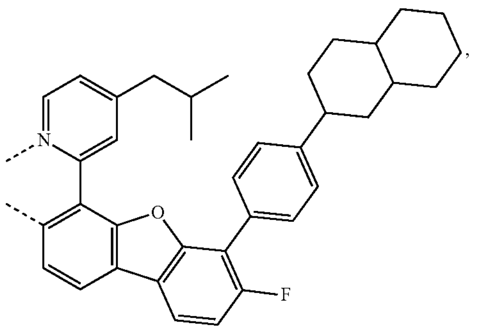
-continued
L$_{a739}$
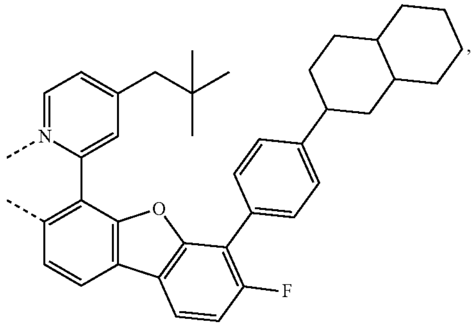
L$_{a740}$
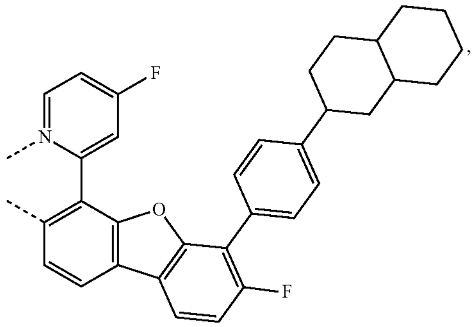
L$_{a741}$
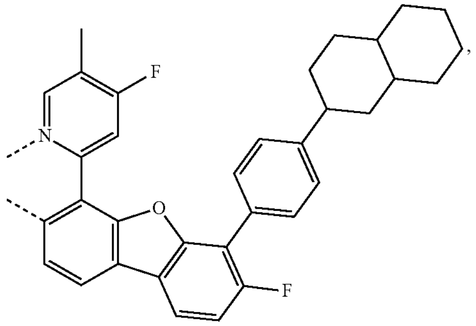
L$_{a742}$
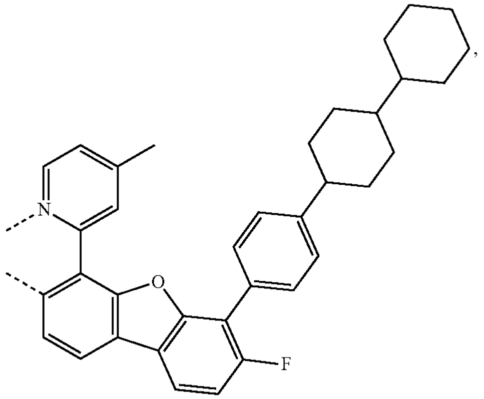

L$_{a743}$
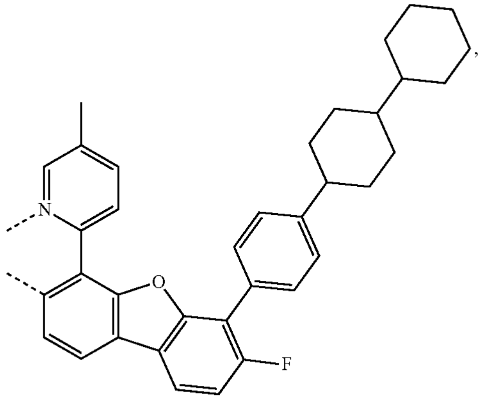
L$_{a744}$
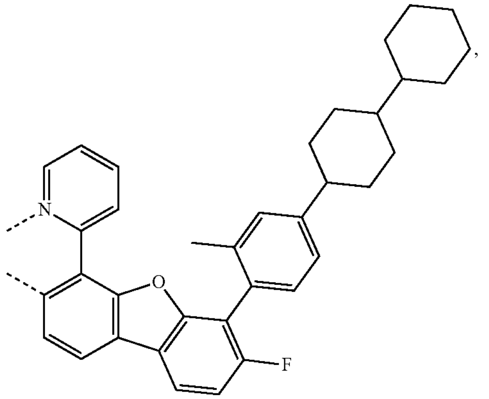
L$_{a745}$
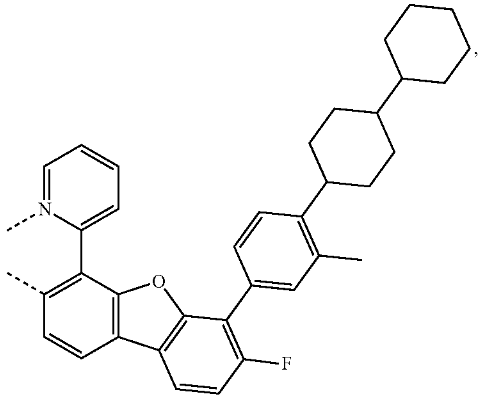
L$_{a746}$
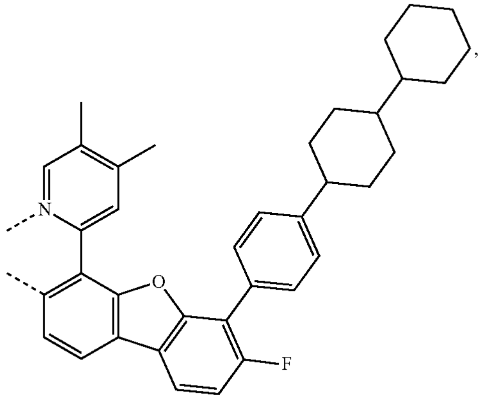
L$_{a747}$
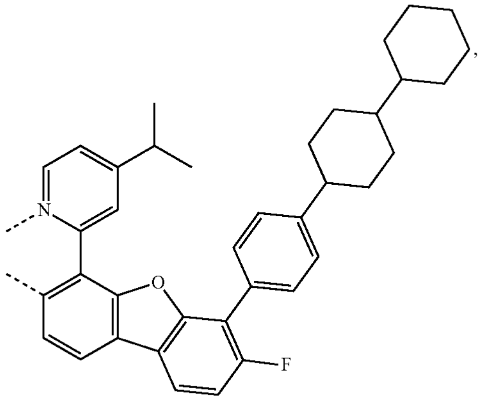
L$_{a748}$
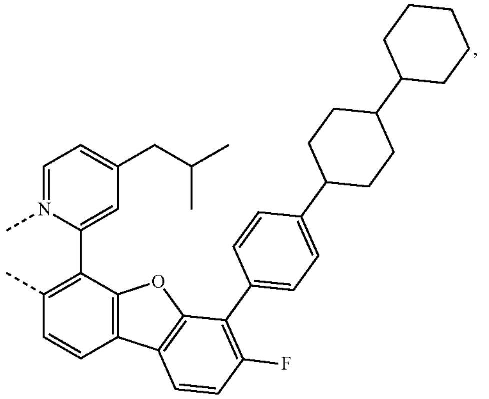
L$_{a749}$
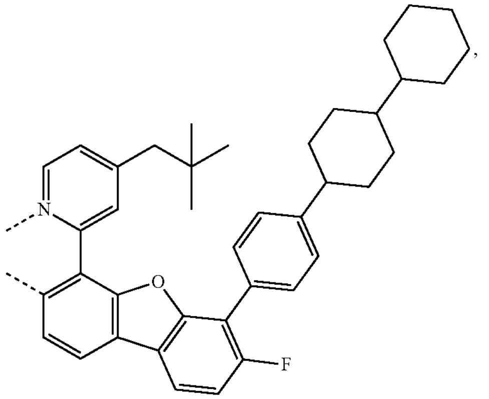
L$_{a750}$
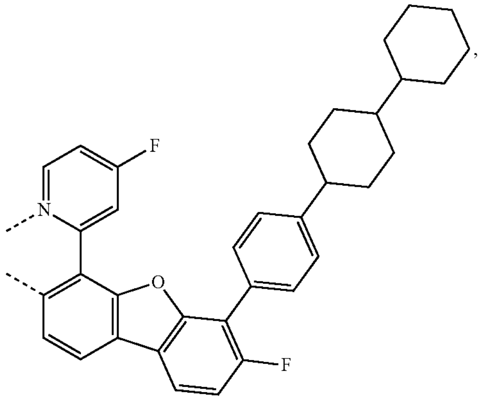

-continued
$L_{a751}$
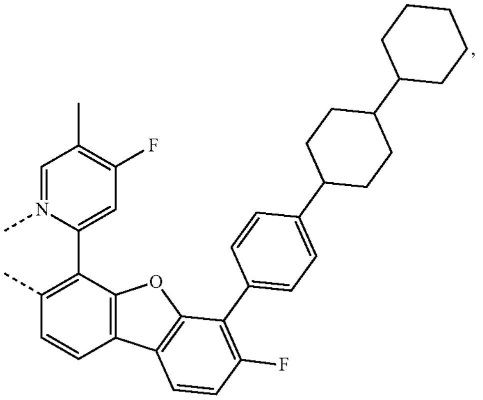
$L_{a752}$
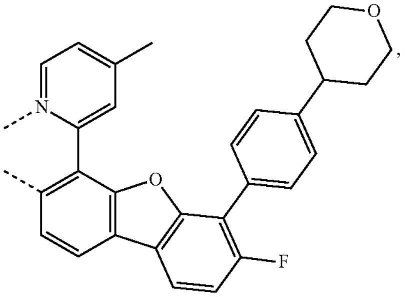
$L_{a753}$
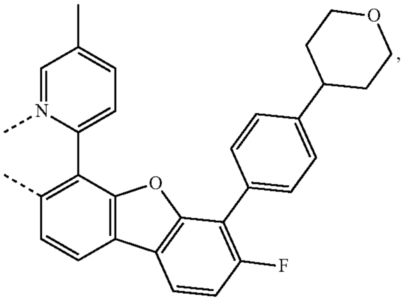
$L_{a754}$
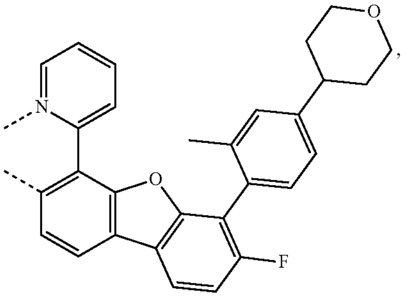
$L_{a755}$
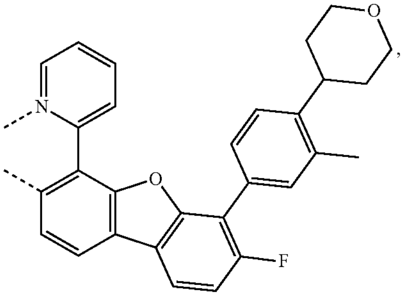
-continued
$L_{a756}$
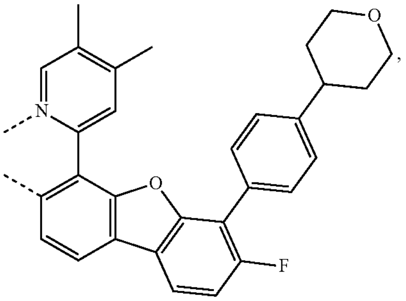
$L_{a757}$
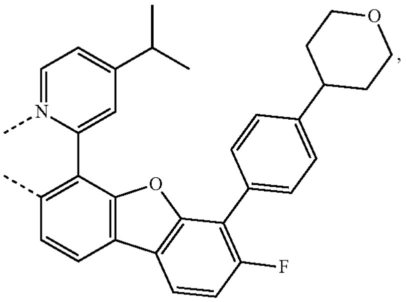
$L_{a758}$
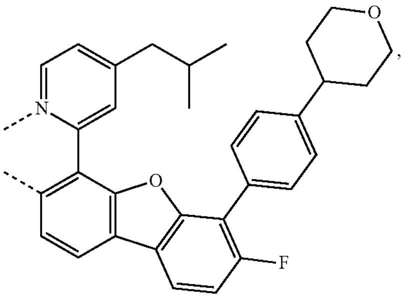
$L_{a759}$
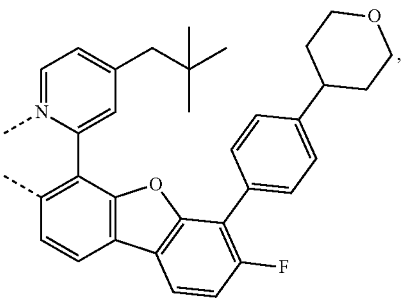
$L_{a760}$
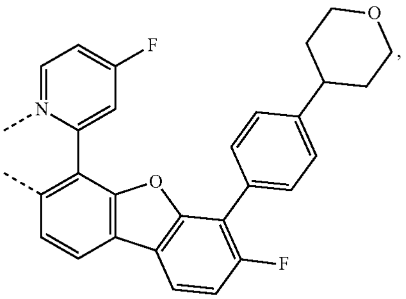

-continued
$L_{a761}$
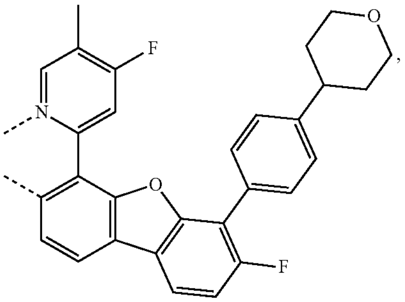
,
$L_{a782}$
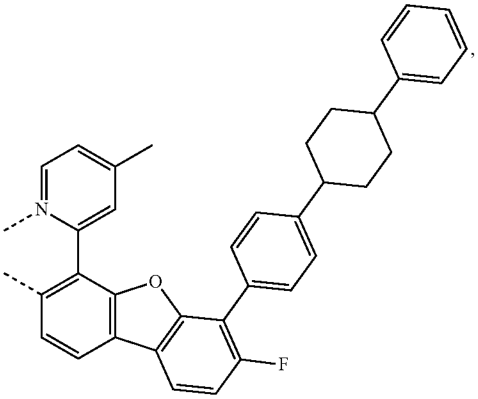
,
$L_{a783}$
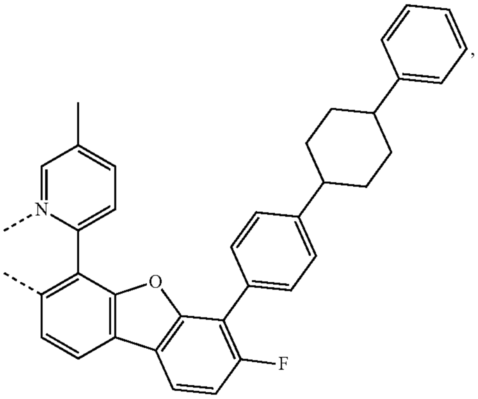
,
$L_{a784}$
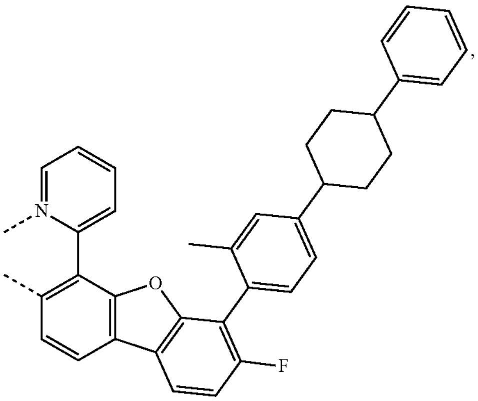
,
-continued
$L_{a785}$
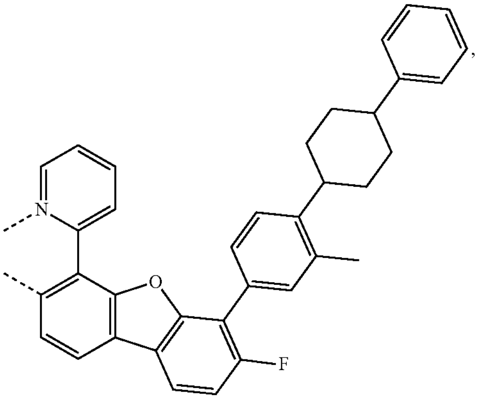
,
$L_{a786}$
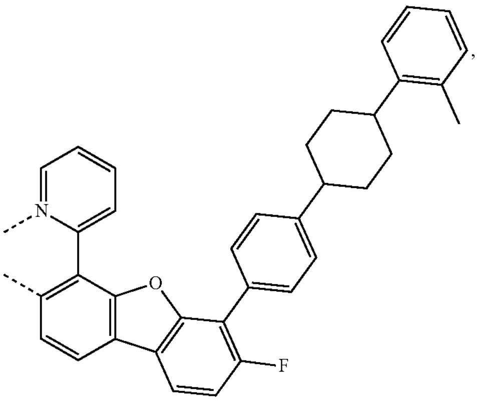
,
$L_{a787}$
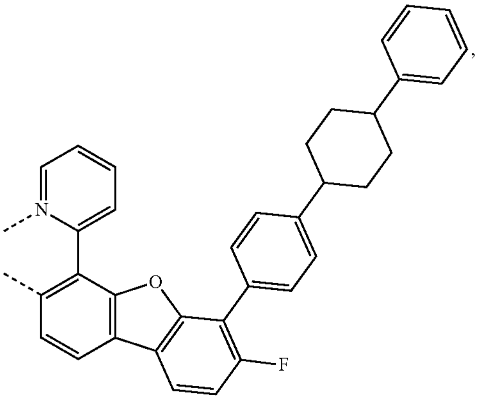
,
$L_{a788}$
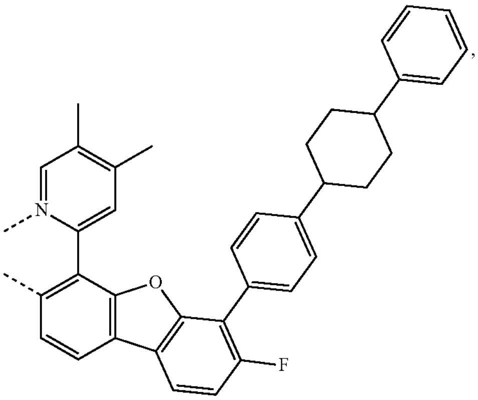
, -continued
$L_{a789}$
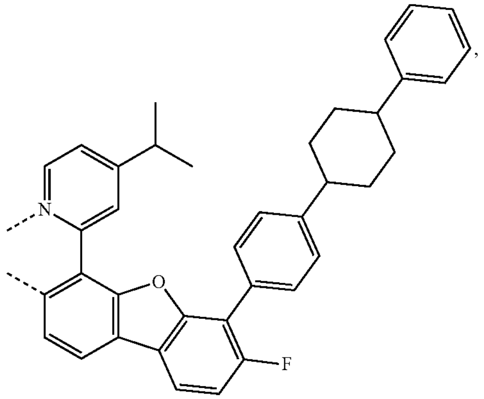
$L_{a790}$
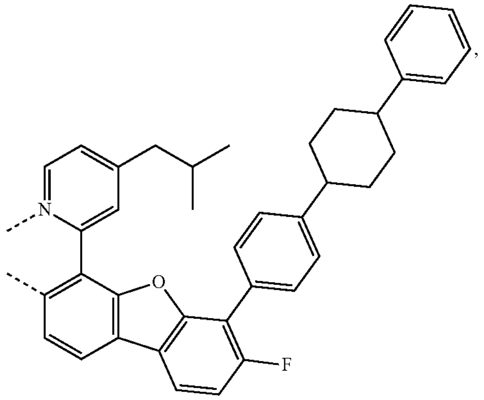
$L_{a791}$
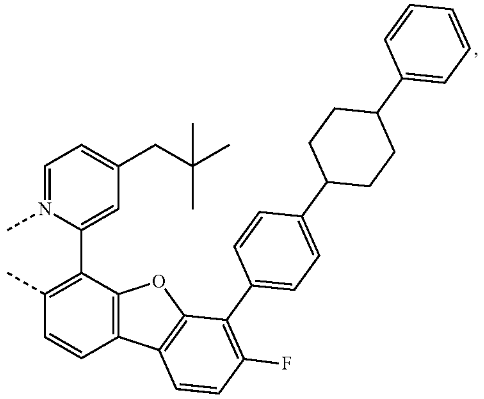
$L_{a792}$
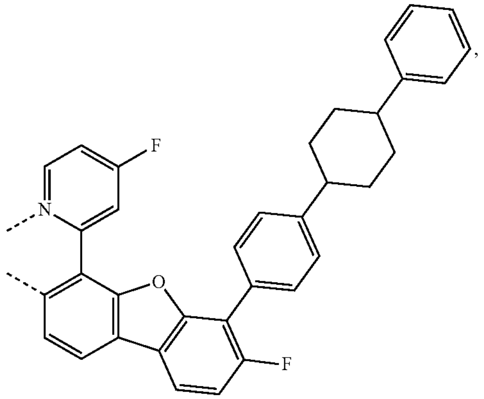
-continued
$L_{a793}$
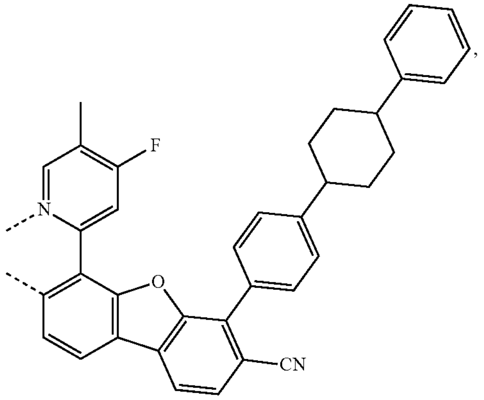
$L_{a804}$
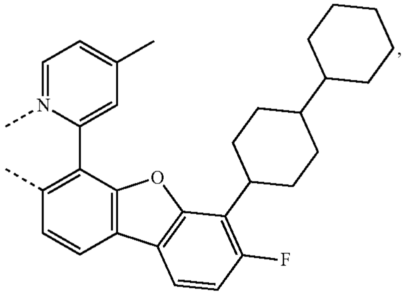
$L_{a805}$
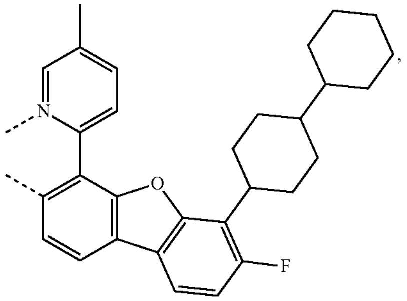
$L_{a806}$
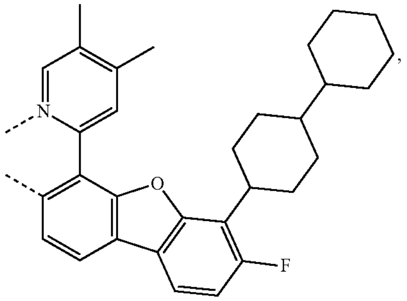
$L_{a807}$
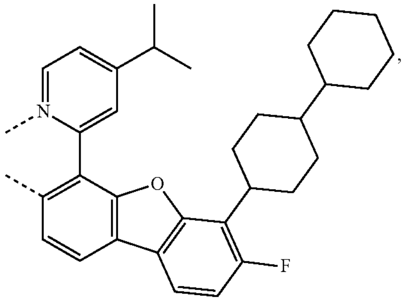

-continued
$L_{a808}$
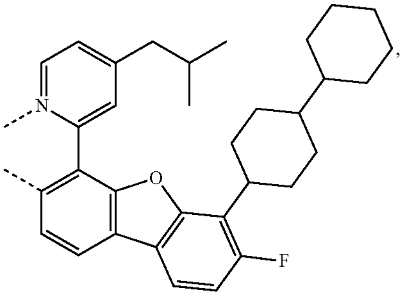
$L_{a809}$
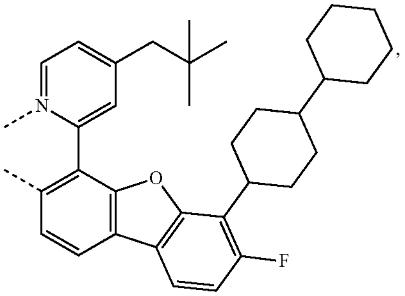
$L_{a810}$
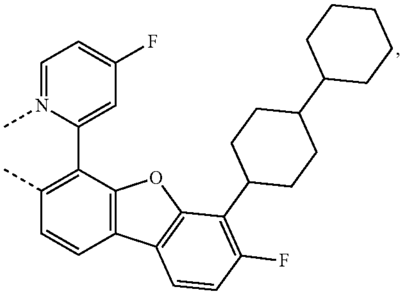
$L_{a811}$
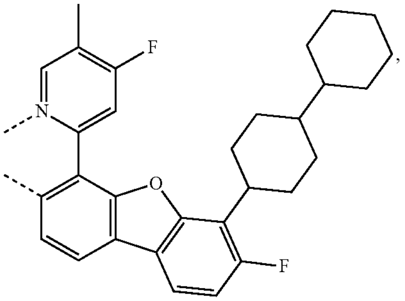
$L_{a812}$
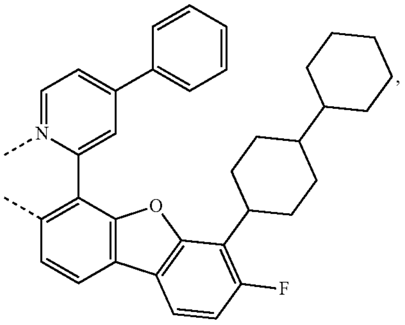
-continued
$L_{a813}$
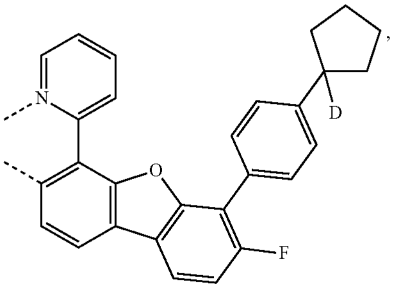
$L_{a814}$
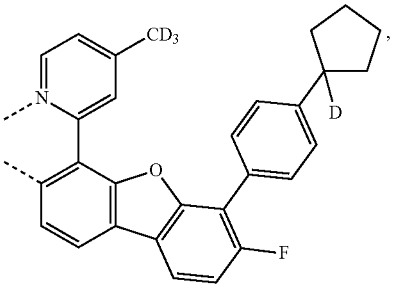
$L_{a815}$
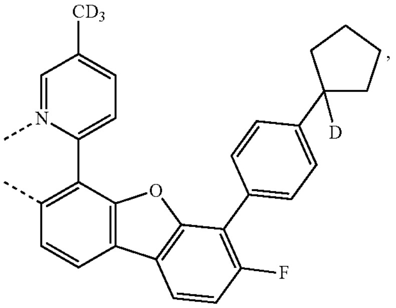
$L_{a816}$
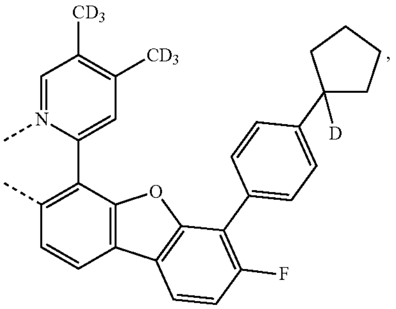
$L_{a817}$
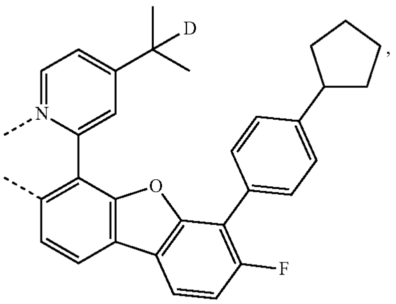

-continued
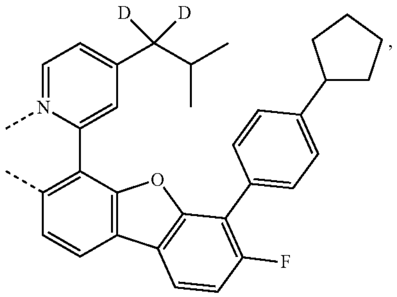
$L_{a818}$
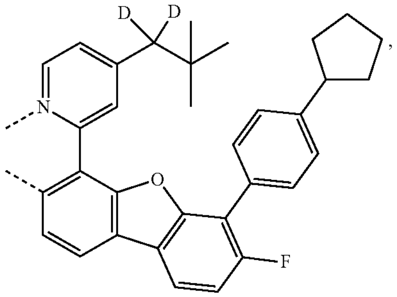
$L_{a819}$
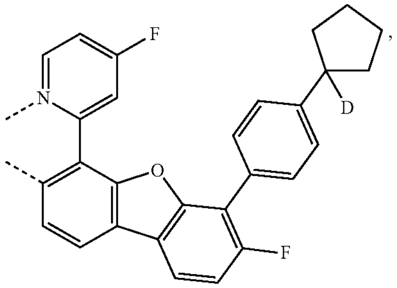
$L_{a820}$
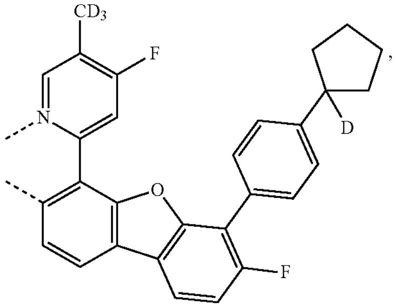
$L_{a821}$
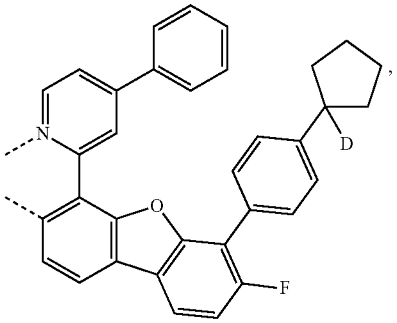
$L_{a822}$
-continued
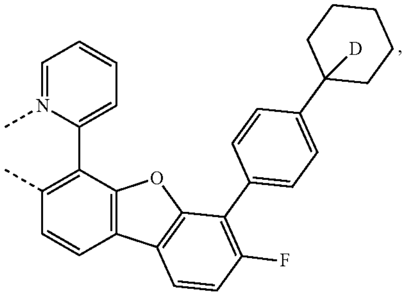
$L_{a823}$
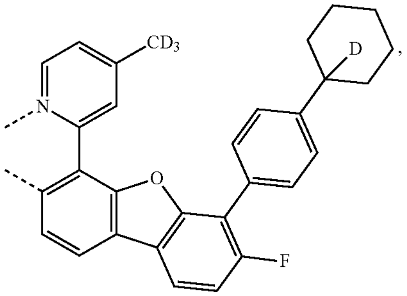
$L_{a824}$
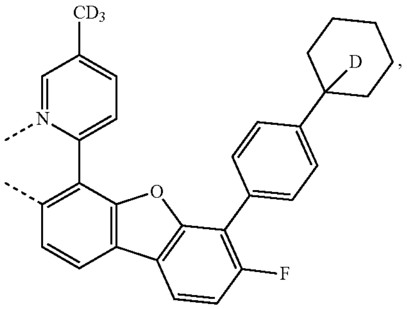
$L_{a825}$
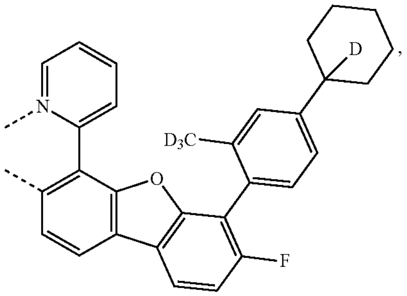
$L_{a826}$
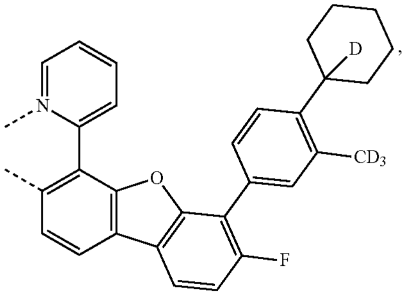
$L_{a827}$ -continued
$L_{a828}$
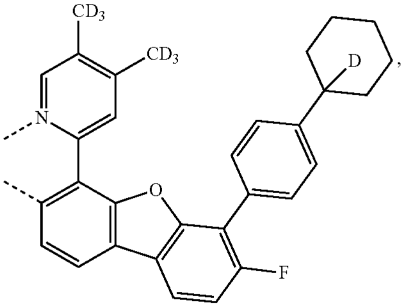
,
$L_{a829}$
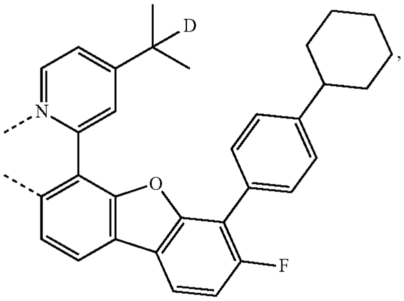
,
$L_{a830}$
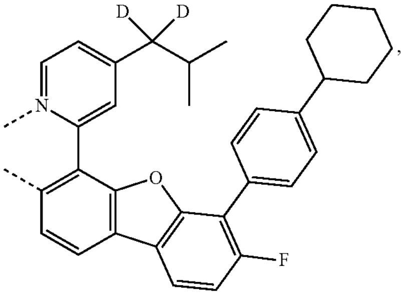
,
$L_{a831}$
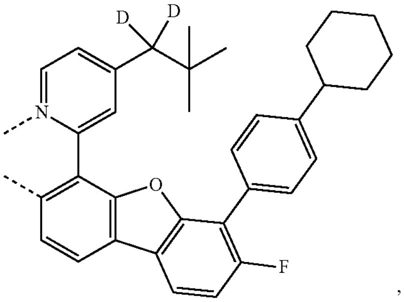
,
$L_{a832}$
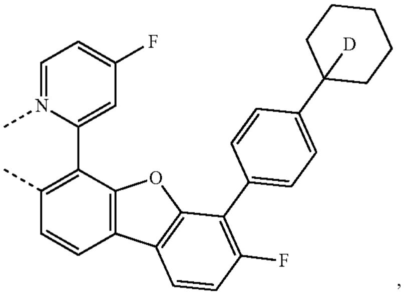
,
-continued
$L_{a833}$
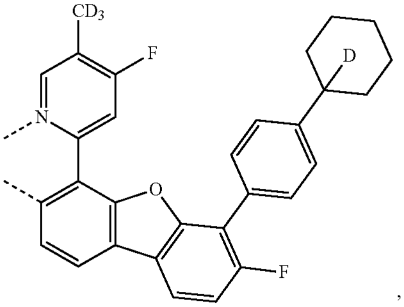
,
$L_{a834}$
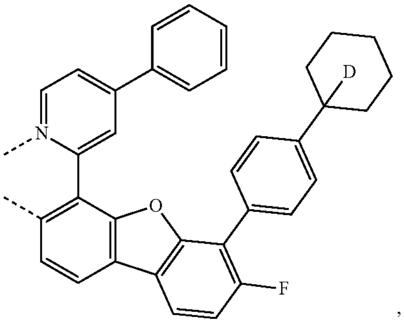
,
$L_{a835}$
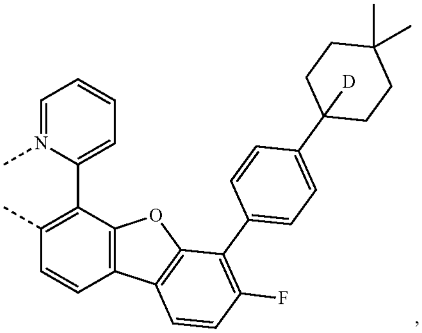
,
$L_{a836}$
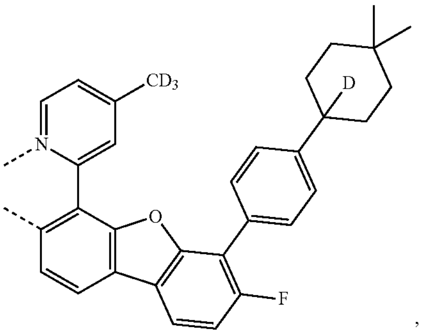
, -continued
$L_{a837}$
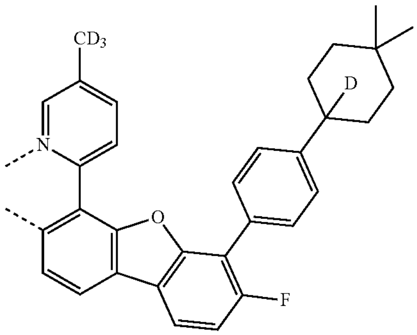
,
$L_{a838}$
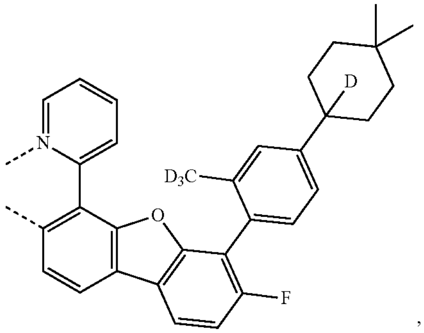
,
$L_{a839}$
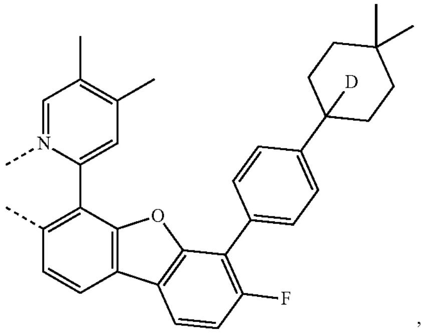
,
$L_{a840}$
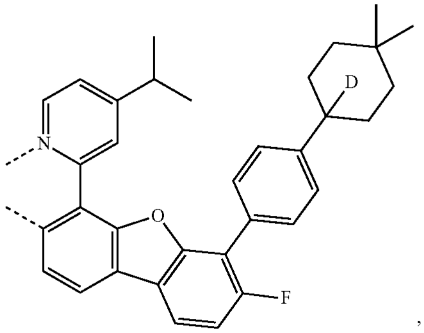
,
-continued
$L_{a841}$
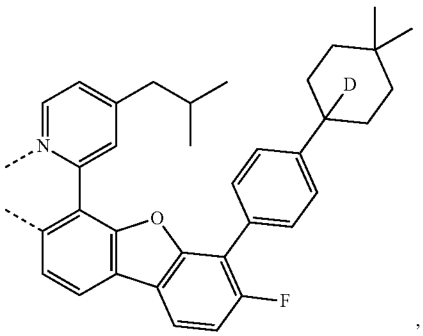
,
$L_{a842}$
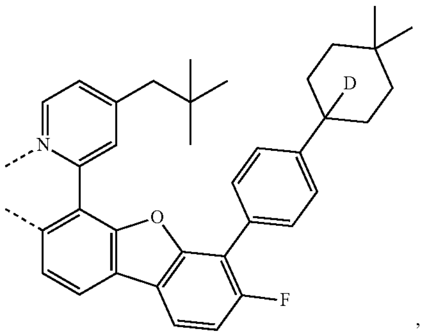
,
$L_{a843}$
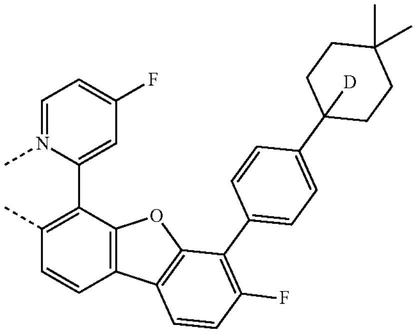
,
$L_{a844}$
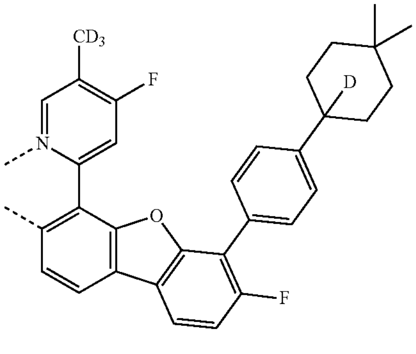
, -continued
$L_{a845}$
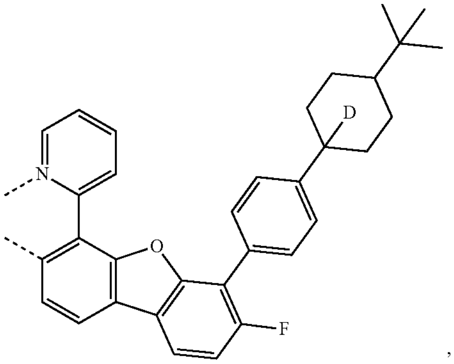
,
$L_{a846}$
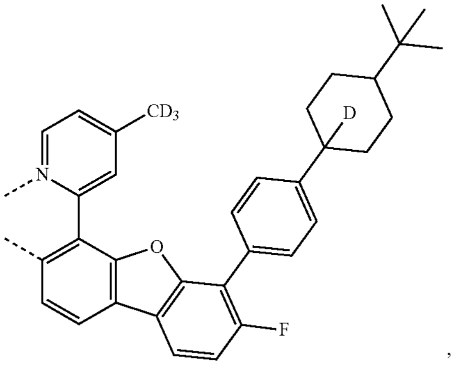
,
$L_{a847}$
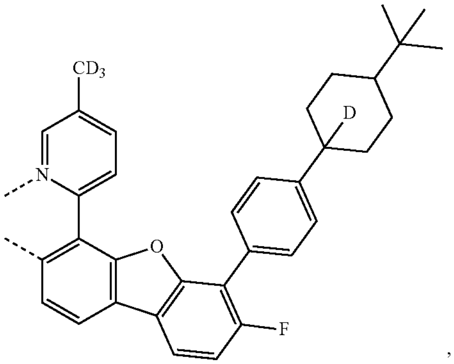
,
$L_{a848}$
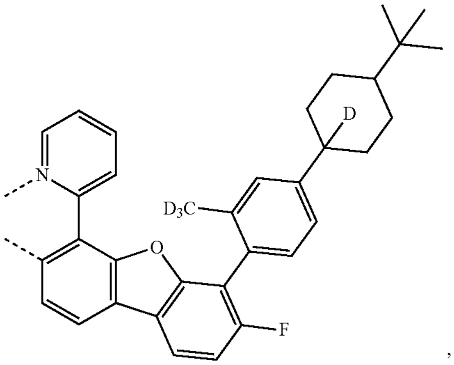
,
-continued
$L_{a849}$
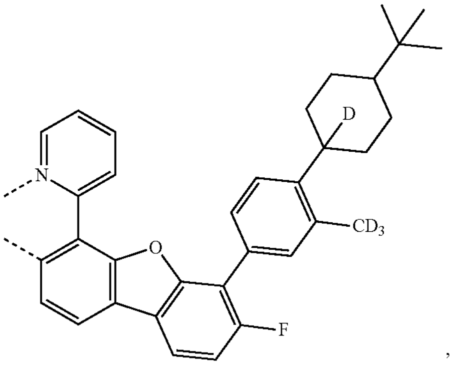
,
$L_{a850}$
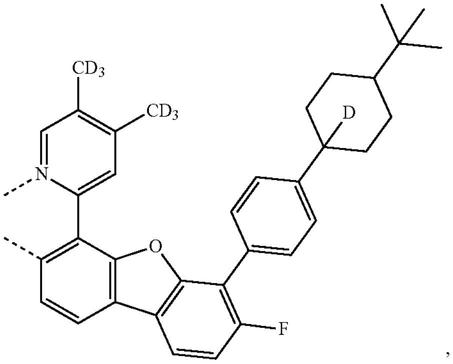
,
$L_{a851}$
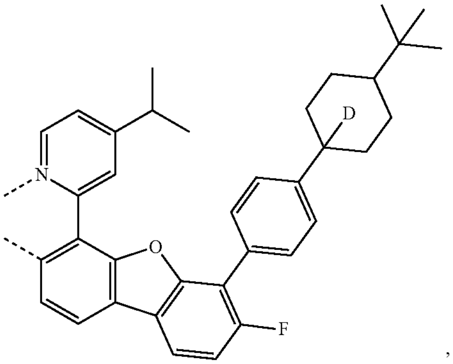
,
$L_{a852}$
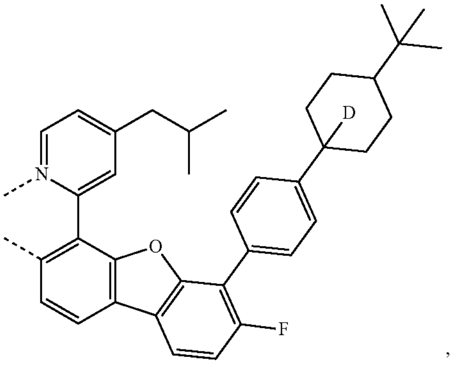
, -continued
$L_{a853}$
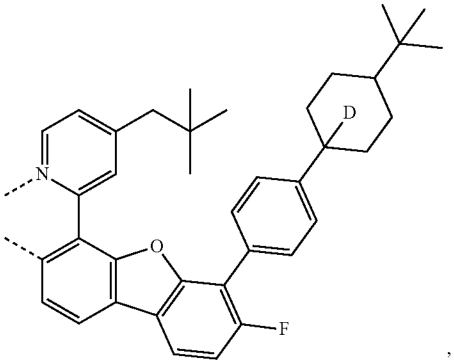
,
$L_{a854}$
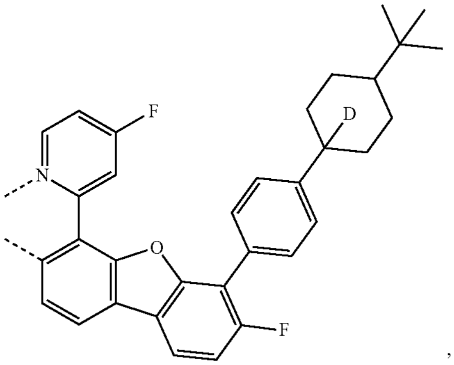
,
$L_{a855}$
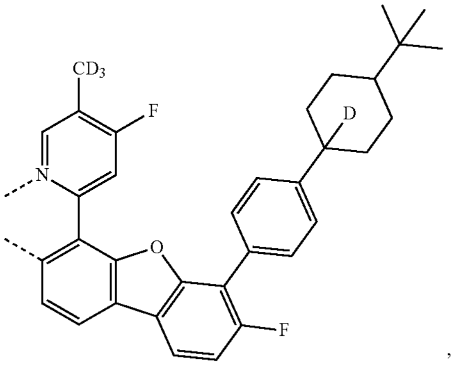
,
$L_{a856}$
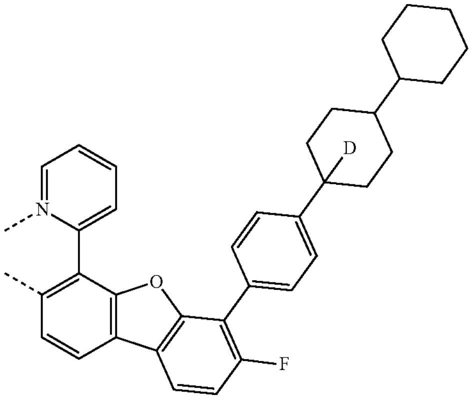
,
-continued
$L_{a857}$
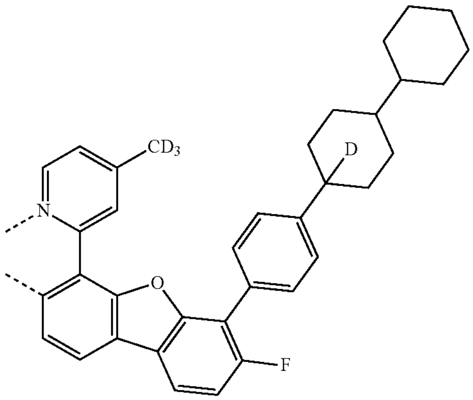
,
$L_{a858}$
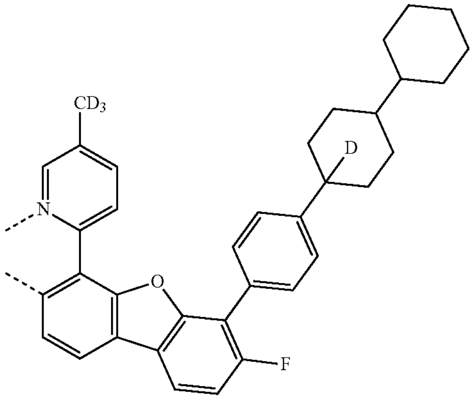
,
$L_{a859}$
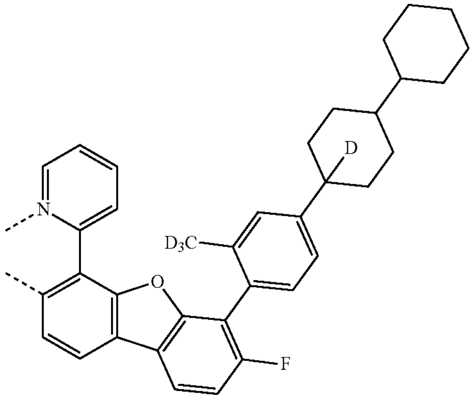
,
$L_{a860}$
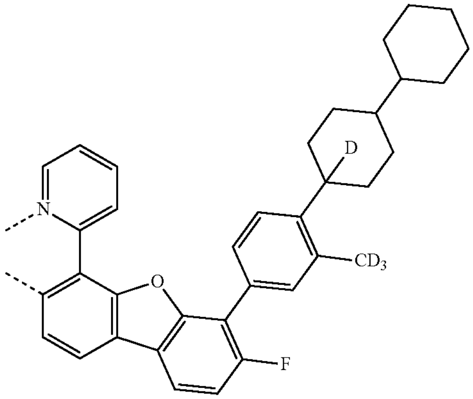
, -continued
$L_{a861}$
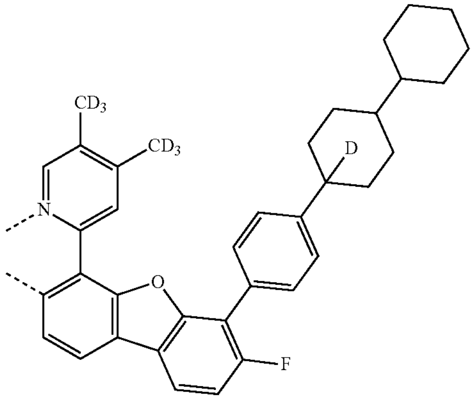
,
$L_{a862}$
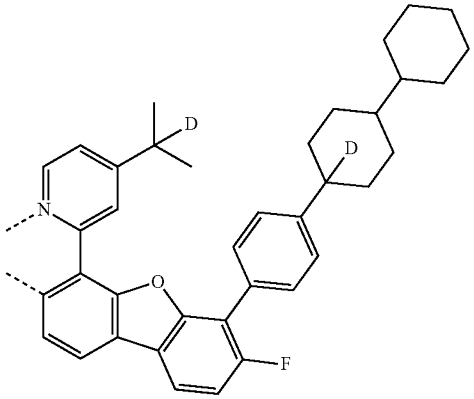
,
$L_{a863}$
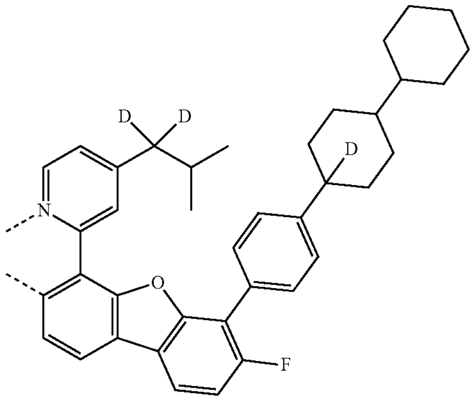
,
$L_{a864}$
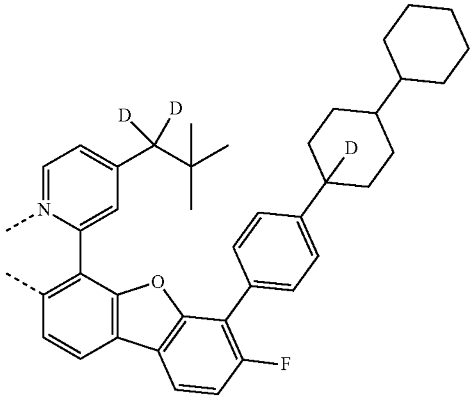
,
-continued
$L_{a865}$
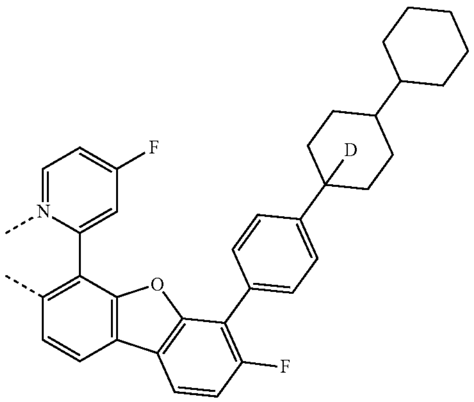
,
$L_{a866}$
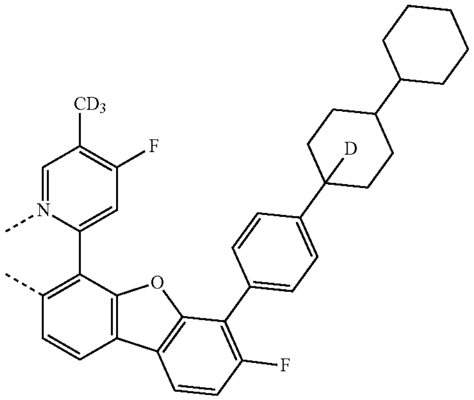
,
$L_{a867}$
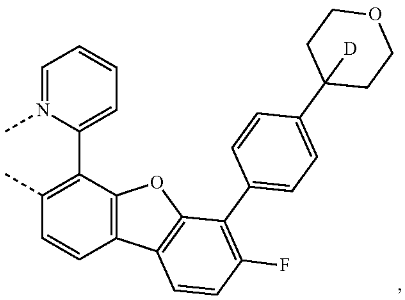
,
$L_{a868}$
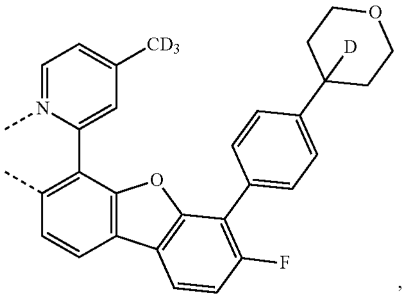
, -continued
L$_{a869}$
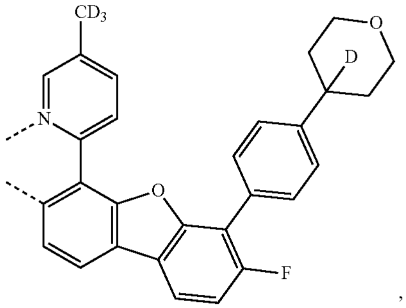
,
L$_{a870}$
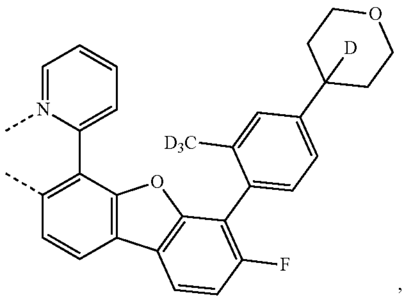
,
L$_{a871}$
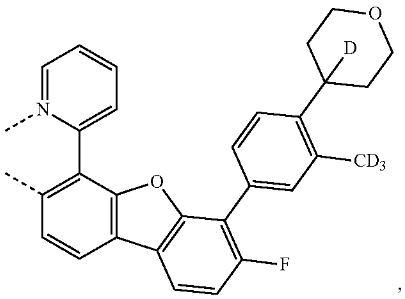
,
L$_{a872}$
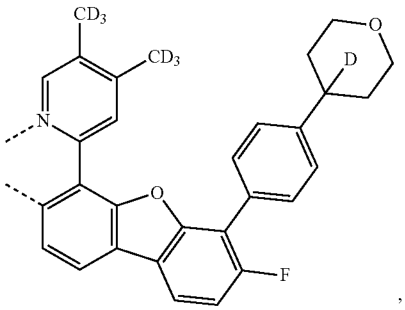
,
L$_{a873}$
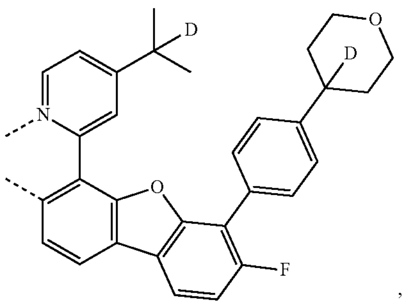
,
-continued
L$_{a874}$
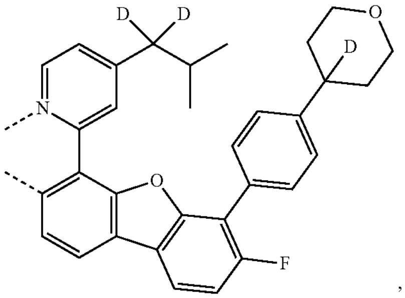
,
L$_{a875}$
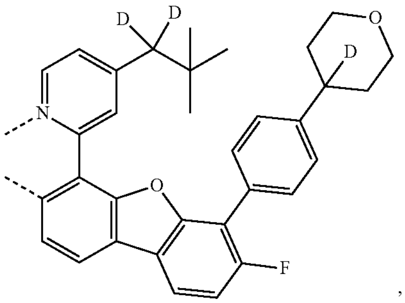
,
L$_{a876}$
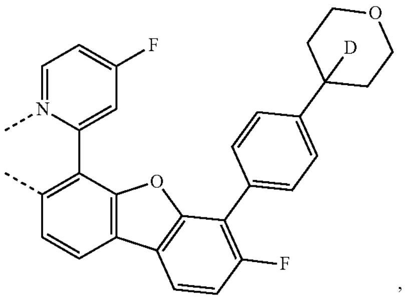
,
L$_{a877}$
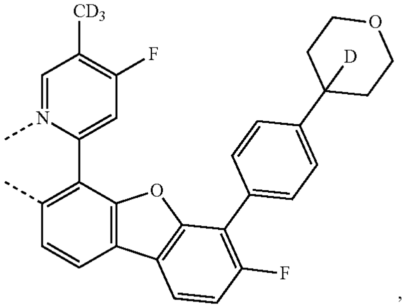
,
L$_{a887}$
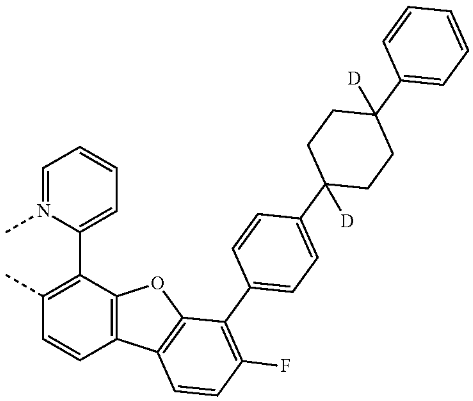
, -continued
$L_{a888}$
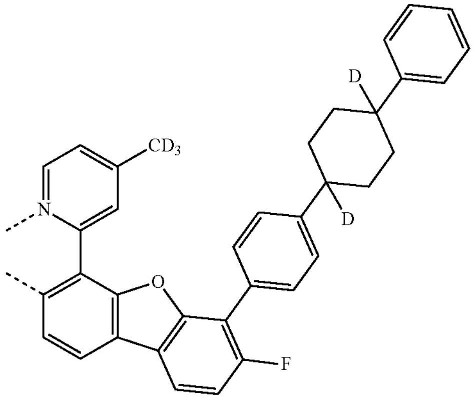
,
$L_{a889}$
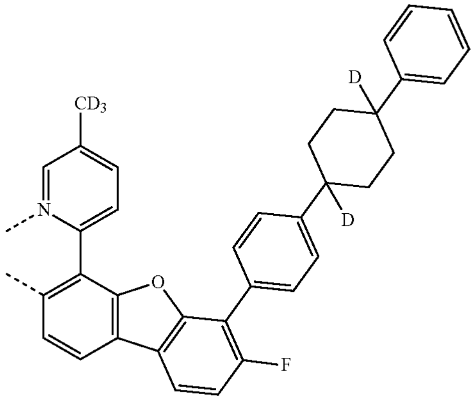
,
$L_{a890}$
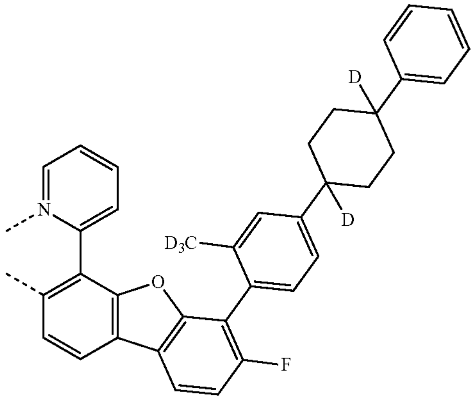
,
$L_{a891}$
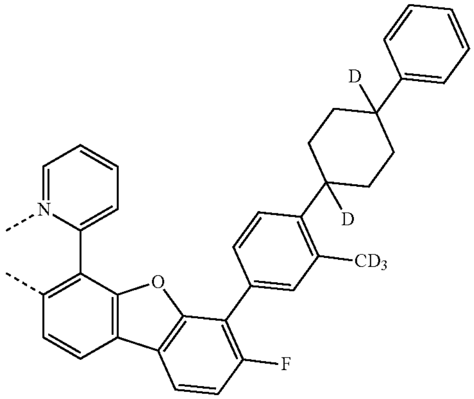
,
-continued
$L_{a892}$
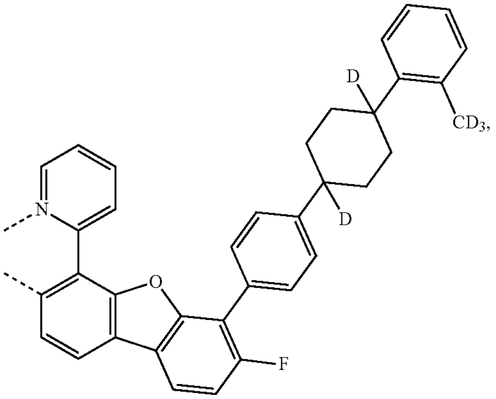
$L_{a893}$
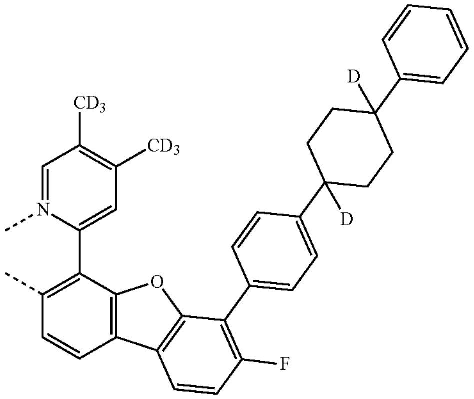
,
$L_{a894}$
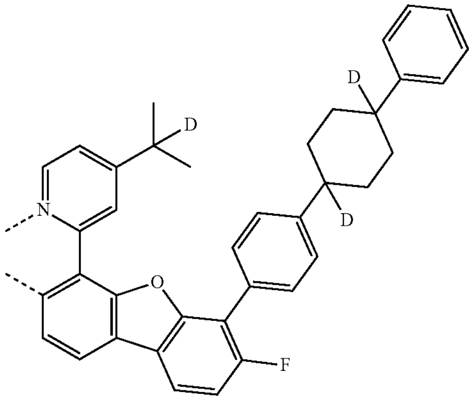
,
$L_{a895}$
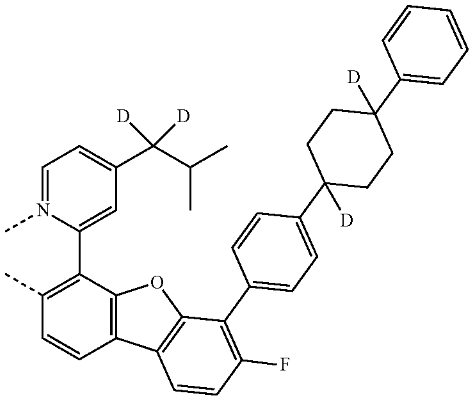
, -continued
$L_{a896}$
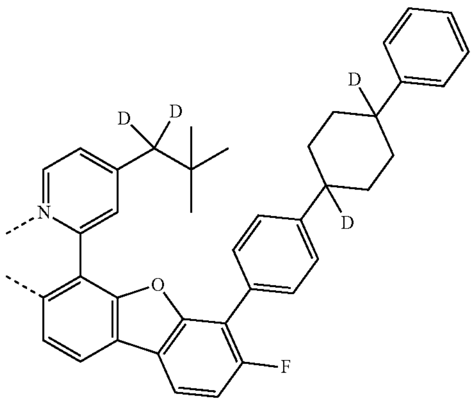
,
$L_{a897}$
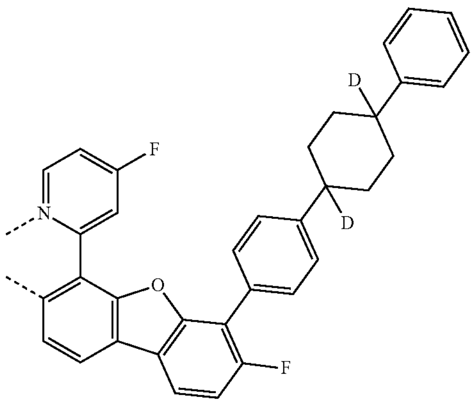
,
$L_{a898}$
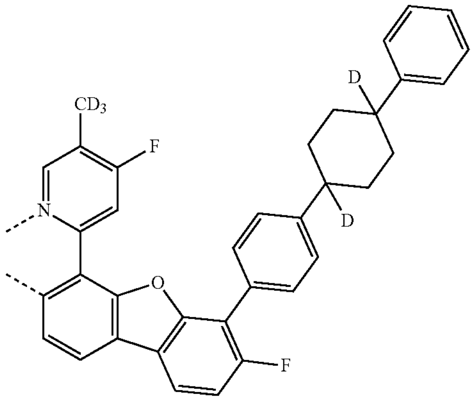
,
$L_{a899}$
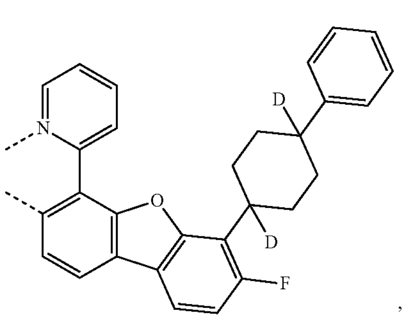
,
-continued
$L_{a900}$
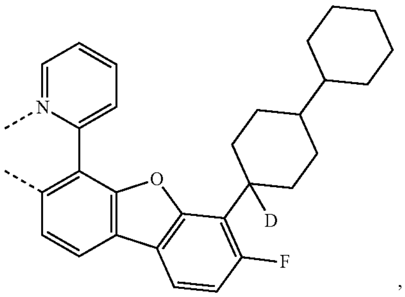
,
$L_{a903}$
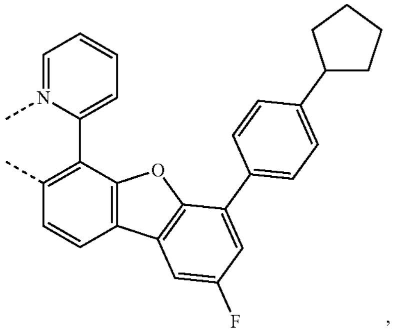
,
$L_{a904}$
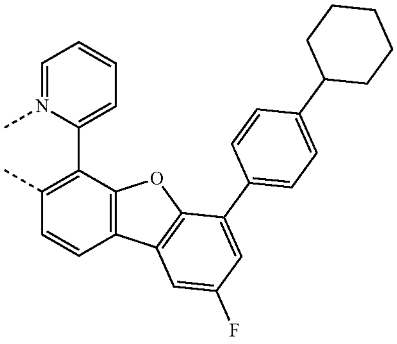
,
$L_{a905}$
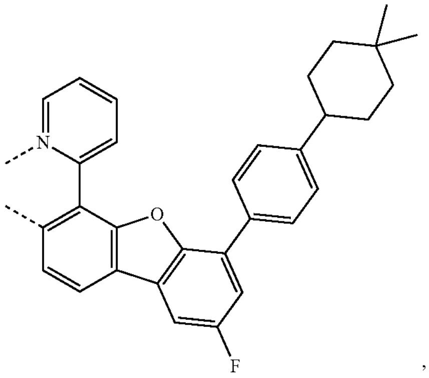
, -continued
$L_{a906}$
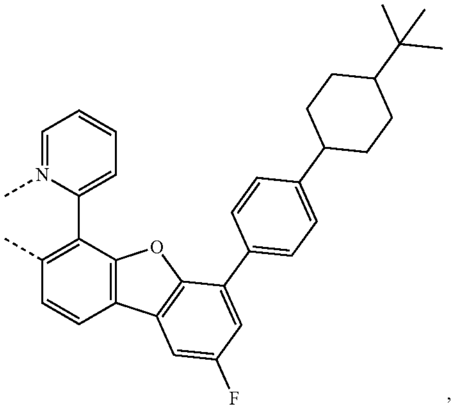
,
$L_{a907}$
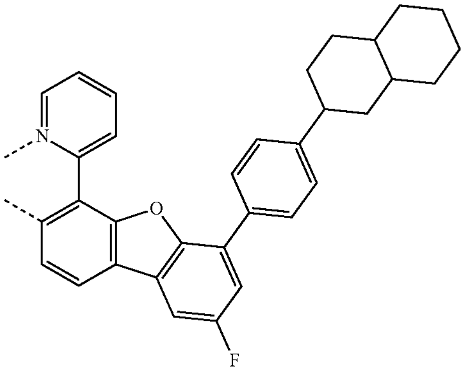
,
$L_{a908}$
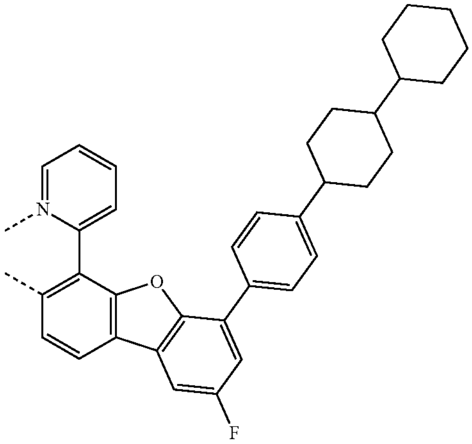
,
$L_{a909}$
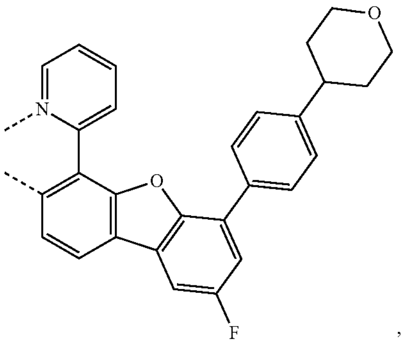
,
-continued
$L_{a911}$
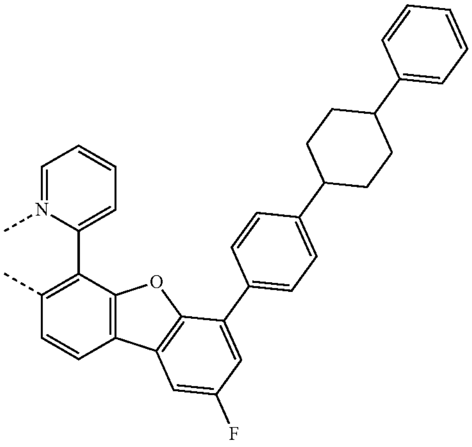
,
$L_{a912}$
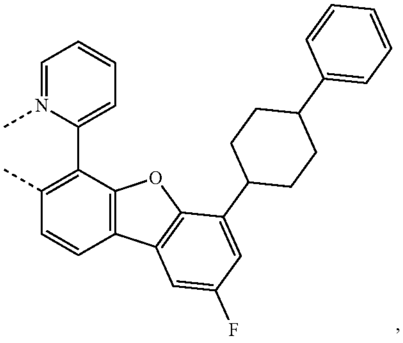
,
$L_{a916}$
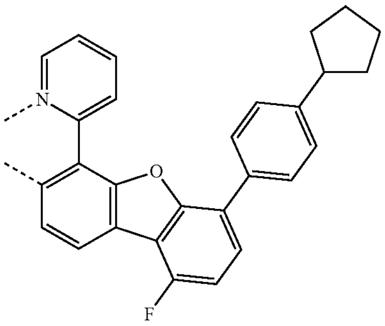
,
$L_{a917}$
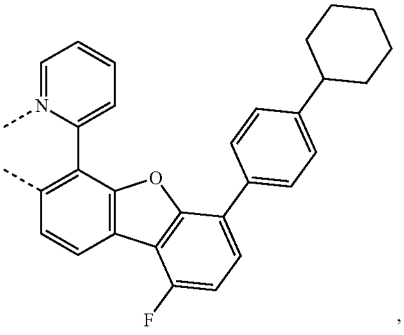
, -continued
L$_{a918}$
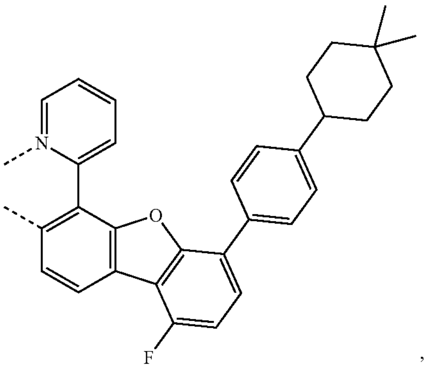
,
L$_{a919}$
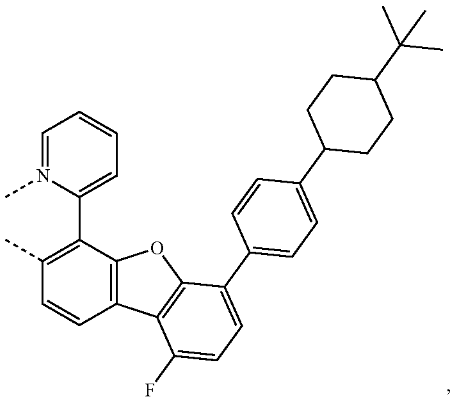
,
L$_{a920}$
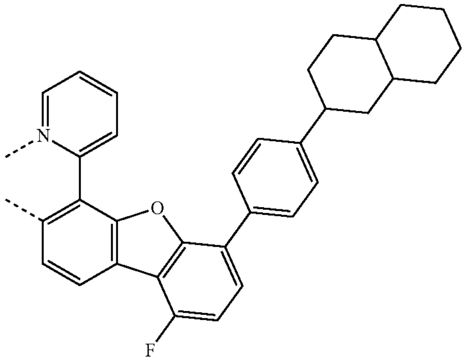
,
L$_{a921}$
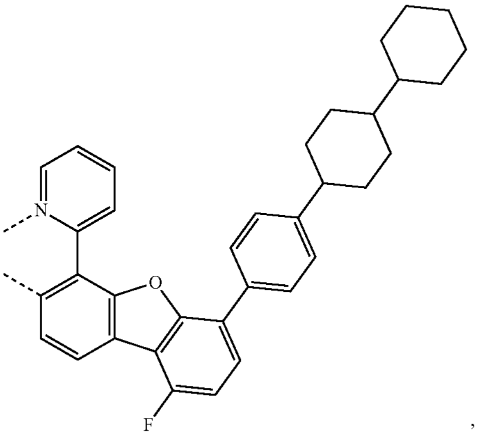
,
-continued
L$_{a922}$
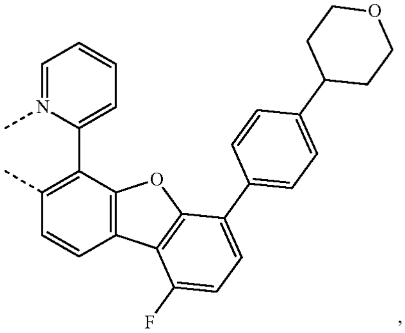
,
L$_{a924}$
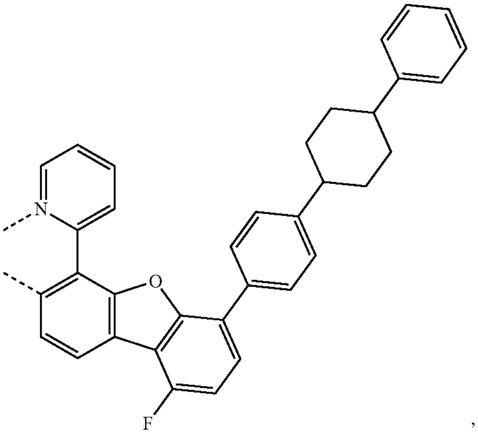
,
L$_{a928}$
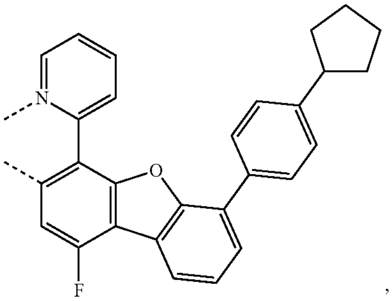
,
L$_{a929}$
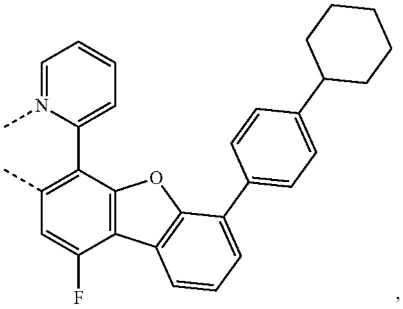
, -continued
$L_{a930}$
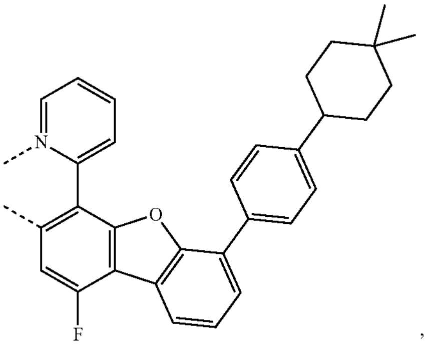
,
$L_{a931}$
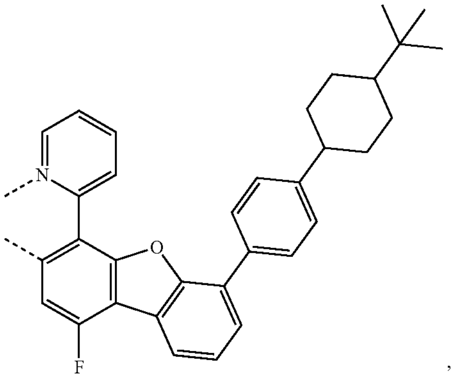
,
$L_{a932}$
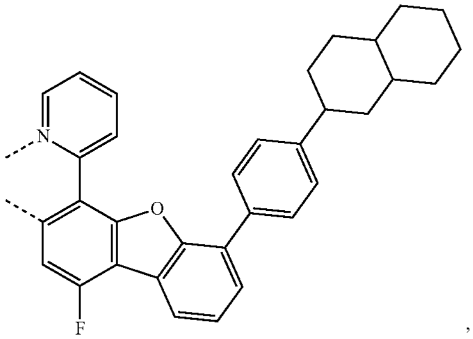
,
$L_{a933}$
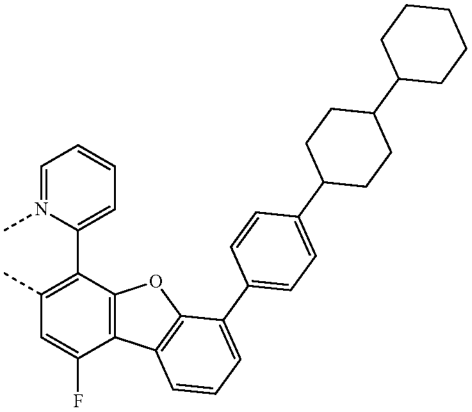
,
-continued
$L_{a934}$
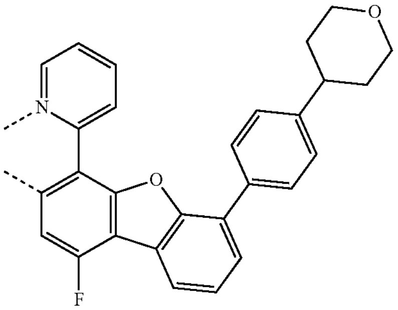
,
$L_{a936}$
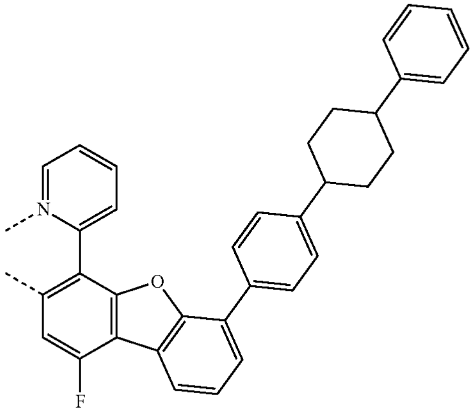
, and
$L_{a936}$
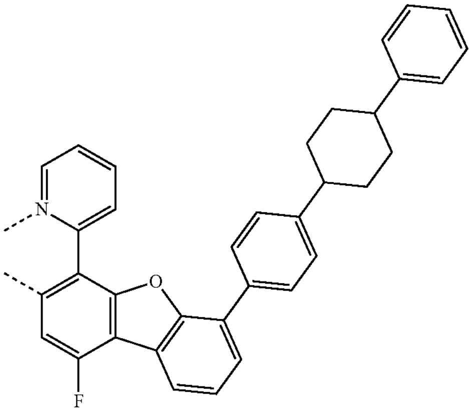
,
$L_{a938}$
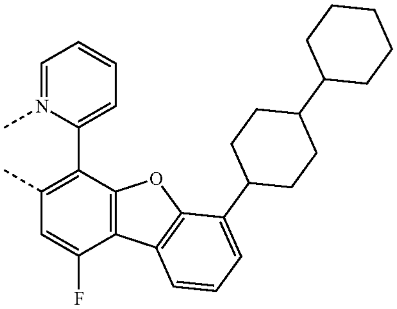
.

7. The metal complex of claim 6, wherein $L_b$ is, at each occurrence identically or differently, selected from the group consisting of:
$L_{b1}$
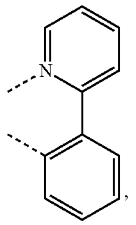
$L_{b2}$
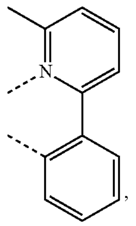
$L_{b3}$
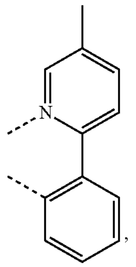
$L_{b4}$
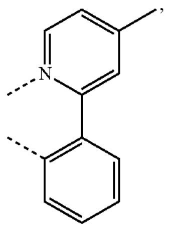
$L_{b5}$
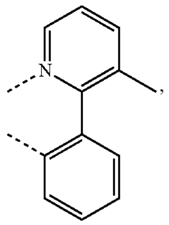
$L_{b6}$
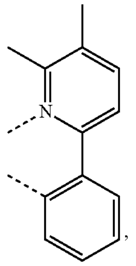
-continued
$L_{b7}$
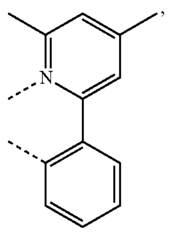
$L_{b8}$
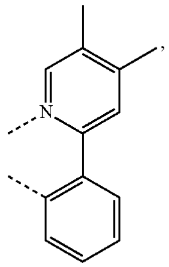
$L_{b9}$
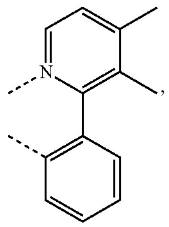
$L_{b10}$
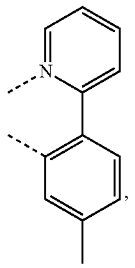
$L_{b11}$
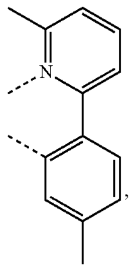
$L_{b12}$
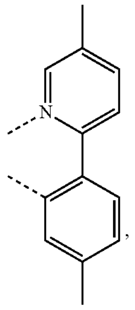

$L_{b13}$
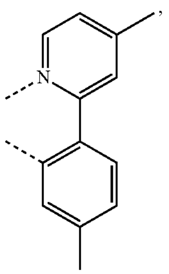
$L_{b14}$
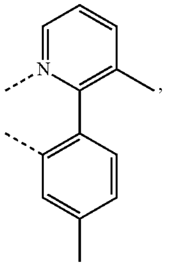
$L_{b15}$
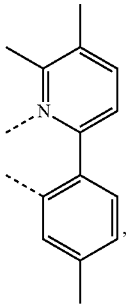
$L_{b16}$
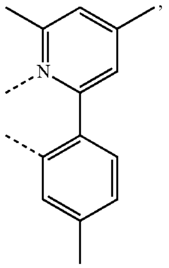
$L_{b17}$
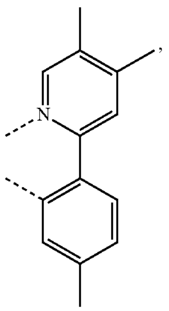
$L_{b18}$
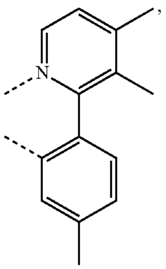
$L_{b19}$
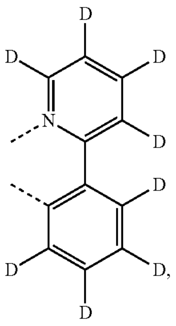
$L_{b20}$
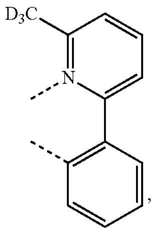
$L_{b21}$
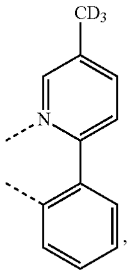
$L_{b22}$
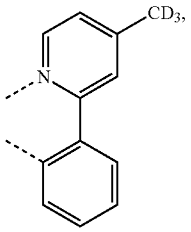
$L_{b23}$
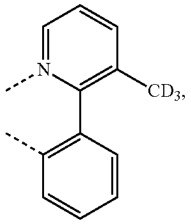

-continued
$L_{b24}$
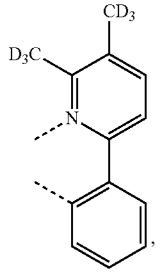
$L_{b25}$
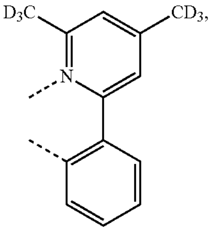
$L_{b26}$
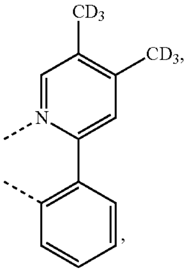
$L_{b27}$
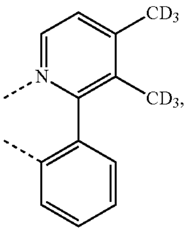
$L_{b28}$
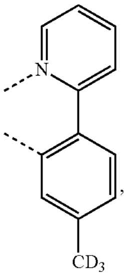
$L_{b29}$
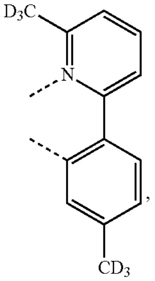
-continued
$L_{b30}$
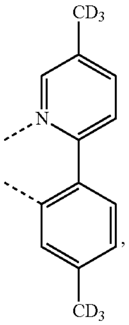
$L_{b31}$
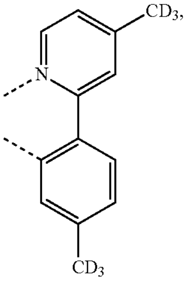
$L_{b32}$
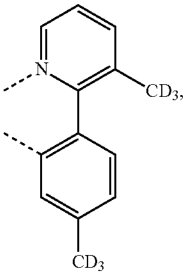
$L_{b33}$
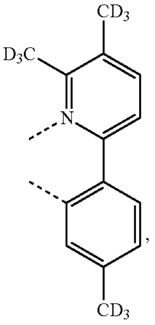
$L_{b34}$
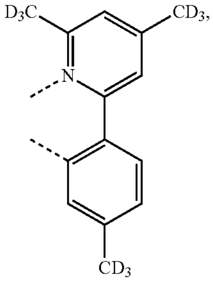

-continued
$L_{b35}$
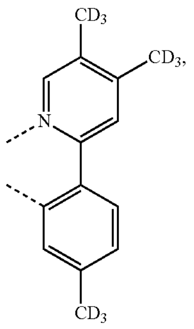
$L_{b36}$
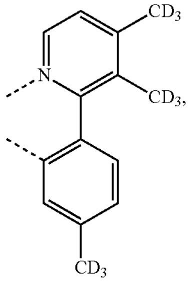
$L_{b37}$
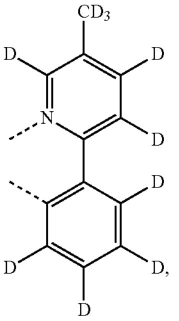
$L_{b38}$
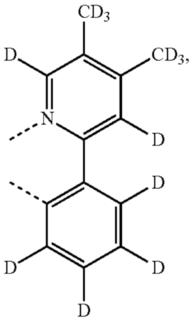
$L_{b39}$
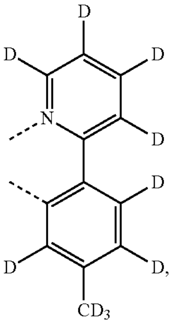
-continued
$L_{b40}$
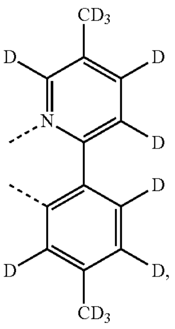
$L_{b41}$
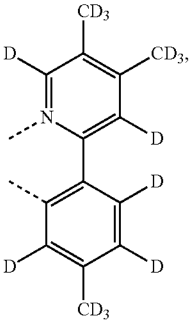
$L_{b42}$
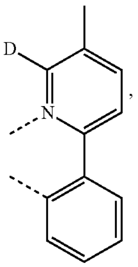
$L_{b43}$
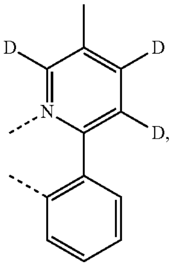
$L_{b44}$
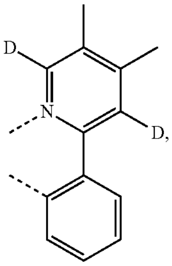

-continued
$L_{b45}$
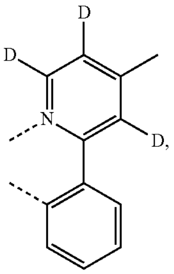
$L_{b46}$
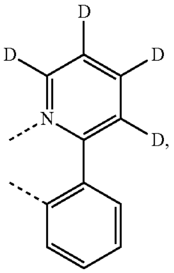
$L_{b47}$
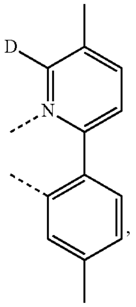
$L_{b48}$
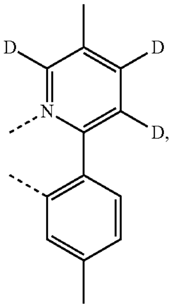
$L_{b49}$
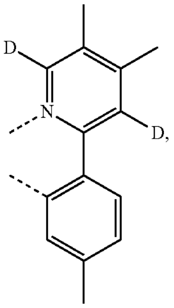
-continued
$L_{b50}$
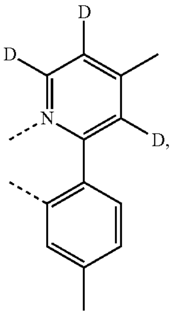
$L_{b51}$
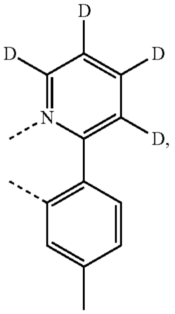
$L_{b52}$
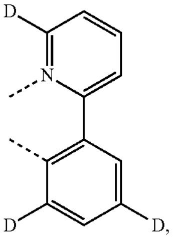
$L_{b53}$
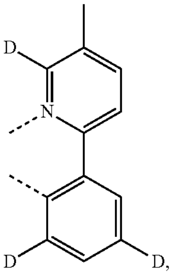
$L_{b54}$
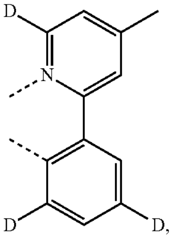

-continued
$L_{b55}$
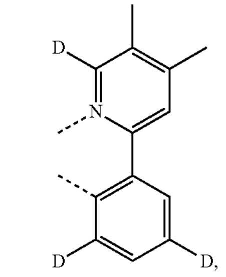
$L_{b56}$
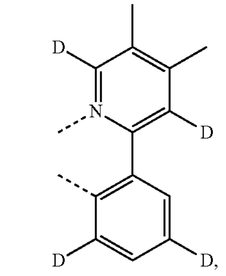
$L_{b57}$
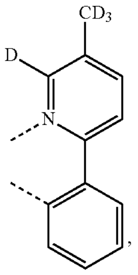
$L_{b58}$
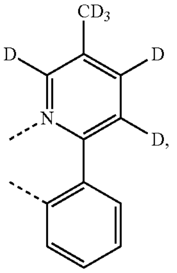
$L_{b59}$
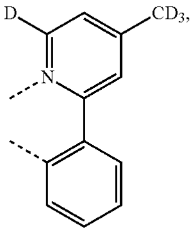
-continued
$L_{b60}$
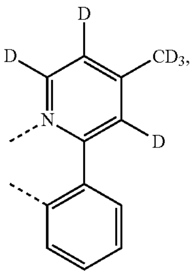
$L_{b61}$
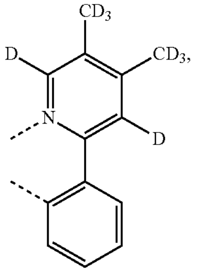
$L_{b62}$
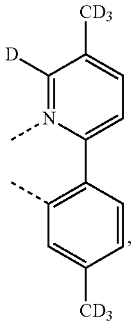
$L_{b63}$
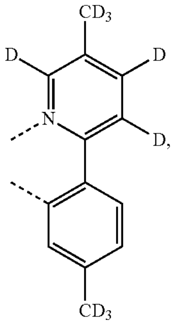
$L_{b64}$
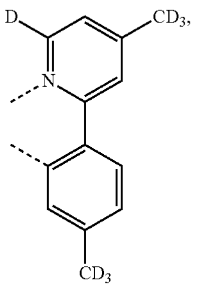

-continued
$L_{b65}$
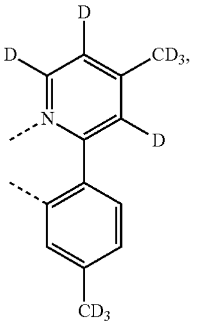
$L_{b66}$
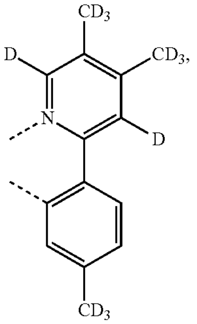
$L_{b67}$
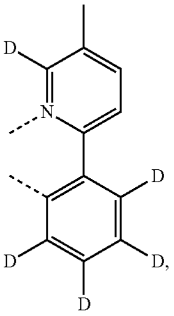
$L_{b68}$
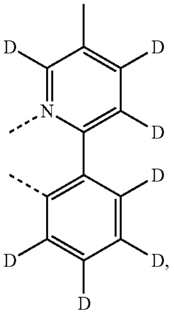
$L_{b69}$
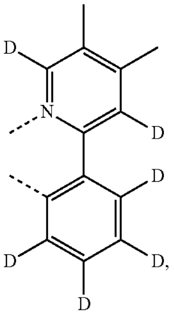
-continued
$L_{b70}$
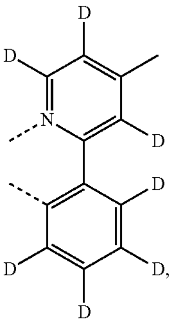
$L_{b71}$
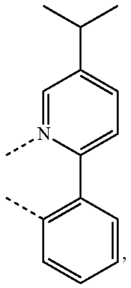
$L_{b72}$
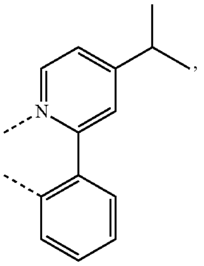
$L_{b73}$
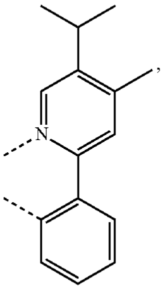
$L_{b74}$
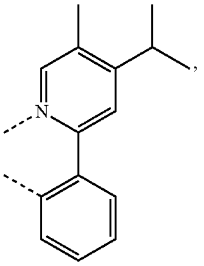

-continued
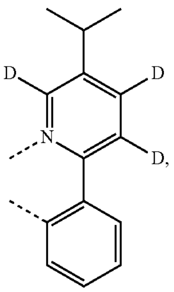
$L_{b75}$
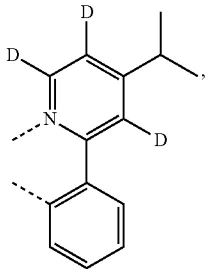
$L_{b76}$
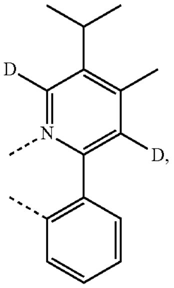
$L_{b77}$
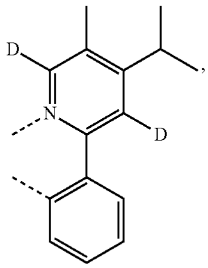
$L_{b78}$
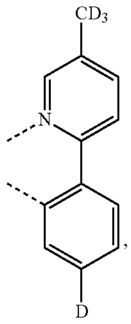
$L_{b79}$
-continued
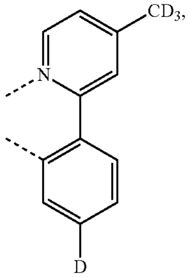
$L_{b80}$
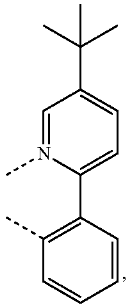
$L_{b81}$
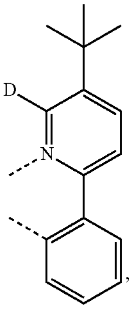
$L_{b82}$
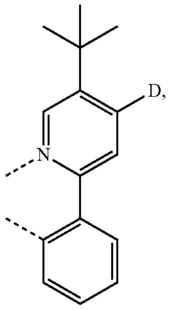
$L_{b83}$
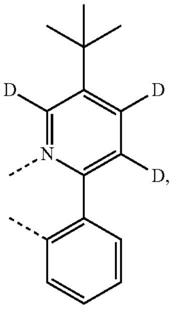
$L_{b84}$ -continued
$L_{b85}$
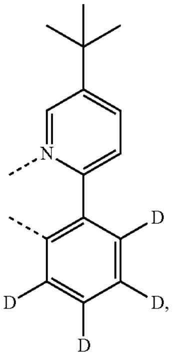
$L_{b86}$
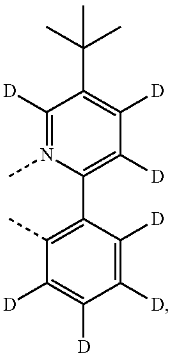
$L_{b87}$
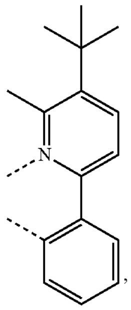
$L_{b88}$
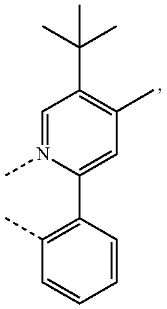
-continued
$L_{b89}$
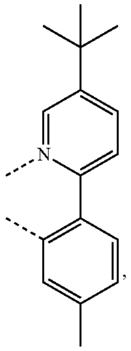
$L_{b90}$
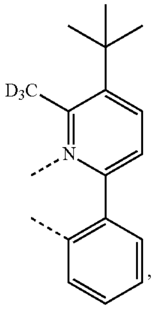
$L_{b91}$
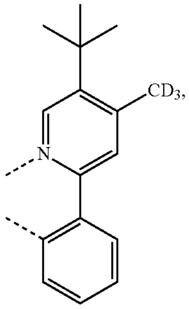
$L_{b92}$
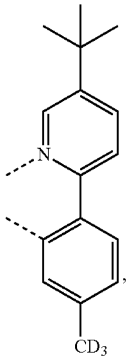

-continued
$L_{b93}$
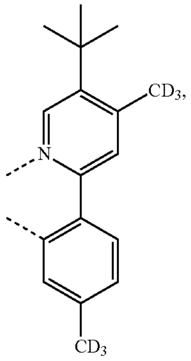
$L_{b94}$
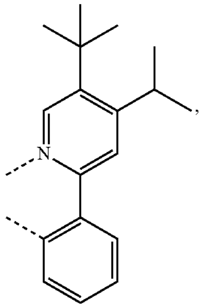
$L_{b95}$
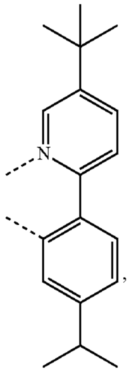
$L_{b96}$
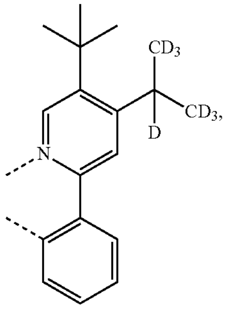
-continued
$L_{b97}$
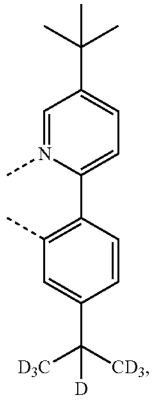
$L_{b98}$
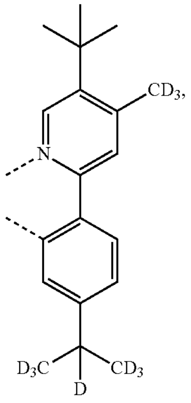
$L_{b99}$
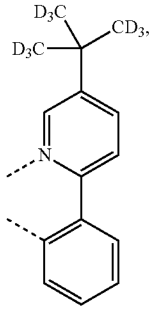
$L_{b100}$
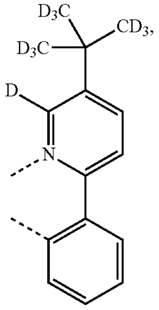

L$_{b101}$
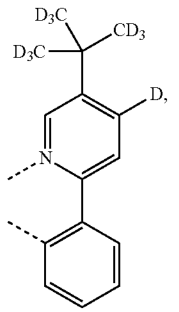
L$_{b102}$
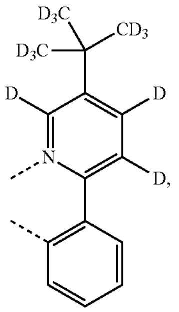
L$_{b103}$
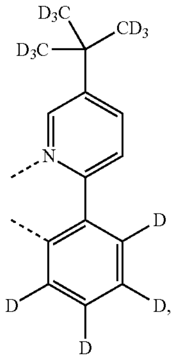
L$_{b104}$
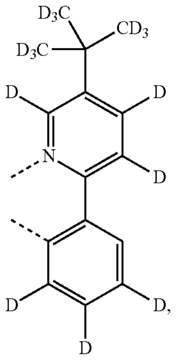
L$_{b105}$
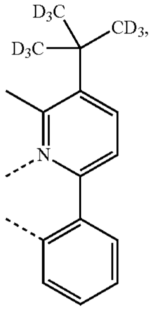
L$_{b106}$
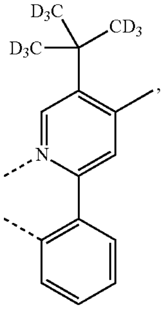
L$_{b107}$
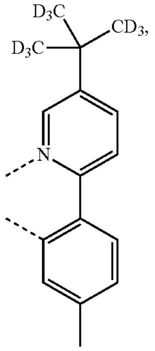
L$_{b108}$
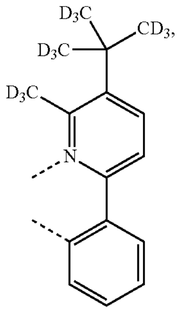
L$_{b109}$
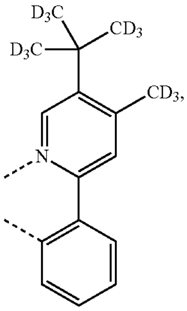

-continued
$L_{b110}$
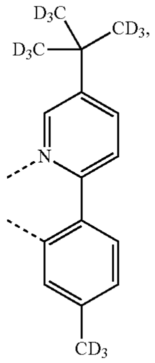
$L_{b111}$
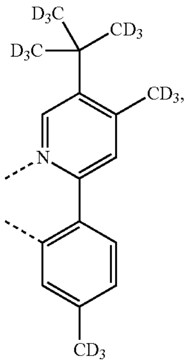
$L_{b112}$
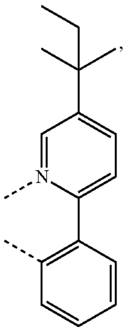
$L_{b113}$
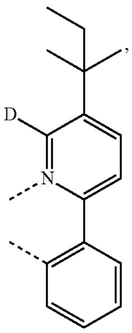
-continued
$L_{b114}$
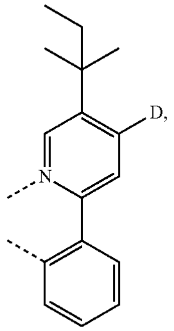
$L_{b115}$
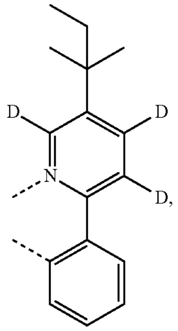
$L_{b116}$
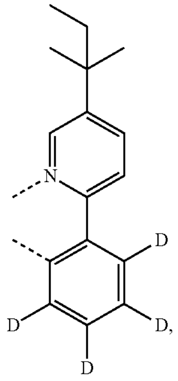
$L_{b117}$
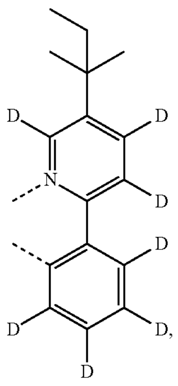

-continued
$L_{b118}$
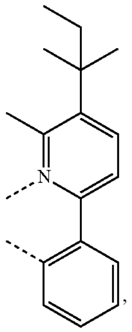
$L_{b119}$
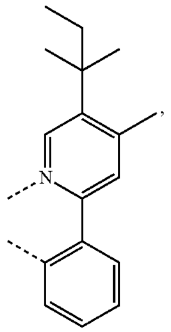
$L_{b120}$
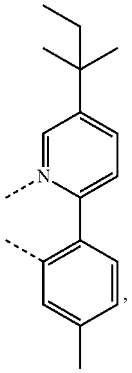
$L_{b121}$
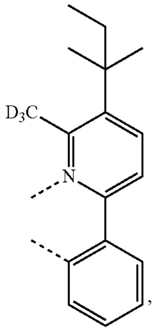
-continued
$L_{b122}$
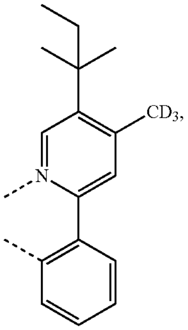
$L_{b123}$
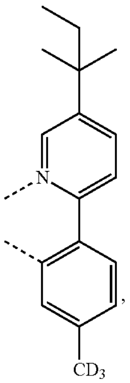
$L_{b124}$
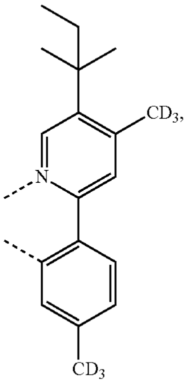
$L_{b125}$
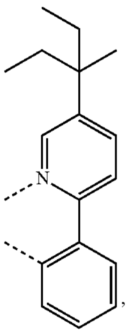

-continued
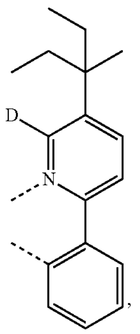
$L_{b126}$
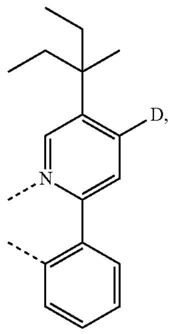
$L_{b127}$
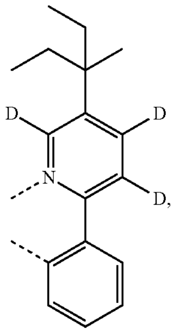
$L_{b128}$
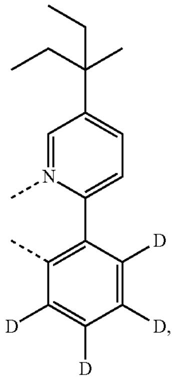
$L_{b129}$
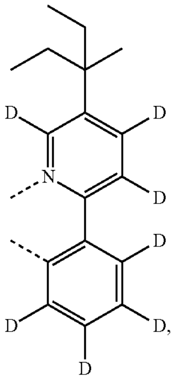
$L_{b130}$
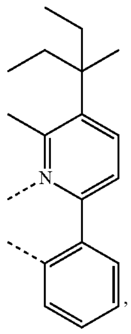
$L_{b131}$
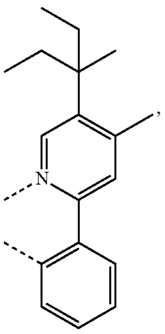
$L_{b132}$
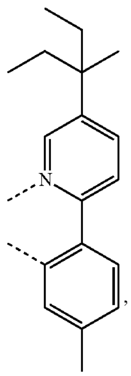
$L_{b133}$ $L_{b134}$
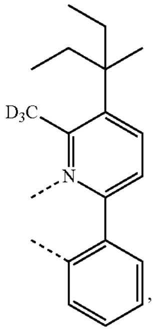
$L_{b135}$
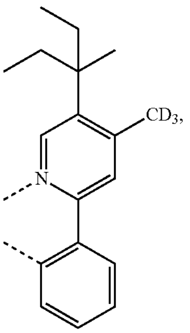
$L_{b136}$
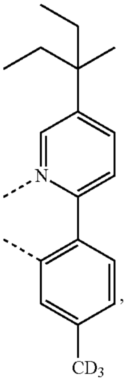
$L_{b137}$
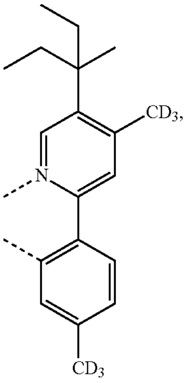
$L_{b138}$
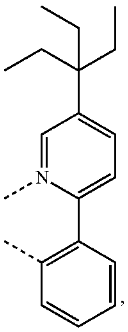
$L_{b139}$
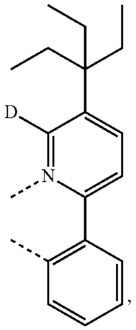
$L_{b140}$
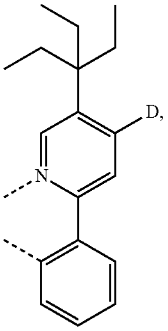
$L_{b141}$
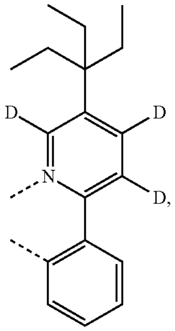

-continued
$L_{b142}$
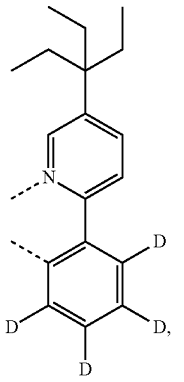
$L_{b143}$
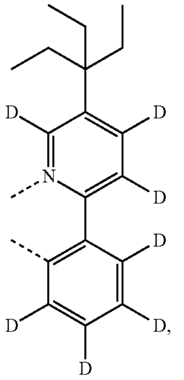
$L_{b144}$
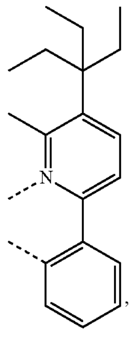
$L_{b145}$
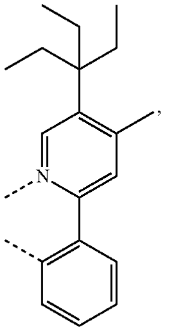
-continued
$L_{b146}$
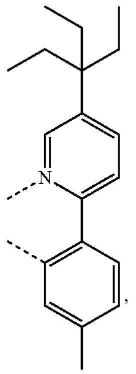
$L_{b147}$
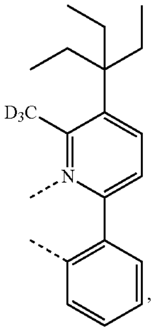
$L_{b148}$
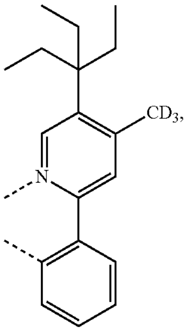
$L_{b149}$
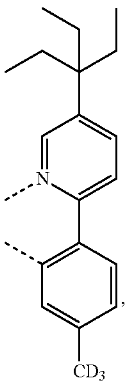

-continued
$L_{b150}$
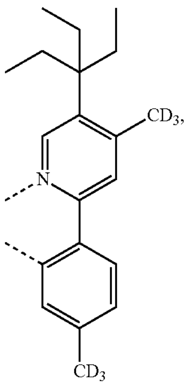
$L_{b151}$
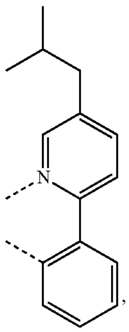
$L_{b152}$
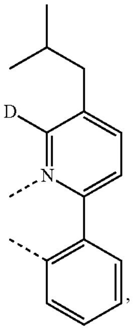
$L_{b153}$
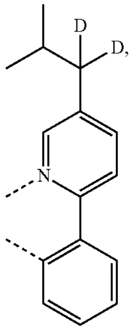
-continued
$L_{b154}$
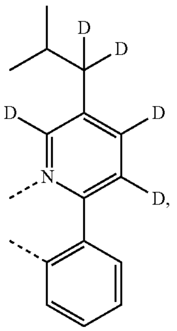
$L_{b155}$
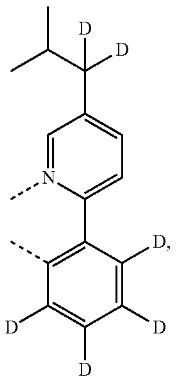
$L_{b156}$
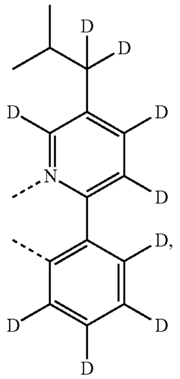
$L_{b157}$
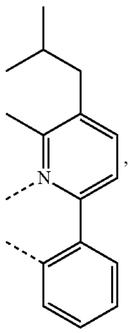

-continued
$L_{b158}$
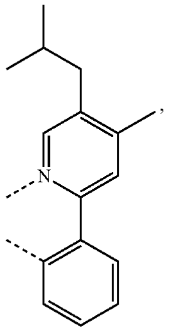
,
$L_{b159}$
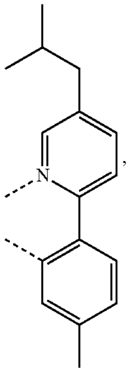
,
$L_{b160}$
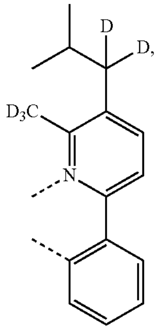
$L_{b161}$
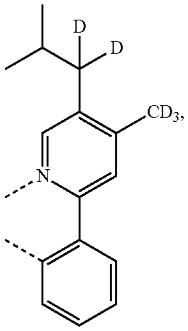
-continued
$L_{b162}$
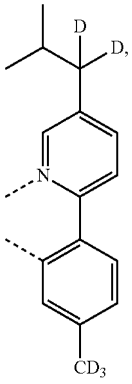
$L_{b163}$
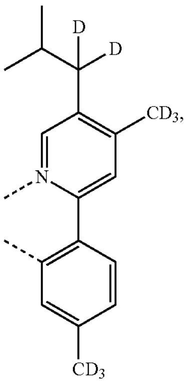
$L_{b164}$
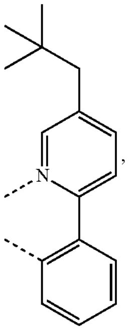
,
$L_{b165}$
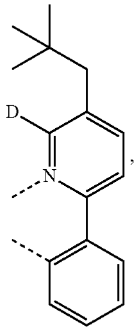
, -continued
$L_{b166}$
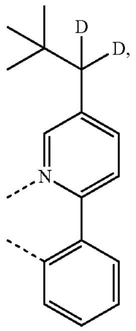
$L_{b167}$
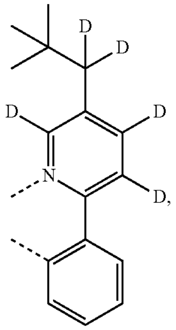
$L_{b168}$
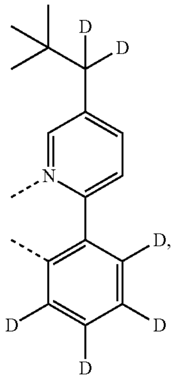
$L_{b169}$
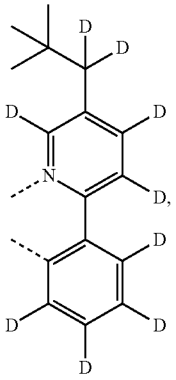
-continued
$L_{b170}$
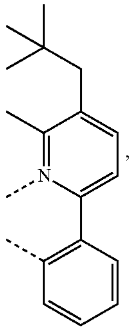
$L_{b171}$
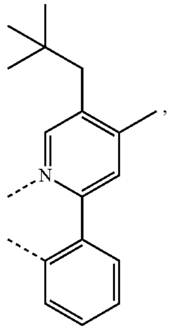
$L_{b172}$
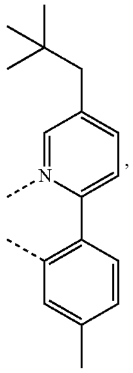
$L_{b173}$
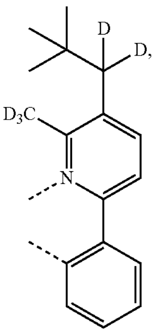

-continued
$L_{b174}$
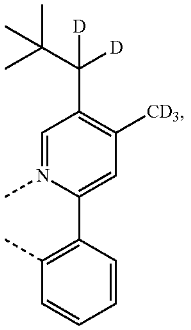
$L_{b175}$
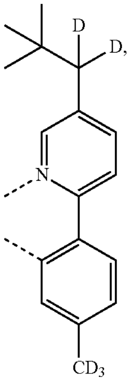
$L_{b176}$
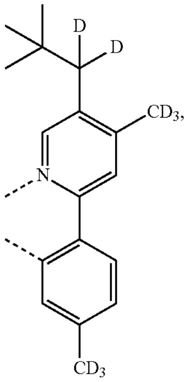
$L_{b177}$
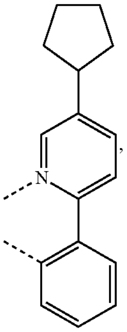
-continued
$L_{b178}$
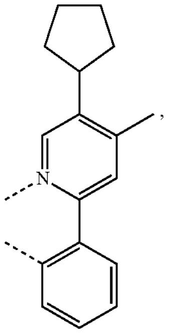
$L_{b179}$
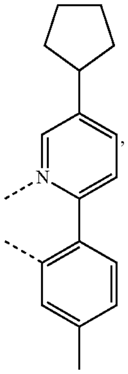
$L_{b180}$
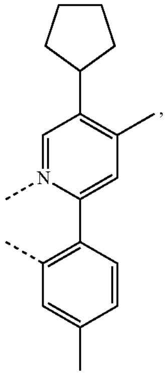
$L_{b181}$
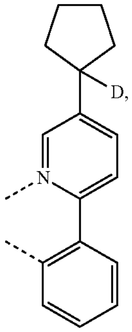

-continued
$L_{b182}$
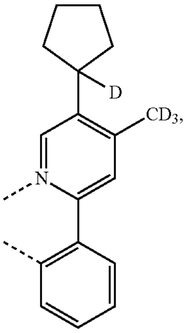
$L_{b183}$
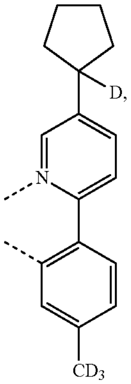
$L_{b184}$
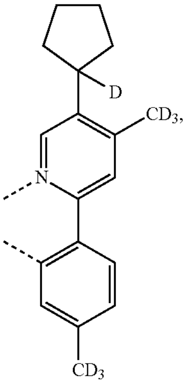
$L_{b185}$
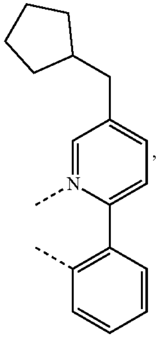
-continued
$L_{b186}$
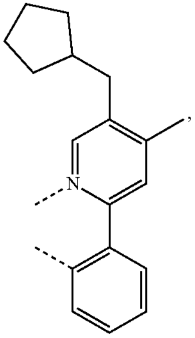
$L_{b187}$
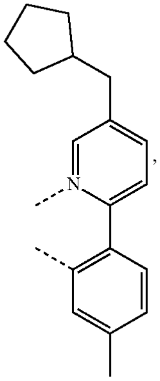
$L_{b188}$
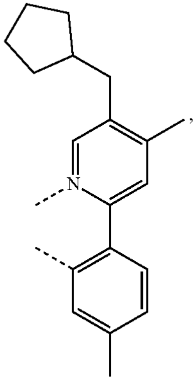
$L_{b189}$
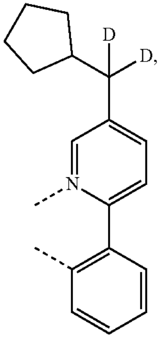

-continued
$L_{b190}$
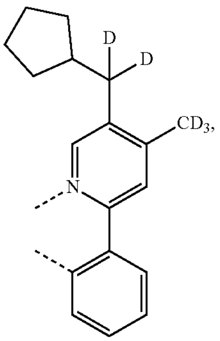
$L_{b191}$
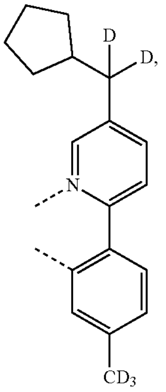
$L_{b192}$
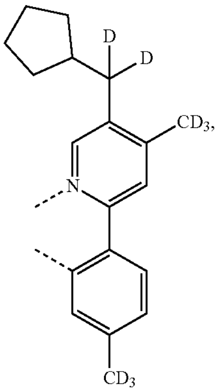
$L_{b193}$
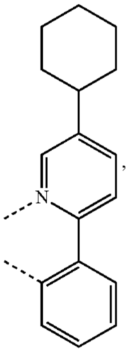
-continued
$L_{b194}$
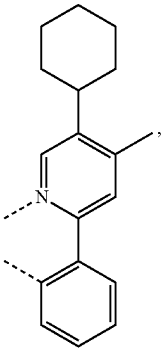
$L_{b195}$
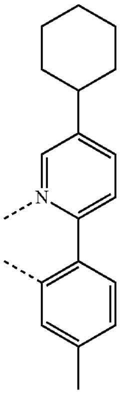
$L_{b196}$
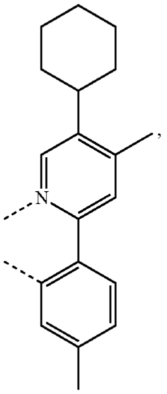
$L_{b197}$
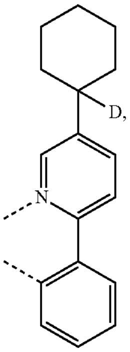

-continued
$L_{b198}$
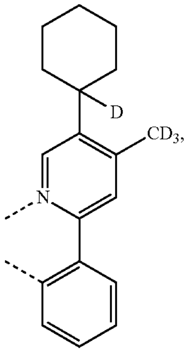
$L_{b199}$
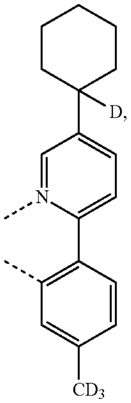
$L_{b200}$
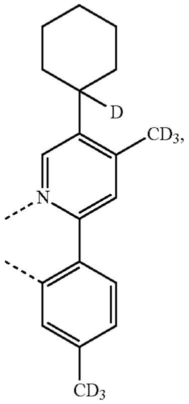
$L_{b201}$
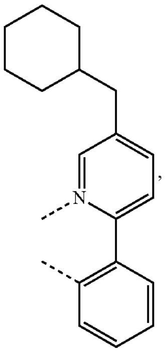
-continued
$L_{b202}$
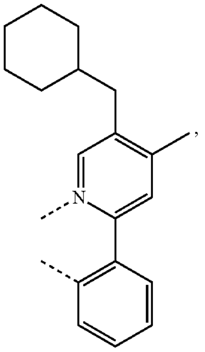
$L_{b203}$
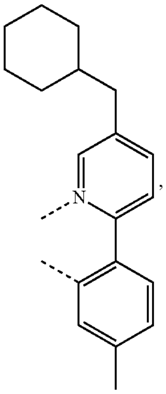
$L_{b204}$
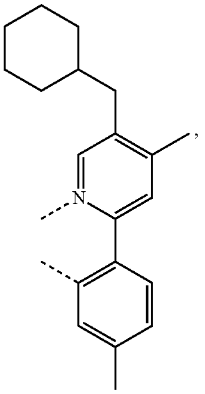
$L_{b205}$
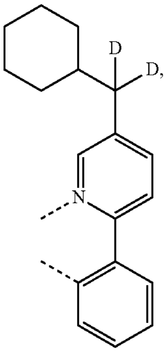

-continued
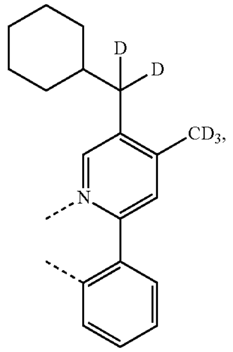
$L_{b206}$
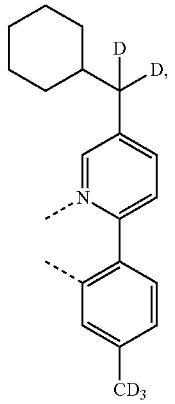
$L_{b207}$
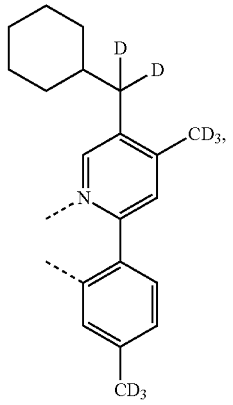
$L_{b208}$
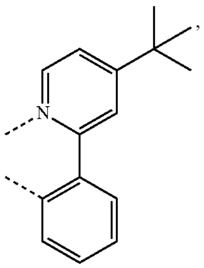
$L_{b209}$
-continued
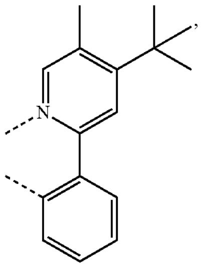
$L_{b210}$
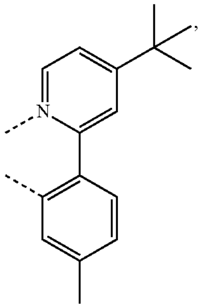
$L_{b211}$
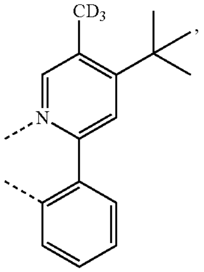
$L_{b212}$
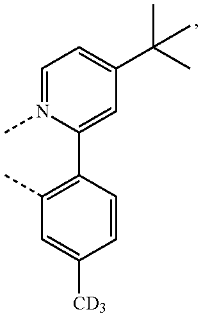
$L_{b213}$
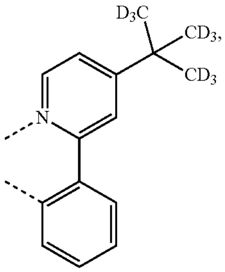
$L_{b214}$ -continued
$L_{b215}$
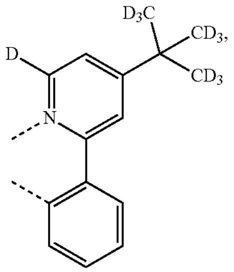
$L_{b216}$
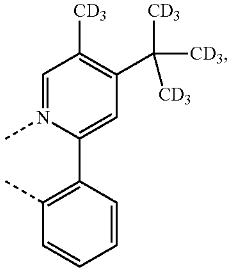
$L_{b217}$
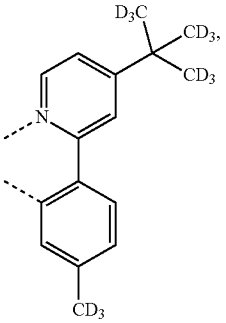
$L_{b218}$
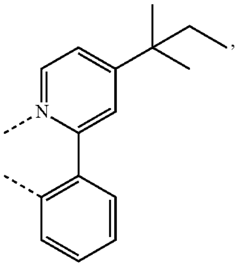
$L_{b219}$
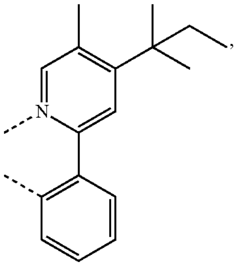
-continued
$L_{b220}$
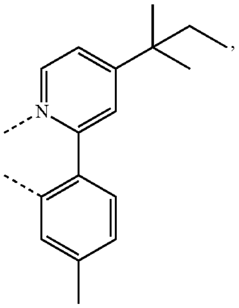
$L_{b221}$
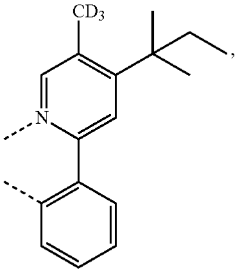
$L_{b222}$
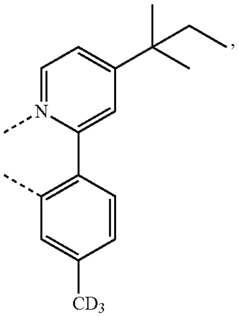
$L_{b223}$
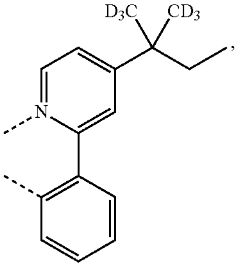
$L_{b224}$
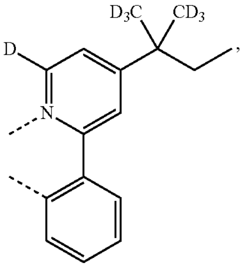

-continued
$L_{b225}$
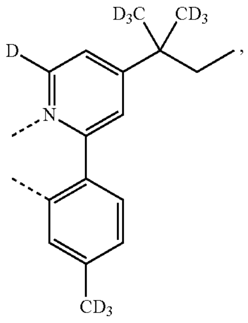
$L_{b226}$
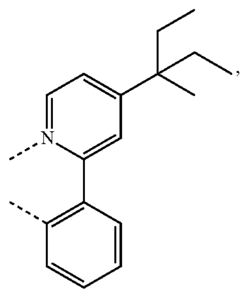
$L_{b227}$
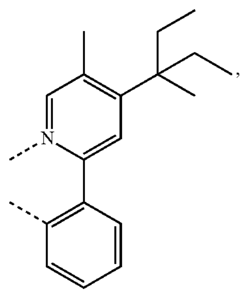
$L_{b228}$
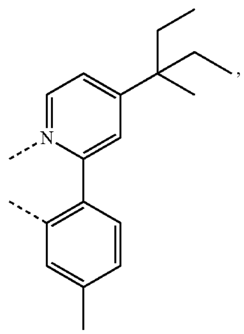
$L_{b229}$
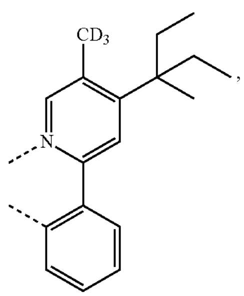
-continued
$L_{b230}$
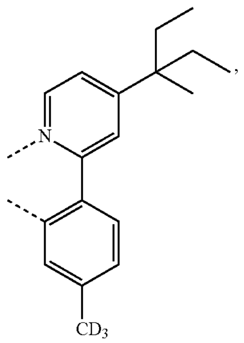
$L_{b231}$
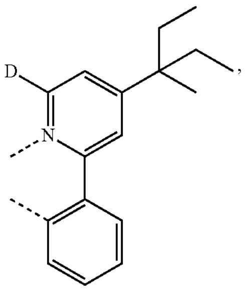
$L_{b232}$
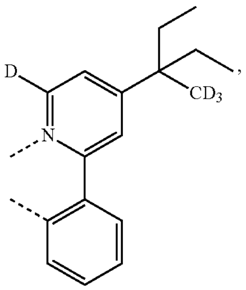
$L_{b233}$
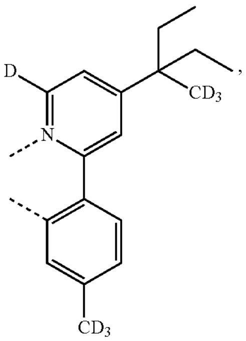
$L_{b234}$
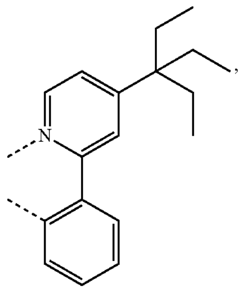

-continued
$L_{b235}$
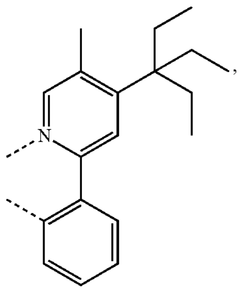
$L_{b236}$
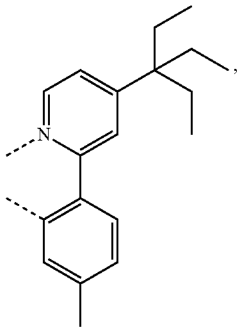
$L_{b237}$
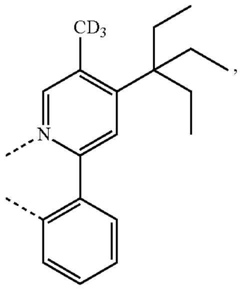
$L_{b238}$
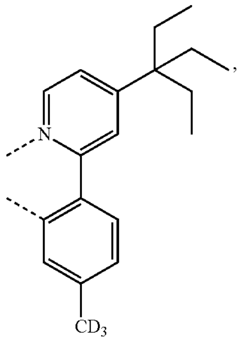
$L_{b239}$
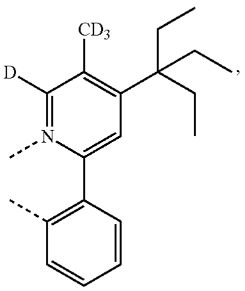
-continued
$L_{b240}$
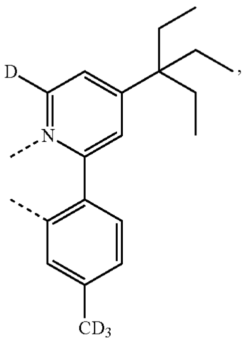
$L_{b241}$
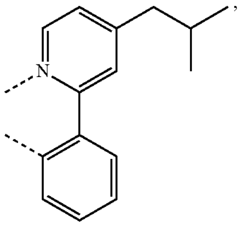
$L_{b242}$
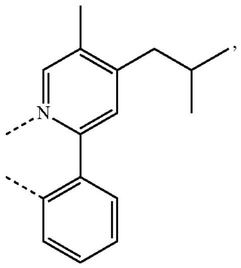
$L_{b243}$
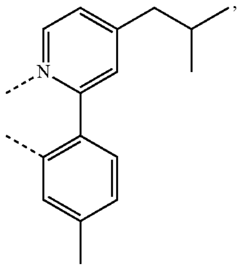
$L_{b244}$
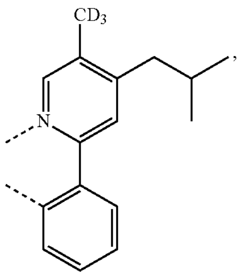

-continued
$L_{b245}$
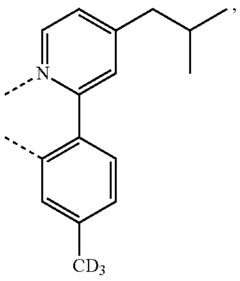
,
$L_{b246}$
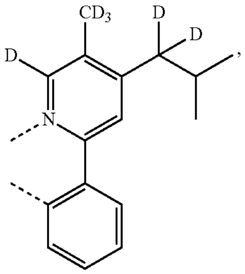
,
$L_{b247}$
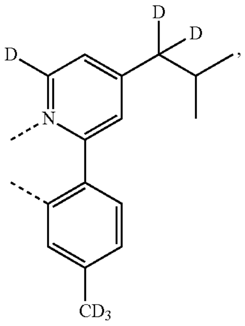
,
$L_{b248}$
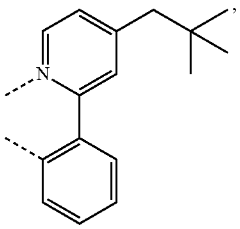
,
$L_{b249}$
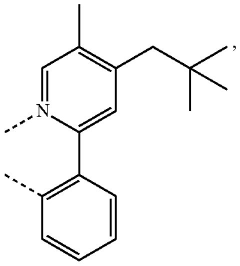
,
-continued
$L_{b250}$
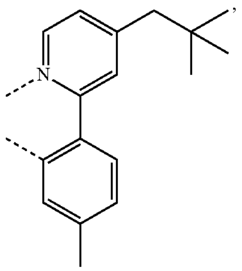
,
$L_{b251}$
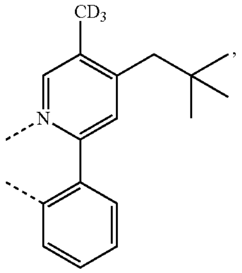
,
$L_{b252}$
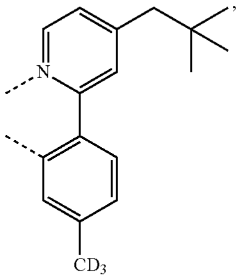
,
$L_{b253}$
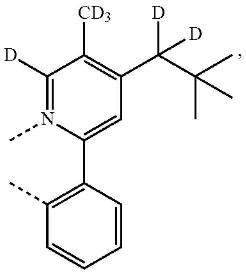
,
$L_{b254}$
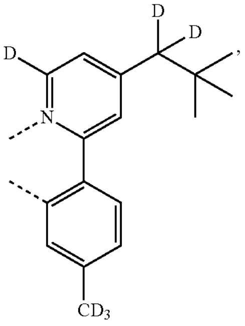
, -continued
$L_{b255}$
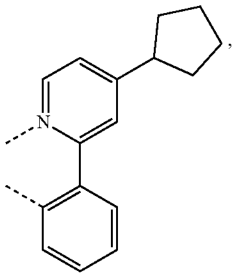
$L_{b256}$
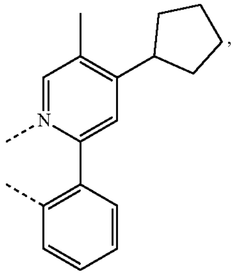
$L_{b257}$
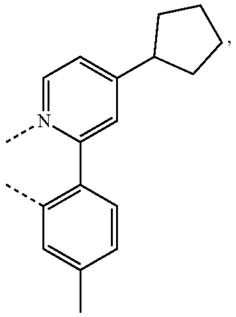
$L_{b258}$
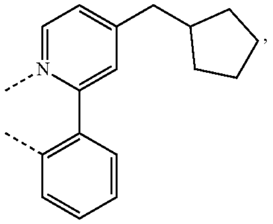
$L_{b259}$
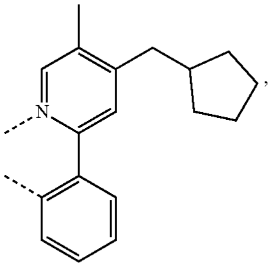
-continued
$L_{b260}$
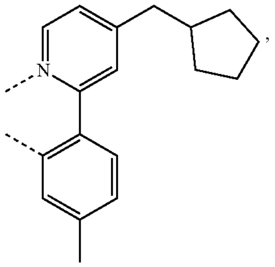
$L_{b261}$
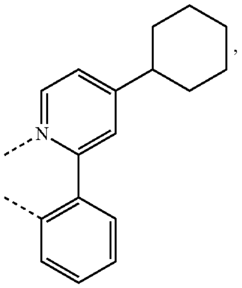
$L_{b262}$
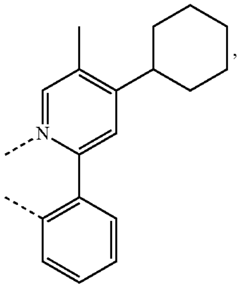
$L_{b263}$
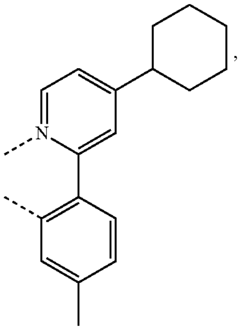
$L_{b264}$
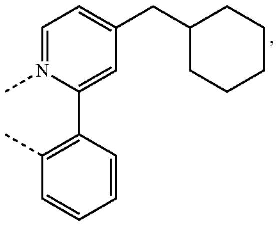

-continued
$L_{b265}$
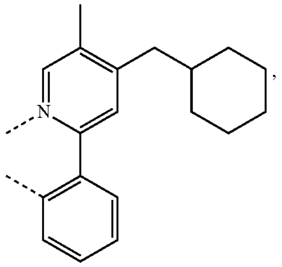
$L_{b266}$
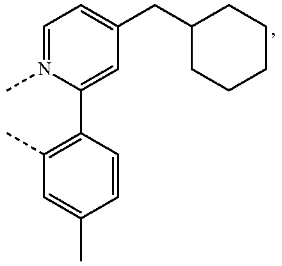
$L_{b267}$
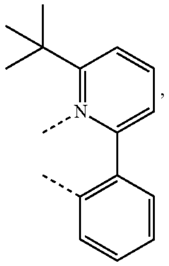
$L_{b268}$
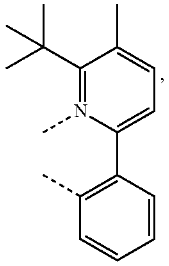
$L_{b269}$
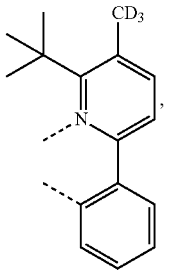
$L_{b270}$
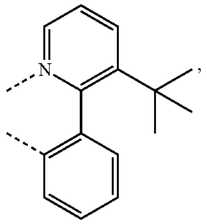
-continued
$L_{b271}$
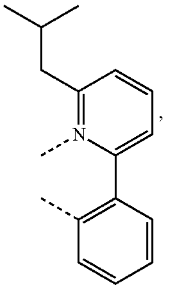
$L_{b272}$
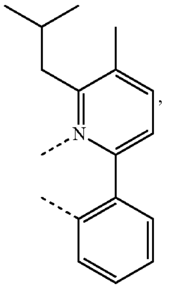
$L_{b273}$
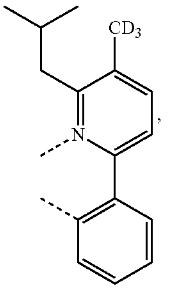
$L_{b274}$
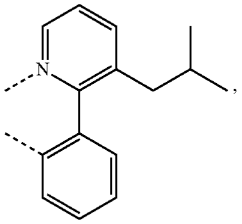
$L_{b275}$
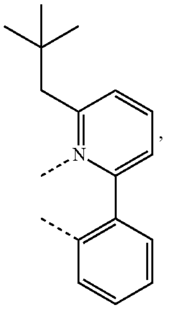

-continued
L$_{b276}$
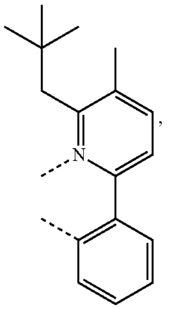
L$_{b277}$
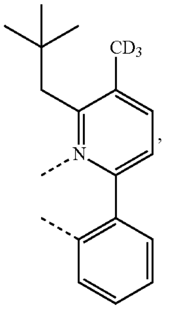
L$_{b278}$
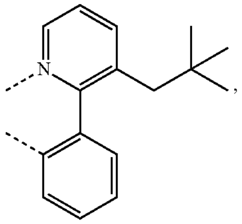
L$_{b279}$
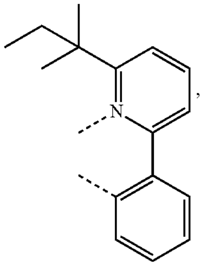
L$_{b280}$
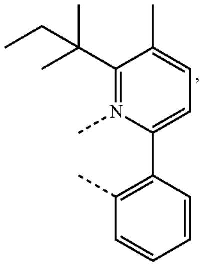
-continued
L$_{b281}$
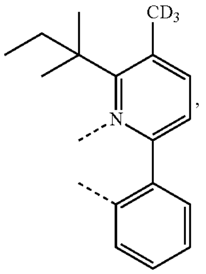
L$_{b282}$
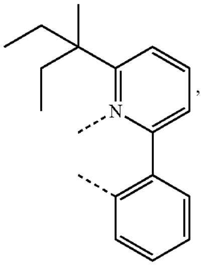
L$_{b283}$
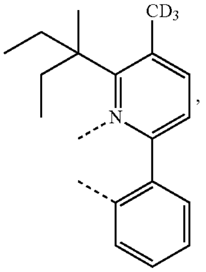
L$_{b284}$
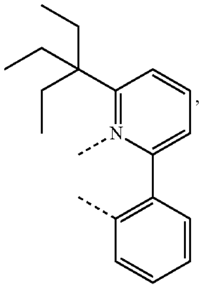
L$_{b285}$
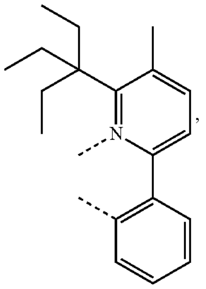

-continued
L$_{b286}$
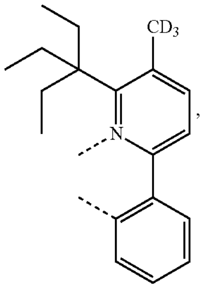
L$_{b287}$
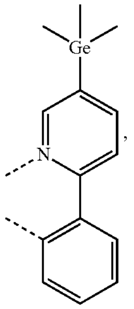
L$_{b288}$
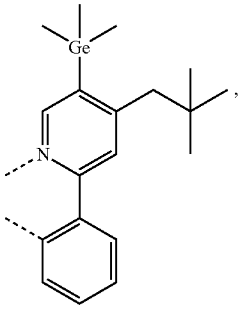
L$_{b289}$
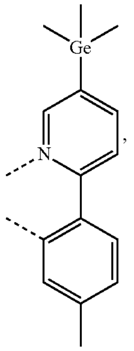
L$_{b290}$
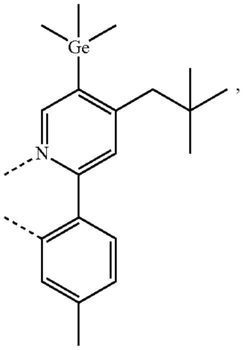
-continued
L$_{b291}$
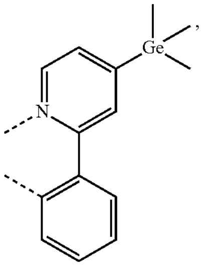
L$_{b292}$
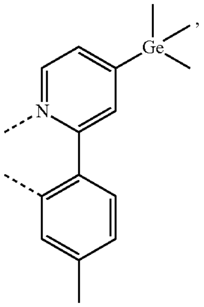
L$_{b293}$
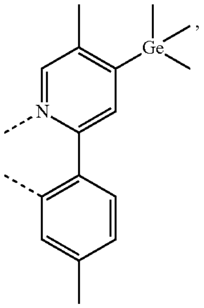
L$_{b294}$
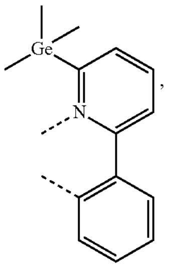
L$_{b295}$
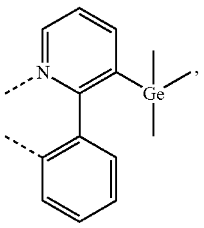

$L_{b296}$
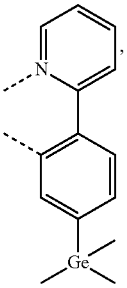
$L_{b297}$
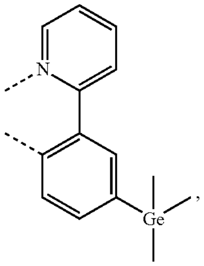
$L_{b298}$
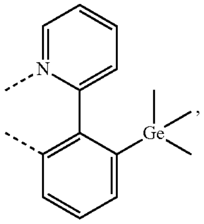
$L_{b299}$
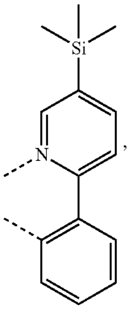
$L_{b300}$
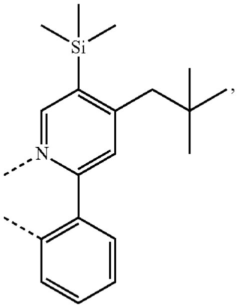
$L_{b301}$
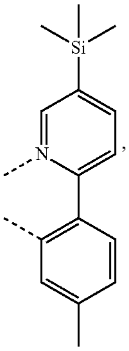
$L_{b302}$
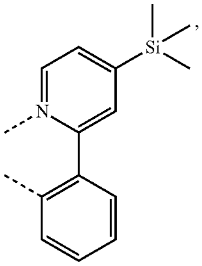
$L_{b303}$
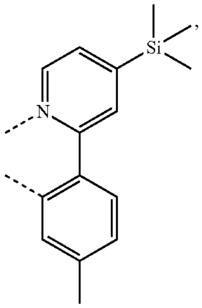
$L_{b304}$
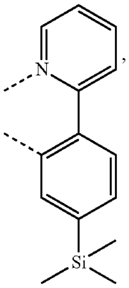
$L_{b305}$
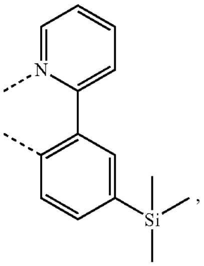

L$_{b306}$
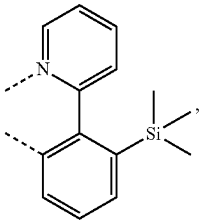
L$_{b307}$
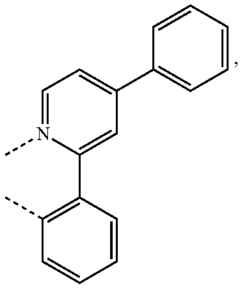
L$_{b308}$
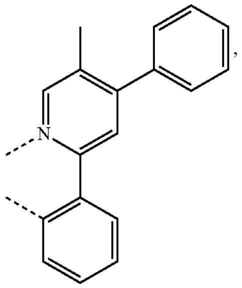
L$_{b309}$
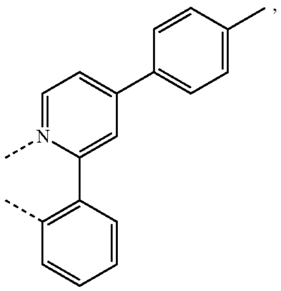
L$_{b310}$
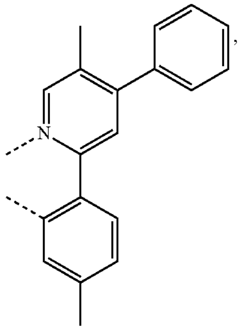
L$_{b311}$
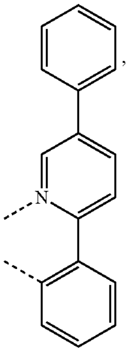
L$_{b312}$
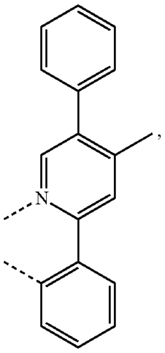
L$_{b313}$
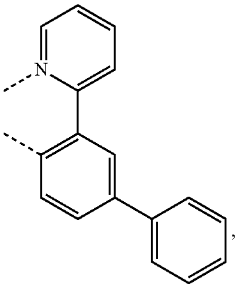
L$_{b314}$
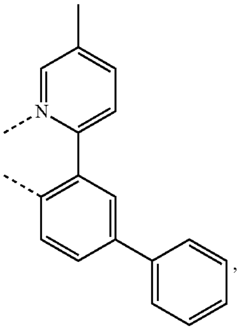

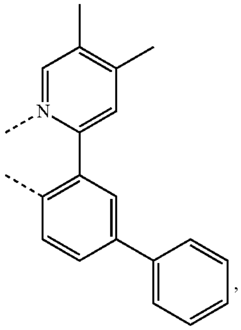
$L_{b315}$
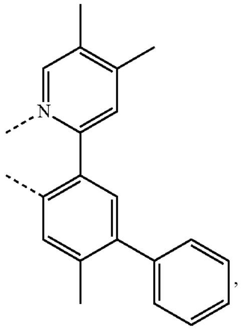
$L_{b316}$
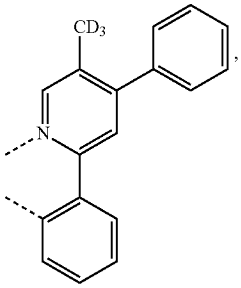
$L_{b317}$
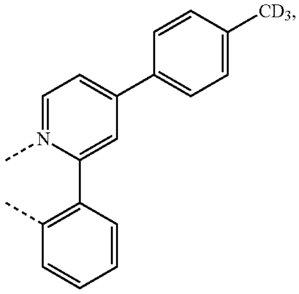
$L_{b318}$
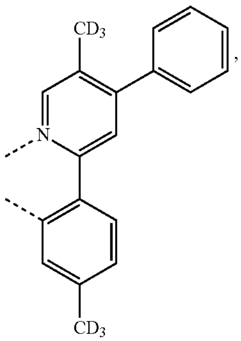
$L_{b319}$
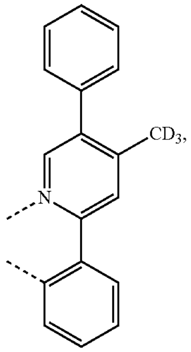
$L_{b320}$
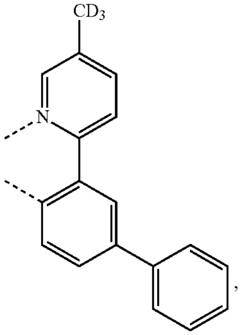
$L_{b321}$
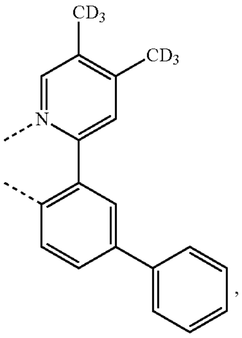
$L_{b322}$
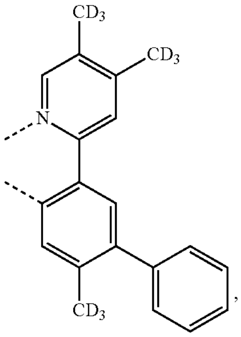
$L_{b323}$ -continued
$L_{b324}$
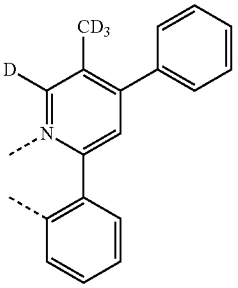,
$L_{b325}$
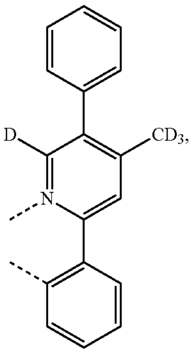,
$L_{b326}$
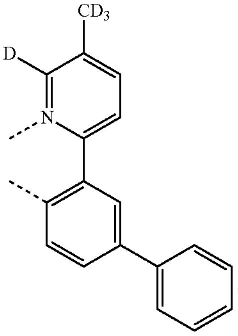,
$L_{b327}$
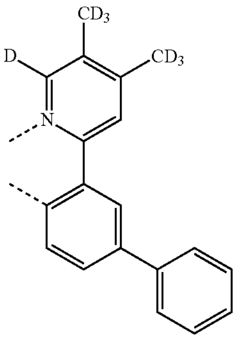, and
-continued
$L_{b328}$
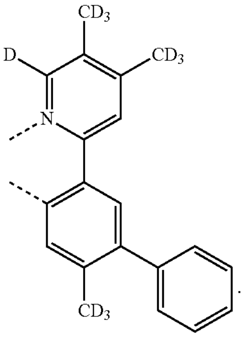.
8. The metal complex of claim 7, wherein Le is, at each occurrence identically or differently, selected from the group consisting of:
$L_{c1}$
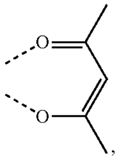,
$L_{c2}$
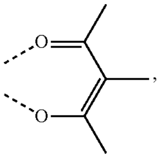,
$L_{c3}$
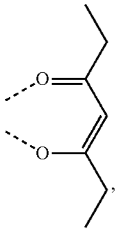,
$L_{c4}$
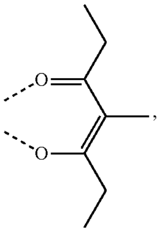,
$L_{c5}$
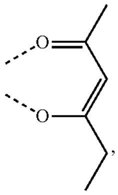, -continued
$L_{c6}$
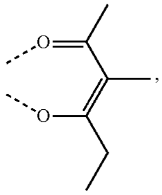
,
$L_{c7}$
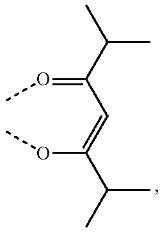
,
$L_{c8}$
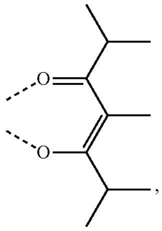
,
$L_{c9}$
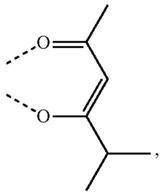
,
$L_{c10}$
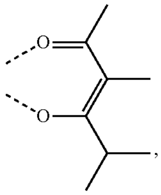
,
$L_{c11}$
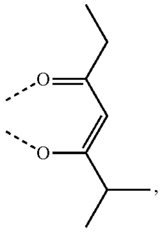
,
$L_{c12}$
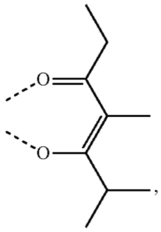
,
-continued
$L_{c13}$
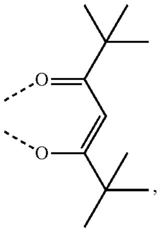
,
$L_{c14}$
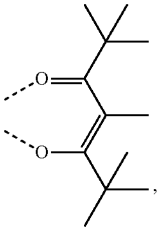
,
$L_{c15}$
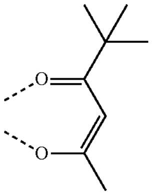
,
$L_{c16}$
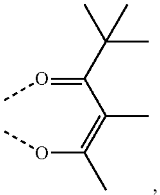
,
$L_{c17}$
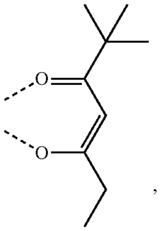
,
$L_{c18}$
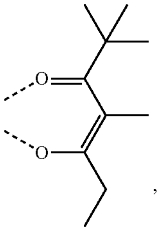
,
$L_{c19}$
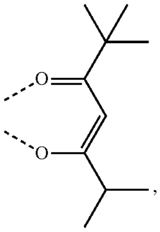
, -continued
$L_{c20}$
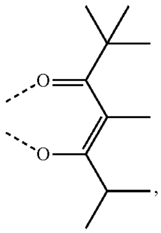
,
$L_{c21}$
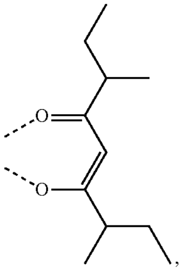
,
$L_{c22}$
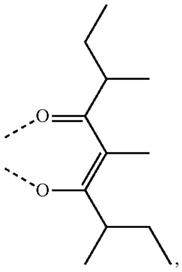
,
$L_{c23}$
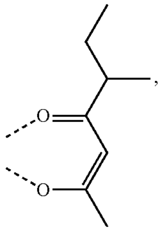
,
$L_{c24}$
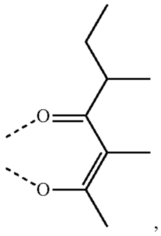
,
$L_{c25}$
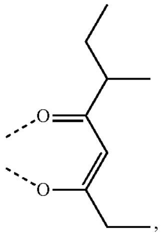
,
-continued
$L_{c26}$
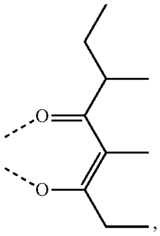
,
$L_{c27}$
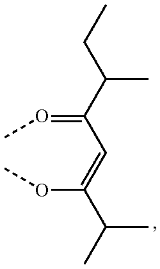
,
$L_{c28}$
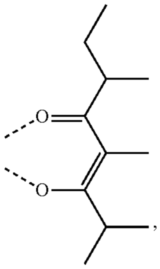
,
$L_{c29}$
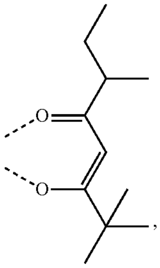
,
$L_{c30}$
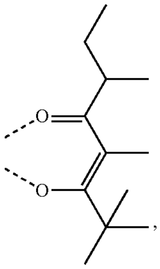
, -continued
$L_{c31}$
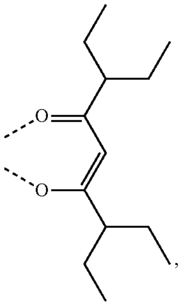
$L_{c32}$
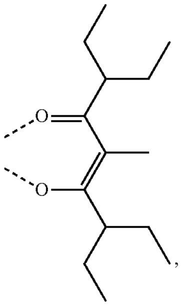
$L_{c33}$
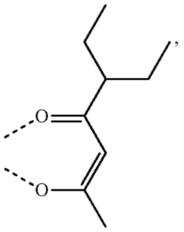
$L_{c34}$
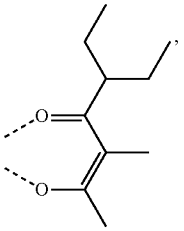
$L_{c35}$
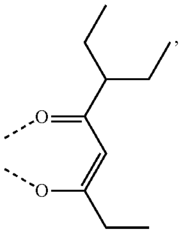
$L_{c36}$
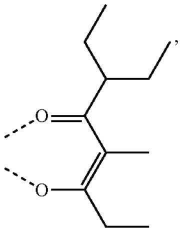
-continued
$L_{c37}$
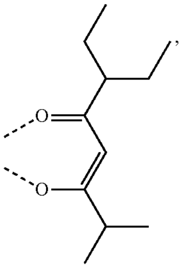
$L_{c38}$
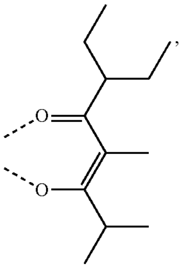
$L_{c39}$
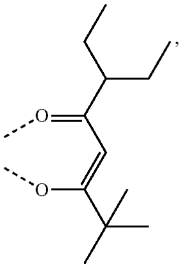
$L_{c40}$
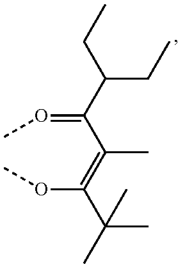
$L_{c41}$
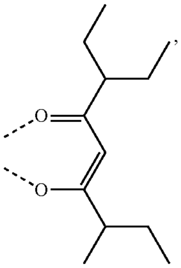

-continued
L$_{c42}$
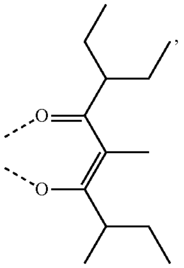
L$_{c43}$
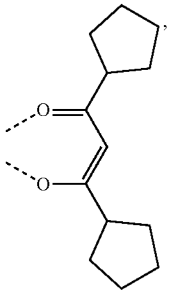
L$_{c44}$
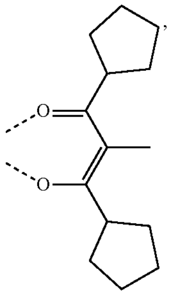
L$_{c45}$
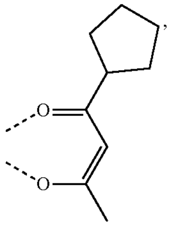
L$_{c46}$
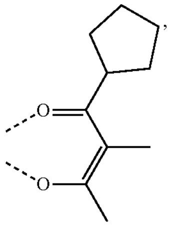
L$_{c47}$
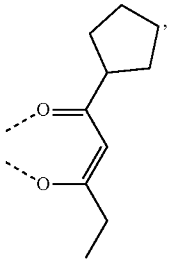
-continued
L$_{c48}$
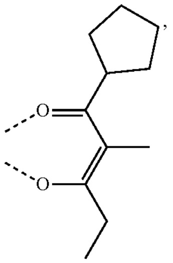
L$_{c49}$
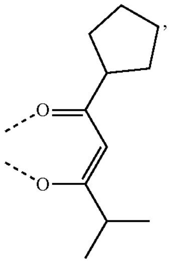
L$_{c50}$
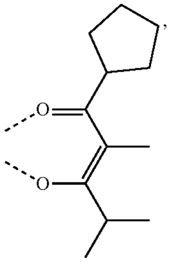
L$_{c51}$
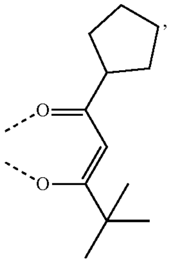
L$_{c52}$
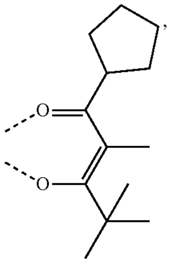
L$_{c53}$
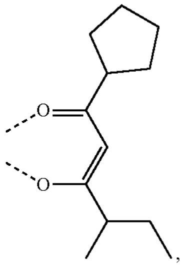

-continued
$L_{c54}$
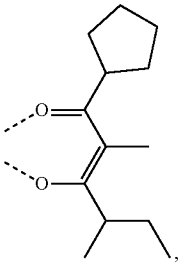
$L_{c55}$
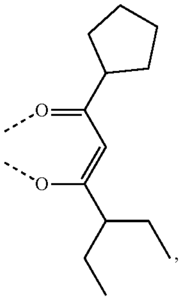
$L_{c56}$
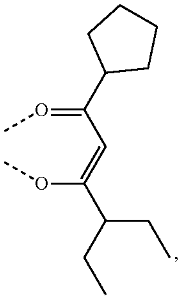
$L_{c57}$
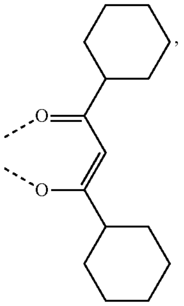
$L_{c58}$
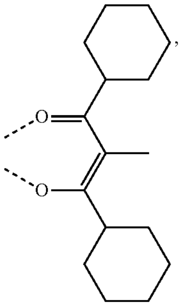
-continued
$L_{c59}$
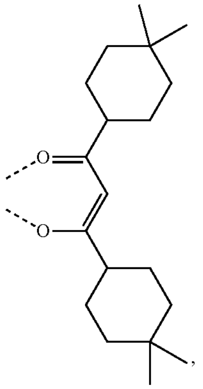
$L_{c60}$
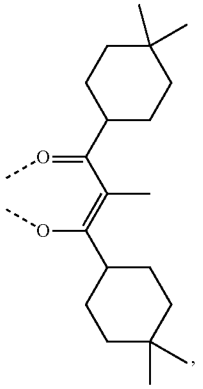
$L_{c61}$
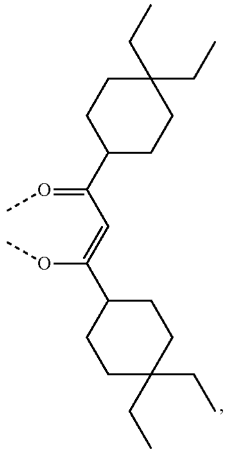

-continued
$L_{c62}$
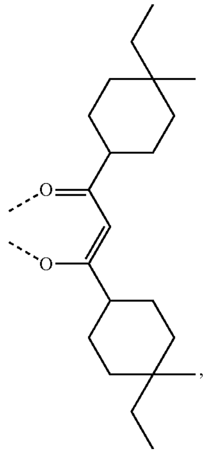
$L_{c63}$
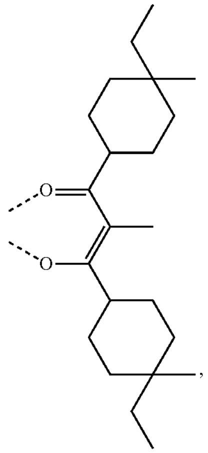
$L_{c64}$
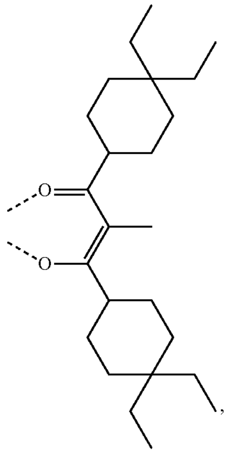
$L_{c65}$
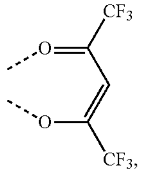
-continued
$L_{c66}$
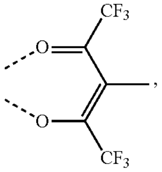
$L_{c67}$
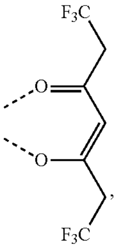
$L_{c68}$
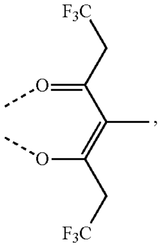
$L_{c69}$
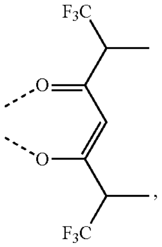
$L_{c70}$
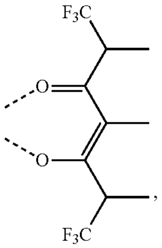
$L_{c71}$
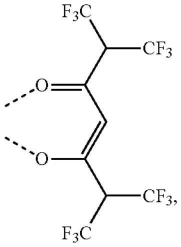

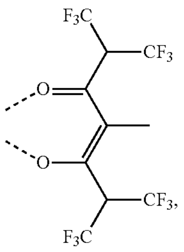
$L_{c72}$
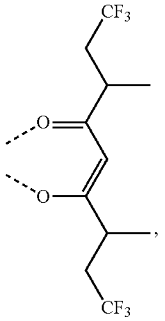
$L_{c73}$
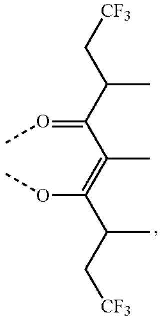
$L_{c74}$
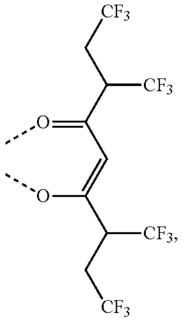
$L_{c75}$
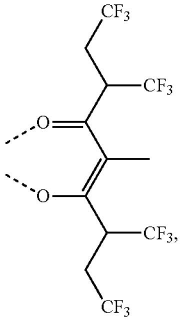
$L_{c76}$
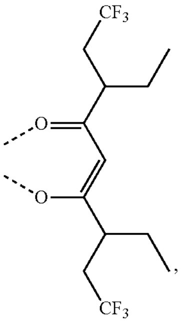
$L_{c77}$
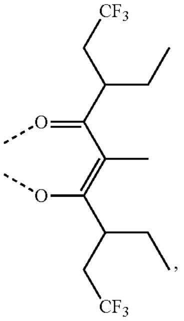
$L_{c78}$
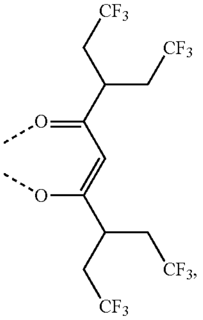
$L_{c79}$
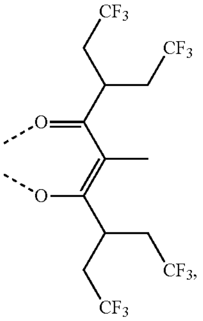
$L_{c80}$
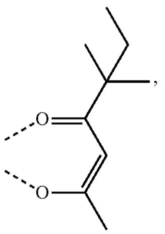
$L_{c81}$ -continued
$L_{c82}$
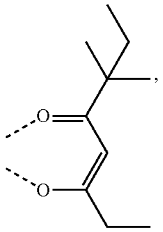
$L_{c83}$
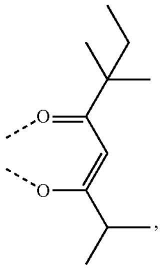
$L_{c84}$
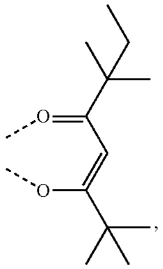
$L_{c85}$
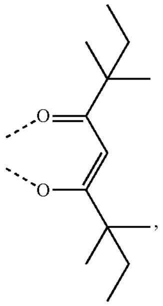
$L_{c86}$
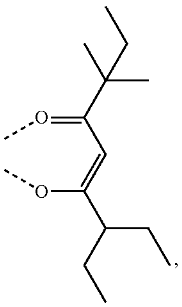
-continued
$L_{c87}$
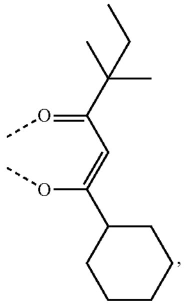
$L_{c88}$
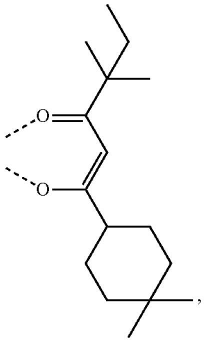
$L_{c89}$
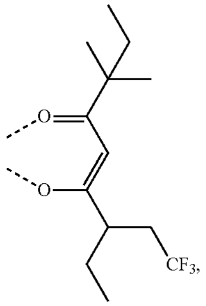
$L_{c90}$
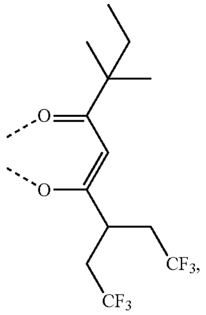
$L_{c91}$
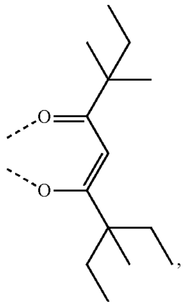

-continued
Lc92
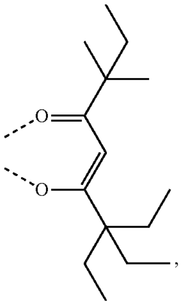
Lc93
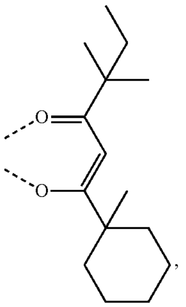
Lc94
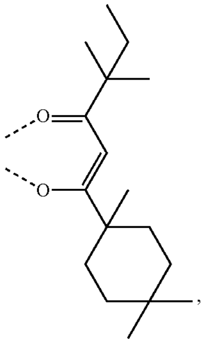
Lc95
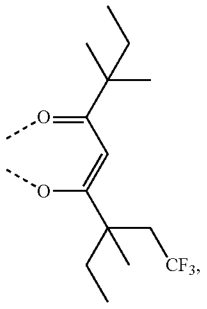
Lc96
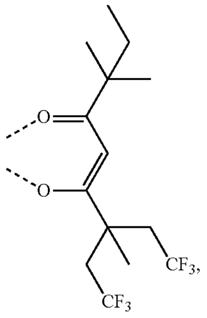
-continued
Lc97
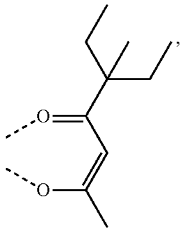
Lc98
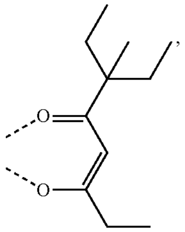
Lc99
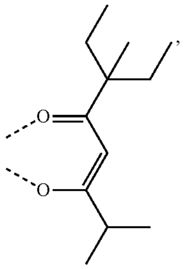
Lc100
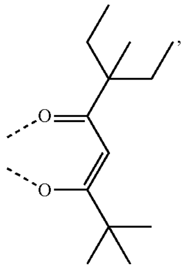
Lc101
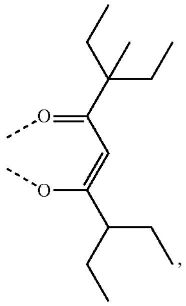

-continued
$L_{c102}$
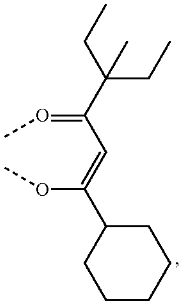
$L_{c103}$
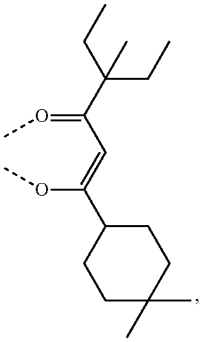
$L_{c104}$
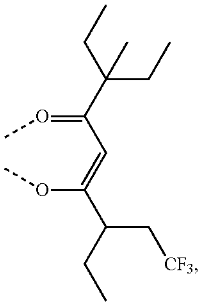
$L_{c105}$
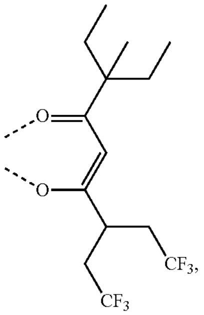
$L_{c106}$
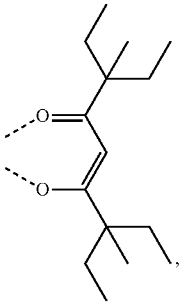
-continued
$L_{c107}$
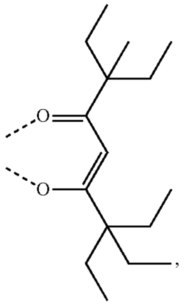
$L_{c108}$
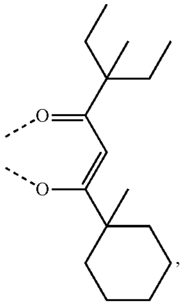
$L_{c109}$
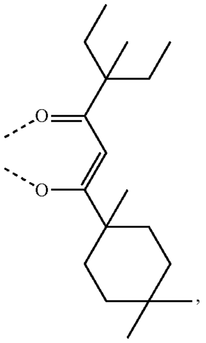
$L_{c110}$
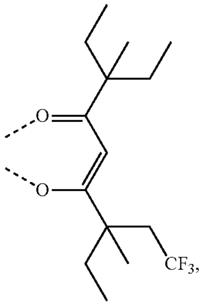
$L_{c111}$
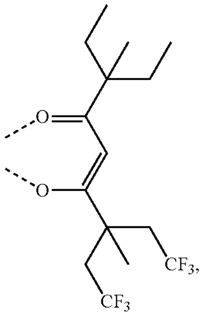

-continued
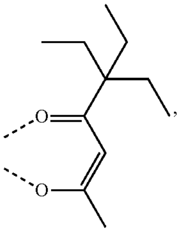
,
$L_{c112}$
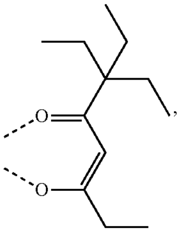
,
$L_{c113}$
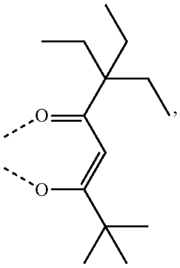
,
$L_{c115}$
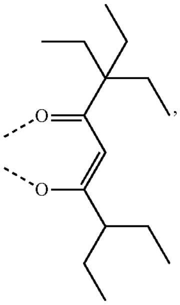
,
$L_{c116}$
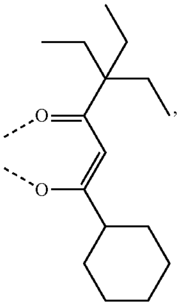
,
$L_{c117}$
-continued
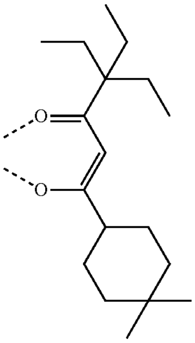
,
$L_{c118}$
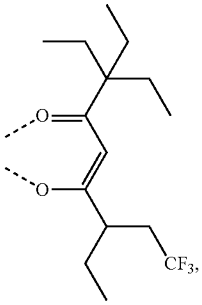
,
$L_{c119}$
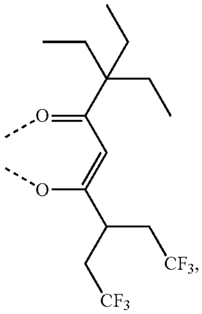
,
$L_{c120}$
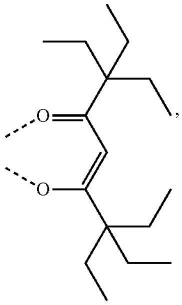
,
$L_{c121}$
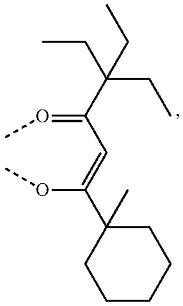
$L_{c122}$ -continued
$L_{c123}$
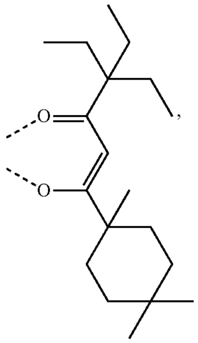
$L_{c124}$
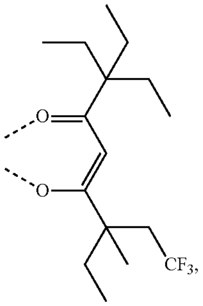
$L_{c125}$
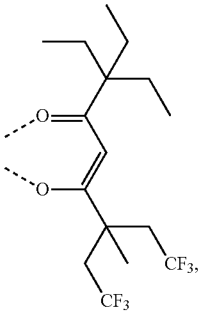
$L_{c126}$
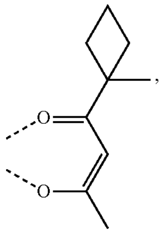
$L_{c127}$
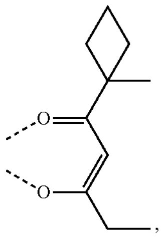
-continued
$L_{c128}$
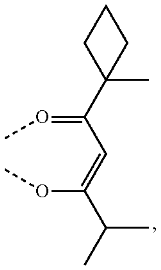
$L_{c129}$
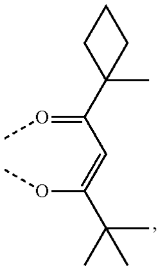
$L_{c130}$
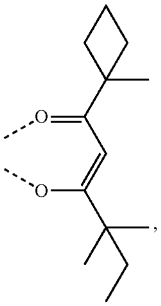
$L_{c131}$
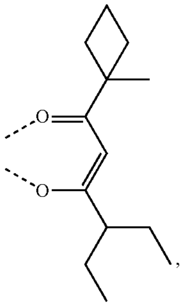
$L_{c132}$
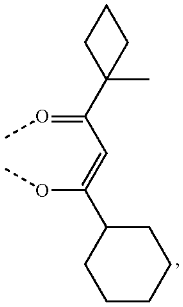

-continued
$L_{c133}$
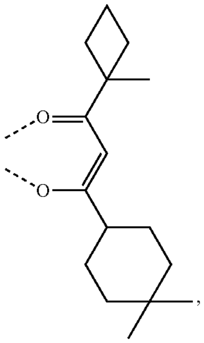
$L_{c134}$
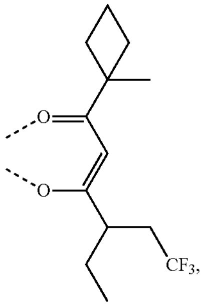
$L_{c135}$
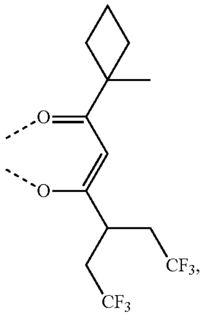
$L_{c136}$
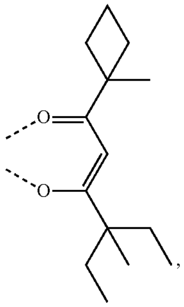
$L_{c137}$
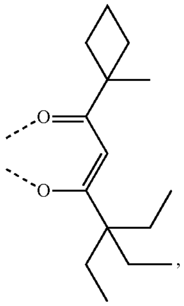
-continued
$L_{c138}$
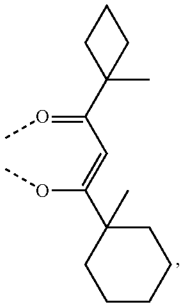
$L_{c139}$
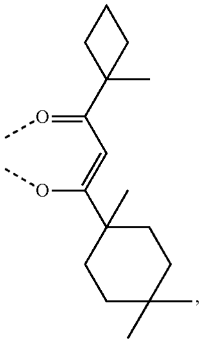
$L_{c140}$
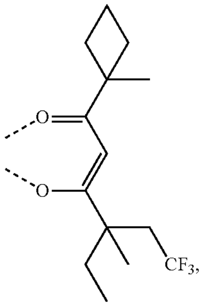
$L_{c141}$
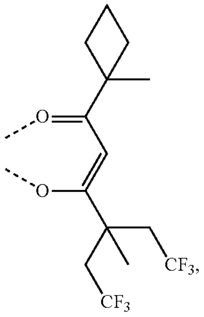
$L_{c142}$
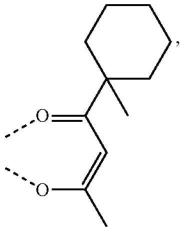

-continued
$L_{c143}$
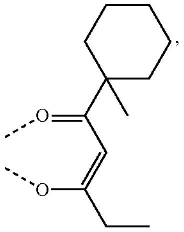
$L_{c144}$
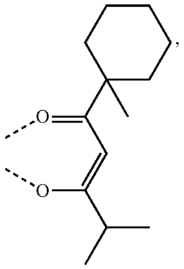
$L_{c145}$
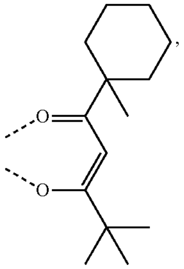
$L_{c146}$
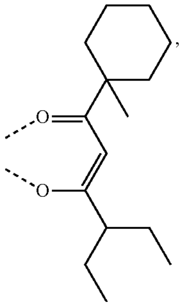
$L_{c147}$
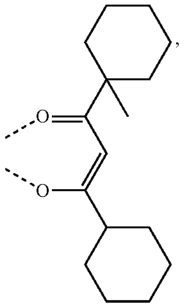
-continued
$L_{c148}$
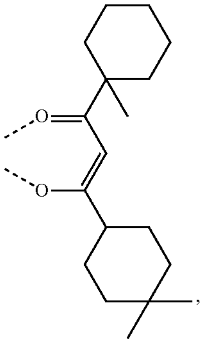
$L_{c149}$
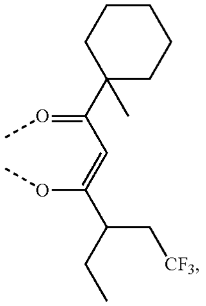
$L_{c150}$
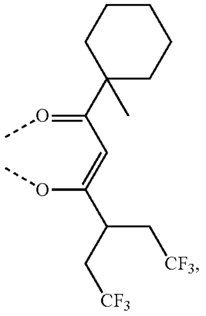
$L_{c151}$
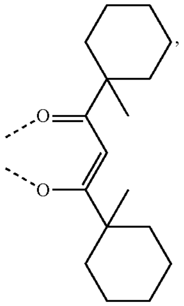
$L_{c152}$
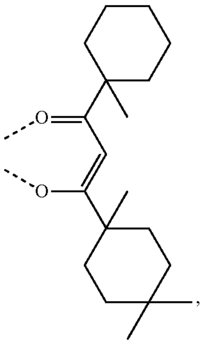

L$_{c153}$
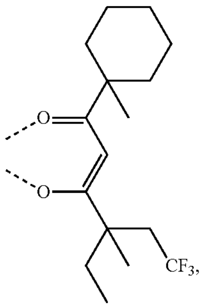
L$_{c154}$
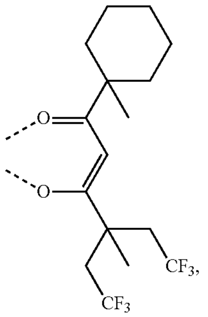
L$_{c155}$
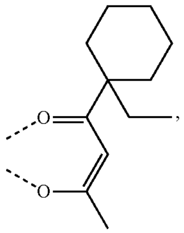
L$_{c156}$
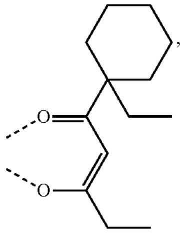
L$_{c157}$
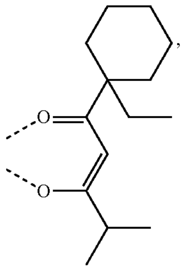
L$_{c158}$
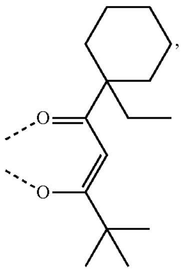
L$_{c159}$
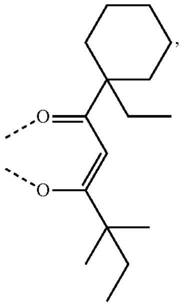
L$_{c160}$
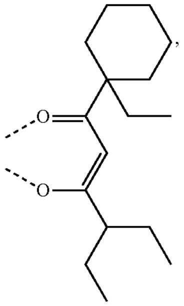
L$_{c161}$
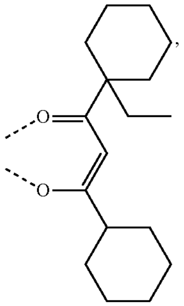
L$_{c162}$
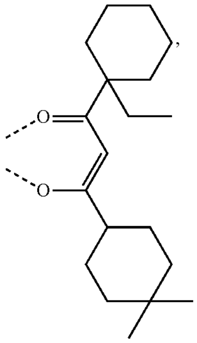

-continued
$L_{c163}$
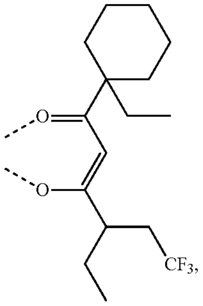
$L_{c164}$
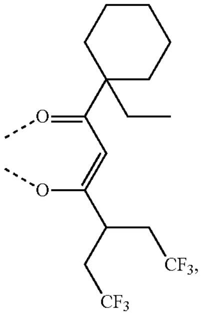
$L_{c165}$
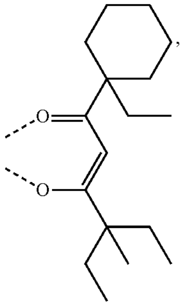
$L_{c166}$
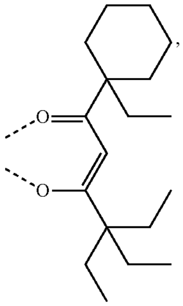
$L_{c167}$
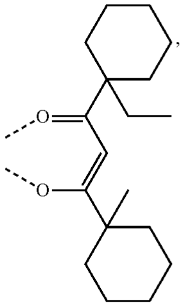
-continued
$L_{c168}$
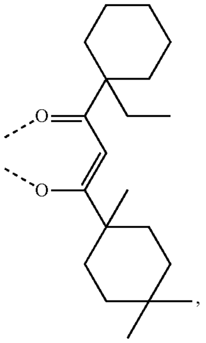
$L_{c169}$
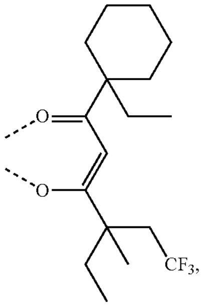
$L_{c170}$
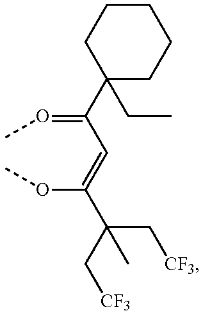
$L_{c171}$
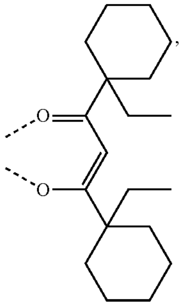
$L_{c172}$
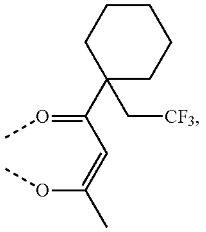

$L_{c173}$
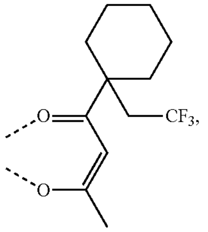
$L_{c174}$
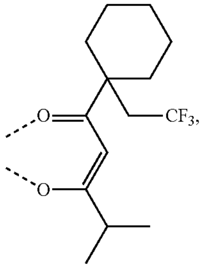
$L_{c175}$
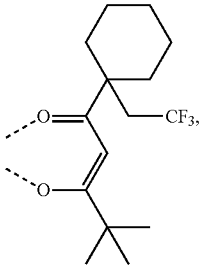
$L_{c176}$
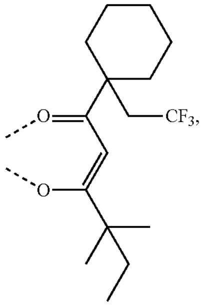
$L_{c177}$
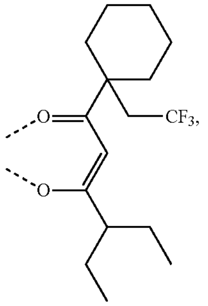
$L_{c178}$
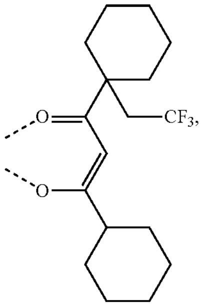
$L_{c179}$
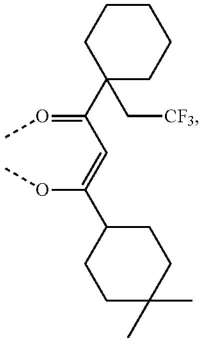
$L_{c180}$
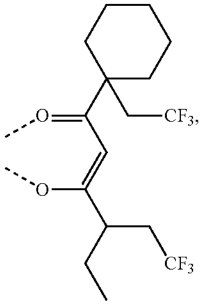
$L_{c181}$
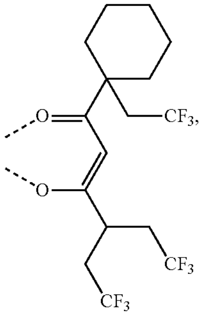
$L_{c182}$
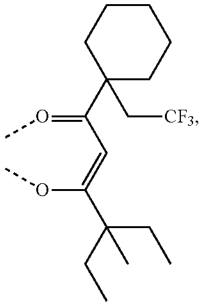

-continued
$L_{c183}$
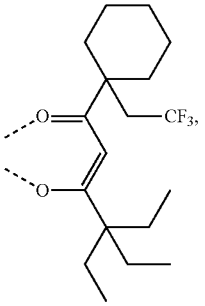
$L_{c184}$
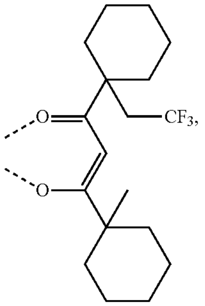
$L_{c185}$
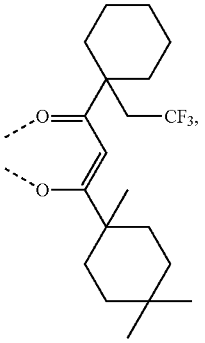
$L_{c186}$
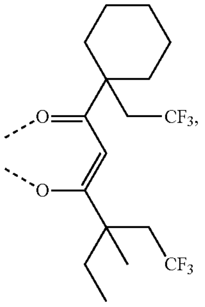
$L_{c187}$
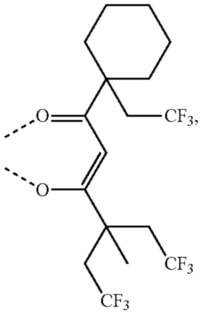
-continued
$L_{c188}$
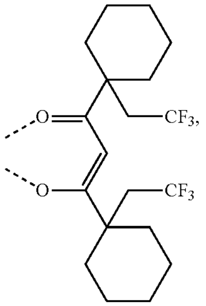
$L_{c189}$
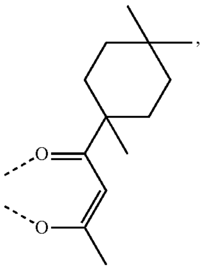
$L_{c190}$
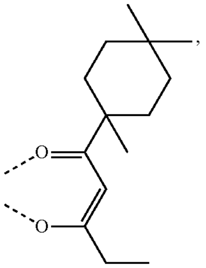
$L_{c191}$
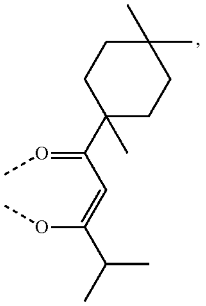
$L_{c192}$
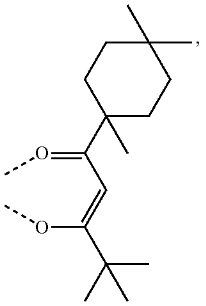

-continued
$L_{c193}$
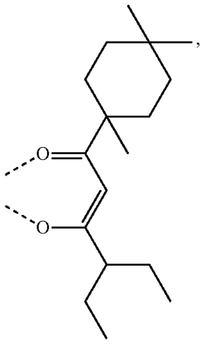
$L_{c194}$
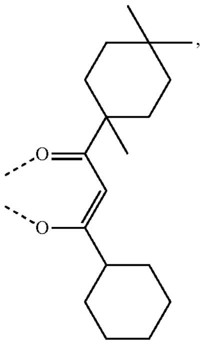
$L_{c195}$
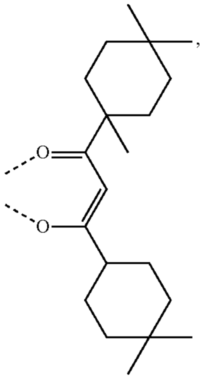
$L_{c196}$
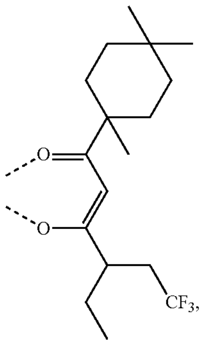
-continued
$L_{c197}$
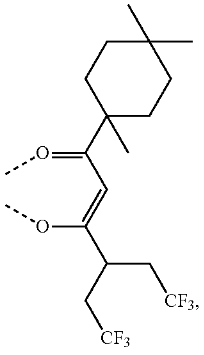
$L_{c198}$
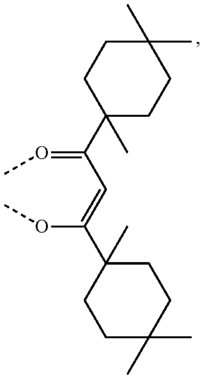
$L_{c199}$
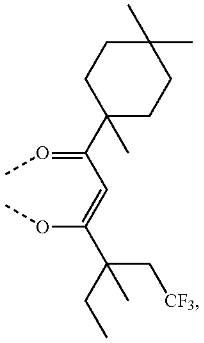
$L_{c200}$
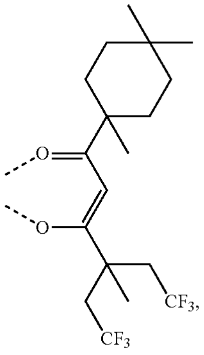

-continued
$L_{c201}$
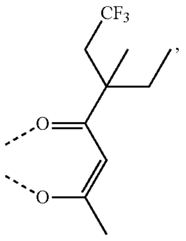
$L_{c202}$
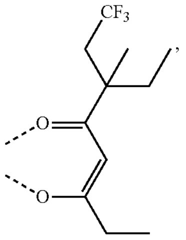
$L_{c203}$
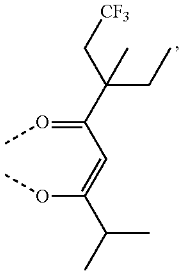
$L_{c204}$
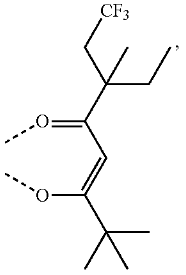
$L_{c205}$
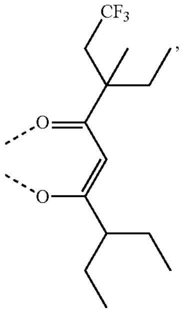
-continued
$L_{c206}$
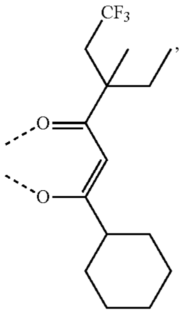
$L_{c207}$
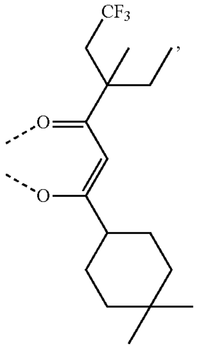
$L_{c208}$
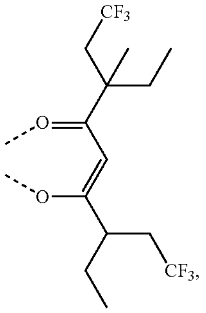
$L_{c209}$
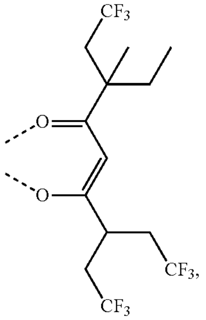
$L_{c210}$
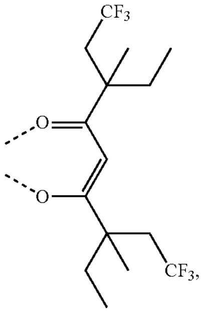

-continued
$L_{c211}$
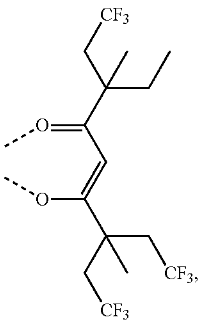
$L_{c212}$
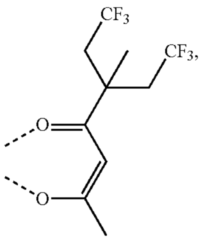
$L_{c213}$
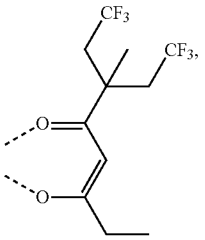
$L_{c214}$
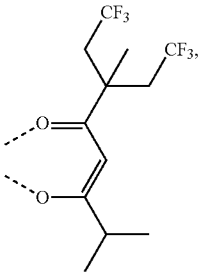
$L_{c215}$
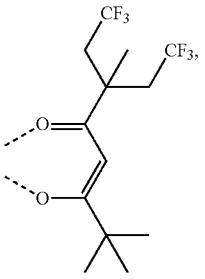
-continued
$L_{c216}$
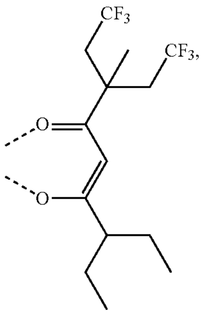
$L_{c217}$
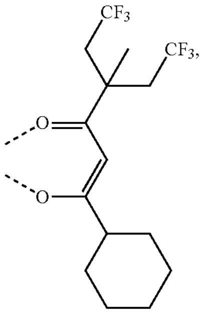
$L_{c218}$
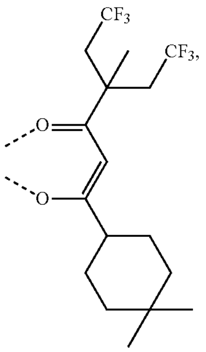
$L_{c219}$
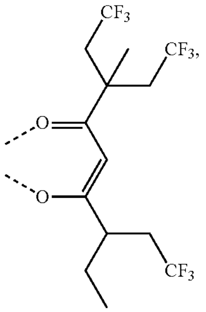
$L_{c220}$
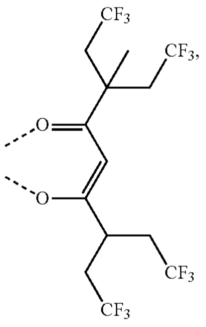

-continued
Lc221
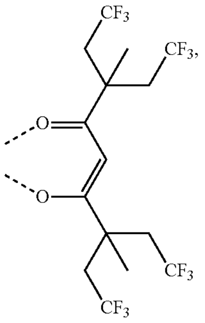
Lc222
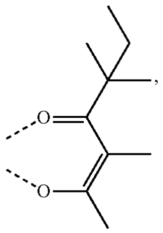
Lc223
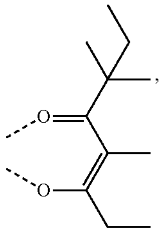
Lc224
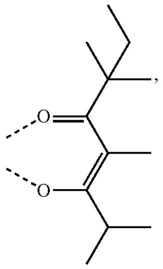
Lc225
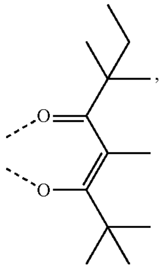
-continued
Lc226
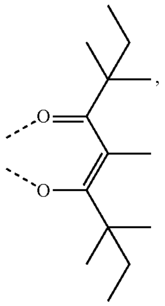
Lc227
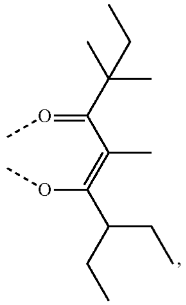
Lc228
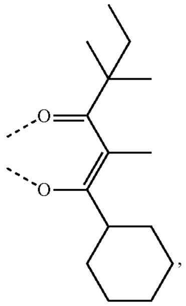
Lc229
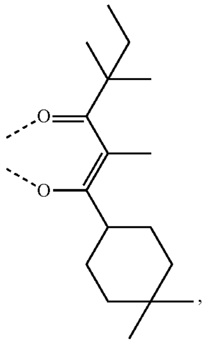
Lc230
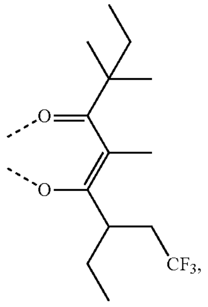

-continued
$L_{c231}$
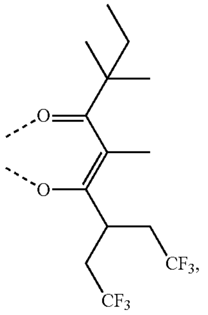
$L_{c232}$
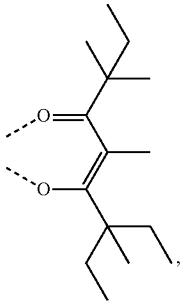
$L_{c233}$
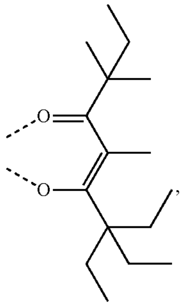
$L_{c234}$
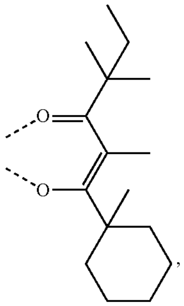
$L_{c235}$
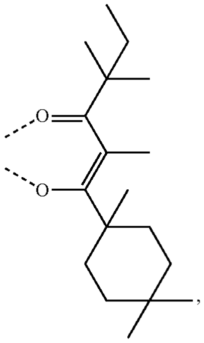
-continued
$L_{c236}$
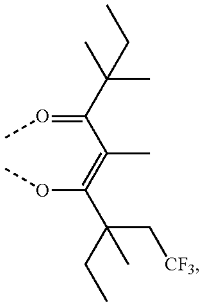
$L_{c237}$
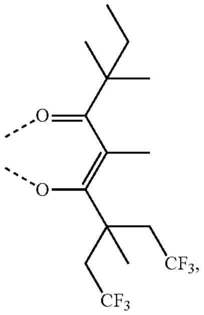
$L_{c238}$
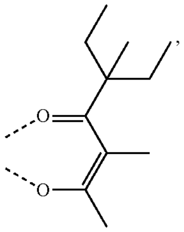
$L_{c239}$
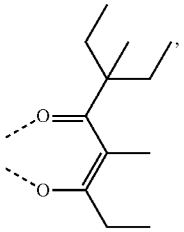
$L_{c240}$
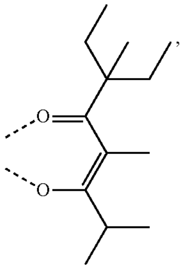

-continued
$L_{c241}$
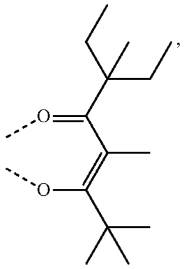
$L_{c242}$
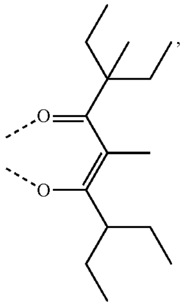
$L_{c243}$
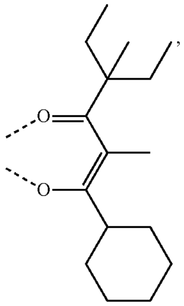
$L_{c244}$
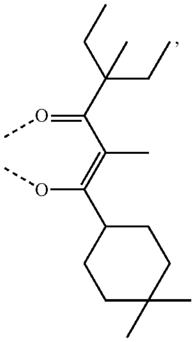
$L_{c245}$
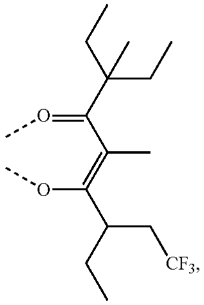
-continued
$L_{c246}$
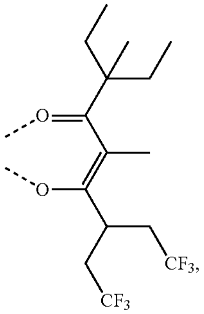
$L_{c247}$
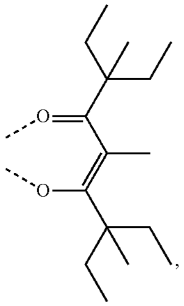
$L_{c248}$
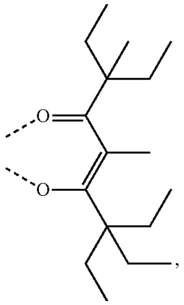
$L_{c249}$
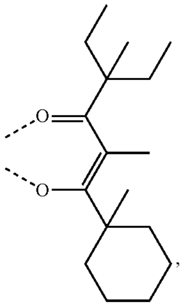
$L_{c250}$
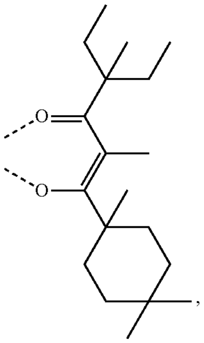

$L_{c251}$
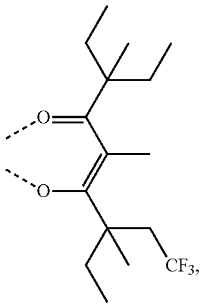
$L_{c252}$
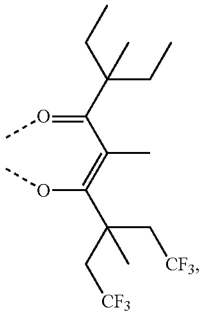
$L_{c253}$
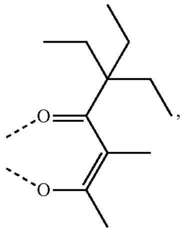
$L_{c254}$
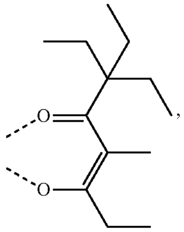
$L_{c255}$
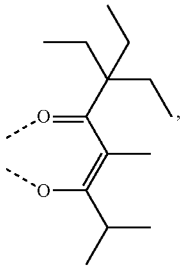
$L_{c256}$
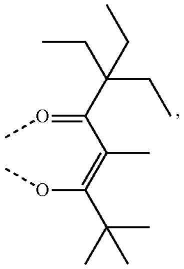
$L_{c257}$
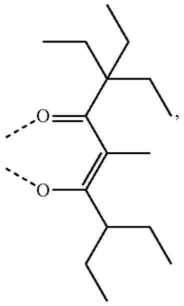
$L_{c258}$
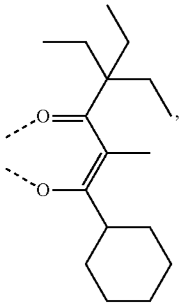
$L_{c259}$
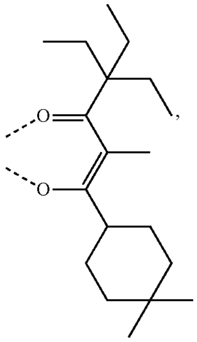
$L_{c260}$
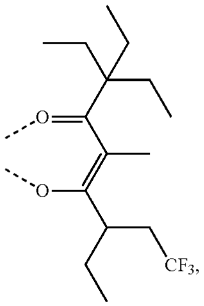

-continued
$L_{c261}$
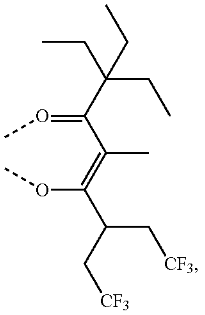
$L_{c262}$
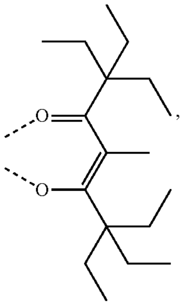
$L_{c263}$
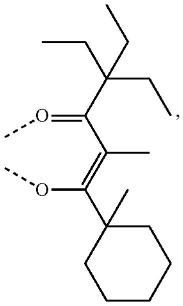
$L_{c264}$
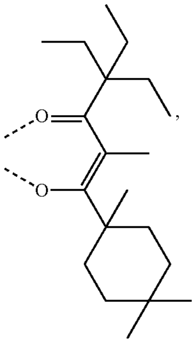
$L_{c265}$
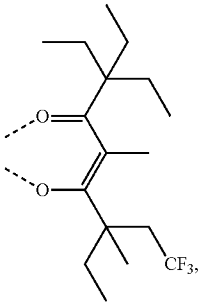
-continued
$L_{c266}$
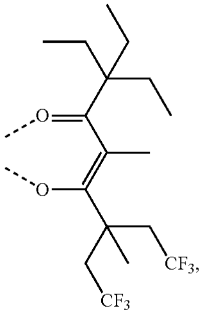
$L_{c267}$
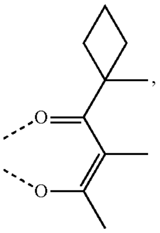
$L_{c268}$
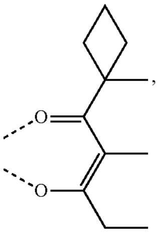
$L_{c269}$
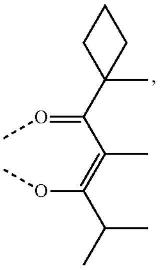
$L_{c270}$
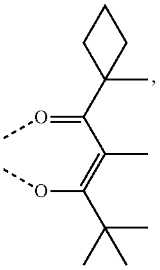

-continued
$L_{c271}$
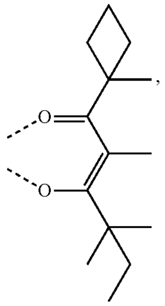
$L_{c272}$
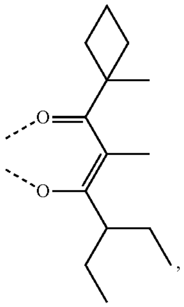
$L_{c273}$
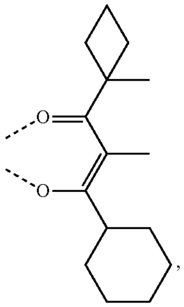
$L_{c274}$
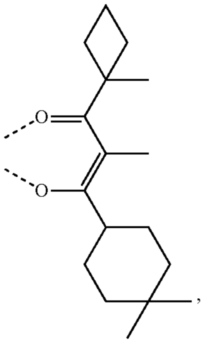
$L_{c275}$
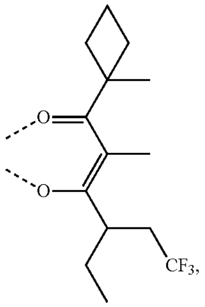
-continued
$L_{c276}$
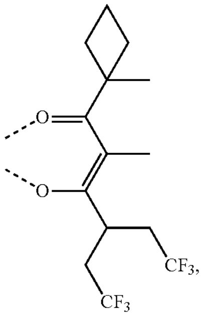
$L_{c277}$
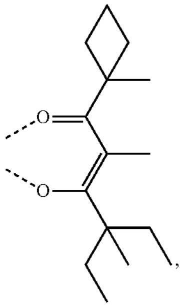
$L_{c278}$
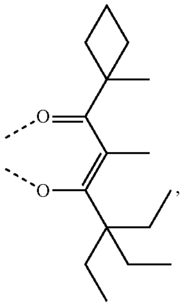
$L_{c279}$
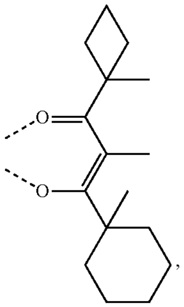
$L_{c280}$
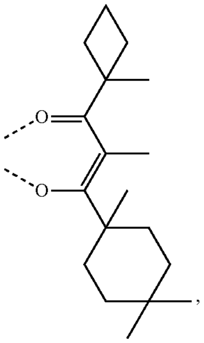

-continued
$L_{c281}$
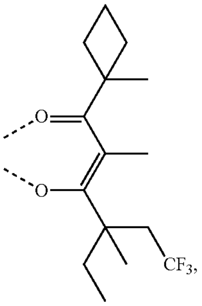
$L_{c282}$
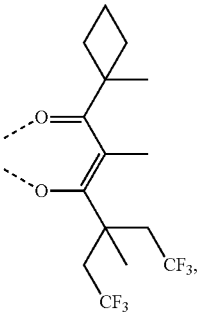
$L_{c283}$
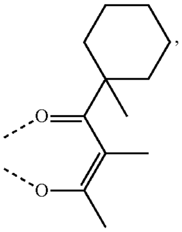
$L_{c284}$
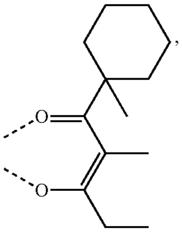
$L_{c285}$
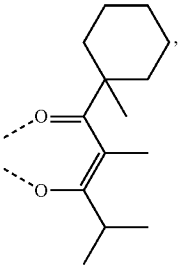
-continued
$L_{c286}$
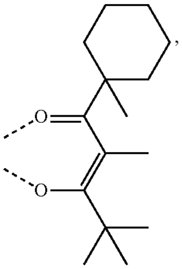
$L_{c287}$
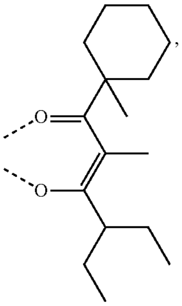
$L_{c288}$
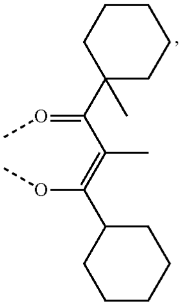
$L_{c289}$
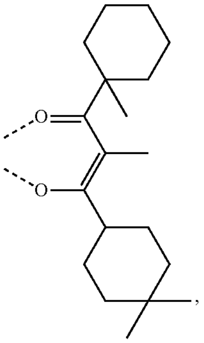
$L_{c290}$
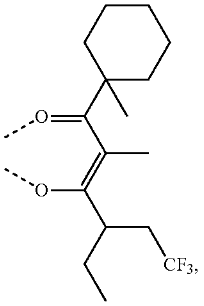

-continued
$L_{c291}$
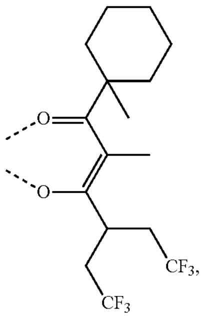
$L_{c292}$
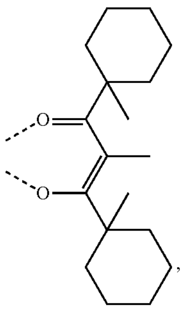
$L_{c293}$
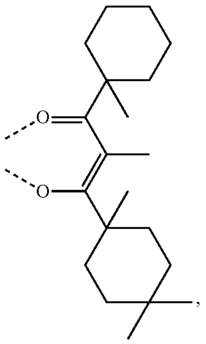
$L_{c294}$
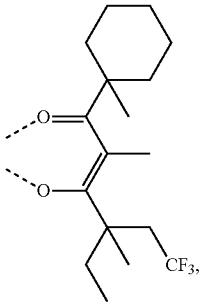
$L_{c295}$
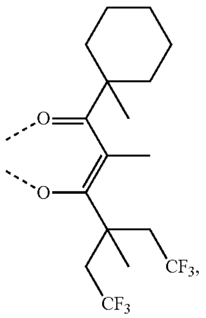
-continued
$L_{c296}$
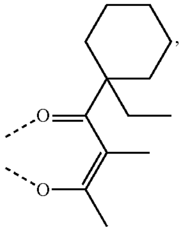
$L_{c297}$
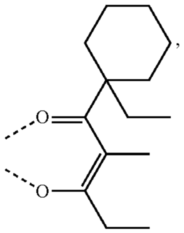
$L_{c298}$
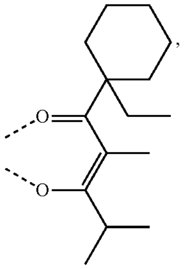
$L_{c299}$
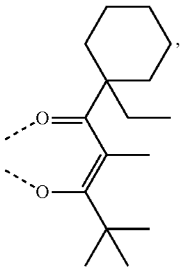
$L_{c300}$
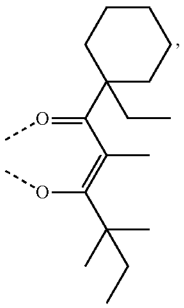

-continued
$L_{c301}$
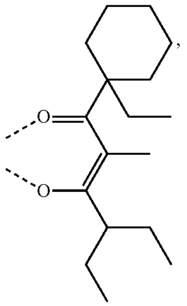
$L_{c302}$
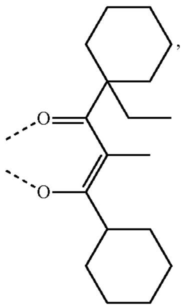
$L_{c303}$
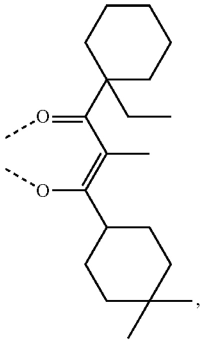
$L_{c304}$
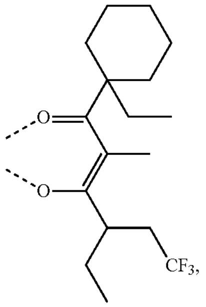
$L_{c305}$
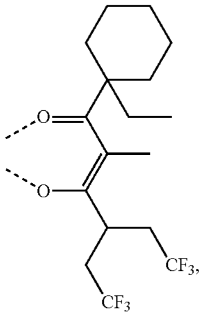
-continued
$L_{c306}$
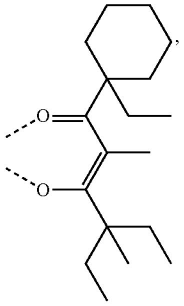
$L_{c307}$
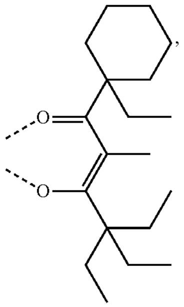
$L_{c308}$
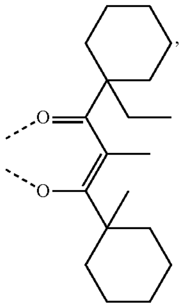
$L_{c309}$
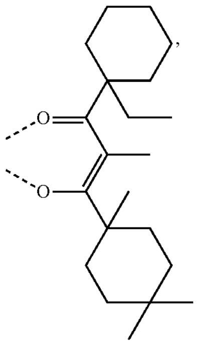
$L_{c310}$
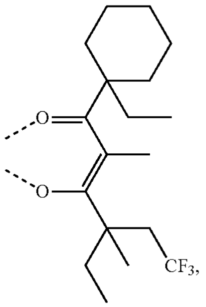

-continued
$L_{c311}$
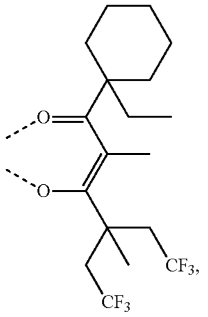
$L_{c312}$
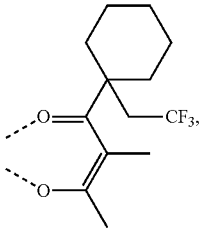
$L_{c313}$
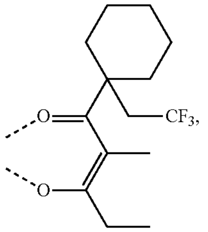
$L_{c314}$
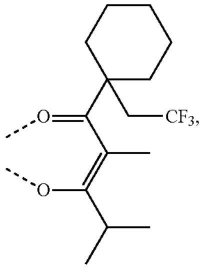
$L_{c315}$
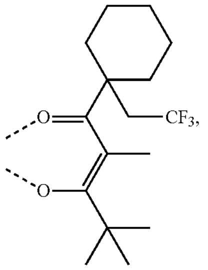
-continued
$L_{c316}$
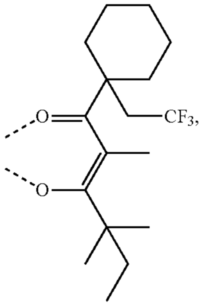
$L_{c317}$
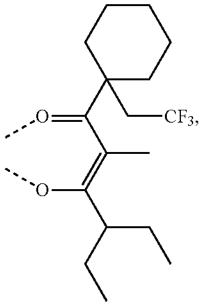
$L_{c318}$
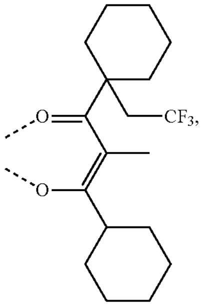
$L_{c319}$
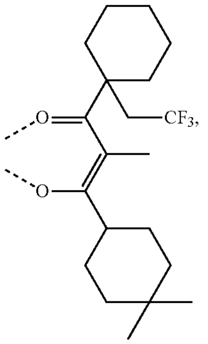
$L_{c320}$
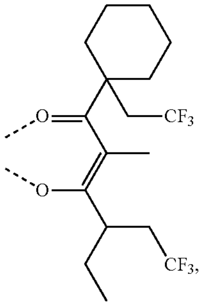

$L_{c321}$
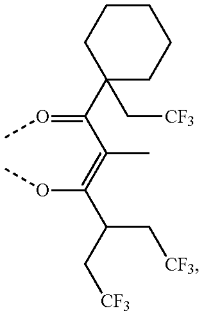,
$L_{c322}$
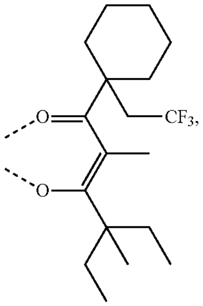,
$L_{c323}$
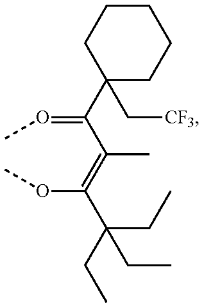,
$L_{c324}$
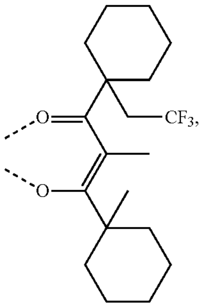,
$L_{c325}$
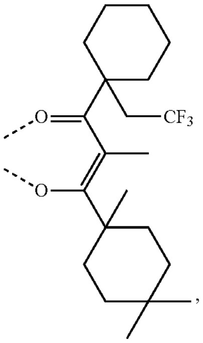,
$L_{c326}$
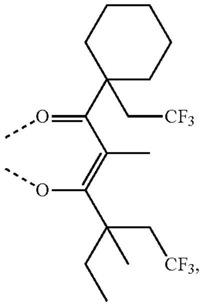,
$L_{c327}$
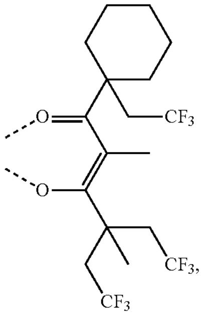,
$L_{c328}$
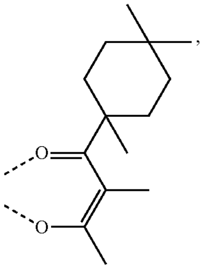,
$L_{c329}$
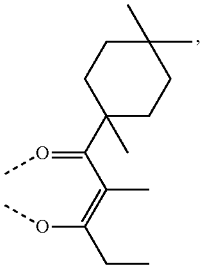,
$L_{c330}$
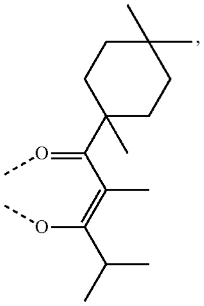, $L_{c331}$
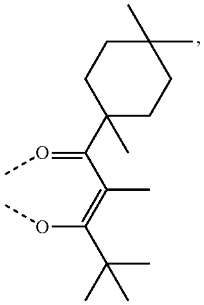
$L_{c332}$
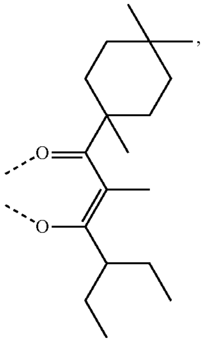
$L_{c333}$
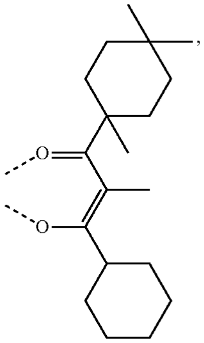
$L_{c334}$
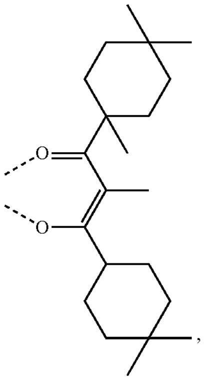
$L_{c335}$
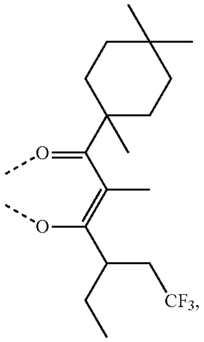
$L_{c336}$
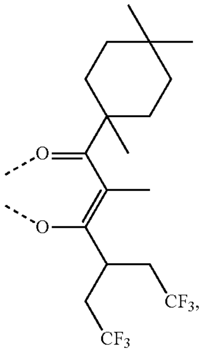
$L_{c337}$
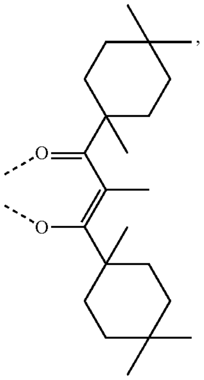
$L_{c338}$
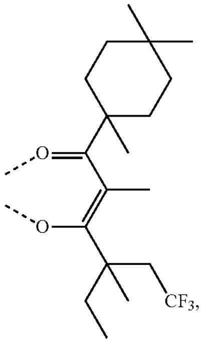

-continued
$L_{c339}$
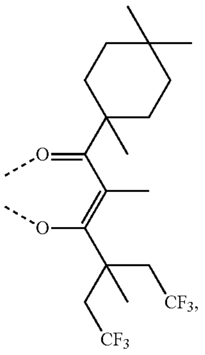
$L_{c340}$
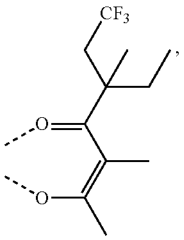
$L_{c341}$
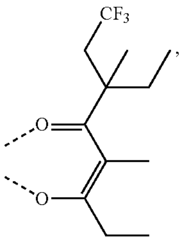
$L_{c342}$
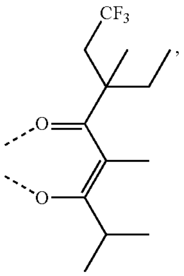
$L_{c343}$
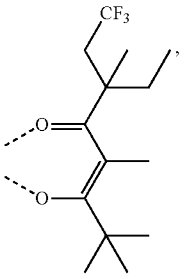
-continued
$L_{c344}$
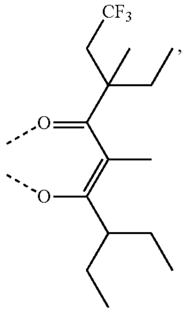
$L_{c345}$
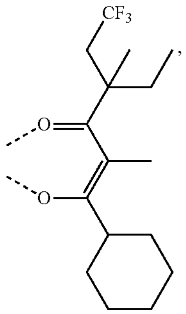
$L_{c346}$
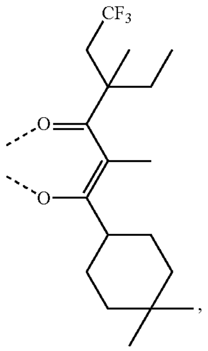
$L_{c347}$
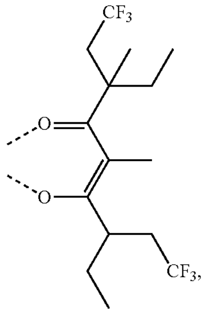
$L_{c348}$
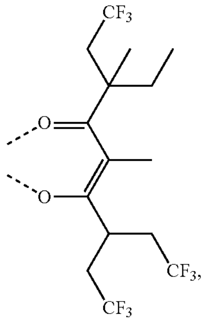

-continued
$L_{c349}$
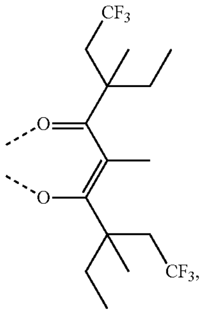
$L_{c350}$
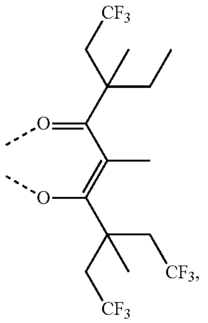
$L_{c351}$
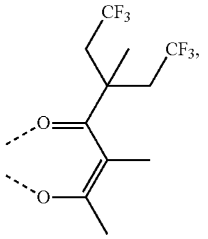
$L_{c352}$
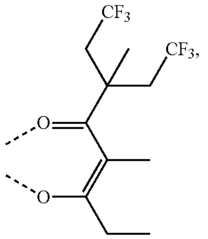
$L_{c353}$
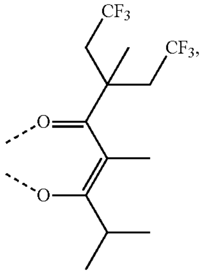
-continued
$L_{c354}$
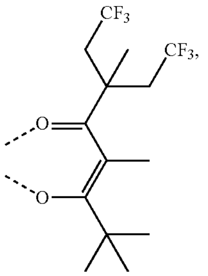
$L_{c355}$
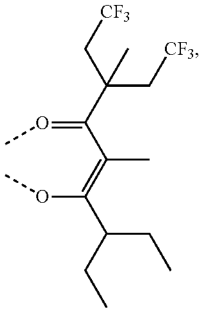
$L_{c356}$
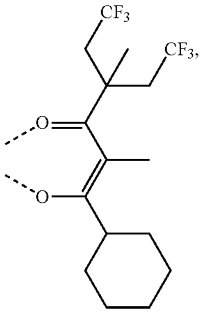
$L_{c357}$
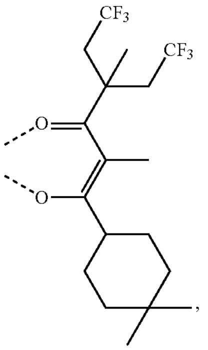
$L_{c358}$
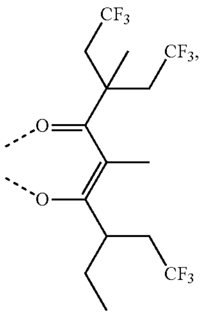

-continued $L_{c359}$

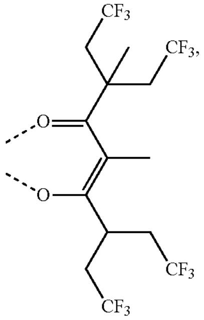

, and $L_{c360}$

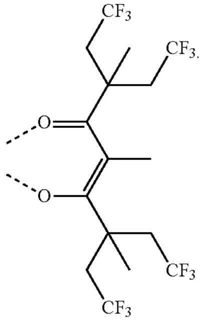

.

9. The metal complex of claim 8, wherein the metal complex has a structure of $Ir(L_a)_2(L_b)$ or $Ir(L_a)(L_b)_2$ or $Ir(L_a)_3$, wherein $L_a$ is, at each occurrence identically or differently, selected from any one or any two or any three of the group consisting of $L_{a12}$ to $L_{a77}$, $L_{a91}$ to $L_{a94}$, $L_{a98}$ to $L_{a102}$, $L_{a111}$ to $L_{a114}$, $L_{a142}$ to $L_{a150}$, $L_{a153}$ to $L_{a173}$, $L_{a177}$ to $L_{a192}$, $L_{a195}$ to $L_{a200}$, $L_{a229}$ to $L_{a306}$, $L_{a327}$ to $L_{a360}$, $L_{a381}$ to $L_{a456}$, $L_{a466}$ to $L_{a477}$, $L_{a482}$ to $L_{a488}$, $L_{a490}$, $L_{a495}$ to $L_{a501}$, $L_{a503}$, $L_{a517}$ to $L_{a582}$, $L_{a596}$ to $L_{a599}$, $L_{a603}$ to $L_{a607}$, $L_{a616}$ to $L_{a19}$, $L_{a647}$ to $L_{a655}$, $L_{a670}$ to $L_{a675}$, $L_{a678}$ to $L_{a761}$, $L_{a782}$ to $L_{a793}$, $L_{a804}$ to $L_{a877}$, $L_{a887}$ to $L_{a900}$, $L_{a903}$ to $L_{a909}$, $L_{a911}$ to $L_{a912}$, $L_{a916}$ to $L_{a922}$, $L_{a924}$, $L_{a928}$ to $L_{a934}$, $L_{a936}$, $L_{a938}$, and $L_b$ is selected from any one or any two of the group consisting of $L_{b1}$ to $L_{b328}$; or the metal complex has a structure of $Ir(L_a)_2(L_c)$ or $Ir(L_a)(L_c)_2$, wherein $L_a$ is, at each occurrence identically or differently, selected from any one or any two of the group consisting of $L_{a12}$ to $L_{a77}$, $L_{a91}$ to $L_{a94}$, $L_{a98}$ to $L_{a102}$, $L_{a111}$ to $L_{a114}$, $L_{a142}$ to $L_{a150}$, $L_{a153}$ to $L_{a173}$, $L_{a177}$ to $L_{a192}$, $L_{a195}$ to $L_{a200}$, $L_{a229}$ to $L_{a306}$, $L_{a327}$ to $L_{a360}$, $L_{a381}$ to $L_{a456}$, $L_{a466}$ to $L_{a477}$, $L_{a482}$ to $L_{a488}$, $L_{a490}$, $L_{a495}$ to $L_{a501}$, $L_{a503}$, $L_{a517}$ to $L_{a582}$, $L_{a596}$ to $L_{a599}$, $L_{a603}$ to $L_{a607}$, $L_{a616}$ to $L_{a19}$, $L_{a647}$ to $L_{a655}$, $L_{a670}$ to $L_{a675}$, $L_{a678}$ to $L_{a761}$, $L_{a782}$ to $L_{a793}$, $L_{a804}$ to $L_{a877}$, $L_{a887}$ to $L_{a900}$, $L_{a903}$ to $L_{a909}$, $L_{a911}$ to $L_{a912}$, $L_{a916}$ to $L_{a922}$, $L_{a924}$, $L_{a928}$ to $L_{a934}$, $L_{a936}$, $L_{a938}$, and $L_c$ is selected from any one or any two of the group consisting of $L_{c1}$ to $L_{c360}$; or the metal complex has a structure of $Ir(L_a)(L_b)(L_c)$, wherein $L_a$ is, at each occurrence identically or differently, selected from any one of the group consisting of $L_{a12}$ to $L_{a77}$, $L_{a91}$ to $L_{a94}$, $L_{a98}$ to $L_{a102}$, $L_{a111}$ to $L_{a114}$, $L_{a142}$ to $L_{a150}$, $L_{a153}$ to $L_{a173}$, $L_{a177}$ to $L_{a192}$, $L_{a195}$ to $L_{a200}$, $L_{a229}$ to $L_{a306}$, $L_{a327}$ to $L_{a360}$, $L_{a381}$ to $L_{a456}$, $L_{a466}$ to $L_{a477}$, $L_{a482}$ to $L_{a488}$, $L_{a490}$, $L_{a495}$ to $L_{a501}$, $L_{a503}$, $L_{a517}$ to $L_{a582}$, $L_{a596}$ to $L_{a599}$, $L_{a603}$ to $L_{a607}$, $L_{a616}$ to $L_{a19}$, $L_{a647}$ to $L_{a655}$, $L_{a670}$ to $L_{a675}$, $L_{a678}$ to $L_{a761}$, $L_{a782}$ to $L_{a793}$, $L_{a804}$ to $L_{a877}$, $L_{a887}$ to $L_{a900}$, $L_{a903}$ to $L_{a909}$, $L_{a911}$ to $L_{a912}$, $L_{a916}$ to $L_{a922}$, $L_{a924}$, $L_{a928}$ to $L_{a934}$, $L_{a936}$, $L_{a938}$, $L_b$ is selected from any one of the group consisting of $L_{b1}$ to $L_{b328}$, and $L_c$ is selected from any one of the group consisting of $L_{c1}$ to $L_{c360}$;

wherein the metal complex is selected from the group consisting of metal complex 39 to metal complex 266, metal complex 305 to metal complex 1102, metal complex 1179 to metal complex 1824, metal complex 1863 to metal complex 1900, wherein metal complex 39 to metal complex 266, metal complex 305 to metal complex 1102, metal complex 1179 to metal complex 1824, metal complex 1863 to metal complex 1900 have a structure of $IrL_a(L_b)_2$, wherein two $L_b$ are identical, and $L_a$ and $L_b$ correspond to structures in the following table, respectively:

| Metal complex | $L_a$ | $L_b$ | Metal complex | $L_a$ | $L_b$ |
|---|---|---|---|---|---|
| 39 | $L_{a13}$ | $L_{b1}$ | 40 | $L_{a13}$ | $L_{b3}$ |
| 41 | $L_{a13}$ | $L_{b4}$ | 42 | $L_{a13}$ | $L_{b8}$ |
| 43 | $L_{a13}$ | $L_{b10}$ | 44 | $L_{a13}$ | $L_{b12}$ |
| 45 | $L_{a13}$ | $L_{b13}$ | 46 | $L_{a13}$ | $L_{b17}$ |
| 47 | $L_{a13}$ | $L_{b21}$ | 48 | $L_{a13}$ | $L_{b22}$ |
| 49 | $L_{a13}$ | $L_{b26}$ | 50 | $L_{a13}$ | $L_{b28}$ |
| 51 | $L_{a13}$ | $L_{b30}$ | 52 | $L_{a13}$ | $L_{b31}$ |
| 53 | $L_{a13}$ | $L_{b35}$ | 54 | $L_{a13}$ | $L_{b37}$ |
| 55 | $L_{a13}$ | $L_{b38}$ | 56 | $L_{a13}$ | $L_{b39}$ |
| 57 | $L_{a13}$ | $L_{b40}$ | 58 | $L_{a13}$ | $L_{b41}$ |
| 59 | $L_{a13}$ | $L_{b42}$ | 60 | $L_{a13}$ | $L_{b43}$ |
| 61 | $L_{a13}$ | $L_{b44}$ | 62 | $L_{a13}$ | $L_{b45}$ |
| 63 | $L_{a13}$ | $L_{b71}$ | 64 | $L_{a13}$ | $L_{b72}$ |
| 65 | $L_{a13}$ | $L_{b79}$ | 66 | $L_{a13}$ | $L_{b80}$ |
| 67 | $L_{a13}$ | $L_{b81}$ | 68 | $L_{a13}$ | $L_{b99}$ |
| 69 | $L_{a13}$ | $L_{b112}$ | 70 | $L_{a13}$ | $L_{b151}$ |
| 71 | $L_{a13}$ | $L_{b153}$ | 72 | $L_{a13}$ | $L_{b164}$ |
| 73 | $L_{a13}$ | $L_{b166}$ | 74 | $L_{a13}$ | $L_{b209}$ |
| 75 | $L_{a13}$ | $L_{b287}$ | 76 | $L_{a13}$ | $L_{b299}$ |
| 77 | $L_{a14}$ | $L_{b1}$ | 78 | $L_{a14}$ | $L_{b3}$ |
| 79 | $L_{a14}$ | $L_{b4}$ | 80 | $L_{a14}$ | $L_{b8}$ |
| 81 | $L_{a14}$ | $L_{b10}$ | 82 | $L_{a14}$ | $L_{b12}$ |
| 83 | $L_{a14}$ | $L_{b13}$ | 84 | $L_{a14}$ | $L_{b17}$ |
| 85 | $L_{a14}$ | $L_{b21}$ | 86 | $L_{a14}$ | $L_{b22}$ |
| 87 | $L_{a14}$ | $L_{b26}$ | 88 | $L_{a14}$ | $L_{b28}$ |
| 89 | $L_{a14}$ | $L_{b30}$ | 90 | $L_{a14}$ | $L_{b31}$ |
| 91 | $L_{a14}$ | $L_{b35}$ | 92 | $L_{a14}$ | $L_{b37}$ |
| 93 | $L_{a14}$ | $L_{b38}$ | 94 | $L_{a14}$ | $L_{b39}$ |
| 95 | $L_{a14}$ | $L_{b40}$ | 96 | $L_{a14}$ | $L_{b41}$ |
| 97 | $L_{a14}$ | $L_{b42}$ | 98 | $L_{a14}$ | $L_{b43}$ |
| 99 | $L_{a14}$ | $L_{b44}$ | 100 | $L_{a14}$ | $L_{b45}$ |
| 101 | $L_{a14}$ | $L_{b71}$ | 102 | $L_{a14}$ | $L_{b72}$ |
| 103 | $L_{a14}$ | $L_{b79}$ | 104 | $L_{a14}$ | $L_{b80}$ |
| 105 | $L_{a14}$ | $L_{b81}$ | 106 | $L_{a14}$ | $L_{b99}$ |
| 107 | $L_{a14}$ | $L_{b112}$ | 108 | $L_{a14}$ | $L_{b151}$ |
| 109 | $L_{a14}$ | $L_{b153}$ | 110 | $L_{a14}$ | $L_{b164}$ |
| 111 | $L_{a14}$ | $L_{b166}$ | 112 | $L_{a14}$ | $L_{b209}$ |
| 113 | $L_{a14}$ | $L_{b287}$ | 114 | $L_{a14}$ | $L_{b299}$ |
| 115 | $L_{a18}$ | $L_{b1}$ | 116 | $L_{a18}$ | $L_{b3}$ |
| 117 | $L_{a18}$ | $L_{b4}$ | 118 | $L_{a18}$ | $L_{b8}$ |
| 119 | $L_{a18}$ | $L_{b10}$ | 120 | $L_{a18}$ | $L_{b12}$ |
| 121 | $L_{a18}$ | $L_{b13}$ | 122 | $L_{a18}$ | $L_{b17}$ |
| 123 | $L_{a18}$ | $L_{b21}$ | 124 | $L_{a18}$ | $L_{b22}$ |
| 125 | $L_{a18}$ | $L_{b26}$ | 126 | $L_{a18}$ | $L_{b28}$ |
| 127 | $L_{a18}$ | $L_{b30}$ | 128 | $L_{a18}$ | $L_{b31}$ |
| 129 | $L_{a18}$ | $L_{b35}$ | 130 | $L_{a18}$ | $L_{b37}$ |
| 131 | $L_{a18}$ | $L_{b38}$ | 132 | $L_{a18}$ | $L_{b39}$ |
| 133 | $L_{a18}$ | $L_{b40}$ | 134 | $L_{a18}$ | $L_{b41}$ |
| 135 | $L_{a18}$ | $L_{b42}$ | 136 | $L_{a18}$ | $L_{b43}$ |
| 137 | $L_{a18}$ | $L_{b44}$ | 138 | $L_{a18}$ | $L_{b45}$ |
| 139 | $L_{a18}$ | $L_{b71}$ | 140 | $L_{a18}$ | $L_{b72}$ |
| 141 | $L_{a18}$ | $L_{b79}$ | 142 | $L_{a18}$ | $L_{b80}$ |
| 143 | $L_{a18}$ | $L_{b81}$ | 144 | $L_{a18}$ | $L_{b99}$ |
| 145 | $L_{a18}$ | $L_{b112}$ | 146 | $L_{a18}$ | $L_{b151}$ |
| 147 | $L_{a18}$ | $L_{b153}$ | 148 | $L_{a18}$ | $L_{b164}$ |
| 149 | $L_{a18}$ | $L_{b166}$ | 150 | $L_{a18}$ | $L_{b209}$ |
| 151 | $L_{a18}$ | $L_{b287}$ | 152 | $L_{a18}$ | $L_{b299}$ |

-continued

| Metal complex | $L_a$ | $L_b$ | Metal complex | $L_a$ | $L_b$ |
|---|---|---|---|---|---|
| 153 | $L_{a20}$ | $L_{b1}$ | 154 | $L_{a20}$ | $L_{b3}$ |
| 155 | $L_{a20}$ | $L_{b4}$ | 156 | $L_{a20}$ | $L_{b8}$ |
| 157 | $L_{a20}$ | $L_{b10}$ | 158 | $L_{a20}$ | $L_{b12}$ |
| 159 | $L_{a20}$ | $L_{b13}$ | 160 | $L_{a20}$ | $L_{b17}$ |
| 161 | $L_{a20}$ | $L_{b21}$ | 162 | $L_{a20}$ | $L_{b22}$ |
| 163 | $L_{a20}$ | $L_{b26}$ | 164 | $L_{a20}$ | $L_{b28}$ |
| 165 | $L_{a20}$ | $L_{b30}$ | 166 | $L_{a20}$ | $L_{b31}$ |
| 167 | $L_{a20}$ | $L_{b35}$ | 168 | $L_{a20}$ | $L_{b37}$ |
| 169 | $L_{a20}$ | $L_{b38}$ | 170 | $L_{a20}$ | $L_{b39}$ |
| 171 | $L_{a20}$ | $L_{b40}$ | 172 | $L_{a20}$ | $L_{b41}$ |
| 173 | $L_{a20}$ | $L_{b42}$ | 174 | $L_{a20}$ | $L_{b43}$ |
| 175 | $L_{a20}$ | $L_{b44}$ | 176 | $L_{a20}$ | $L_{b45}$ |
| 177 | $L_{a20}$ | $L_{b71}$ | 178 | $L_{a20}$ | $L_{b72}$ |
| 179 | $L_{a20}$ | $L_{b79}$ | 180 | $L_{a20}$ | $L_{b80}$ |
| 181 | $L_{a20}$ | $L_{b81}$ | 182 | $L_{a20}$ | $L_{b99}$ |
| 183 | $L_{a20}$ | $L_{b112}$ | 184 | $L_{a20}$ | $L_{b151}$ |
| 185 | $L_{a20}$ | $L_{b153}$ | 186 | $L_{a20}$ | $L_{b164}$ |
| 187 | $L_{a20}$ | $L_{b166}$ | 188 | $L_{a20}$ | $L_{b209}$ |
| 189 | $L_{a20}$ | $L_{b287}$ | 190 | $L_{a20}$ | $L_{b299}$ |
| 191 | $L_{a57}$ | $L_{b1}$ | 192 | $L_{a57}$ | $L_{b3}$ |
| 193 | $L_{a57}$ | $L_{b4}$ | 194 | $L_{a57}$ | $L_{b8}$ |
| 195 | $L_{a57}$ | $L_{b10}$ | 196 | $L_{a57}$ | $L_{b12}$ |
| 197 | $L_{a57}$ | $L_{b13}$ | 198 | $L_{a57}$ | $L_{b17}$ |
| 199 | $L_{a57}$ | $L_{b21}$ | 200 | $L_{a57}$ | $L_{b22}$ |
| 201 | $L_{a57}$ | $L_{b26}$ | 202 | $L_{a57}$ | $L_{b28}$ |
| 203 | $L_{a57}$ | $L_{b30}$ | 204 | $L_{a57}$ | $L_{b31}$ |
| 205 | $L_{a57}$ | $L_{b35}$ | 206 | $L_{a57}$ | $L_{b37}$ |
| 207 | $L_{a57}$ | $L_{b38}$ | 208 | $L_{a57}$ | $L_{b39}$ |
| 209 | $L_{a57}$ | $L_{b40}$ | 210 | $L_{a57}$ | $L_{b41}$ |
| 211 | $L_{a57}$ | $L_{b42}$ | 212 | $L_{a57}$ | $L_{b43}$ |
| 213 | $L_{a57}$ | $L_{b44}$ | 214 | $L_{a57}$ | $L_{b45}$ |
| 215 | $L_{a57}$ | $L_{b71}$ | 216 | $L_{a57}$ | $L_{b72}$ |
| 217 | $L_{a57}$ | $L_{b79}$ | 218 | $L_{a57}$ | $L_{b80}$ |
| 219 | $L_{a57}$ | $L_{b81}$ | 220 | $L_{a57}$ | $L_{b99}$ |
| 221 | $L_{a57}$ | $L_{b112}$ | 222 | $L_{a57}$ | $L_{b151}$ |
| 223 | $L_{a57}$ | $L_{b153}$ | 224 | $L_{a57}$ | $L_{b164}$ |
| 225 | $L_{a57}$ | $L_{b166}$ | 226 | $L_{a57}$ | $L_{b209}$ |
| 227 | $L_{a57}$ | $L_{b287}$ | 228 | $L_{a57}$ | $L_{b299}$ |
| 229 | $L_{a70}$ | $L_{b1}$ | 230 | $L_{a70}$ | $L_{b3}$ |
| 231 | $L_{a70}$ | $L_{b4}$ | 232 | $L_{a70}$ | $L_{b8}$ |
| 233 | $L_{a70}$ | $L_{b10}$ | 234 | $L_{a70}$ | $L_{b12}$ |
| 235 | $L_{a70}$ | $L_{b13}$ | 236 | $L_{a70}$ | $L_{b17}$ |
| 237 | $L_{a70}$ | $L_{b21}$ | 238 | $L_{a70}$ | $L_{b22}$ |
| 239 | $L_{a70}$ | $L_{b26}$ | 240 | $L_{a70}$ | $L_{b28}$ |
| 241 | $L_{a70}$ | $L_{b30}$ | 242 | $L_{a70}$ | $L_{b31}$ |
| 243 | $L_{a70}$ | $L_{b35}$ | 244 | $L_{a70}$ | $L_{b37}$ |
| 245 | $L_{a70}$ | $L_{b38}$ | 246 | $L_{a70}$ | $L_{b39}$ |
| 247 | $L_{a70}$ | $L_{b40}$ | 248 | $L_{a70}$ | $L_{b41}$ |
| 249 | $L_{a70}$ | $L_{b42}$ | 250 | $L_{a70}$ | $L_{b43}$ |
| 251 | $L_{a70}$ | $L_{b44}$ | 252 | $L_{a70}$ | $L_{b45}$ |
| 253 | $L_{a70}$ | $L_{b71}$ | 254 | $L_{a70}$ | $L_{b72}$ |
| 255 | $L_{a70}$ | $L_{b79}$ | 256 | $L_{a70}$ | $L_{b80}$ |
| 257 | $L_{a70}$ | $L_{b81}$ | 258 | $L_{a70}$ | $L_{b99}$ |
| 259 | $L_{a70}$ | $L_{b112}$ | 260 | $L_{a70}$ | $L_{b151}$ |
| 261 | $L_{a70}$ | $L_{b153}$ | 262 | $L_{a70}$ | $L_{b164}$ |
| 263 | $L_{a70}$ | $L_{b166}$ | 264 | $L_{a70}$ | $L_{b209}$ |
| 265 | $L_{a70}$ | $L_{b287}$ | 266 | $L_{a70}$ | $L_{b299}$ |
| 305 | $L_{a92}$ | $L_{b1}$ | 306 | $L_{a92}$ | $L_{b3}$ |
| 307 | $L_{a92}$ | $L_{b4}$ | 308 | $L_{a92}$ | $L_{b8}$ |
| 309 | $L_{a92}$ | $L_{b10}$ | 310 | $L_{a92}$ | $L_{b12}$ |
| 311 | $L_{a92}$ | $L_{b13}$ | 312 | $L_{a92}$ | $L_{b17}$ |
| 313 | $L_{a92}$ | $L_{b21}$ | 314 | $L_{a92}$ | $L_{b22}$ |
| 315 | $L_{a92}$ | $L_{b26}$ | 316 | $L_{a92}$ | $L_{b28}$ |
| 317 | $L_{a92}$ | $L_{b30}$ | 318 | $L_{a92}$ | $L_{b31}$ |
| 319 | $L_{a92}$ | $L_{b35}$ | 320 | $L_{a92}$ | $L_{b37}$ |
| 321 | $L_{a92}$ | $L_{b38}$ | 322 | $L_{a92}$ | $L_{b39}$ |
| 323 | $L_{a92}$ | $L_{b40}$ | 324 | $L_{a92}$ | $L_{b41}$ |
| 325 | $L_{a92}$ | $L_{b42}$ | 326 | $L_{a92}$ | $L_{b43}$ |
| 327 | $L_{a92}$ | $L_{b44}$ | 328 | $L_{a92}$ | $L_{b45}$ |
| 329 | $L_{a92}$ | $L_{b71}$ | 330 | $L_{a92}$ | $L_{b72}$ |
| 331 | $L_{a92}$ | $L_{b79}$ | 332 | $L_{a92}$ | $L_{b80}$ |
| 333 | $L_{a92}$ | $L_{b81}$ | 334 | $L_{a92}$ | $L_{b99}$ |
| 335 | $L_{a92}$ | $L_{b112}$ | 336 | $L_{a92}$ | $L_{b151}$ |
| 337 | $L_{a92}$ | $L_{b153}$ | 338 | $L_{a92}$ | $L_{b164}$ |
| 339 | $L_{a92}$ | $L_{b166}$ | 340 | $L_{a92}$ | $L_{b209}$ |
| 341 | $L_{a92}$ | $L_{b287}$ | 342 | $L_{a92}$ | $L_{b299}$ |

-continued

| Metal complex | $L_a$ | $L_b$ | Metal complex | $L_a$ | $L_b$ |
|---|---|---|---|---|---|
| 343 | $L_{a113}$ | $L_{b1}$ | 344 | $L_{a113}$ | $L_{b3}$ |
| 345 | $L_{a113}$ | $L_{b4}$ | 346 | $L_{a113}$ | $L_{b8}$ |
| 347 | $L_{a113}$ | $L_{b10}$ | 348 | $L_{a113}$ | $L_{b12}$ |
| 349 | $L_{a113}$ | $L_{b13}$ | 350 | $L_{a113}$ | $L_{b17}$ |
| 351 | $L_{a113}$ | $L_{b21}$ | 352 | $L_{a113}$ | $L_{b22}$ |
| 353 | $L_{a113}$ | $L_{b26}$ | 354 | $L_{a113}$ | $L_{b28}$ |
| 355 | $L_{a113}$ | $L_{b30}$ | 356 | $L_{a113}$ | $L_{b31}$ |
| 357 | $L_{a113}$ | $L_{b35}$ | 358 | $L_{a113}$ | $L_{b37}$ |
| 359 | $L_{a113}$ | $L_{b38}$ | 360 | $L_{a113}$ | $L_{b39}$ |
| 361 | $L_{a113}$ | $L_{b40}$ | 362 | $L_{a113}$ | $L_{b41}$ |
| 363 | $L_{a113}$ | $L_{b42}$ | 364 | $L_{a113}$ | $L_{b43}$ |
| 365 | $L_{a113}$ | $L_{b44}$ | 366 | $L_{a113}$ | $L_{b45}$ |
| 367 | $L_{a113}$ | $L_{b71}$ | 368 | $L_{a113}$ | $L_{b72}$ |
| 369 | $L_{a113}$ | $L_{b79}$ | 370 | $L_{a113}$ | $L_{b80}$ |
| 371 | $L_{a113}$ | $L_{b81}$ | 372 | $L_{a113}$ | $L_{b99}$ |
| 373 | $L_{a113}$ | $L_{b112}$ | 374 | $L_{a113}$ | $L_{b151}$ |
| 375 | $L_{a113}$ | $L_{b153}$ | 376 | $L_{a113}$ | $L_{b164}$ |
| 377 | $L_{a113}$ | $L_{b166}$ | 378 | $L_{a113}$ | $L_{b209}$ |
| 379 | $L_{a113}$ | $L_{b287}$ | 380 | $L_{a113}$ | $L_{b299}$ |
| 381 | $L_{a231}$ | $L_{b1}$ | 382 | $L_{a231}$ | $L_{b3}$ |
| 383 | $L_{a231}$ | $L_{b4}$ | 384 | $L_{a231}$ | $L_{b8}$ |
| 385 | $L_{a231}$ | $L_{b10}$ | 386 | $L_{a231}$ | $L_{b12}$ |
| 387 | $L_{a231}$ | $L_{b13}$ | 388 | $L_{a231}$ | $L_{b17}$ |
| 389 | $L_{a231}$ | $L_{b21}$ | 390 | $L_{a231}$ | $L_{b22}$ |
| 391 | $L_{a231}$ | $L_{b26}$ | 392 | $L_{a231}$ | $L_{b28}$ |
| 393 | $L_{a231}$ | $L_{b30}$ | 394 | $L_{a231}$ | $L_{b31}$ |
| 395 | $L_{a231}$ | $L_{b35}$ | 396 | $L_{a231}$ | $L_{b37}$ |
| 397 | $L_{a231}$ | $L_{b38}$ | 398 | $L_{a231}$ | $L_{b39}$ |
| 399 | $L_{a231}$ | $L_{b40}$ | 400 | $L_{a231}$ | $L_{b41}$ |
| 401 | $L_{a231}$ | $L_{b42}$ | 402 | $L_{a231}$ | $L_{b43}$ |
| 403 | $L_{a231}$ | $L_{b44}$ | 404 | $L_{a231}$ | $L_{b45}$ |
| 405 | $L_{a231}$ | $L_{b71}$ | 406 | $L_{a231}$ | $L_{b72}$ |
| 407 | $L_{a231}$ | $L_{b79}$ | 408 | $L_{a231}$ | $L_{b80}$ |
| 409 | $L_{a231}$ | $L_{b81}$ | 410 | $L_{a231}$ | $L_{b99}$ |
| 411 | $L_{a231}$ | $L_{b112}$ | 412 | $L_{a231}$ | $L_{b151}$ |
| 413 | $L_{a231}$ | $L_{b153}$ | 414 | $L_{a231}$ | $L_{b164}$ |
| 415 | $L_{a231}$ | $L_{b166}$ | 416 | $L_{a231}$ | $L_{b209}$ |
| 417 | $L_{a231}$ | $L_{b287}$ | 418 | $L_{a231}$ | $L_{b299}$ |
| 419 | $L_{a236}$ | $L_{b1}$ | 420 | $L_{a236}$ | $L_{b3}$ |
| 421 | $L_{a236}$ | $L_{b4}$ | 422 | $L_{a236}$ | $L_{b8}$ |
| 423 | $L_{a236}$ | $L_{b10}$ | 424 | $L_{a236}$ | $L_{b12}$ |
| 425 | $L_{a236}$ | $L_{b13}$ | 426 | $L_{a236}$ | $L_{b17}$ |
| 427 | $L_{a236}$ | $L_{b21}$ | 428 | $L_{a236}$ | $L_{b22}$ |
| 429 | $L_{a236}$ | $L_{b26}$ | 430 | $L_{a236}$ | $L_{b28}$ |
| 431 | $L_{a236}$ | $L_{b30}$ | 432 | $L_{a236}$ | $L_{b31}$ |
| 433 | $L_{a236}$ | $L_{b35}$ | 434 | $L_{a236}$ | $L_{b37}$ |
| 435 | $L_{a236}$ | $L_{b38}$ | 436 | $L_{a236}$ | $L_{b39}$ |
| 437 | $L_{a236}$ | $L_{b40}$ | 438 | $L_{a236}$ | $L_{b41}$ |
| 439 | $L_{a236}$ | $L_{b42}$ | 440 | $L_{a236}$ | $L_{b43}$ |
| 441 | $L_{a236}$ | $L_{b44}$ | 442 | $L_{a236}$ | $L_{b45}$ |
| 443 | $L_{a236}$ | $L_{b71}$ | 444 | $L_{a236}$ | $L_{b72}$ |
| 445 | $L_{a236}$ | $L_{b79}$ | 446 | $L_{a236}$ | $L_{b80}$ |
| 447 | $L_{a236}$ | $L_{b81}$ | 448 | $L_{a236}$ | $L_{b99}$ |
| 449 | $L_{a236}$ | $L_{b112}$ | 450 | $L_{a236}$ | $L_{b151}$ |
| 451 | $L_{a236}$ | $L_{b153}$ | 452 | $L_{a236}$ | $L_{b164}$ |
| 453 | $L_{a236}$ | $L_{b166}$ | 454 | $L_{a236}$ | $L_{b209}$ |
| 455 | $L_{a236}$ | $L_{b287}$ | 456 | $L_{a236}$ | $L_{b299}$ |
| 457 | $L_{a237}$ | $L_{b1}$ | 458 | $L_{a237}$ | $L_{b3}$ |
| 459 | $L_{a237}$ | $L_{b4}$ | 460 | $L_{a237}$ | $L_{b8}$ |
| 461 | $L_{a237}$ | $L_{b10}$ | 462 | $L_{a237}$ | $L_{b12}$ |
| 463 | $L_{a237}$ | $L_{b13}$ | 464 | $L_{a237}$ | $L_{b17}$ |
| 465 | $L_{a237}$ | $L_{b21}$ | 466 | $L_{a237}$ | $L_{b22}$ |
| 467 | $L_{a237}$ | $L_{b26}$ | 468 | $L_{a237}$ | $L_{b28}$ |
| 469 | $L_{a237}$ | $L_{b30}$ | 470 | $L_{a237}$ | $L_{b31}$ |
| 471 | $L_{a237}$ | $L_{b35}$ | 472 | $L_{a237}$ | $L_{b37}$ |
| 473 | $L_{a237}$ | $L_{b38}$ | 474 | $L_{a237}$ | $L_{b39}$ |
| 475 | $L_{a237}$ | $L_{b40}$ | 476 | $L_{a237}$ | $L_{b41}$ |
| 477 | $L_{a237}$ | $L_{b42}$ | 478 | $L_{a237}$ | $L_{b43}$ |
| 479 | $L_{a237}$ | $L_{b44}$ | 480 | $L_{a237}$ | $L_{b45}$ |
| 481 | $L_{a237}$ | $L_{b71}$ | 482 | $L_{a237}$ | $L_{b72}$ |
| 483 | $L_{a237}$ | $L_{b79}$ | 484 | $L_{a237}$ | $L_{b80}$ |
| 485 | $L_{a237}$ | $L_{b81}$ | 486 | $L_{a237}$ | $L_{b99}$ |
| 487 | $L_{a237}$ | $L_{b112}$ | 488 | $L_{a237}$ | $L_{b151}$ |
| 489 | $L_{a237}$ | $L_{b153}$ | 490 | $L_{a237}$ | $L_{b164}$ |
| 491 | $L_{a237}$ | $L_{b166}$ | 492 | $L_{a237}$ | $L_{b209}$ |
| 493 | $L_{a237}$ | $L_{b287}$ | 494 | $L_{a237}$ | $L_{b299}$ |

-continued

| Metal complex | $L_a$ | $L_b$ | Metal complex | $L_a$ | $L_b$ |
|---|---|---|---|---|---|
| 495 | $L_{a238}$ | $L_{b1}$ | 496 | $L_{a238}$ | $L_{b3}$ |
| 497 | $L_{a238}$ | $L_{b4}$ | 498 | $L_{a238}$ | $L_{b8}$ |
| 499 | $L_{a238}$ | $L_{b10}$ | 500 | $L_{a238}$ | $L_{b12}$ |
| 501 | $L_{a238}$ | $L_{b13}$ | 502 | $L_{a238}$ | $L_{b17}$ |
| 503 | $L_{a238}$ | $L_{b21}$ | 504 | $L_{a238}$ | $L_{b22}$ |
| 505 | $L_{a238}$ | $L_{b26}$ | 506 | $L_{a238}$ | $L_{b28}$ |
| 507 | $L_{a238}$ | $L_{b30}$ | 508 | $L_{a238}$ | $L_{b31}$ |
| 509 | $L_{a238}$ | $L_{b35}$ | 510 | $L_{a238}$ | $L_{b37}$ |
| 511 | $L_{a238}$ | $L_{b38}$ | 512 | $L_{a238}$ | $L_{b39}$ |
| 513 | $L_{a238}$ | $L_{b40}$ | 514 | $L_{a238}$ | $L_{b41}$ |
| 515 | $L_{a238}$ | $L_{b42}$ | 516 | $L_{a238}$ | $L_{b43}$ |
| 517 | $L_{a238}$ | $L_{b44}$ | 518 | $L_{a238}$ | $L_{b45}$ |
| 519 | $L_{a238}$ | $L_{b71}$ | 520 | $L_{a238}$ | $L_{b72}$ |
| 521 | $L_{a238}$ | $L_{b79}$ | 522 | $L_{a238}$ | $L_{b80}$ |
| 523 | $L_{a238}$ | $L_{b81}$ | 524 | $L_{a238}$ | $L_{b99}$ |
| 525 | $L_{a238}$ | $L_{b112}$ | 526 | $L_{a238}$ | $L_{b151}$ |
| 527 | $L_{a238}$ | $L_{b153}$ | 528 | $L_{a238}$ | $L_{b164}$ |
| 529 | $L_{a238}$ | $L_{b166}$ | 530 | $L_{a238}$ | $L_{b209}$ |
| 531 | $L_{a238}$ | $L_{b287}$ | 532 | $L_{a238}$ | $L_{b299}$ |
| 533 | $L_{a239}$ | $L_{b1}$ | 534 | $L_{a239}$ | $L_{b3}$ |
| 535 | $L_{a239}$ | $L_{b4}$ | 536 | $L_{a239}$ | $L_{b8}$ |
| 537 | $L_{a239}$ | $L_{b10}$ | 538 | $L_{a239}$ | $L_{b12}$ |
| 539 | $L_{a239}$ | $L_{b13}$ | 540 | $L_{a239}$ | $L_{b17}$ |
| 541 | $L_{a239}$ | $L_{b21}$ | 542 | $L_{a239}$ | $L_{b22}$ |
| 543 | $L_{a239}$ | $L_{b26}$ | 544 | $L_{a239}$ | $L_{b28}$ |
| 545 | $L_{a239}$ | $L_{b30}$ | 546 | $L_{a239}$ | $L_{b31}$ |
| 547 | $L_{a239}$ | $L_{b35}$ | 548 | $L_{a239}$ | $L_{b37}$ |
| 549 | $L_{a239}$ | $L_{b38}$ | 550 | $L_{a239}$ | $L_{b39}$ |
| 551 | $L_{a239}$ | $L_{b40}$ | 552 | $L_{a239}$ | $L_{b41}$ |
| 553 | $L_{a239}$ | $L_{b42}$ | 554 | $L_{a239}$ | $L_{b43}$ |
| 555 | $L_{a239}$ | $L_{b44}$ | 556 | $L_{a239}$ | $L_{b45}$ |
| 557 | $L_{a239}$ | $L_{b71}$ | 558 | $L_{a239}$ | $L_{b72}$ |
| 559 | $L_{a239}$ | $L_{b79}$ | 560 | $L_{a239}$ | $L_{b80}$ |
| 561 | $L_{a239}$ | $L_{b81}$ | 562 | $L_{a239}$ | $L_{b99}$ |
| 563 | $L_{a239}$ | $L_{b112}$ | 564 | $L_{a239}$ | $L_{b151}$ |
| 565 | $L_{a239}$ | $L_{b153}$ | 566 | $L_{a239}$ | $L_{b164}$ |
| 567 | $L_{a239}$ | $L_{b166}$ | 568 | $L_{a239}$ | $L_{b209}$ |
| 569 | $L_{a239}$ | $L_{b287}$ | 570 | $L_{a239}$ | $L_{b299}$ |
| 571 | $L_{a245}$ | $L_{b1}$ | 572 | $L_{a245}$ | $L_{b3}$ |
| 573 | $L_{a245}$ | $L_{b4}$ | 574 | $L_{a245}$ | $L_{b8}$ |
| 575 | $L_{a245}$ | $L_{b10}$ | 576 | $L_{a245}$ | $L_{b12}$ |
| 577 | $L_{a245}$ | $L_{b13}$ | 578 | $L_{a245}$ | $L_{b17}$ |
| 579 | $L_{a245}$ | $L_{b21}$ | 580 | $L_{a245}$ | $L_{b22}$ |
| 581 | $L_{a245}$ | $L_{b26}$ | 582 | $L_{a245}$ | $L_{b28}$ |
| 583 | $L_{a245}$ | $L_{b30}$ | 584 | $L_{a245}$ | $L_{b31}$ |
| 585 | $L_{a245}$ | $L_{b35}$ | 586 | $L_{a245}$ | $L_{b37}$ |
| 587 | $L_{a245}$ | $L_{b38}$ | 588 | $L_{a245}$ | $L_{b39}$ |
| 589 | $L_{a245}$ | $L_{b40}$ | 590 | $L_{a245}$ | $L_{b41}$ |
| 591 | $L_{a245}$ | $L_{b42}$ | 592 | $L_{a245}$ | $L_{b43}$ |
| 593 | $L_{a245}$ | $L_{b44}$ | 594 | $L_{a245}$ | $L_{b45}$ |
| 595 | $L_{a245}$ | $L_{b71}$ | 596 | $L_{a245}$ | $L_{b72}$ |
| 597 | $L_{a245}$ | $L_{b79}$ | 598 | $L_{a245}$ | $L_{b80}$ |
| 599 | $L_{a245}$ | $L_{b81}$ | 600 | $L_{a245}$ | $L_{b99}$ |
| 601 | $L_{a245}$ | $L_{b112}$ | 602 | $L_{a245}$ | $L_{b151}$ |
| 603 | $L_{a245}$ | $L_{b153}$ | 604 | $L_{a245}$ | $L_{b164}$ |
| 605 | $L_{a245}$ | $L_{b166}$ | 606 | $L_{a245}$ | $L_{b209}$ |
| 607 | $L_{a245}$ | $L_{b287}$ | 608 | $L_{a245}$ | $L_{b299}$ |
| 609 | $L_{a250}$ | $L_{b1}$ | 610 | $L_{a250}$ | $L_{b3}$ |
| 611 | $L_{a250}$ | $L_{b4}$ | 612 | $L_{a250}$ | $L_{b8}$ |
| 613 | $L_{a250}$ | $L_{b10}$ | 614 | $L_{a250}$ | $L_{b12}$ |
| 615 | $L_{a250}$ | $L_{b13}$ | 616 | $L_{a250}$ | $L_{b17}$ |
| 617 | $L_{a250}$ | $L_{b21}$ | 618 | $L_{a250}$ | $L_{b22}$ |
| 619 | $L_{a250}$ | $L_{b26}$ | 620 | $L_{a250}$ | $L_{b28}$ |
| 621 | $L_{a250}$ | $L_{b30}$ | 622 | $L_{a250}$ | $L_{b31}$ |
| 623 | $L_{a250}$ | $L_{b35}$ | 624 | $L_{a250}$ | $L_{b37}$ |
| 625 | $L_{a250}$ | $L_{b38}$ | 626 | $L_{a250}$ | $L_{b39}$ |
| 627 | $L_{a250}$ | $L_{b40}$ | 628 | $L_{a250}$ | $L_{b41}$ |
| 629 | $L_{a250}$ | $L_{b42}$ | 630 | $L_{a250}$ | $L_{b43}$ |
| 631 | $L_{a250}$ | $L_{b44}$ | 632 | $L_{a250}$ | $L_{b45}$ |
| 633 | $L_{a250}$ | $L_{b71}$ | 634 | $L_{a250}$ | $L_{b72}$ |
| 635 | $L_{a250}$ | $L_{b79}$ | 636 | $L_{a250}$ | $L_{b80}$ |
| 637 | $L_{a250}$ | $L_{b81}$ | 638 | $L_{a250}$ | $L_{b99}$ |
| 639 | $L_{a250}$ | $L_{b112}$ | 640 | $L_{a250}$ | $L_{b151}$ |
| 641 | $L_{a250}$ | $L_{b153}$ | 642 | $L_{a250}$ | $L_{b164}$ |
| 643 | $L_{a250}$ | $L_{b166}$ | 644 | $L_{a250}$ | $L_{b209}$ |
| 645 | $L_{a250}$ | $L_{b287}$ | 646 | $L_{a250}$ | $L_{b299}$ |

-continued

| Metal complex | $L_a$ | $L_b$ | Metal complex | $L_a$ | $L_b$ |
|---|---|---|---|---|---|
| 647 | $L_{a251}$ | $L_{b1}$ | 648 | $L_{a251}$ | $L_{b3}$ |
| 649 | $L_{a251}$ | $L_{b4}$ | 650 | $L_{a251}$ | $L_{b8}$ |
| 651 | $L_{a251}$ | $L_{b10}$ | 652 | $L_{a251}$ | $L_{b12}$ |
| 653 | $L_{a251}$ | $L_{b13}$ | 654 | $L_{a251}$ | $L_{b17}$ |
| 655 | $L_{a251}$ | $L_{b21}$ | 656 | $L_{a251}$ | $L_{b22}$ |
| 657 | $L_{a251}$ | $L_{b26}$ | 658 | $L_{a251}$ | $L_{b28}$ |
| 659 | $L_{a251}$ | $L_{b30}$ | 660 | $L_{a251}$ | $L_{b31}$ |
| 661 | $L_{a251}$ | $L_{b35}$ | 662 | $L_{a251}$ | $L_{b37}$ |
| 663 | $L_{a251}$ | $L_{b38}$ | 664 | $L_{a251}$ | $L_{b39}$ |
| 665 | $L_{a251}$ | $L_{b40}$ | 666 | $L_{a251}$ | $L_{b41}$ |
| 667 | $L_{a251}$ | $L_{b42}$ | 668 | $L_{a251}$ | $L_{b43}$ |
| 669 | $L_{a251}$ | $L_{b44}$ | 670 | $L_{a251}$ | $L_{b45}$ |
| 671 | $L_{a251}$ | $L_{b71}$ | 672 | $L_{a251}$ | $L_{b72}$ |
| 673 | $L_{a251}$ | $L_{b79}$ | 674 | $L_{a251}$ | $L_{b80}$ |
| 675 | $L_{a251}$ | $L_{b81}$ | 676 | $L_{a251}$ | $L_{b99}$ |
| 677 | $L_{a251}$ | $L_{b112}$ | 678 | $L_{a251}$ | $L_{b151}$ |
| 679 | $L_{a251}$ | $L_{b153}$ | 680 | $L_{a251}$ | $L_{b164}$ |
| 681 | $L_{a251}$ | $L_{b166}$ | 682 | $L_{a251}$ | $L_{b209}$ |
| 683 | $L_{a251}$ | $L_{b287}$ | 684 | $L_{a251}$ | $L_{b299}$ |
| 685 | $L_{a252}$ | $L_{b1}$ | 686 | $L_{a252}$ | $L_{b3}$ |
| 687 | $L_{a252}$ | $L_{b4}$ | 688 | $L_{a252}$ | $L_{b8}$ |
| 689 | $L_{a252}$ | $L_{b10}$ | 690 | $L_{a252}$ | $L_{b12}$ |
| 691 | $L_{a252}$ | $L_{b13}$ | 692 | $L_{a252}$ | $L_{b17}$ |
| 693 | $L_{a252}$ | $L_{b21}$ | 694 | $L_{a252}$ | $L_{b22}$ |
| 695 | $L_{a252}$ | $L_{b26}$ | 696 | $L_{a252}$ | $L_{b28}$ |
| 697 | $L_{a252}$ | $L_{b30}$ | 698 | $L_{a252}$ | $L_{b31}$ |
| 699 | $L_{a252}$ | $L_{b35}$ | 700 | $L_{a252}$ | $L_{b37}$ |
| 701 | $L_{a252}$ | $L_{b38}$ | 702 | $L_{a252}$ | $L_{b39}$ |
| 703 | $L_{a252}$ | $L_{b40}$ | 704 | $L_{a252}$ | $L_{b41}$ |
| 705 | $L_{a252}$ | $L_{b42}$ | 706 | $L_{a252}$ | $L_{b43}$ |
| 707 | $L_{a252}$ | $L_{b44}$ | 708 | $L_{a252}$ | $L_{b45}$ |
| 709 | $L_{a252}$ | $L_{b71}$ | 710 | $L_{a252}$ | $L_{b72}$ |
| 711 | $L_{a252}$ | $L_{b79}$ | 712 | $L_{a252}$ | $L_{b80}$ |
| 713 | $L_{a252}$ | $L_{b81}$ | 714 | $L_{a252}$ | $L_{b99}$ |
| 715 | $L_{a252}$ | $L_{b112}$ | 716 | $L_{a252}$ | $L_{b151}$ |
| 717 | $L_{a252}$ | $L_{b153}$ | 718 | $L_{a252}$ | $L_{b164}$ |
| 719 | $L_{a252}$ | $L_{b166}$ | 720 | $L_{a252}$ | $L_{b209}$ |
| 721 | $L_{a252}$ | $L_{b287}$ | 722 | $L_{a252}$ | $L_{b299}$ |
| 723 | $L_{a253}$ | $L_{b1}$ | 724 | $L_{a253}$ | $L_{b3}$ |
| 725 | $L_{a253}$ | $L_{b4}$ | 726 | $L_{a253}$ | $L_{b8}$ |
| 727 | $L_{a253}$ | $L_{b10}$ | 728 | $L_{a253}$ | $L_{b12}$ |
| 729 | $L_{a253}$ | $L_{b13}$ | 730 | $L_{a253}$ | $L_{b17}$ |
| 731 | $L_{a253}$ | $L_{b21}$ | 732 | $L_{a253}$ | $L_{b22}$ |
| 733 | $L_{a253}$ | $L_{b26}$ | 734 | $L_{a253}$ | $L_{b28}$ |
| 735 | $L_{a253}$ | $L_{b30}$ | 736 | $L_{a253}$ | $L_{b31}$ |
| 737 | $L_{a253}$ | $L_{b35}$ | 738 | $L_{a253}$ | $L_{b37}$ |
| 739 | $L_{a253}$ | $L_{b38}$ | 740 | $L_{a253}$ | $L_{b39}$ |
| 741 | $L_{a253}$ | $L_{b40}$ | 742 | $L_{a253}$ | $L_{b41}$ |
| 743 | $L_{a253}$ | $L_{b42}$ | 744 | $L_{a253}$ | $L_{b43}$ |
| 745 | $L_{a253}$ | $L_{b44}$ | 746 | $L_{a253}$ | $L_{b45}$ |
| 747 | $L_{a253}$ | $L_{b71}$ | 748 | $L_{a253}$ | $L_{b72}$ |
| 749 | $L_{a253}$ | $L_{b79}$ | 750 | $L_{a253}$ | $L_{b80}$ |
| 751 | $L_{a253}$ | $L_{b81}$ | 752 | $L_{a253}$ | $L_{b99}$ |
| 753 | $L_{a253}$ | $L_{b112}$ | 754 | $L_{a253}$ | $L_{b151}$ |
| 755 | $L_{a253}$ | $L_{b153}$ | 756 | $L_{a253}$ | $L_{b164}$ |
| 757 | $L_{a253}$ | $L_{b166}$ | 758 | $L_{a253}$ | $L_{b209}$ |
| 759 | $L_{a253}$ | $L_{b287}$ | 760 | $L_{a253}$ | $L_{b299}$ |
| 761 | $L_{a259}$ | $L_{b1}$ | 762 | $L_{a259}$ | $L_{b3}$ |
| 763 | $L_{a259}$ | $L_{b4}$ | 764 | $L_{a259}$ | $L_{b8}$ |
| 765 | $L_{a259}$ | $L_{b10}$ | 766 | $L_{a259}$ | $L_{b12}$ |
| 767 | $L_{a259}$ | $L_{b13}$ | 768 | $L_{a259}$ | $L_{b17}$ |
| 769 | $L_{a259}$ | $L_{b21}$ | 770 | $L_{a259}$ | $L_{b22}$ |
| 771 | $L_{a259}$ | $L_{b26}$ | 772 | $L_{a259}$ | $L_{b28}$ |
| 773 | $L_{a259}$ | $L_{b30}$ | 774 | $L_{a259}$ | $L_{b31}$ |
| 775 | $L_{a259}$ | $L_{b35}$ | 776 | $L_{a259}$ | $L_{b37}$ |
| 777 | $L_{a259}$ | $L_{b38}$ | 778 | $L_{a259}$ | $L_{b39}$ |
| 779 | $L_{a259}$ | $L_{b40}$ | 780 | $L_{a259}$ | $L_{b41}$ |
| 781 | $L_{a259}$ | $L_{b42}$ | 782 | $L_{a259}$ | $L_{b43}$ |
| 783 | $L_{a259}$ | $L_{b44}$ | 784 | $L_{a259}$ | $L_{b45}$ |
| 785 | $L_{a259}$ | $L_{b71}$ | 786 | $L_{a259}$ | $L_{b72}$ |
| 787 | $L_{a259}$ | $L_{b79}$ | 788 | $L_{a259}$ | $L_{b80}$ |
| 789 | $L_{a259}$ | $L_{b81}$ | 790 | $L_{a259}$ | $L_{b99}$ |
| 791 | $L_{a259}$ | $L_{b112}$ | 792 | $L_{a259}$ | $L_{b151}$ |
| 793 | $L_{a259}$ | $L_{b53}$ | 794 | $L_{a259}$ | $L_{b164}$ |
| 795 | $L_{a259}$ | $L_{b166}$ | 796 | $L_{a259}$ | $L_{b209}$ |
| 797 | $L_{a259}$ | $L_{b287}$ | 798 | $L_{a259}$ | $L_{b299}$ |

-continued

| Metal complex | $L_a$ | $L_b$ | Metal complex | $L_a$ | $L_b$ |
|---|---|---|---|---|---|
| 799 | $L_{a264}$ | $L_{b1}$ | 800 | $L_{a264}$ | $L_{b3}$ |
| 801 | $L_{a264}$ | $L_{b4}$ | 802 | $L_{a264}$ | $L_{b8}$ |
| 803 | $L_{a264}$ | $L_{b10}$ | 804 | $L_{a264}$ | $L_{b12}$ |
| 805 | $L_{a264}$ | $L_{b13}$ | 806 | $L_{a264}$ | $L_{b17}$ |
| 807 | $L_{a264}$ | $L_{b21}$ | 808 | $L_{a264}$ | $L_{b22}$ |
| 809 | $L_{a264}$ | $L_{b26}$ | 810 | $L_{a264}$ | $L_{b28}$ |
| 811 | $L_{a264}$ | $L_{b30}$ | 812 | $L_{a264}$ | $L_{b31}$ |
| 813 | $L_{a264}$ | $L_{b35}$ | 814 | $L_{a264}$ | $L_{b37}$ |
| 815 | $L_{a264}$ | $L_{b38}$ | 816 | $L_{a264}$ | $L_{b39}$ |
| 817 | $L_{a264}$ | $L_{b40}$ | 818 | $L_{a264}$ | $L_{b41}$ |
| 819 | $L_{a264}$ | $L_{b42}$ | 820 | $L_{a264}$ | $L_{b43}$ |
| 821 | $L_{a264}$ | $L_{b44}$ | 822 | $L_{a264}$ | $L_{b45}$ |
| 823 | $L_{a264}$ | $L_{b71}$ | 824 | $L_{a264}$ | $L_{b72}$ |
| 825 | $L_{a264}$ | $L_{b79}$ | 826 | $L_{a264}$ | $L_{b80}$ |
| 827 | $L_{a264}$ | $L_{b81}$ | 828 | $L_{a264}$ | $L_{b99}$ |
| 829 | $L_{a264}$ | $L_{b112}$ | 830 | $L_{a264}$ | $L_{b151}$ |
| 831 | $L_{a264}$ | $L_{b153}$ | 832 | $L_{a264}$ | $L_{b164}$ |
| 833 | $L_{a264}$ | $L_{b166}$ | 834 | $L_{a264}$ | $L_{b209}$ |
| 835 | $L_{a264}$ | $L_{b287}$ | 836 | $L_{a264}$ | $L_{b299}$ |
| 837 | $L_{a269}$ | $L_{b1}$ | 838 | $L_{a269}$ | $L_{b3}$ |
| 839 | $L_{a269}$ | $L_{b4}$ | 840 | $L_{a269}$ | $L_{b8}$ |
| 841 | $L_{a269}$ | $L_{b10}$ | 842 | $L_{a269}$ | $L_{b12}$ |
| 843 | $L_{a269}$ | $L_{b13}$ | 844 | $L_{a269}$ | $L_{b17}$ |
| 845 | $L_{a269}$ | $L_{b21}$ | 846 | $L_{a269}$ | $L_{b22}$ |
| 847 | $L_{a269}$ | $L_{b26}$ | 848 | $L_{a269}$ | $L_{b28}$ |
| 849 | $L_{a269}$ | $L_{b30}$ | 850 | $L_{a269}$ | $L_{b31}$ |
| 851 | $L_{a269}$ | $L_{b35}$ | 852 | $L_{a269}$ | $L_{b37}$ |
| 853 | $L_{a269}$ | $L_{b38}$ | 854 | $L_{a269}$ | $L_{b39}$ |
| 855 | $L_{a269}$ | $L_{b40}$ | 856 | $L_{a269}$ | $L_{b41}$ |
| 857 | $L_{a269}$ | $L_{b42}$ | 858 | $L_{a269}$ | $L_{b43}$ |
| 859 | $L_{a269}$ | $L_{b44}$ | 860 | $L_{a269}$ | $L_{b45}$ |
| 861 | $L_{a269}$ | $L_{b71}$ | 862 | $L_{a269}$ | $L_{b72}$ |
| 863 | $L_{a269}$ | $L_{b79}$ | 864 | $L_{a269}$ | $L_{b80}$ |
| 865 | $L_{a269}$ | $L_{b81}$ | 866 | $L_{a269}$ | $L_{b99}$ |
| 867 | $L_{a269}$ | $L_{b112}$ | 868 | $L_{a269}$ | $L_{b151}$ |
| 869 | $L_{a269}$ | $L_{b153}$ | 870 | $L_{a269}$ | $L_{b164}$ |
| 871 | $L_{a269}$ | $L_{b166}$ | 872 | $L_{a269}$ | $L_{b209}$ |
| 873 | $L_{a269}$ | $L_{b287}$ | 874 | $L_{a269}$ | $L_{b299}$ |
| 875 | $L_{a274}$ | $L_{b1}$ | 876 | $L_{a274}$ | $L_{b3}$ |
| 877 | $L_{a274}$ | $L_{b4}$ | 878 | $L_{a274}$ | $L_{b8}$ |
| 879 | $L_{a274}$ | $L_{b10}$ | 880 | $L_{a274}$ | $L_{b12}$ |
| 881 | $L_{a274}$ | $L_{b13}$ | 882 | $L_{a274}$ | $L_{b17}$ |
| 883 | $L_{a274}$ | $L_{b21}$ | 884 | $L_{a274}$ | $L_{b22}$ |
| 885 | $L_{a274}$ | $L_{b26}$ | 886 | $L_{a274}$ | $L_{b28}$ |
| 887 | $L_{a274}$ | $L_{b30}$ | 888 | $L_{a274}$ | $L_{b31}$ |
| 889 | $L_{a274}$ | $L_{b35}$ | 890 | $L_{a274}$ | $L_{b37}$ |
| 891 | $L_{a274}$ | $L_{b38}$ | 892 | $L_{a274}$ | $L_{b39}$ |
| 893 | $L_{a274}$ | $L_{b40}$ | 894 | $L_{a274}$ | $L_{b41}$ |
| 895 | $L_{a274}$ | $L_{b42}$ | 896 | $L_{a274}$ | $L_{b43}$ |
| 897 | $L_{a274}$ | $L_{b44}$ | 898 | $L_{a274}$ | $L_{b45}$ |
| 899 | $L_{a274}$ | $L_{b71}$ | 900 | $L_{a274}$ | $L_{b72}$ |
| 901 | $L_{a274}$ | $L_{b79}$ | 902 | $L_{a274}$ | $L_{b80}$ |
| 903 | $L_{a274}$ | $L_{b81}$ | 904 | $L_{a274}$ | $L_{b99}$ |
| 905 | $L_{a274}$ | $L_{b112}$ | 906 | $L_{a274}$ | $L_{b151}$ |
| 907 | $L_{a274}$ | $L_{b153}$ | 908 | $L_{a274}$ | $L_{b164}$ |
| 909 | $L_{a274}$ | $L_{b166}$ | 910 | $L_{a274}$ | $L_{b209}$ |
| 911 | $L_{a274}$ | $L_{b287}$ | 912 | $L_{a274}$ | $L_{b299}$ |
| 913 | $L_{a287}$ | $L_{b1}$ | 914 | $L_{a287}$ | $L_{b3}$ |
| 915 | $L_{a287}$ | $L_{b4}$ | 916 | $L_{a287}$ | $L_{b8}$ |
| 917 | $L_{a287}$ | $L_{b10}$ | 918 | $L_{a287}$ | $L_{b12}$ |
| 919 | $L_{a287}$ | $L_{b13}$ | 920 | $L_{a287}$ | $L_{b17}$ |
| 921 | $L_{a287}$ | $L_{b21}$ | 922 | $L_{a287}$ | $L_{b22}$ |
| 923 | $L_{a287}$ | $L_{b26}$ | 924 | $L_{a287}$ | $L_{b28}$ |
| 925 | $L_{a287}$ | $L_{b30}$ | 926 | $L_{a287}$ | $L_{b31}$ |
| 927 | $L_{a287}$ | $L_{b35}$ | 928 | $L_{a287}$ | $L_{b37}$ |
| 929 | $L_{a287}$ | $L_{b38}$ | 930 | $L_{a287}$ | $L_{b39}$ |
| 931 | $L_{a287}$ | $L_{b40}$ | 932 | $L_{a287}$ | $L_{b41}$ |
| 933 | $L_{a287}$ | $L_{b42}$ | 934 | $L_{a287}$ | $L_{b43}$ |
| 935 | $L_{a287}$ | $L_{b44}$ | 936 | $L_{a287}$ | $L_{b45}$ |
| 937 | $L_{a287}$ | $L_{b71}$ | 938 | $L_{a287}$ | $L_{b72}$ |
| 939 | $L_{a287}$ | $L_{b79}$ | 940 | $L_{a287}$ | $L_{b80}$ |
| 941 | $L_{a287}$ | $L_{b81}$ | 942 | $L_{a287}$ | $L_{b99}$ |
| 943 | $L_{a287}$ | $L_{b112}$ | 944 | $L_{a287}$ | $L_{b151}$ |
| 945 | $L_{a287}$ | $L_{b153}$ | 946 | $L_{a287}$ | $L_{b164}$ |
| 947 | $L_{a287}$ | $L_{b166}$ | 948 | $L_{a287}$ | $L_{b209}$ |
| 949 | $L_{a287}$ | $L_{b287}$ | 950 | $L_{a287}$ | $L_{b299}$ |

-continued

| Metal complex | $L_a$ | $L_b$ | Metal complex | $L_a$ | $L_b$ |
|---|---|---|---|---|---|
| 951 | $L_{a289}$ | $L_{b1}$ | 952 | $L_{a289}$ | $L_{b3}$ |
| 953 | $L_{a289}$ | $L_{b4}$ | 954 | $L_{a289}$ | $L_{b8}$ |
| 955 | $L_{a289}$ | $L_{b10}$ | 956 | $L_{a289}$ | $L_{b12}$ |
| 957 | $L_{a289}$ | $L_{b13}$ | 958 | $L_{a289}$ | $L_{b17}$ |
| 959 | $L_{a289}$ | $L_{b21}$ | 960 | $L_{a289}$ | $L_{b22}$ |
| 961 | $L_{a289}$ | $L_{b26}$ | 962 | $L_{a289}$ | $L_{b28}$ |
| 963 | $L_{a289}$ | $L_{b30}$ | 964 | $L_{a289}$ | $L_{b31}$ |
| 965 | $L_{a289}$ | $L_{b35}$ | 966 | $L_{a289}$ | $L_{b37}$ |
| 967 | $L_{a289}$ | $L_{b38}$ | 968 | $L_{a289}$ | $L_{b39}$ |
| 969 | $L_{a289}$ | $L_{b40}$ | 970 | $L_{a289}$ | $L_{b41}$ |
| 971 | $L_{a289}$ | $L_{b42}$ | 972 | $L_{a289}$ | $L_{b43}$ |
| 973 | $L_{a289}$ | $L_{b44}$ | 974 | $L_{a289}$ | $L_{b45}$ |
| 975 | $L_{a289}$ | $L_{b71}$ | 976 | $L_{a289}$ | $L_{b72}$ |
| 977 | $L_{a289}$ | $L_{b79}$ | 978 | $L_{a289}$ | $L_{b80}$ |
| 979 | $L_{a289}$ | $L_{b81}$ | 980 | $L_{a289}$ | $L_{b99}$ |
| 981 | $L_{a289}$ | $L_{b112}$ | 982 | $L_{a289}$ | $L_{b151}$ |
| 983 | $L_{a289}$ | $L_{b153}$ | 984 | $L_{a289}$ | $L_{b164}$ |
| 985 | $L_{a289}$ | $L_{b166}$ | 986 | $L_{a289}$ | $L_{b209}$ |
| 987 | $L_{a289}$ | $L_{b287}$ | 988 | $L_{a289}$ | $L_{b299}$ |
| 989 | $L_{a290}$ | $L_{b1}$ | 990 | $L_{a290}$ | $L_{b3}$ |
| 991 | $L_{a290}$ | $L_{b4}$ | 992 | $L_{a290}$ | $L_{b8}$ |
| 993 | $L_{a290}$ | $L_{b10}$ | 994 | $L_{a290}$ | $L_{b12}$ |
| 995 | $L_{a290}$ | $L_{b13}$ | 996 | $L_{a290}$ | $L_{b17}$ |
| 997 | $L_{a290}$ | $L_{b21}$ | 998 | $L_{a290}$ | $L_{b22}$ |
| 999 | $L_{a290}$ | $L_{b26}$ | 1000 | $L_{a290}$ | $L_{b28}$ |
| 1001 | $L_{a290}$ | $L_{b30}$ | 1002 | $L_{a290}$ | $L_{b31}$ |
| 1003 | $L_{a290}$ | $L_{b35}$ | 1004 | $L_{a290}$ | $L_{b37}$ |
| 1005 | $L_{a290}$ | $L_{b38}$ | 1006 | $L_{a290}$ | $L_{b39}$ |
| 1007 | $L_{a290}$ | $L_{b40}$ | 1008 | $L_{a290}$ | $L_{b41}$ |
| 1009 | $L_{a290}$ | $L_{b42}$ | 1010 | $L_{a290}$ | $L_{b43}$ |
| 1011 | $L_{a290}$ | $L_{b44}$ | 1012 | $L_{a290}$ | $L_{b45}$ |
| 1013 | $L_{a290}$ | $L_{b71}$ | 1014 | $L_{a290}$ | $L_{b72}$ |
| 1015 | $L_{a290}$ | $L_{b79}$ | 1016 | $L_{a290}$ | $L_{b80}$ |
| 1017 | $L_{a290}$ | $L_{b81}$ | 1018 | $L_{a290}$ | $L_{b99}$ |
| 1019 | $L_{a290}$ | $L_{b112}$ | 1020 | $L_{a290}$ | $L_{b151}$ |
| 1021 | $L_{a290}$ | $L_{b153}$ | 1022 | $L_{a290}$ | $L_{b164}$ |
| 1023 | $L_{a290}$ | $L_{b166}$ | 1024 | $L_{a290}$ | $L_{b209}$ |
| 1025 | $L_{a290}$ | $L_{b287}$ | 1026 | $L_{a290}$ | $L_{b299}$ |
| 1027 | $L_{a297}$ | $L_{b1}$ | 1028 | $L_{a297}$ | $L_{b3}$ |
| 1029 | $L_{a297}$ | $L_{b4}$ | 1030 | $L_{a297}$ | $L_{b8}$ |
| 1031 | $L_{a297}$ | $L_{b10}$ | 1032 | $L_{a297}$ | $L_{b12}$ |
| 1033 | $L_{a297}$ | $L_{b13}$ | 1034 | $L_{a297}$ | $L_{b17}$ |
| 1035 | $L_{a297}$ | $L_{b21}$ | 1036 | $L_{a297}$ | $L_{b22}$ |
| 1037 | $L_{a297}$ | $L_{b26}$ | 1038 | $L_{a297}$ | $L_{b28}$ |
| 1039 | $L_{a297}$ | $L_{b30}$ | 1040 | $L_{a297}$ | $L_{b31}$ |
| 1041 | $L_{a297}$ | $L_{b35}$ | 1042 | $L_{a297}$ | $L_{b37}$ |
| 1043 | $L_{a297}$ | $L_{b38}$ | 1044 | $L_{a297}$ | $L_{b39}$ |
| 1045 | $L_{a297}$ | $L_{b40}$ | 1046 | $L_{a297}$ | $L_{b41}$ |
| 1047 | $L_{a297}$ | $L_{b42}$ | 1048 | $L_{a297}$ | $L_{b43}$ |
| 1049 | $L_{a297}$ | $L_{b44}$ | 1050 | $L_{a297}$ | $L_{b45}$ |
| 1051 | $L_{a297}$ | $L_{b71}$ | 1052 | $L_{a297}$ | $L_{b72}$ |
| 1053 | $L_{a297}$ | $L_{b79}$ | 1054 | $L_{a297}$ | $L_{b80}$ |
| 1055 | $L_{a297}$ | $L_{b81}$ | 1056 | $L_{a297}$ | $L_{b99}$ |
| 1057 | $L_{a297}$ | $L_{b112}$ | 1058 | $L_{a297}$ | $L_{b151}$ |
| 1059 | $L_{a297}$ | $L_{b153}$ | 1060 | $L_{a297}$ | $L_{b164}$ |
| 1061 | $L_{a297}$ | $L_{b166}$ | 1062 | $L_{a297}$ | $L_{b209}$ |
| 1063 | $L_{a297}$ | $L_{b287}$ | 1064 | $L_{a297}$ | $L_{b299}$ |
| 1065 | $L_{a299}$ | $L_{b1}$ | 1066 | $L_{a299}$ | $L_{b3}$ |
| 1067 | $L_{a299}$ | $L_{b4}$ | 1068 | $L_{a299}$ | $L_{b8}$ |
| 1069 | $L_{a299}$ | $L_{b10}$ | 1070 | $L_{a299}$ | $L_{b12}$ |
| 1071 | $L_{a299}$ | $L_{b13}$ | 1072 | $L_{a299}$ | $L_{b17}$ |
| 1073 | $L_{a299}$ | $L_{b21}$ | 1074 | $L_{a299}$ | $L_{b22}$ |
| 1075 | $L_{a299}$ | $L_{b26}$ | 1076 | $L_{a299}$ | $L_{b28}$ |
| 1077 | $L_{a299}$ | $L_{b30}$ | 1078 | $L_{a299}$ | $L_{b31}$ |
| 1079 | $L_{a299}$ | $L_{b35}$ | 1080 | $L_{a299}$ | $L_{b37}$ |
| 1081 | $L_{a299}$ | $L_{b38}$ | 1082 | $L_{a299}$ | $L_{b39}$ |
| 1083 | $L_{a299}$ | $L_{b40}$ | 1084 | $L_{a299}$ | $L_{b41}$ |
| 1085 | $L_{a299}$ | $L_{b42}$ | 1086 | $L_{a299}$ | $L_{b43}$ |
| 1087 | $L_{a299}$ | $L_{b44}$ | 1088 | $L_{a299}$ | $L_{b45}$ |
| 1089 | $L_{a299}$ | $L_{b71}$ | 1090 | $L_{a299}$ | $L_{b72}$ |
| 1091 | $L_{a299}$ | $L_{b79}$ | 1092 | $L_{a299}$ | $L_{b80}$ |
| 1093 | $L_{a299}$ | $L_{b81}$ | 1094 | $L_{a299}$ | $L_{b99}$ |
| 1095 | $L_{a299}$ | $L_{b112}$ | 1096 | $L_{a299}$ | $L_{b151}$ |
| 1097 | $L_{a299}$ | $L_{b153}$ | 1098 | $L_{a299}$ | $L_{b164}$ |
| 1099 | $L_{a299}$ | $L_{b166}$ | 1100 | $L_{a299}$ | $L_{b209}$ |
| 1101 | $L_{a299}$ | $L_{b287}$ | 1102 | $L_{a299}$ | $L_{b299}$ |

-continued

| Metal complex | $L_a$ | $L_b$ | Metal complex | $L_a$ | $L_b$ |
|---|---|---|---|---|---|
| 1179 | $L_{a327}$ | $L_{b1}$ | 1180 | $L_{a327}$ | $L_{b3}$ |
| 1181 | $L_{a327}$ | $L_{b4}$ | 1182 | $L_{a327}$ | $L_{b8}$ |
| 1183 | $L_{a327}$ | $L_{b10}$ | 1184 | $L_{a327}$ | $L_{b12}$ |
| 1185 | $L_{a327}$ | $L_{b13}$ | 1186 | $L_{a327}$ | $L_{b17}$ |
| 1187 | $L_{a327}$ | $L_{b21}$ | 1188 | $L_{a327}$ | $L_{b22}$ |
| 1189 | $L_{a327}$ | $L_{b26}$ | 1190 | $L_{a327}$ | $L_{b28}$ |
| 1191 | $L_{a327}$ | $L_{b30}$ | 1192 | $L_{a327}$ | $L_{b31}$ |
| 1193 | $L_{a327}$ | $L_{b35}$ | 1194 | $L_{a327}$ | $L_{b37}$ |
| 1195 | $L_{a327}$ | $L_{b38}$ | 1196 | $L_{a327}$ | $L_{b39}$ |
| 1197 | $L_{a327}$ | $L_{b40}$ | 1198 | $L_{a327}$ | $L_{b41}$ |
| 1199 | $L_{a327}$ | $L_{b42}$ | 1200 | $L_{a327}$ | $L_{b43}$ |
| 1201 | $L_{a327}$ | $L_{b44}$ | 1202 | $L_{a327}$ | $L_{b45}$ |
| 1203 | $L_{a327}$ | $L_{b71}$ | 1204 | $L_{a327}$ | $L_{b72}$ |
| 1205 | $L_{a327}$ | $L_{b79}$ | 1206 | $L_{a327}$ | $L_{b80}$ |
| 1207 | $L_{a327}$ | $L_{b81}$ | 1208 | $L_{a327}$ | $L_{b99}$ |
| 1209 | $L_{a327}$ | $L_{b112}$ | 1210 | $L_{a327}$ | $L_{b151}$ |
| 1211 | $L_{a327}$ | $L_{b153}$ | 1212 | $L_{a327}$ | $L_{b164}$ |
| 1213 | $L_{a327}$ | $L_{b166}$ | 1214 | $L_{a327}$ | $L_{b209}$ |
| 1215 | $L_{a327}$ | $L_{b287}$ | 1216 | $L_{a327}$ | $L_{b299}$ |
| 1217 | $L_{a329}$ | $L_{b1}$ | 1218 | $L_{a329}$ | $L_{b3}$ |
| 1219 | $L_{a329}$ | $L_{b4}$ | 1220 | $L_{a329}$ | $L_{b8}$ |
| 1221 | $L_{a329}$ | $L_{b10}$ | 1222 | $L_{a329}$ | $L_{b12}$ |
| 1223 | $L_{a329}$ | $L_{b13}$ | 1224 | $L_{a329}$ | $L_{b17}$ |
| 1225 | $L_{a329}$ | $L_{b21}$ | 1226 | $L_{a329}$ | $L_{b22}$ |
| 1227 | $L_{a329}$ | $L_{b26}$ | 1228 | $L_{a329}$ | $L_{b28}$ |
| 1229 | $L_{a329}$ | $L_{b30}$ | 1230 | $L_{a329}$ | $L_{b31}$ |
| 1231 | $L_{a329}$ | $L_{b35}$ | 1232 | $L_{a329}$ | $L_{b37}$ |
| 1233 | $L_{a329}$ | $L_{b38}$ | 1234 | $L_{a329}$ | $L_{b39}$ |
| 1235 | $L_{a329}$ | $L_{b40}$ | 1236 | $L_{a329}$ | $L_{b41}$ |
| 1237 | $L_{a329}$ | $L_{b42}$ | 1238 | $L_{a329}$ | $L_{b43}$ |
| 1239 | $L_{a329}$ | $L_{b44}$ | 1240 | $L_{a329}$ | $L_{b45}$ |
| 1241 | $L_{a329}$ | $L_{b71}$ | 1242 | $L_{a329}$ | $L_{b72}$ |
| 1243 | $L_{a329}$ | $L_{b79}$ | 1244 | $L_{a329}$ | $L_{b80}$ |
| 1245 | $L_{a329}$ | $L_{b81}$ | 1246 | $L_{a329}$ | $L_{b99}$ |
| 1247 | $L_{a329}$ | $L_{b112}$ | 1248 | $L_{a329}$ | $L_{b151}$ |
| 1249 | $L_{a329}$ | $L_{b153}$ | 1250 | $L_{a329}$ | $L_{b164}$ |
| 1251 | $L_{a329}$ | $L_{b166}$ | 1252 | $L_{a329}$ | $L_{b209}$ |
| 1253 | $L_{a329}$ | $L_{b287}$ | 1254 | $L_{a329}$ | $L_{b299}$ |
| 1255 | $L_{a330}$ | $L_{b1}$ | 1256 | $L_{a330}$ | $L_{b3}$ |
| 1257 | $L_{a330}$ | $L_{b4}$ | 1258 | $L_{a330}$ | $L_{b8}$ |
| 1259 | $L_{a330}$ | $L_{b10}$ | 1260 | $L_{a330}$ | $L_{b12}$ |
| 1261 | $L_{a330}$ | $L_{b13}$ | 1262 | $L_{a330}$ | $L_{b17}$ |
| 1263 | $L_{a330}$ | $L_{b21}$ | 1264 | $L_{a330}$ | $L_{b22}$ |
| 1265 | $L_{a330}$ | $L_{b26}$ | 1266 | $L_{a330}$ | $L_{b28}$ |
| 1267 | $L_{a330}$ | $L_{b30}$ | 1268 | $L_{a330}$ | $L_{b31}$ |
| 1269 | $L_{a330}$ | $L_{b35}$ | 1270 | $L_{a330}$ | $L_{b37}$ |
| 1271 | $L_{a330}$ | $L_{b38}$ | 1272 | $L_{a330}$ | $L_{b39}$ |
| 1273 | $L_{a330}$ | $L_{b40}$ | 1274 | $L_{a330}$ | $L_{b41}$ |
| 1275 | $L_{a330}$ | $L_{b42}$ | 1276 | $L_{a330}$ | $L_{b43}$ |
| 1277 | $L_{a330}$ | $L_{b44}$ | 1278 | $L_{a330}$ | $L_{b45}$ |
| 1279 | $L_{a330}$ | $L_{b71}$ | 1280 | $L_{a330}$ | $L_{b72}$ |
| 1281 | $L_{a330}$ | $L_{b79}$ | 1282 | $L_{a330}$ | $L_{b80}$ |
| 1283 | $L_{a330}$ | $L_{b81}$ | 1284 | $L_{a330}$ | $L_{b99}$ |
| 1285 | $L_{a330}$ | $L_{b112}$ | 1286 | $L_{a330}$ | $L_{b151}$ |
| 1287 | $L_{a330}$ | $L_{b153}$ | 1288 | $L_{a330}$ | $L_{b164}$ |
| 1289 | $L_{a330}$ | $L_{b166}$ | 1290 | $L_{a330}$ | $L_{b209}$ |
| 1291 | $L_{a330}$ | $L_{b287}$ | 1292 | $L_{a330}$ | $L_{b299}$ |
| 1293 | $L_{a331}$ | $L_{b1}$ | 1294 | $L_{a331}$ | $L_{b3}$ |
| 1295 | $L_{a331}$ | $L_{b4}$ | 1296 | $L_{a331}$ | $L_{b8}$ |
| 1297 | $L_{a331}$ | $L_{b10}$ | 1298 | $L_{a331}$ | $L_{b12}$ |
| 1299 | $L_{a331}$ | $L_{b13}$ | 1300 | $L_{a331}$ | $L_{b17}$ |
| 1301 | $L_{a331}$ | $L_{b21}$ | 1302 | $L_{a331}$ | $L_{b22}$ |
| 1303 | $L_{a331}$ | $L_{b26}$ | 1304 | $L_{a331}$ | $L_{b28}$ |
| 1305 | $L_{a331}$ | $L_{b30}$ | 1306 | $L_{a331}$ | $L_{b31}$ |
| 1307 | $L_{a331}$ | $L_{b35}$ | 1308 | $L_{a331}$ | $L_{b37}$ |
| 1309 | $L_{a331}$ | $L_{b38}$ | 1310 | $L_{a331}$ | $L_{b39}$ |
| 1311 | $L_{a331}$ | $L_{b40}$ | 1312 | $L_{a331}$ | $L_{b41}$ |
| 1313 | $L_{a331}$ | $L_{b42}$ | 1314 | $L_{a331}$ | $L_{b43}$ |
| 1315 | $L_{a331}$ | $L_{b44}$ | 1316 | $L_{a331}$ | $L_{b45}$ |
| 1317 | $L_{a331}$ | $L_{b71}$ | 1318 | $L_{a331}$ | $L_{b72}$ |
| 1319 | $L_{a331}$ | $L_{b79}$ | 1320 | $L_{a331}$ | $L_{b80}$ |
| 1321 | $L_{a331}$ | $L_{b81}$ | 1322 | $L_{a331}$ | $L_{b99}$ |
| 1323 | $L_{a331}$ | $L_{b112}$ | 1324 | $L_{a331}$ | $L_{b151}$ |
| 1325 | $L_{a331}$ | $L_{b153}$ | 1326 | $L_{a331}$ | $L_{b164}$ |
| 1327 | $L_{a331}$ | $L_{b166}$ | 1328 | $L_{a331}$ | $L_{b209}$ |
| 1329 | $L_{a331}$ | $L_{b287}$ | 1330 | $L_{a331}$ | $L_{b299}$ |

-continued

| Metal complex | $L_a$ | $L_b$ | Metal complex | $L_a$ | $L_b$ |
|---|---|---|---|---|---|
| 1331 | $L_{a336}$ | $L_{b1}$ | 1332 | $L_{a336}$ | $L_{b3}$ |
| 1333 | $L_{a336}$ | $L_{b4}$ | 1334 | $L_{a336}$ | $L_{b8}$ |
| 1335 | $L_{a336}$ | $L_{b10}$ | 1336 | $L_{a336}$ | $L_{b12}$ |
| 1337 | $L_{a336}$ | $L_{b13}$ | 1338 | $L_{a336}$ | $L_{b17}$ |
| 1339 | $L_{a336}$ | $L_{b21}$ | 1340 | $L_{a336}$ | $L_{b22}$ |
| 1341 | $L_{a336}$ | $L_{b26}$ | 1342 | $L_{a336}$ | $L_{b28}$ |
| 1343 | $L_{a336}$ | $L_{b30}$ | 1344 | $L_{a336}$ | $L_{b31}$ |
| 1345 | $L_{a336}$ | $L_{b35}$ | 1346 | $L_{a336}$ | $L_{b37}$ |
| 1347 | $L_{a336}$ | $L_{b38}$ | 1348 | $L_{a336}$ | $L_{b39}$ |
| 1349 | $L_{a336}$ | $L_{b40}$ | 1350 | $L_{a336}$ | $L_{b41}$ |
| 1351 | $L_{a336}$ | $L_{b42}$ | 1352 | $L_{a336}$ | $L_{b43}$ |
| 1353 | $L_{a336}$ | $L_{b44}$ | 1354 | $L_{a336}$ | $L_{b45}$ |
| 1355 | $L_{a336}$ | $L_{b71}$ | 1356 | $L_{a336}$ | $L_{b72}$ |
| 1357 | $L_{a336}$ | $L_{b79}$ | 1358 | $L_{a336}$ | $L_{b80}$ |
| 1359 | $L_{a336}$ | $L_{b81}$ | 1360 | $L_{a336}$ | $L_{b99}$ |
| 1361 | $L_{a336}$ | $L_{b112}$ | 1362 | $L_{a336}$ | $L_{b151}$ |
| 1363 | $L_{a336}$ | $L_{b153}$ | 1364 | $L_{a336}$ | $L_{b164}$ |
| 1365 | $L_{a336}$ | $L_{b166}$ | 1366 | $L_{a336}$ | $L_{b209}$ |
| 1367 | $L_{a336}$ | $L_{b287}$ | 1368 | $L_{a336}$ | $L_{b299}$ |
| 1369 | $L_{a381}$ | $L_{b1}$ | 1370 | $L_{a381}$ | $L_{b3}$ |
| 1371 | $L_{a381}$ | $L_{b4}$ | 1372 | $L_{a381}$ | $L_{b8}$ |
| 1373 | $L_{a381}$ | $L_{b10}$ | 1374 | $L_{a381}$ | $L_{b12}$ |
| 1375 | $L_{a381}$ | $L_{b13}$ | 1376 | $L_{a381}$ | $L_{b17}$ |
| 1377 | $L_{a381}$ | $L_{b21}$ | 1378 | $L_{a381}$ | $L_{b22}$ |
| 1379 | $L_{a381}$ | $L_{b26}$ | 1380 | $L_{a381}$ | $L_{b28}$ |
| 1381 | $L_{a381}$ | $L_{b30}$ | 1382 | $L_{a381}$ | $L_{b31}$ |
| 1383 | $L_{a381}$ | $L_{b35}$ | 1384 | $L_{a381}$ | $L_{b37}$ |
| 1385 | $L_{a381}$ | $L_{b38}$ | 1386 | $L_{a381}$ | $L_{b39}$ |
| 1387 | $L_{a381}$ | $L_{b40}$ | 1388 | $L_{a381}$ | $L_{b41}$ |
| 1389 | $L_{a381}$ | $L_{b42}$ | 1390 | $L_{a381}$ | $L_{b43}$ |
| 1391 | $L_{a381}$ | $L_{b44}$ | 1392 | $L_{a381}$ | $L_{b45}$ |
| 1393 | $L_{a381}$ | $L_{b71}$ | 1394 | $L_{a381}$ | $L_{b72}$ |
| 1395 | $L_{a381}$ | $L_{b79}$ | 1396 | $L_{a381}$ | $L_{b80}$ |
| 1397 | $L_{a381}$ | $L_{b81}$ | 1398 | $L_{a381}$ | $L_{b99}$ |
| 1399 | $L_{a381}$ | $L_{b112}$ | 1400 | $L_{a381}$ | $L_{b151}$ |
| 1401 | $L_{a381}$ | $L_{b153}$ | 1402 | $L_{a381}$ | $L_{b164}$ |
| 1403 | $L_{a381}$ | $L_{b166}$ | 1404 | $L_{a381}$ | $L_{b209}$ |
| 1405 | $L_{a381}$ | $L_{b287}$ | 1406 | $L_{a381}$ | $L_{b299}$ |
| 1407 | $L_{a391}$ | $L_{b1}$ | 1408 | $L_{a391}$ | $L_{b3}$ |
| 1409 | $L_{a391}$ | $L_{b4}$ | 1410 | $L_{a391}$ | $L_{b8}$ |
| 1411 | $L_{a391}$ | $L_{b10}$ | 1412 | $L_{a391}$ | $L_{b12}$ |
| 1413 | $L_{a391}$ | $L_{b13}$ | 1414 | $L_{a391}$ | $L_{b17}$ |
| 1415 | $L_{a391}$ | $L_{b21}$ | 1416 | $L_{a391}$ | $L_{b22}$ |
| 1417 | $L_{a391}$ | $L_{b26}$ | 1418 | $L_{a391}$ | $L_{b28}$ |
| 1419 | $L_{a391}$ | $L_{b30}$ | 1420 | $L_{a391}$ | $L_{b31}$ |
| 1421 | $L_{a391}$ | $L_{b35}$ | 1422 | $L_{a391}$ | $L_{b37}$ |
| 1423 | $L_{a391}$ | $L_{b38}$ | 1424 | $L_{a391}$ | $L_{b39}$ |
| 1425 | $L_{a391}$ | $L_{b40}$ | 1426 | $L_{a391}$ | $L_{b41}$ |
| 1427 | $L_{a391}$ | $L_{b42}$ | 1428 | $L_{a391}$ | $L_{b43}$ |
| 1429 | $L_{a391}$ | $L_{b44}$ | 1430 | $L_{a391}$ | $L_{b45}$ |
| 1431 | $L_{a391}$ | $L_{b71}$ | 1432 | $L_{a391}$ | $L_{b72}$ |
| 1433 | $L_{a391}$ | $L_{b79}$ | 1434 | $L_{a391}$ | $L_{b80}$ |
| 1435 | $L_{a391}$ | $L_{b81}$ | 1436 | $L_{a391}$ | $L_{b99}$ |
| 1437 | $L_{a391}$ | $L_{b112}$ | 1438 | $L_{a391}$ | $L_{b151}$ |
| 1439 | $L_{a391}$ | $L_{b153}$ | 1440 | $L_{a391}$ | $L_{b164}$ |
| 1441 | $L_{a391}$ | $L_{b166}$ | 1442 | $L_{a391}$ | $L_{b209}$ |
| 1443 | $L_{a391}$ | $L_{b287}$ | 1444 | $L_{a391}$ | $L_{b299}$ |
| 1445 | $L_{a403}$ | $L_{b1}$ | 1446 | $L_{a403}$ | $L_{b3}$ |
| 1447 | $L_{a403}$ | $L_{b4}$ | 1448 | $L_{a403}$ | $L_{b8}$ |
| 1449 | $L_{a403}$ | $L_{b10}$ | 1450 | $L_{a403}$ | $L_{b12}$ |
| 1451 | $L_{a403}$ | $L_{b13}$ | 1452 | $L_{a403}$ | $L_{b17}$ |
| 1453 | $L_{a403}$ | $L_{b21}$ | 1454 | $L_{a403}$ | $L_{b22}$ |
| 1455 | $L_{a403}$ | $L_{b26}$ | 1456 | $L_{a403}$ | $L_{b28}$ |
| 1457 | $L_{a403}$ | $L_{b30}$ | 1458 | $L_{a403}$ | $L_{b31}$ |
| 1459 | $L_{a403}$ | $L_{b35}$ | 1460 | $L_{a403}$ | $L_{b37}$ |
| 1461 | $L_{a403}$ | $L_{b38}$ | 1462 | $L_{a403}$ | $L_{b39}$ |
| 1463 | $L_{a403}$ | $L_{b40}$ | 1464 | $L_{a403}$ | $L_{b41}$ |
| 1465 | $L_{a403}$ | $L_{b42}$ | 1466 | $L_{a403}$ | $L_{b43}$ |
| 1467 | $L_{a403}$ | $L_{b44}$ | 1468 | $L_{a403}$ | $L_{b45}$ |
| 1469 | $L_{a403}$ | $L_{b71}$ | 1470 | $L_{a403}$ | $L_{b72}$ |
| 1471 | $L_{a403}$ | $L_{b79}$ | 1472 | $L_{a403}$ | $L_{b80}$ |
| 1473 | $L_{a403}$ | $L_{b81}$ | 1474 | $L_{a403}$ | $L_{b99}$ |
| 1475 | $L_{a403}$ | $L_{b112}$ | 1476 | $L_{a403}$ | $L_{b151}$ |
| 1477 | $L_{a403}$ | $L_{b153}$ | 1478 | $L_{a403}$ | $L_{b164}$ |
| 1479 | $L_{a403}$ | $L_{b166}$ | 1480 | $L_{a403}$ | $L_{b209}$ |
| 1481 | $L_{a403}$ | $L_{b287}$ | 1482 | $L_{a403}$ | $L_{b299}$ |

| Metal complex | $L_a$ | $L_b$ | Metal complex | $L_a$ | $L_b$ |
|---|---|---|---|---|---|
| 1483 | $L_{a413}$ | $L_{b1}$ | 1484 | $L_{a413}$ | $L_{b3}$ |
| 1485 | $L_{a413}$ | $L_{b4}$ | 1486 | $L_{a413}$ | $L_{b8}$ |
| 1487 | $L_{a413}$ | $L_{b10}$ | 1488 | $L_{a413}$ | $L_{b12}$ |
| 1489 | $L_{a413}$ | $L_{b13}$ | 1490 | $L_{a413}$ | $L_{b17}$ |
| 1491 | $L_{a413}$ | $L_{b21}$ | 1492 | $L_{a413}$ | $L_{b22}$ |
| 1493 | $L_{a413}$ | $L_{b26}$ | 1494 | $L_{a413}$ | $L_{b28}$ |
| 1495 | $L_{a413}$ | $L_{b30}$ | 1496 | $L_{a413}$ | $L_{b31}$ |
| 1497 | $L_{a413}$ | $L_{b35}$ | 1498 | $L_{a413}$ | $L_{b37}$ |
| 1499 | $L_{a413}$ | $L_{b38}$ | 1500 | $L_{a413}$ | $L_{b39}$ |
| 1501 | $L_{a413}$ | $L_{b40}$ | 1502 | $L_{a413}$ | $L_{b41}$ |
| 1503 | $L_{a413}$ | $L_{b42}$ | 1504 | $L_{a413}$ | $L_{b43}$ |
| 1505 | $L_{a413}$ | $L_{b44}$ | 1506 | $L_{a413}$ | $L_{b45}$ |
| 1507 | $L_{a413}$ | $L_{b71}$ | 1508 | $L_{a413}$ | $L_{b72}$ |
| 1509 | $L_{a413}$ | $L_{b79}$ | 1510 | $L_{a413}$ | $L_{b80}$ |
| 1511 | $L_{a413}$ | $L_{b81}$ | 1512 | $L_{a413}$ | $L_{b99}$ |
| 1513 | $L_{a413}$ | $L_{b112}$ | 1514 | $L_{a413}$ | $L_{b151}$ |
| 1515 | $L_{a413}$ | $L_{b153}$ | 1516 | $L_{a413}$ | $L_{b164}$ |
| 1517 | $L_{a413}$ | $L_{b166}$ | 1518 | $L_{a413}$ | $L_{b209}$ |
| 1519 | $L_{a413}$ | $L_{b287}$ | 1520 | $L_{a413}$ | $L_{b299}$ |
| 1521 | $L_{a435}$ | $L_{b1}$ | 1522 | $L_{a435}$ | $L_{b3}$ |
| 1523 | $L_{a435}$ | $L_{b4}$ | 1524 | $L_{a435}$ | $L_{b8}$ |
| 1525 | $L_{a435}$ | $L_{b10}$ | 1526 | $L_{a435}$ | $L_{b12}$ |
| 1527 | $L_{a435}$ | $L_{b13}$ | 1528 | $L_{a435}$ | $L_{b17}$ |
| 1529 | $L_{a435}$ | $L_{b21}$ | 1530 | $L_{a435}$ | $L_{b22}$ |
| 1531 | $L_{a435}$ | $L_{b26}$ | 1532 | $L_{a435}$ | $L_{b28}$ |
| 1533 | $L_{a435}$ | $L_{b30}$ | 1534 | $L_{a435}$ | $L_{b31}$ |
| 1535 | $L_{a435}$ | $L_{b35}$ | 1536 | $L_{a435}$ | $L_{b37}$ |
| 1537 | $L_{a435}$ | $L_{b38}$ | 1538 | $L_{a435}$ | $L_{b39}$ |
| 1539 | $L_{a435}$ | $L_{b40}$ | 1540 | $L_{a435}$ | $L_{b41}$ |
| 1541 | $L_{a435}$ | $L_{b42}$ | 1542 | $L_{a435}$ | $L_{b43}$ |
| 1543 | $L_{a435}$ | $L_{b44}$ | 1544 | $L_{a435}$ | $L_{b45}$ |
| 1545 | $L_{a435}$ | $L_{b71}$ | 1546 | $L_{a435}$ | $L_{b72}$ |
| 1547 | $L_{a435}$ | $L_{b79}$ | 1548 | $L_{a435}$ | $L_{b80}$ |
| 1549 | $L_{a435}$ | $L_{b81}$ | 1550 | $L_{a435}$ | $L_{b99}$ |
| 1551 | $L_{a435}$ | $L_{b112}$ | 1552 | $L_{a435}$ | $L_{b151}$ |
| 1553 | $L_{a435}$ | $L_{b153}$ | 1554 | $L_{a435}$ | $L_{b164}$ |
| 1555 | $L_{a435}$ | $L_{b166}$ | 1556 | $L_{a435}$ | $L_{b209}$ |
| 1557 | $L_{a435}$ | $L_{b287}$ | 1558 | $L_{a435}$ | $L_{b299}$ |
| 1559 | $L_{a446}$ | $L_{b1}$ | 1560 | $L_{a446}$ | $L_{b3}$ |
| 1561 | $L_{a446}$ | $L_{b4}$ | 1562 | $L_{a446}$ | $L_{b8}$ |
| 1563 | $L_{a446}$ | $L_{b10}$ | 1564 | $L_{a446}$ | $L_{b12}$ |
| 1565 | $L_{a446}$ | $L_{b13}$ | 1566 | $L_{a446}$ | $L_{b17}$ |
| 1567 | $L_{a446}$ | $L_{b21}$ | 1568 | $L_{a446}$ | $L_{b22}$ |
| 1569 | $L_{a446}$ | $L_{b26}$ | 1570 | $L_{a446}$ | $L_{b28}$ |
| 1571 | $L_{a446}$ | $L_{b30}$ | 1572 | $L_{a446}$ | $L_{b31}$ |
| 1573 | $L_{a446}$ | $L_{b35}$ | 1574 | $L_{a446}$ | $L_{b37}$ |
| 1575 | $L_{a446}$ | $L_{b38}$ | 1576 | $L_{a446}$ | $L_{b39}$ |
| 1577 | $L_{a446}$ | $L_{b40}$ | 1578 | $L_{a446}$ | $L_{b41}$ |
| 1579 | $L_{a446}$ | $L_{b42}$ | 1580 | $L_{a446}$ | $L_{b43}$ |
| 1581 | $L_{a446}$ | $L_{b44}$ | 1582 | $L_{a446}$ | $L_{b45}$ |
| 1583 | $L_{a446}$ | $L_{b71}$ | 1584 | $L_{a446}$ | $L_{b72}$ |
| 1585 | $L_{a446}$ | $L_{b79}$ | 1586 | $L_{a446}$ | $L_{b80}$ |
| 1587 | $L_{a446}$ | $L_{b81}$ | 1588 | $L_{a446}$ | $L_{b99}$ |
| 1589 | $L_{a446}$ | $L_{b112}$ | 1590 | $L_{a446}$ | $L_{b151}$ |
| 1591 | $L_{a446}$ | $L_{b153}$ | 1592 | $L_{a446}$ | $L_{b164}$ |
| 1593 | $L_{a446}$ | $L_{b166}$ | 1594 | $L_{a446}$ | $L_{b209}$ |
| 1595 | $L_{a446}$ | $L_{b287}$ | 1596 | $L_{a446}$ | $L_{b299}$ |
| 1597 | $L_{a466}$ | $L_{b1}$ | 1598 | $L_{a466}$ | $L_{b3}$ |
| 1599 | $L_{a466}$ | $L_{b4}$ | 1600 | $L_{a466}$ | $L_{b8}$ |
| 1601 | $L_{a466}$ | $L_{b10}$ | 1602 | $L_{a466}$ | $L_{b12}$ |
| 1603 | $L_{a466}$ | $L_{b13}$ | 1604 | $L_{a466}$ | $L_{b17}$ |
| 1605 | $L_{a466}$ | $L_{b21}$ | 1606 | $L_{a466}$ | $L_{b22}$ |
| 1607 | $L_{a466}$ | $L_{b26}$ | 1608 | $L_{a466}$ | $L_{b28}$ |
| 1609 | $L_{a466}$ | $L_{b30}$ | 1610 | $L_{a466}$ | $L_{b31}$ |
| 1611 | $L_{a466}$ | $L_{b35}$ | 1612 | $L_{a466}$ | $L_{b37}$ |
| 1613 | $L_{a466}$ | $L_{b38}$ | 1614 | $L_{a466}$ | $L_{b39}$ |
| 1615 | $L_{a466}$ | $L_{b40}$ | 1616 | $L_{a466}$ | $L_{b41}$ |
| 1617 | $L_{a466}$ | $L_{b42}$ | 1618 | $L_{a466}$ | $L_{b43}$ |
| 1619 | $L_{a466}$ | $L_{b44}$ | 1620 | $L_{a466}$ | $L_{b45}$ |
| 1621 | $L_{a466}$ | $L_{b71}$ | 1622 | $L_{a466}$ | $L_{b72}$ |
| 1623 | $L_{a466}$ | $L_{b79}$ | 1624 | $L_{a466}$ | $L_{b80}$ |
| 1625 | $L_{a466}$ | $L_{b81}$ | 1626 | $L_{a466}$ | $L_{b99}$ |
| 1627 | $L_{a466}$ | $L_{b112}$ | 1628 | $L_{a466}$ | $L_{b151}$ |
| 1629 | $L_{a466}$ | $L_{b153}$ | 1630 | $L_{a466}$ | $L_{b164}$ |
| 1631 | $L_{a466}$ | $L_{b166}$ | 1632 | $L_{a466}$ | $L_{b209}$ |
| 1633 | $L_{a466}$ | $L_{b287}$ | 1634 | $L_{a466}$ | $L_{b299}$ |

| Metal complex | $L_a$ | $L_b$ | Metal complex | $L_a$ | $L_b$ |
|---|---|---|---|---|---|
| 1635 | $L_{a518}$ | $L_{b1}$ | 1636 | $L_{a518}$ | $L_{b3}$ |
| 1637 | $L_{a518}$ | $L_{b4}$ | 1638 | $L_{a518}$ | $L_{b8}$ |
| 1639 | $L_{a518}$ | $L_{b10}$ | 1640 | $L_{a518}$ | $L_{b12}$ |
| 1641 | $L_{a518}$ | $L_{b13}$ | 1642 | $L_{a518}$ | $L_{b17}$ |
| 1643 | $L_{a518}$ | $L_{b21}$ | 1644 | $L_{a518}$ | $L_{b22}$ |
| 1645 | $L_{a518}$ | $L_{b26}$ | 1646 | $L_{a518}$ | $L_{b28}$ |
| 1647 | $L_{a518}$ | $L_{b30}$ | 1648 | $L_{a518}$ | $L_{b31}$ |
| 1649 | $L_{a518}$ | $L_{b35}$ | 1650 | $L_{a518}$ | $L_{b37}$ |
| 1651 | $L_{a518}$ | $L_{b38}$ | 1652 | $L_{a518}$ | $L_{b39}$ |
| 1653 | $L_{a518}$ | $L_{b40}$ | 1654 | $L_{a518}$ | $L_{b41}$ |
| 1655 | $L_{a518}$ | $L_{b42}$ | 1656 | $L_{a518}$ | $L_{b43}$ |
| 1657 | $L_{a518}$ | $L_{b44}$ | 1658 | $L_{a518}$ | $L_{b45}$ |
| 1659 | $L_{a518}$ | $L_{b71}$ | 1660 | $L_{a518}$ | $L_{b72}$ |
| 1661 | $L_{a518}$ | $L_{b79}$ | 1662 | $L_{a518}$ | $L_{b80}$ |
| 1663 | $L_{a518}$ | $L_{b81}$ | 1664 | $L_{a518}$ | $L_{b99}$ |
| 1665 | $L_{a518}$ | $L_{b112}$ | 1666 | $L_{a518}$ | $L_{b151}$ |
| 1667 | $L_{a518}$ | $L_{b153}$ | 1668 | $L_{a518}$ | $L_{b164}$ |
| 1669 | $L_{a518}$ | $L_{b166}$ | 1670 | $L_{a518}$ | $L_{b209}$ |
| 1671 | $L_{a518}$ | $L_{b287}$ | 1672 | $L_{a518}$ | $L_{b299}$ |
| 1673 | $L_{a519}$ | $L_{b1}$ | 1674 | $L_{a519}$ | $L_{b3}$ |
| 1675 | $L_{a519}$ | $L_{b4}$ | 1676 | $L_{a519}$ | $L_{b8}$ |
| 1677 | $L_{a519}$ | $L_{b10}$ | 1678 | $L_{a519}$ | $L_{b12}$ |
| 1679 | $L_{a519}$ | $L_{b13}$ | 1680 | $L_{a519}$ | $L_{b17}$ |
| 1681 | $L_{a519}$ | $L_{b21}$ | 1682 | $L_{a519}$ | $L_{b22}$ |
| 1683 | $L_{a519}$ | $L_{b26}$ | 1684 | $L_{a519}$ | $L_{b28}$ |
| 1685 | $L_{a519}$ | $L_{b30}$ | 1686 | $L_{a519}$ | $L_{b31}$ |
| 1687 | $L_{a519}$ | $L_{b35}$ | 1688 | $L_{a519}$ | $L_{b37}$ |
| 1689 | $L_{a519}$ | $L_{b38}$ | 1690 | $L_{a519}$ | $L_{b39}$ |
| 1691 | $L_{a519}$ | $L_{b40}$ | 1692 | $L_{a519}$ | $L_{b41}$ |
| 1693 | $L_{a519}$ | $L_{b42}$ | 1694 | $L_{a519}$ | $L_{b43}$ |
| 1695 | $L_{a519}$ | $L_{b44}$ | 1696 | $L_{a519}$ | $L_{b45}$ |
| 1697 | $L_{a519}$ | $L_{b71}$ | 1698 | $L_{a519}$ | $L_{b72}$ |
| 1699 | $L_{a519}$ | $L_{b79}$ | 1700 | $L_{a519}$ | $L_{b80}$ |
| 1701 | $L_{a519}$ | $L_{b81}$ | 1702 | $L_{a519}$ | $L_{b99}$ |
| 1703 | $L_{a519}$ | $L_{b112}$ | 1704 | $L_{a519}$ | $L_{b151}$ |
| 1705 | $L_{a519}$ | $L_{b153}$ | 1706 | $L_{a519}$ | $L_{b164}$ |
| 1707 | $L_{a519}$ | $L_{b166}$ | 1708 | $L_{a519}$ | $L_{b209}$ |
| 1709 | $L_{a519}$ | $L_{b287}$ | 1710 | $L_{a519}$ | $L_{b299}$ |
| 1711 | $L_{a525}$ | $L_{b1}$ | 1712 | $L_{a525}$ | $L_{b3}$ |
| 1713 | $L_{a525}$ | $L_{b4}$ | 1714 | $L_{a525}$ | $L_{b8}$ |
| 1715 | $L_{a525}$ | $L_{b10}$ | 1716 | $L_{a525}$ | $L_{b12}$ |
| 1717 | $L_{a525}$ | $L_{b13}$ | 1718 | $L_{a525}$ | $L_{b17}$ |
| 1719 | $L_{a525}$ | $L_{b21}$ | 1720 | $L_{a525}$ | $L_{b22}$ |
| 1721 | $L_{a525}$ | $L_{b26}$ | 1722 | $L_{a525}$ | $L_{b28}$ |
| 1723 | $L_{a525}$ | $L_{b30}$ | 1724 | $L_{a525}$ | $L_{b31}$ |
| 1725 | $L_{a525}$ | $L_{b35}$ | 1726 | $L_{a525}$ | $L_{b37}$ |
| 1727 | $L_{a525}$ | $L_{b38}$ | 1728 | $L_{a525}$ | $L_{b39}$ |
| 1729 | $L_{a525}$ | $L_{b40}$ | 1730 | $L_{a525}$ | $L_{b41}$ |
| 1731 | $L_{a525}$ | $L_{b42}$ | 1732 | $L_{a525}$ | $L_{b43}$ |
| 1733 | $L_{a525}$ | $L_{b44}$ | 1734 | $L_{a525}$ | $L_{b45}$ |
| 1735 | $L_{a525}$ | $L_{b71}$ | 1736 | $L_{a525}$ | $L_{b72}$ |
| 1737 | $L_{a525}$ | $L_{b79}$ | 1738 | $L_{a525}$ | $L_{b80}$ |
| 1739 | $L_{a525}$ | $L_{b81}$ | 1740 | $L_{a525}$ | $L_{b99}$ |
| 1741 | $L_{a525}$ | $L_{b112}$ | 1742 | $L_{a525}$ | $L_{b151}$ |
| 1743 | $L_{a525}$ | $L_{b153}$ | 1744 | $L_{a525}$ | $L_{b164}$ |
| 1745 | $L_{a525}$ | $L_{b166}$ | 1746 | $L_{a525}$ | $L_{b209}$ |
| 1747 | $L_{a525}$ | $L_{b287}$ | 1748 | $L_{a525}$ | $L_{b299}$ |
| 1749 | $L_{a562}$ | $L_{b1}$ | 1750 | $L_{a562}$ | $L_{b3}$ |
| 1751 | $L_{a562}$ | $L_{b4}$ | 1752 | $L_{a562}$ | $L_{b8}$ |
| 1753 | $L_{a562}$ | $L_{b10}$ | 1754 | $L_{a562}$ | $L_{b12}$ |
| 1755 | $L_{a562}$ | $L_{b13}$ | 1756 | $L_{a562}$ | $L_{b17}$ |
| 1757 | $L_{a562}$ | $L_{b21}$ | 1758 | $L_{a562}$ | $L_{b22}$ |
| 1759 | $L_{a562}$ | $L_{b26}$ | 1760 | $L_{a562}$ | $L_{b28}$ |
| 1761 | $L_{a562}$ | $L_{b30}$ | 1762 | $L_{a562}$ | $L_{b31}$ |
| 1763 | $L_{a562}$ | $L_{b35}$ | 1764 | $L_{a562}$ | $L_{b37}$ |
| 1765 | $L_{a562}$ | $L_{b38}$ | 1766 | $L_{a562}$ | $L_{b39}$ |
| 1767 | $L_{a562}$ | $L_{b40}$ | 1768 | $L_{a562}$ | $L_{b41}$ |
| 1769 | $L_{a562}$ | $L_{b42}$ | 1770 | $L_{a562}$ | $L_{b43}$ |
| 1771 | $L_{a562}$ | $L_{b44}$ | 1772 | $L_{a562}$ | $L_{b45}$ |
| 1773 | $L_{a562}$ | $L_{b71}$ | 1774 | $L_{a562}$ | $L_{b72}$ |
| 1775 | $L_{a562}$ | $L_{b79}$ | 1776 | $L_{a562}$ | $L_{b80}$ |
| 1777 | $L_{a562}$ | $L_{b81}$ | 1778 | $L_{a562}$ | $L_{b99}$ |
| 1779 | $L_{a562}$ | $L_{b112}$ | 1780 | $L_{a562}$ | $L_{b151}$ |
| 1781 | $L_{a562}$ | $L_{b153}$ | 1782 | $L_{a562}$ | $L_{b164}$ |
| 1783 | $L_{a562}$ | $L_{b166}$ | 1784 | $L_{a562}$ | $L_{b209}$ |
| 1785 | $L_{a562}$ | $L_{b287}$ | 1786 | $L_{a562}$ | $L_{b299}$ |

-continued

| Metal complex | $L_a$ | $L_b$ | Metal complex | $L_a$ | $L_b$ |
|---|---|---|---|---|---|
| 1787 | $L_{a575}$ | $L_{b1}$ | 1788 | $L_{a575}$ | $L_{b3}$ |
| 1789 | $L_{a575}$ | $L_{b4}$ | 1790 | $L_{a575}$ | $L_{b8}$ |
| 1791 | $L_{a575}$ | $L_{b10}$ | 1792 | $L_{a575}$ | $L_{b12}$ |
| 1793 | $L_{a575}$ | $L_{b13}$ | 1794 | $L_{a575}$ | $L_{b17}$ |
| 1795 | $L_{a575}$ | $L_{b21}$ | 1796 | $L_{a575}$ | $L_{b22}$ |
| 1797 | $L_{a575}$ | $L_{b26}$ | 1798 | $L_{a575}$ | $L_{b28}$ |
| 1799 | $L_{a575}$ | $L_{b30}$ | 1800 | $L_{a575}$ | $L_{b31}$ |
| 1801 | $L_{a575}$ | $L_{b35}$ | 1802 | $L_{a575}$ | $L_{b37}$ |
| 1803 | $L_{a575}$ | $L_{b38}$ | 1804 | $L_{a575}$ | $L_{b39}$ |
| 1805 | $L_{a575}$ | $L_{b40}$ | 1806 | $L_{a575}$ | $L_{b41}$ |
| 1807 | $L_{a575}$ | $L_{b42}$ | 1808 | $L_{a575}$ | $L_{b43}$ |
| 1809 | $L_{a575}$ | $L_{b44}$ | 1810 | $L_{a575}$ | $L_{b45}$ |
| 1811 | $L_{a575}$ | $L_{b71}$ | 1812 | $L_{a575}$ | $L_{b72}$ |
| 1813 | $L_{a575}$ | $L_{b79}$ | 1814 | $L_{a575}$ | $L_{b80}$ |
| 1815 | $L_{a575}$ | $L_{b81}$ | 1816 | $L_{a575}$ | $L_{b99}$ |
| 1817 | $L_{a575}$ | $L_{b112}$ | 1818 | $L_{a575}$ | $L_{b151}$ |
| 1819 | $L_{a575}$ | $L_{b153}$ | 1820 | $L_{a575}$ | $L_{b164}$ |
| 1821 | $L_{a575}$ | $L_{b166}$ | 1822 | $L_{a575}$ | $L_{b209}$ |
| 1823 | $L_{a575}$ | $L_{b287}$ | 1824 | $L_{a575}$ | $L_{b299}$ |
| 1863 | $L_{a597}$ | $L_{b1}$ | 1864 | $L_{a597}$ | $L_{b3}$ |
| 1865 | $L_{a597}$ | $L_{b4}$ | 1866 | $L_{a597}$ | $L_{b8}$ |
| 1867 | $L_{a597}$ | $L_{b10}$ | 1868 | $L_{a597}$ | $L_{b12}$ |
| 1869 | $L_{a597}$ | $L_{b13}$ | 1870 | $L_{a597}$ | $L_{b17}$ |
| 1871 | $L_{a597}$ | $L_{b21}$ | 1872 | $L_{a597}$ | $L_{b22}$ |
| 1873 | $L_{a597}$ | $L_{b26}$ | 1874 | $L_{a597}$ | $L_{b28}$ |
| 1875 | $L_{a597}$ | $L_{b30}$ | 1876 | $L_{a597}$ | $L_{b31}$ |
| 1877 | $L_{a597}$ | $L_{b35}$ | 1878 | $L_{a597}$ | $L_{b37}$ |
| 1879 | $L_{a597}$ | $L_{b38}$ | 1880 | $L_{a597}$ | $L_{b39}$ |
| 1881 | $L_{a597}$ | $L_{b40}$ | 1882 | $L_{a597}$ | $L_{b41}$ |
| 1883 | $L_{a597}$ | $L_{b42}$ | 1884 | $L_{a597}$ | $L_{b43}$ |
| 1885 | $L_{a597}$ | $L_{b44}$ | 1886 | $L_{a597}$ | $L_{b45}$ |
| 1887 | $L_{a597}$ | $L_{b71}$ | 1888 | $L_{a597}$ | $L_{b72}$ |
| 1889 | $L_{a597}$ | $L_{b79}$ | 1890 | $L_{a597}$ | $L_{b80}$ |
| 1891 | $L_{a597}$ | $L_{b81}$ | 1892 | $L_{a597}$ | $L_{b99}$ |
| 1893 | $L_{a597}$ | $L_{b112}$ | 1894 | $L_{a597}$ | $L_{b151}$ |
| 1895 | $L_{a597}$ | $L_{b153}$ | 1896 | $L_{a597}$ | $L_{b164}$ |
| 1897 | $L_{a597}$ | $L_{b166}$ | 1898 | $L_{a597}$ | $L_{b209}$ |
| 1899 | $L_{a597}$ | $L_{b287}$ | 1900 | $L_{a597}$ | $L_{b299}$. |

10. The metal complex of claim 1, wherein the metal complex is $Ir(L_a)_m(L_b)_{3-m}$ and has a structure represented by Formula 3:

Formula 3

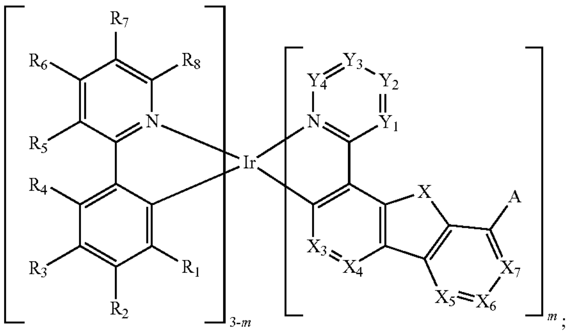

wherein, m is selected from 1, 2 or 3; when m is selected from 1, two $L_b$ are identical or different;

when m is selected from 2 or 3, a plurality of $L_a$ are identical or different;

$Y_1$ to $Y_4$ are, at each occurrence identically or differently, selected from $CR_y$ or N;

X is selected from the group consisting of O, S, Se, NR', CR'R', SiR'R', and GeR'R'; when two R' are present, the two R' are identical or different;

$X_3$ to $X_7$ are, at each occurrence identically or differently, selected from $CR_x$ or N;

at least one of $X_3$ to $X_7$ is $CR_x$, wherein the $R_x$ is a cyano group or fluorine;

A has a structure represented by Formula 2:

Formula 2

$$*-A_1-(A_2)_a-R_{a3};$$

wherein a is selected from 1;

$A_1$ is, at each occurrence identically or differently, selected from the group consisting of the following groups unsubstituted or substituted by one or at least two $R_{a1}$: alkylene having 1 to 20 carbon atoms, heteroalkylene having 1 to 20 carbon atoms, cycloalkylene having 3 to 20 carbon atoms, heterocyclene having 3 to 20 ring atoms, phenylene and heteroarylene having 5 to 6 ring atoms, and combinations thereof;

$A_2$ is, at each occurrence identically or differently, selected from the group consisting of the following groups unsubstituted or substituted by one or at least two $R_{a2}$: cycloalkylene having 3 to 20 carbon atoms, heterocyclene having 3 to 20 ring atoms, and combinations thereof;

R', $R_x$, $R_y$, $R_{a1}$, $R_{a2}$, $R_{a3}$, and $R_1$ to $R_8$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof;

adjacent substituents $R_1$ to $R_8$ can be optionally joined to form a ring;

adjacent substituents R', $R_x$, $R_y$, $R_{a2}$, $R_{a3}$ can be optionally joined to form a ring;

the length of A is at least 6.7 Å;

"*" represents a position where A is attached;

when $A_1$ is, at each occurrence identically or differently, selected from phenylene unsubstituted or substituted by one or at least two $R_{a1}$ or heteroarylene having 5 to 6 ring atoms unsubstituted or substituted by one or at least two $R_{a1}$, $A_2$ and $R_{a1}$ need to satisfy the following conditions:

1) $A_2$ that is directly attached to $A_1$ is, at each occurrence identically or differently, selected from the group consisting of: cycloalkylene having 3 to 20 carbon atoms unsubstituted or substituted by one or at least two $R_{a2}$, heterocyclene having 3 to 20 ring atoms unsubstituted or substituted by one or at least two $R_{a2}$, and combinations thereof; and 2) $R_{a1}$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof.

11. The metal complex of claim 10, wherein $X_3$ to $X_7$ are, at each occurrence identically or differently, selected from $CR_x$; and/or $Y_1$ to $Y_4$ are, at each occurrence identically or differently, selected from $CR_y$.

12. The metal complex of claim 10, wherein at least one of $X_3$ to $X_7$ is N, and/or at least one of $Y_1$ to $Y_4$ is N.

13. The metal complex of claim 10, wherein at least one of $X_3$ to $X_7$ is $CR_x$, wherein the $R_x$ is cyano or fluorine; remaining $R_x$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, a cyano group, and combinations thereof.

14. The metal complex of claim 10, wherein $R_y$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted arylalkyl having 7 to 30 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, and combinations thereof.

15. The metal complex of claim 10, wherein at least one or at least two of $R_5$ to $R_8$ is (are), at each occurrence identically or differently, selected from substituted or unsubstituted alkyl having 1 to 20 carbon atoms, substituted or unsubstituted cycloalkyl having 3 to 20 ring carbon atoms or combinations thereof, and the total number of carbon atoms in all $R_5$ to $R_8$ is at least 4.

16. The metal complex of claim 10, wherein at least one or at least two or at least three or all of $R_2$, $R_3$, $R_6$, and $R_7$ is (are) selected from the group consisting of: deuterium, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, and combinations thereof.

17. The metal complex of claim 10, wherein $X_7$ is $CR_x$, wherein the $R_x$ is cyano or fluorine; remaining $R_x$ are, at each occurrence identically or differently, selected from the group consisting of: hydrogen, deuterium, substituted or unsubstituted alkyl having 1 to 6 carbon atoms, substituted or unsubstituted cycloalkyl having 3 to 6 ring carbon atoms, and combinations thereof.

18. The metal complex of claim 10, wherein at least one $R_y$ is selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, and combinations thereof.

19. The metal complex of claim 1, wherein X is selected from O or S.

20. The metal complex of claim 1, wherein $R_{a1}$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted arylalkyl having 7 to 30 carbon atoms, substituted or unsubstituted alkylsilyl having 4 to 20 carbon atoms, substituted or unsubstituted arylsilyl having 6 to 20 carbon atoms, a hydroxyl group, a sulfanyl group, and combinations thereof.

21. The metal complex of claim 1, wherein $R_{a2}$ and $R_{a3}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted arylalkyl having 7 to 30 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, a hydroxyl group, a sulfanyl group, and combinations thereof.

22. The metal complex of claim 1, wherein A is, at each occurrence identically or differently, selected from the group consisting of:

A-28

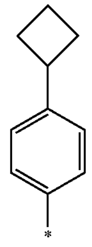

,

-continued
A-29
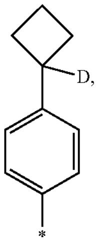
A-30
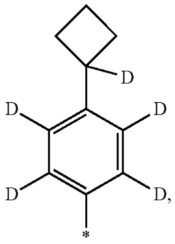
A-31
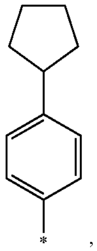
A-32
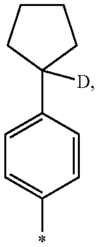
A-33
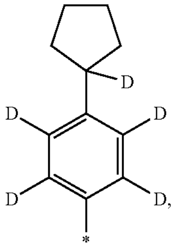
A-34
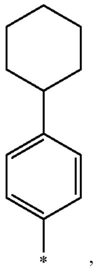
-continued
A-35
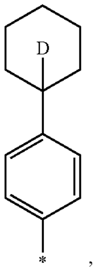
A-36
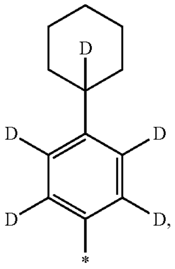
A-36
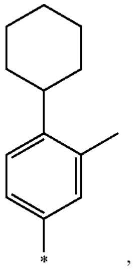
A-37
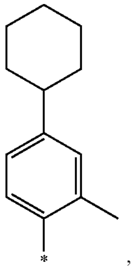
A-38
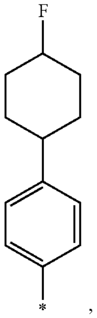

-continued
A-39
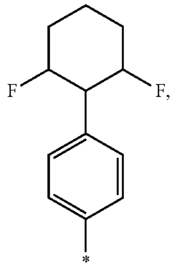
,
A-40
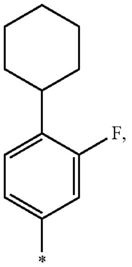
,
A-41
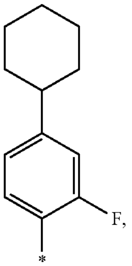
,
A-42
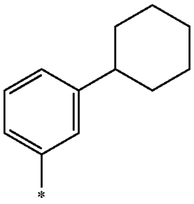
,
A-43
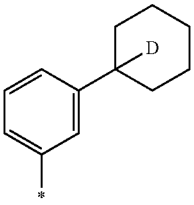
,
A-44
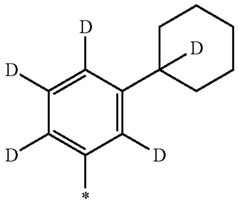
,
-continued
A-45
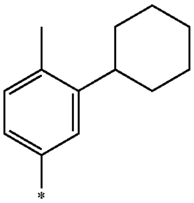
,
A-46
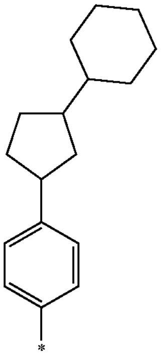
,
A-47
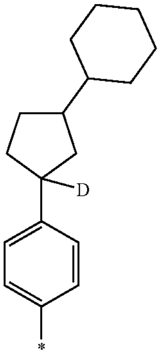
,
A-48
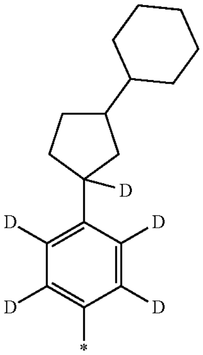
, -continued
A-49
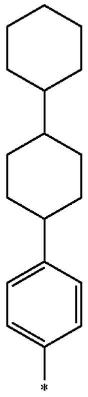
,
A-50
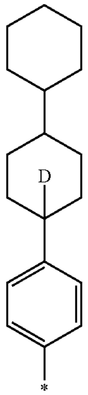
,
A-51
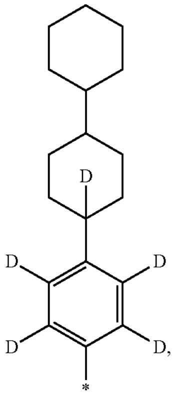
A-52
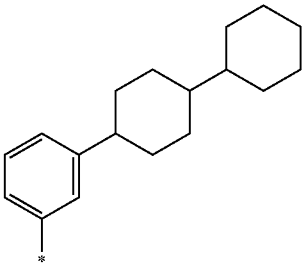
,
-continued
A-53
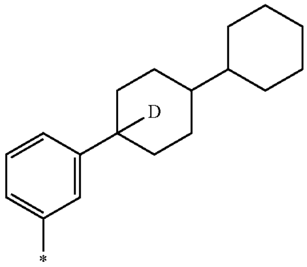
,
A-54
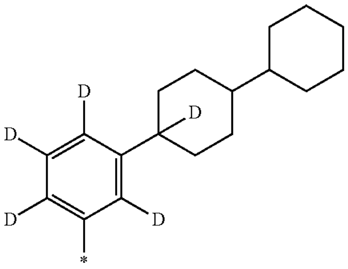
,
A-55
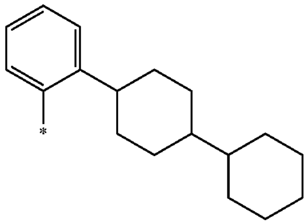
,
A-56
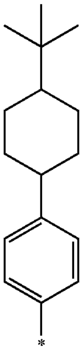
,
A-57
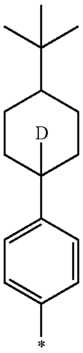
, A-58
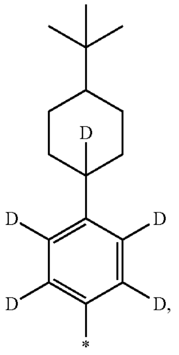
A-59
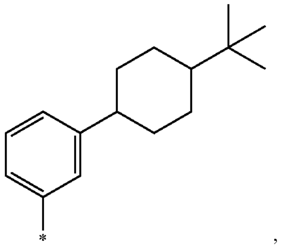
A-60
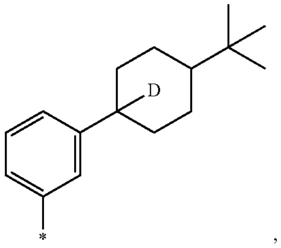
A-61
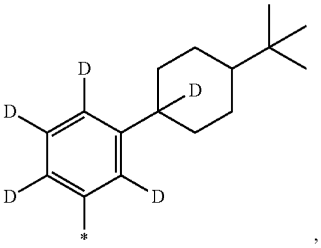
A-62
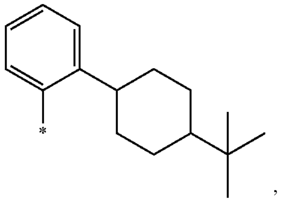
A-63
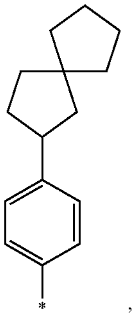
A-64
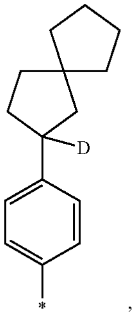
A-65
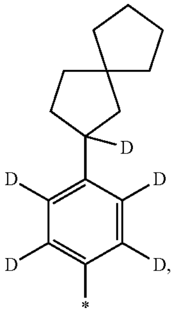
A-66
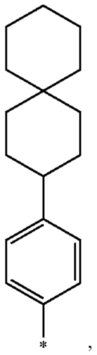

-continued
A-67
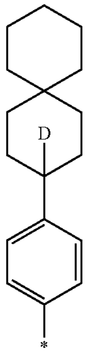
,
A-68
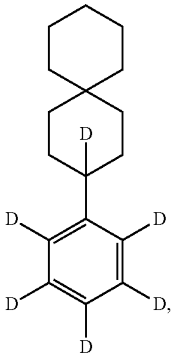
A-69
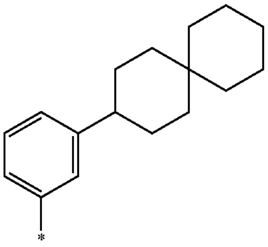
,
A-70
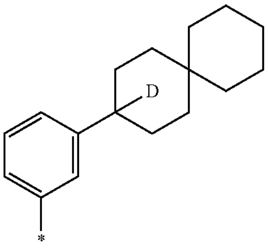
,
A-71
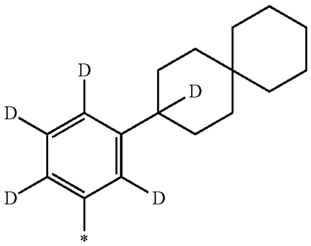
,
-continued
A-72
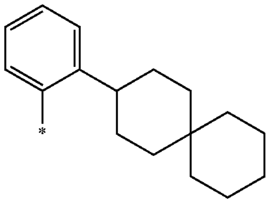
,
A-73
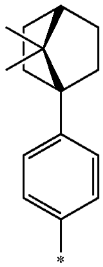
,
A-74
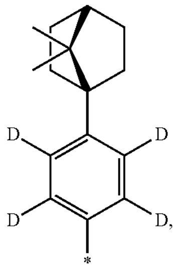
A-75
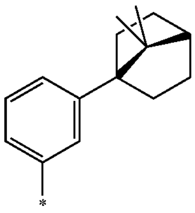
,
A-76
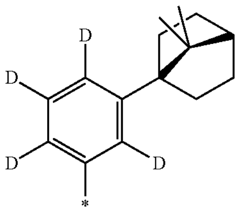
,
A-77
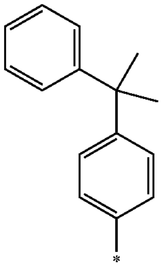
, -continued
A-78
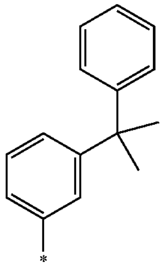
,
A-79
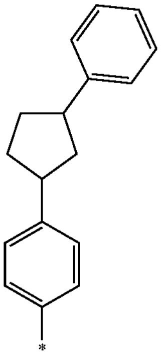
,
A-80
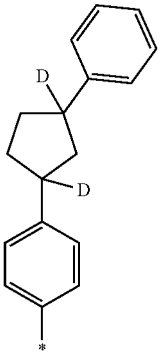
,
A-81
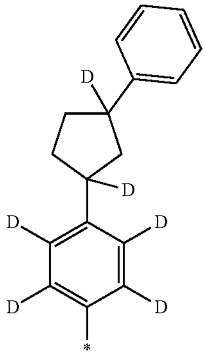
,
-continued
A-82
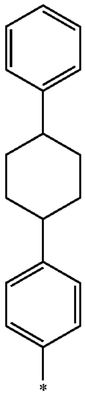
,
A-83
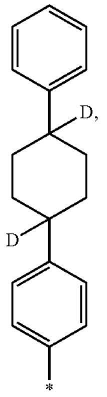
A-84
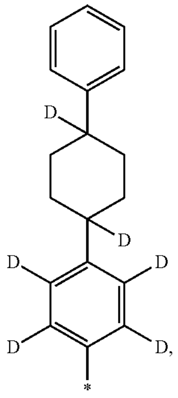
A-85
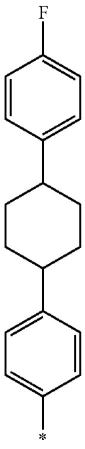
, -continued
A-86
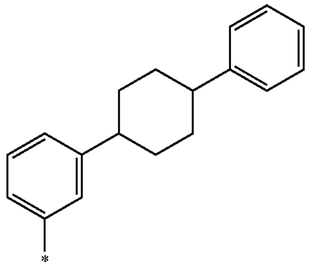
,
A-87
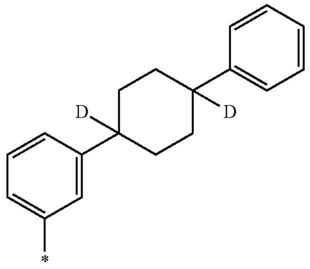
,
A-88
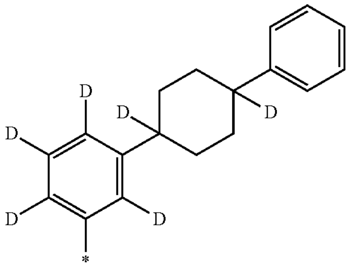
,
A-89
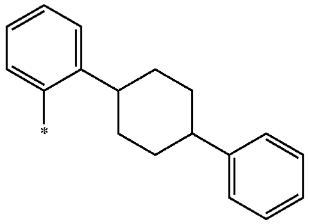
,
A-90
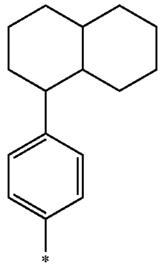
,
A-91
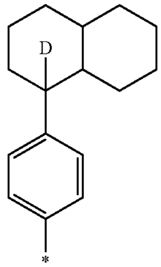
,
-continued
A-92
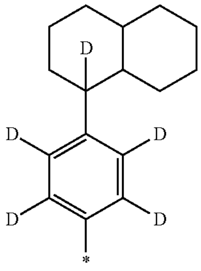
,
A-93
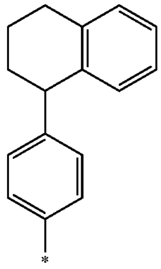
,
A-94
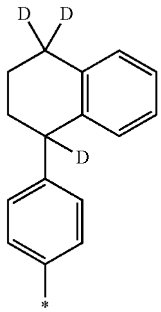
,
A-95
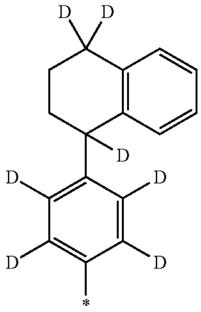
,
A-96
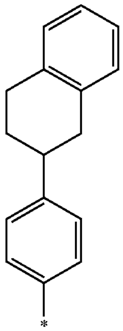
, -continued
A-97
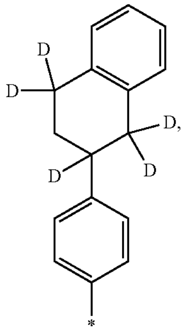
A-98
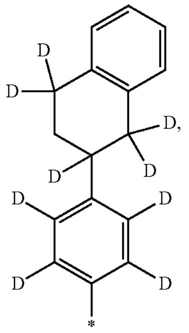
A-99
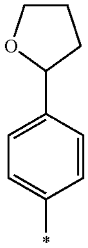
,
A-100
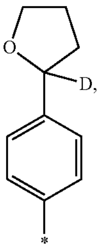
A-101
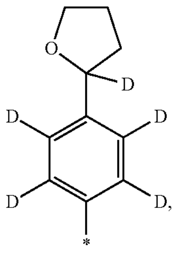
A-102
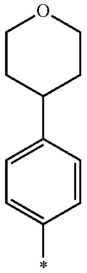
,
A-103
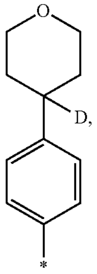
A-104
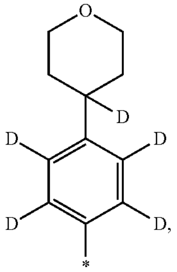
A-105
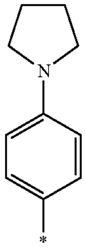
,
A-106
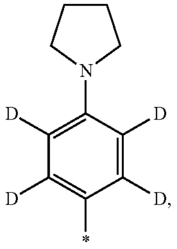
A-107
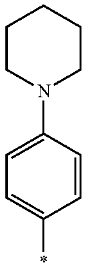
, -continued
A-108
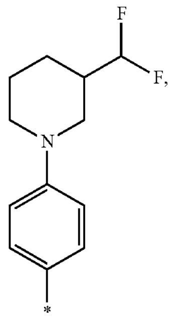
A-109
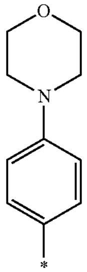
,
A-110
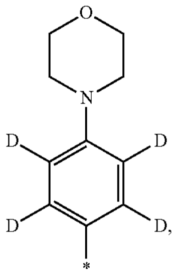
A-111
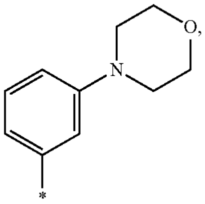
A-112
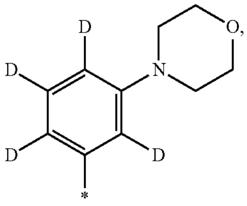
A-134
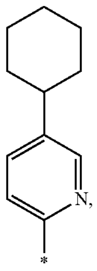
-continued
A-135
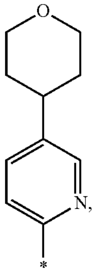
A-136
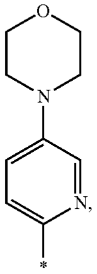
A-139
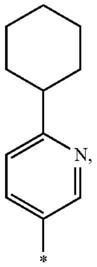
A-140
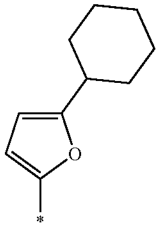
,
A-141
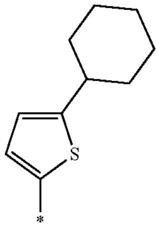
,
A-142
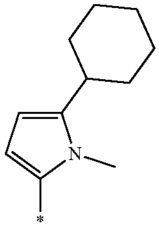
, -continued
A-143
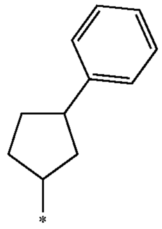
,
A-144
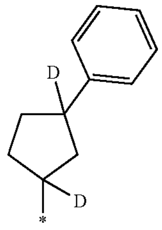
,
A-145
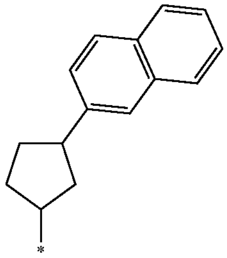
,
A-146
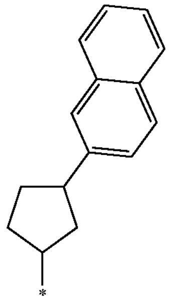
,
A-147
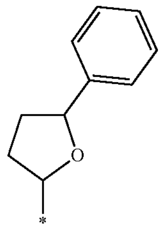
,
A-148
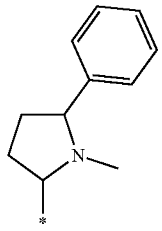
,
-continued
A-149
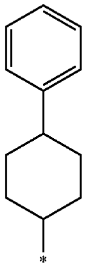
,
A-150
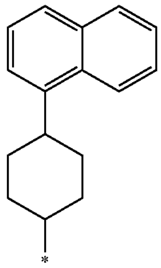
,
A-151
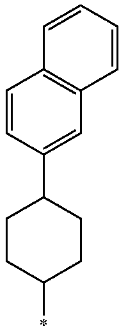
,
A-152
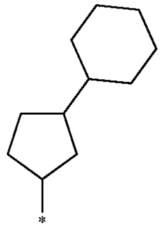
,
A-153
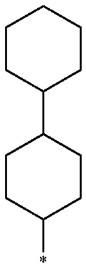
,
and combinations thereof;
optionally, hydrogen in the above groups can be partially or fully substituted with deuterium; wherein "*" represents a position where A is attached.

23. An electroluminescent device, comprising:

an anode, a cathode, and an organic layer disposed between the anode and the cathode, wherein the organic layer comprises the metal complex of claim 1.

24. The electroluminescent device of claim 23, wherein the organic layer comprising the metal complex is an emissive layer.

25. The electroluminescent device of claim 24, wherein the electroluminescent device emits green light or white light.

26. The electroluminescent device of claim 24, wherein the emissive layer comprises a first host compound;

the emissive layer further comprises a second host compound;

the first host compound and/or the second host compound comprise at least one chemical group selected from the group consisting of: benzene, pyridine, pyrimidine, triazine, carbazole, azacarbazole, indolocarbazole, dibenzothiophene, azadibenzothiophene, dibenzofuran, azadibenzofuran, dibenzoselenophene, triphenylene, azatriphenylene, fluorene, silafluorene, naphthalene, quinoline, isoquinoline, quinazoline, quinoxaline, phenanthrene, azaphenanthrene, and combinations thereof.

27. The electroluminescent device of claim 26, wherein the first host compound has a structure represented by Formula 4:

Formula 4

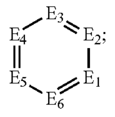

wherein, $E_1$ to $E_6$ are, at each occurrence identically or differently, selected from C, $CR_e$ or N, at least two of $E_1$ to $E_6$ are N, and at least one of $E_1$ to $E_6$ is C and is attached to Formula A:

Formula A

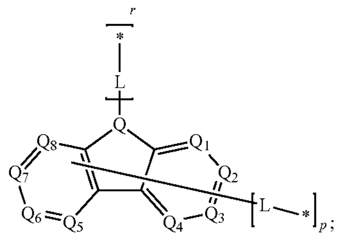

wherein,

Q is, at each occurrence identically or differently, selected from the group consisting of O, S, Se, N, NR", CR"R", SiR "R", GeR "R", and R'"C═CR"; when two R" are present, the two R" can be identical or different;

p is 0 or 1; r is 0 or 1;

when Q is selected from N, p is 0, and r is 1;

when Q is selected from the group consisting of O, S, Se, NR", CR"R", SiR'"R'", GeR'"R'", and R'"C═CR'", p is 1, and r is 0;

L is, at each occurrence identically or differently, selected from a single bond, substituted or unsubstituted alkylene having 1 to 20 carbon atoms, substituted or unsubstituted cycloalkylene having 3 to 20 carbon atoms, substituted or unsubstituted arylene having 6 to 20 carbon atoms, substituted or unsubstituted heteroarylene having 3 to 20 carbon atoms or combinations thereof;

$Q_1$ to $Q_8$ are, at each occurrence identically or differently, selected from C, $CR_q$ or N;

$R_e$, R'", and $R_q$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof;

"*" represents a position where Formula A is attached to Formula 4;

adjacent substituents $R_e$, R'", $R_q$ can be optionally joined to form a ring.

28. The electroluminescent device of claim 27, wherein $E_1$ to $E_6$ are, at each occurrence identically or differently, selected from C, $CR_e$ or N; wherein three of $E_1$ to $E_6$ are N, and at least one of $E_1$ to $E_6$ is $CR_e$ wherein the $R_e$ is, at each occurrence identically or differently, selected from the group consisting of: substituted or unsubstituted aryl having 6 to 30 carbon atoms, substituted or unsubstituted heteroaryl having 3 to 30 carbon atoms, and combinations thereof; and/or Q is, at each occurrence identically or differently, selected from O, S, N or NR'"; and/or R'" is, at each occurrence identically or differently, selected from substituted or unsubstituted aryl having 6 to 30 carbon atoms, substituted or unsubstituted heteroaryl having 3 to 30 carbon atoms or combinations thereof; and/or at least one or at least two of $Q_1$ to $Q_8$ is (are) selected from $CR_q$, wherein the $R_q$ is selected from substituted or unsubstituted aryl having 6 to 30 carbon atoms, substituted or unsubstituted heteroaryl having 5 to 30 carbon atoms or combinations thereof; and/or L is, at each occurrence identically or differently, selected from a single bond, substituted or unsubstituted arylene having 6 to 20 carbon atoms, substituted or unsubstituted heteroarylene having 3 to 20 carbon atoms or combinations thereof.

29. The electroluminescent device of claim 27, wherein the first host compound is selected from the group consisting of:

H-1

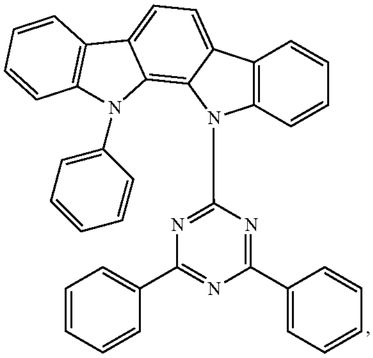

,

H-2

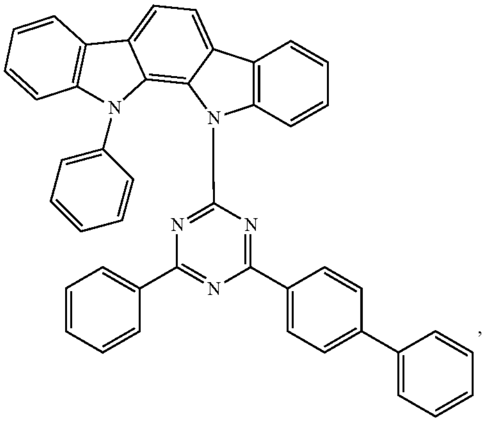

,

H-3

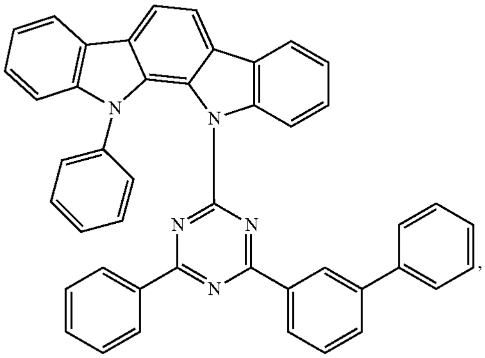

,

H-4

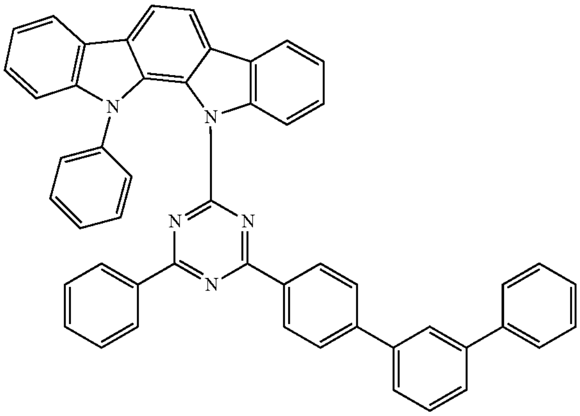

,

H-5

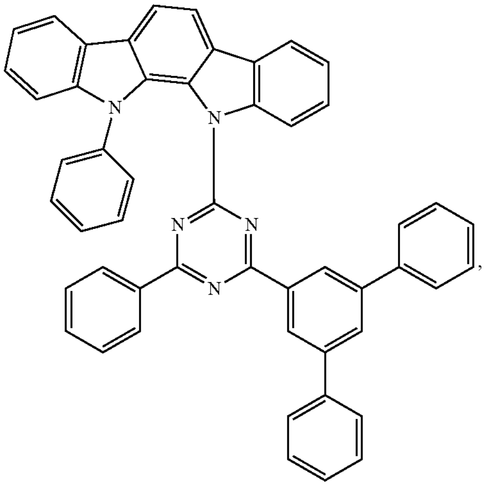

,

H-6

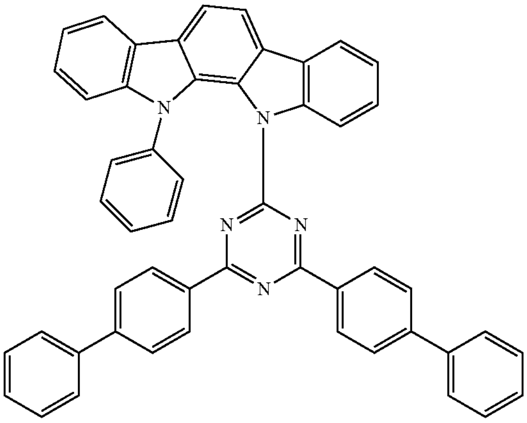

,

-continued
H-7
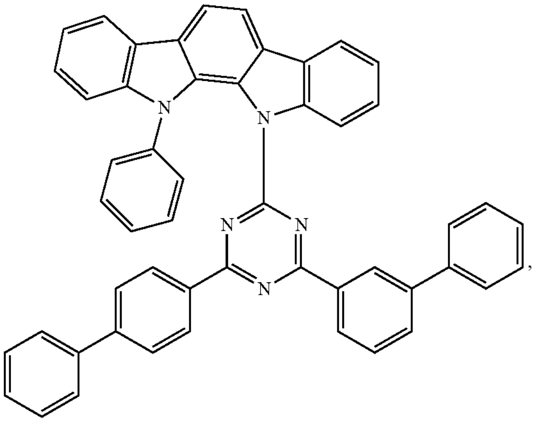
,
H-8
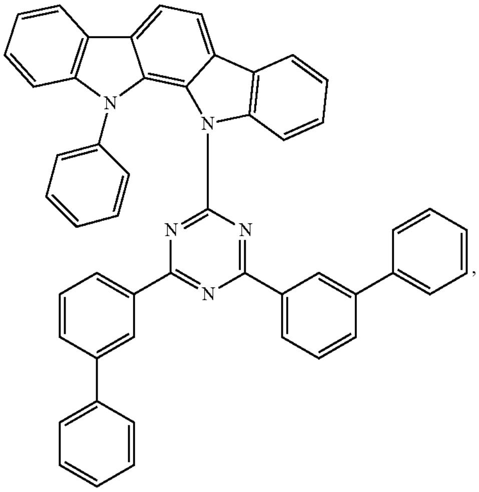
,
H-9
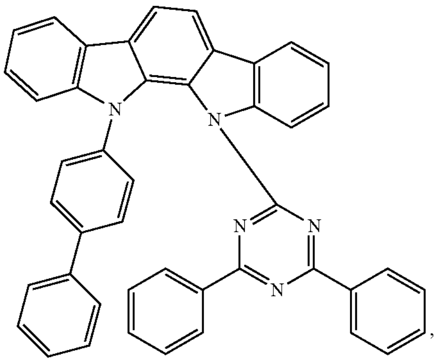
,
H-10
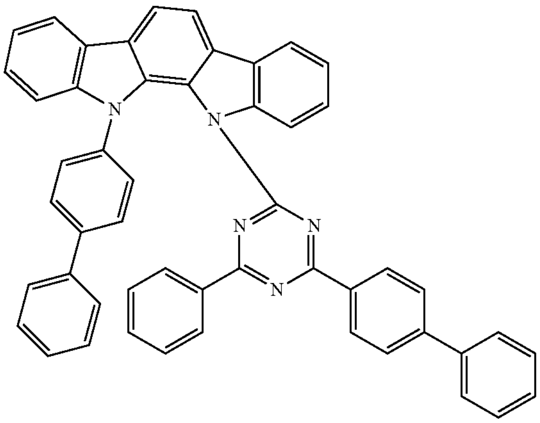
,
H-11
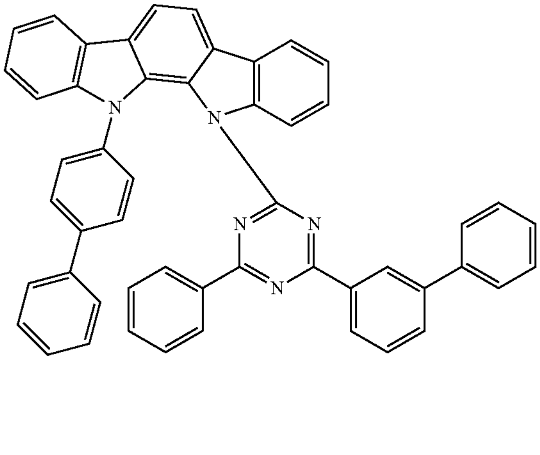
,
H-12
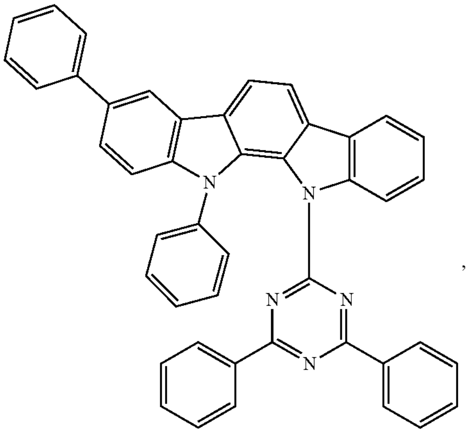
, -continued
H-13
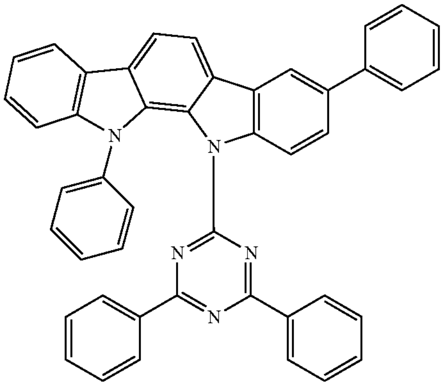
,
H-14
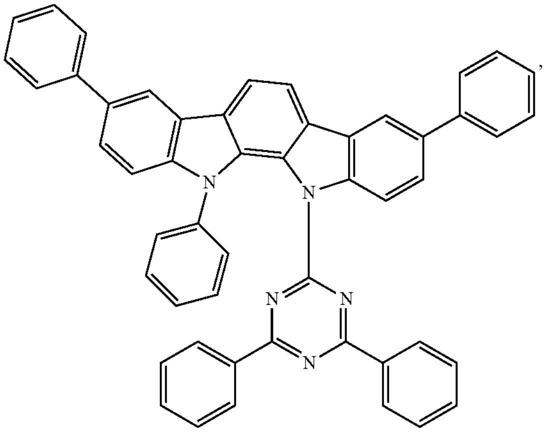
,
H-15
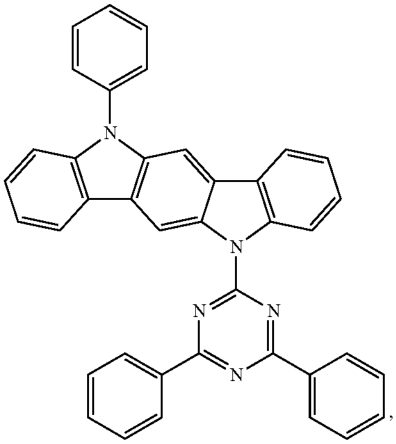
,
H-16
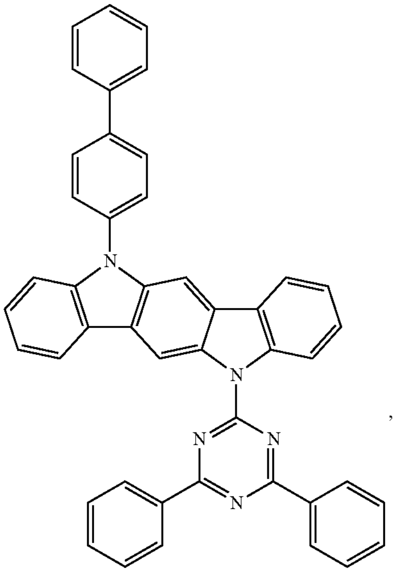
,
H-17
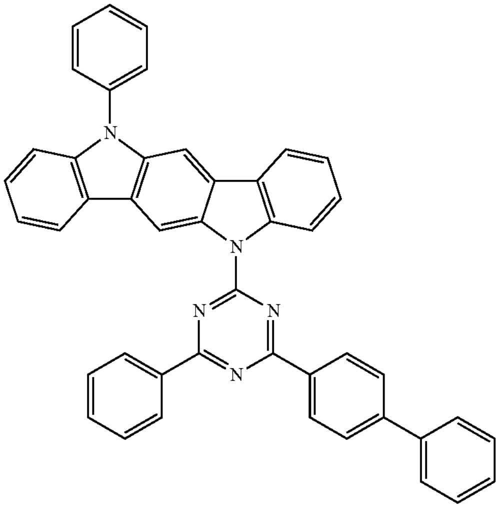
,
H-18
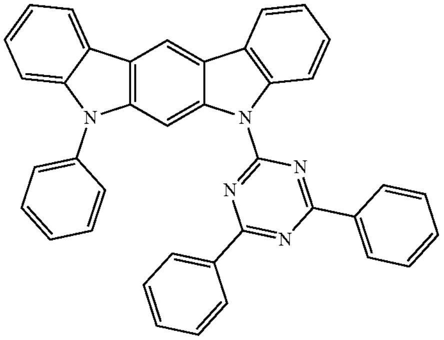
, -continued
H-19
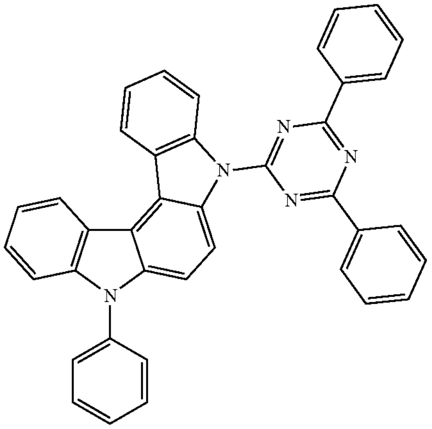
,
H-20
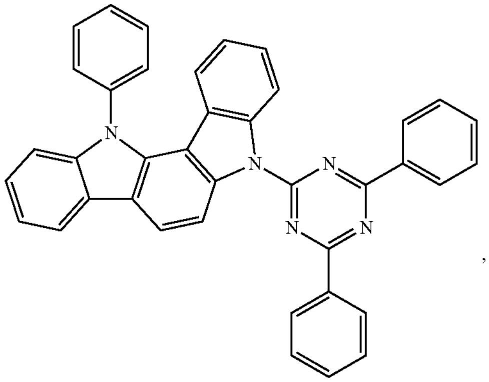
,
H-21
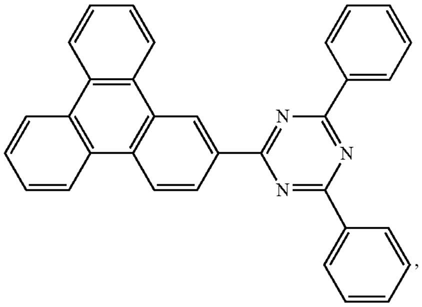
,
H-22
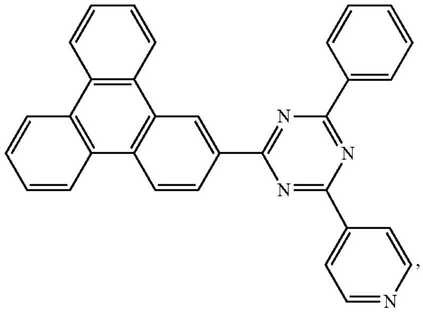
,
H-23
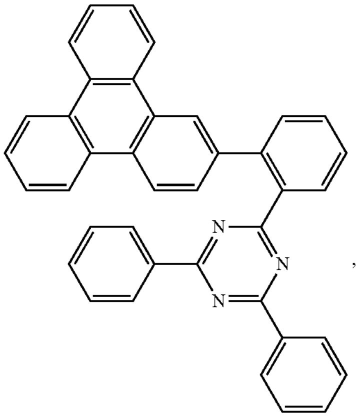
,
H-24
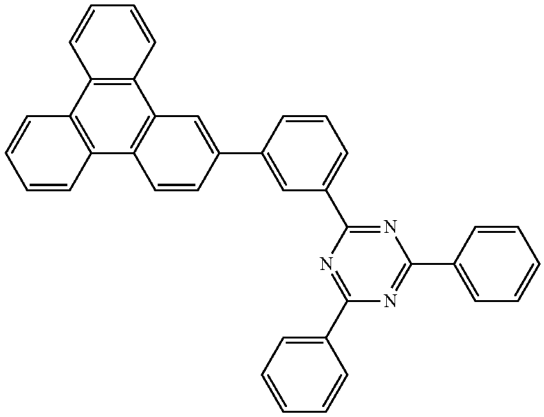
,
H-25
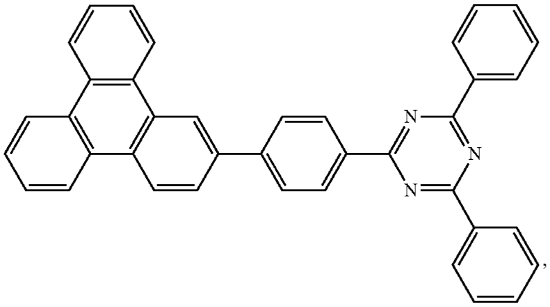
,
H-26
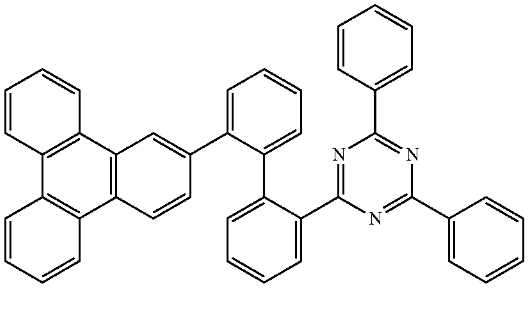
, -continued
H-27
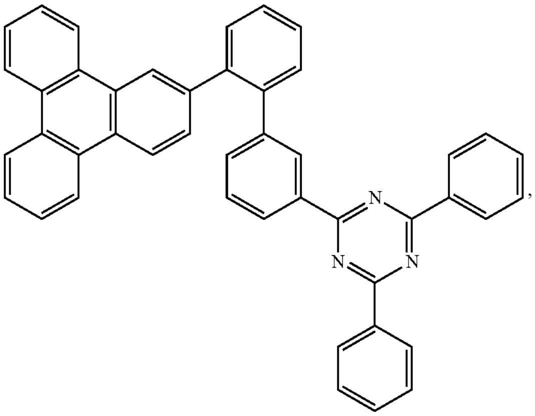,
H-28
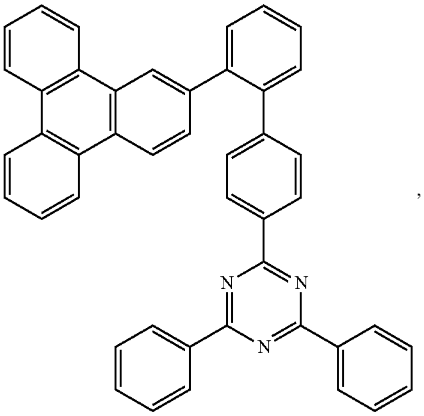,
H-29
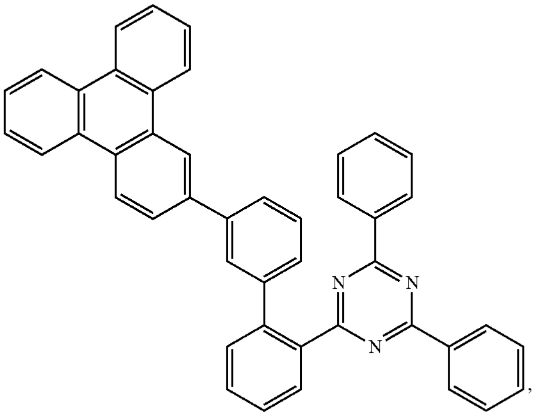,
H-30
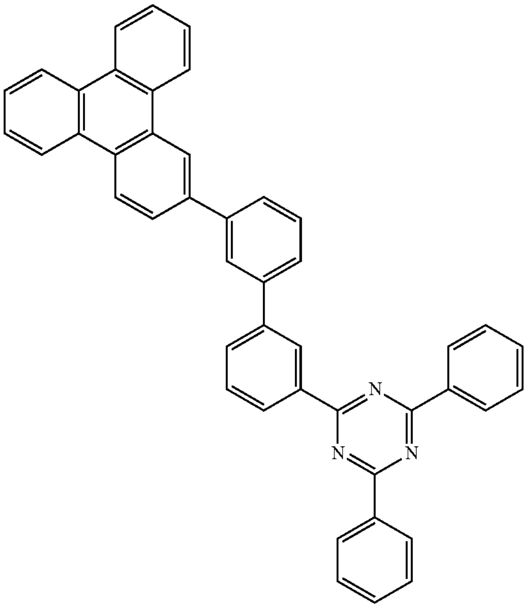,
H-31
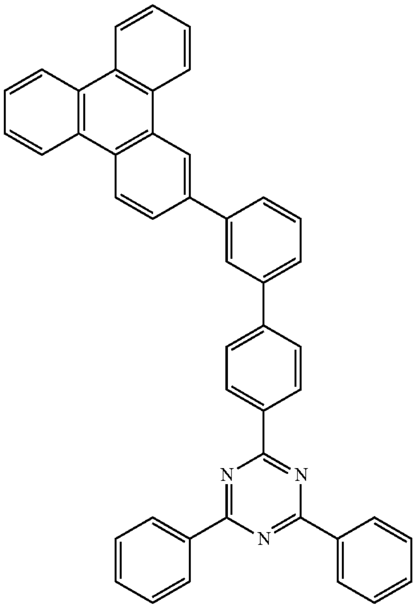,
H-32
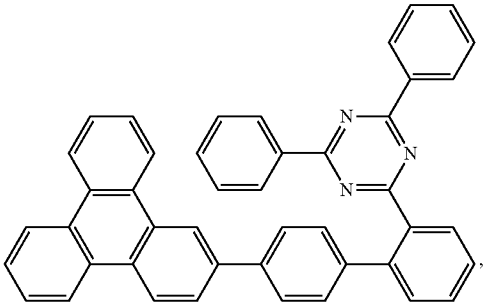, -continued
H-33
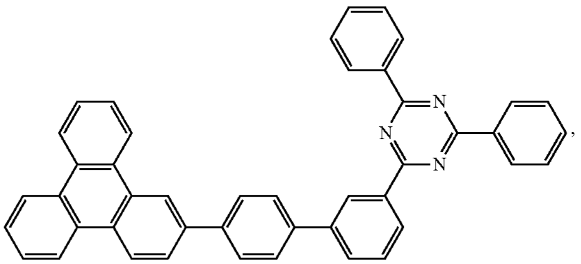
H-34
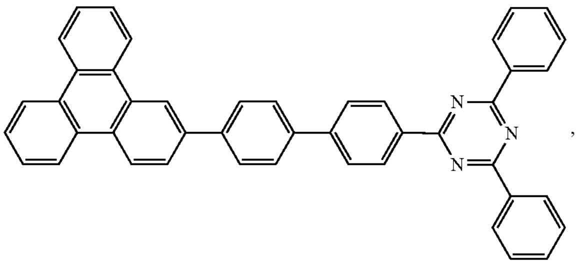
H-35
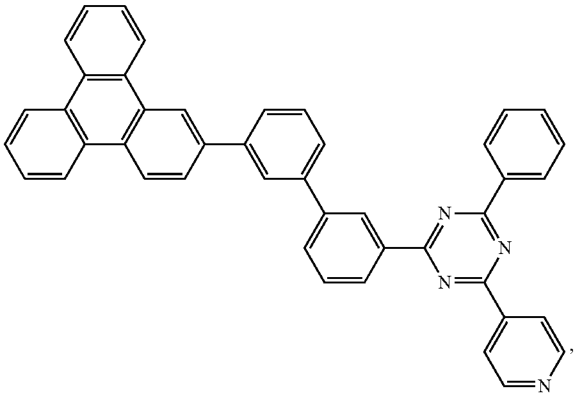
H-36
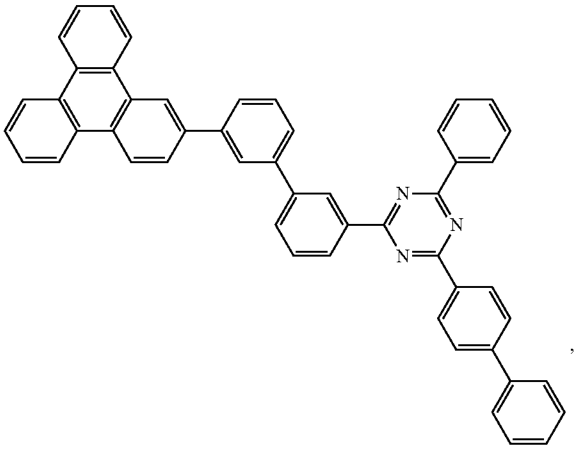
H-37
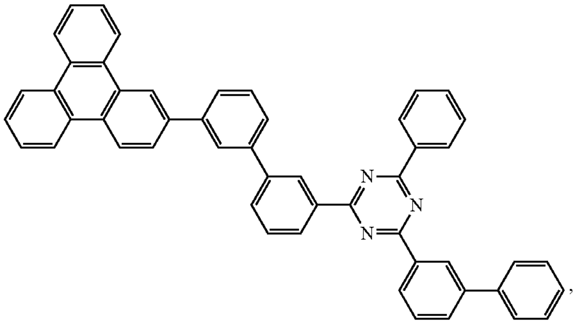
H-38
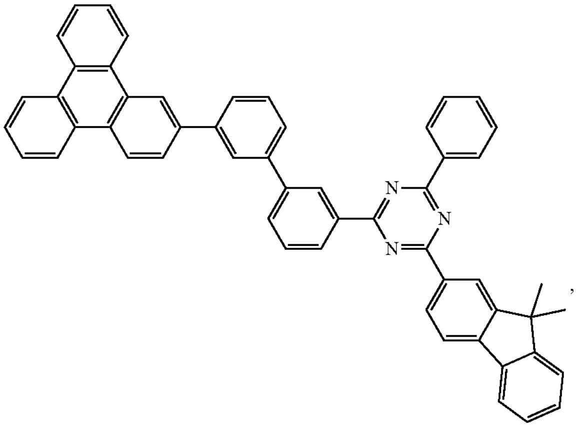
H-39
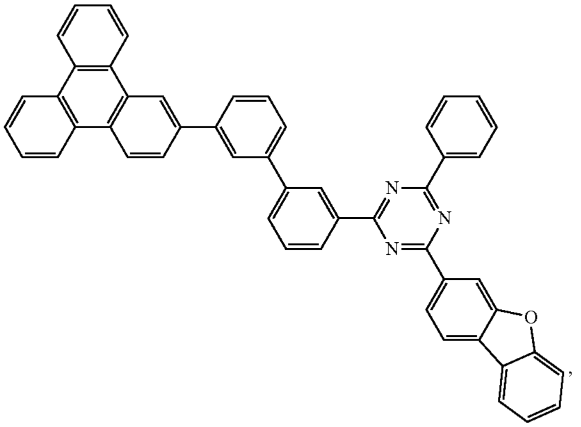
H-40
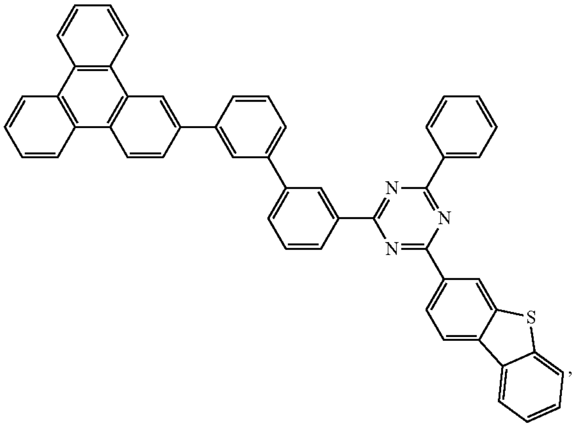

-continued
H-41
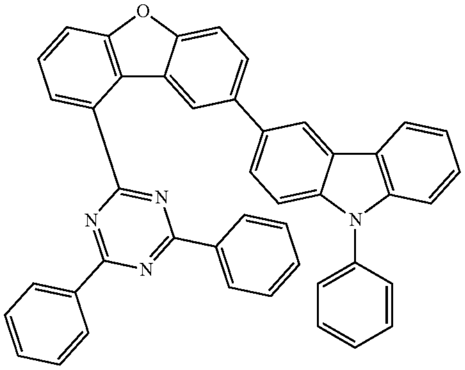
,
H-42
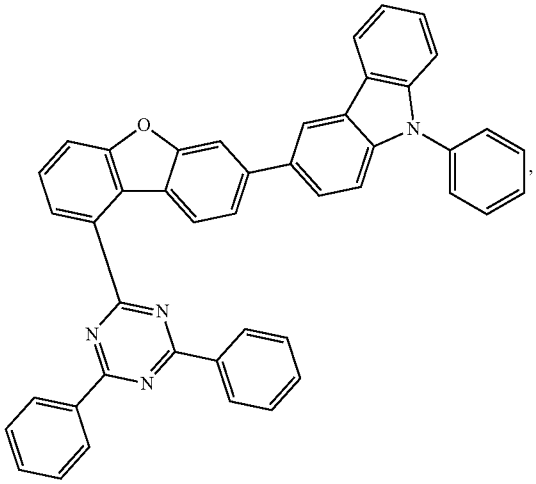
,
H-43
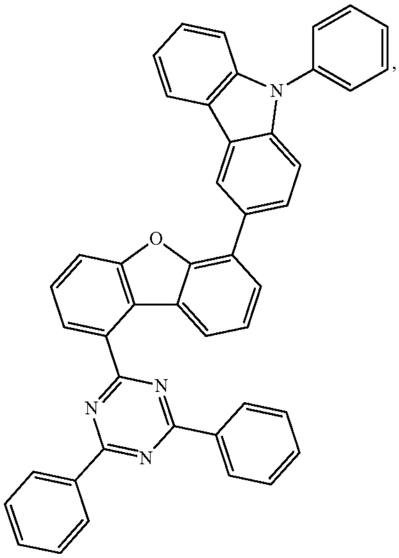
,
H-44
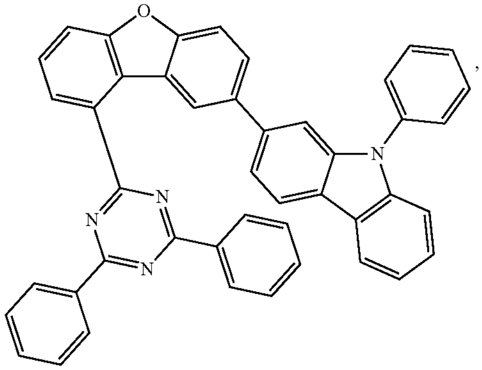
,
H-45
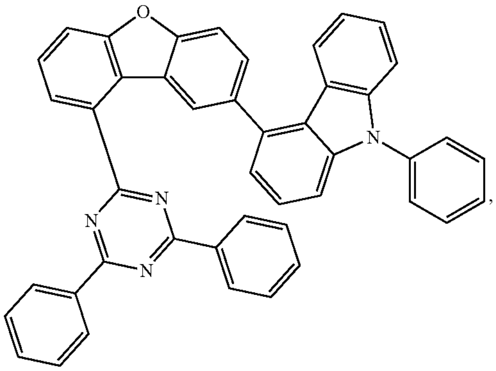
,
H-46
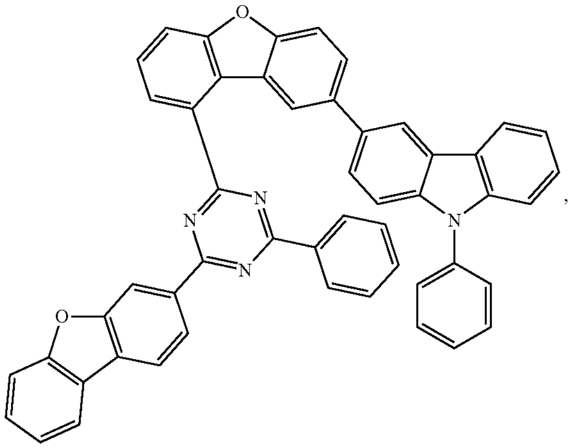
, -continued
H-47
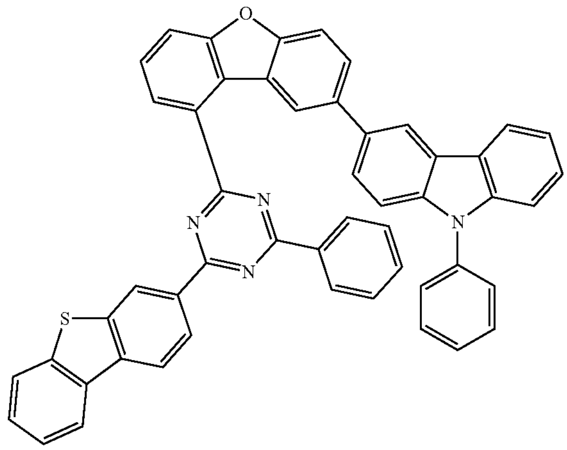
,
H-48
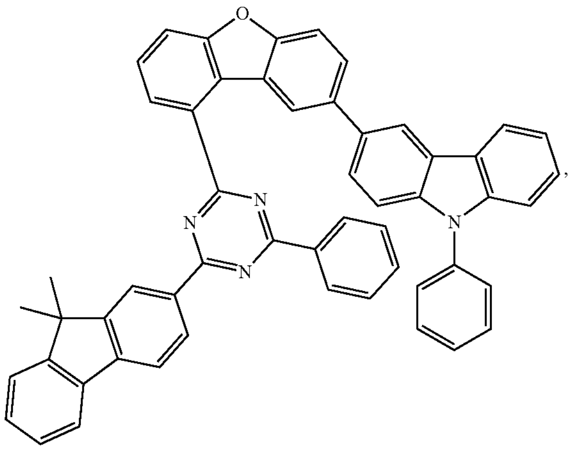
,
H-49
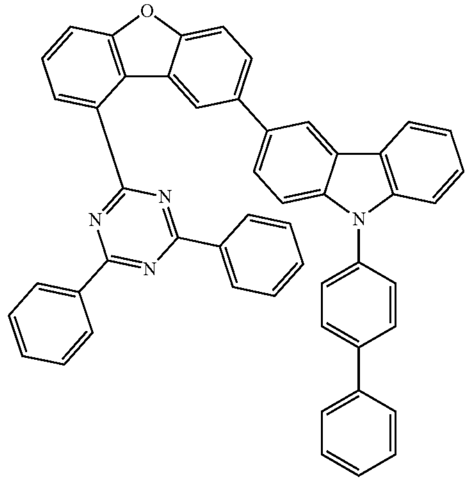
,
H-50
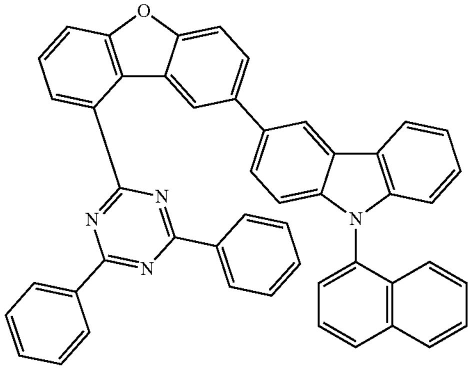
,
H-51
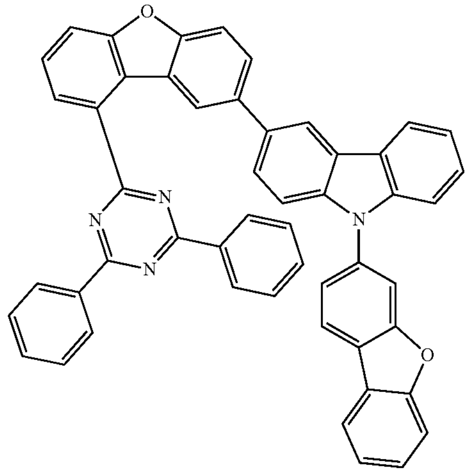
,
H-52
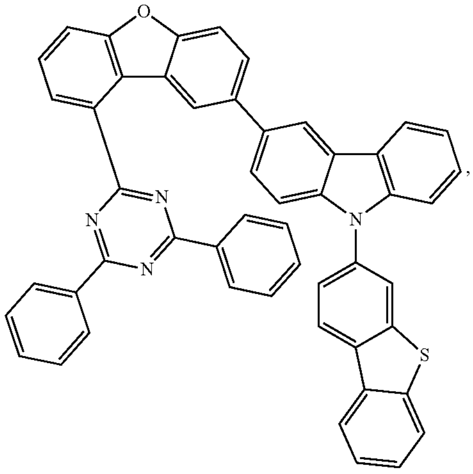
, -continued
H-53
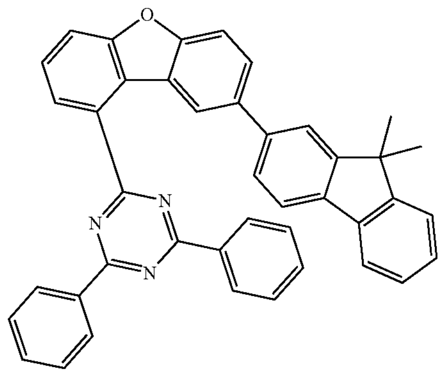
,
H-54
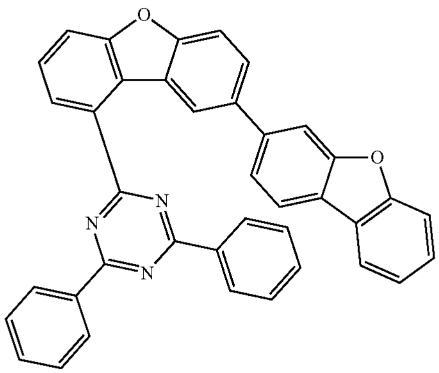
,
H-55
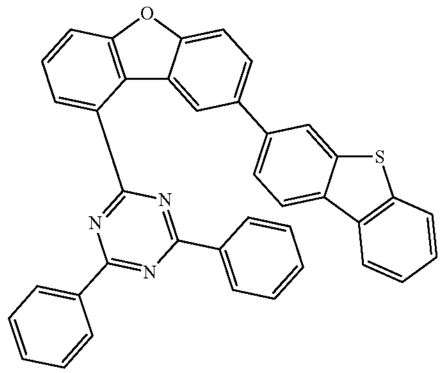
,
H-56
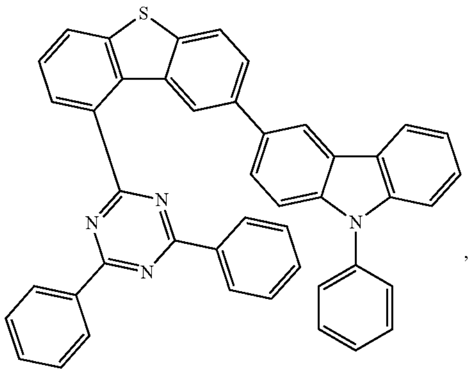
,
H-57
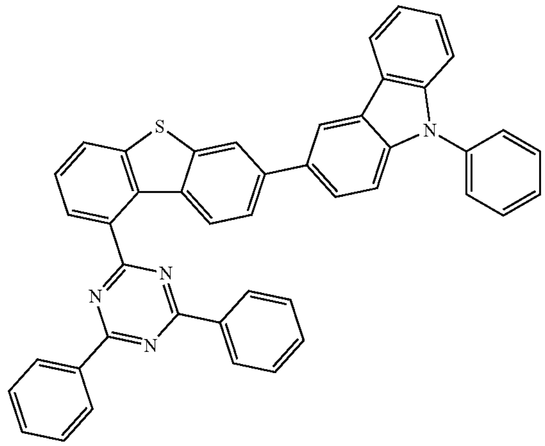
,
H-58
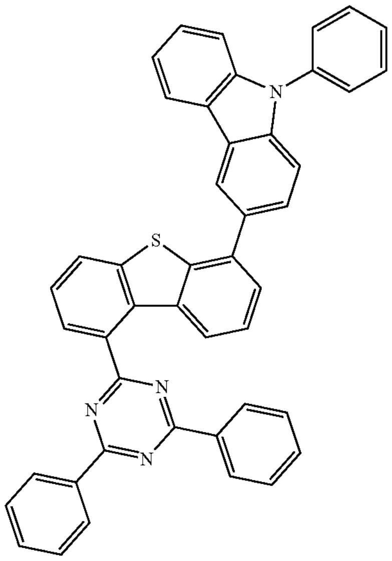
, -continued
H-59
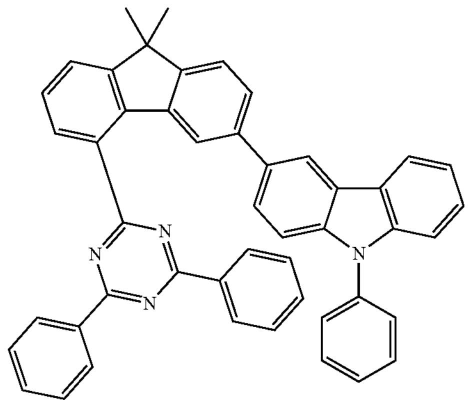,
H-60
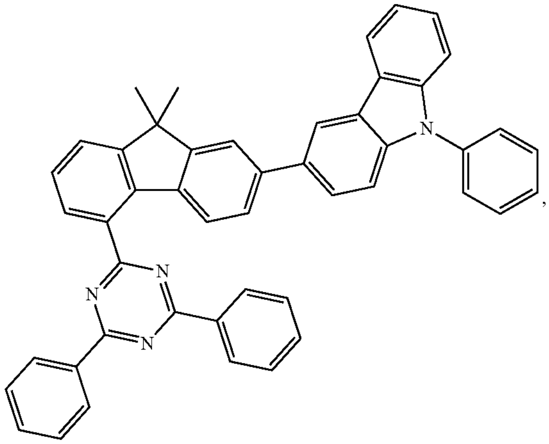,
H-61
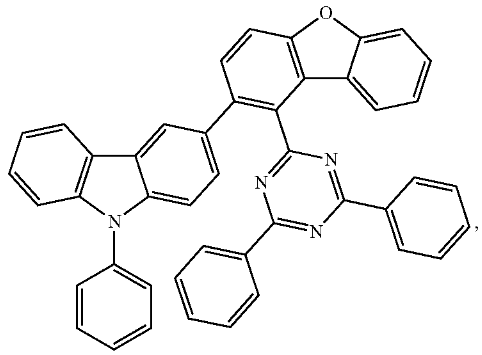,
H-62
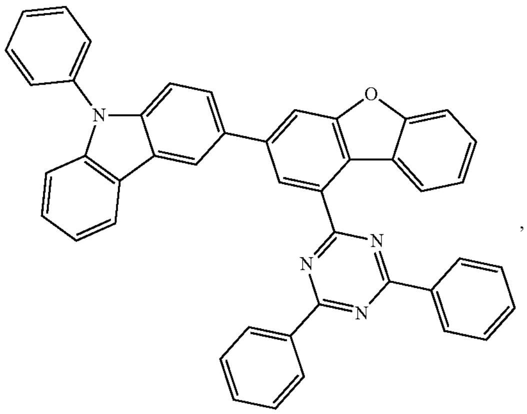,
H-63
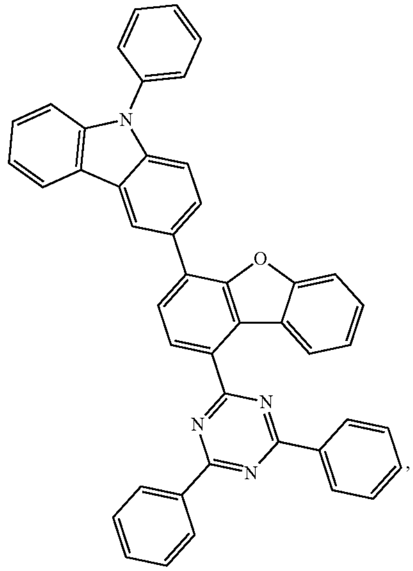,
H-64
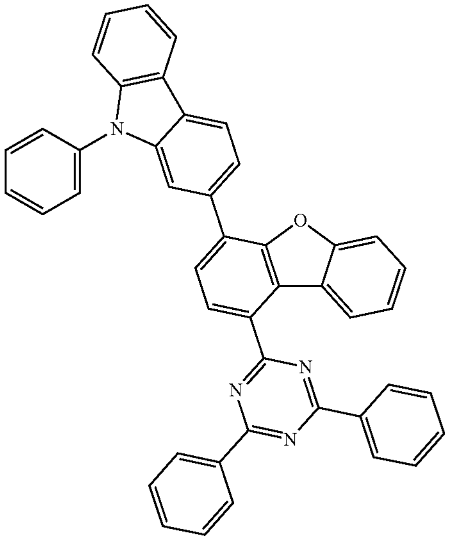, -continued
H-65
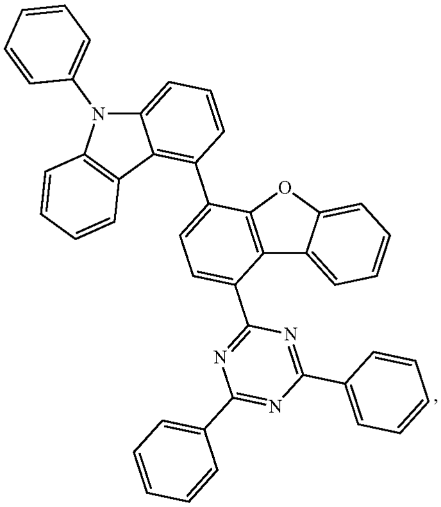
,
H-66
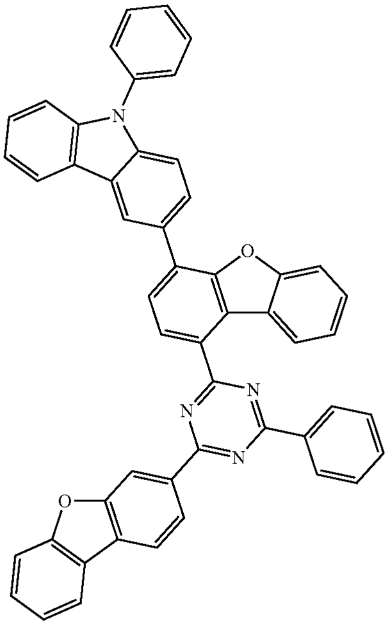
,
H-67
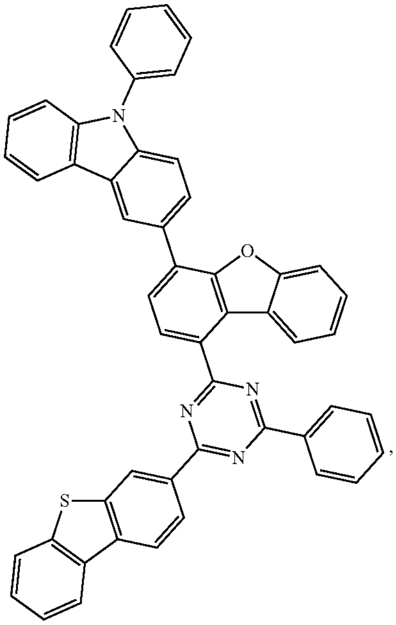
,
H-68
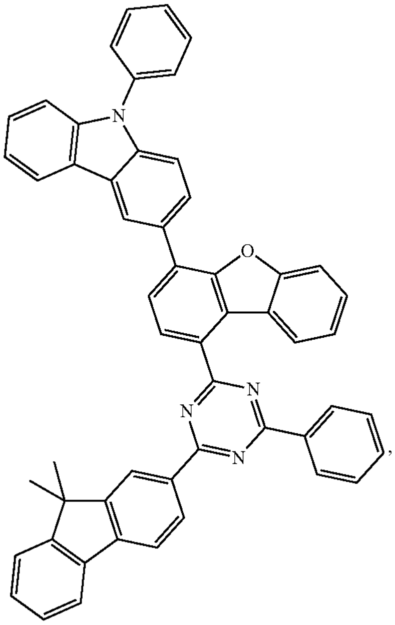
, -continued
H-69
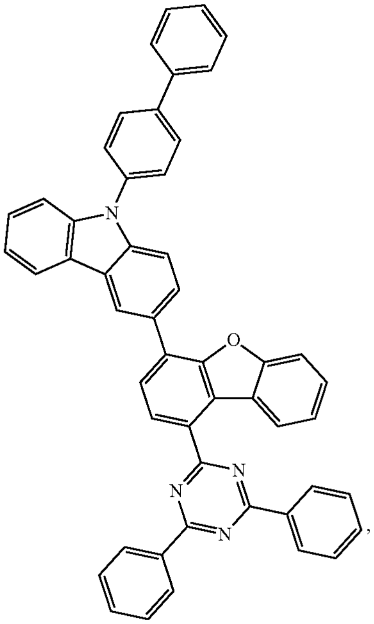
H-70
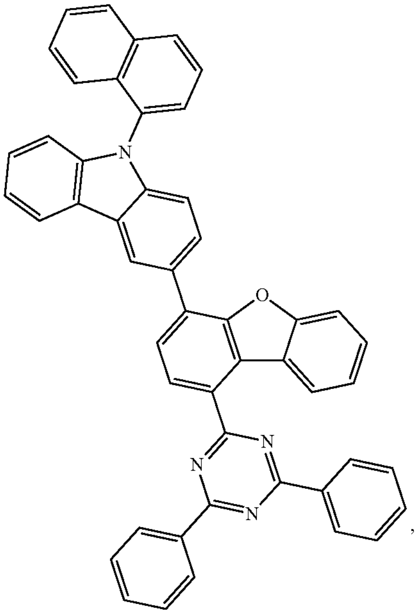
H-71
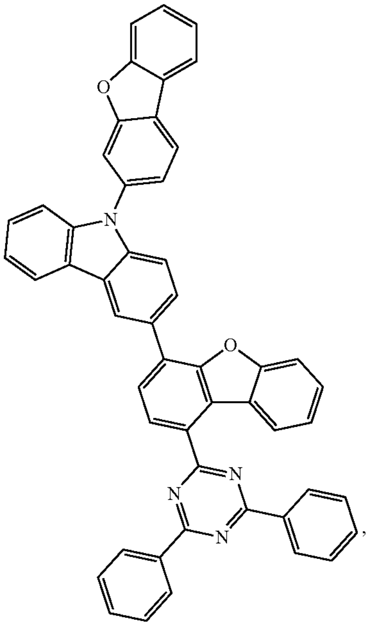
H-72
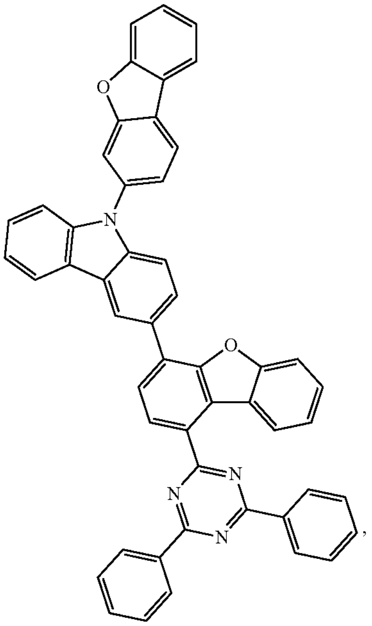
H-73
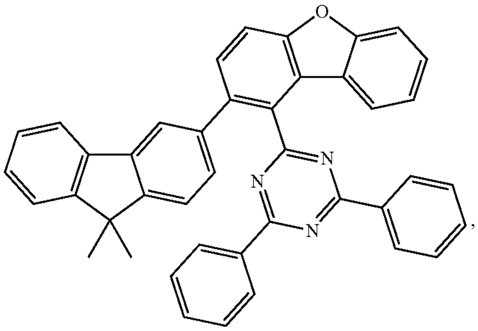
H-74
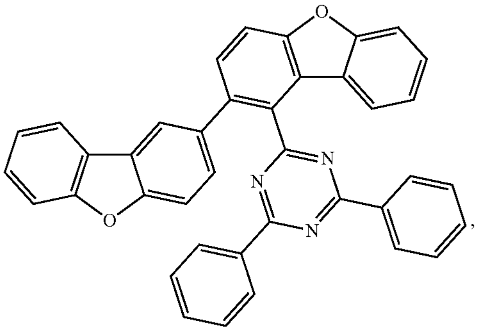

-continued
H-75
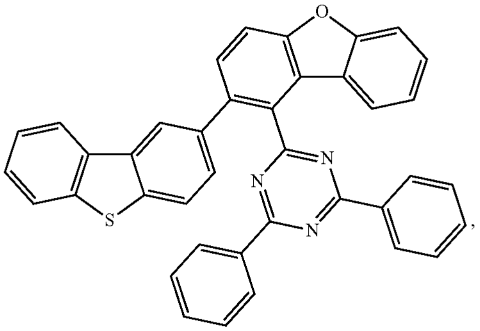
H-76
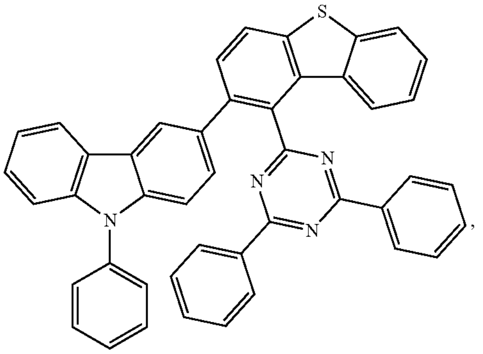
H-77
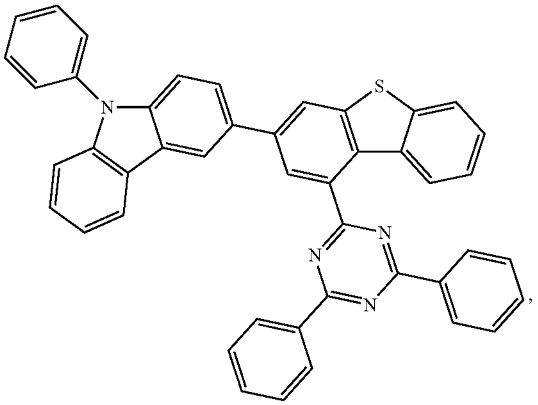
H-78
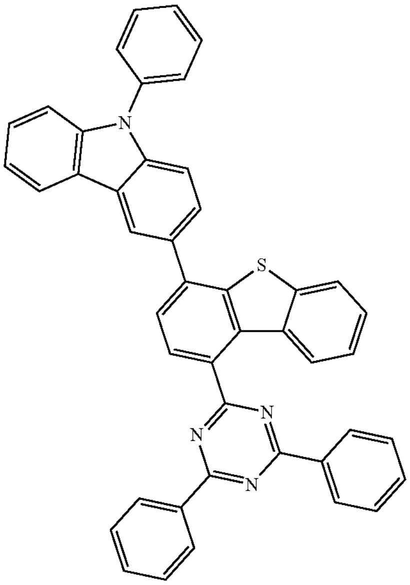
H-79
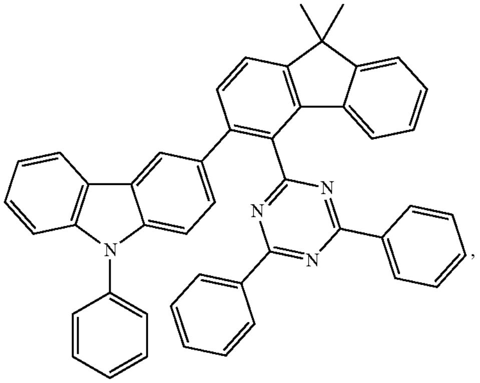
H-80
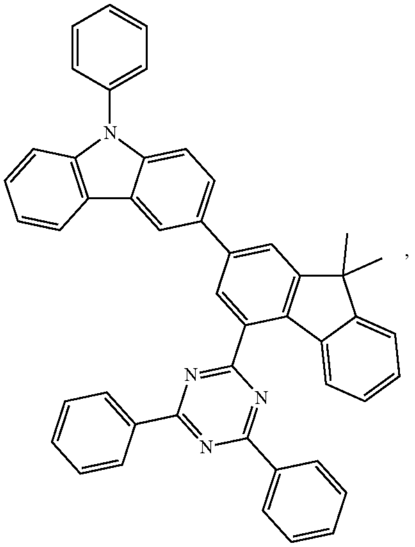

-continued
H-81
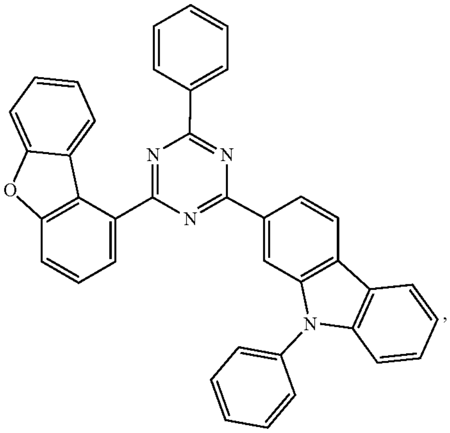
,
H-82
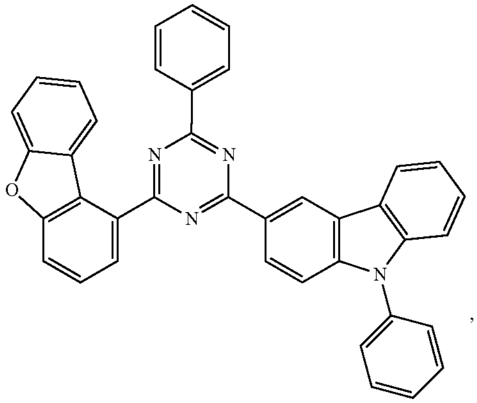
,
H-83
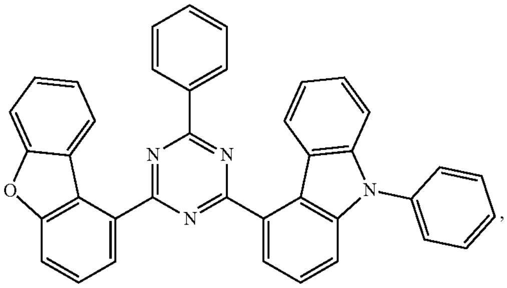
,
H-84
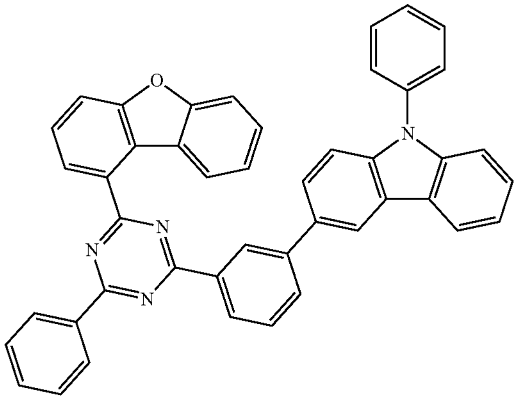
,
H-85
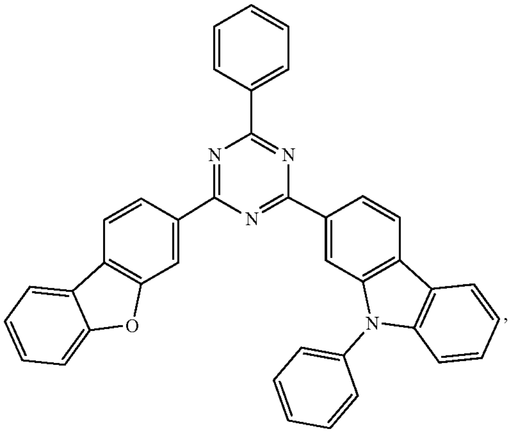
,
H-86
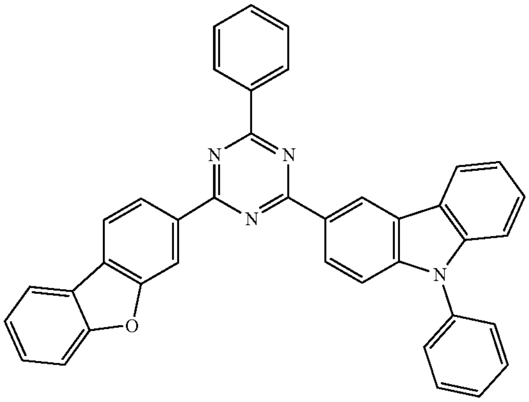
, -continued
H-87
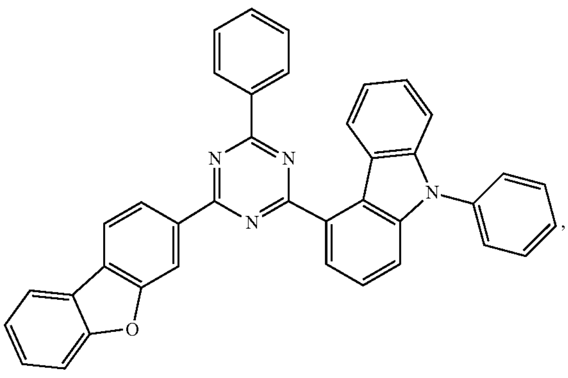,
H-88
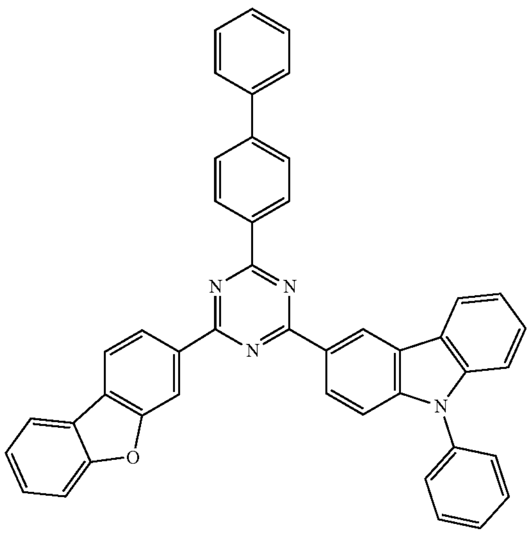,
H-89
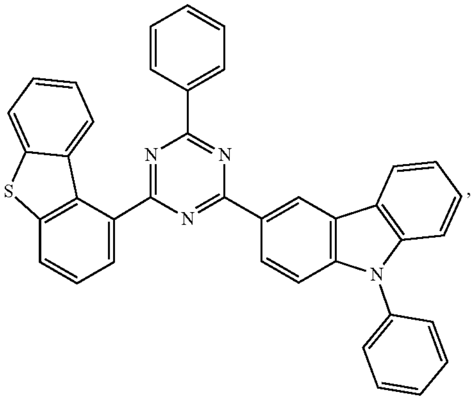,
H-90
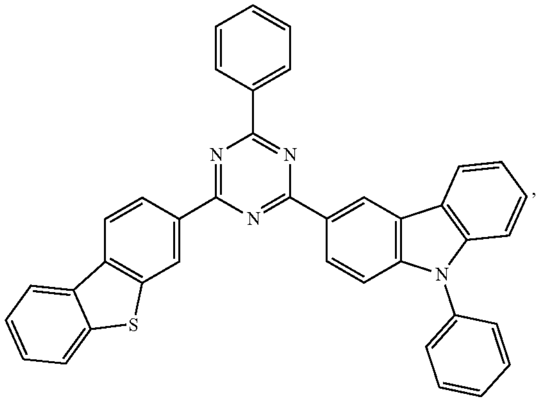,
H-91
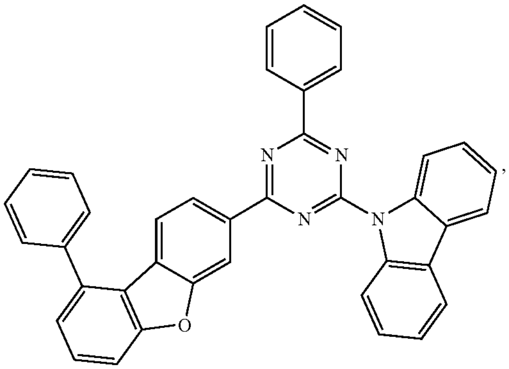,
H-92
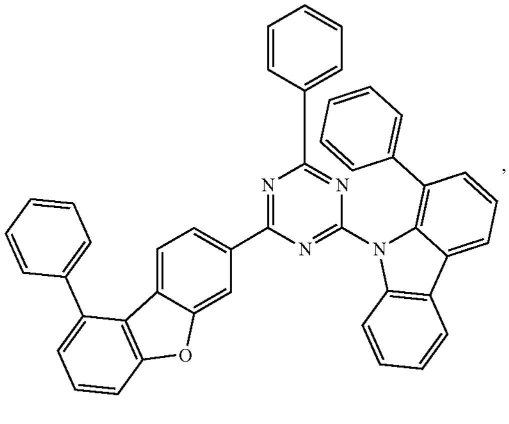, -continued
H-93
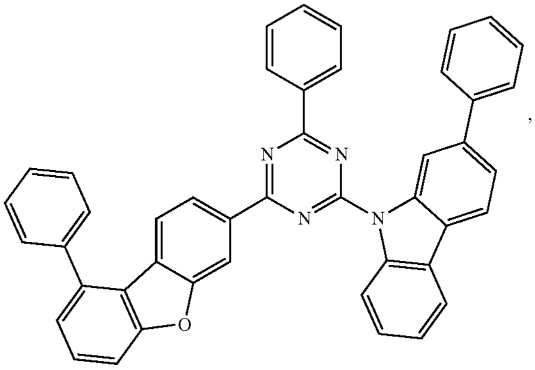
,
H-94
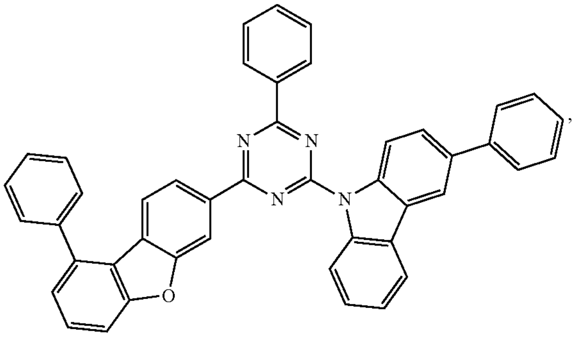
,
H-95
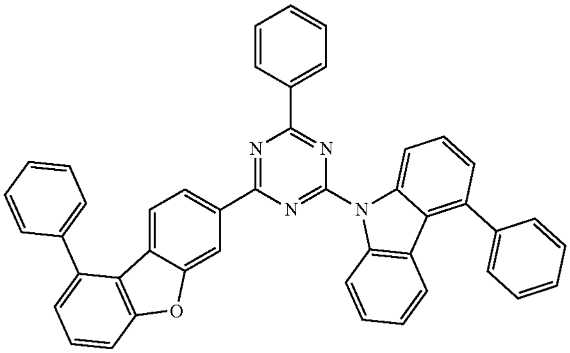
,
H-96
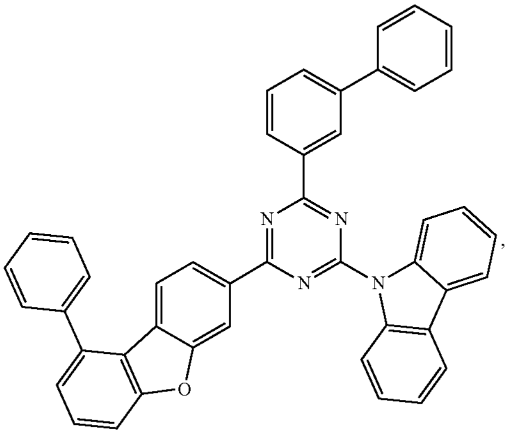
,
H-97
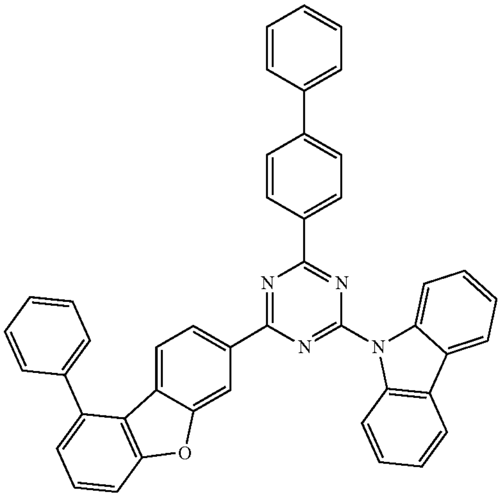
,
H-98
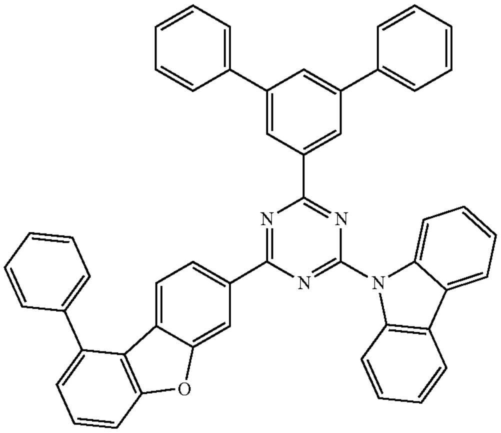
, -continued
H-99
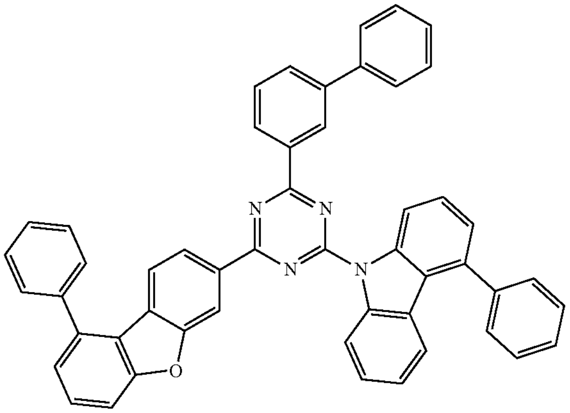,
H-100
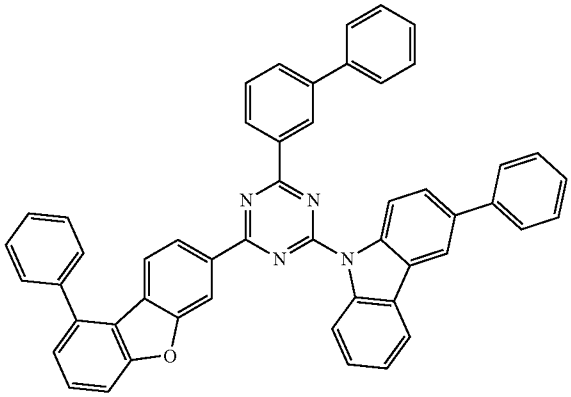,
H-101
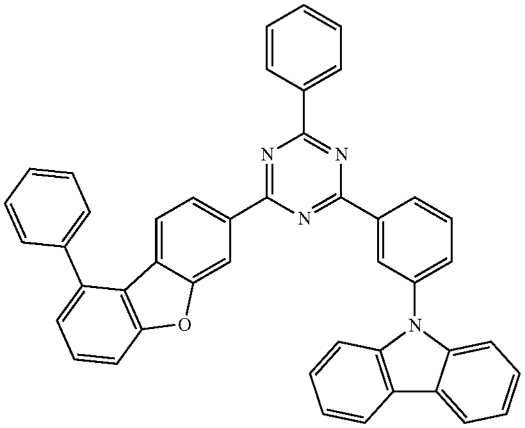,
H-102
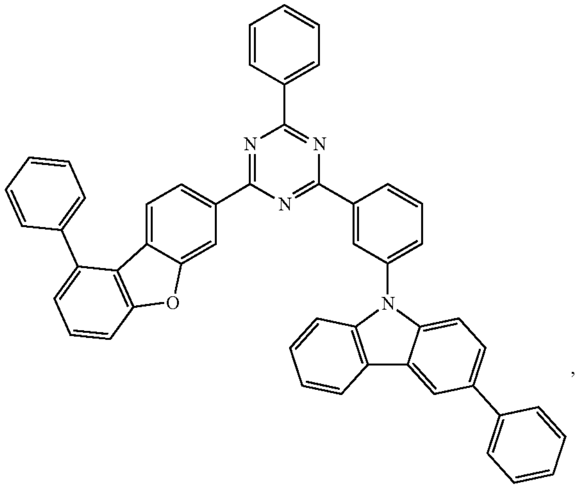,
H-103
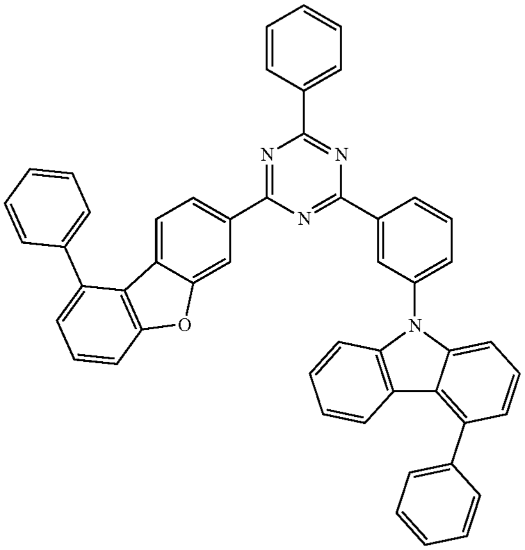,
H-104
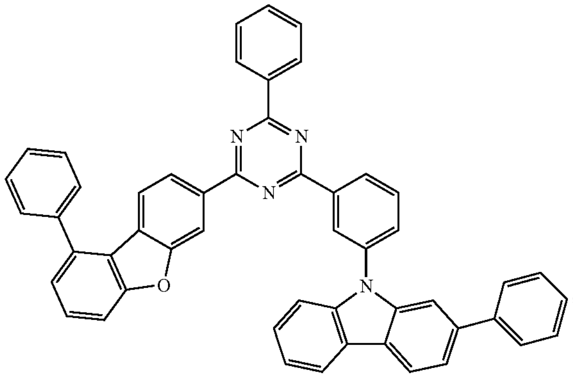, -continued
H-105
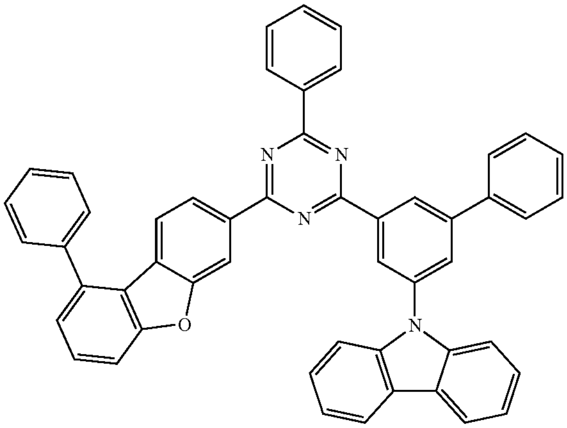
,
H-106
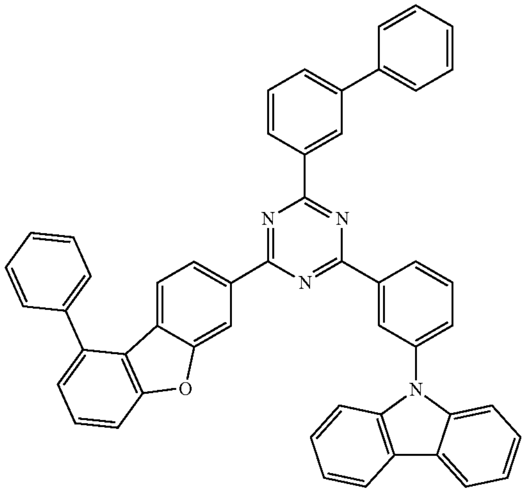
,
H-107
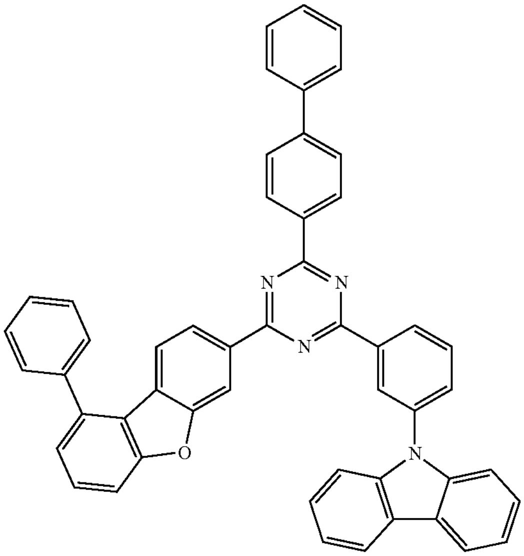
,
H-108
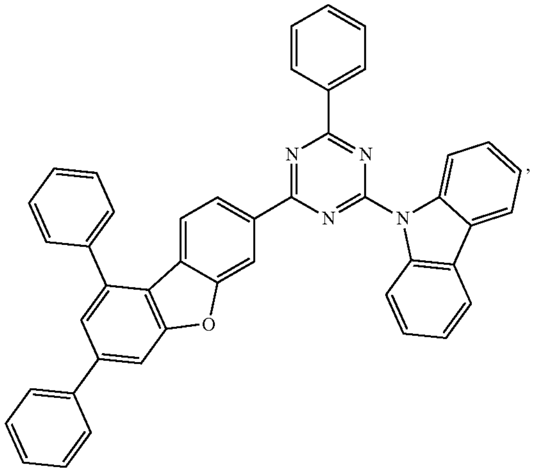
,
H-109
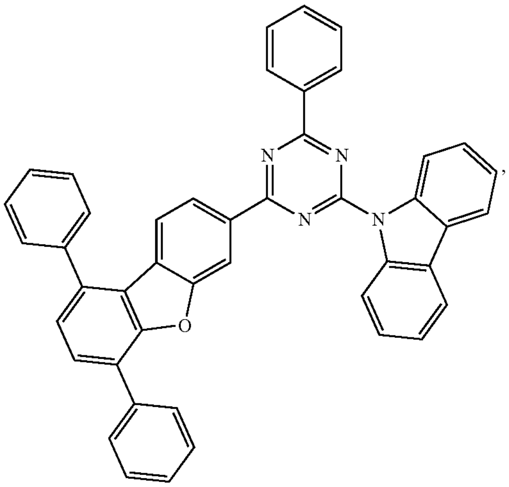
,
H-110
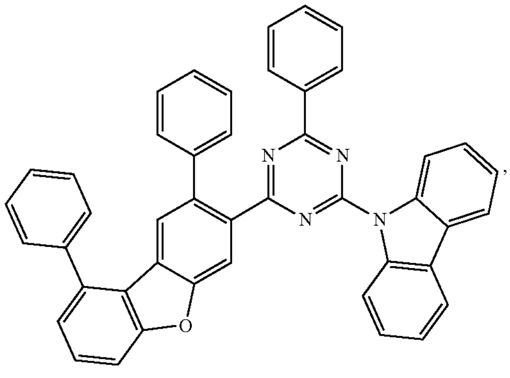
, -continued
H-111
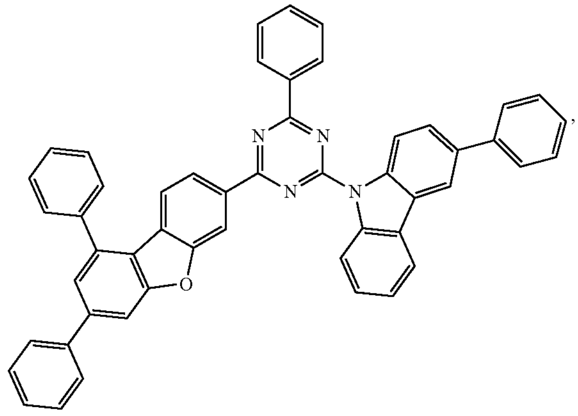
,
H-112
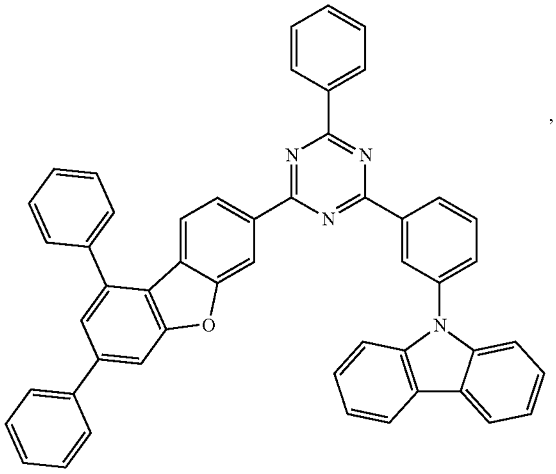
,
H-113
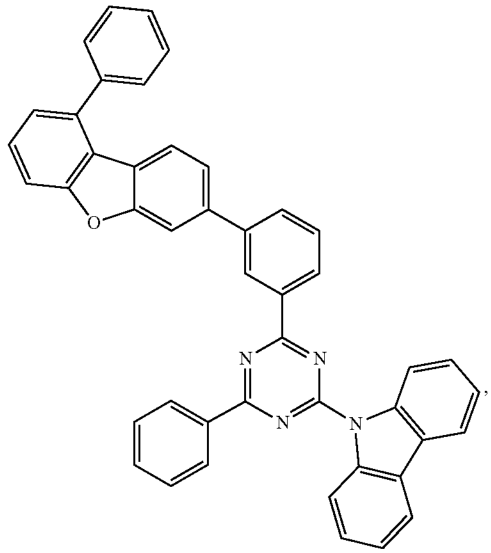
,
H-114
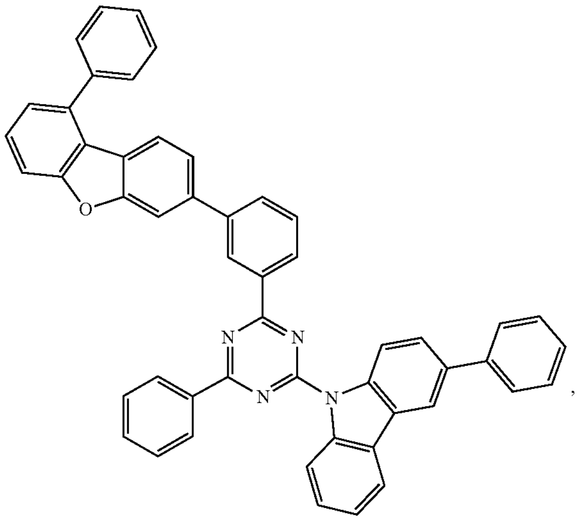
, -continued
H-115
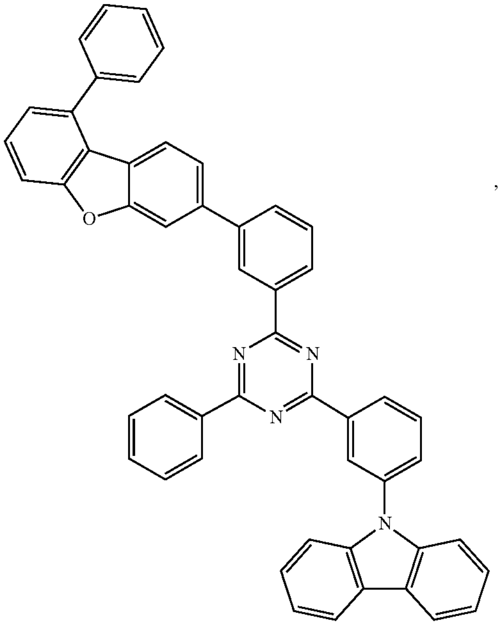
,
H-116
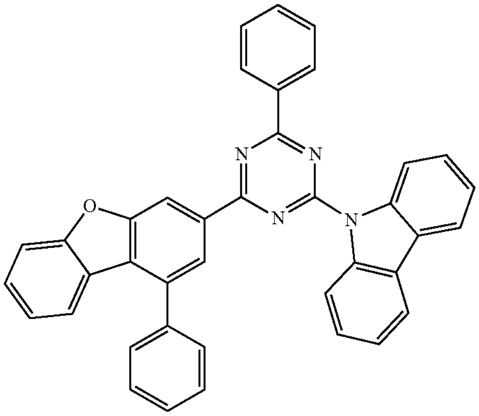
,
H-117
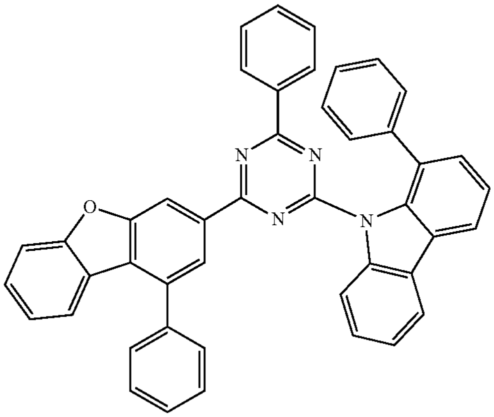
,
H-118
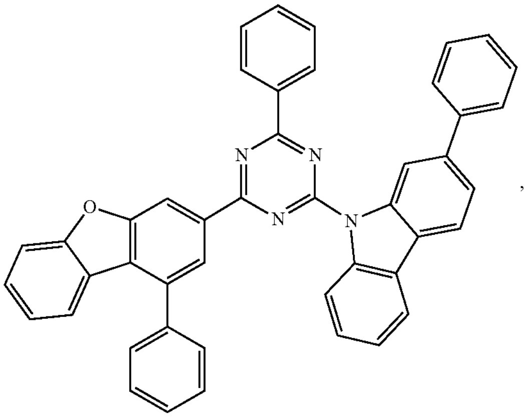
,
H-119
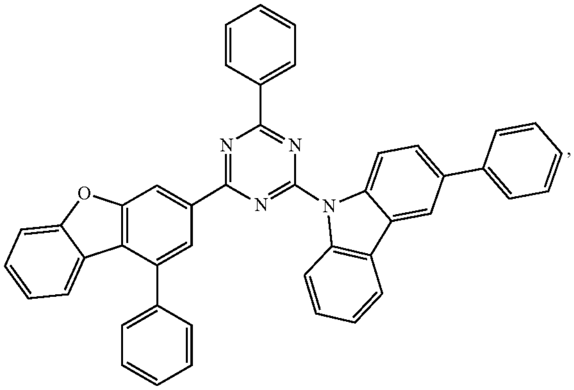
,
H-120
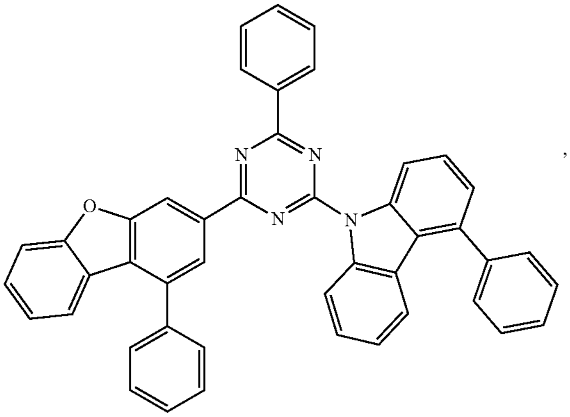
, -continued
H-121
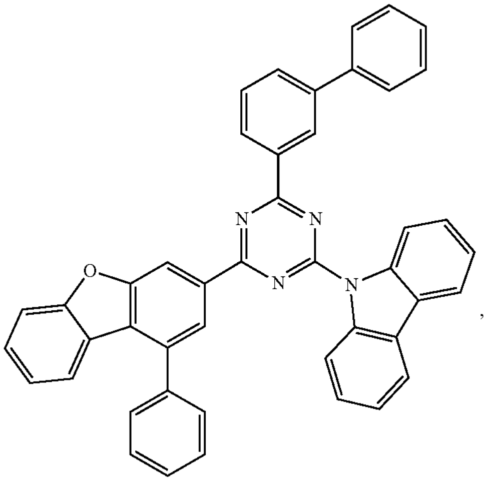
,
H-122
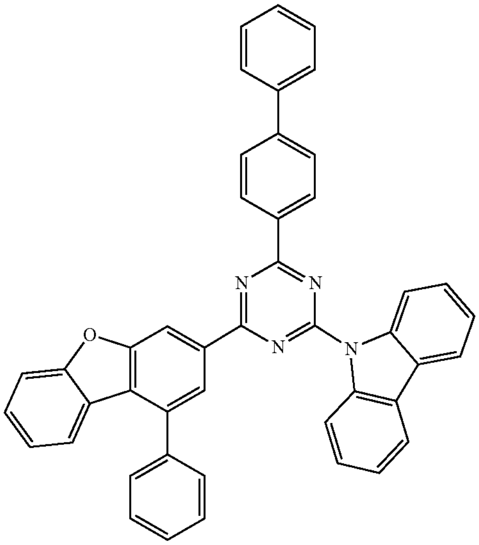
,
H-123
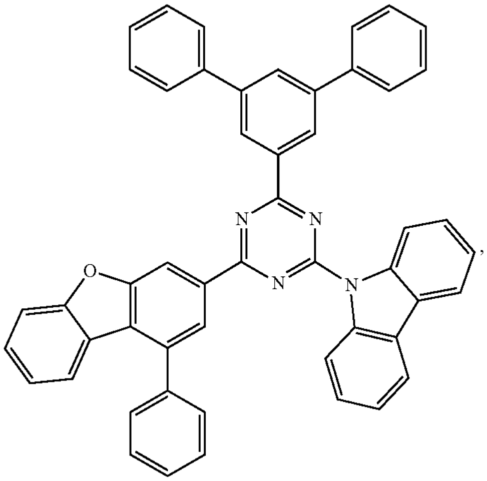
,
H-124
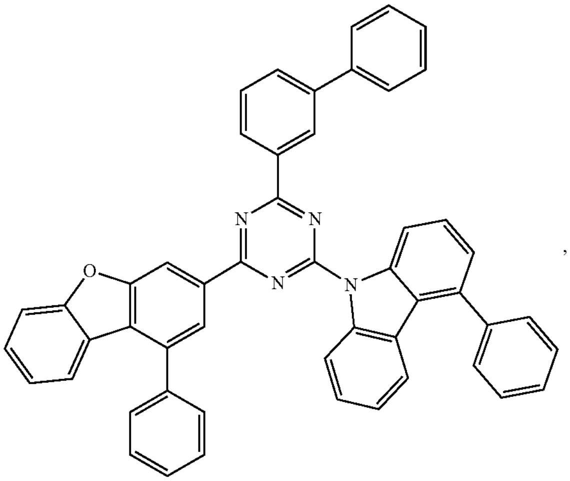
,
H-125
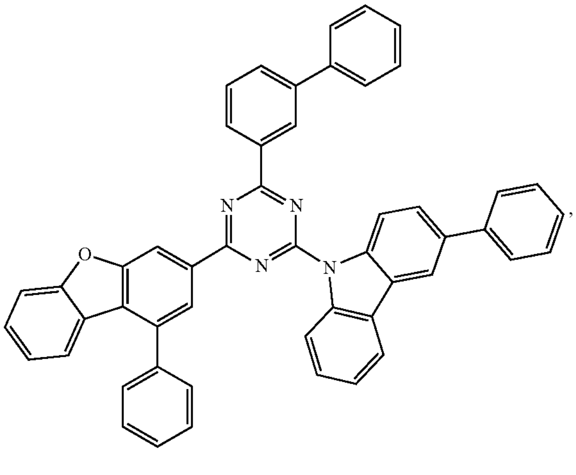
,
H-126
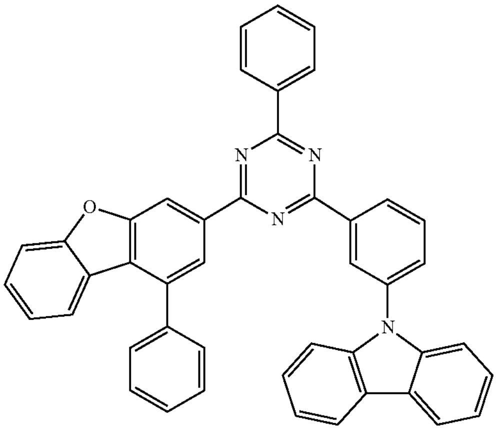
, -continued
H-127
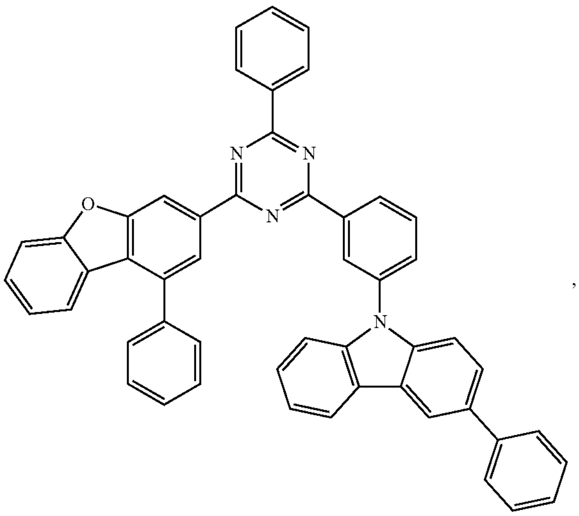
,
H-128
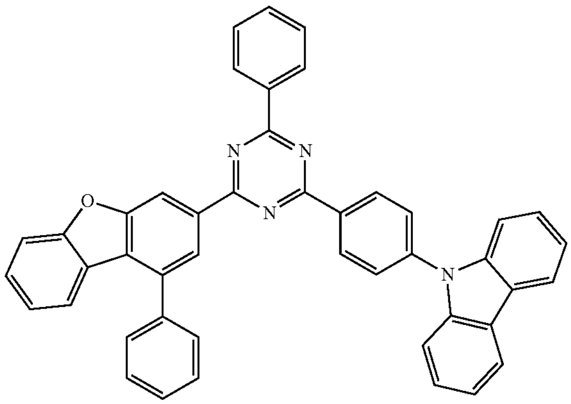
,
H-129
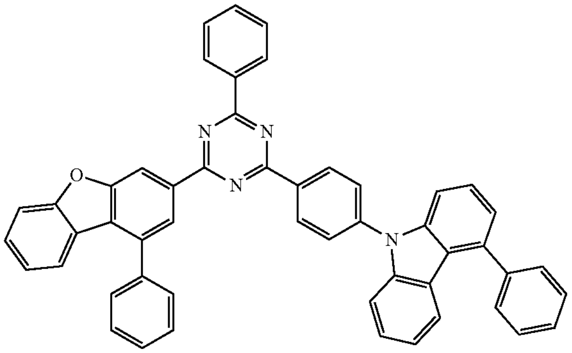
,
H-130
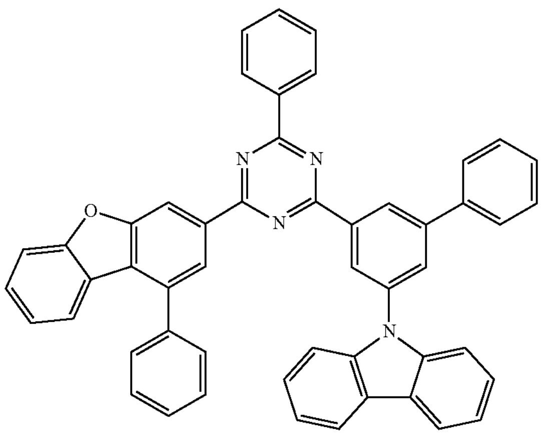
,
H-131
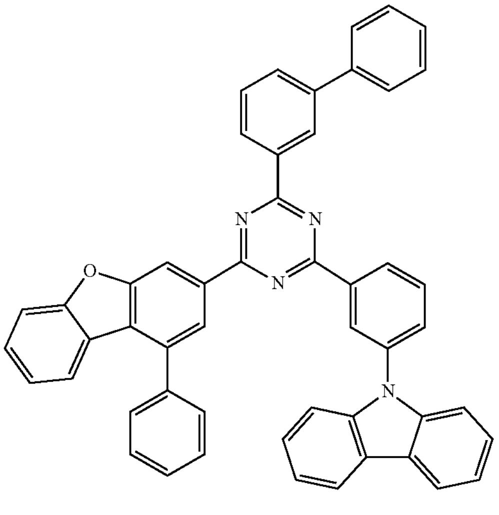
,
H-132
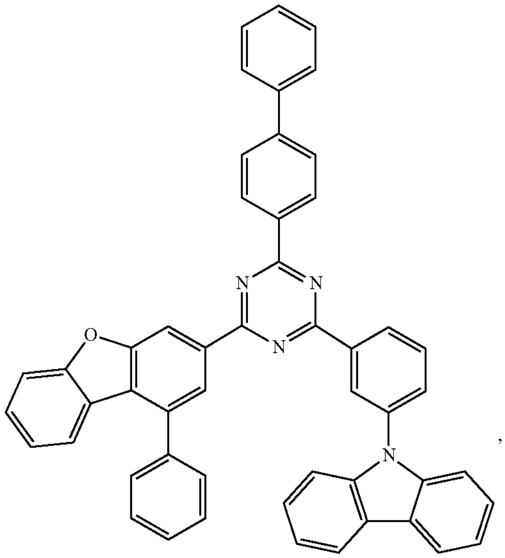
, -continued
H-133
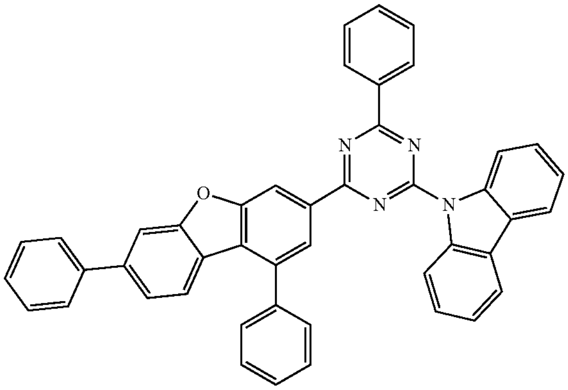
,
H-134
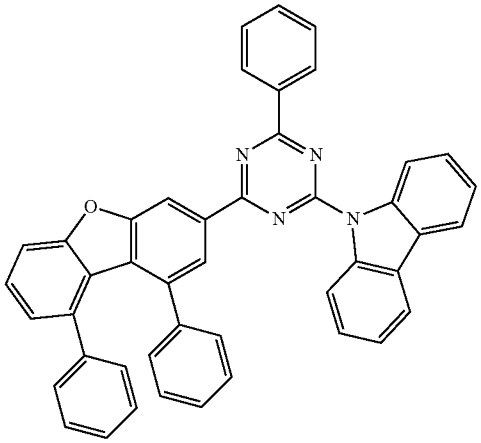
,
H-135
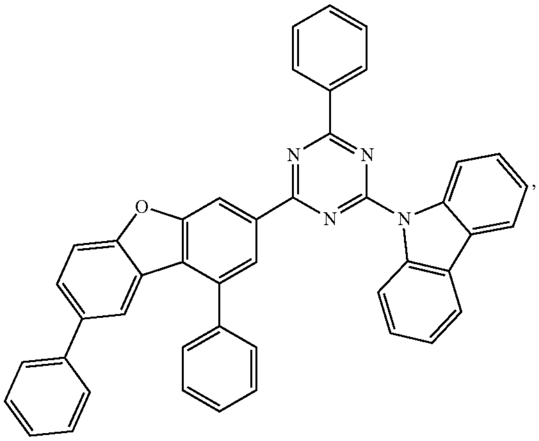
,
H-136
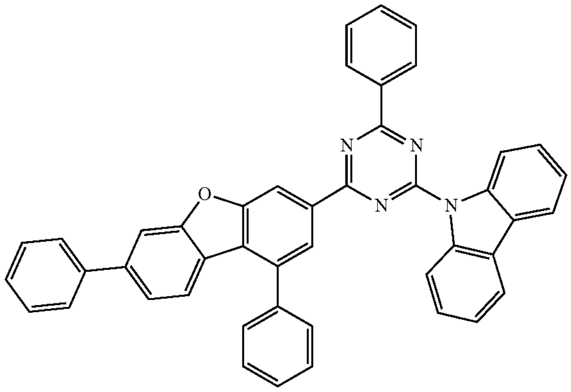
,
H-137
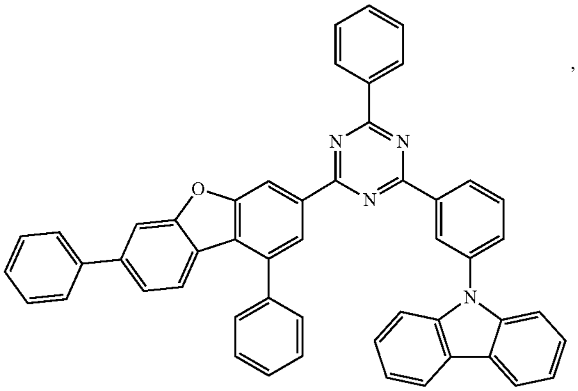
,
H-138
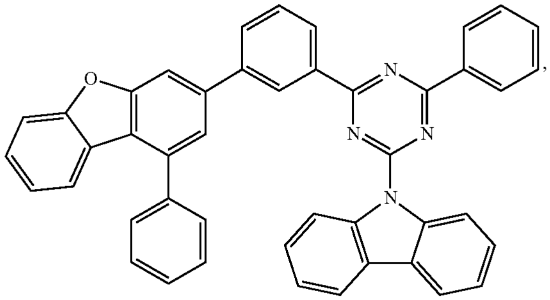
, -continued
H-139
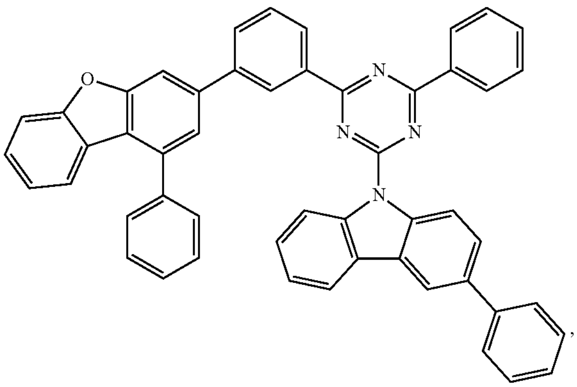
,
H-140
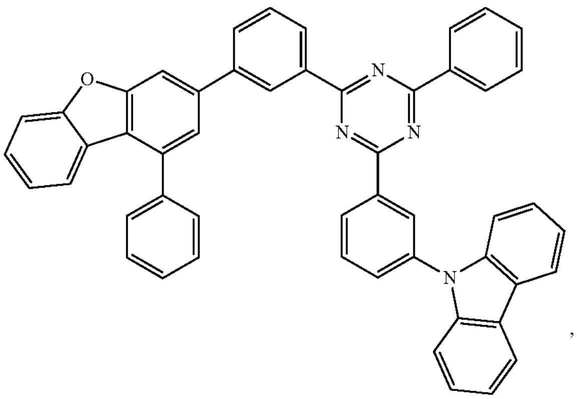
,
H-141
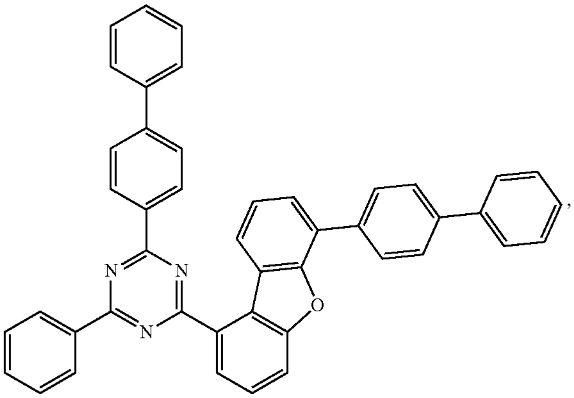
,
H-142
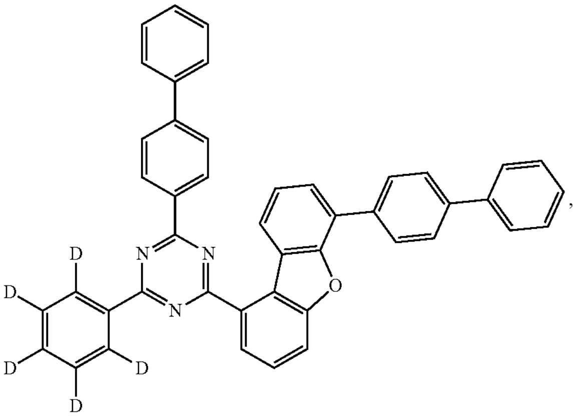
,
H-143
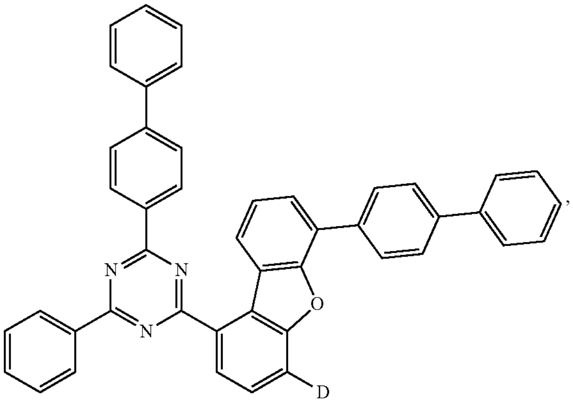
,
H-144
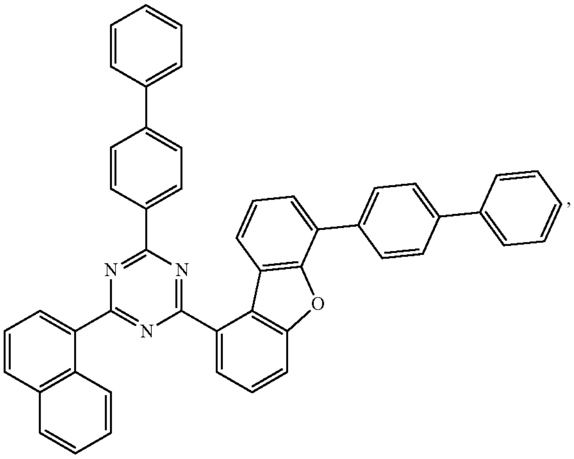
, -continued
H-145
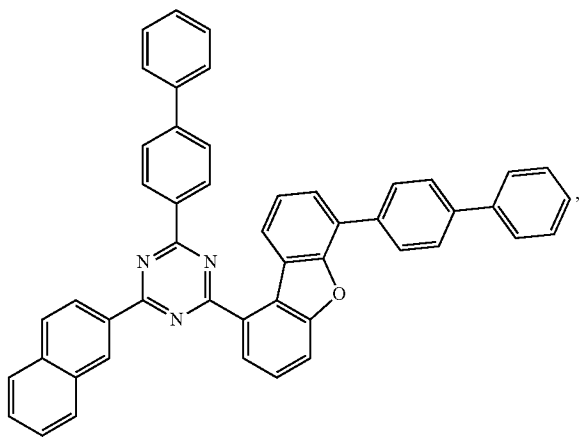
H-146
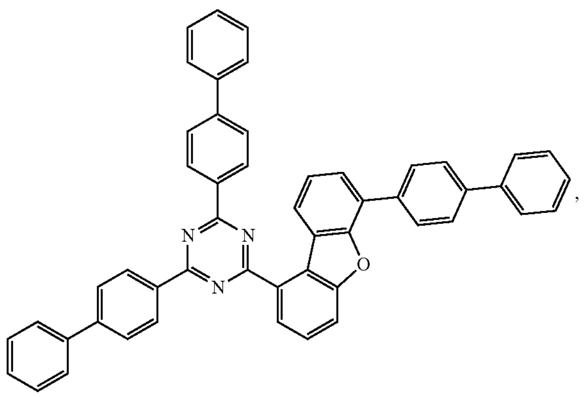
H-147
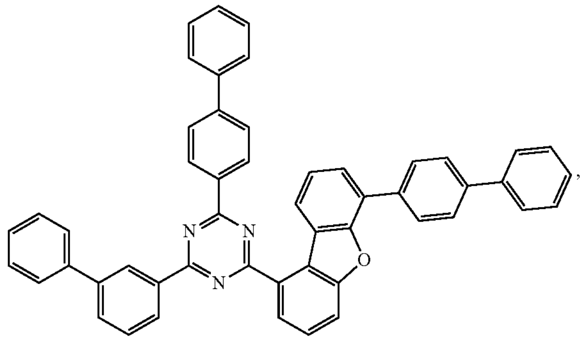
H-148
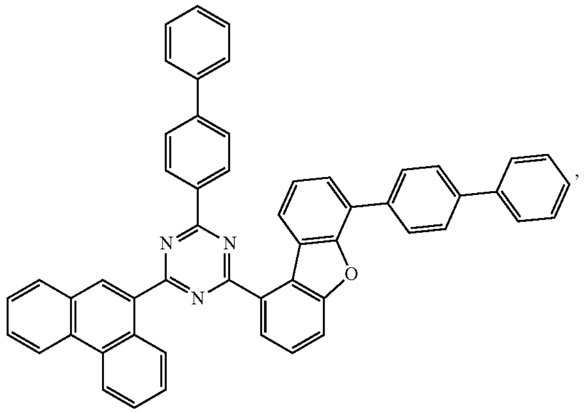
H-149
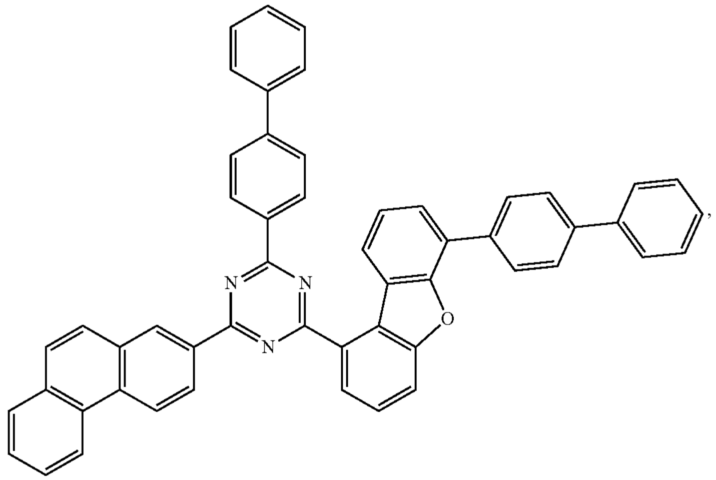

-continued
H-150
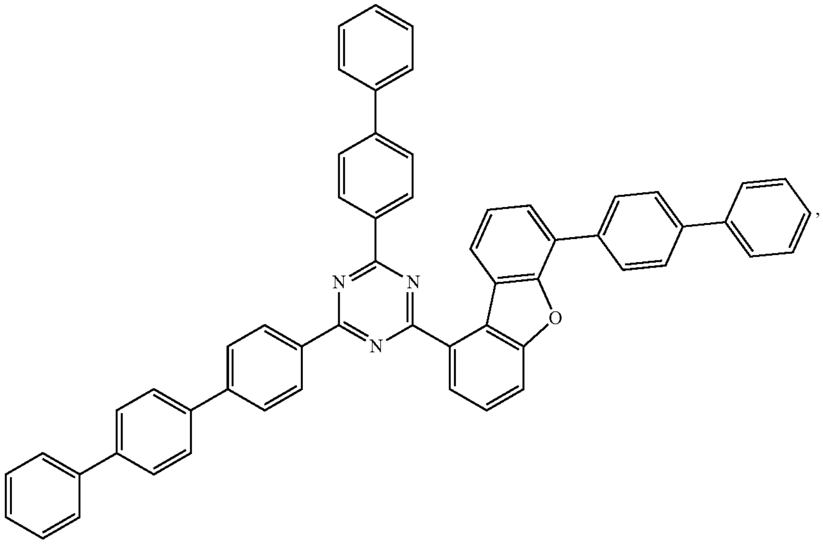
,
H-151
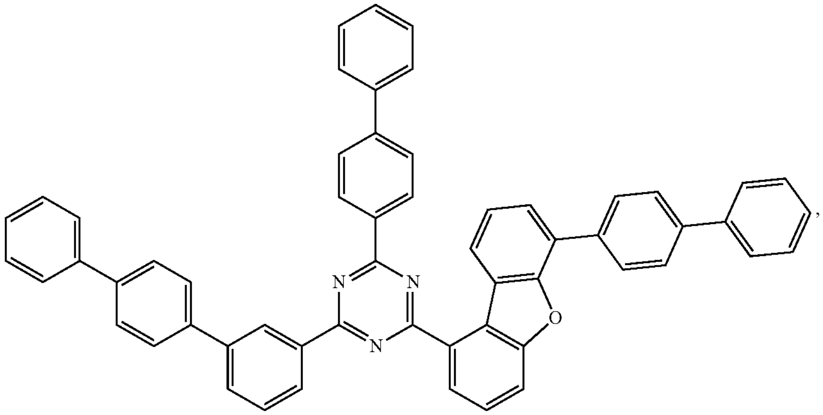
,
H-152
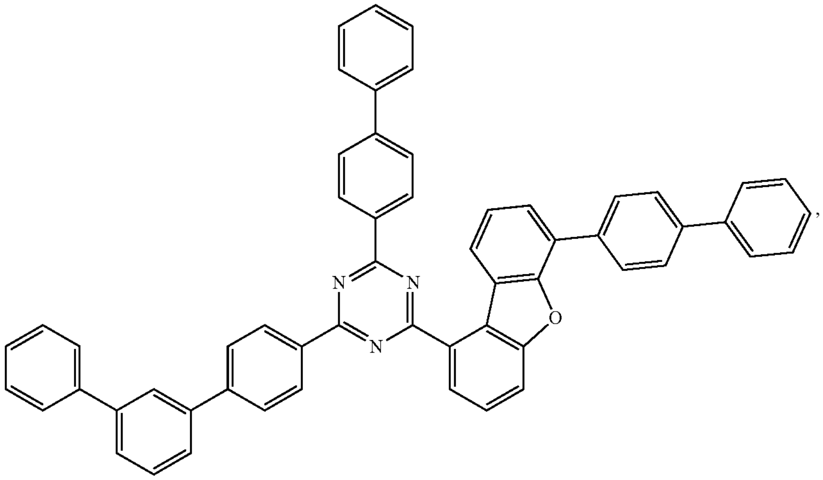
,

-continued
H-153
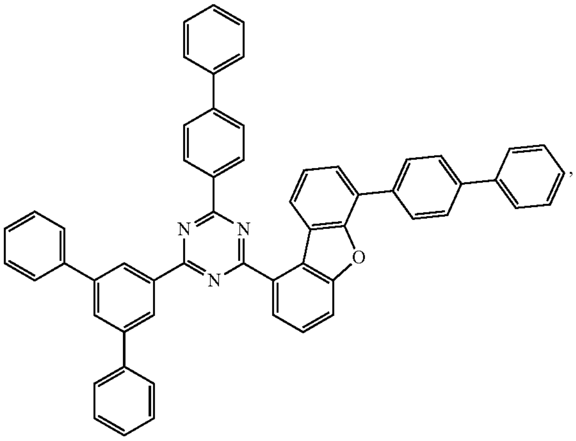
,
H-154
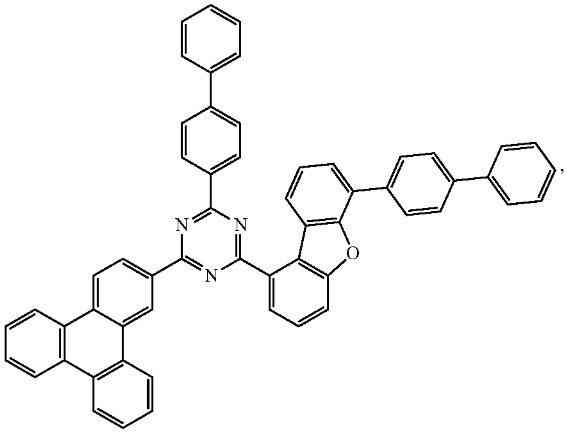
,
H-155
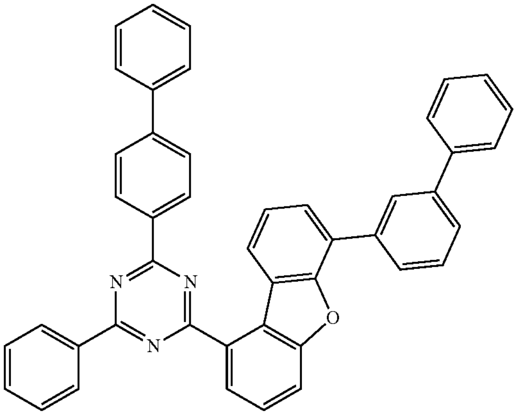
,
H-156
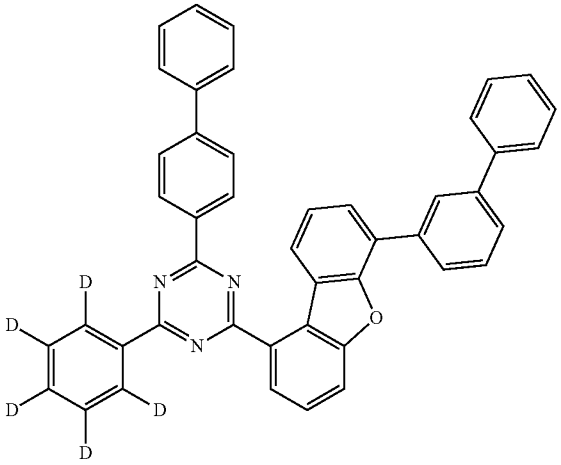
,
H-157
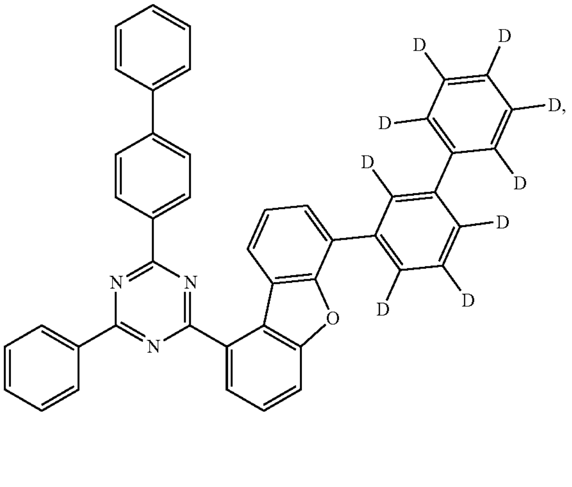
,
H-158
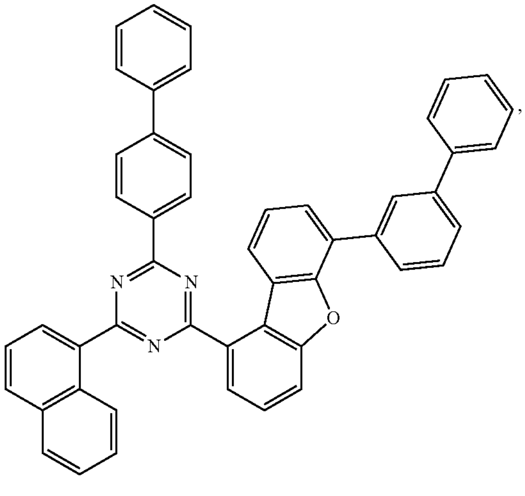
, -continued
H-159
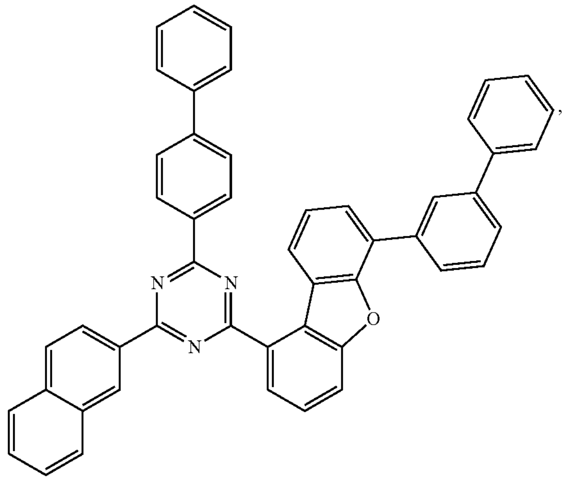
,
H-160
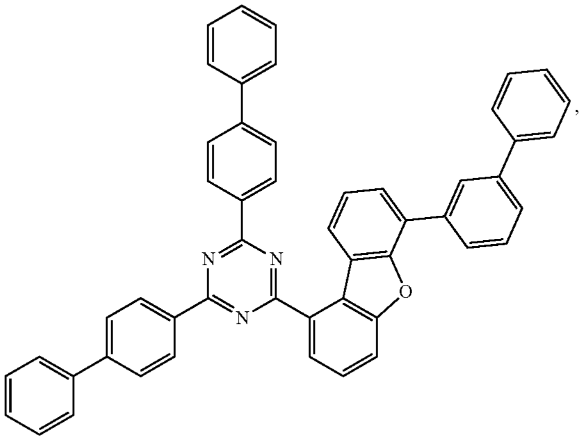
,
H-161
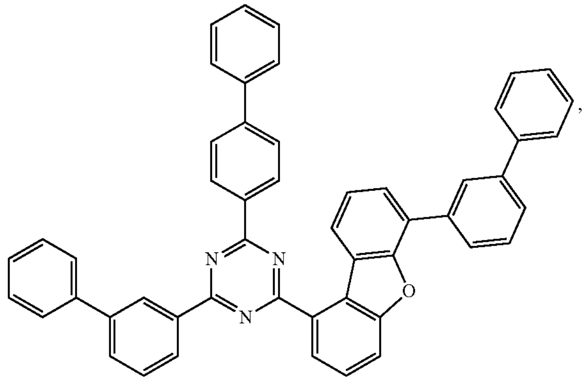
,
H-162
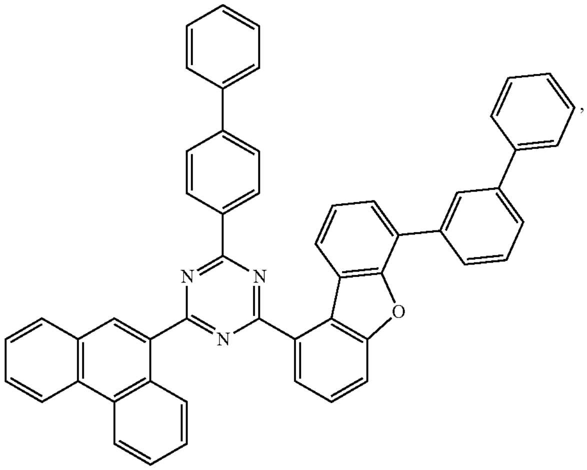
,
H-163
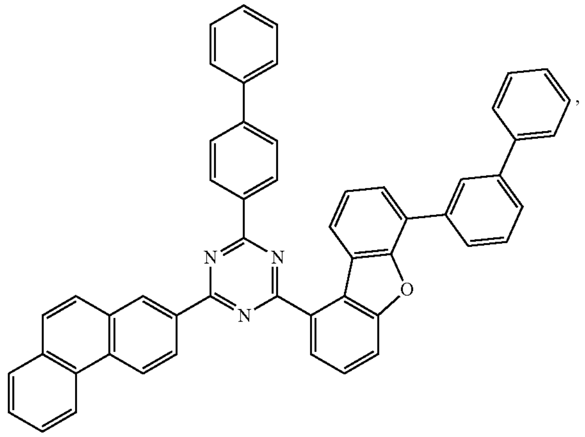
,
H-164
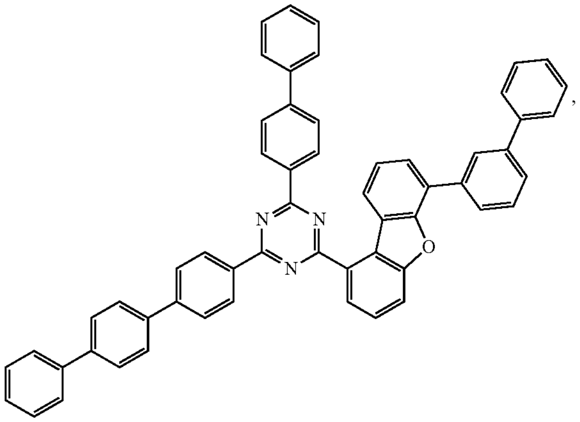
, -continued
H-165
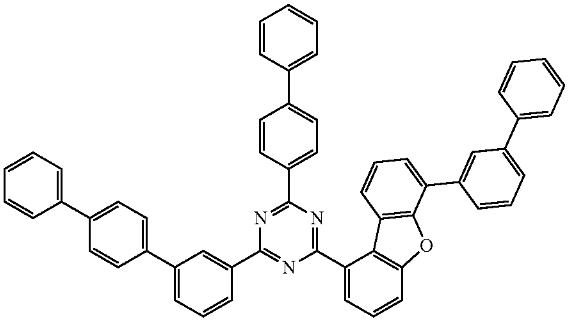
,
H-166
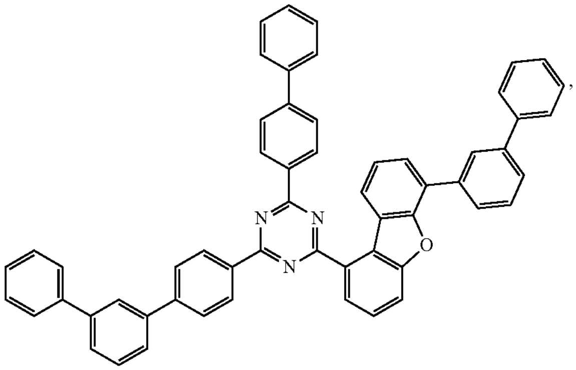
,
H-167
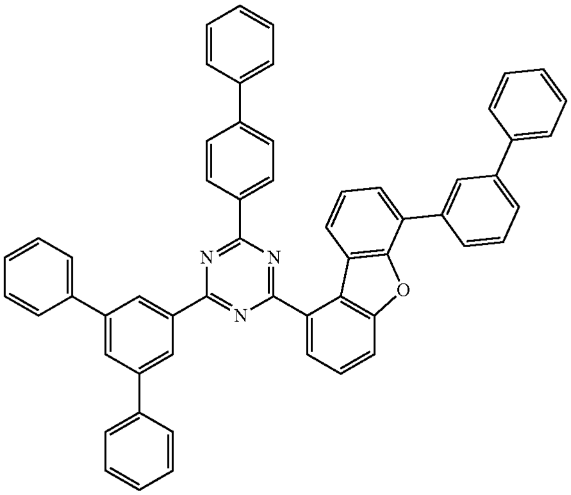
,
H-168
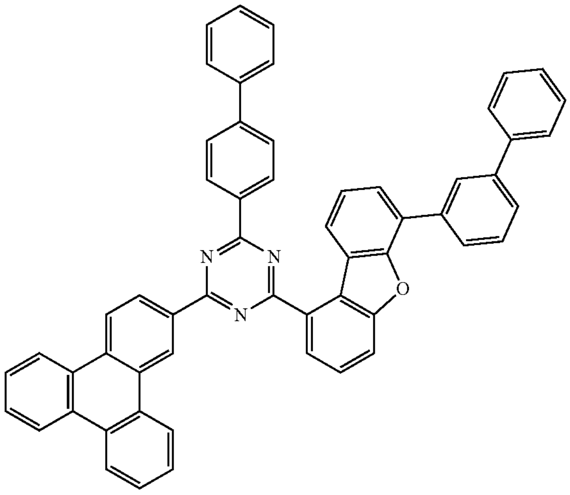
,
H-169
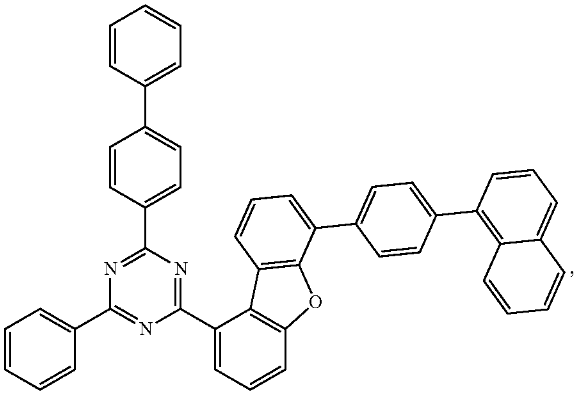
,
H-170
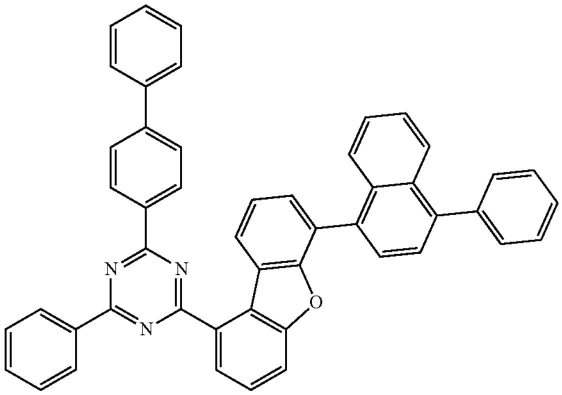
, -continued
H-171
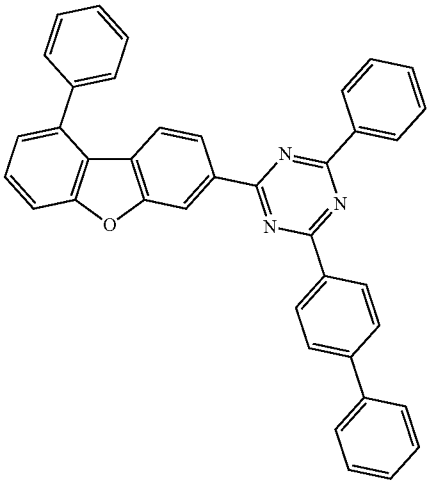
,
H-172
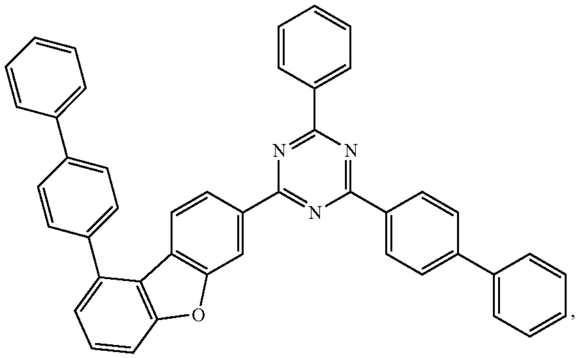
,
H-173
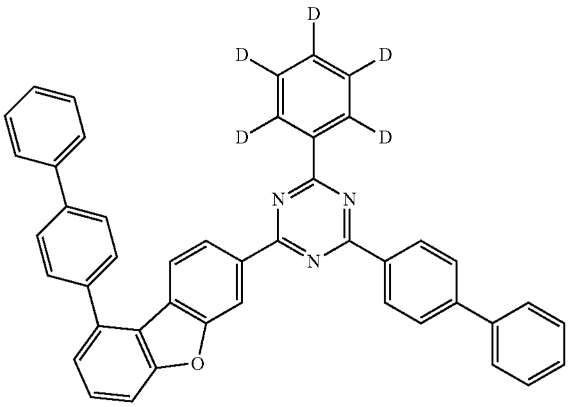
,
H-174
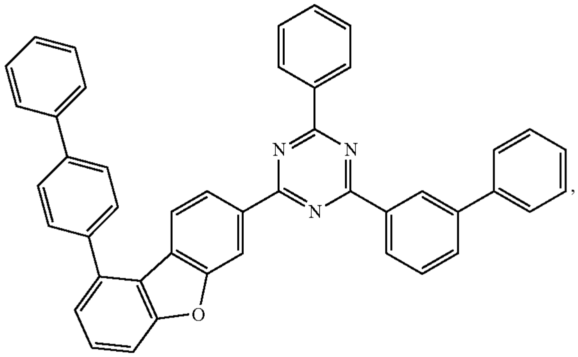
,
H-175
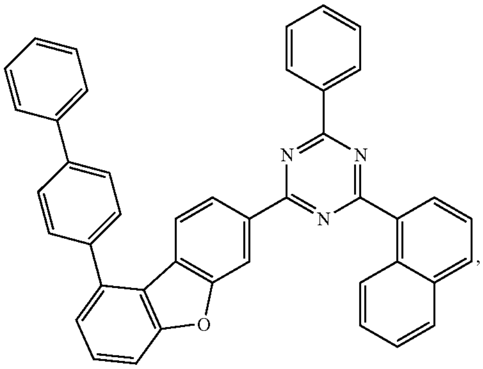
,
H-176
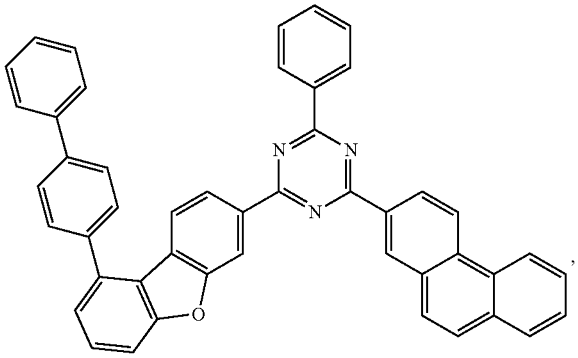
, -continued
H-177
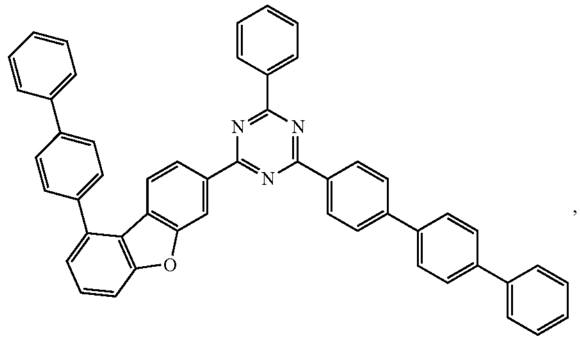
,
H-178
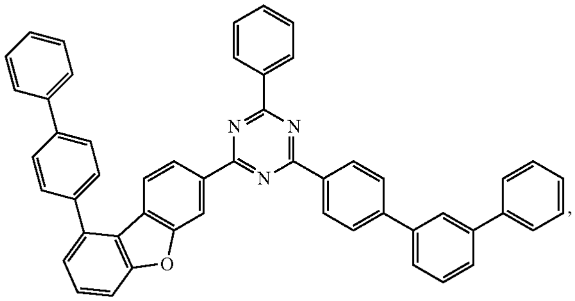
,
H-179
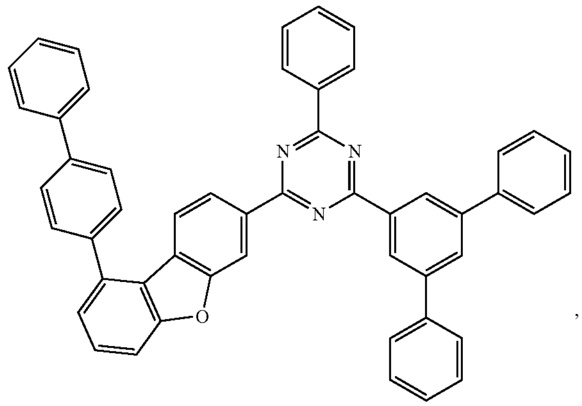
,
H-180
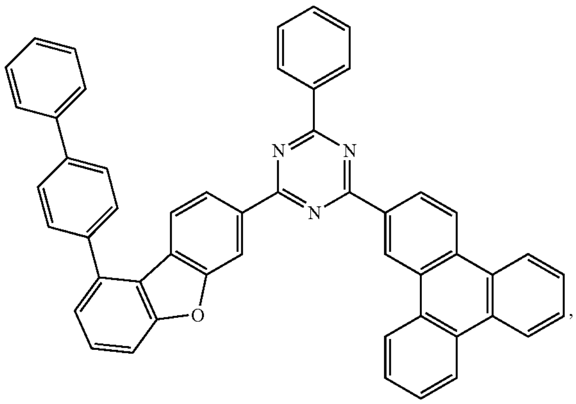
,
H-181
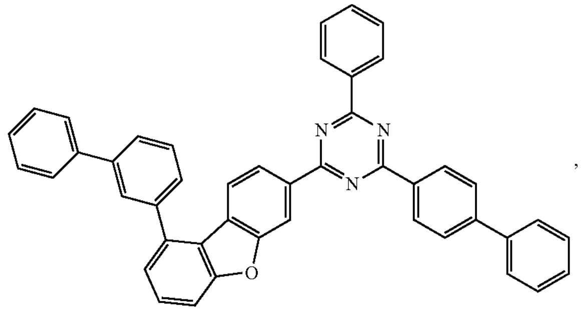
,
H-182
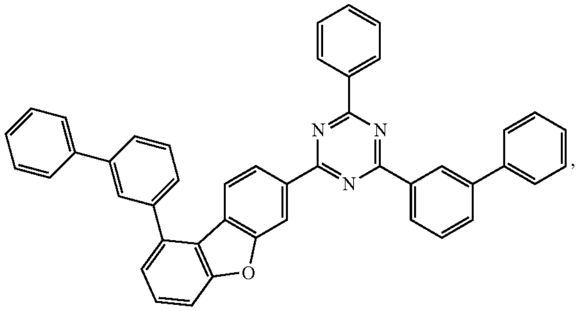
,
H-183
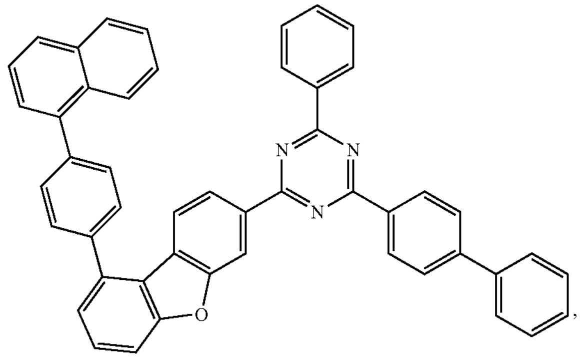
,
H-184
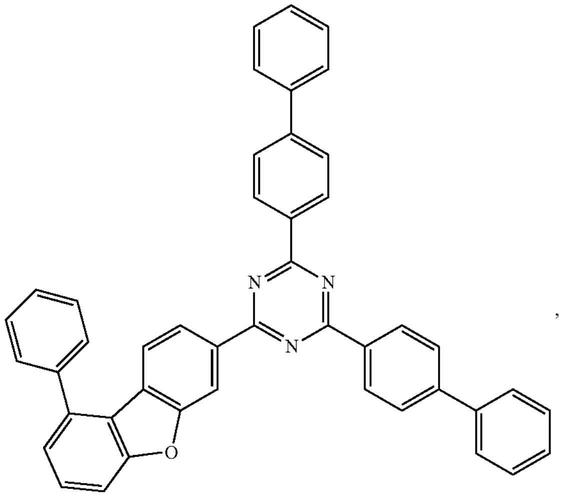
, -continued
H-185
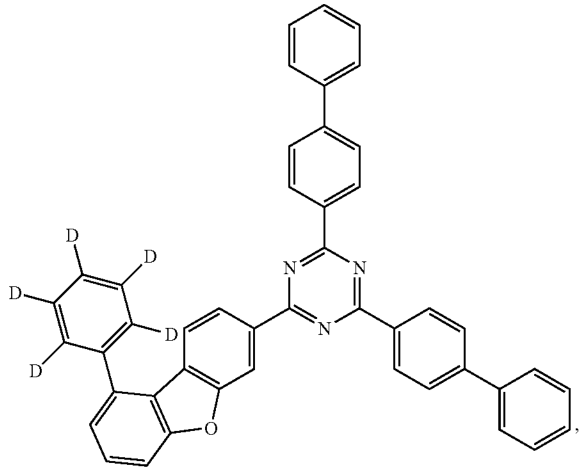
,
H-186
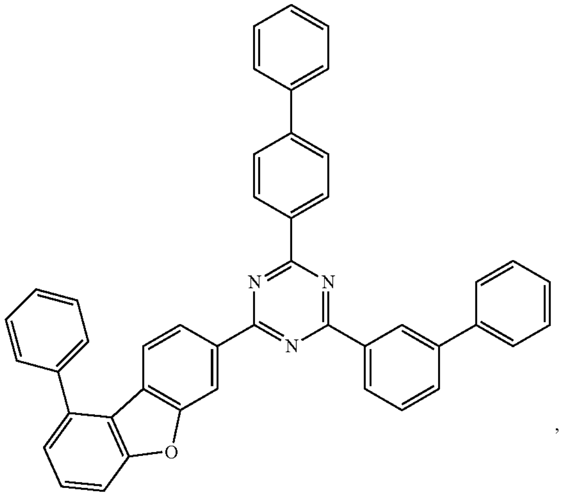
,
H-187
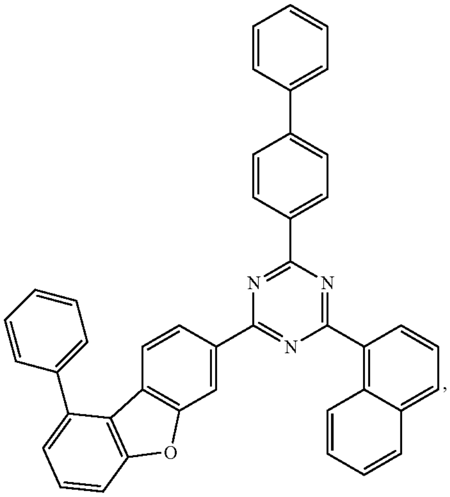
,
H-188
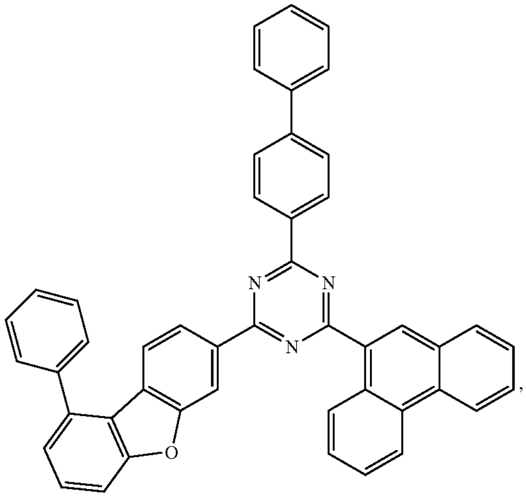
,
H-189
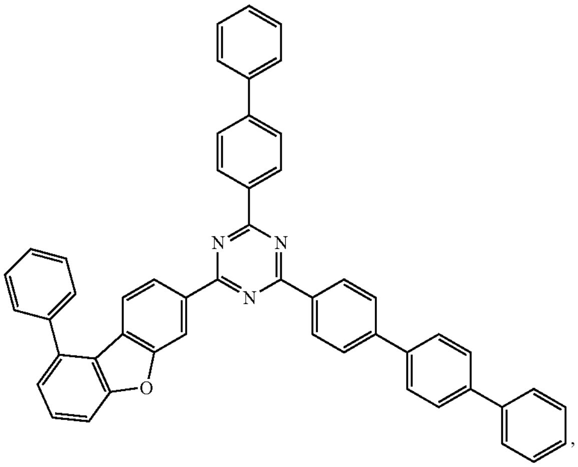
,
H-190
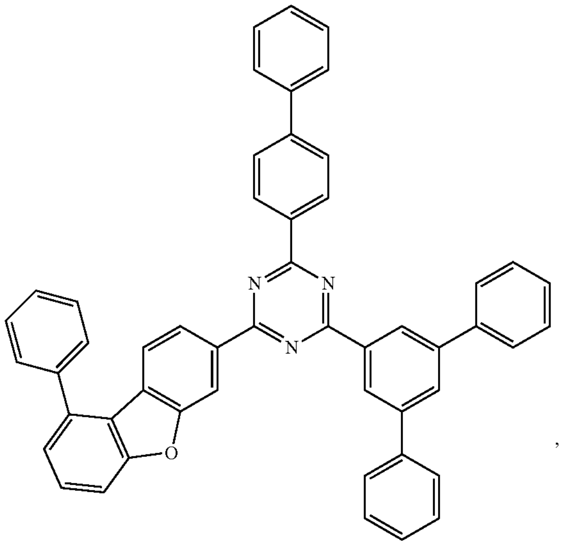
, -continued
H-191
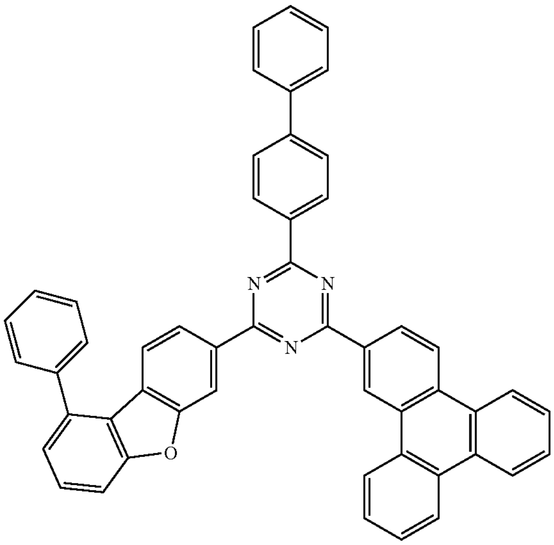
,
H-192
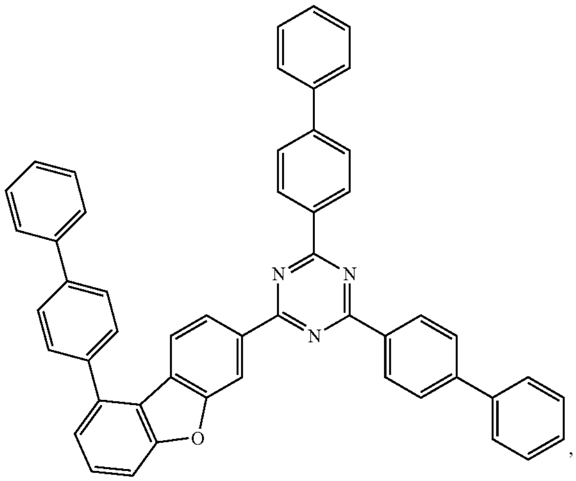
,
H-193
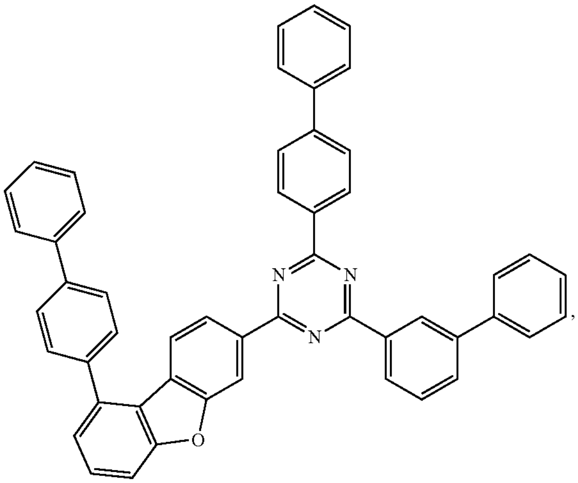
,
H-194
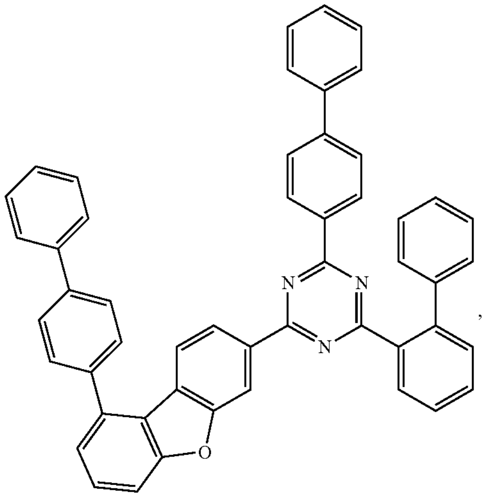
,
H-195
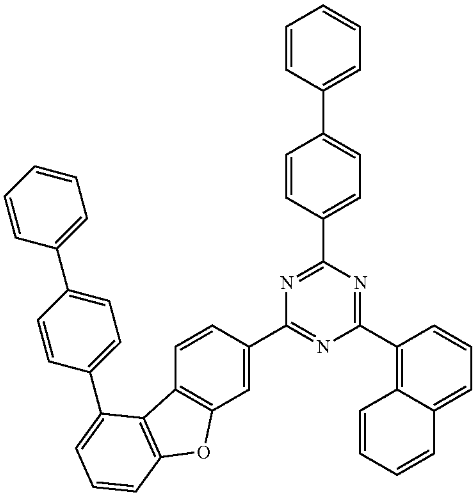
,
H-196
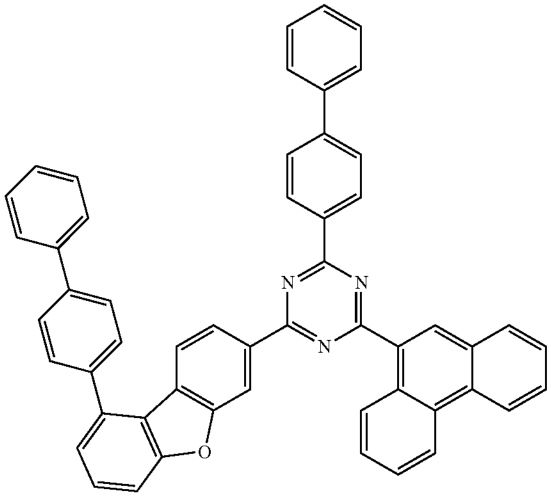
, -continued
H-197
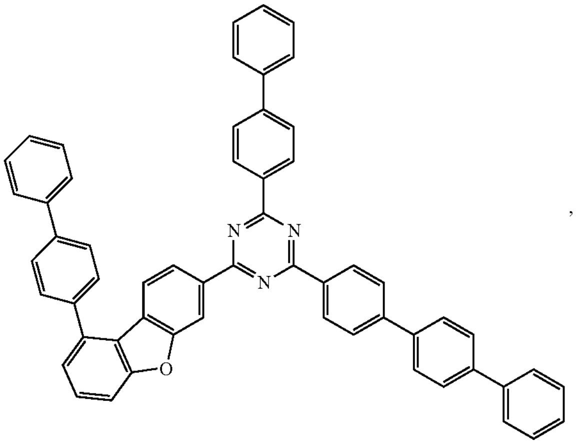
,
H-198
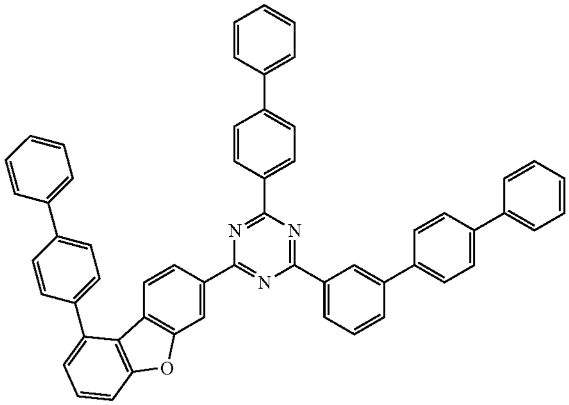
,
H-199
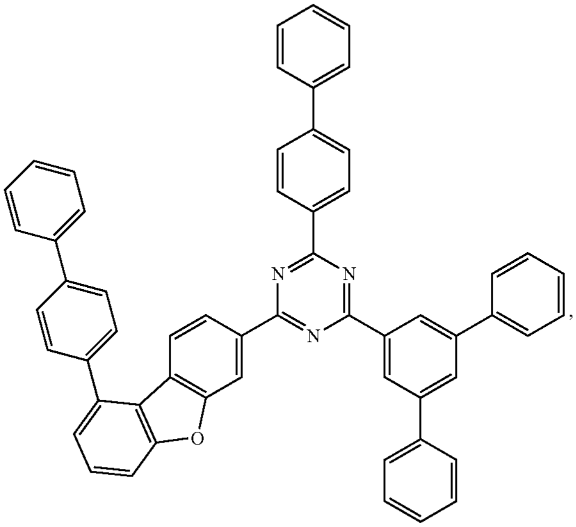
,
H-200
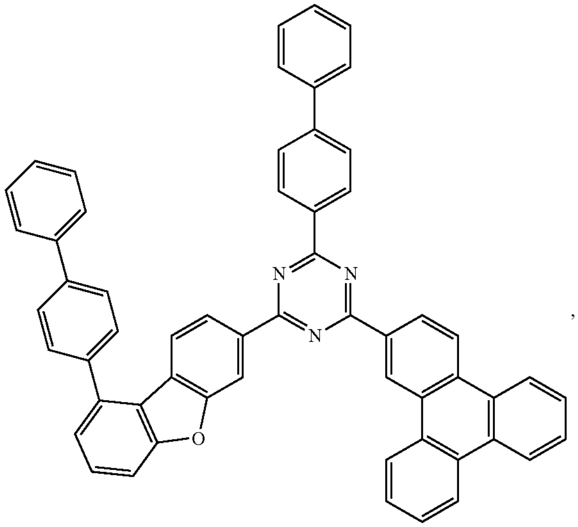
,
H-201
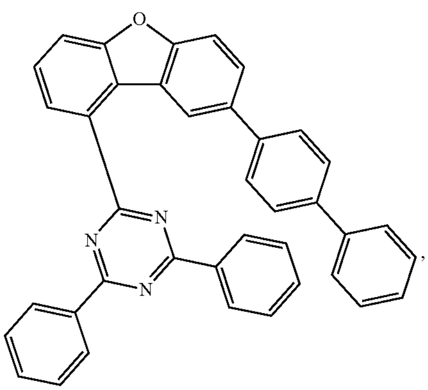
,
H-202
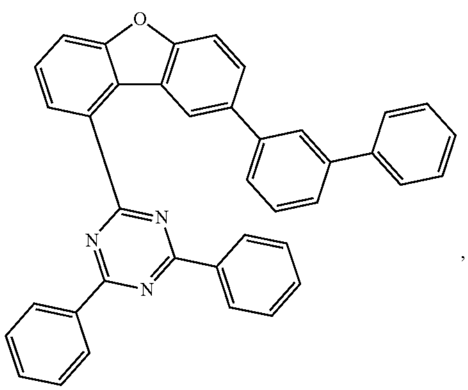
, -continued
H-203
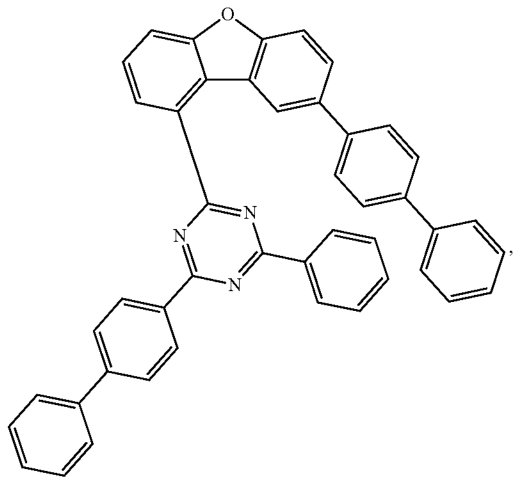
,
H-204
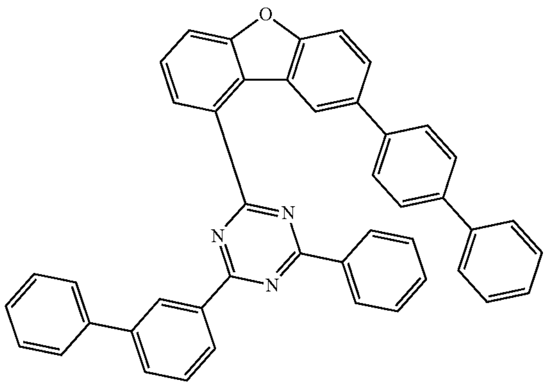
,
H-205
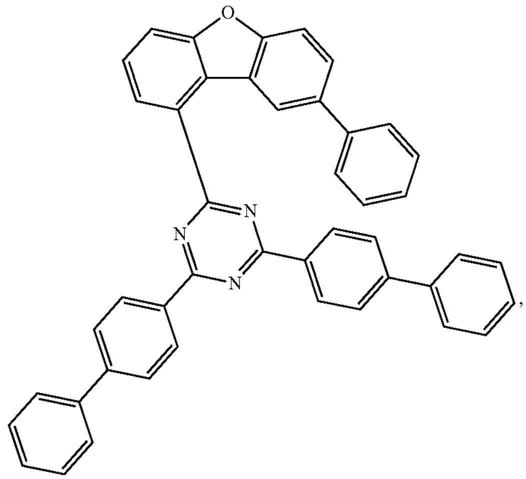
,
H-206
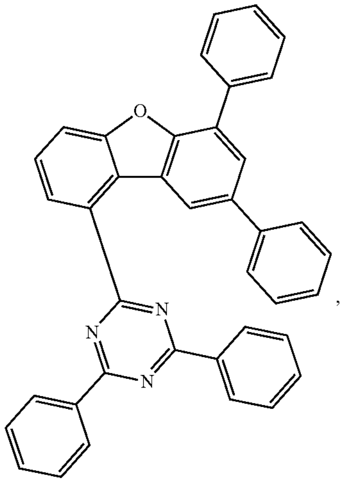
,
H-207
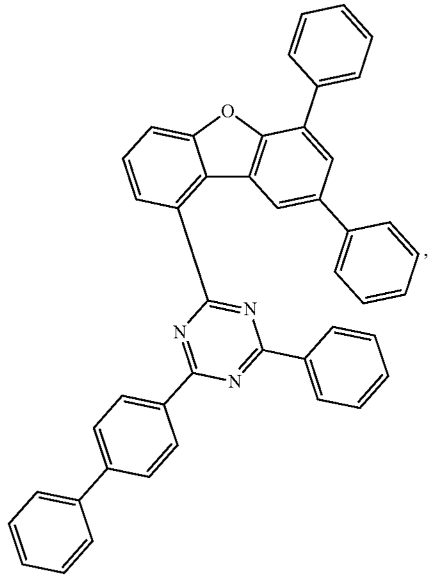
,
H-208
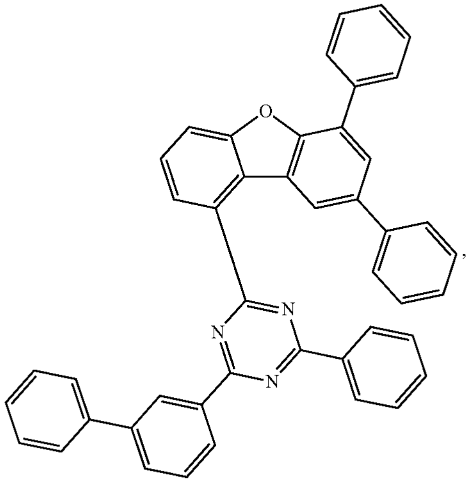
, -continued
H-209
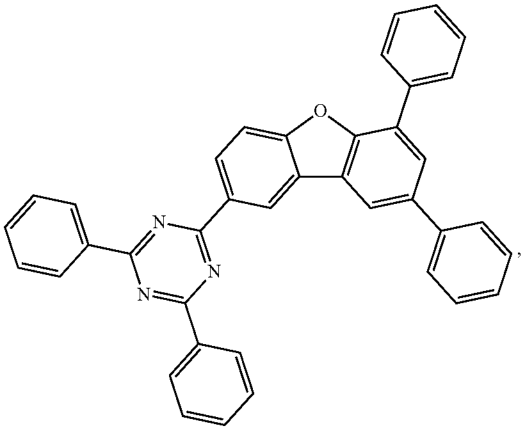,
H-210
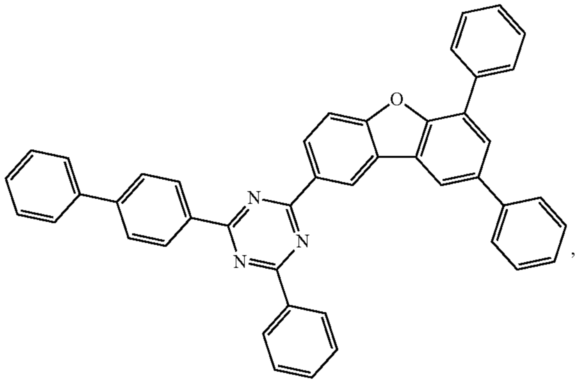,
H-211
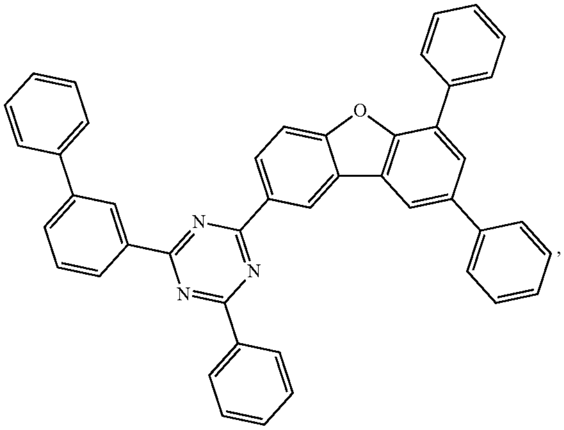,
H-212
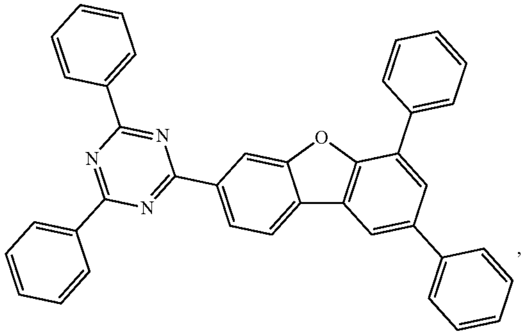,
H-213
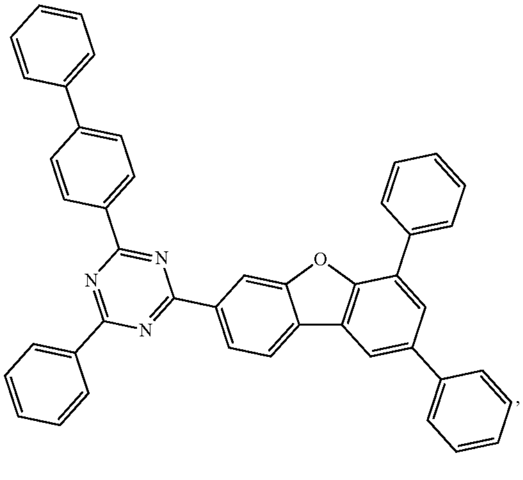,
H-214
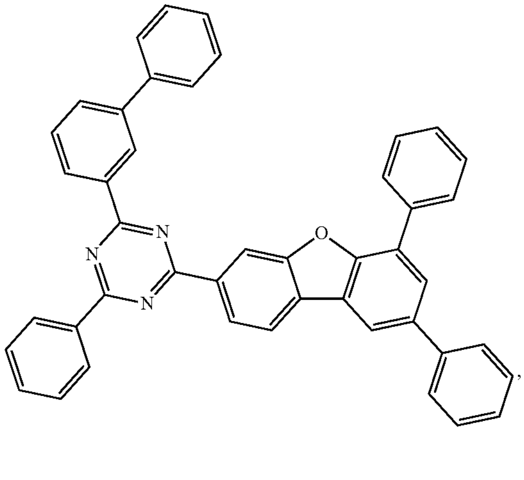, -continued
H-215
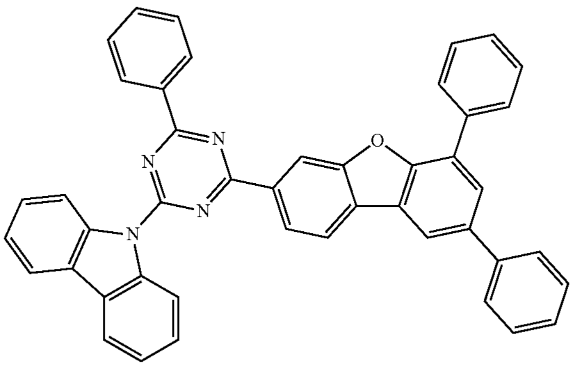
,
H-216
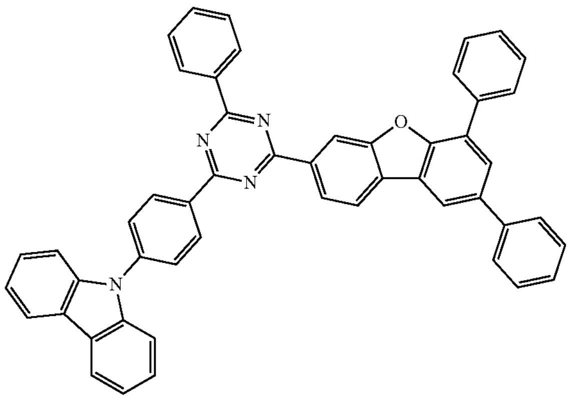
,
H-217
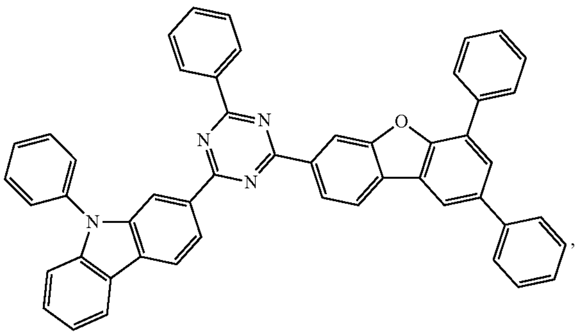
,
H-218
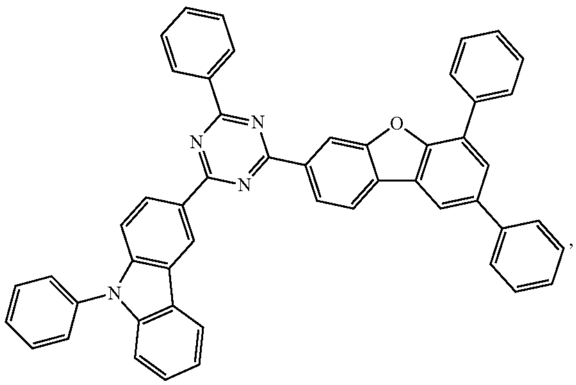
,
H-219
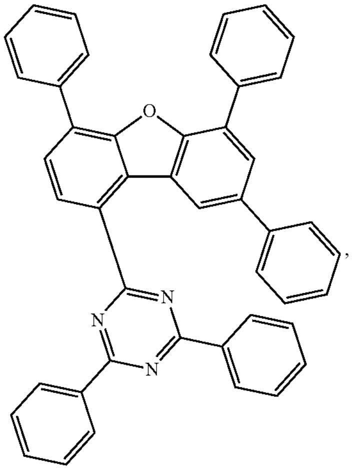
,
H-220
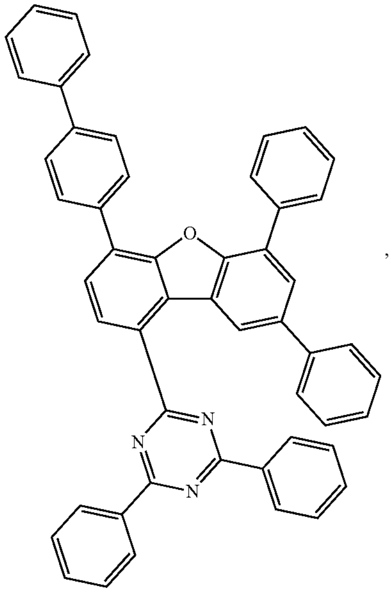
, -continued
H-221
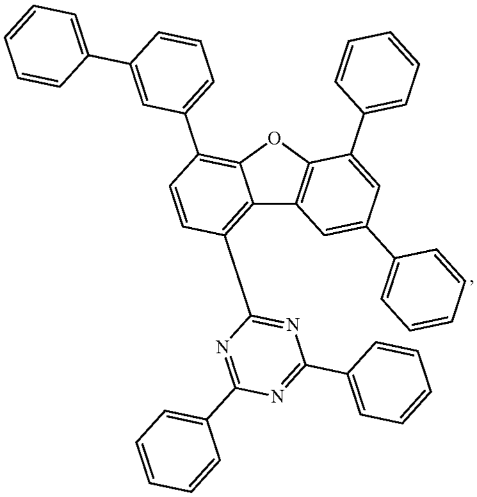
,
H-222
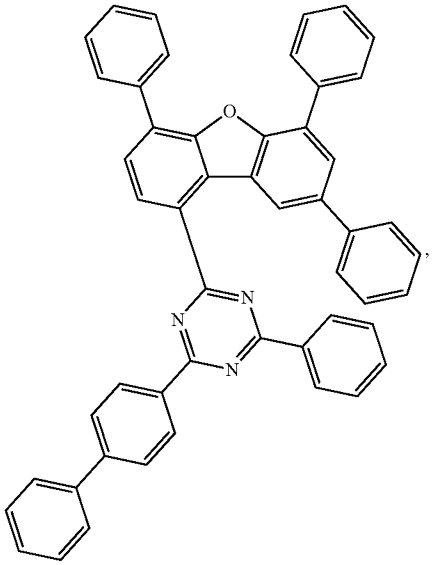
,
H-223
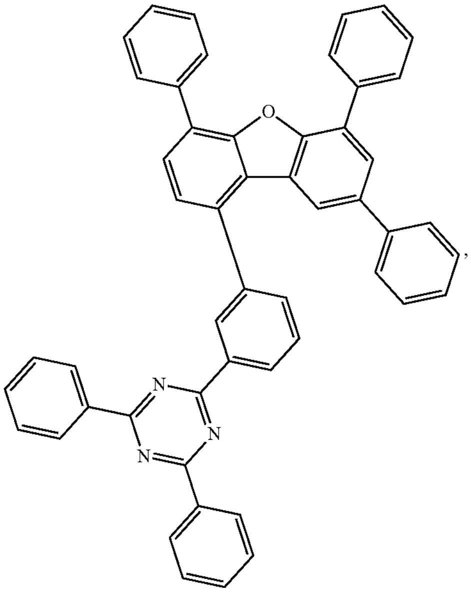
,
H-224
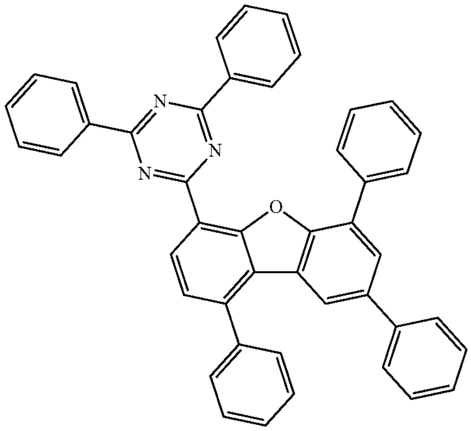
, -continued
H-225
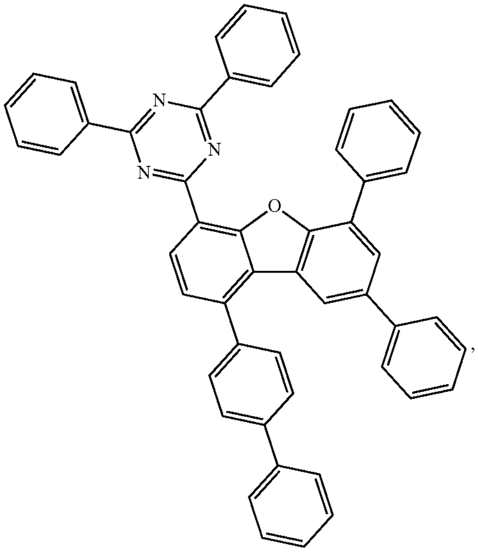
,
H-226
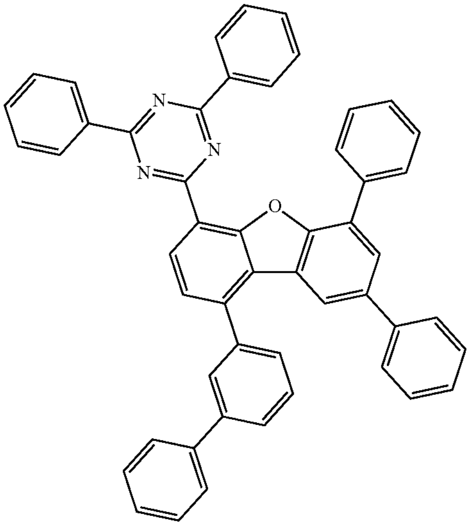
,
H-227
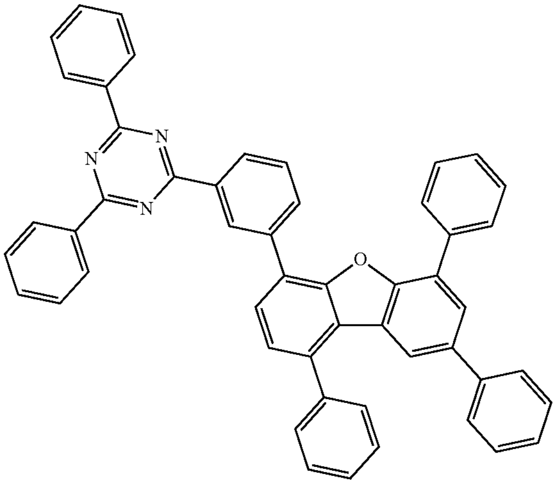
,
H-228
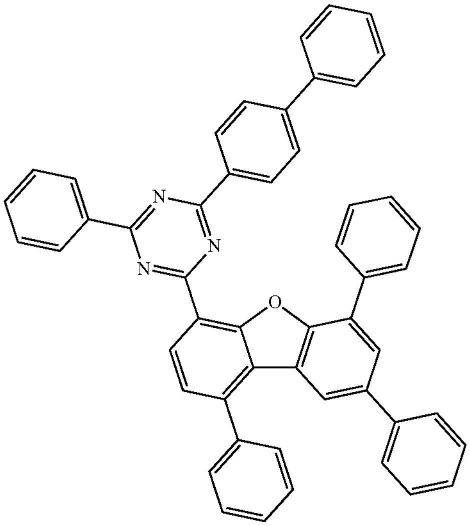
,
H-229
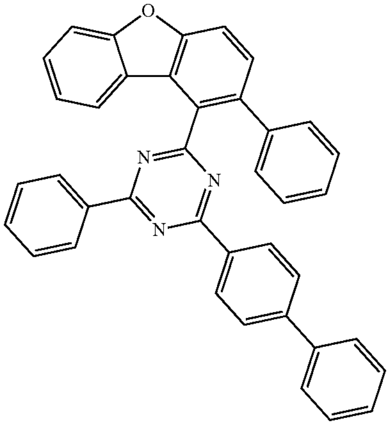
,
H-230
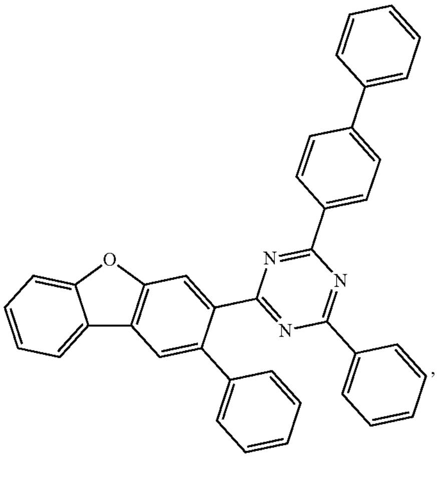
, -continued
H-231
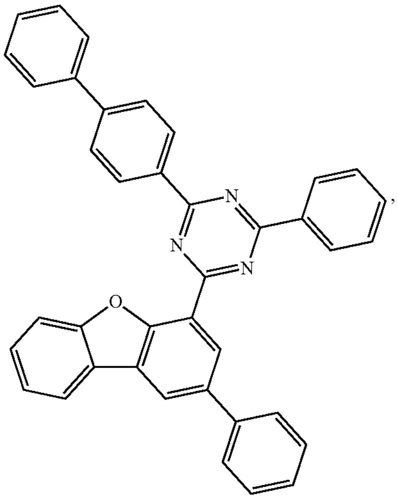
,
H-232
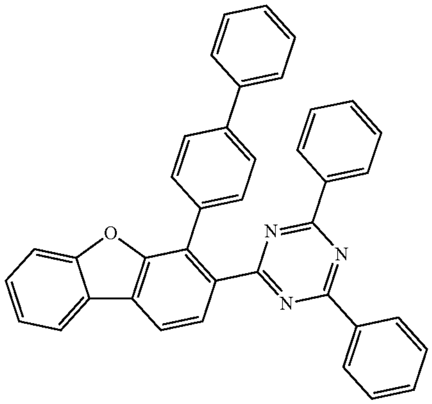
,
H-233
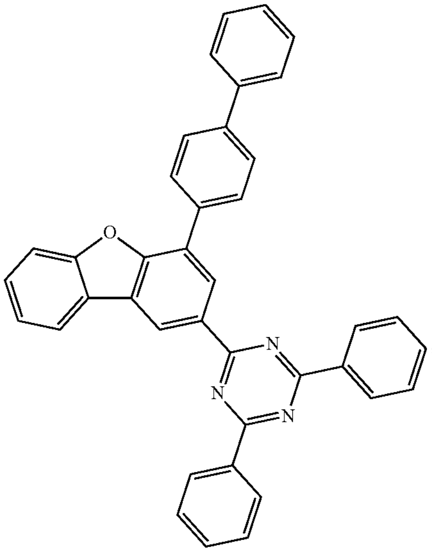
,
H-234
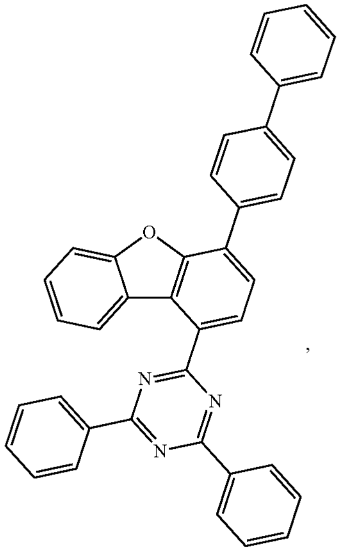
,
H-235
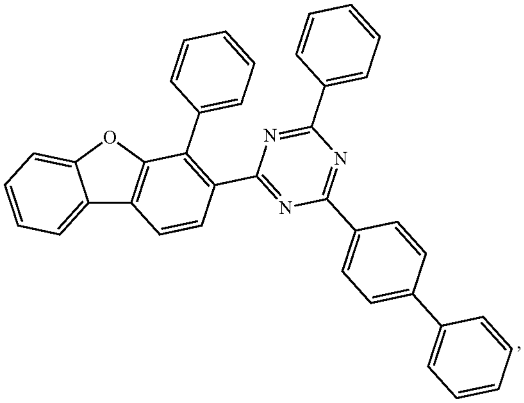
,
H-236
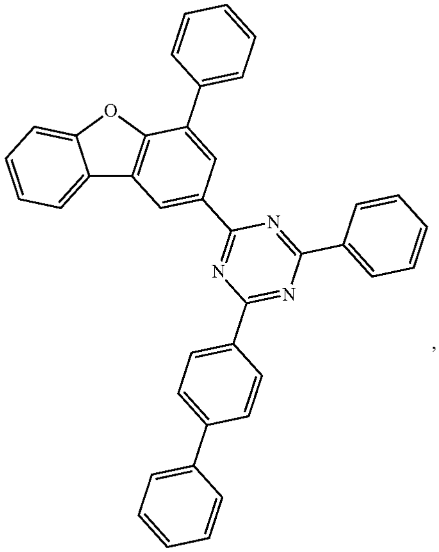
, -continued
H-237
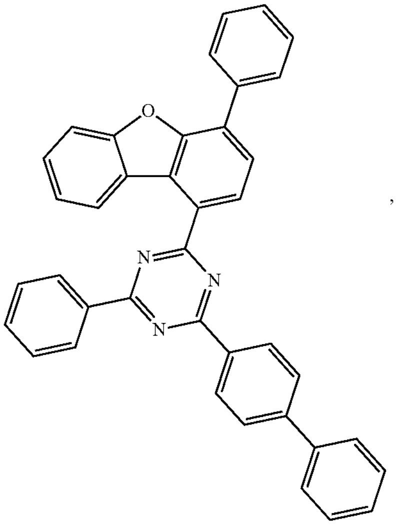
,
H-238
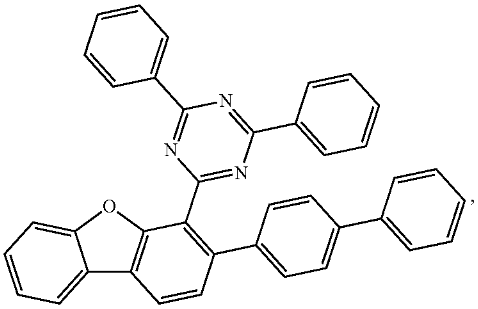
,
H-239
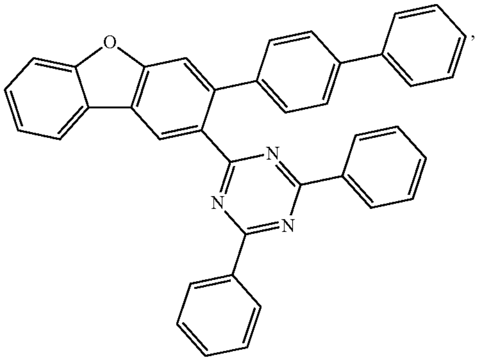
,
H-240
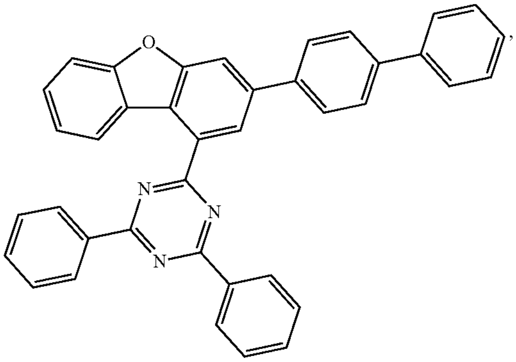
,
H-241
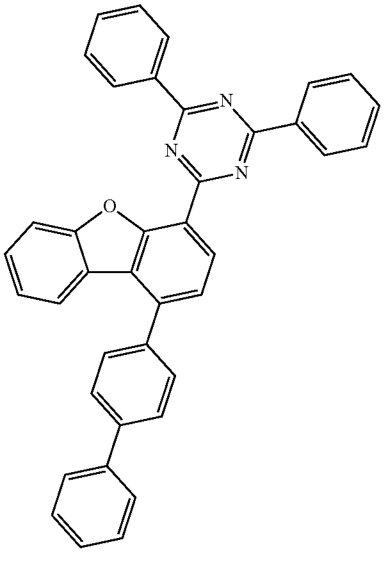
,
H-242
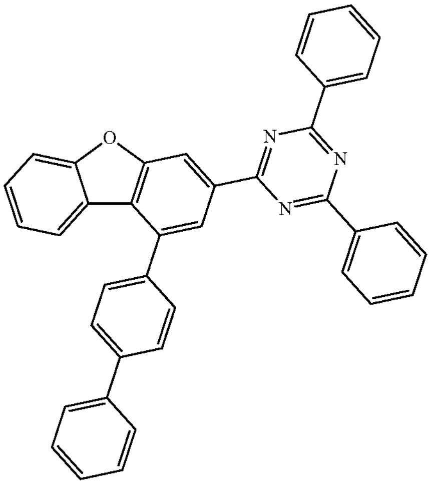
, and -continued

H-243

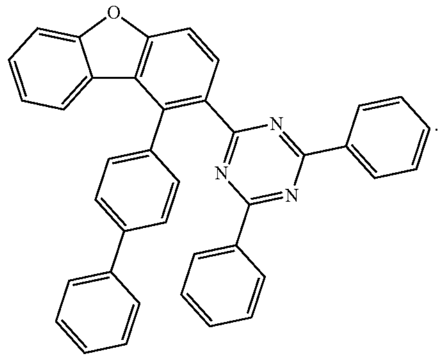

30. The electroluminescent device of claim 26, wherein the second host compound has a structure represented by Formula 5:

Formula 5

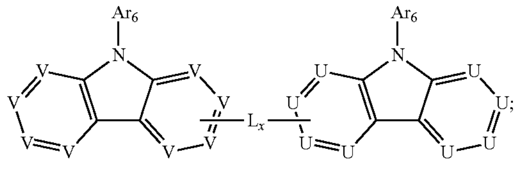

wherein, $L_x$ is, at each occurrence identically or differently, selected from a single bond, substituted or unsubstituted alkylene having 1 to 20 carbon atoms, substituted or unsubstituted cycloalkylene having 3 to 20 carbon atoms, substituted or unsubstituted arylene having 6 to 20 carbon atoms, substituted or unsubstituted heteroarylene having 3 to 20 carbon atoms or combinations thereof;

V is, at each occurrence identically or differently, selected from C, $CR_v$ or N, and at least one of V is C and is attached to $L_x$;

U is, at each occurrence identically or differently, selected from C, $CR_u$ or N, and at least one of U is C and is attached to $L_x$;

$R_v$ and $R_u$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof;

$Ar_6$ is, at each occurrence identically or differently, selected from substituted or unsubstituted aryl having 6 to 30 carbon atoms, substituted or unsubstituted heteroaryl having 3 to 30 carbon atoms or combinations thereof;

adjacent substituents $R_v$ and $R_u$ can be optionally joined to form a ring;

the second host compound has a structure represented by one of Formula 5-a to Formula 5-j:

5-a

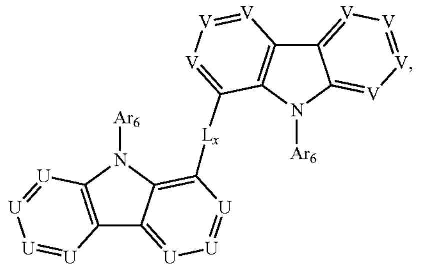

5-b

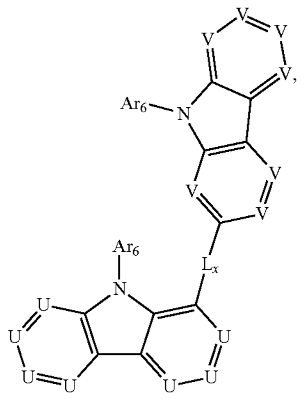

-continued
5-c
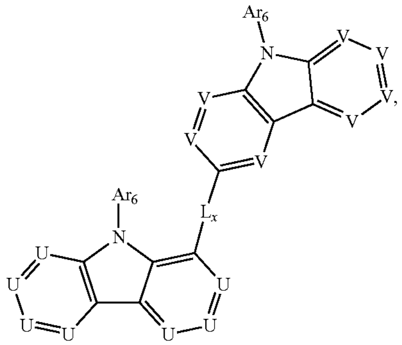
5-d
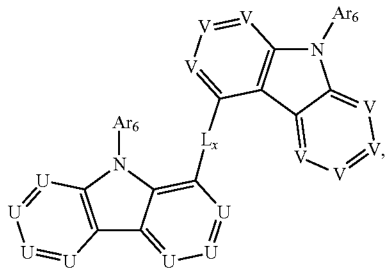
5-e
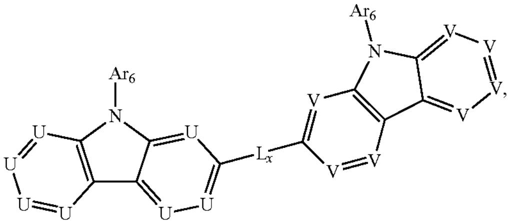
5-f
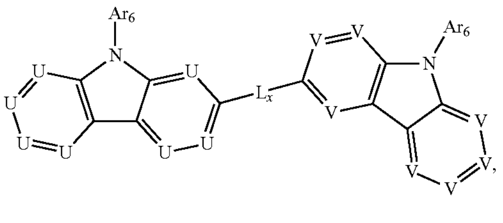
5-g
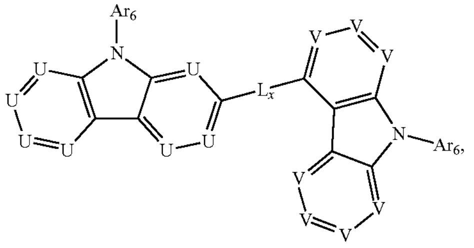
-continued
5-h
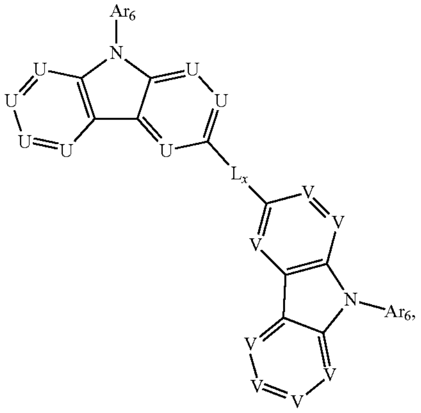
5-i
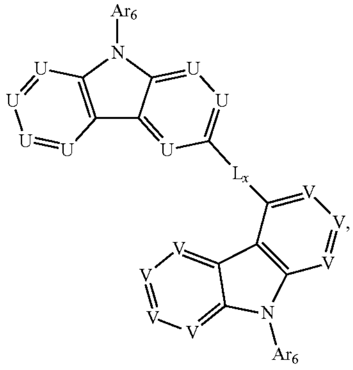
and
5-j
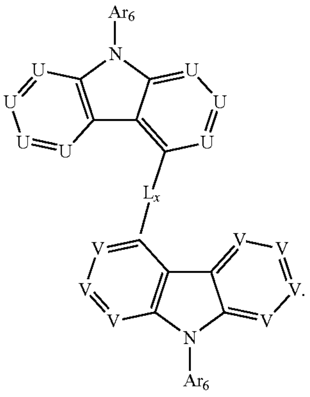

31. The electroluminescent device of claim 30, wherein the second host compound is selected from the group consisting of:
X-1
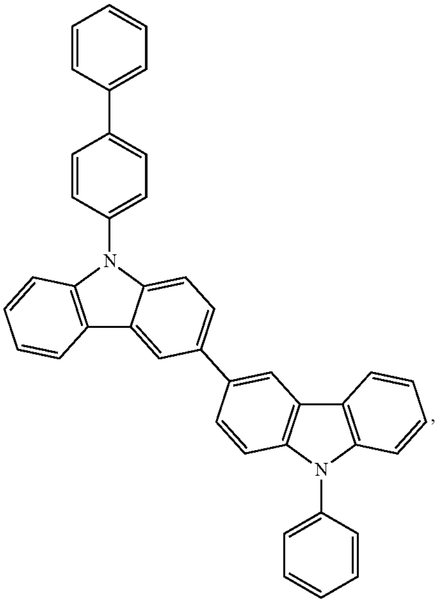
,
X-2
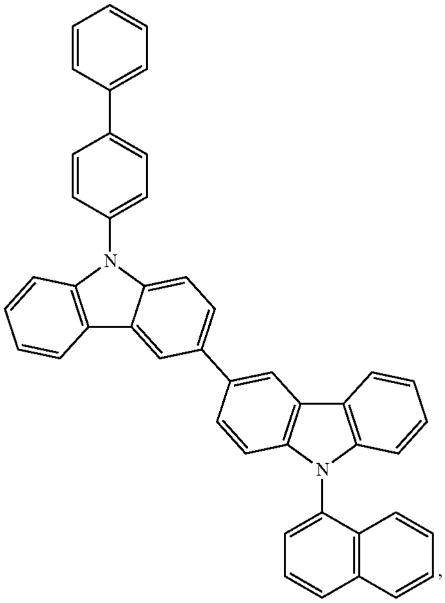
,
-continued
X-3
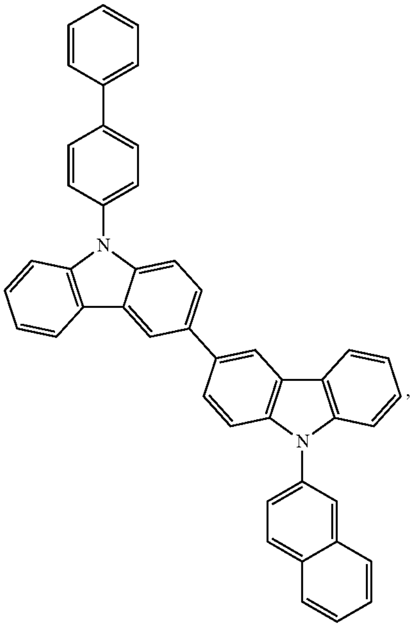
,
X-4
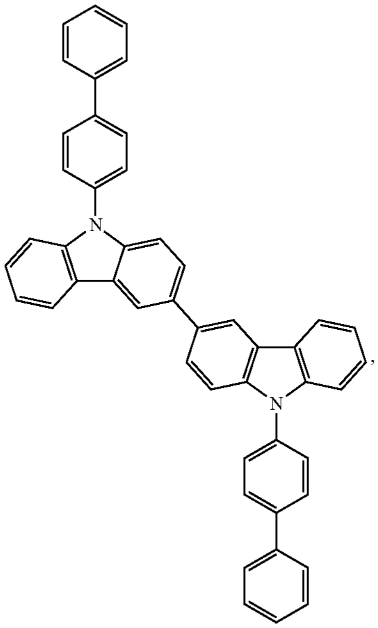
, -continued
X-5
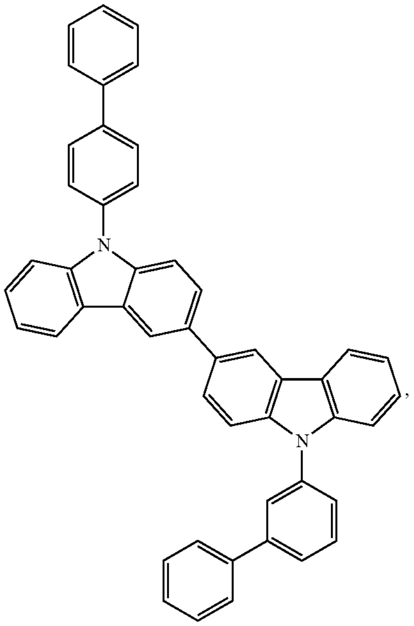
X-7
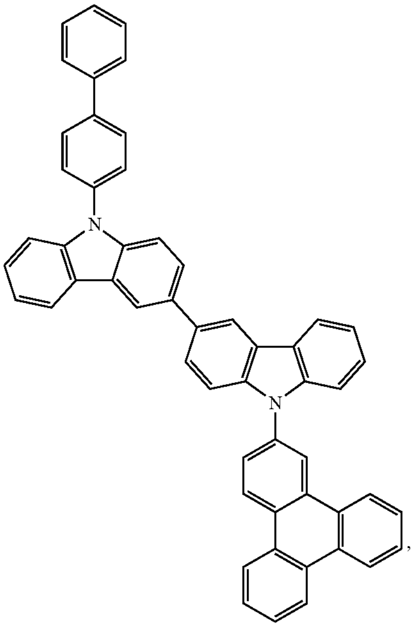
X-6
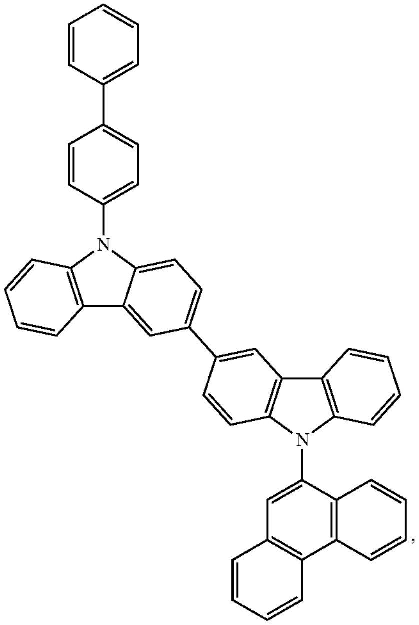
X-8
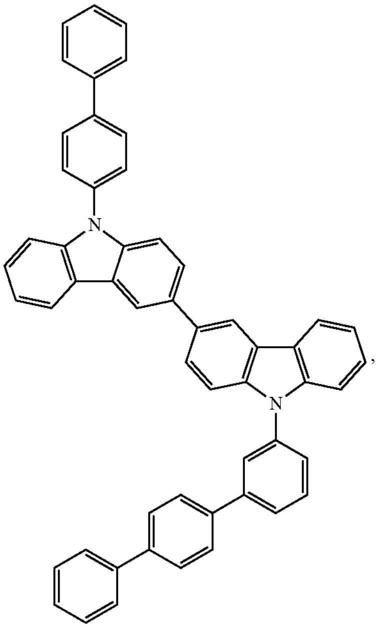

-continued
X-9
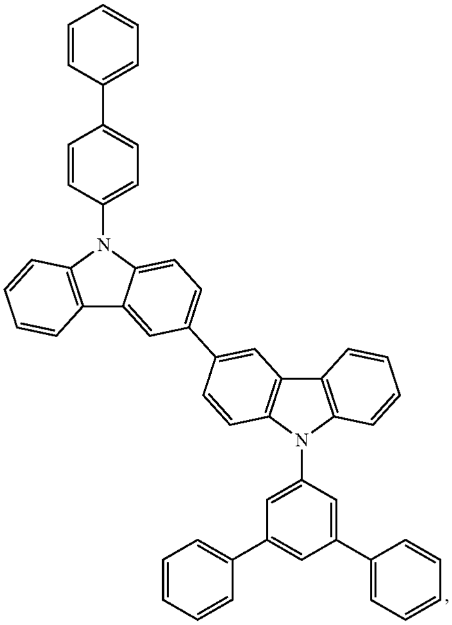
,
X-10
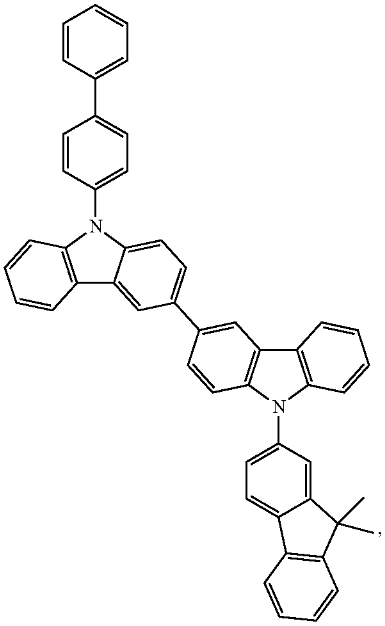
,
-continued
X-11
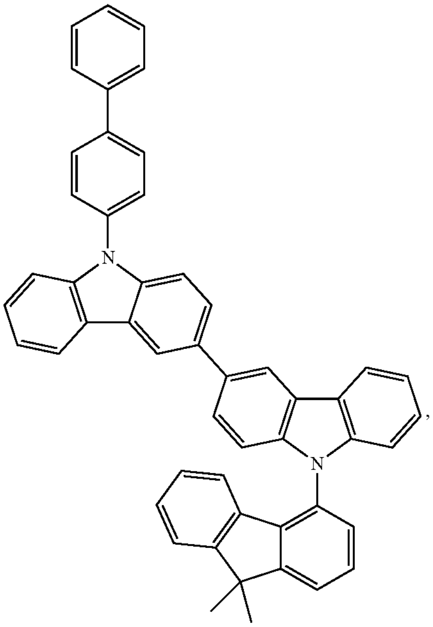
,
X-12
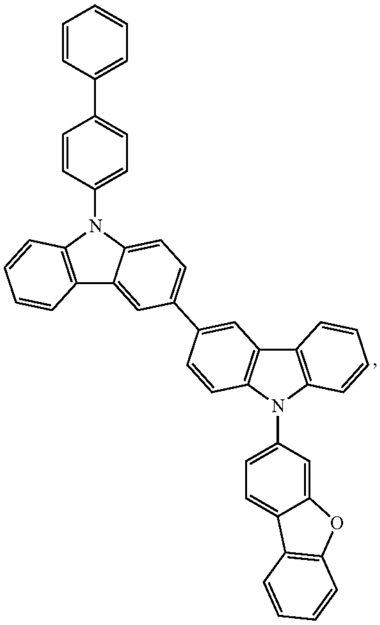
, -continued
X-13
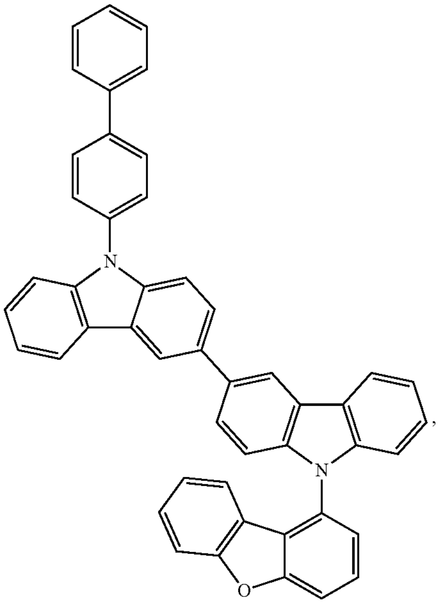
,
X-14
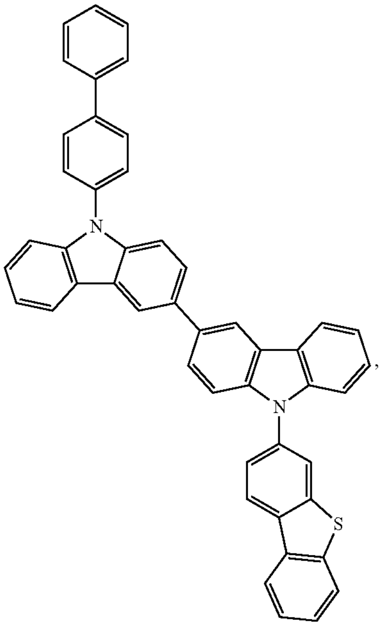
,
-continued
X-15
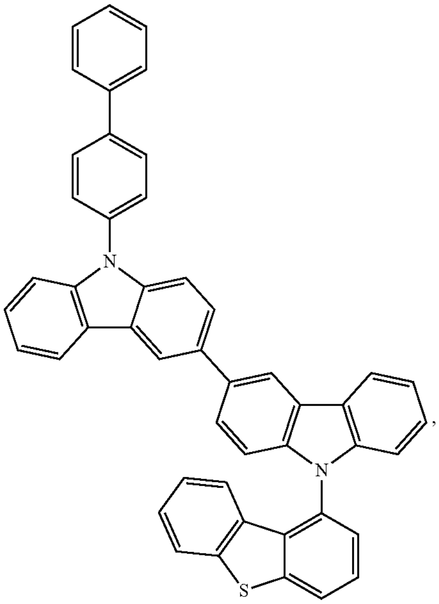
,
X-16
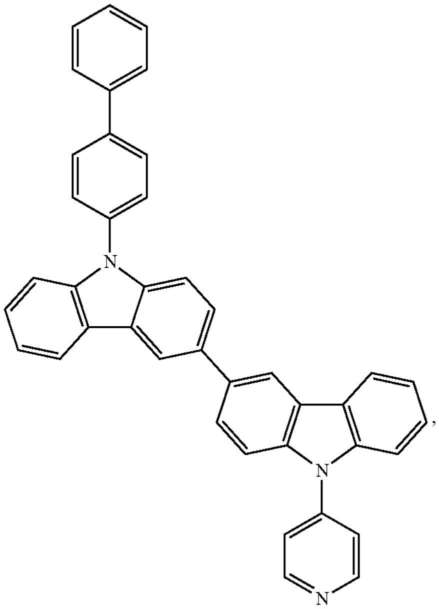
, -continued
X-17
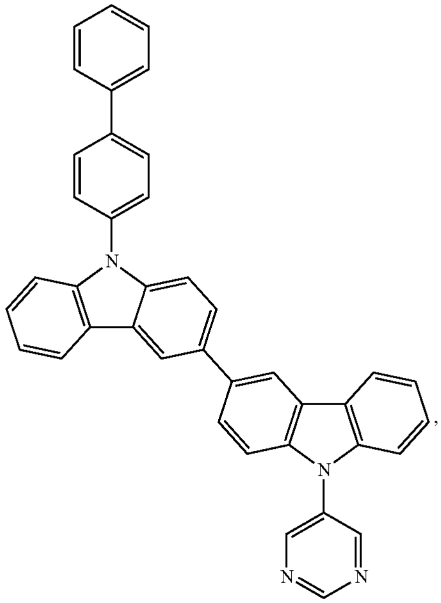
,
X-18
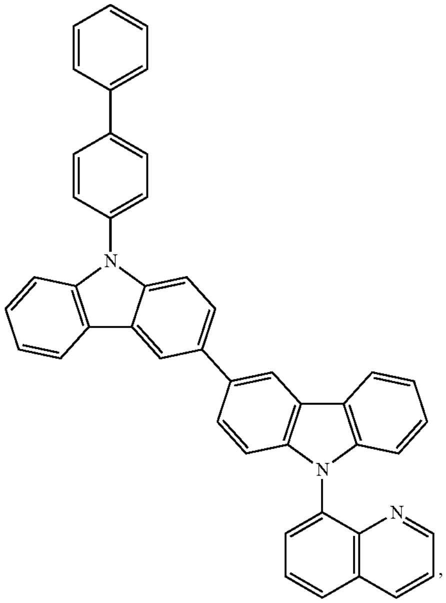
,
-continued
X-19
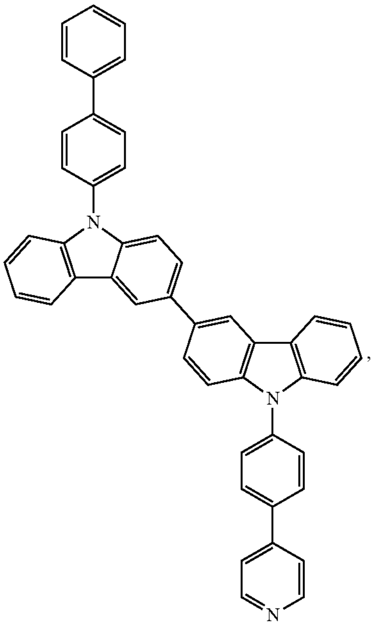
,
X-20
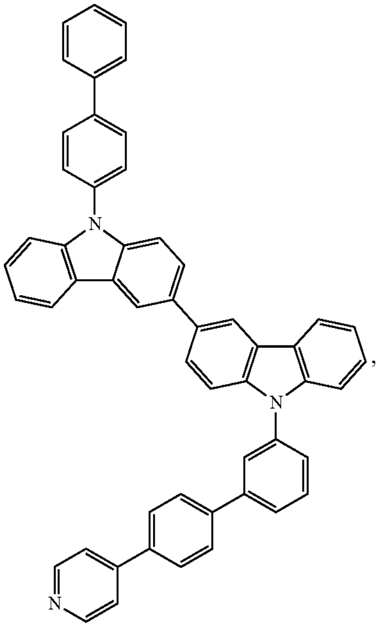
, -continued
X-21
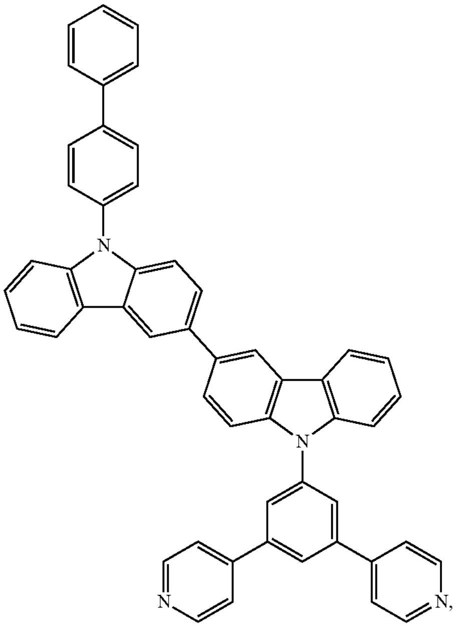
X-22
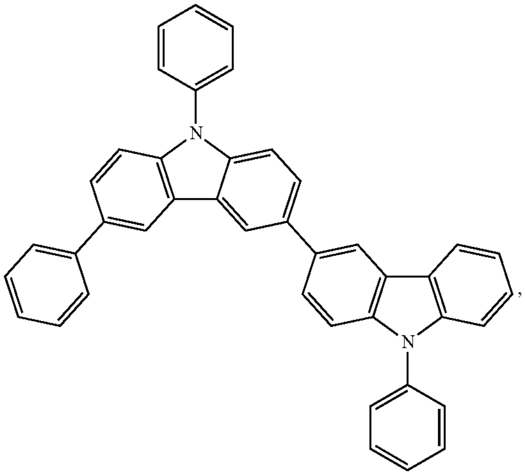
X-23
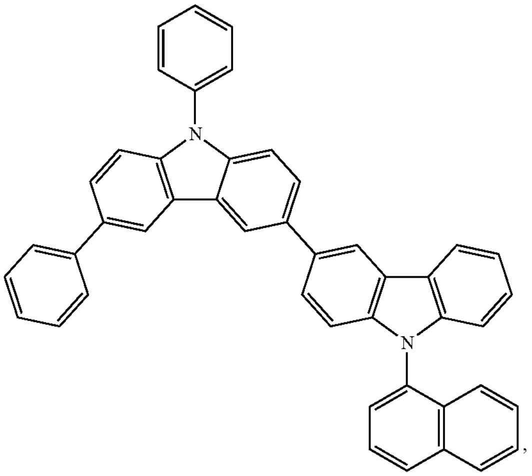
-continued
X-24
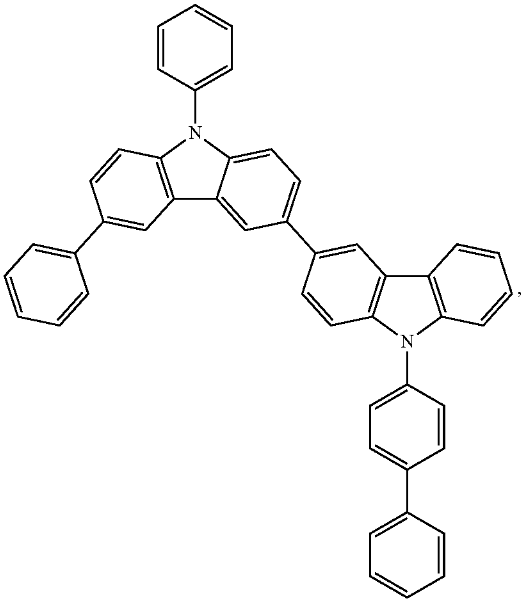
X-25
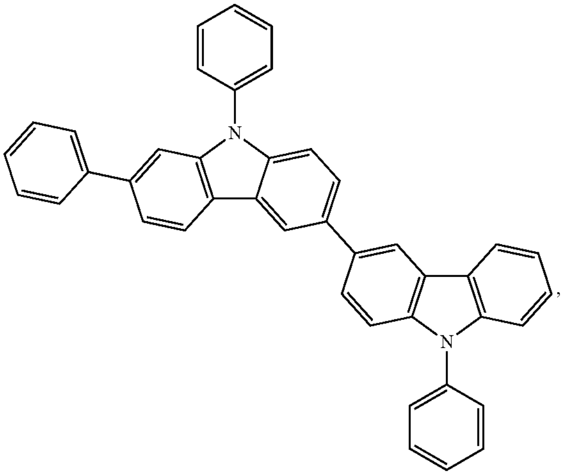
X-26
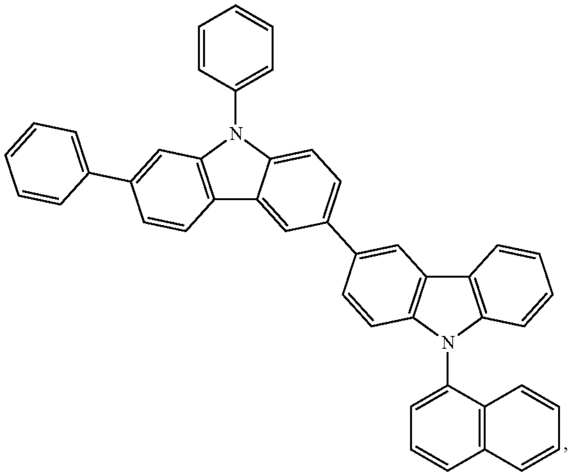

-continued
X-27
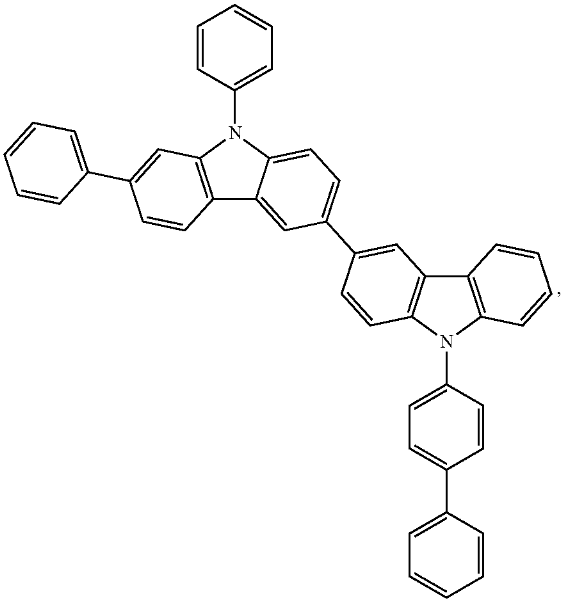
,
X-28
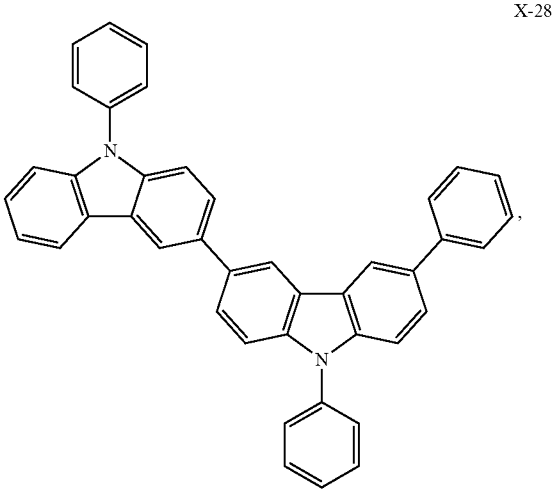
,
X-29
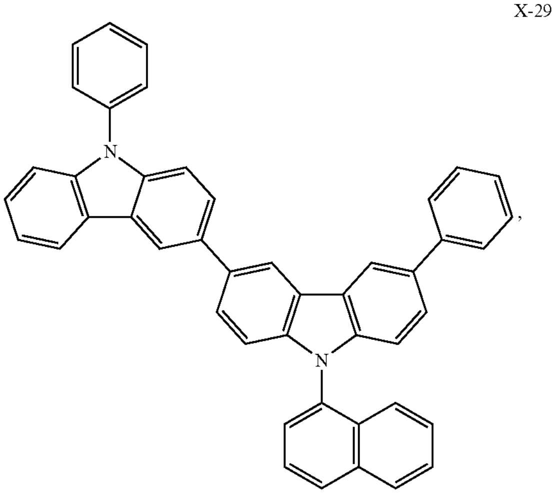
,
-continued
X-30
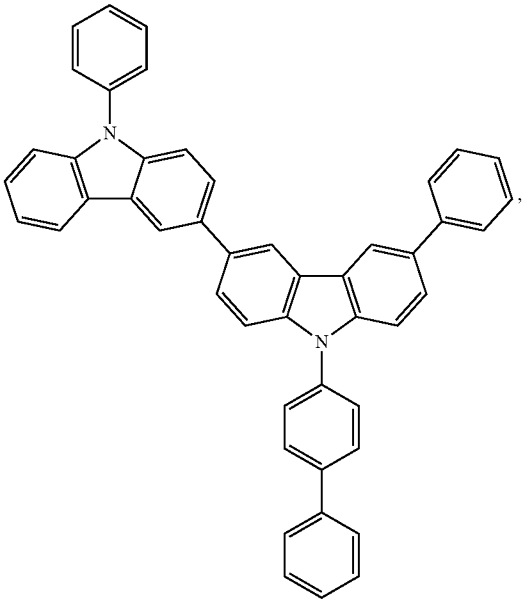
,
X-31
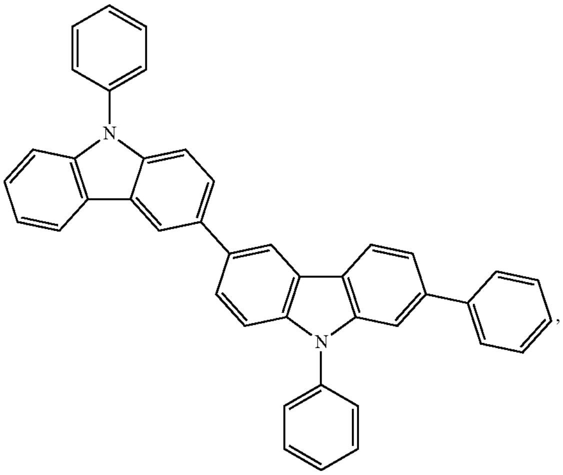
,
X-32
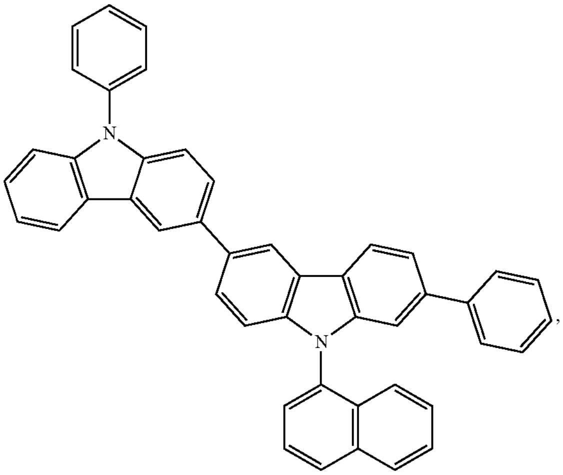
, -continued
X-33
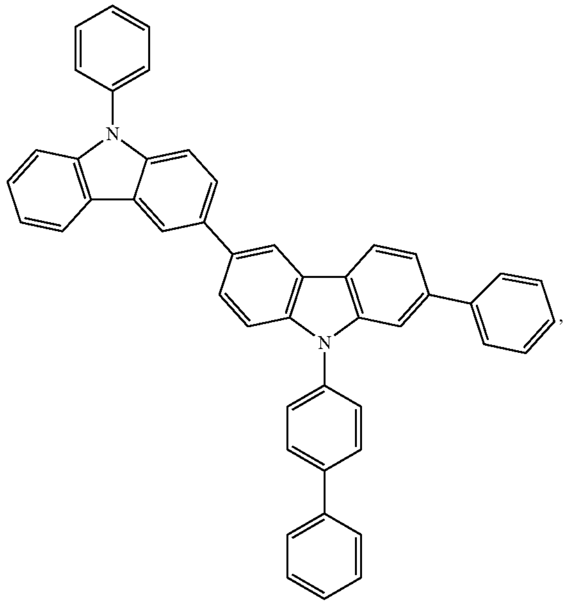,
X-34
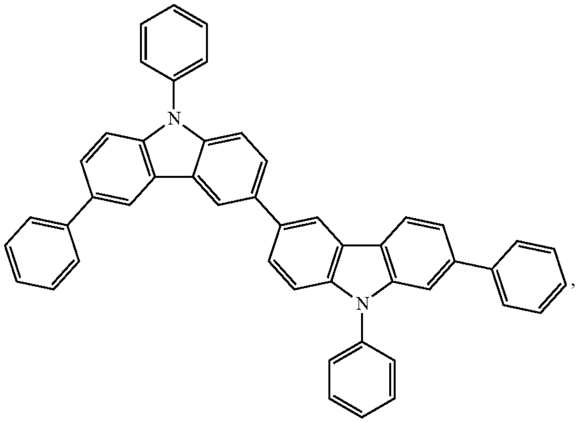,
X-35
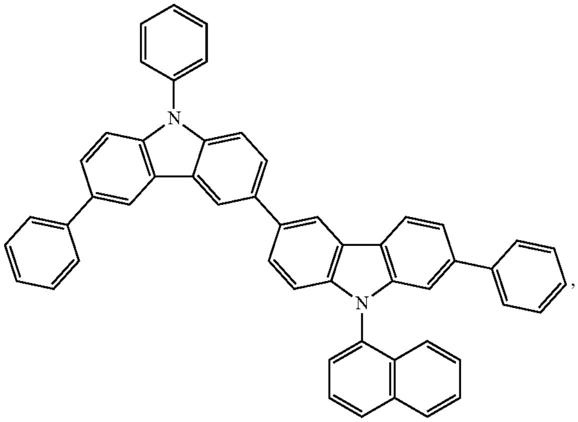,
-continued
X-36
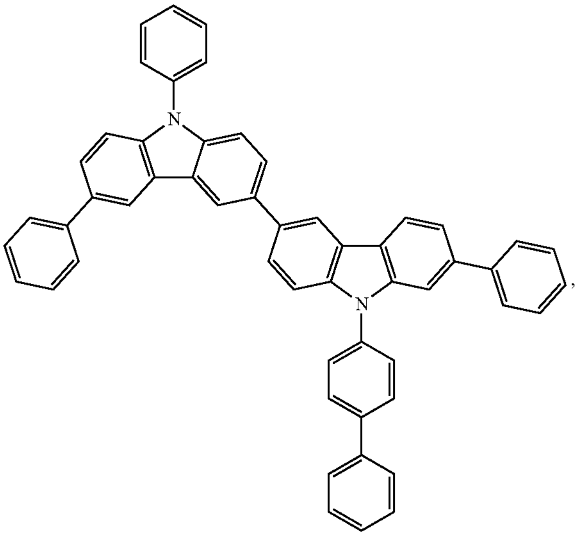,
X-37
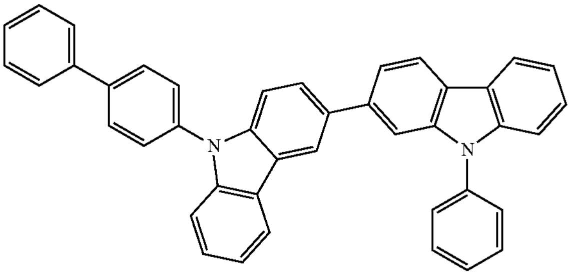,
X-38
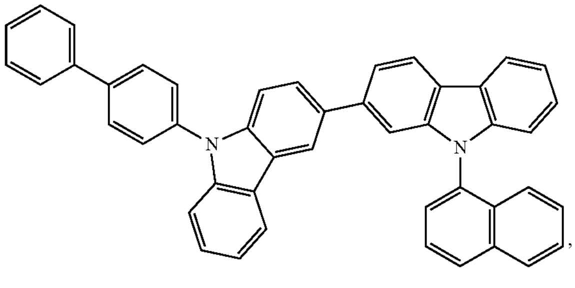,
X-39
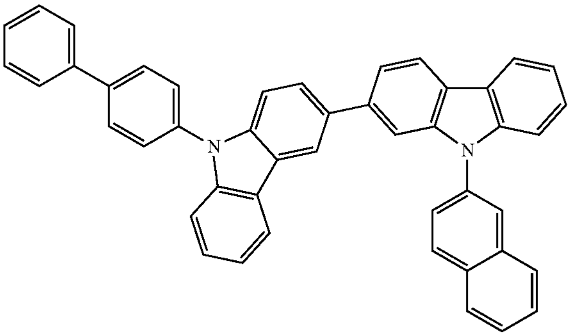, -continued
X-40
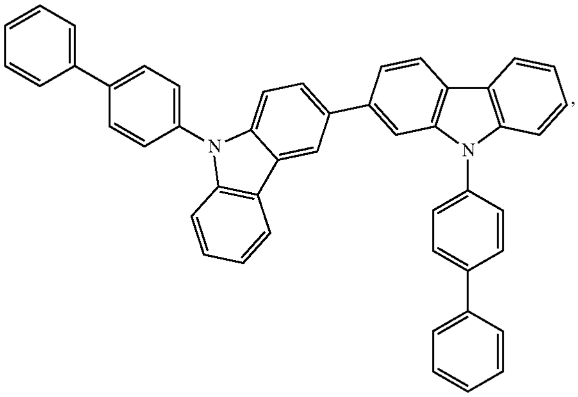
,
X-41
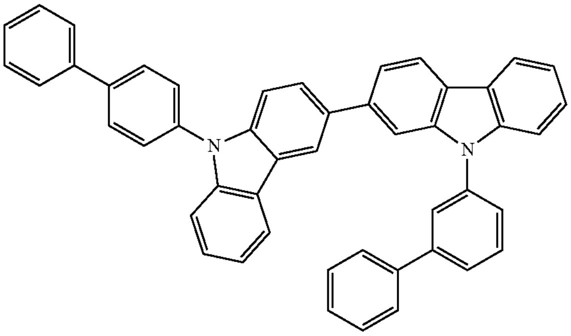
,
X-42
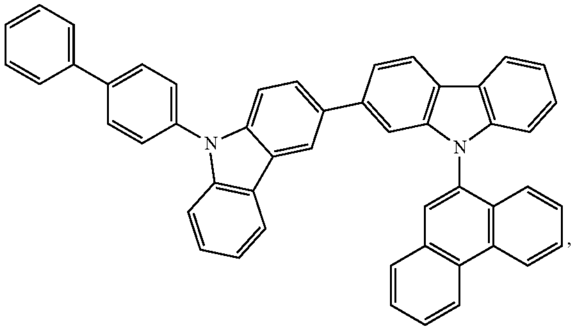
,
X-43
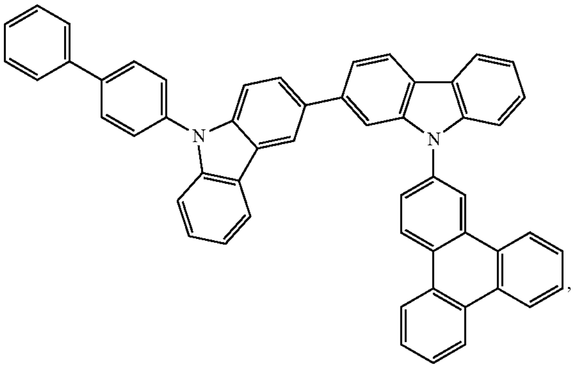
,
-continued
X-44
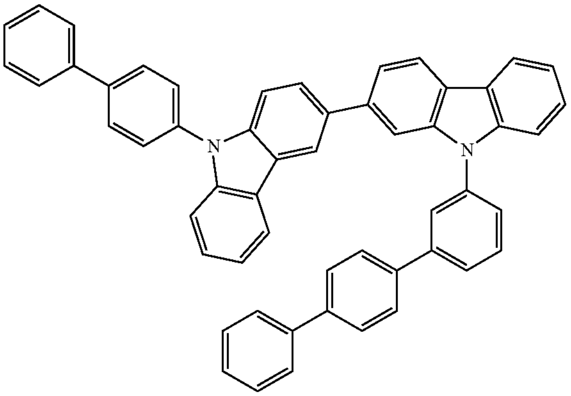
,
X-45
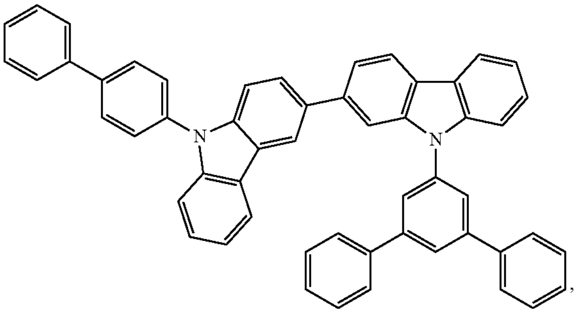
,
X-46
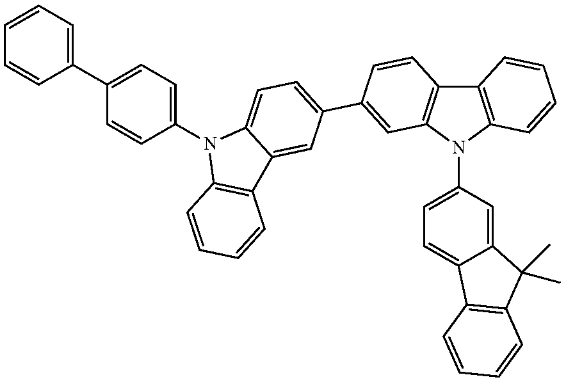
X-47
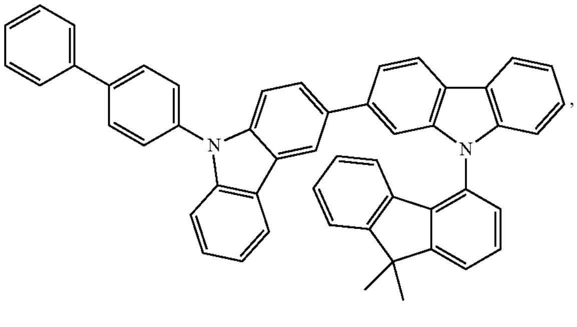
, -continued
X-48
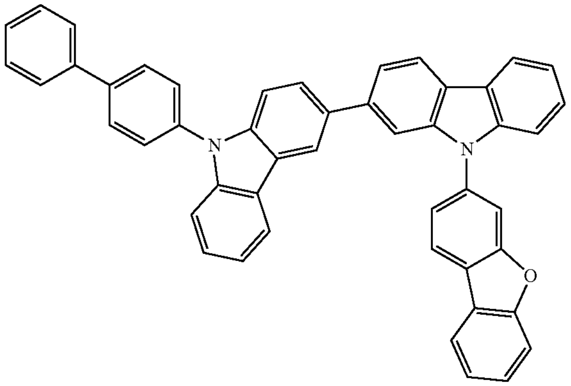
,
X-49
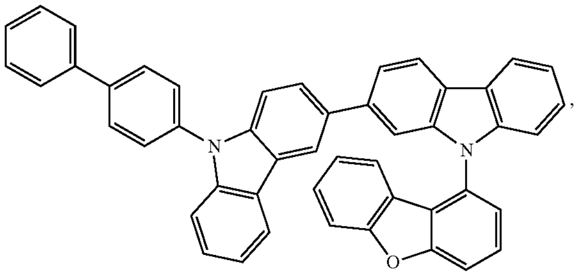
,
X-50
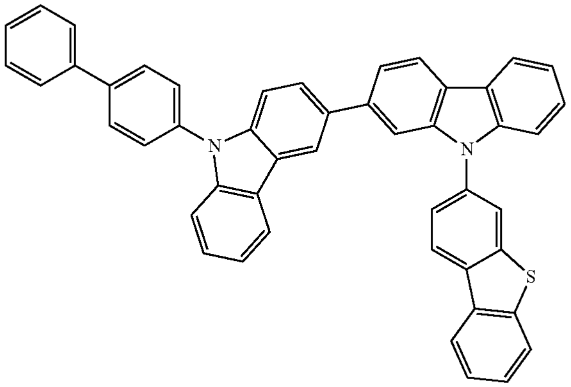
,
X-51
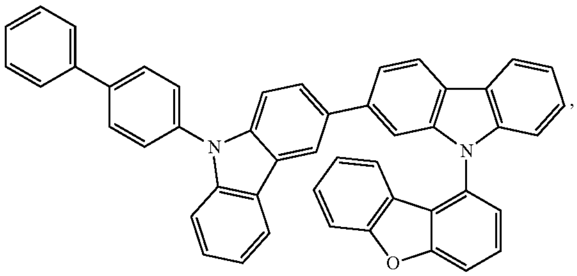
,
-continued
X-52
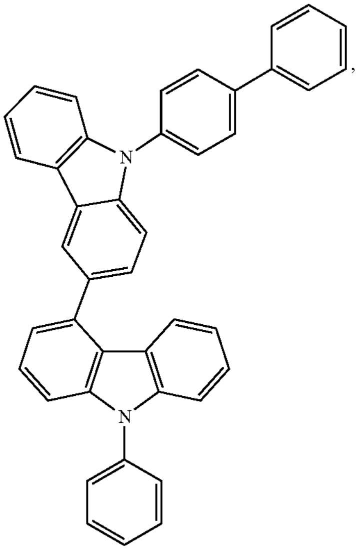
,
X-53
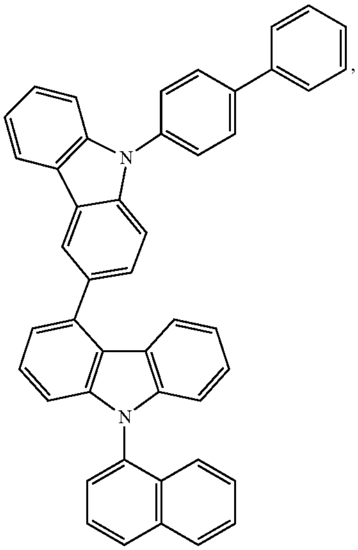
, -continued
X-54
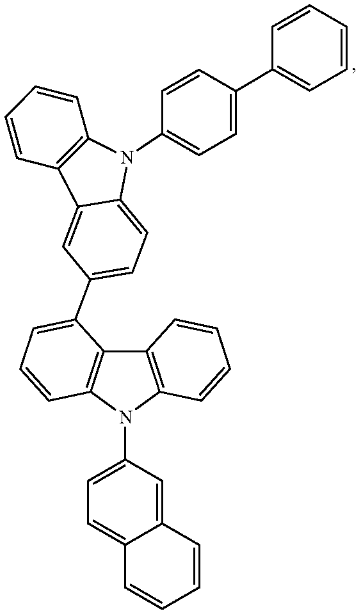
,
-continued
X-56
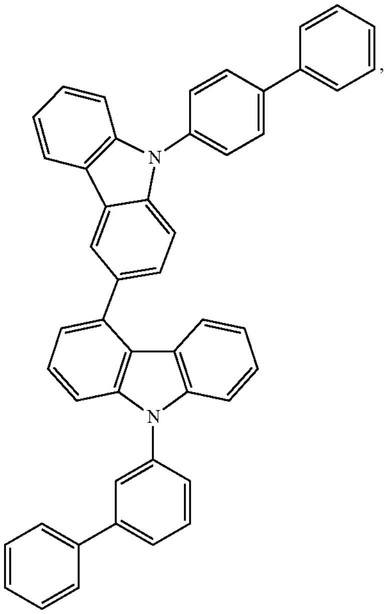
,
X-55
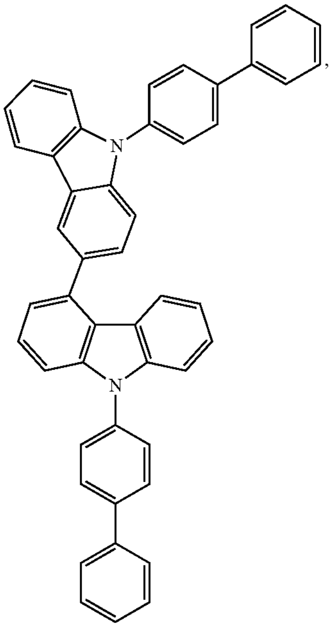
,
X-57
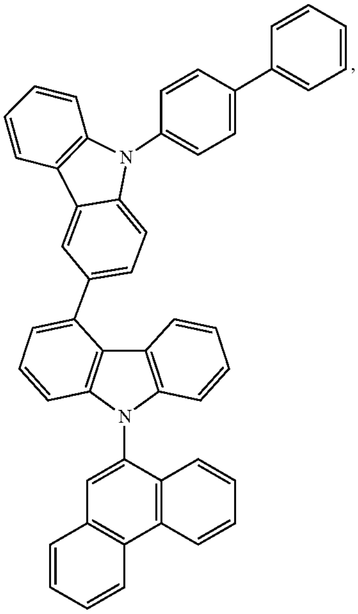
, -continued
X-58
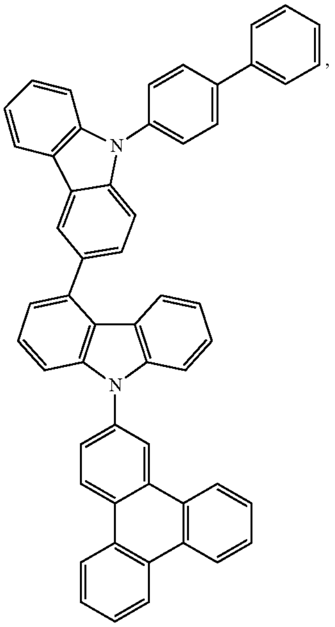
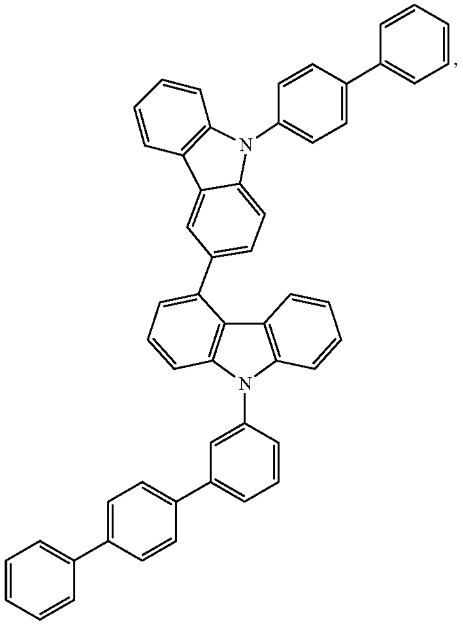
X-59
-continued
X-60
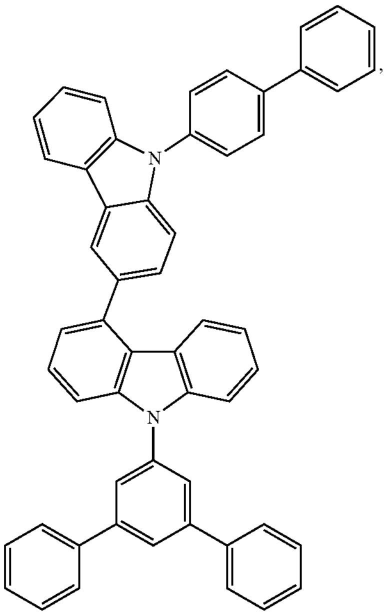
X-61
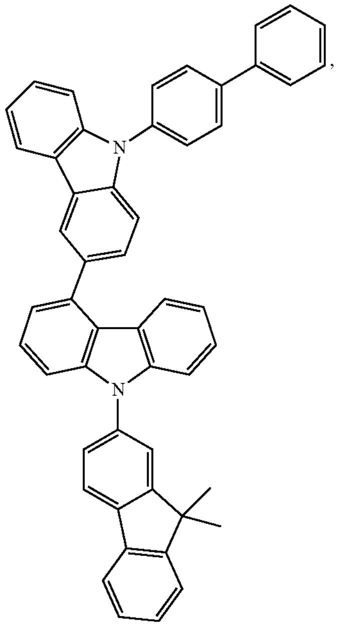

-continued
X-62
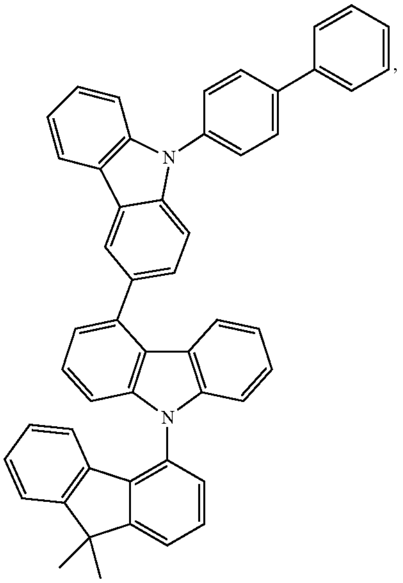
X-64
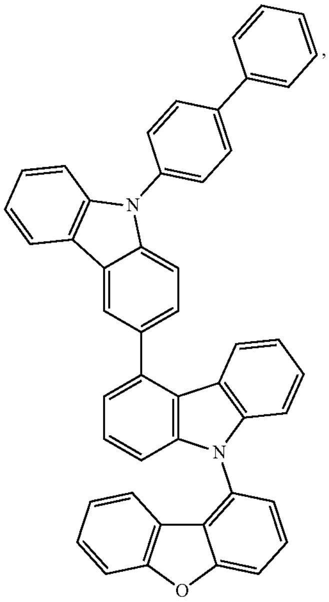
X-63
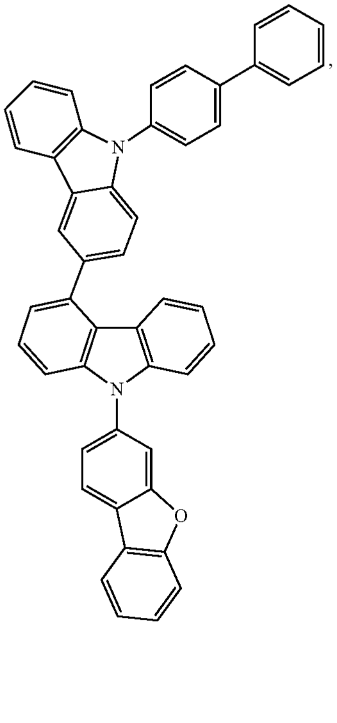
X-65
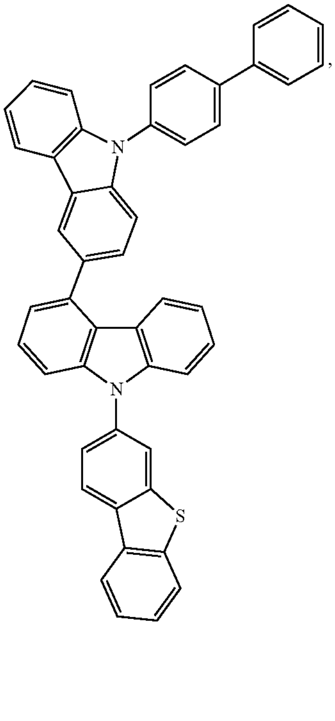

-continued
X-66
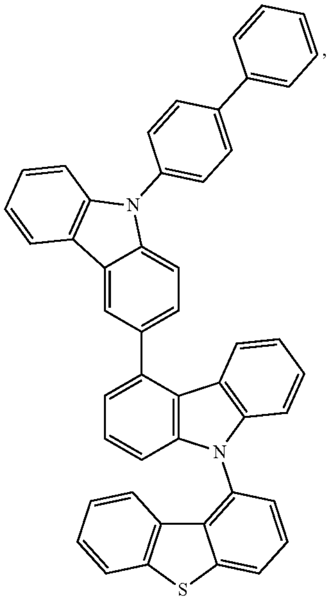
X-67
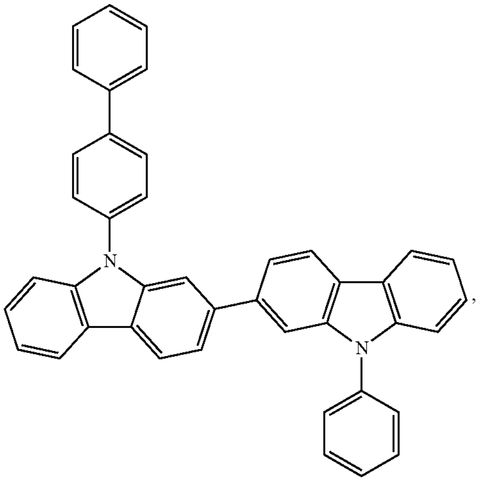
X-68
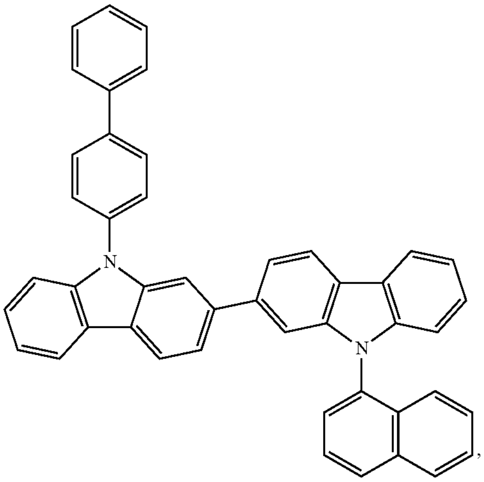
-continued
X-69
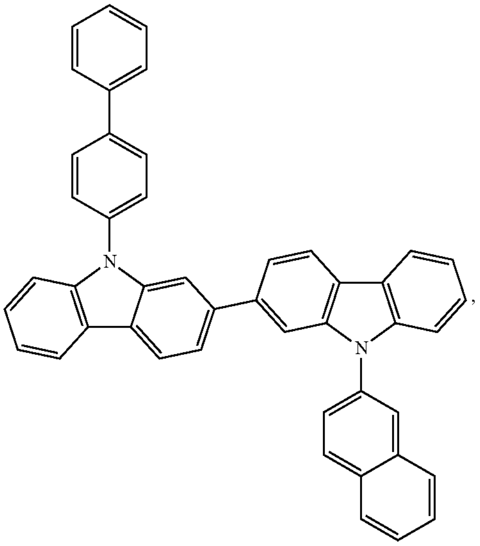
X-70
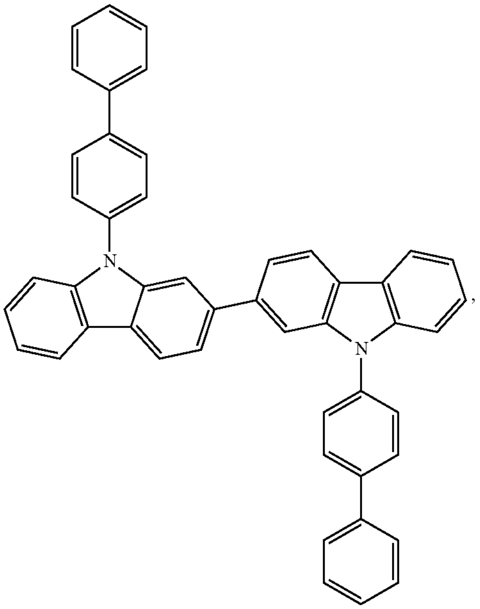

-continued
X-71
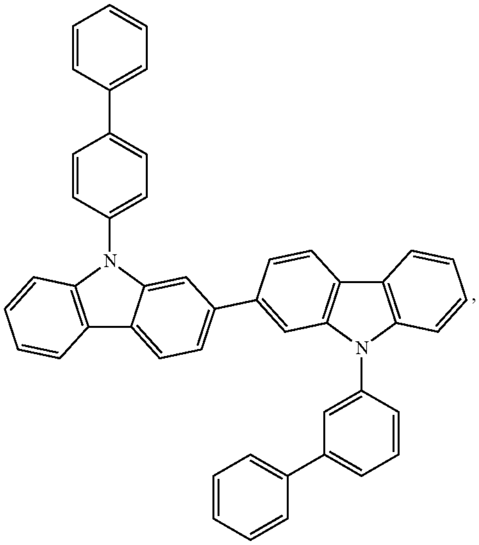
,
X-72
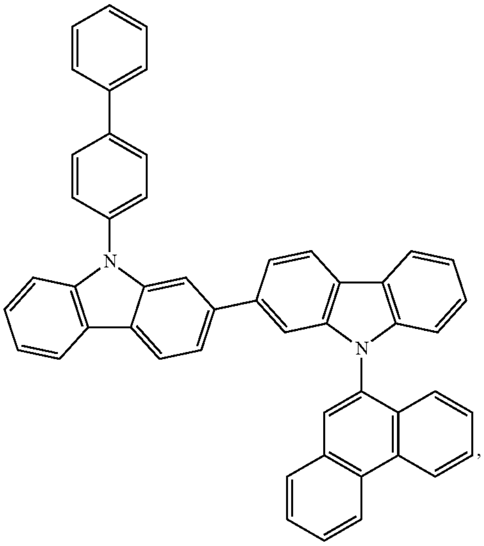
,
-continued
X-73
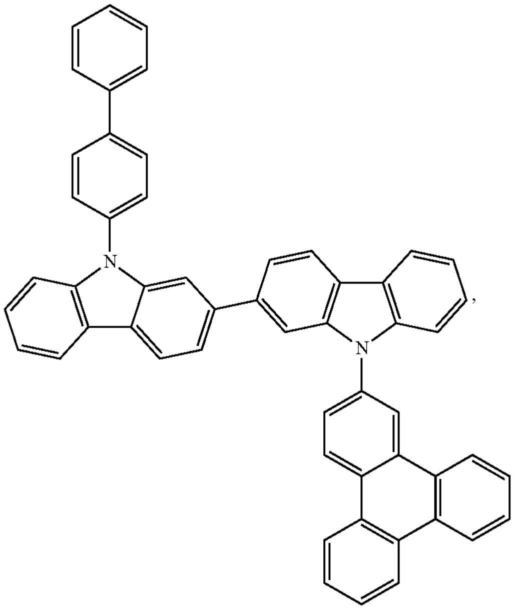
,
X-74
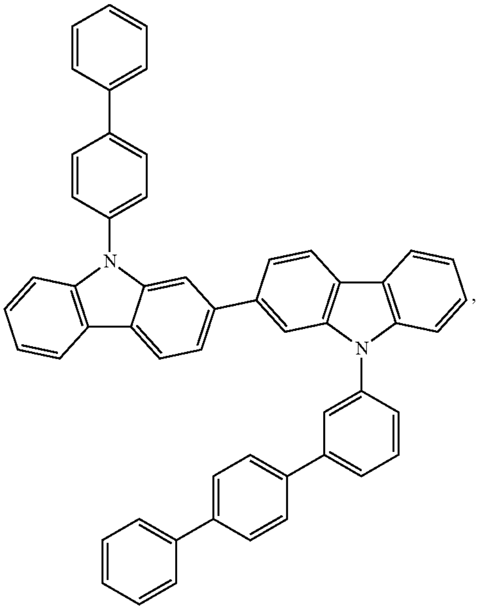
, -continued
X-75
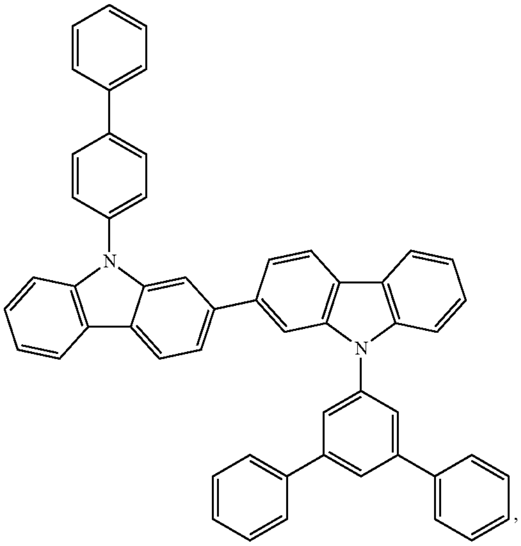
,
X-76
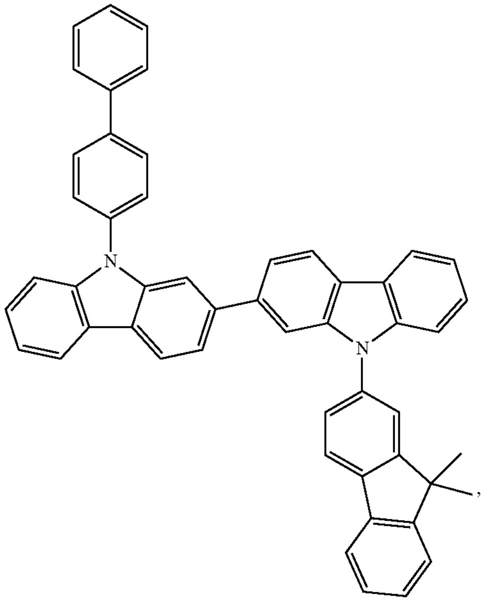
,
X-77
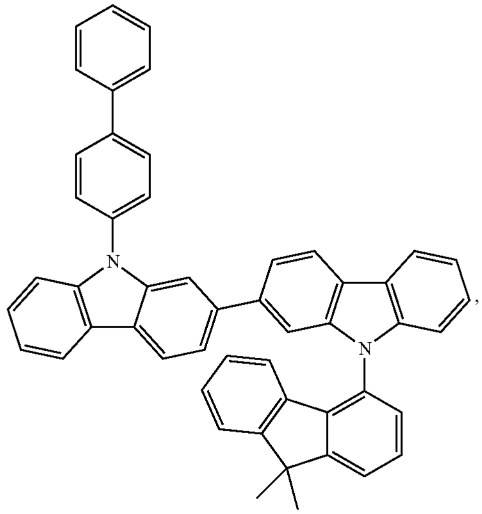
,
-continued
X-78
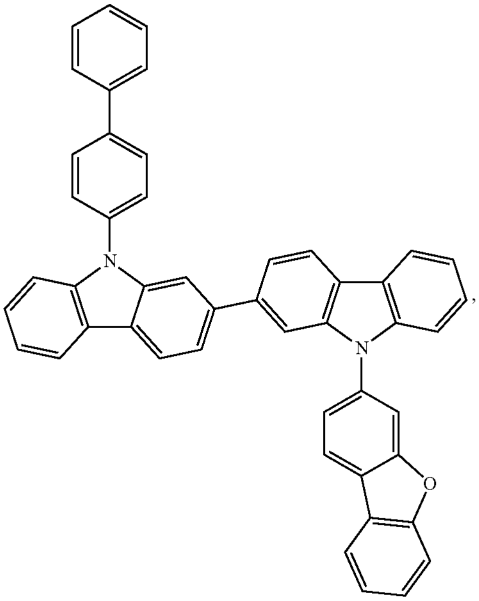
,
X-79
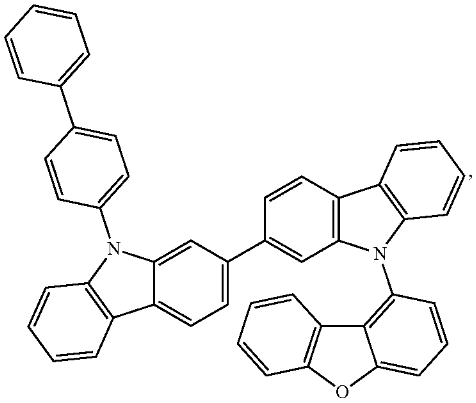
,
X-80
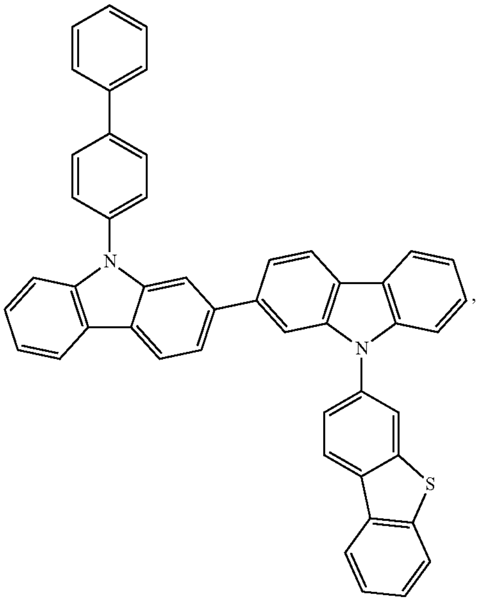
, -continued
X-81
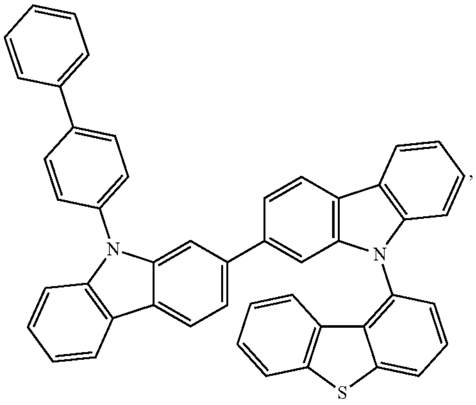
,
X-82
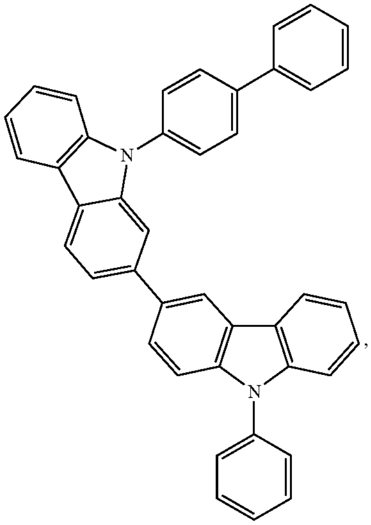
,
X-83
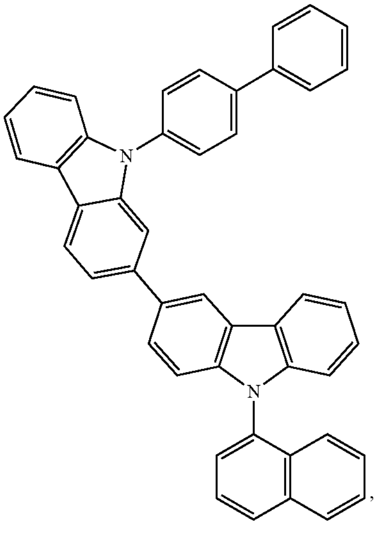
,
-continued
X-84
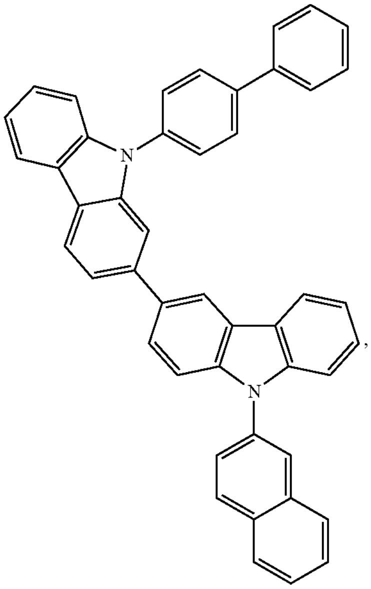
,
X-85
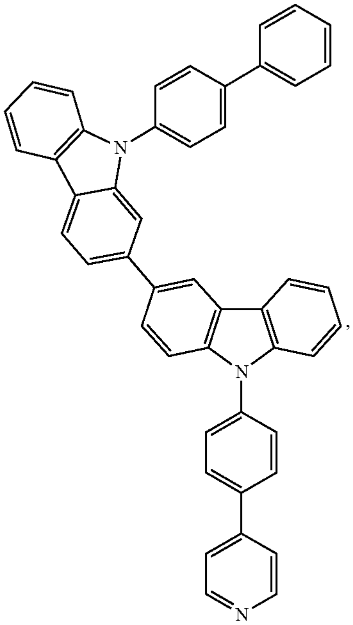
, -continued
X-86
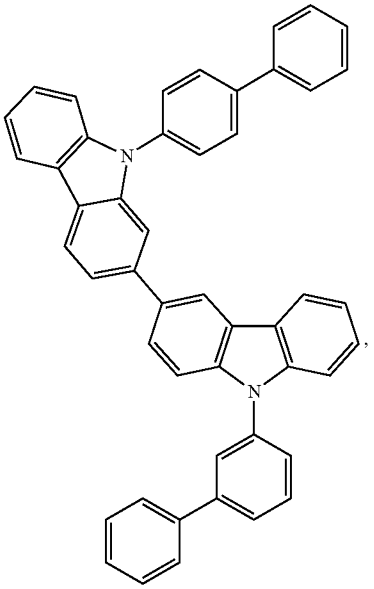
X-87
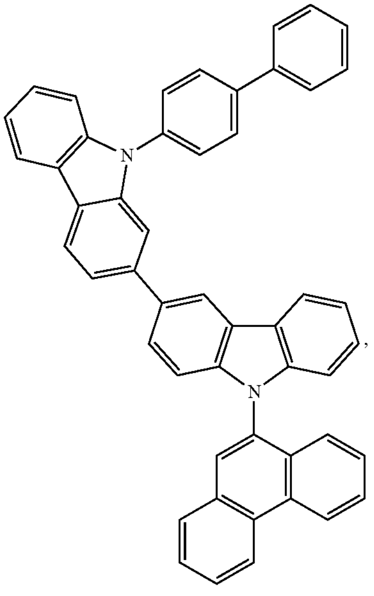
-continued
X-88
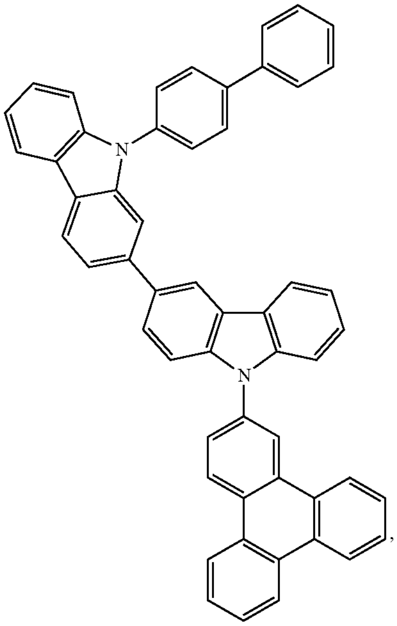
X-89
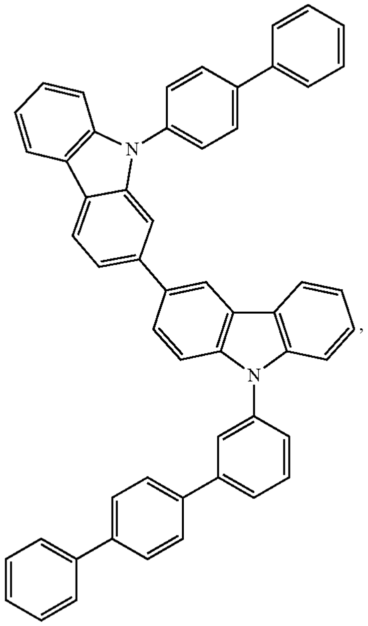

-continued
X-90
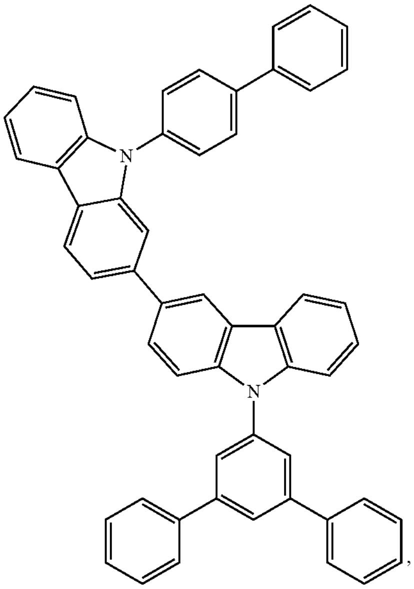
,
X-91
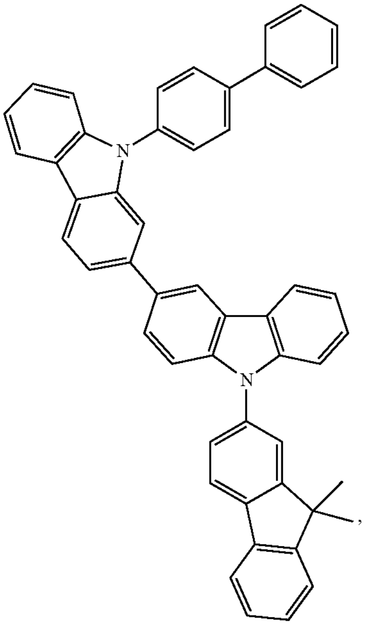
,
-continued
X-92
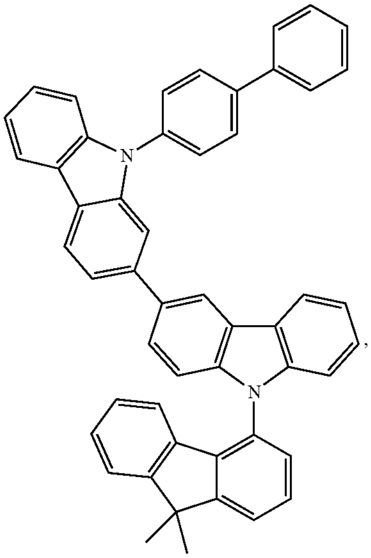
,
X-93
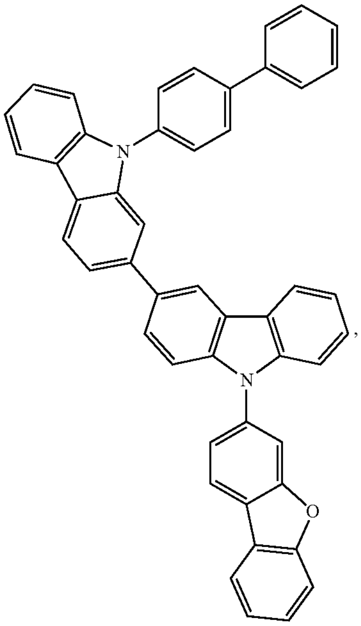
, -continued
X-94
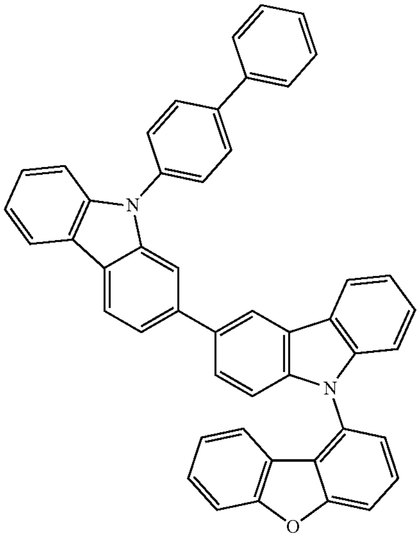
X-95
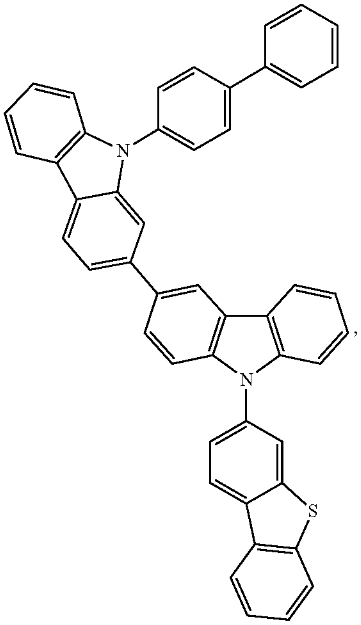
,
-continued
X-96
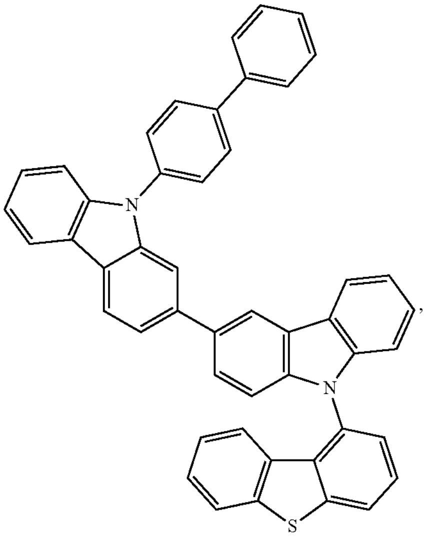
,
X-97
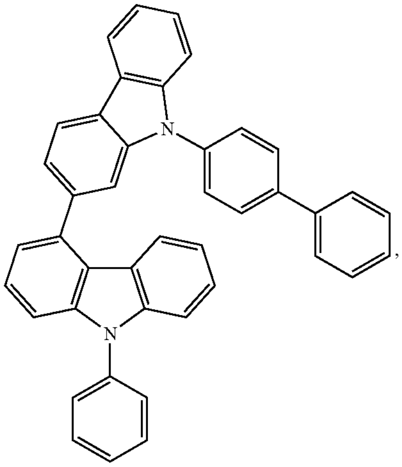
,
X-98
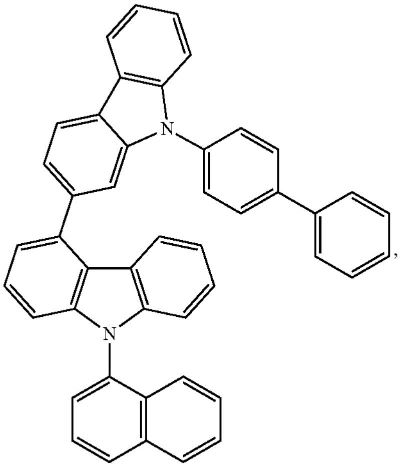
, X-99
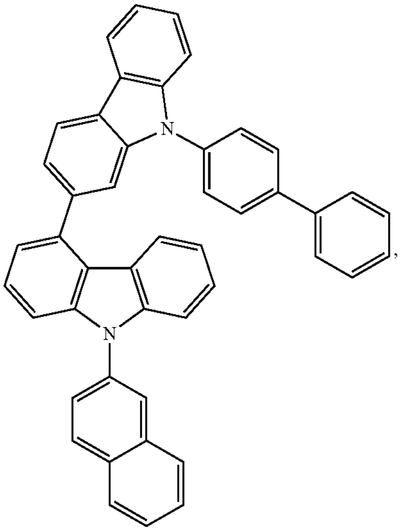
,
X-100
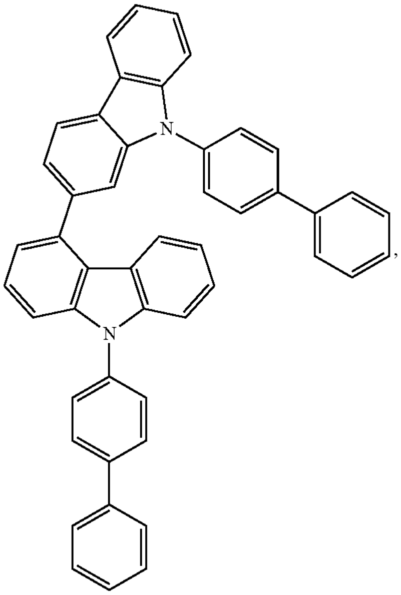
,
X-101
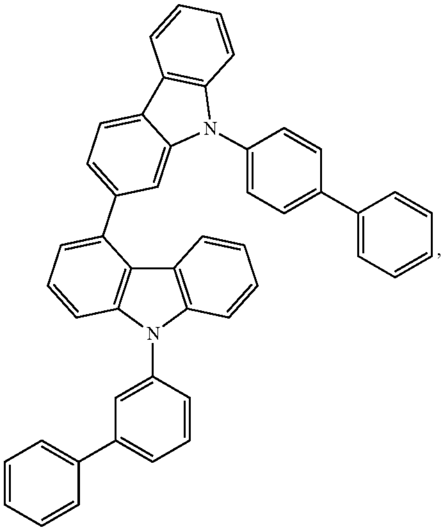
,
X-102
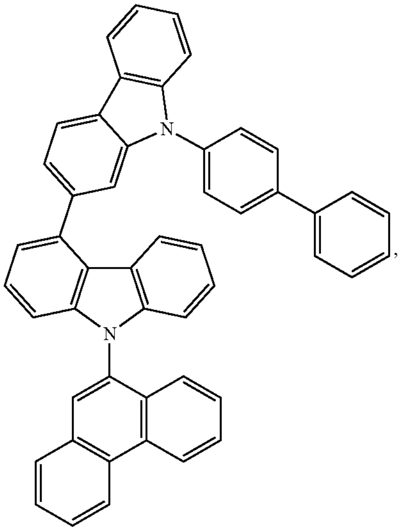
,
X-103
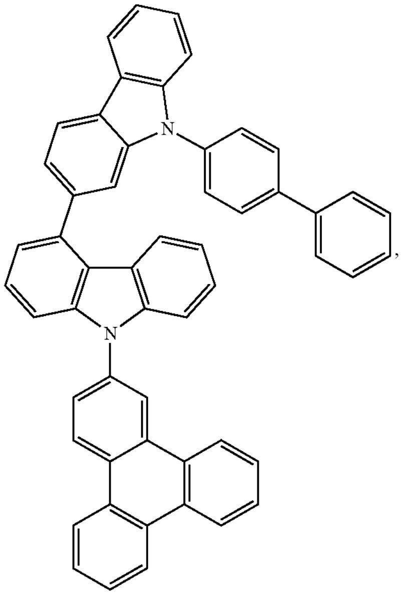
, -continued
X-104
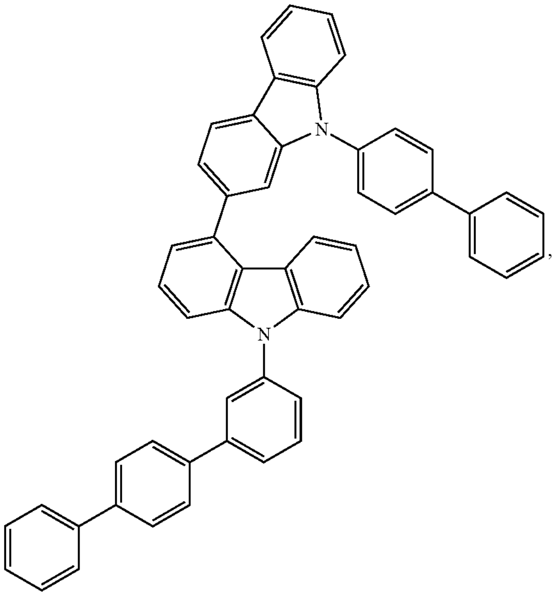
,
X-105
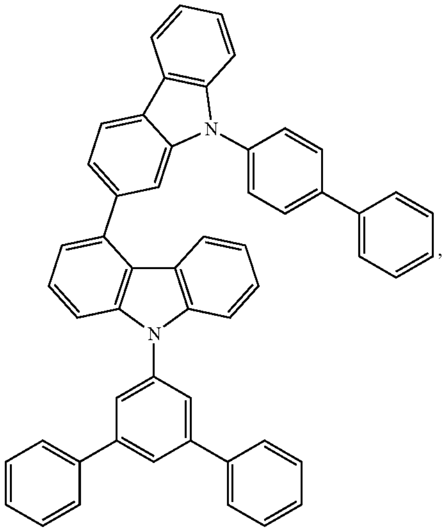
,
-continued
X-106
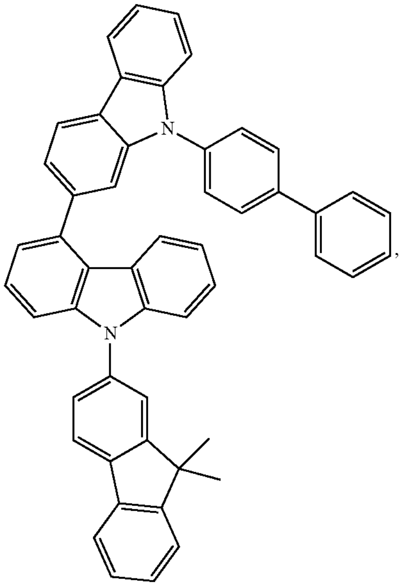
,
X-107
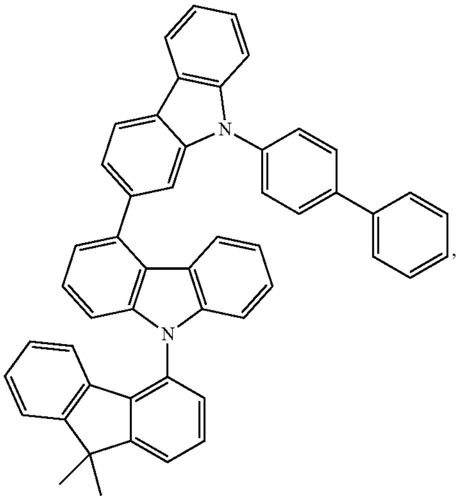
, -continued
X-108
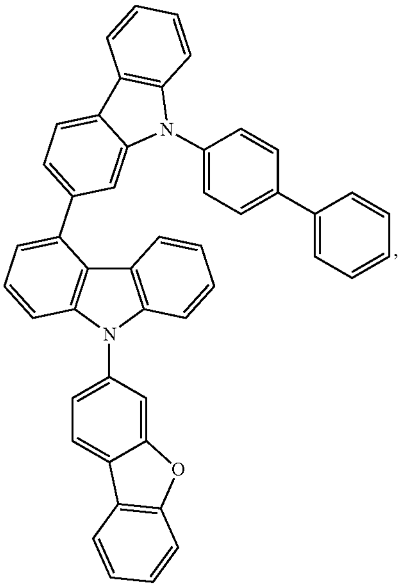
,
X-110
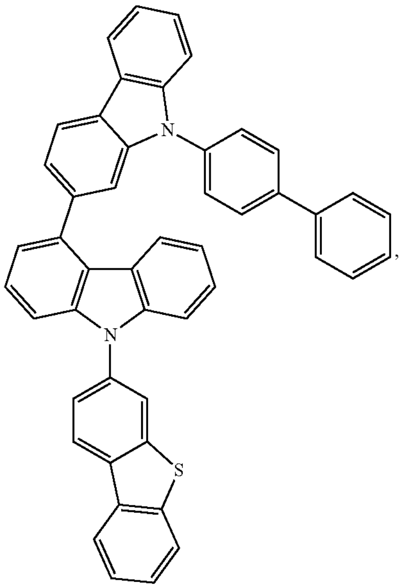
,
X-109
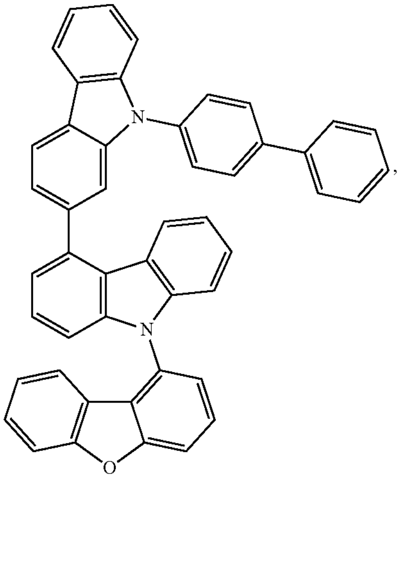
,
X-111
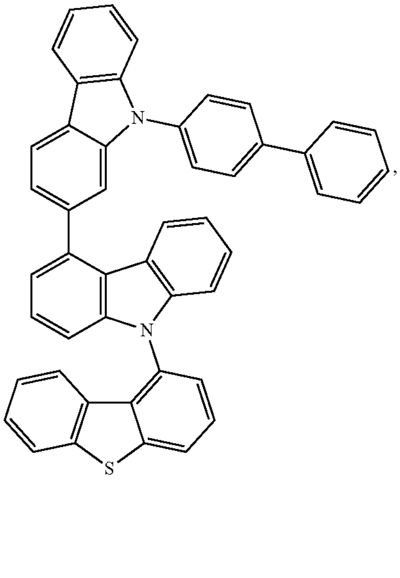
, -continued
X-112
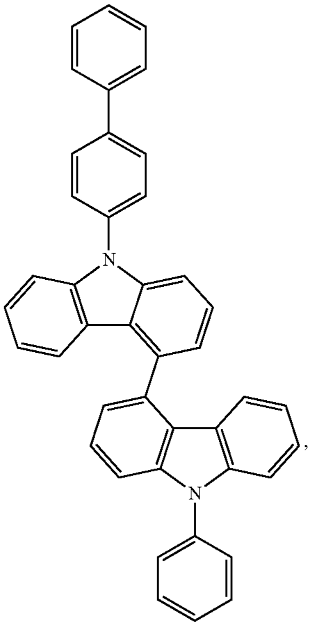
,
X-113
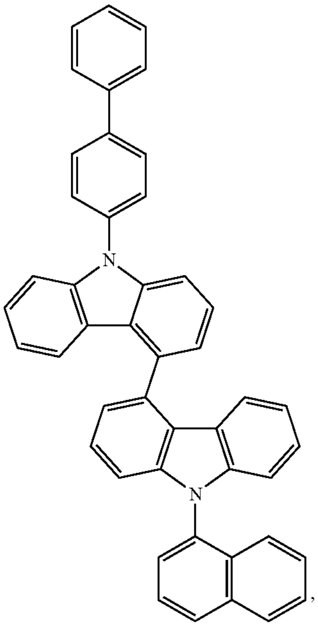
,
-continued
X-114
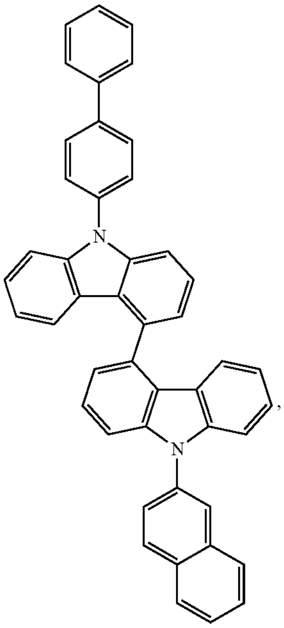
,
X-115
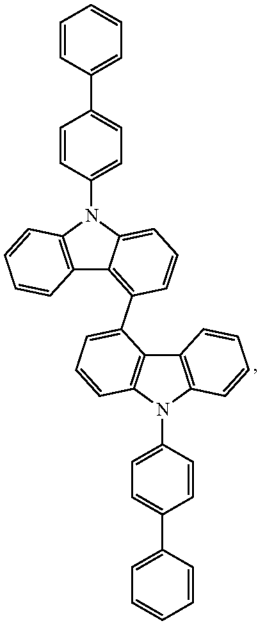
, -continued
X-116
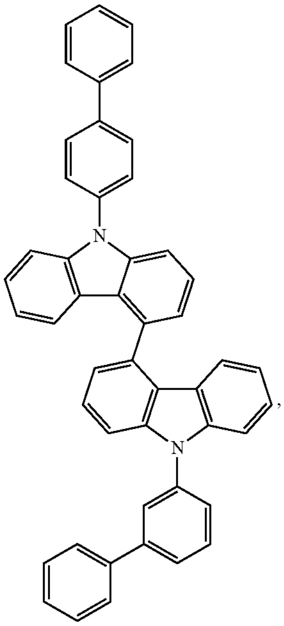
,
-continued
X-118
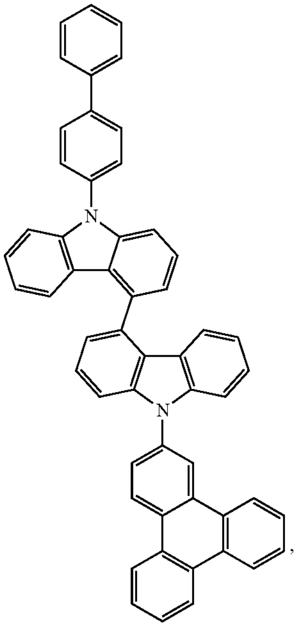
,
X-117
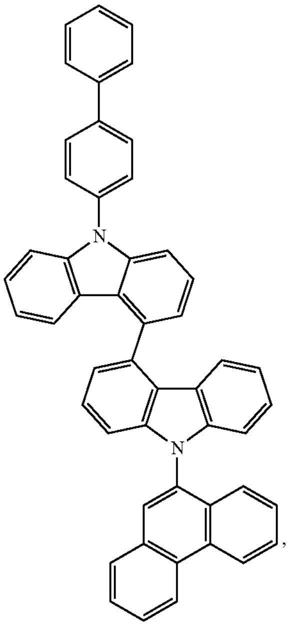
,
X-119
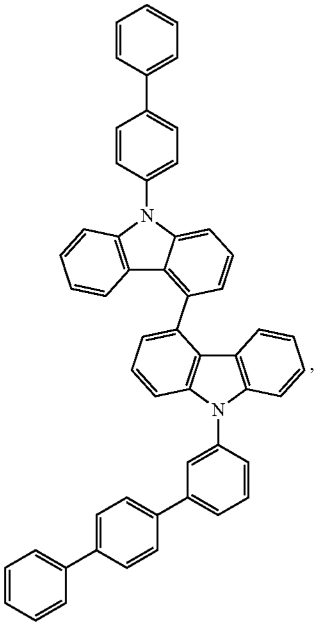
, -continued
X-120
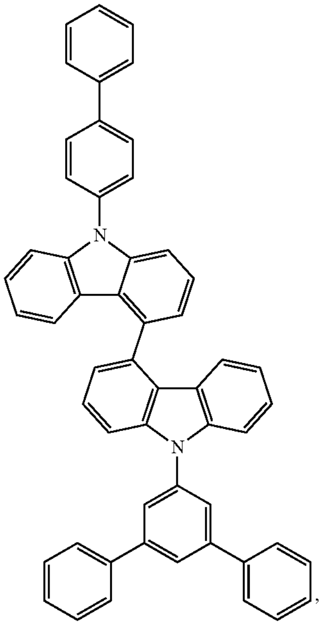
,
X-121
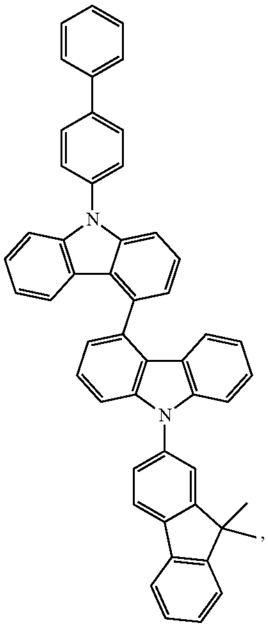
,
-continued
X-122
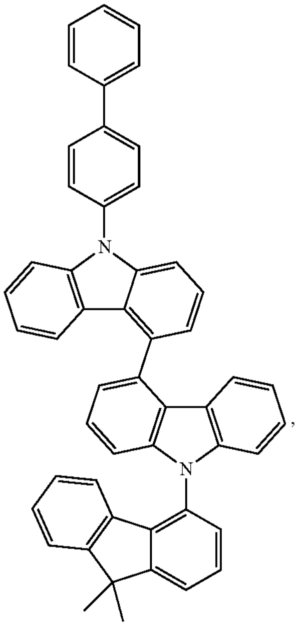
,
X-123
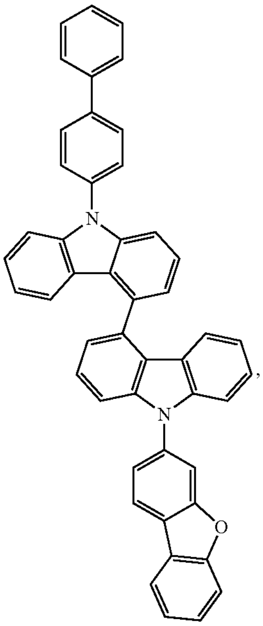
, -continued
X-124
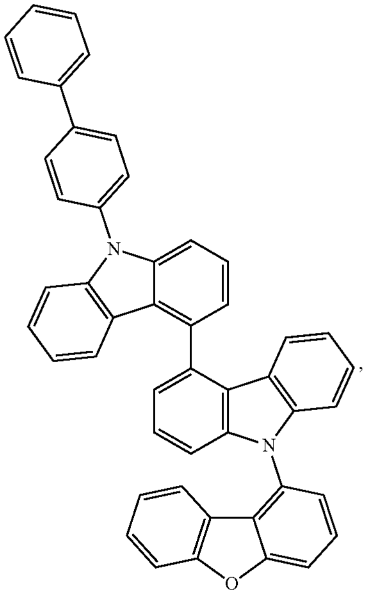
,
X-125
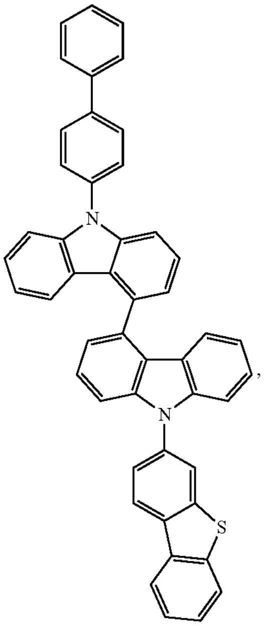
,
-continued
X-126
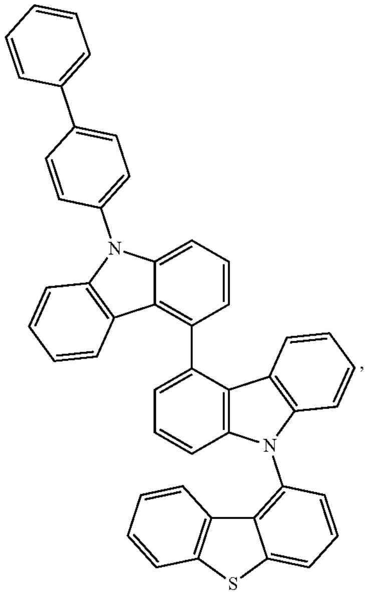
,
X-127
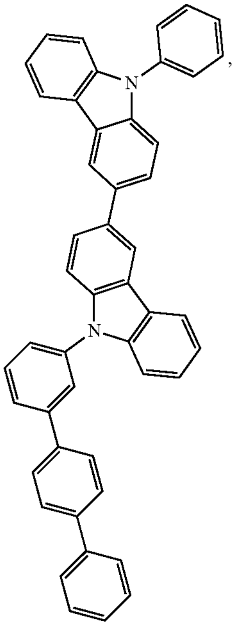
, -continued
X-128
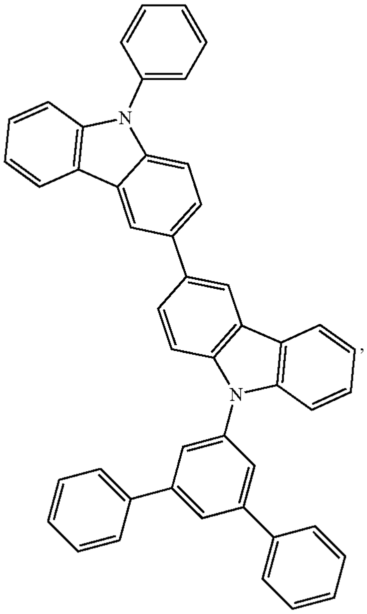
,
X-129
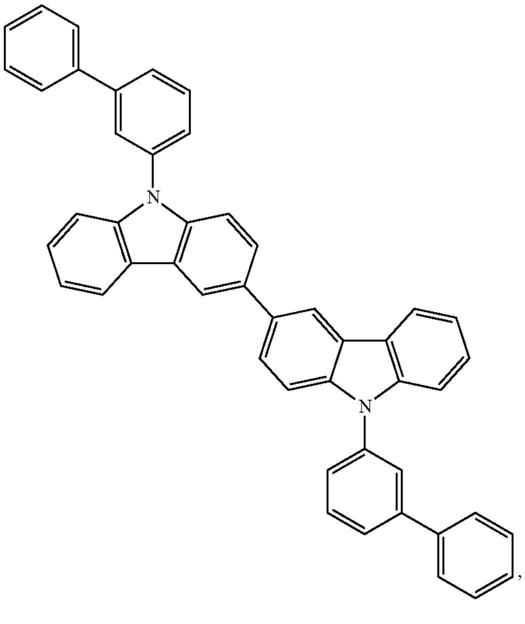
,
-continued
X-130
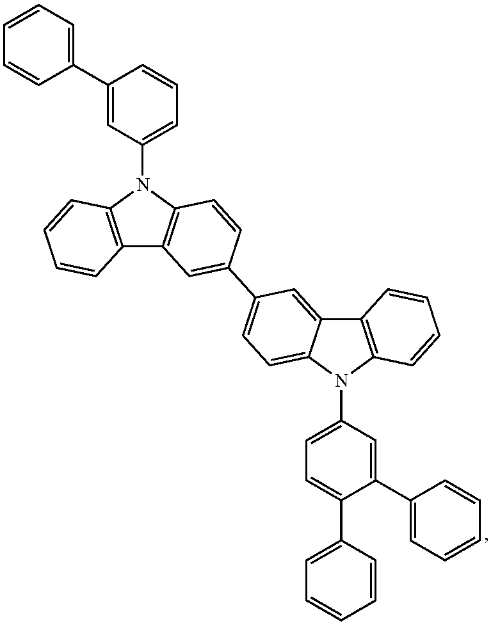
,
X-131
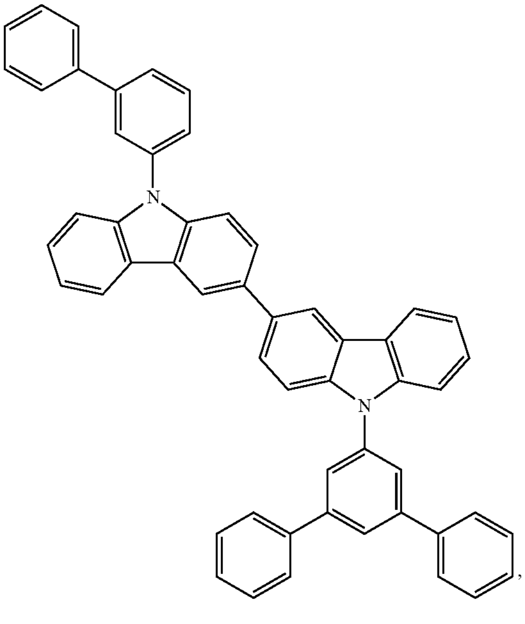
, -continued
X-132
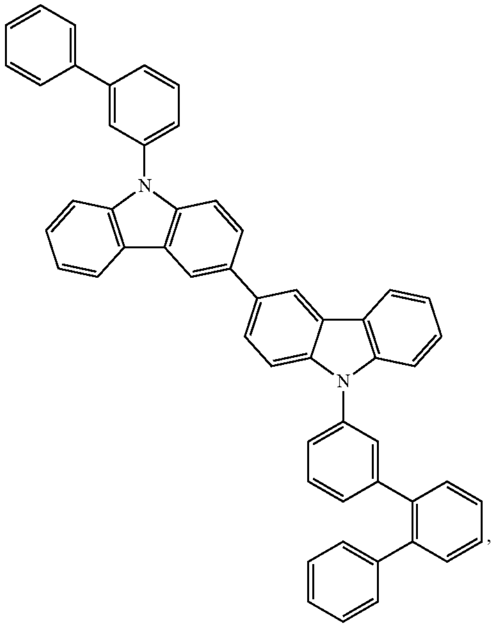
,
X-133
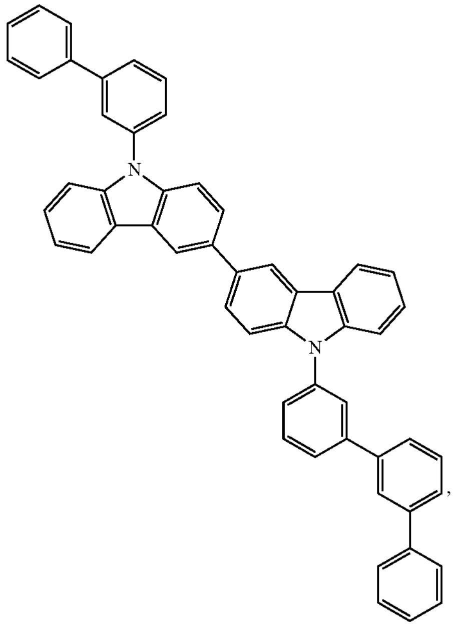
,
-continued
X-134
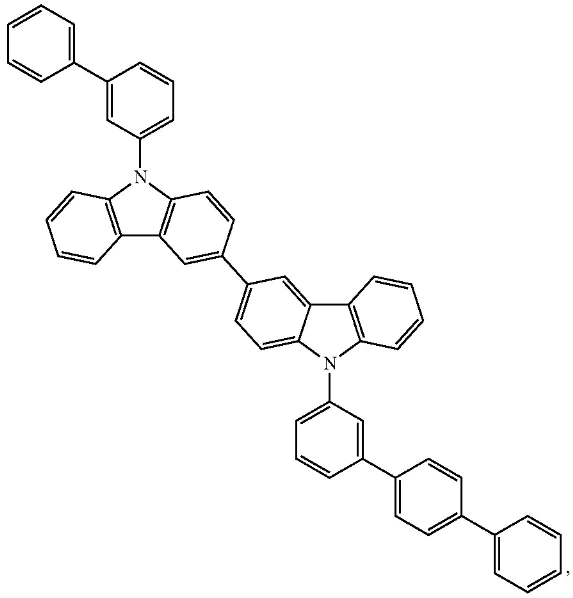
,
X-135
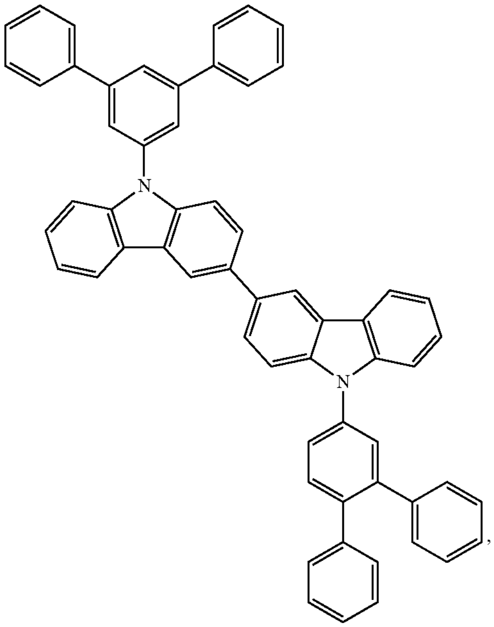
, -continued
X-136
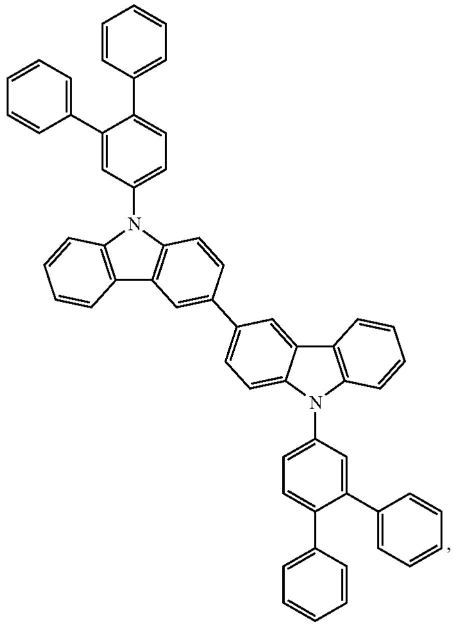
,
X-137
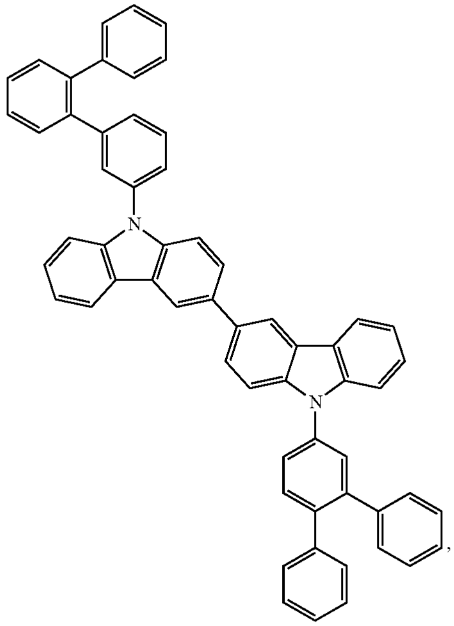
,
-continued
X-138
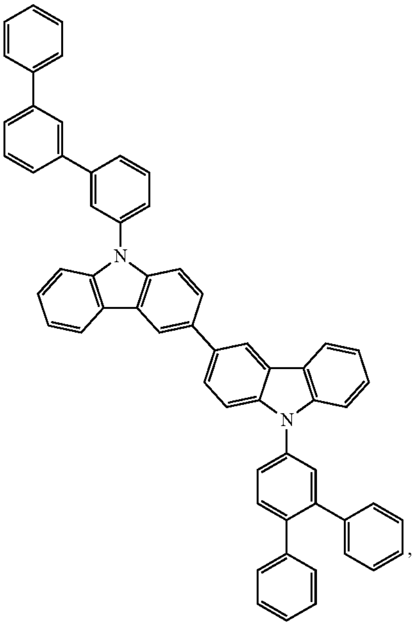
,
X-139
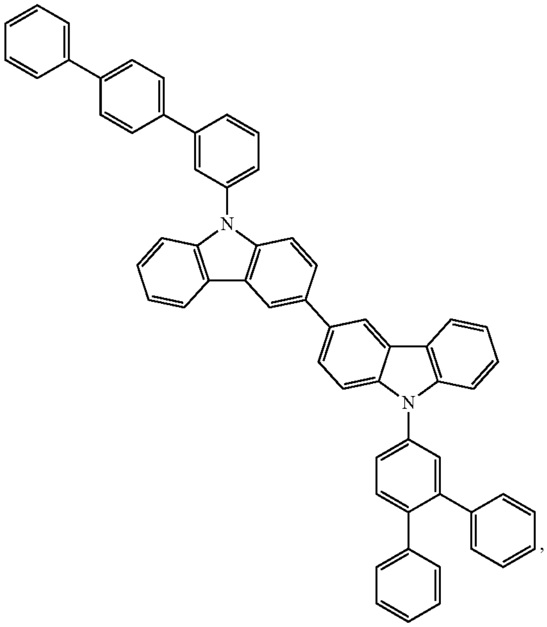
, -continued
X-140
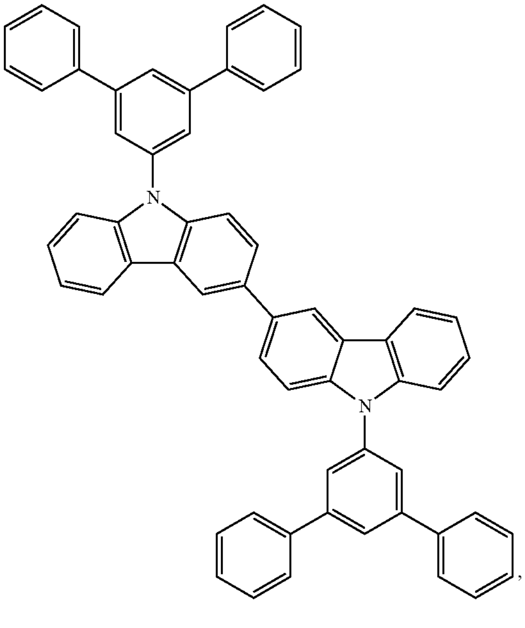
,
X-141
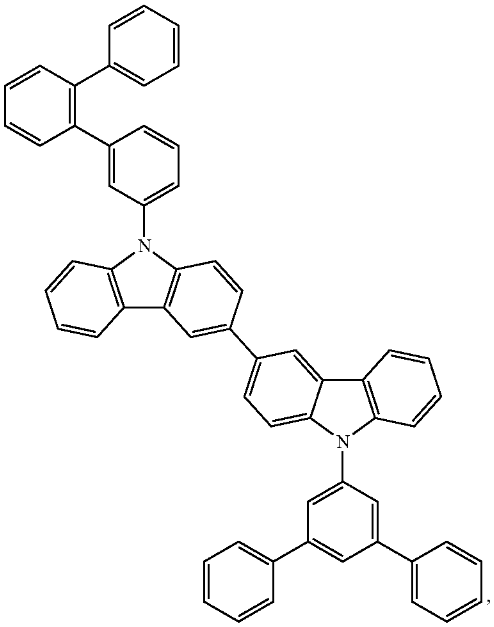
,
-continued
X-142
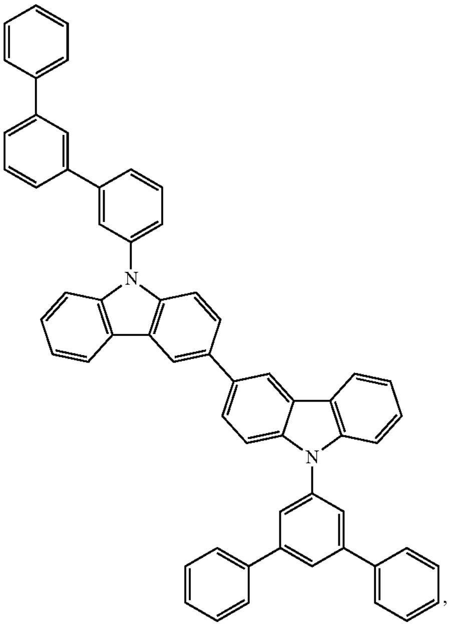
,
X-143
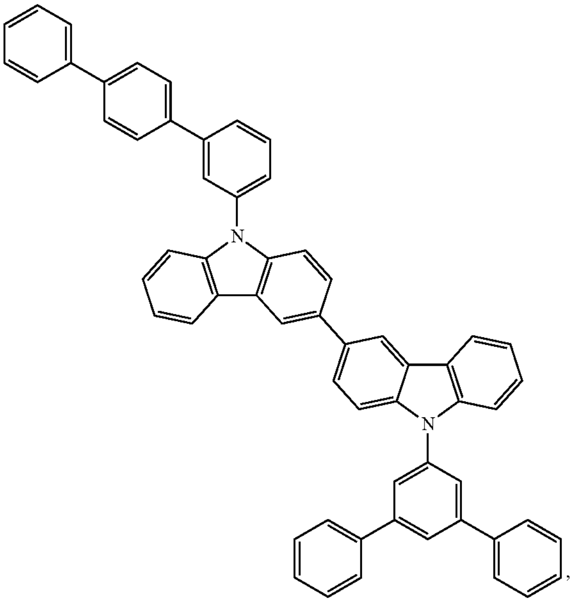
, -continued
X-144
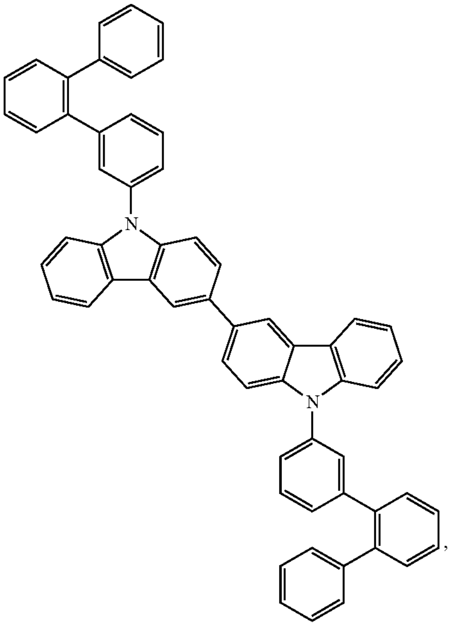
,
-continued
X-146
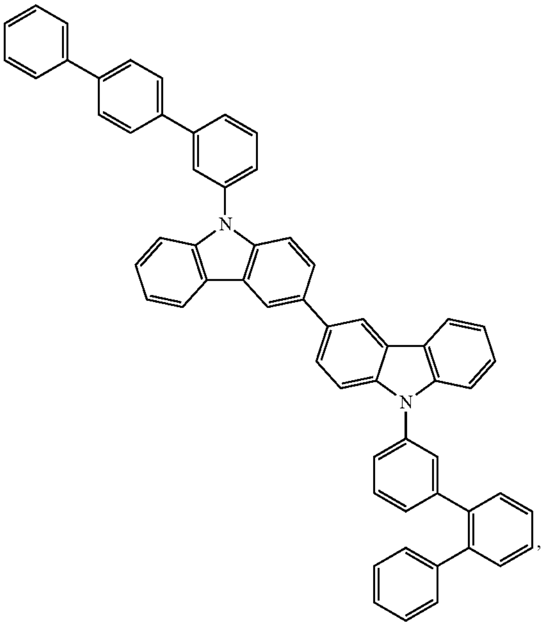
,
X-145
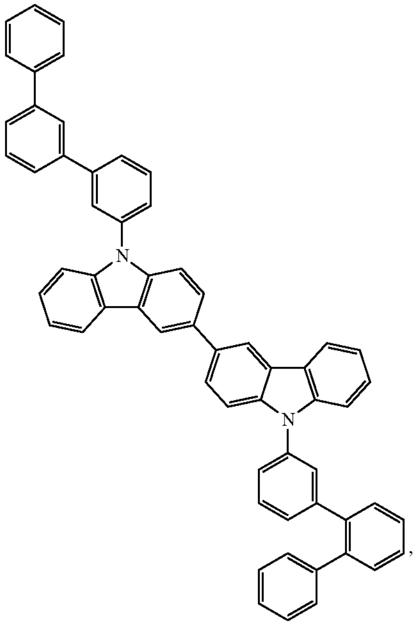
,
X-147
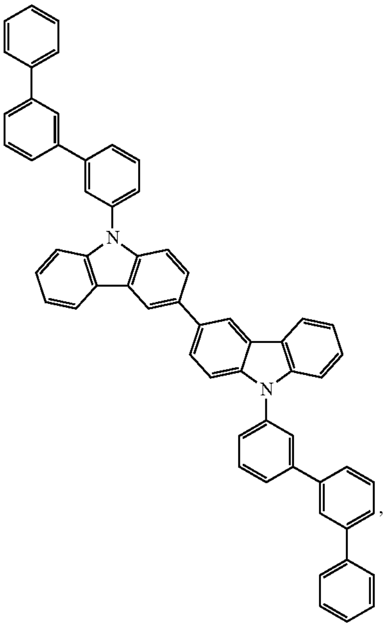
, -continued

X-148

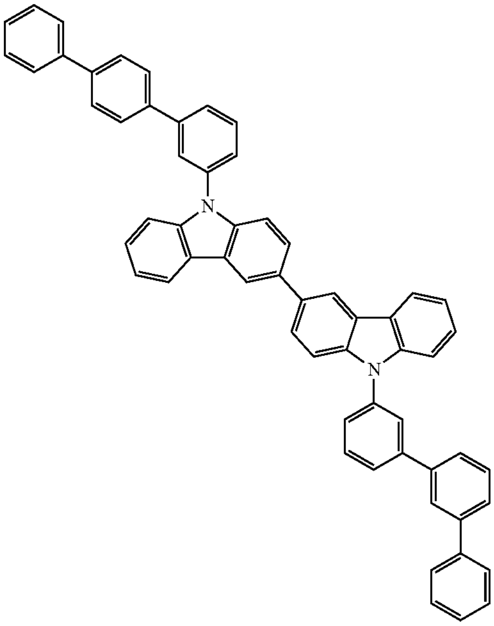

,

X-149

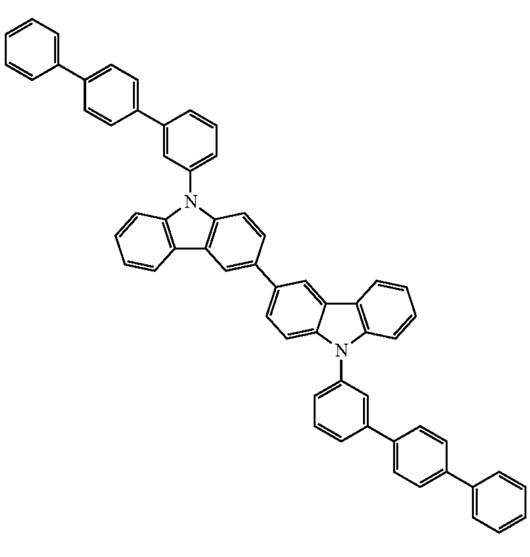

, and

X-150

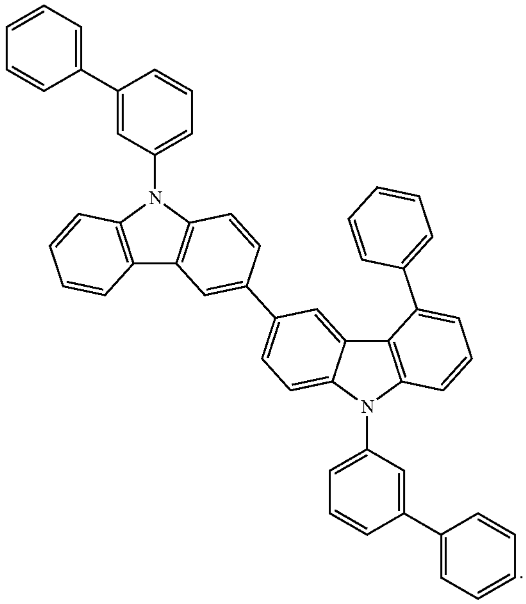

.

32. The electroluminescent device of claim 26, wherein the metal complex is doped in the first host compound and the second host compound, and the weight of the metal complex accounts for 3% to 13% of the total weight of the emissive layer.

33. A compound composition, comprising the metal complex of claim 1.

34. The metal complex of claim 1, wherein $A_1$ is, at each occurrence identically or differently, selected from phenylene unsubstituted or substituted by one or at least two $R_{a1}$; $A_2$ is, at each occurrence identically or differently, selected from cycloalkylene having 5 to 12 ring carbon atoms unsubstituted or substituted by one or at least two $R_{a2}$, heterocyclene unsubstituted or substituted by one or at least two $R_{a2}$ and having 5 to 12 ring atoms or combinations thereof.

35. The metal complex of claim 1, wherein $A_1$ is, at each occurrence identically or differently, selected from the group consisting of the following groups unsubstituted or substituted by one or at least two $R_{a1}$: cycloalkylene having 3 to 10 carbon atoms and heterocyclene having 3 to 10 ring atoms, and combinations thereof; $A_2$ is, at each occurrence identically or differently, selected from following groups unsubstituted or substituted by one or at least two $R_{a2}$: cycloalkylene having 3 to 10 carbon atoms, heterocyclene having 3 to 10 ring atoms, and combinations thereof.

36. The metal complex of claim 1, wherein $R_{a1}$ is, at each occurrence identically or differently, selected from the group consisting of: hydrogen, deuterium, fluorine, methyl, ethyl, propyl, isopropyl, n-butyl, isobutyl, t-butyl, cyclopentyl, cyclohexyl, deuterated methyl, deuterated ethyl, deuterated propyl, deuterated isopropyl, deuterated n-butyl, deuterated isobutyl, deuterated t-butyl, deuterated cyclopentyl, deuterated cyclohexyl, trimethylsilyl, and combinations thereof.

37. The metal complex of claim 1, wherein $R_{a2}$ and $R_{a3}$ are, at each occurrence identically or differently, selected from the group consisting of: hydrogen, deuterium, fluorine, methyl, ethyl, propyl, isopropyl, n-butyl, isobutyl, t-butyl, cyclopentyl, cyclohexyl, deuterated methyl, deuterated ethyl, deuterated propyl, deuterated isopropyl, deuterated n-butyl, deuterated isobutyl, deuterated t-butyl, deuterated cyclopentyl, deuterated cyclohexyl, phenyl, pyridyl, trimethylsilyl, and combinations thereof.

* * * * *